(12) United States Patent
Kimura

(10) Patent No.: US 7,554,362 B2
(45) Date of Patent: Jun. 30, 2009

(54) SEMICONDUCTOR DEVICE, DRIVING METHOD THEREOF AND ELECTRONIC DEVICE

(75) Inventor: Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 32 days.

(21) Appl. No.: 11/157,080

(22) Filed: Jun. 21, 2005

(65) Prior Publication Data

US 2005/0285625 A1    Dec. 29, 2005

(30) Foreign Application Priority Data

Jun. 25, 2004    (JP) .............................. 2004-188713

(51) Int. Cl.
 *H03K 19/0175* (2006.01)
(52) U.S. Cl. .......................................... 326/83; 326/68
(58) Field of Classification Search .................. 326/68, 326/82–83, 86–87; 327/108, 109
See application file for complete search history.

(56) References Cited

U.S. PATENT DOCUMENTS

| | | | | |
|---|---|---|---|---|
| 5,744,878 | A * | 4/1998 | Wachter et al. ............. | 307/130 |
| 6,229,506 | B1 | 5/2001 | Dawson et al. | |
| 6,353,337 | B2 * | 3/2002 | Nasu et al. ..................... | 326/83 |
| 6,373,454 | B1 | 4/2002 | Knapp et al. | |
| 6,859,193 | B1 | 2/2005 | Yumoto | |
| 6,977,543 | B2 * | 12/2005 | Heedley et al. ............. | 327/563 |
| 7,187,351 | B2 * | 3/2007 | Kwon .......................... | 345/82 |
| 7,253,665 | B2 * | 8/2007 | Kimura ....................... | 327/108 |
| 7,345,657 | B2 | 3/2008 | Kimura | |
| 2003/0128199 | A1 | 7/2003 | Kimura | |
| 2003/0128200 | A1 | 7/2003 | Yumoto | |
| 2003/0156102 | A1 | 8/2003 | Kimura | |
| 2003/0169250 | A1 | 9/2003 | Kimura | |
| 2004/0085029 | A1 | 5/2004 | Kimura | |
| 2004/0085270 | A1 | 5/2004 | Kimura | |

FOREIGN PATENT DOCUMENTS

| | | |
|---|---|---|
| EP | 1 441 324 A1 | 7/2004 |
| JP | 2002-514320 | 5/2002 |
| JP | 2002-517806 | 6/2002 |
| WO | WO01/06484 | 1/2001 |
| WO | WO02/39420 | 5/2002 |
| WO | WO 03/038793 A1 | 5/2003 |
| WO | WO03/038794 | 5/2003 |
| WO | WO03/038795 | 5/2003 |
| WO | WO03/038796 | 5/2003 |
| WO | WO03/038797 | 5/2003 |

* cited by examiner

*Primary Examiner*—James Cho
(74) *Attorney, Agent, or Firm*—Fish & Richardson P.C.

(57) ABSTRACT

The invention provides a semiconductor device having a current input type pixel in which a signal write speed is increased and an effect of variations between adjacent transistors is reduced. When a set operation is performed (write a signal), a source drain voltage of one of two transistors connected in series becomes quite low, thus the set operation is performed to the other transistor. In an output operation, the two transistors operate as a multi-gate transistor, therefore, a current value in the output operation can be small. In other words, a current in the set operation can be large. Therefore, an effect of intersection capacitance and wiring resistance which are parasitic on a wiring and the like do not affect much, thereby the set operation can be performed rapidly. As one transistor is used in the set operation and the output operation, an effect of variations between adjacent transistors is lessened.

17 Claims, 191 Drawing Sheets

SEMICONDUCTOR DEVICE, DRIVING METHOD THEREOF AND ELECTRONIC DEVICE

BACKGROUND OF THE INVENTION

1. Field of the Invention

The present invention relates to a semiconductor device provided with a function for controlling by a transistor a current supplied to a load. In particular, the invention relates to a pixel formed of a current driving light emitting element of which luminance changes depending on current, and a semiconductor device including a signal line driver circuit.

2. Description of the Related Art

In recent years, a self-luminous type display device of which pixel is formed of a light emitting element such as a light emitting diode (LED) is attracting attention. As a light emitting element used in such a self-luminous type display device, an organic light emitting diode (OLED), an organic EL element, and an electroluminescence (EL) element are attracting attention and becoming to be used in an organic EL display and the like.

Being self-luminous type, such a light emitting element as an OLED has a pixel higher in visibility and faster in response without a need of a backlight as compared to a liquid crystal display. Further, the luminance of a light emitting element is controlled by a current value flowing through it.

In a display device using such a self-luminous type light emitting element, a passive matrix method and an active matrix method are known as its driving method. The former has a simple structure, but has a problem such that the realization of a large and high definition display is difficult. Therefore, the active matrix method is actively developed in recent years in which a current flowing to the light emitting element is controlled by a thin film transistor (TFT) provided in a pixel circuit.

In the case of a display device of the active matrix method, there is a problem that a current flowing to a light emitting element varies due to variations in current characteristics of driving TFTs, thereby a luminance varies.

That is, in the case of such a display device of the active matrix method, a driving TFT which drives a current flowing to the light emitting element is used in a pixel circuit. When characteristics of these driving TFTs vary, a current flowing to the light emitting element varies, which varies a luminance. Therefore, various circuits have been suggested in which a current flowing to a light emitting element does not vary, thereby, variations in luminance can be suppressed even when characteristics of driving TFTs in pixel circuits vary, which can suppress variations in luminance.

[Patent Document 1]
Published Japanese Translation of PCT International Publication for Patent Application No. 2002-517806
[Patent Document 2]
International Publication WO01/06484
[Patent Document 3]
Published Japanese Translation of PCT International Publication for Patent Application No. 2002-514320
[Patent Document 4]
International Publication WO02/39420

Patent Documents 1 to 4 each discloses a structure of an active matrix type display device. Patent Documents 1 to 3 disclose a circuit configuration in which a current flowing to a light emitting element does not vary due to variations in characteristics of driving TFTs provided in pixel circuits. This configuration is referred to as a current write type pixel or a current input type pixel. Patent Document 4 discloses a circuit configuration for suppressing variations of a signal current due to variations of TFTs in a source driver circuit.

FIG. 169 shows a first configuration example of a conventional active matrix type display device disclosed in Patent Document 1. The pixel shown in FIG. 169 comprises a source signal line 16901, first to third gate signal lines 16902 to 16904, a current supply line 16905, TFTs 16906 to 16909, a capacitor 16910, an EL element 16911, and a current source 16912 for inputting a signal current.

A gate electrode of the TFT 16906 is connected to the first gate signal line 16902, a first electrode thereof is connected to the source signal line 16901, and a second electrode thereof is connected to a first electrode of the TFT 16907, a first electrode of the TFT 16908, and a first electrode of the TFT 16909. A gate electrode of the TFT 16907 is connected to the second gate signal line 16903 and a second electrode thereof is connected to a gate electrode of the TFT 16908. A second electrode of the TFT 16908 is connected to the current supply line 16905. A gate electrode of the TFT 16909 is connected to the third gate signal line 16904 and a second electrode thereof is connected to an anode of the EL element 16911. The capacitor 16910 is connected between the gate electrode and an input electrode of the TFT 16908 and holds a gate-source voltage of the TFT 16908. The current supply line 16905 and a cathode of the EL element 16911 are inputted with predetermined potentials respectively and have a potential difference from each other.

An operation from writing a signal current to light emission is described with reference to FIG. 172. Reference numerals denoting each portion in the drawing correspond to those in FIG. 169. FIGS. 172A to 172C each schematically shows a current flow. FIG. 172D shows a relationship of a current flowing each path when writing a signal current. FIG. 172E shows a voltage accumulated in the capacitor 16910 when writing a signal current, which is a gate-source voltage of the TFT 16908.

First, a pulse is inputted to the first gate signal line 16902 and the second gate signal line 16903 and the TFTs 16906 and 16907 are turned on. At this time, a current flowing through the source signal line, that is a signal current is denoted as Idata.

As the current Idata flows the source signal line, the current path is divided into I1 and I2 as shown in FIG. 172A. These relationships are shown in FIG. 172D. It is needless to say that Idata=I+I12 is satisfied.

A charge is not held in the capacitor 16910 at the moment the TFT 16906 is turned on, therefore, the TFT 16908 is off. Accordingly, I2=0 and Idata=I1 are satisfied. In the meantime, current only flows into the capacitor 16910 to be accumulated therein.

After that, as the charge is gradually accumulated in the capacitor 16910, a potential difference starts to generate between both electrodes (FIG. 172E). When the potential difference between the both electrodes reaches Vth (a point A in FIG. 172E), the TFT 16908 is turned on and 12 generates. As described above, as Idata=I1+I2 is satisfied, current still flows and a charge is accumulated in the capacitor while I1 decreases gradually.

The charge keeps being accumulated in the capacitor 16910 until the potential difference between the both electrodes thereof, that is a gate-source voltage of the TFT 16908 reaches a desired voltage, that is a voltage (VGS) which can make the TFT 16908 supply the current Idata. When the charge stops being accumulated (a point B in FIG. 172E), the current I1 stops flowing and a current corresponding to VGS at that time flows through the TFT 16908 and Idata=I2 is satisfied (FIG. 172B). Thus, a steady state is achieved. At last, selections of the first gate signal line 16902 and the second gate signal line 16903 are terminated to turn off the TFTs 16906 and 16907.

Subsequently, a light emitting operation starts. A pulse is inputted to the third gate signal line 16904 to turn on the TFT 16909. As the capacitor 16910 holds VGS which is written before, the TFT 16908 is on and the current Idata flows from the current supply line 16905. Thus, the EL element 16911 emits light. Provided that the TFT 16908 is set to operate in a saturation region, Idata keeps flowing without changing even when a source-drain voltage of the TFT 16908 changes.

In this manner, an operation to output a set current is hereinafter referred to as an output operation. A merit of the current write type pixel of which example is shown above is that a desired current can be accurately supplied to an EL element because a gate-source voltage required to supply the current Idata is held in the capacitor 16910 even when the TFT 16908 has variations in characteristics and the like. Therefore, luminance variations due to the variations in characteristics of TFTs can be suppressed.

The aforementioned examples relate to a technology for correcting a change of current due to variations of driving TFTs in pixel circuits, however, the same problem occurs in a source driver circuit as well. Patent Document 4 discloses a circuit configuration for preventing a change of a signal current due to variations of the TFTs in the source driver circuit generated in fabrication.

SUMMARY OF THE INVENTION

In this manner, a conventional current drive circuit and a display device using it have configurations such that a signal current and a current for driving a TFT, or a signal current and a current which flows to a light emitting element during the light emission thereof are equal to each other or in proportion to each other.

Therefore, in the case where a drive current of a driving TFT for driving a light emitting element is small or the case of performing a display of a low gray scale level by a light emitting element, the signal current becomes small proportionately. Therefore, as parasitic capacitance of a wiring used for supplying a signal current to the driving TFT and the light emitting element is quite large, there is a problem in that a time constant of charging the parasitic capacitance of the wiring becomes large, thus a signal write speed becomes slow when the signal current is small. That is, a problem is that when a current is supplied to a transistor, it takes more time until a voltage required for the transistor to supply the current generates at a gate terminal.

The invention is made in view of the aforementioned problems and provides a current drive circuit which is capable of improving a write speed of a signal and an element drive speed even when a signal current is small, and a display device using it.

A semiconductor device of the invention includes a first transistor, a second transistor, a switch, and a capacitor. The first transistor includes a gate terminal, a first terminal, and a second terminal while the second transistor includes a gate terminal, a first terminal, and a second terminal. The gate terminal of the first transistor and the first terminal of the first transistor are connected via a switch. A second terminal of the first transistor is connected to the first terminal of the second transistor. The gate terminal of the first transistor is connected to the gate terminal of the second transistor and one terminal of the capacitor. A unit for short-circuiting between the first terminal and the second terminal of the first transistor or between the first terminal of the second transistor and the second terminal of the second transistor is provided.

A semiconductor device of the invention includes a first transistor, a second transistor, a first switch, a second switch, and a capacitor. The first transistor includes a gate terminal, a first terminal, and a second terminal while the second transistor includes a gate terminal, a first terminal, and a second terminal. The gate terminal of the first transistor and the first terminal of the first transistor are connected via the first switch. The second terminal of the first transistor is connected to the first terminal of the second transistor. The gate terminal of the first transistor is connected to the gate terminal of the second transistor and one terminal of the capacitor. The first terminal of the first transistor and the second terminal of the first transistor, or the first terminal and the second terminal of the second transistor are connected via the second switch.

A semiconductor device of the invention includes a first transistor, a second transistor, a first switch, a second switch, a third switch, a power source line, and a capacitor. The first transistor includes a gate terminal, a first terminal, and a second terminal while the second transistor includes a gate terminal, a first terminal, and a second terminal. The gate terminal of the first transistor and the first terminal of the first transistor are connected via the first switch. The second terminal of the first transistor is connected to the first terminal of the second transistor. The gate terminal of the first transistor is connected to the gate terminal of the second transistor via the second switch. The gate terminal of the first transistor is connected to one terminal of the capacitor. The gate terminal of the second transistor is connected to the power source line via the third switch.

According to the aforementioned structure of the semiconductor device of the invention, the first transistor and the second transistor have the same conductivity.

According to the aforementioned structure of the semiconductor device of the invention, the other terminal of the capacitor is connected to the second terminal of the second transistor.

According to the aforementioned structure of the semiconductor device of the invention, the first terminal of the first transistor or the second terminal of the second transistor is connected to a current source circuit.

According to the aforementioned structure of the semiconductor device of the invention, the first terminal of the first transistor and the second terminal of the second transistor are connected to a display element.

That is, according to the invention, a source-drain voltage of one (for example, the second transistor) of the two transistors connected in series (first transistor and second transistor) becomes quite low in a set operation, thereby the set operation is performed to the other transistor (for example, the first transistor). In the output operation, the two transistors (first transistor and second transistor) operate as a multi-gate transistor, thus a current value in the output operation can be made small. That is, a current in the set operation can be large.

According to the invention, in order to complete the set operation rapidly, a potential of the gate terminal of the transistor is set at a predetermined potential before the set operation, and then the set operation is performed. The predetermined potential is approximately equal to a potential at the time when the set operation is completed (the steady state is obtained). Therefore, the set operation can be performed rapidly. It is to be noted that the set operation in this invention is an operation to supply a current to a transistor to generate at a gate terminal thereof a voltage required for the transistor to supply the current.

An operation performed so that the potential of the gate terminal of the transistor becomes a predetermined potential before the set operation in order to complete the set operation rapidly is called a precharge operation. A circuit having such a function is called a precharge unit.

The invention provides a semiconductor device including a transistor which supplies a first current to a load. A potential of a gate terminal of the transistor is set at a predetermined potential by supplying a second current to the transistor.

That is to say, in the case of performing the set operation to the transistor, the steady state is not easily obtained and a write operation of a current is not completed when a current value is small. Therefore, the precharge operation is performed before the set operation. By performing the precharge operation, a potential approximately equal to a potential when the steady state is obtained after performing the set operation is obtained. That is, a potential of the gate terminal of the transistor is rapidly charged by performing the precharge operation. Therefore, by performing the set operation after the precharge operation, the operation can be completed more rapidly.

Note that the precharge operation is performed by supplying a larger current than that in the set operation. Therefore, a potential of the gate terminal of the transistor is rapidly charged.

The invention provides a semiconductor device comprising a display element, a transistor for supplying a current to the display element and a precharge unit for setting a potential of a gate terminal of the transistor at a predetermined potential.

The invention provides a semiconductor device including a signal line driver circuit including a transistor for supplying a current to a signal line, and a precharge unit for setting a potential of a gate terminal of the transistor at a predetermined potential.

The invention provides a semiconductor device provided with a signal line driver circuit including a signal line, a transistor for supplying a current to the signal line, and a precharge unit for making a potential of a gate terminal of the transistor at a predetermined potential.

The invention provides a driving method of a semiconductor device having the steps of supplying a first current to a transistor for supplying a current to a load to generate at a gate terminal thereof a voltage required for the transistor to supply the first current, and then supplying a second current to the transistor to generate at a gate terminal thereof a voltage required for the transistor to supply the second current.

The invention provides a driving method of a semiconductor device setting the steps of making a potential of a gate terminal of a transistor for supplying a current to a load at a predetermined potential at which the transistor can be a steady state, and then supplying a current to the transistor to generate at a gate terminal thereof a voltage required for the transistor to flow the current.

The invention provides the driving method of a semiconductor device according to the aforementioned configuration in which the first current is larger than the second current.

Note that the kind of a transistor which is applicable to the invention is not limited. For example, it may be a thin film transistor (TFT). It may be a TFT having an amorphous, polycrystalline, or single crystalline semiconductor layer is. As other transistors, it may be a transistor formed on a single crystalline substrate, a transistor formed on an SOI substrate, a transistor formed on a glass substrate, a transistor formed on a plastic substrate, or a transistor formed on any substrates. Besides, it may be a transistor formed of an organic material or a carbon nanotube. It may be a MOS transistor or a bipolar transistor as well.

Note that a connection in this invention means an electrical connection. Therefore, other elements, a switch and the like may be disposed between elements.

According to the invention, a semiconductor device includes a circuit having a transistor, a capacitor and the like.

According to the invention, the set operation can be performed rapidly while suppressing effects of intersection capacitance and resistance which are parasitic on wirings and the like and wiring resistance. Accordingly, an accurate current can be outputted in the output operation.

BRIEF DESCRIPTION OF THE DRAWINGS

FIG. 120 is a diagram showing connections of a certain operation of a current source circuit of the invention.

FIG. 121 is a diagram showing connections of a certain operation of a current source circuit of the invention.

FIG. 122 is a diagram showing connections of a certain operation of a current source circuit of the invention.

FIG. 123 is a diagram showing a configuration of a current source circuit of the invention.

FIG. 124 is a diagram showing a configuration of a current source circuit of the invention.

FIG. 125 is a diagram showing a configuration of a current source circuit of the invention.

FIG. 126 is a diagram showing a configuration of a current source circuit of the invention.

FIG. 127 is a diagram showing connections of a certain operation of a current source circuit of the invention.

FIG. 128 is a diagram showing connections of a certain operation of a current source circuit of the invention.

FIG. 129 is a diagram showing connections of a certain operation of a current source circuit of the invention.

FIG. 130 is a diagram showing a configuration of a current source circuit of the invention.

FIG. 131 is a diagram showing an operation of a current source circuit of the invention.

Figure 132:
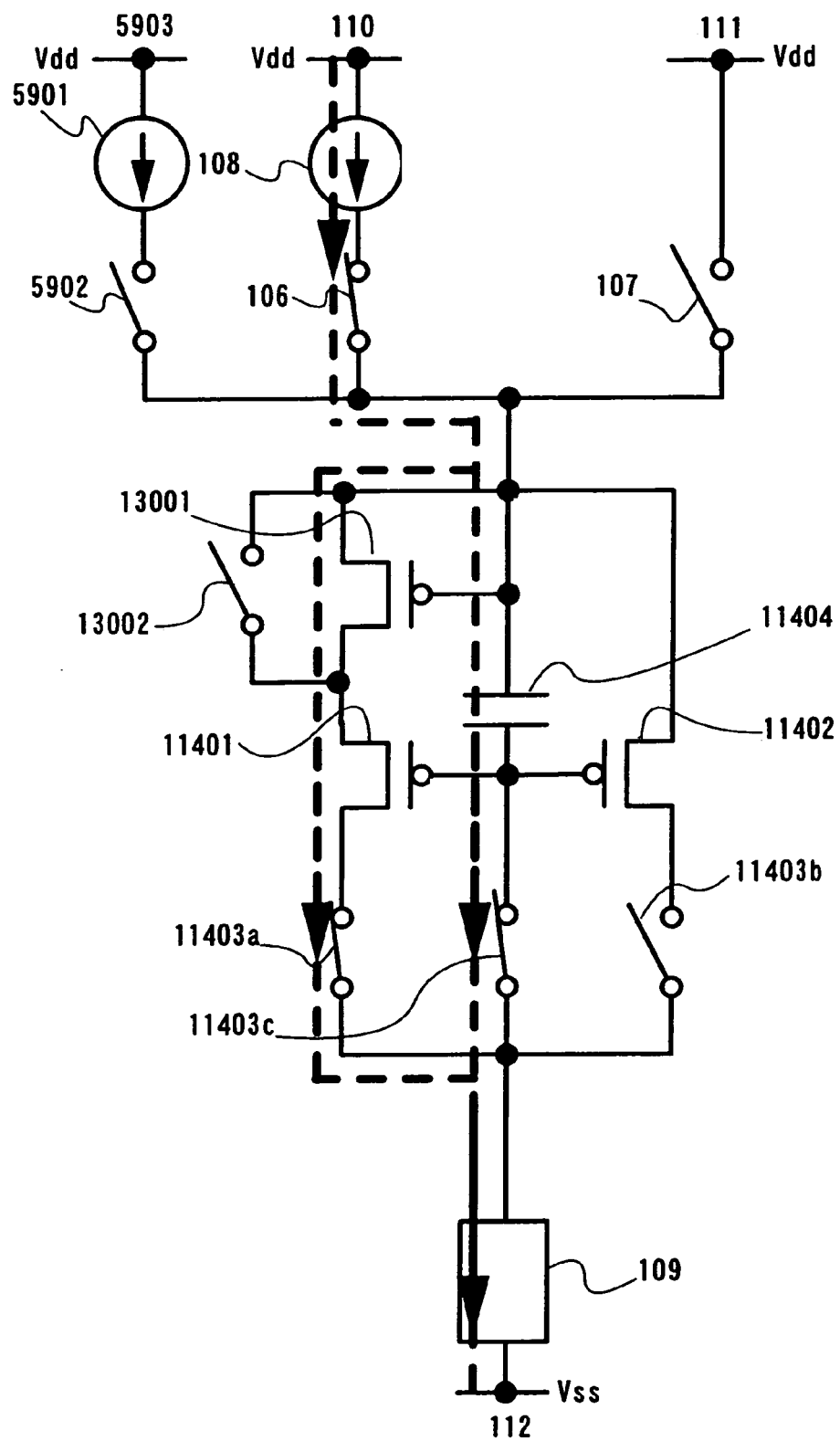

FIG. 132 is a diagram showing an operation of a current source circuit of the invention.

Figure 133:
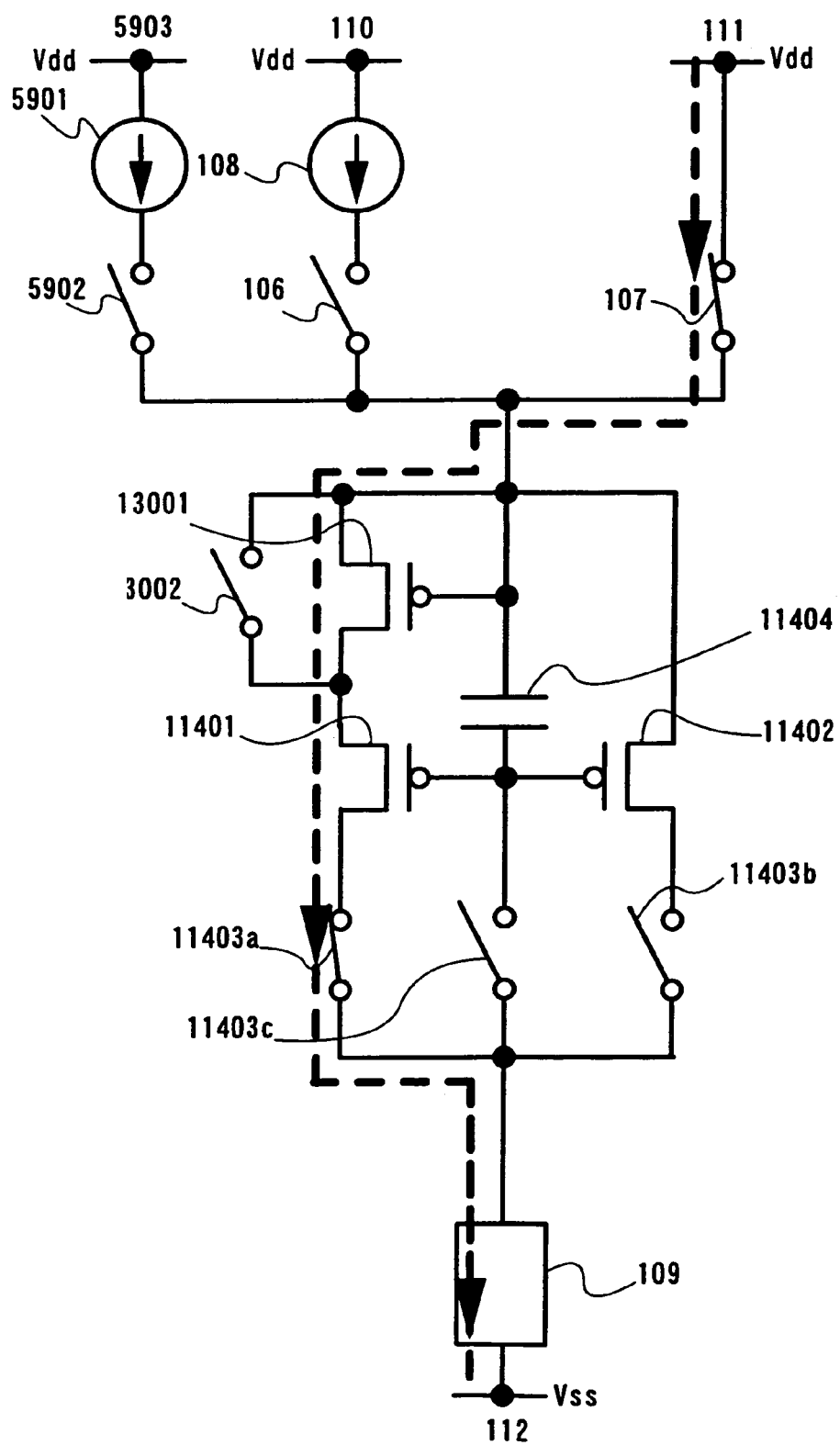

FIG. 133 is a diagram showing an operation of a current source circuit of the invention.

Figure 134:
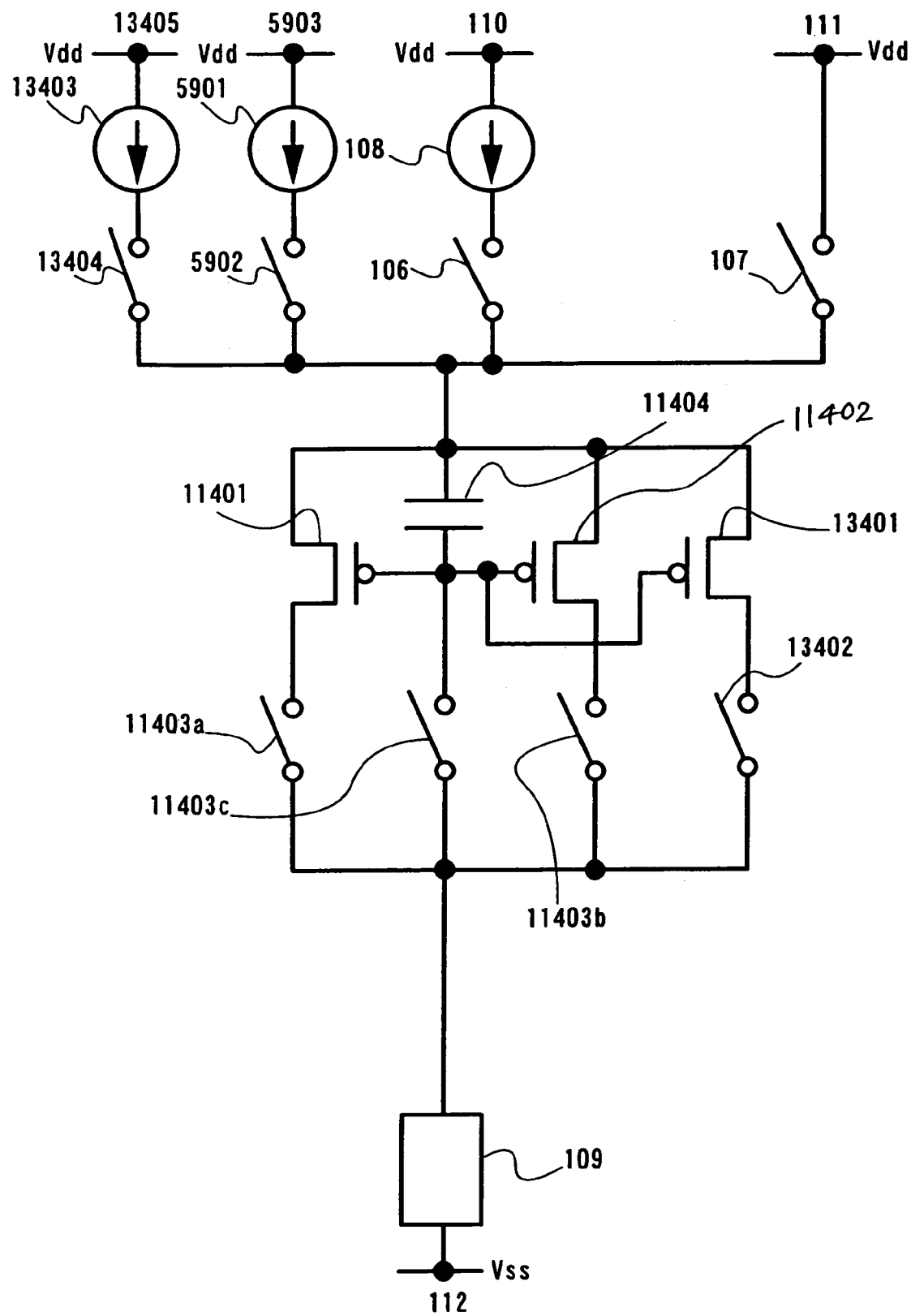

FIG. 134 is a diagram showing a configuration of a current source circuit of the invention.

Figure 135:
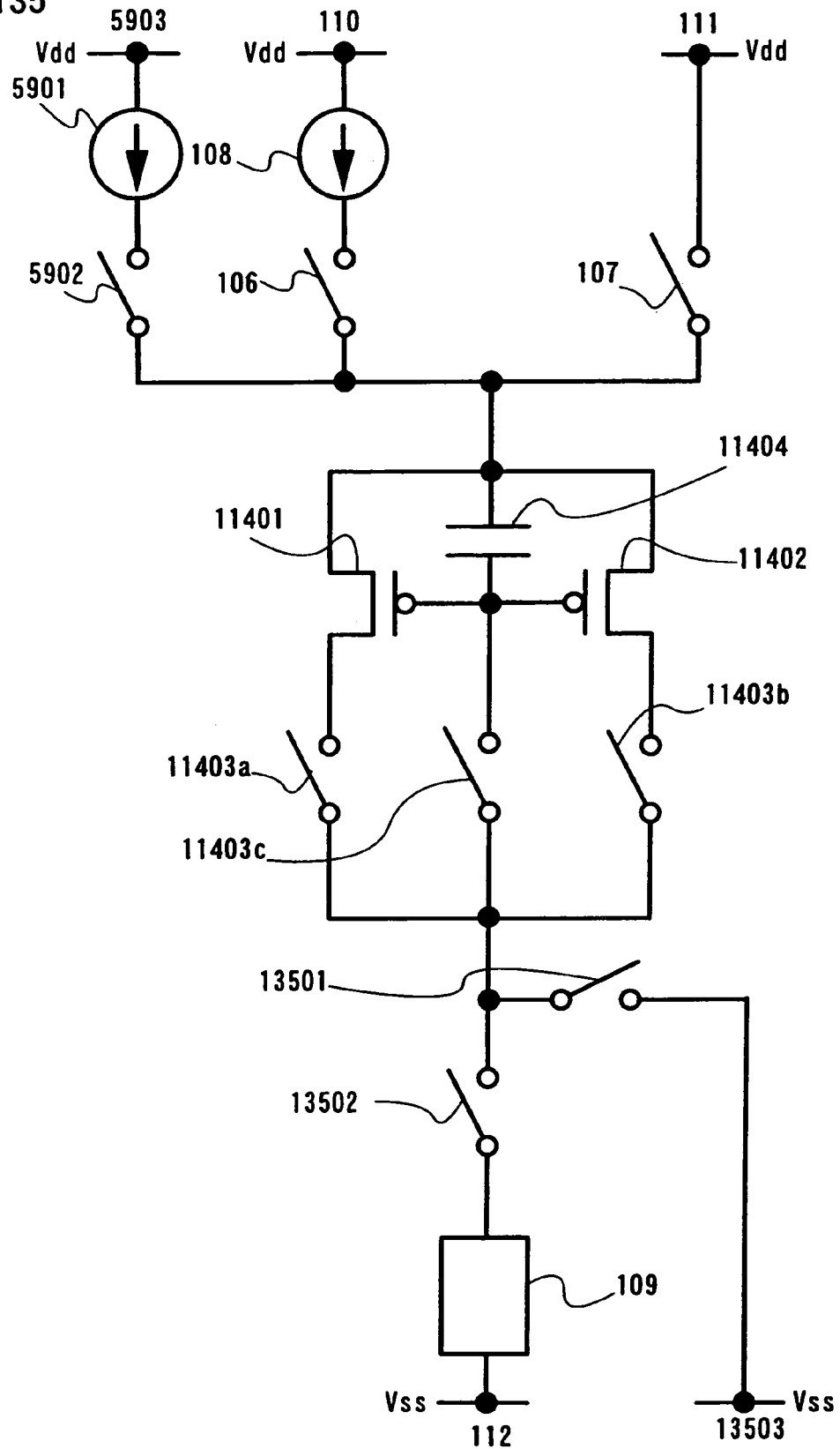

FIG. 135 is a diagram showing a configuration of a current source circuit of the invention.

Figure 136:
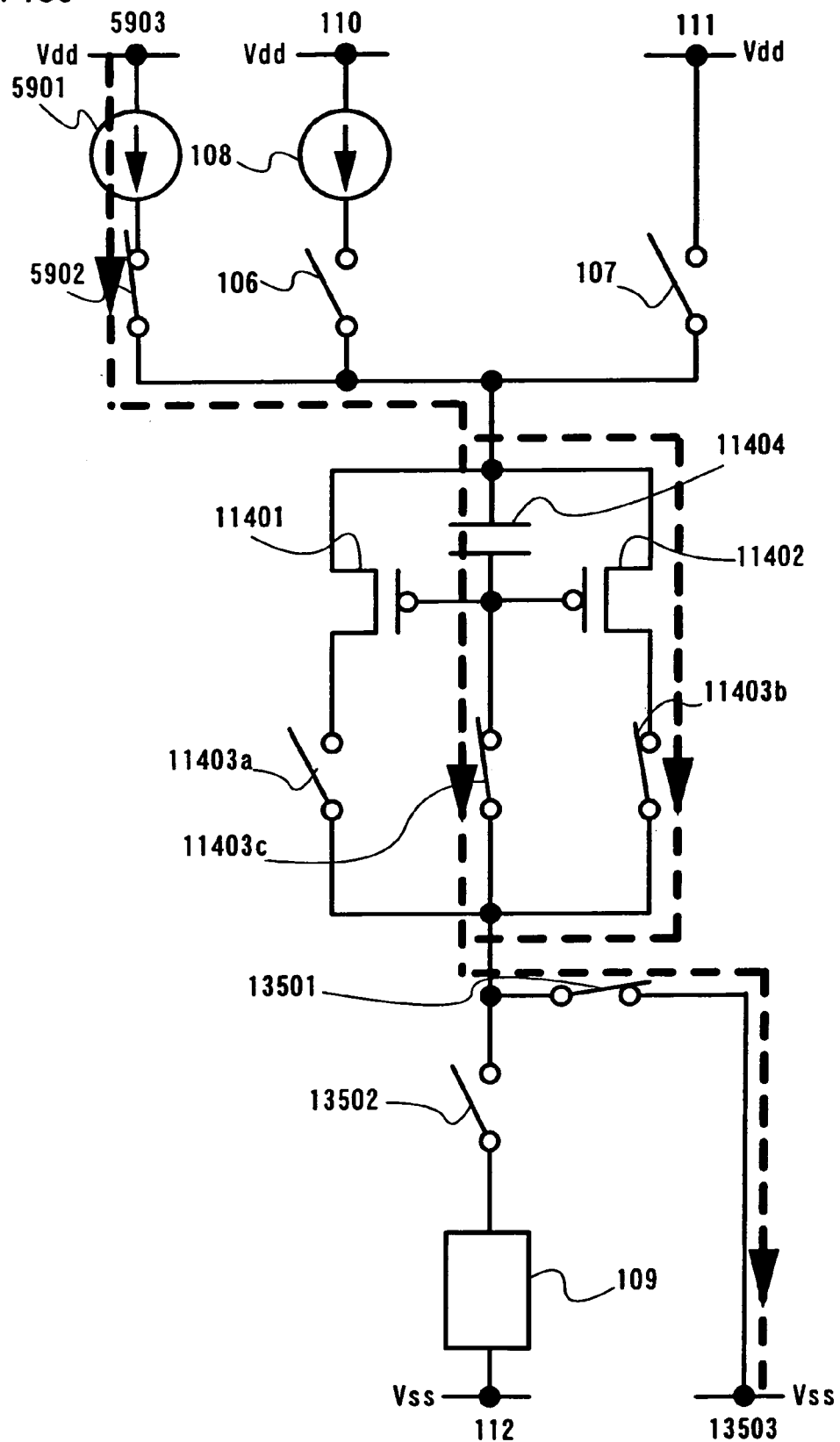

FIG. 136 is a diagram showing an operation of a current source circuit of the invention.

Figure 137:
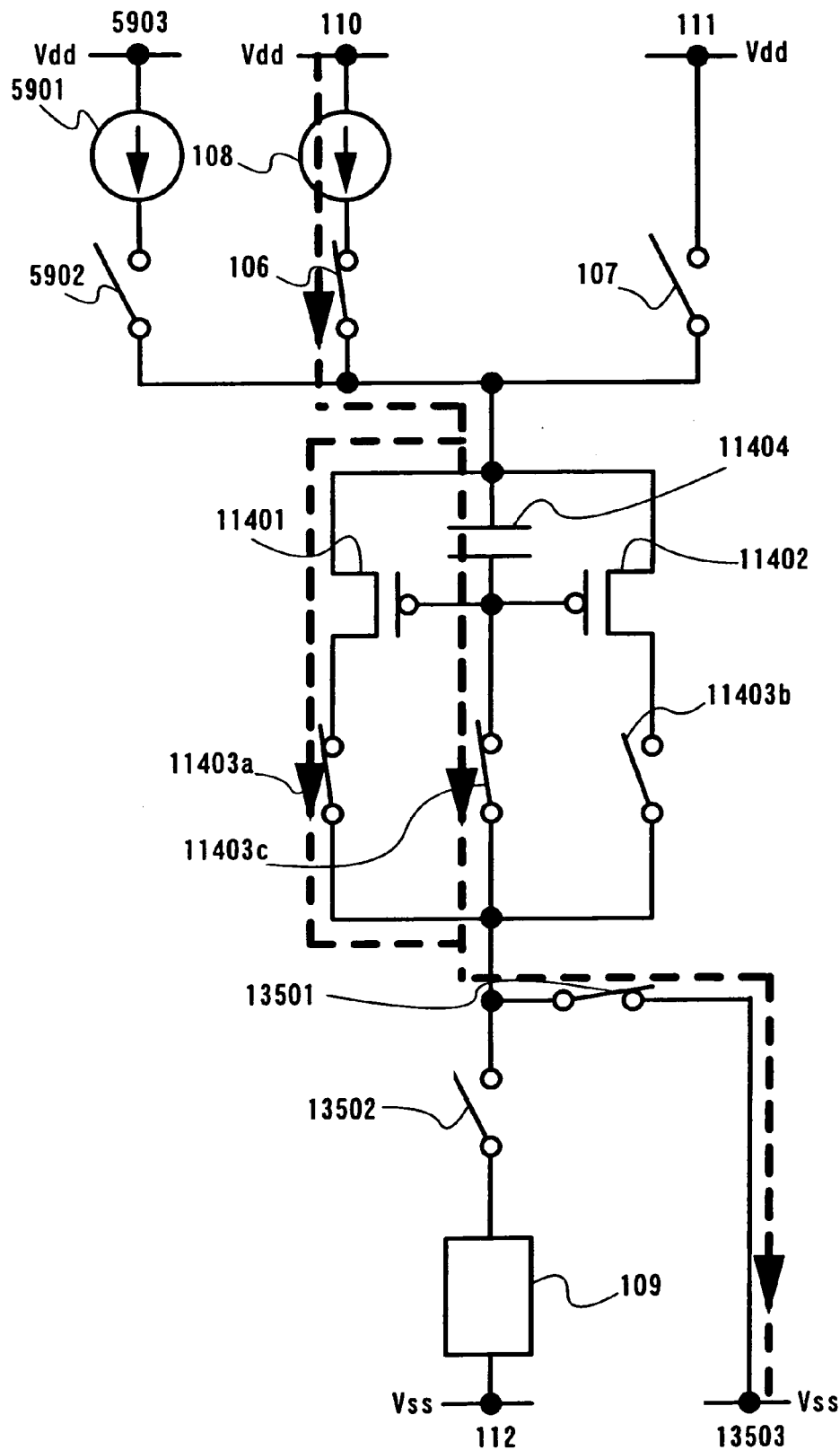

FIG. 137 is a diagram showing an operation of a current source circuit of the invention.

Figure 138:
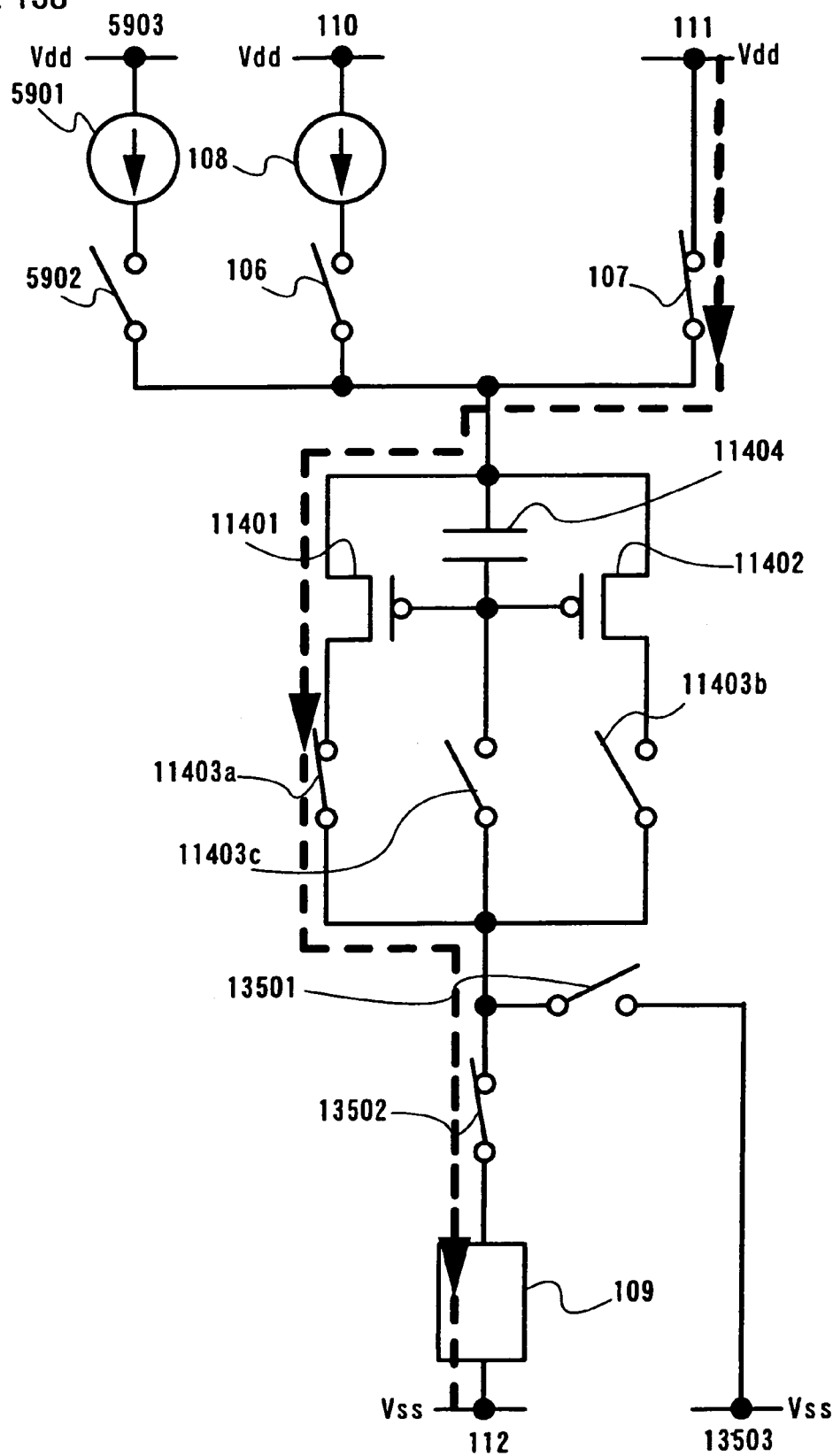

FIG. 138 is a diagram showing an operation of a current source circuit of the invention.

Figure 139:
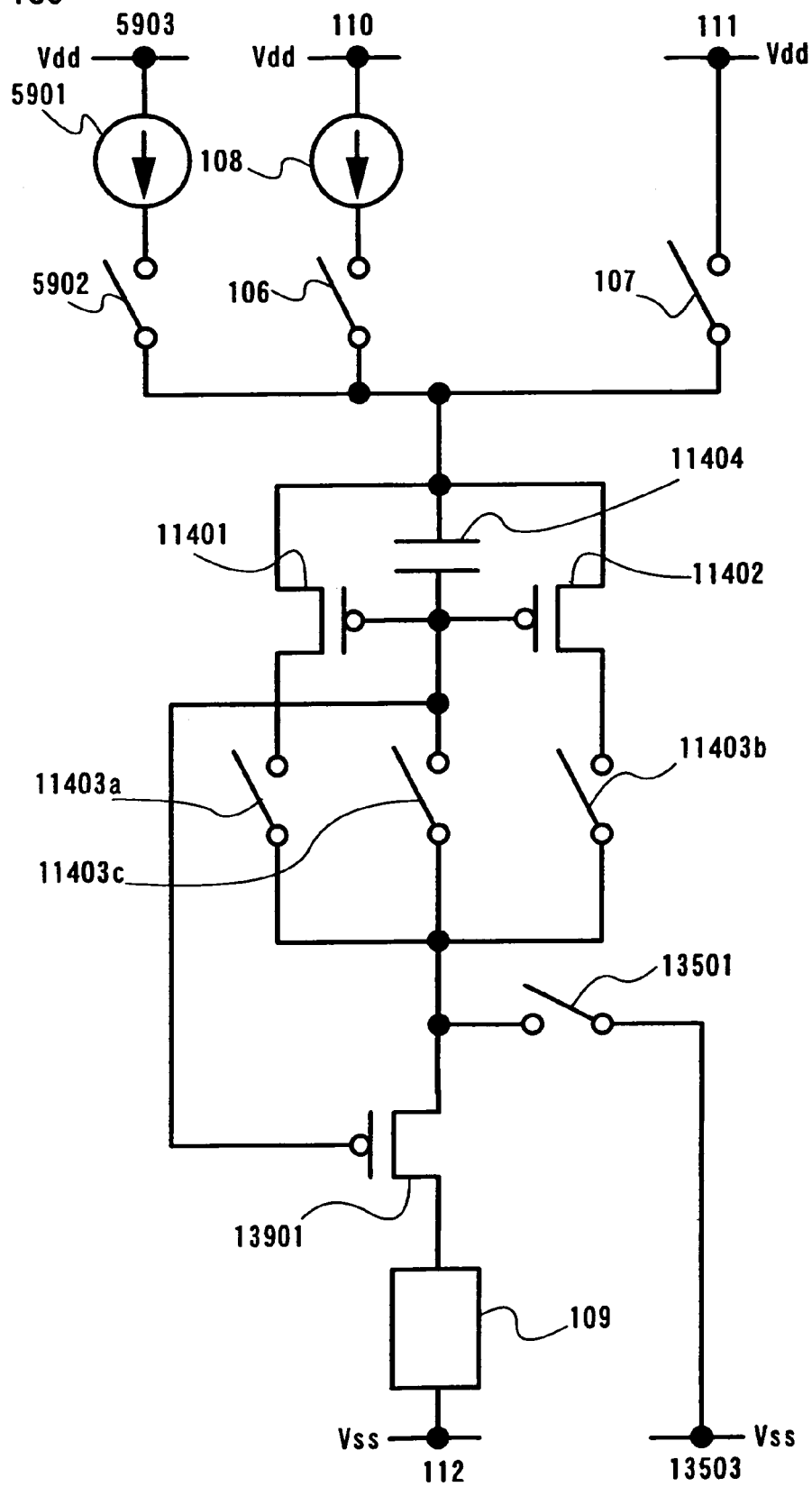

FIG. 139 is a diagram showing a configuration of a current source circuit of the invention.

Figure 140:
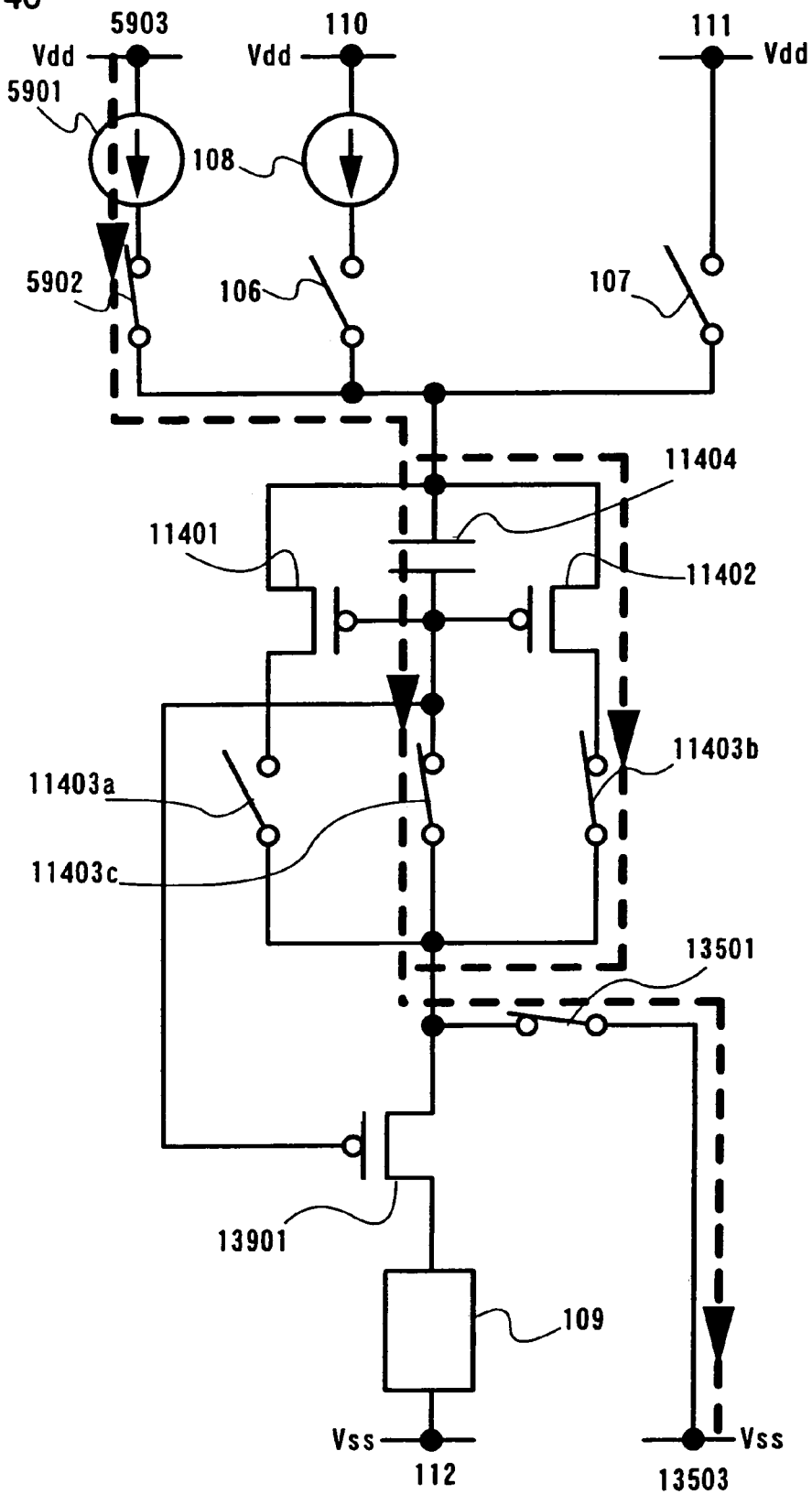

FIG. 140 is a diagram showing an operation of a current source circuit of the invention.

Figure 141:
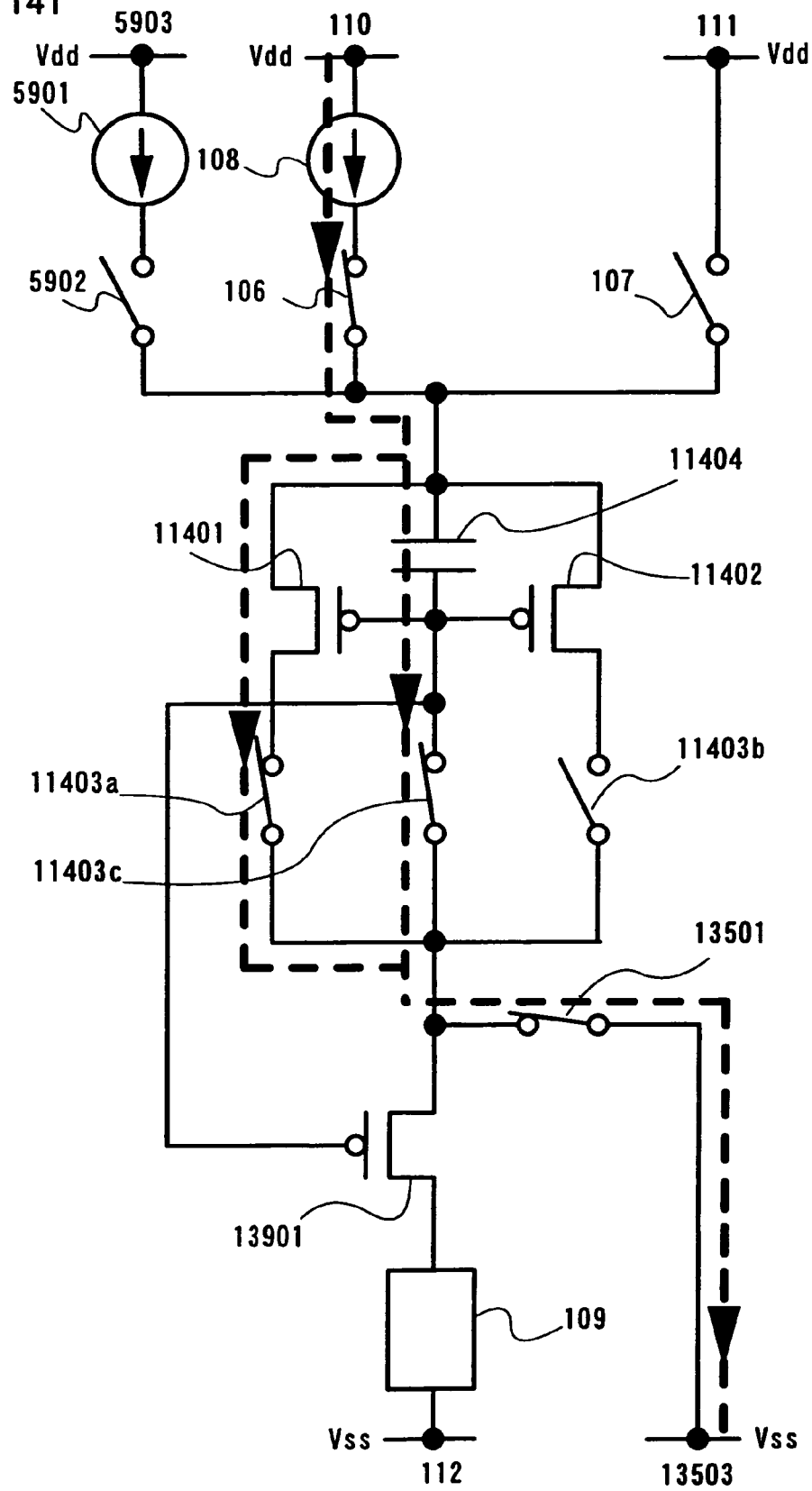

FIG. 141 is a diagram showing an operation of a current source circuit of the invention.

Figure 142:
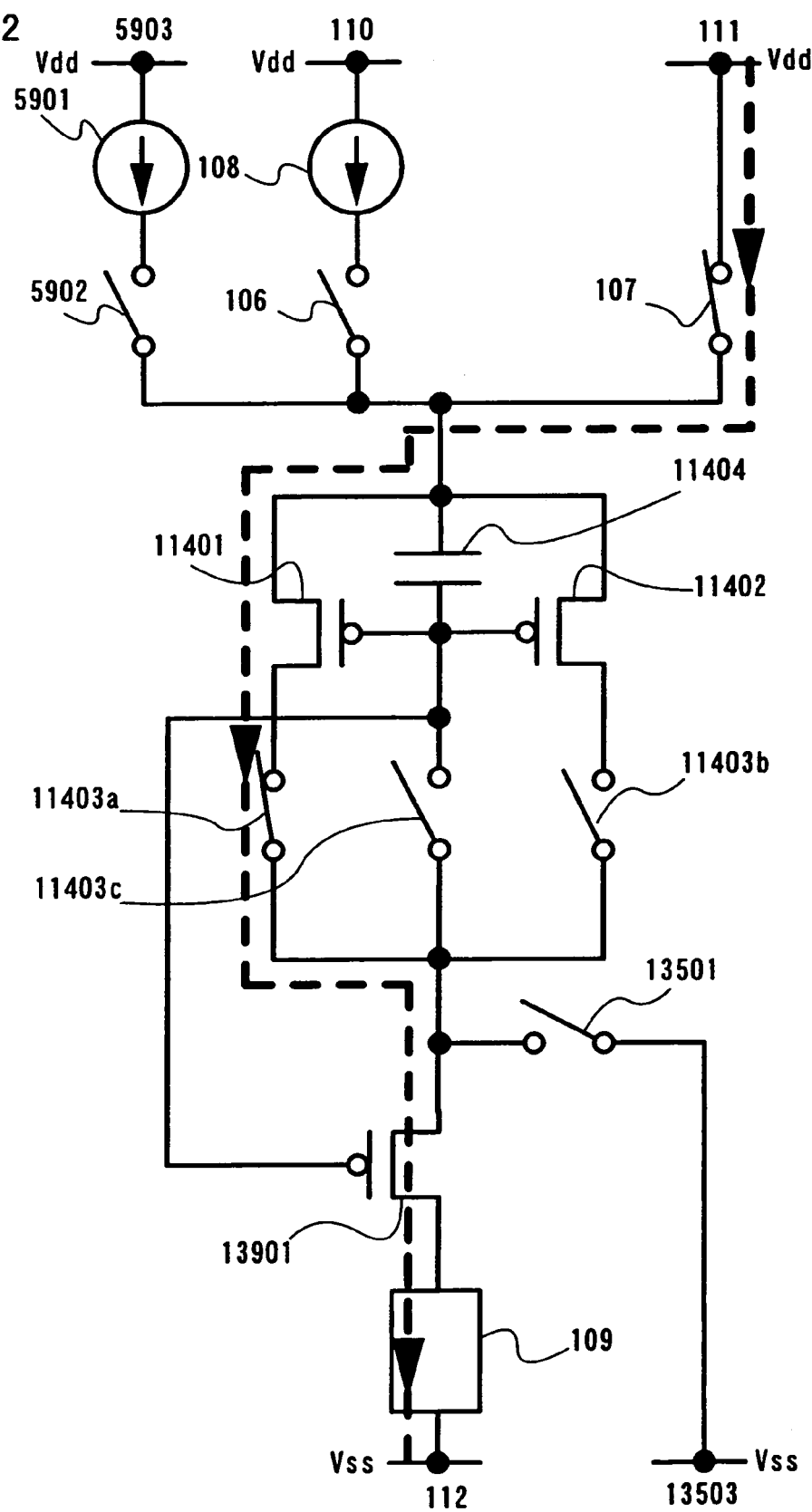

FIG. 142 is a diagram showing an operation of a current source circuit of the invention.

Figure 143:
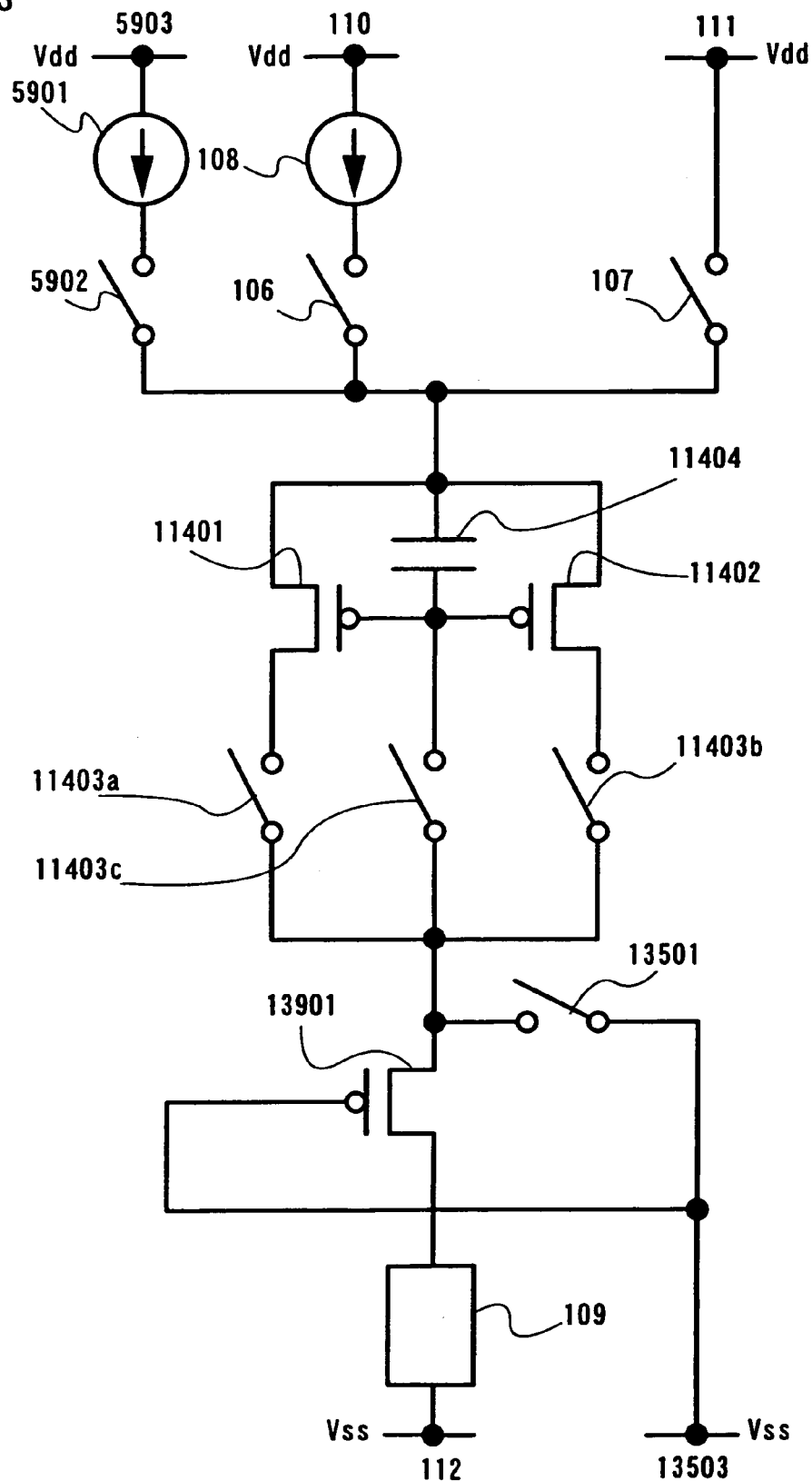

FIG. 143 is a diagram showing a configuration of a current source circuit of the invention.

Figure 144:
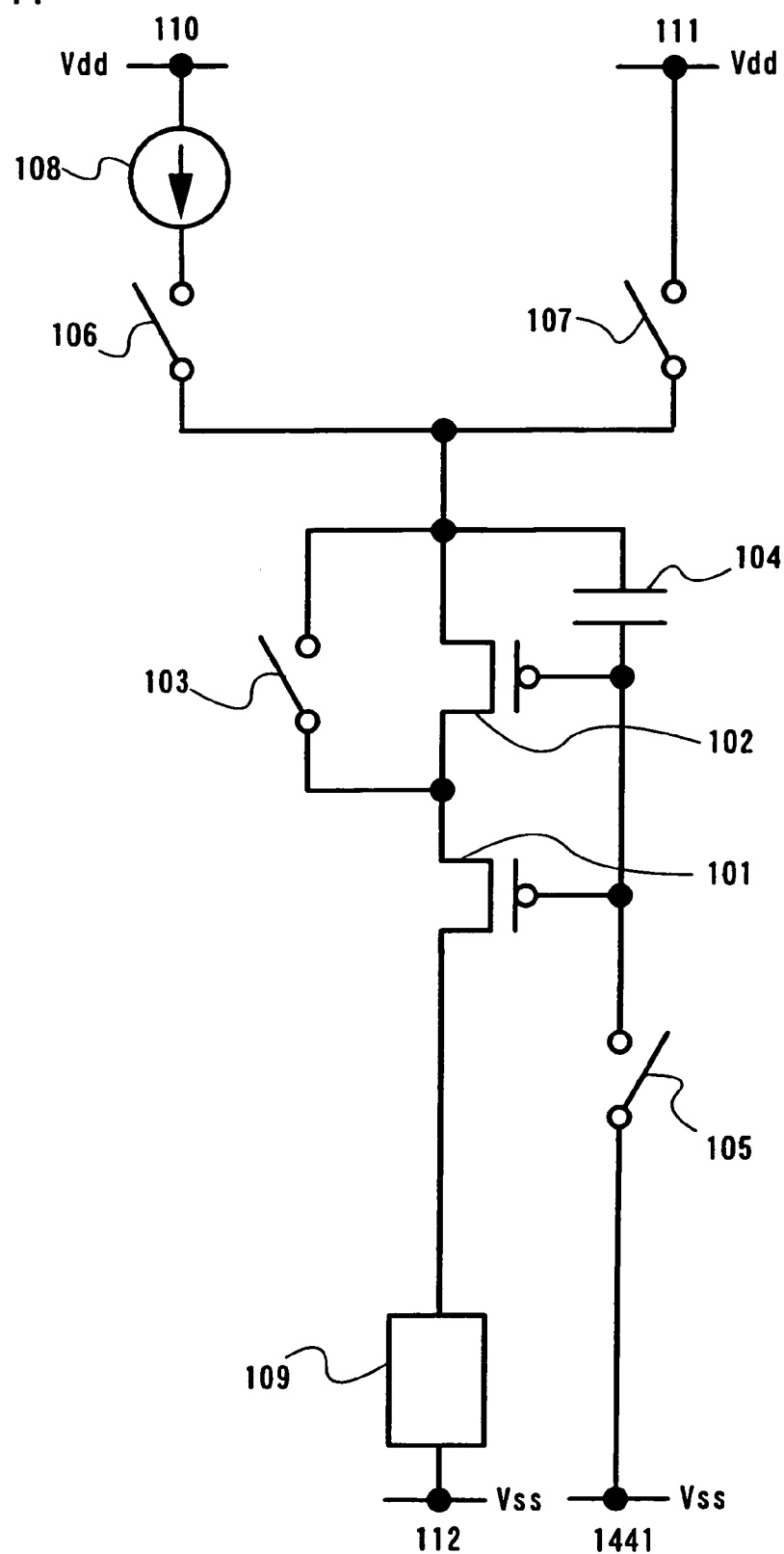

FIG. 144 is a diagram showing a configuration of a current source circuit of the invention.

Figure 145:
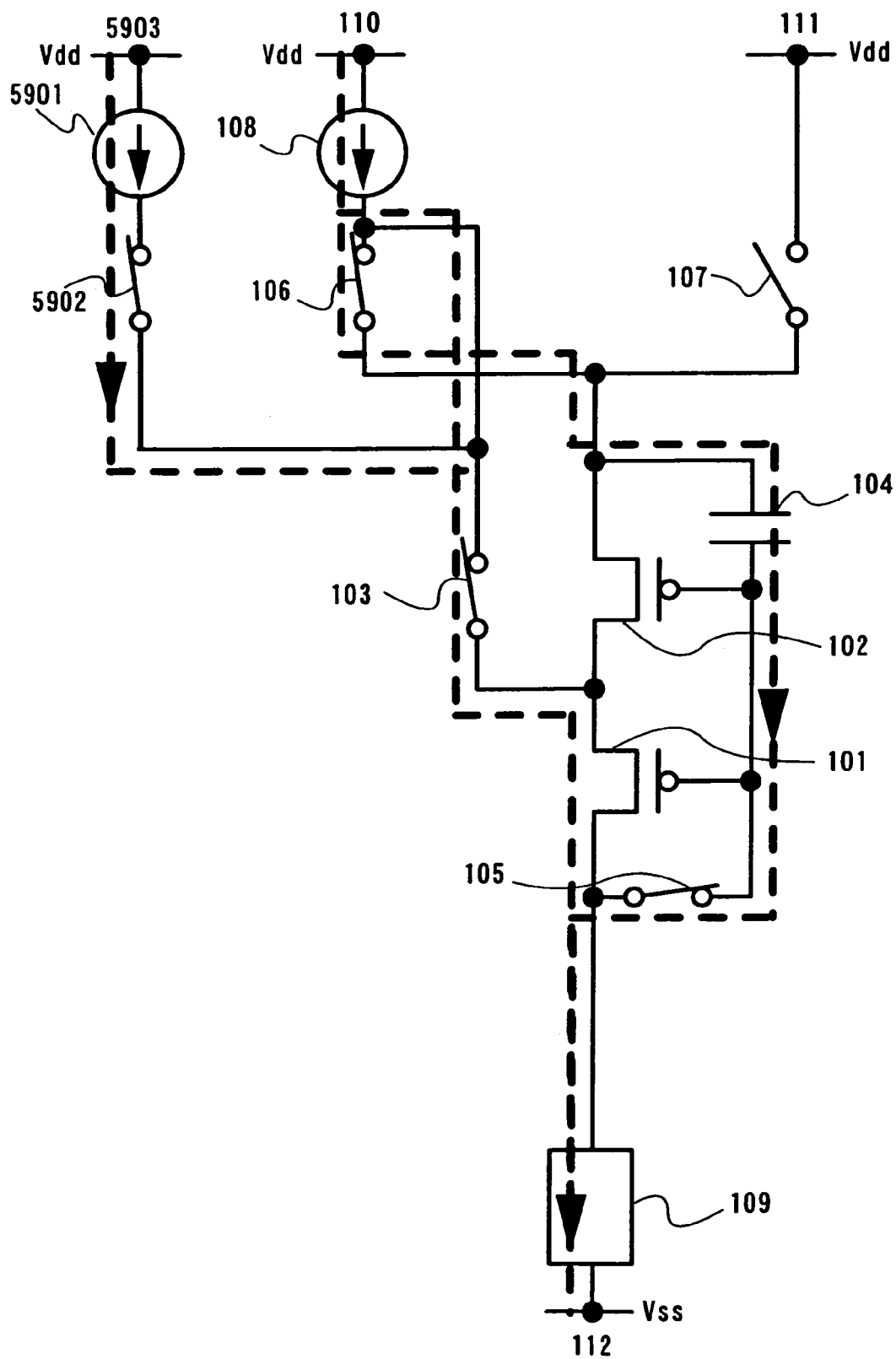

FIG. 145 is a diagram showing an operation of a current source circuit of the invention.

Figure 146:
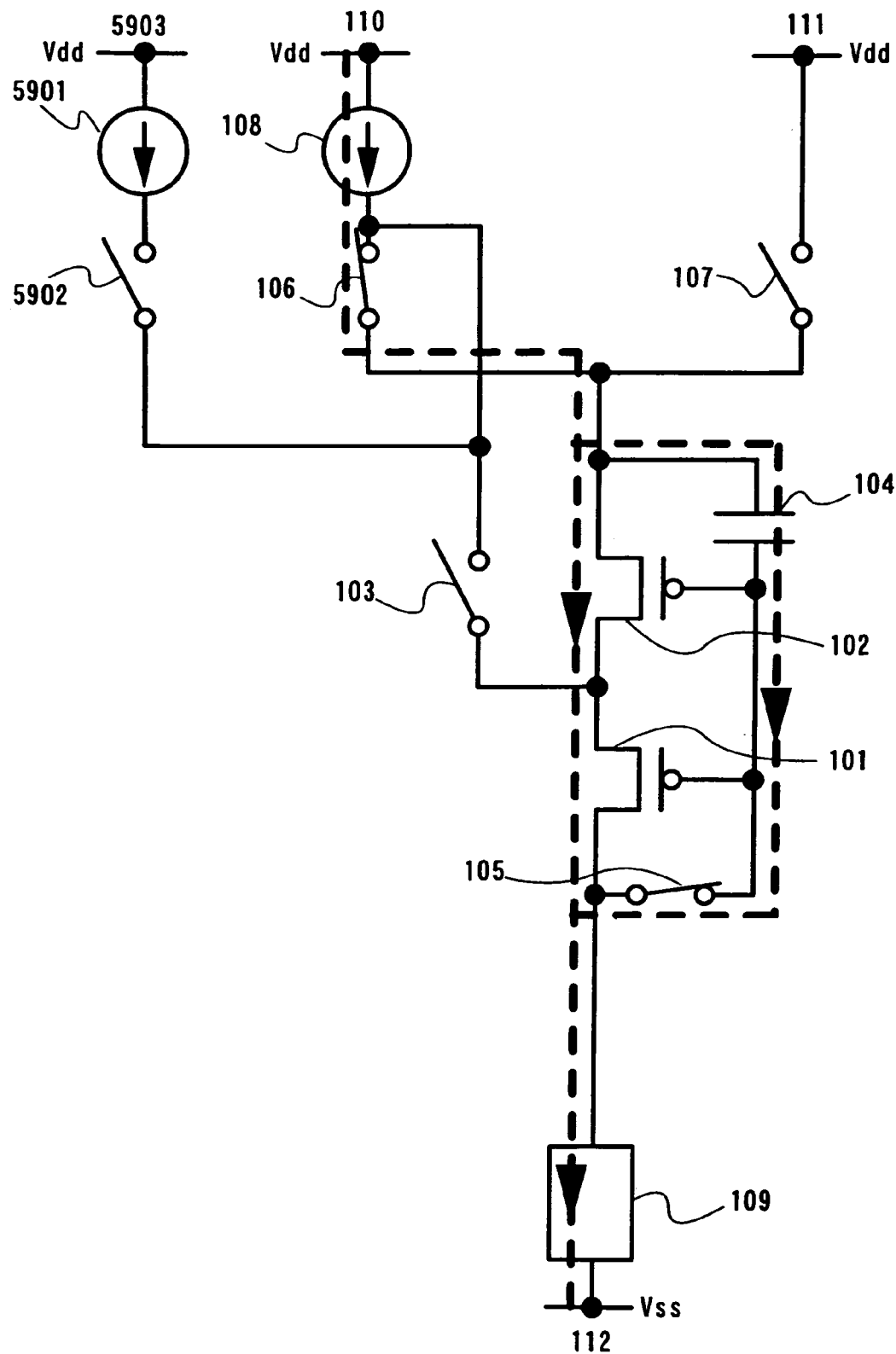

FIG. 146 is a diagram showing an operation of a current source circuit of the invention.

Figure 147:
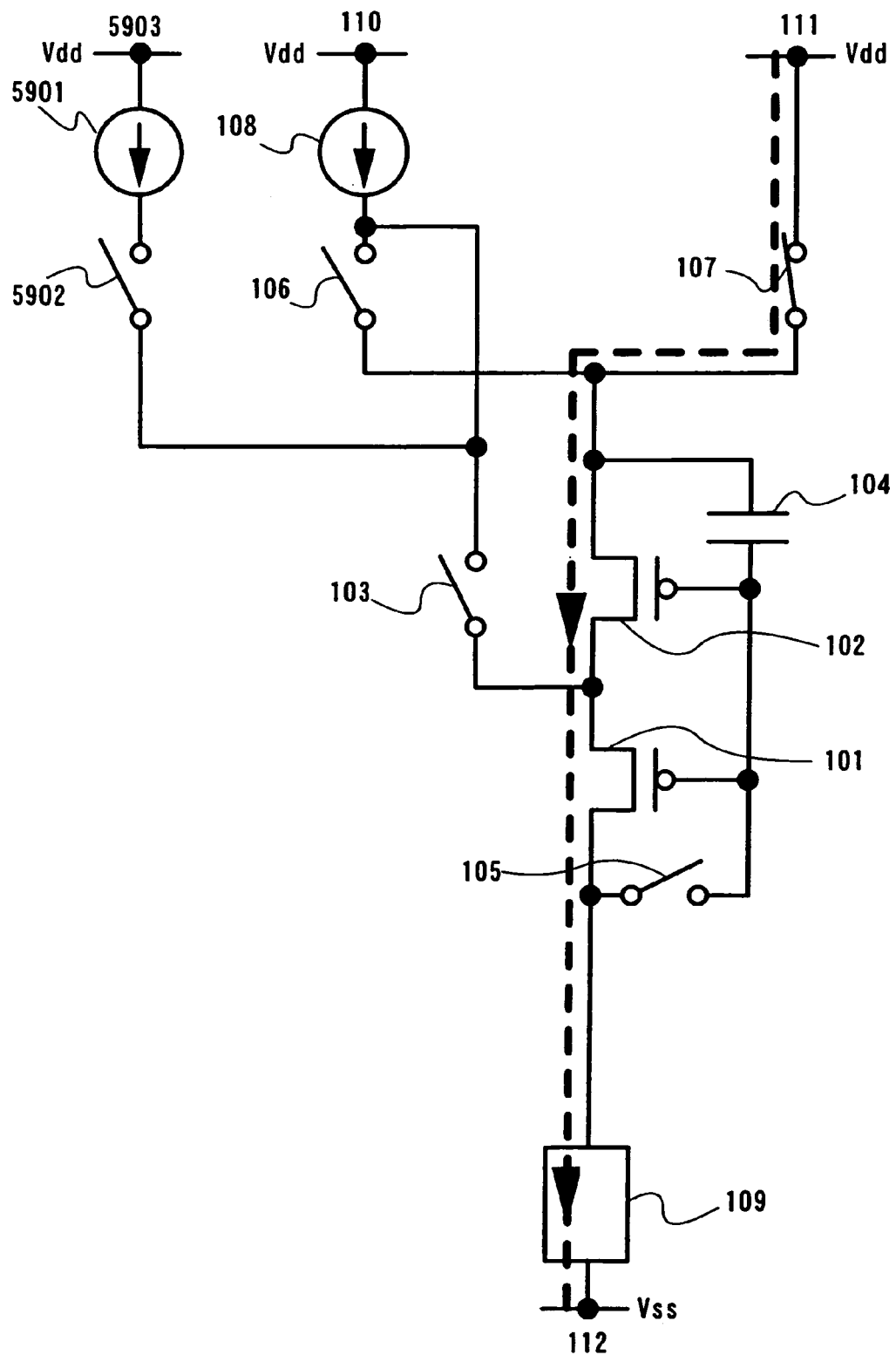

FIG. 147 is a diagram showing an operation of a current source circuit of the invention.

Figure 148:
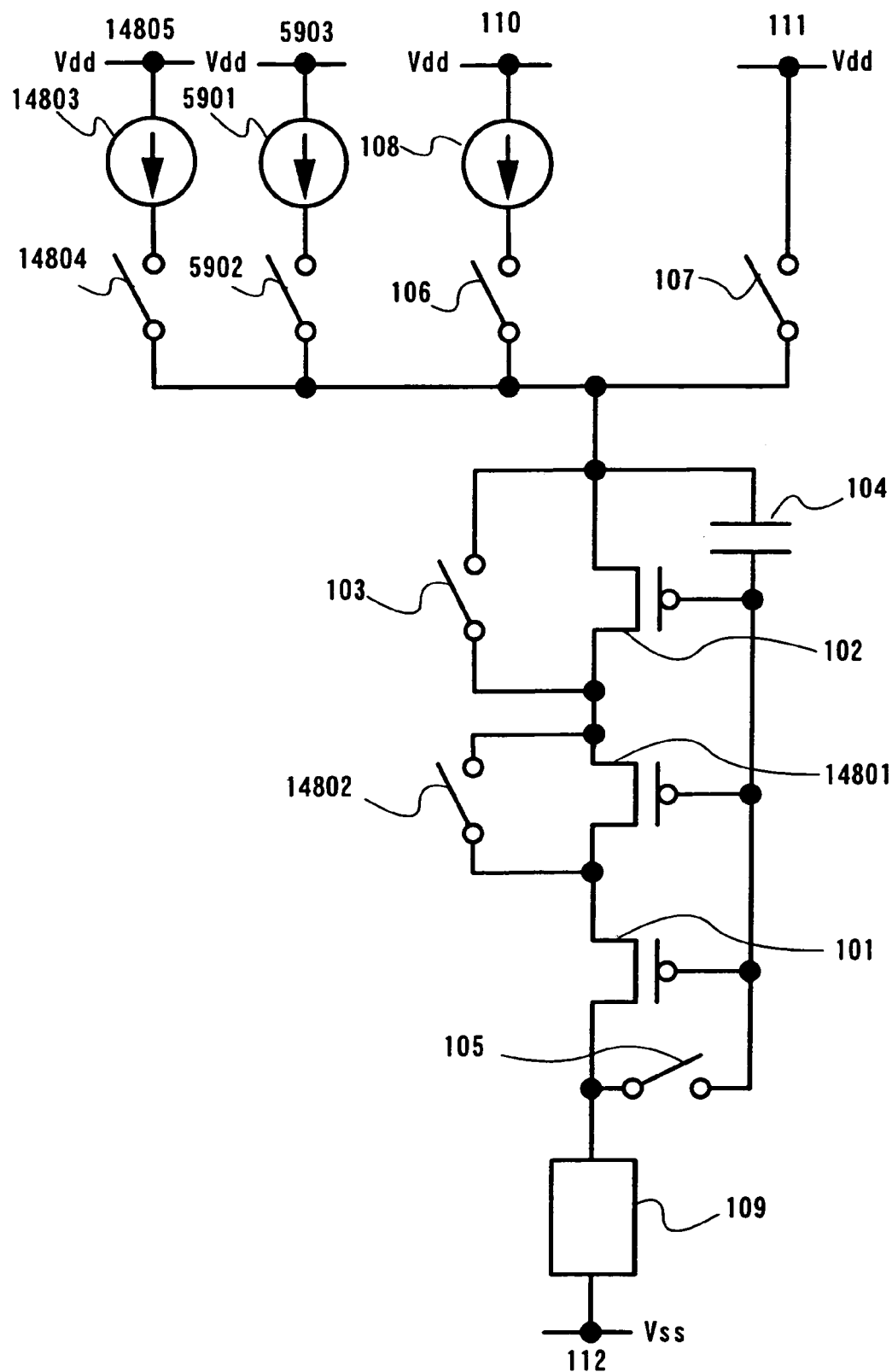

FIG. 148 is a diagram showing a configuration of a current source circuit of the invention.

Figure 149:
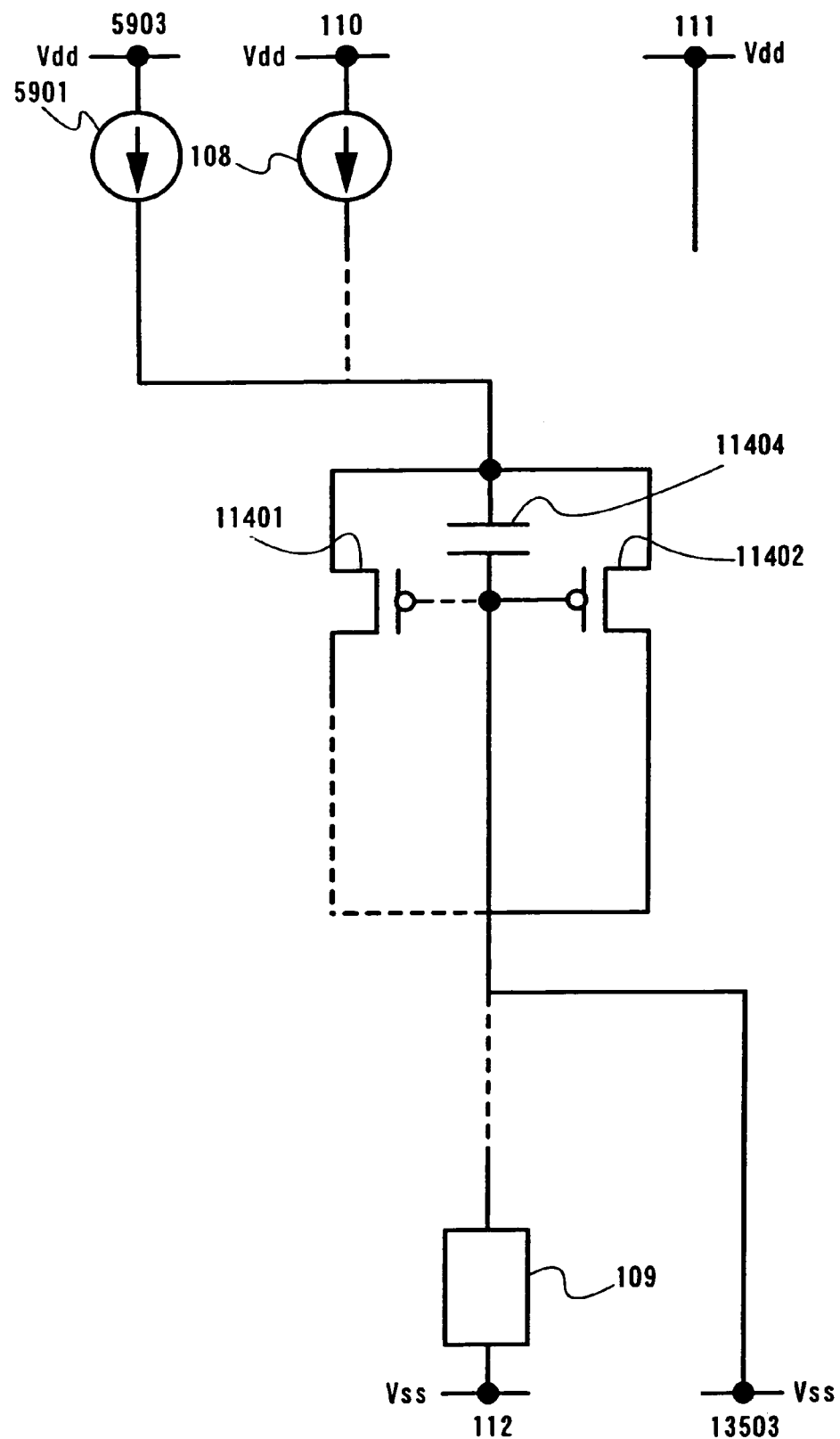

FIG. 149 is a diagram showing connections of a certain operation of a current source circuit of the invention.

Figure 150:
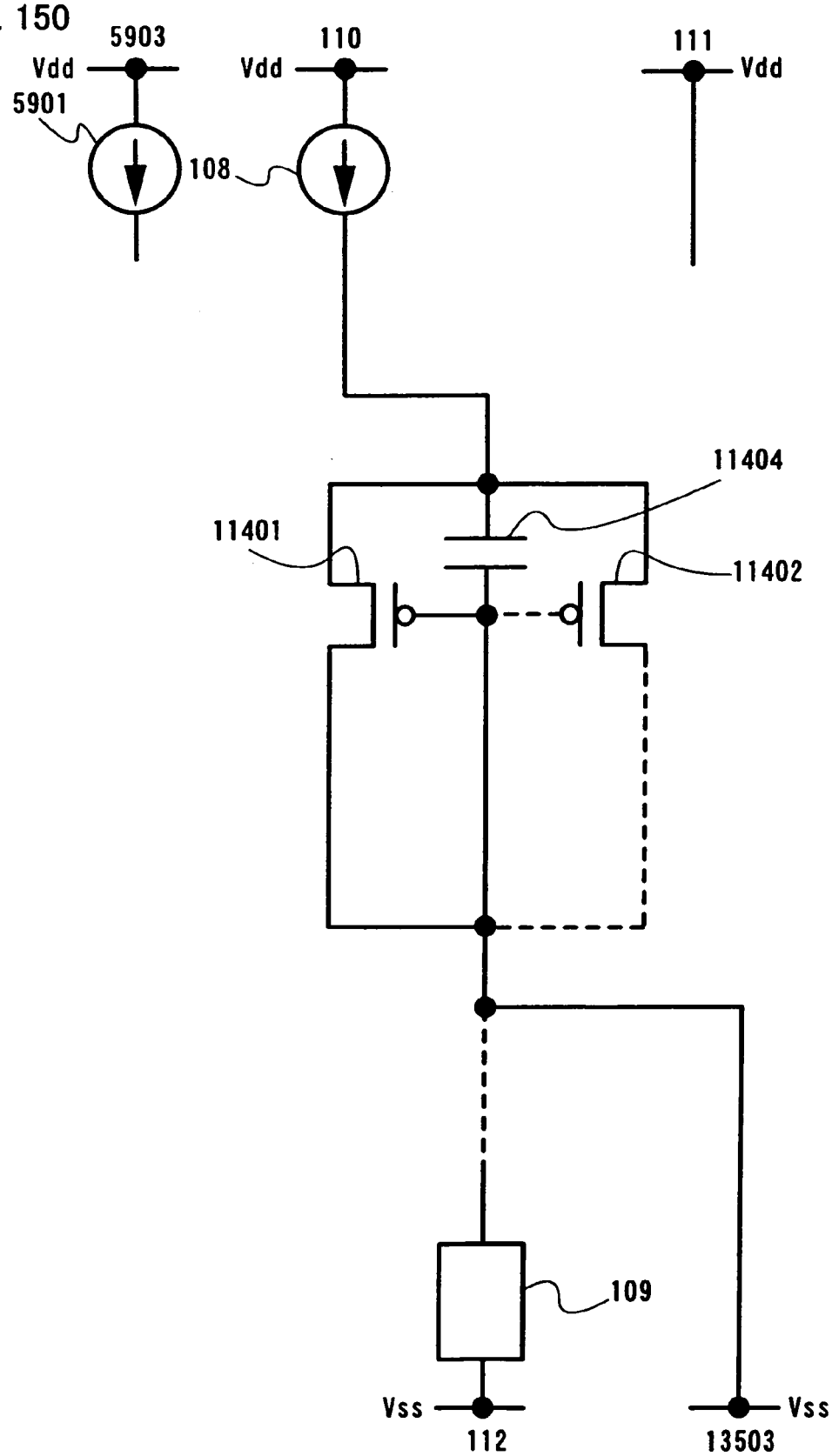

FIG. 150 is a diagram showing connections of a certain operation of a current source circuit of the invention.

Figure 151:
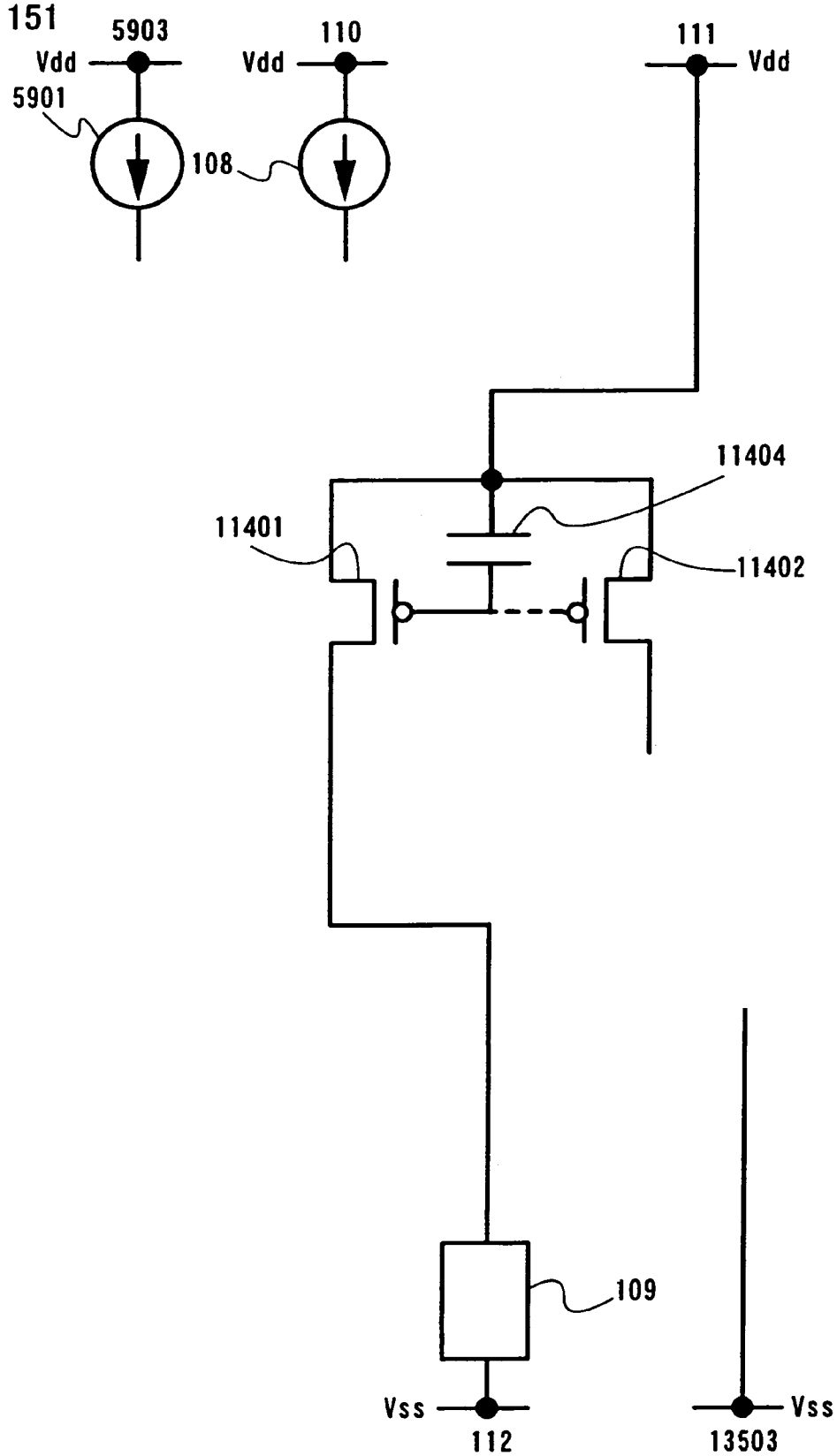

FIG. 151 is a diagram showing connections of a certain operation of a current source circuit of the invention.

Figure 152:
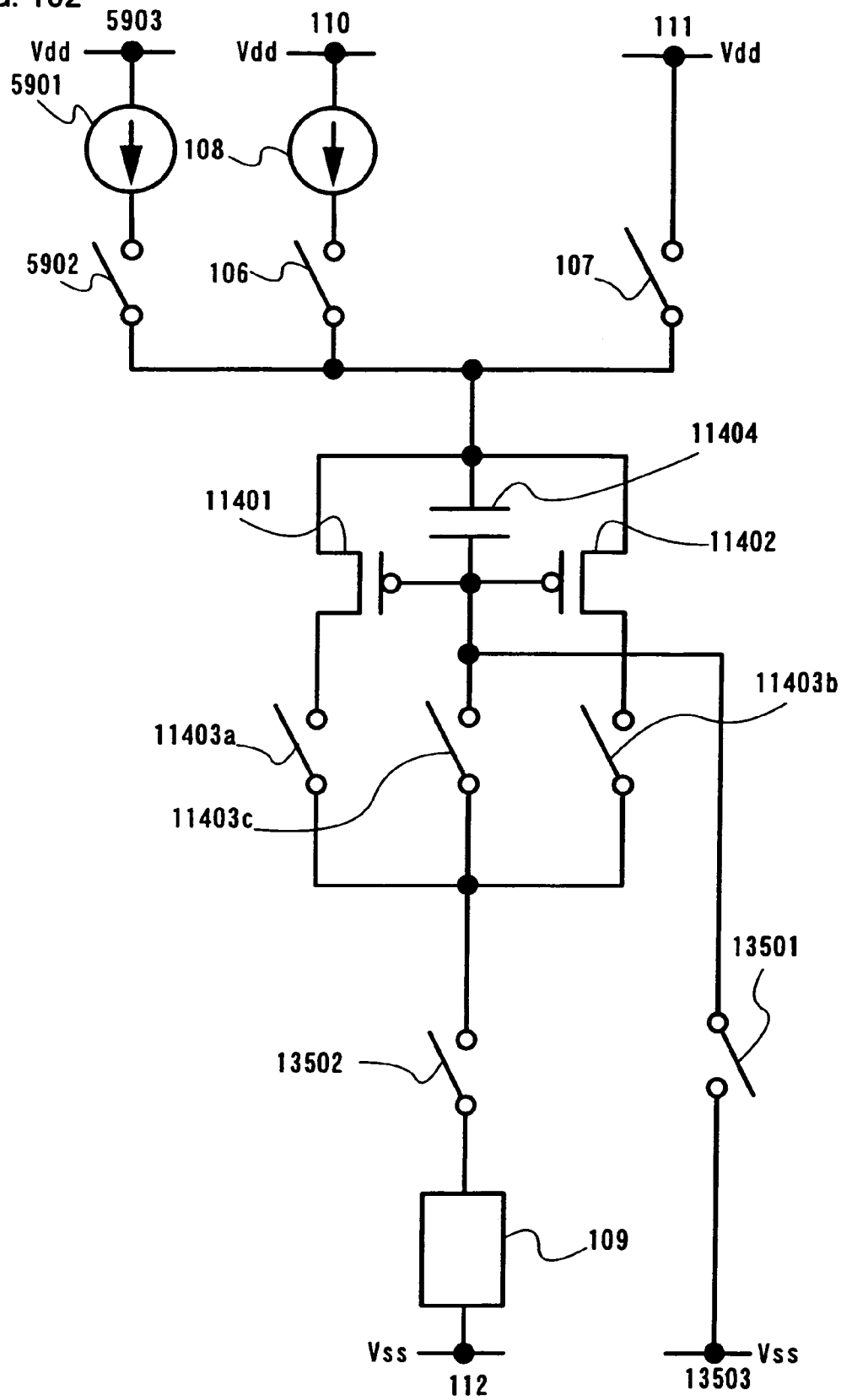

FIG. 152 is a diagram showing a configuration of a current source circuit of the invention.

Figure 153:
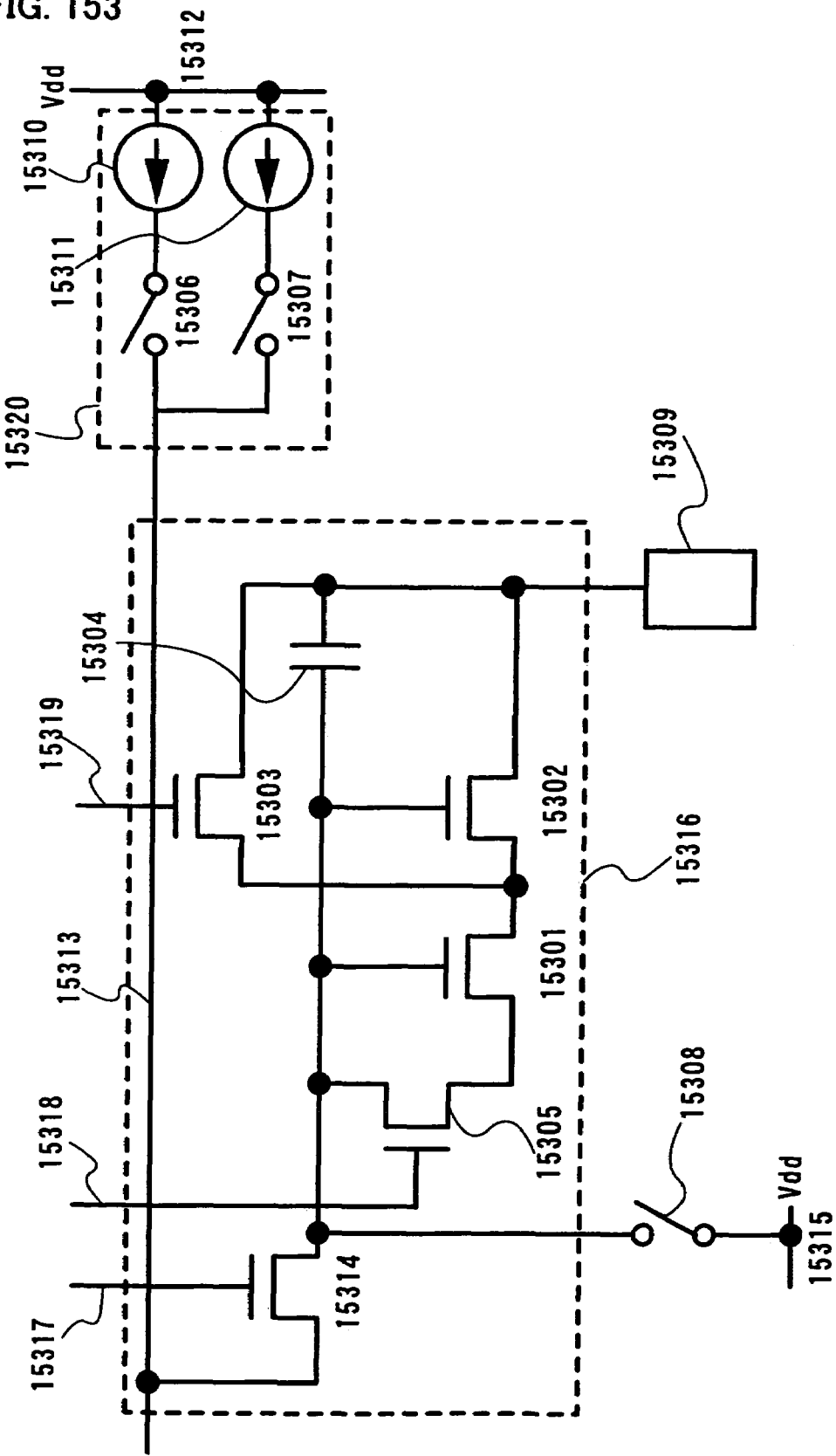

FIG. 153 is a diagram showing a portion of a configuration of a signal line driver circuit of the invention.

Figure 154:
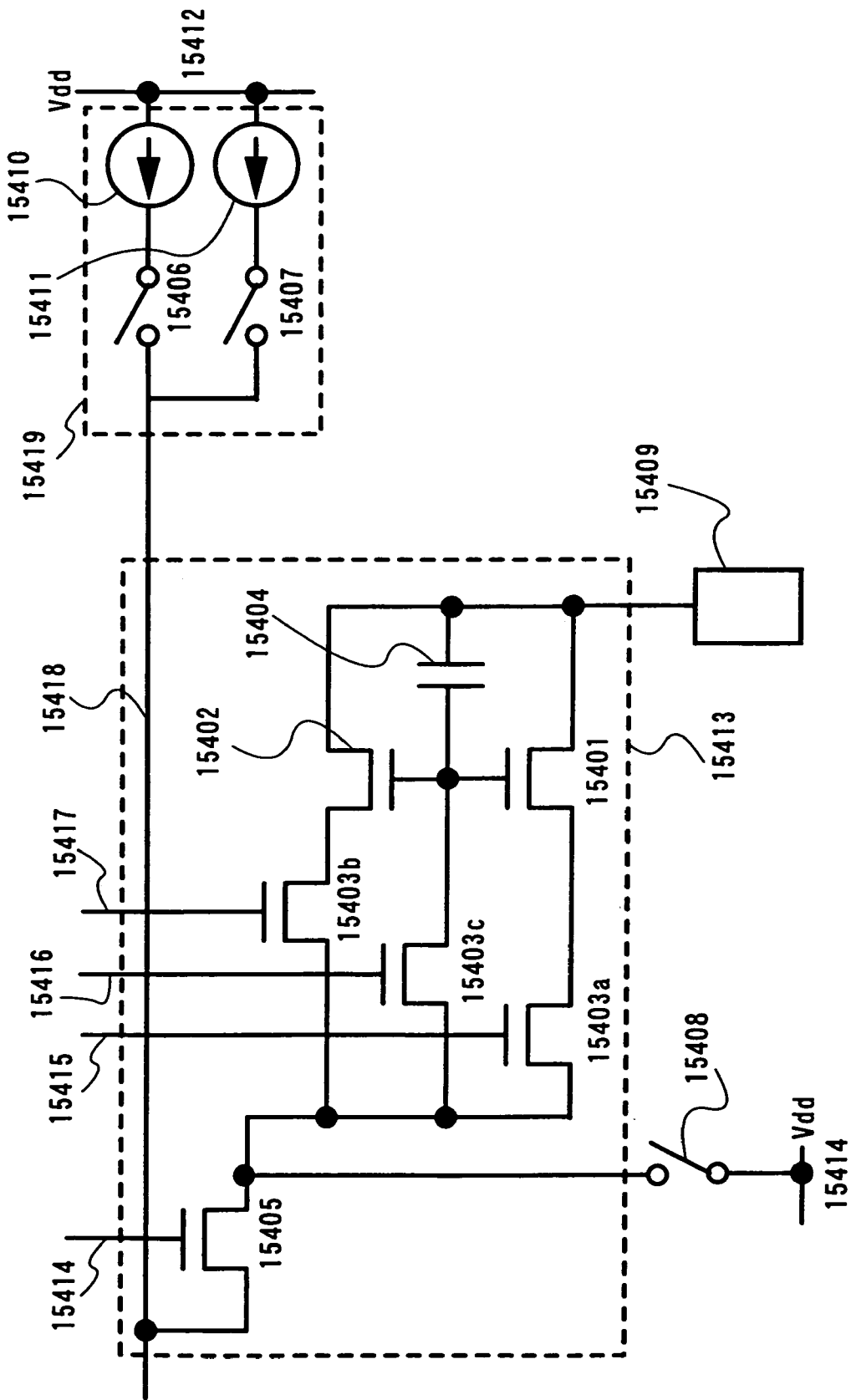

FIG. 154 is a diagram showing a portion of a configuration of a signal line driver circuit of the invention.

Figure 155:
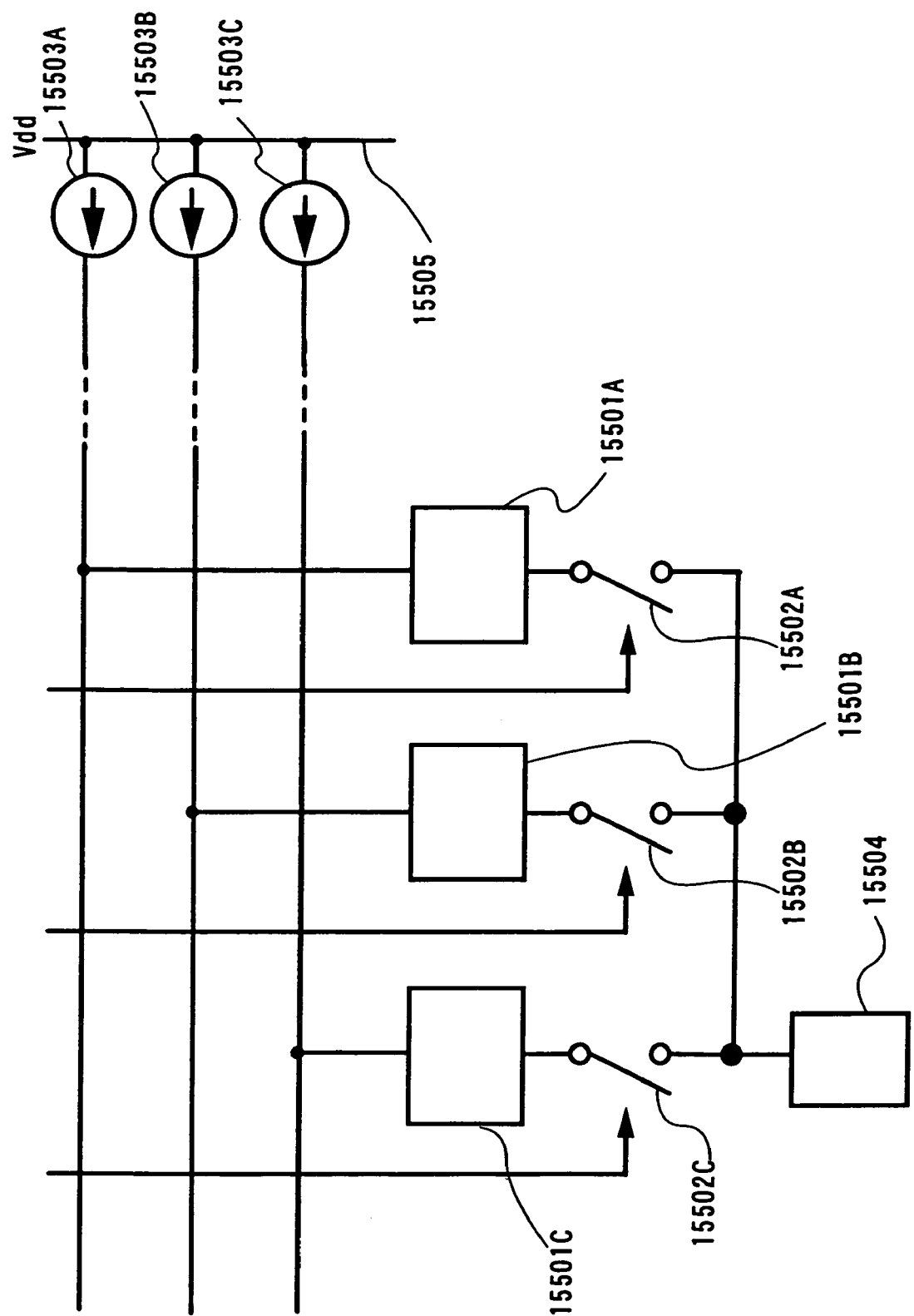

FIG. 155 is a diagram showing a portion of a configuration of a signal line driver circuit of the invention.

Figure 156:
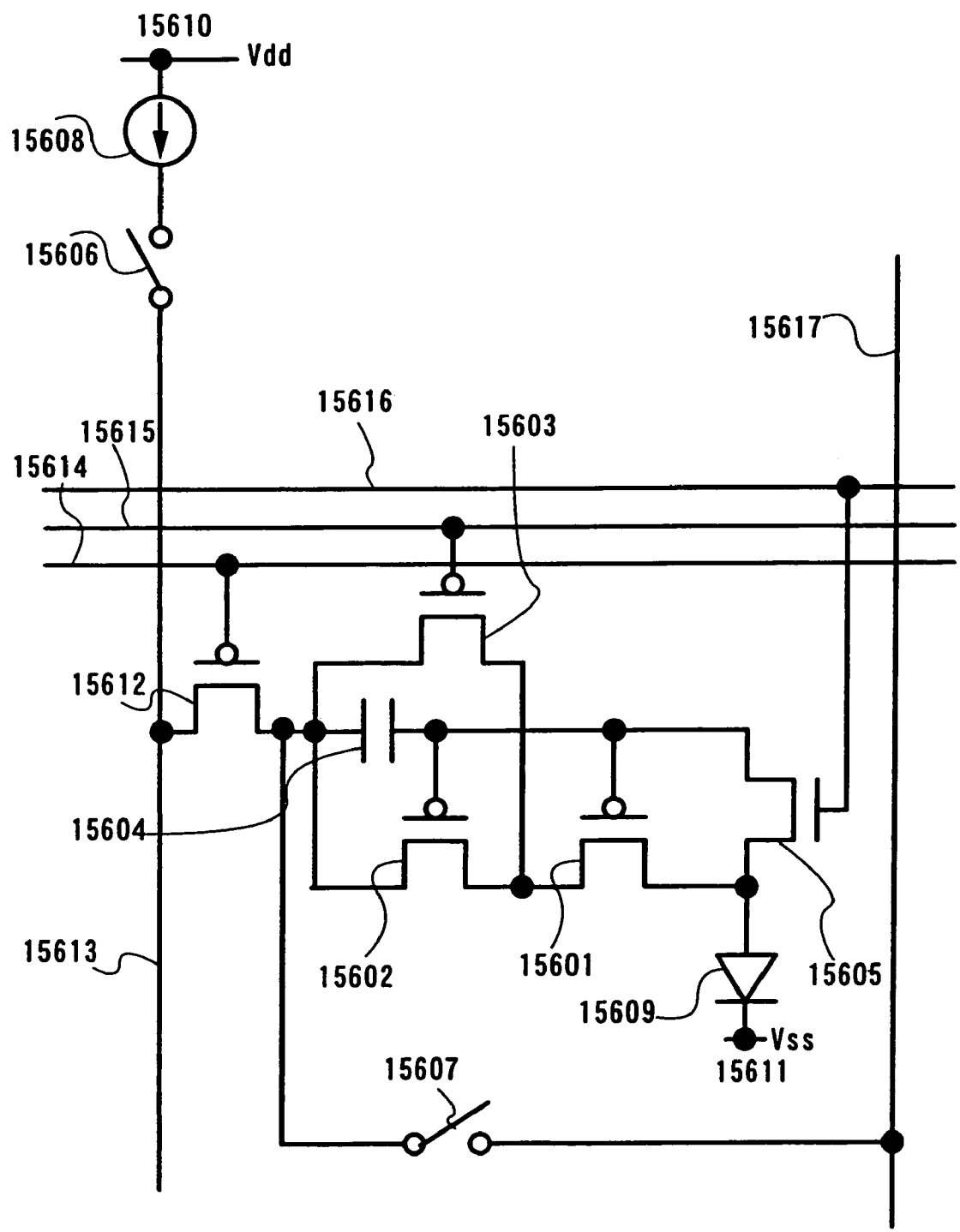

FIG. 156 is a diagram showing a pixel configuration of the invention.

Figure 157:
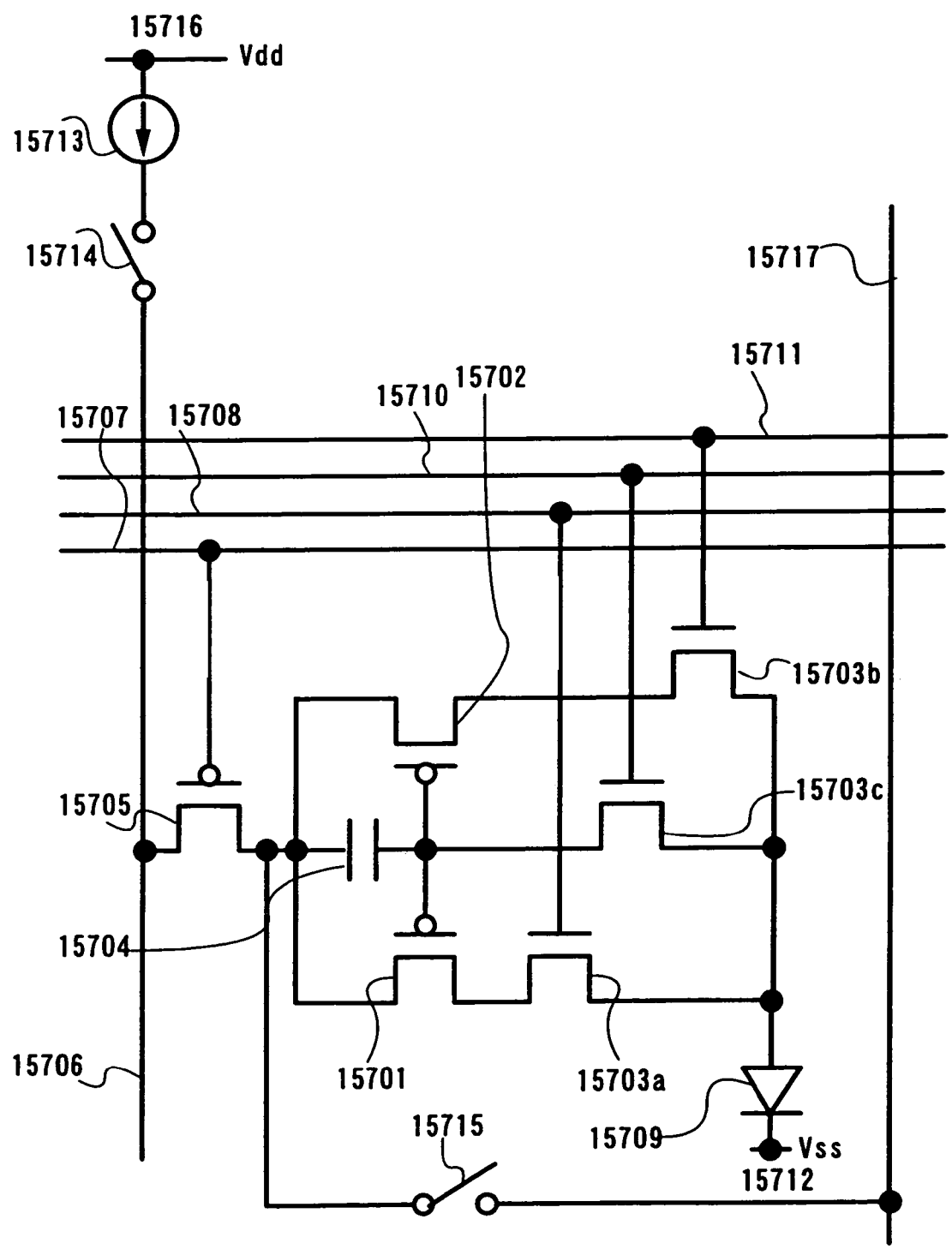

FIG. 157 is a diagram showing a pixel configuration of the invention.

Figure 158:
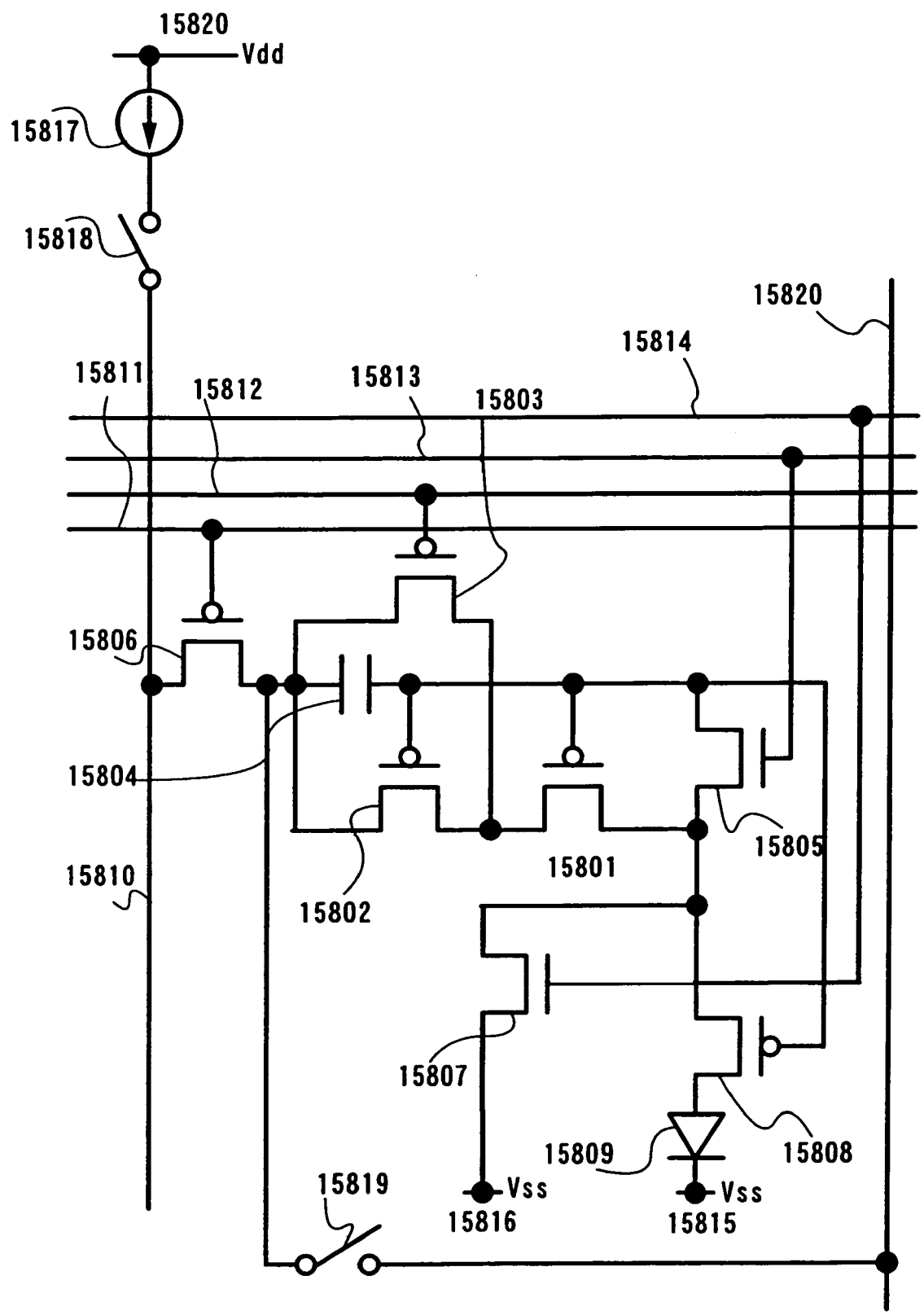

FIG. 158 is a diagram showing a pixel configuration of the invention.

Figure 159:
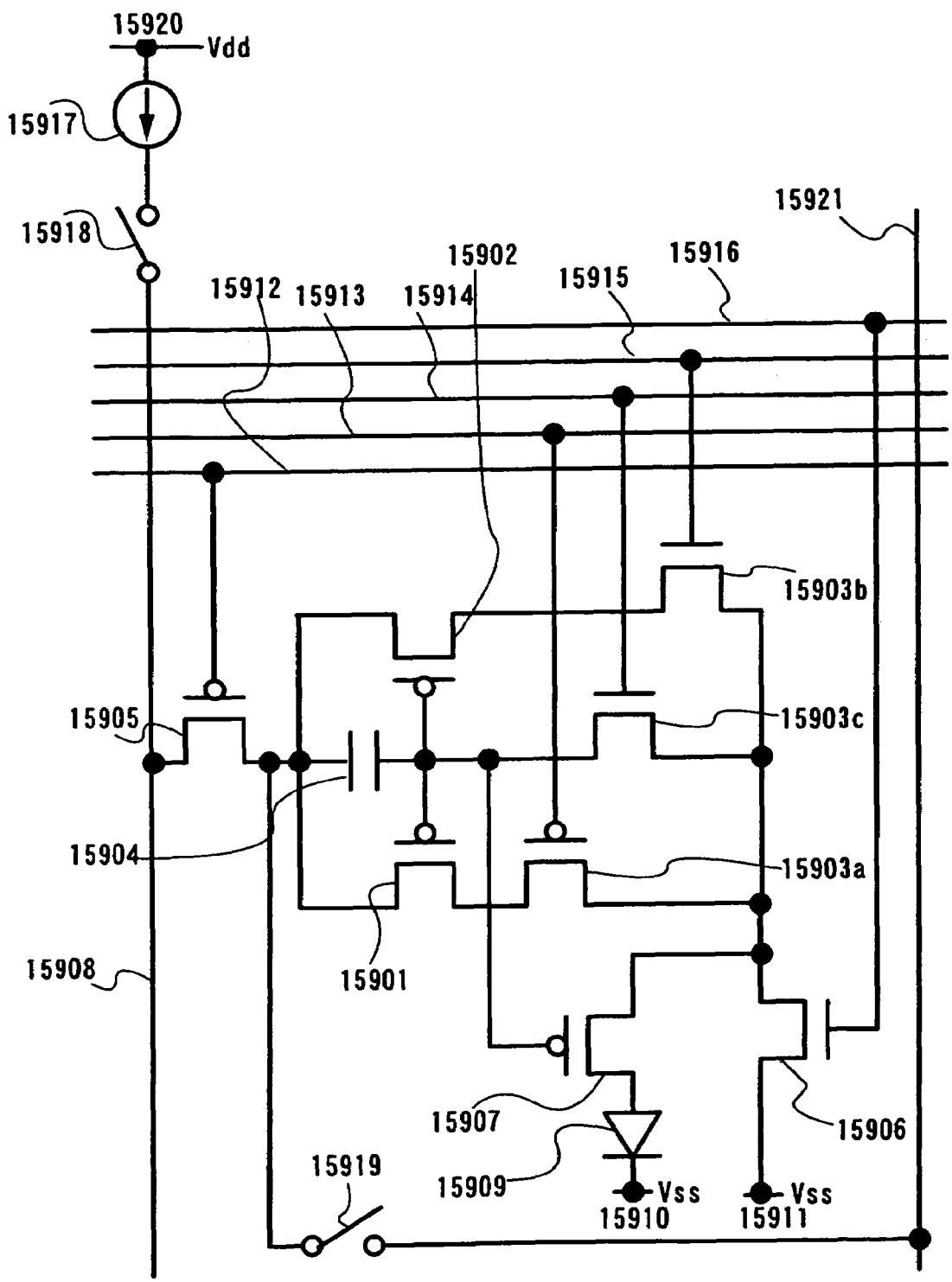

FIG. 159 is a diagram showing a pixel configuration of the invention.

Figure 160:
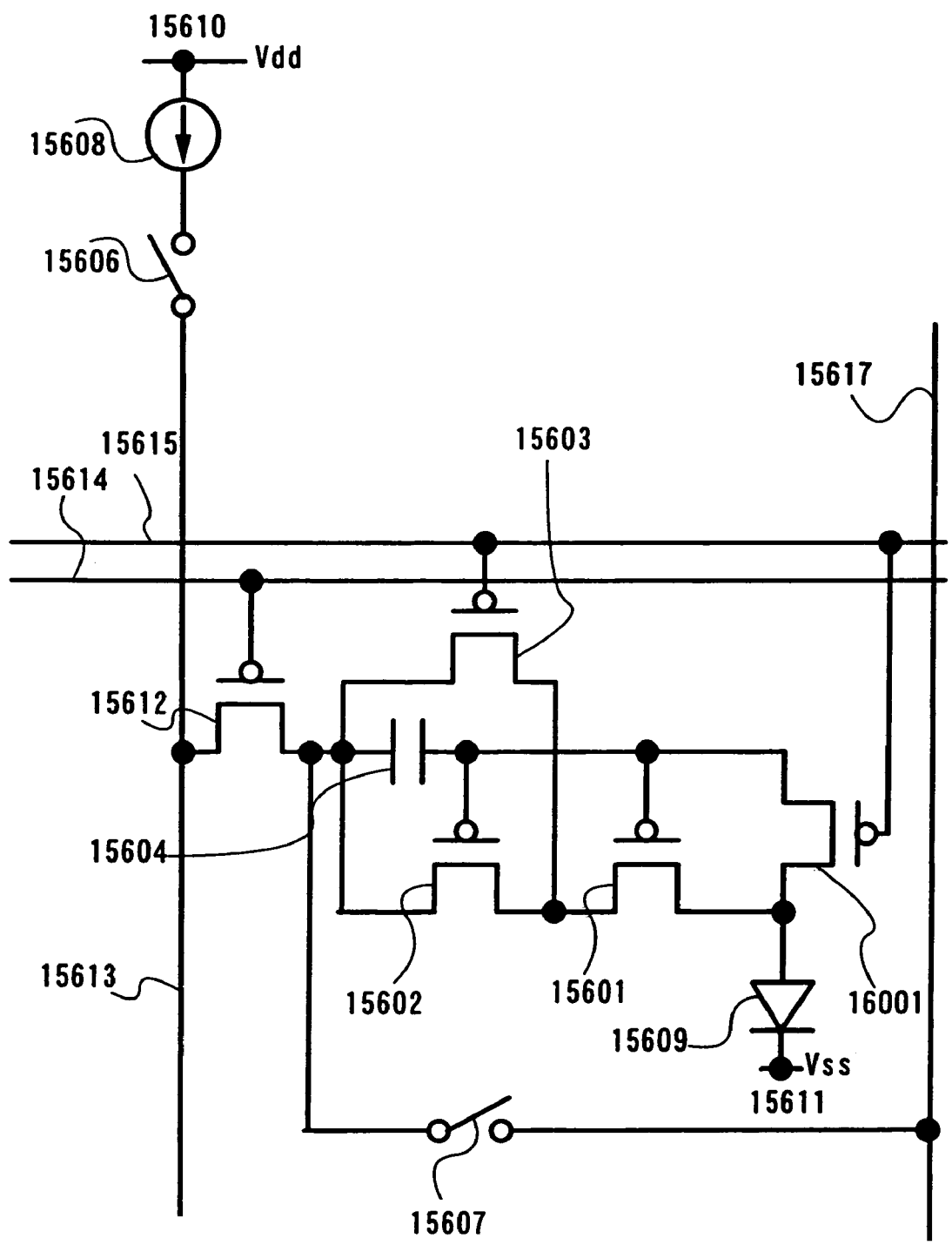

FIG. 160 is a diagram showing a pixel configuration of the invention.

Figure 161:
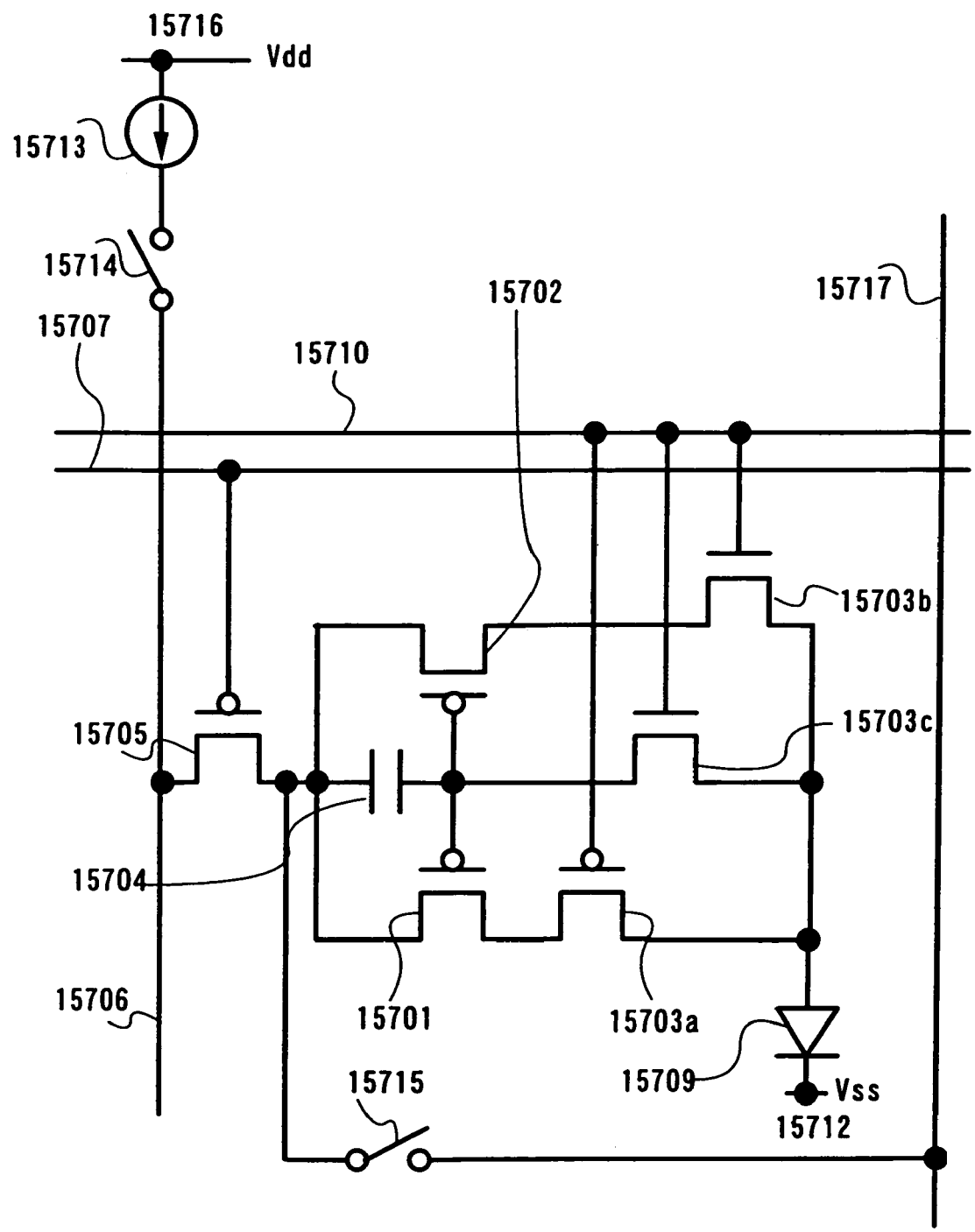

FIG. 161 is a diagram showing a pixel configuration of the invention.

Figure 162:
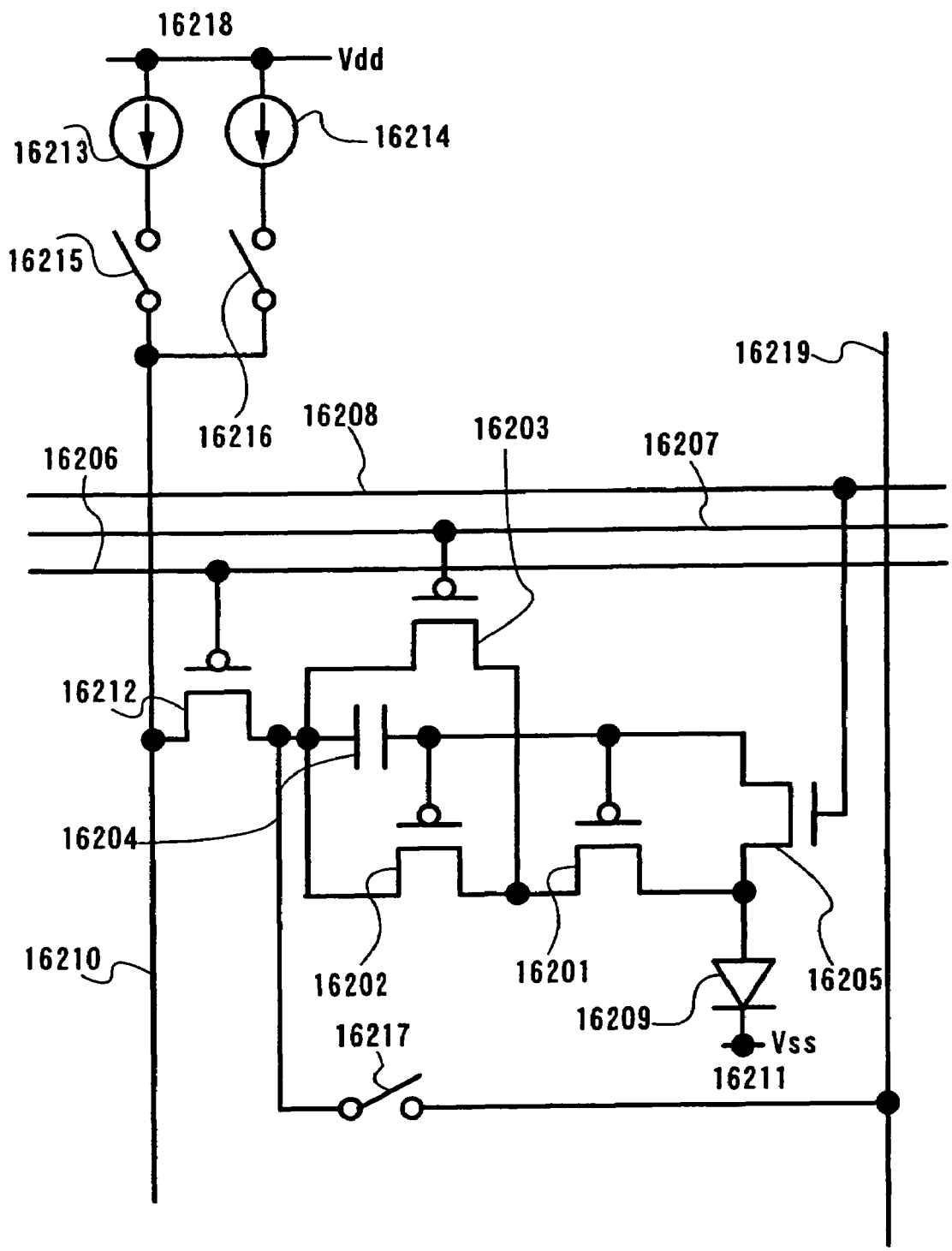

FIG. 162 is a diagram showing a pixel configuration of the invention.

Figure 163:
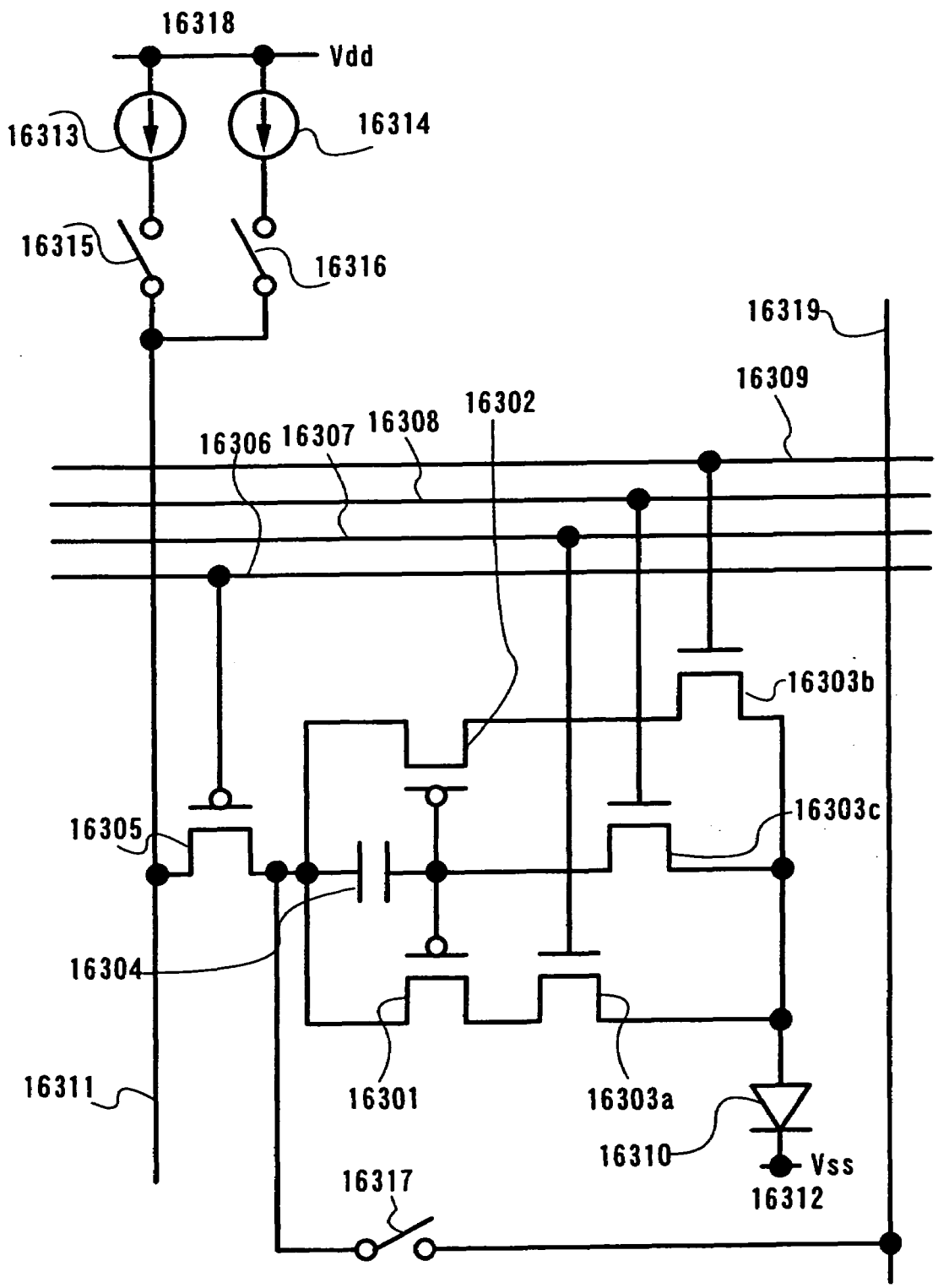

FIG. 163 is a diagram showing a pixel configuration of the invention.

Figure 164:
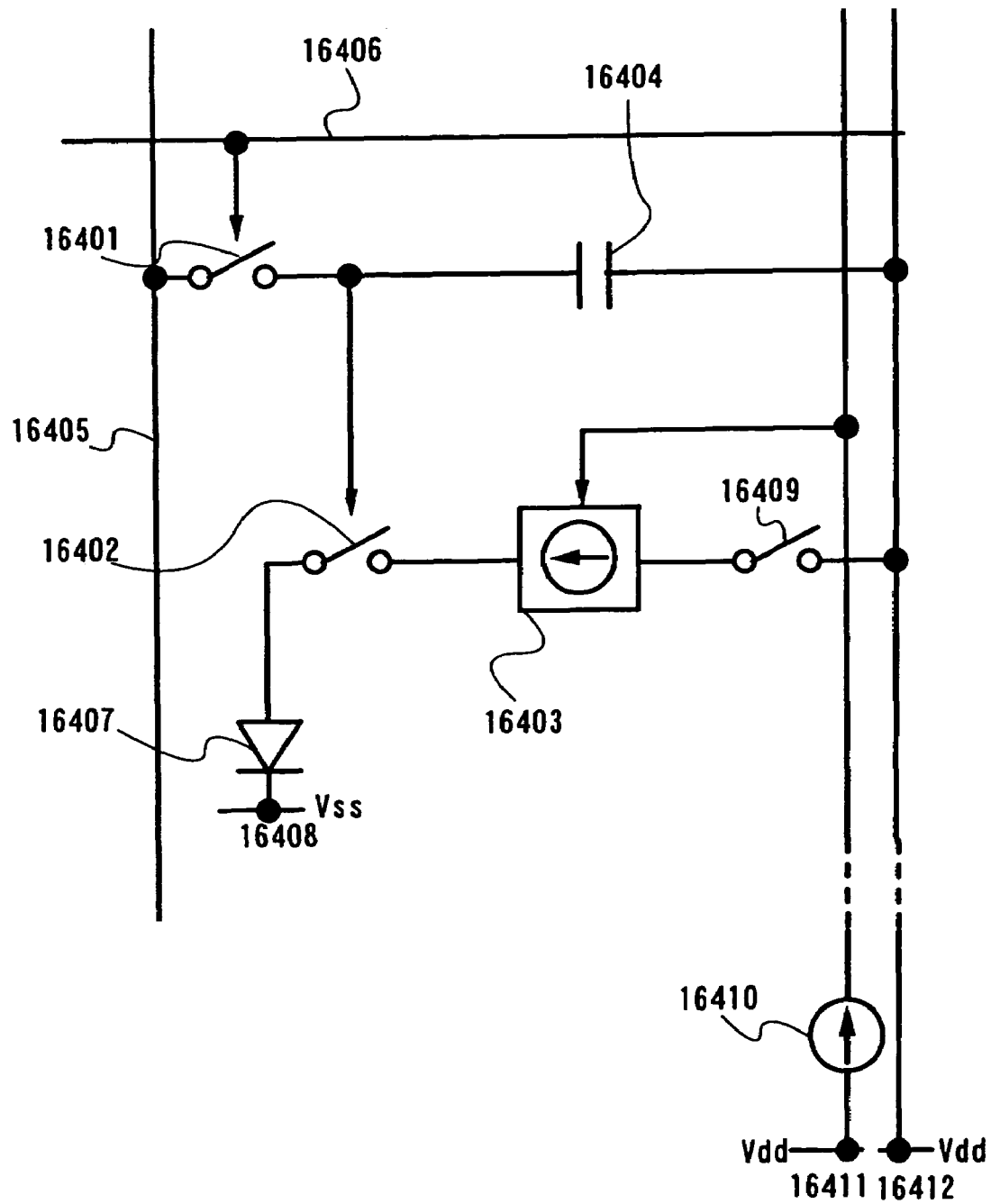

FIG. 164 is a diagram showing a pixel configuration of the invention.

Figure 165:
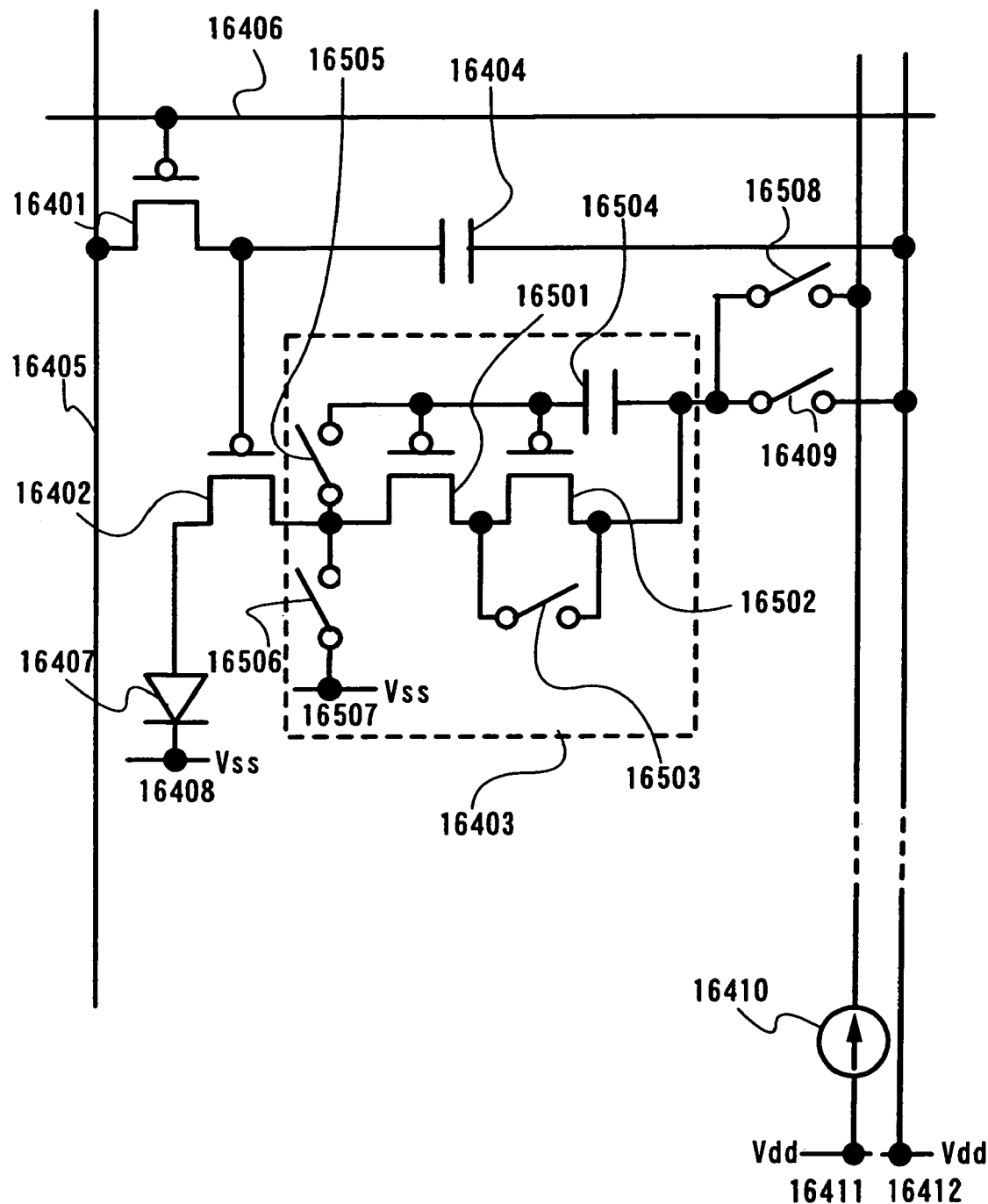

FIG. 165 is a diagram showing a pixel configuration of the invention.

Figure 166:
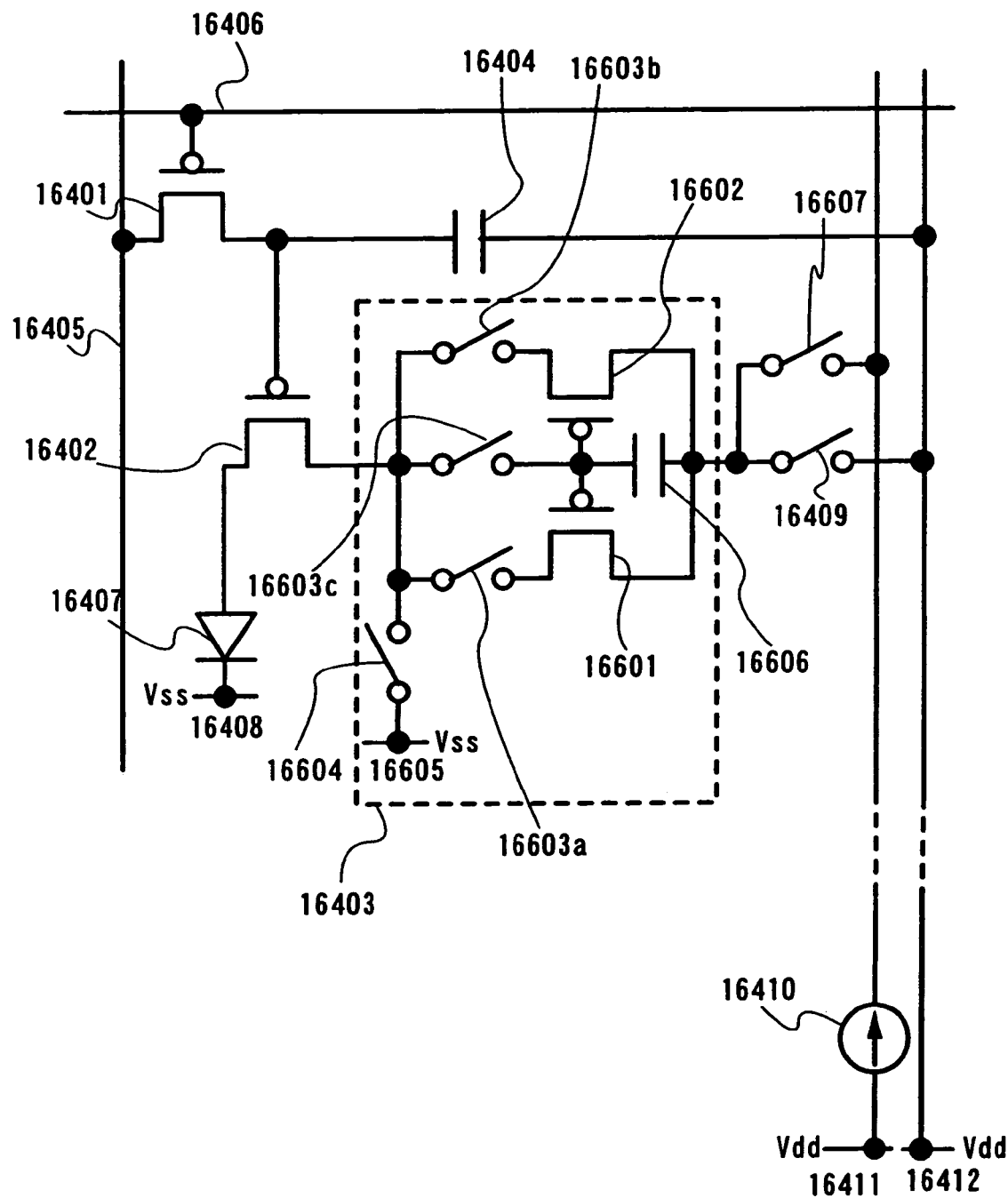

FIG. 166 is a diagram showing a pixel configuration of the invention.

Figure 167:
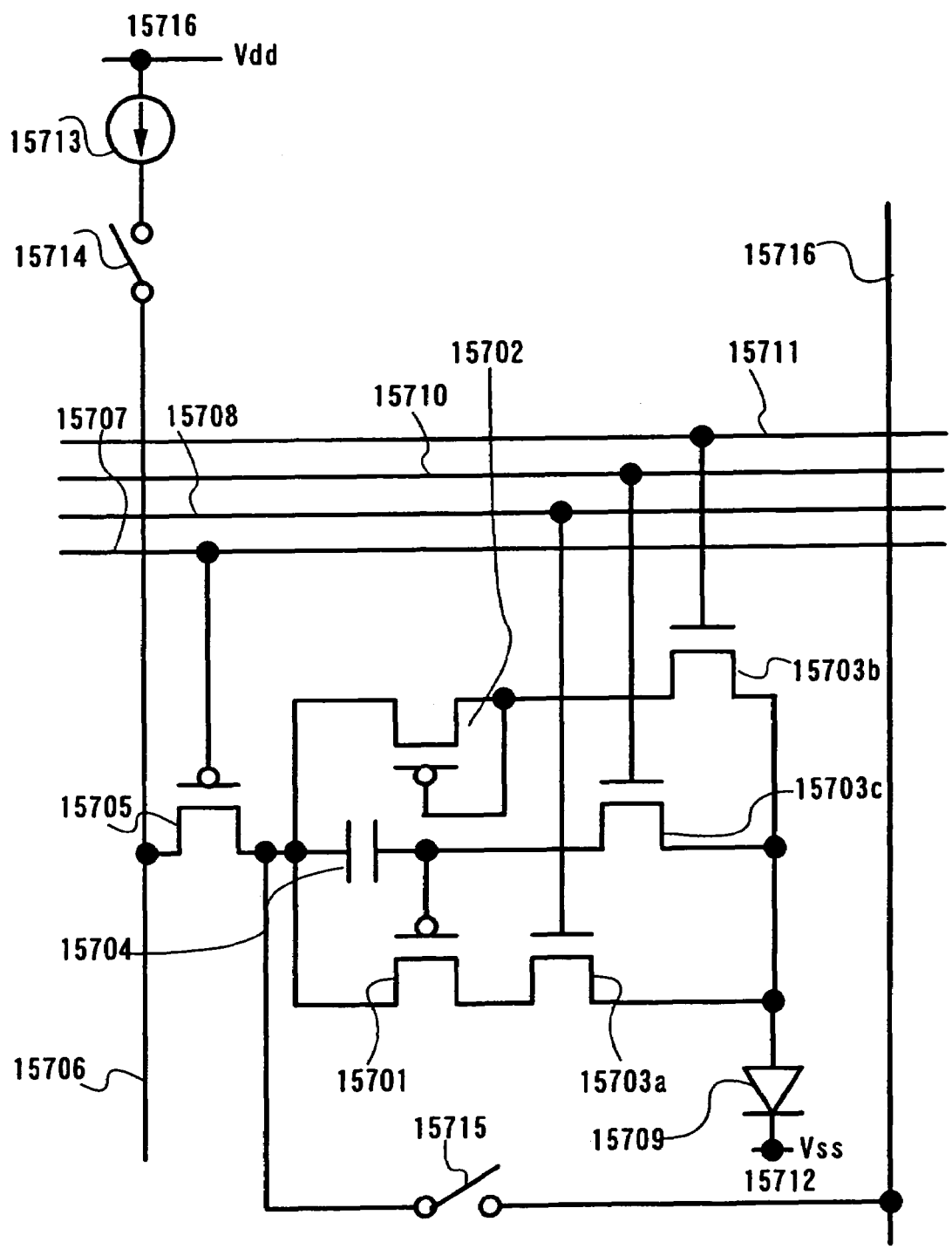

FIG. 167 is a diagram showing a pixel configuration of the invention.

FIGS. 168A to 168H are views of electronic devices to which the invention is applied.

Figure 169:
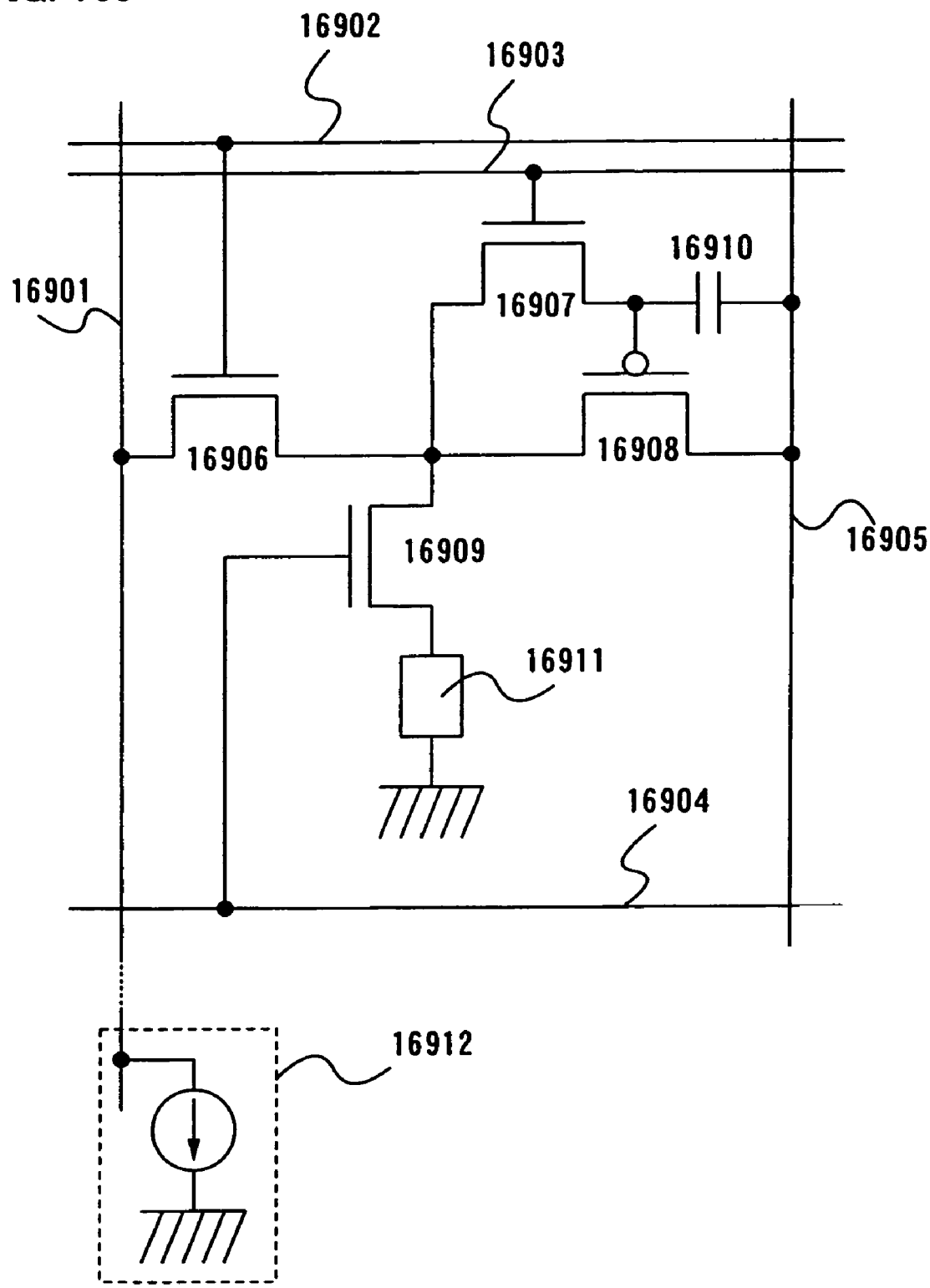

FIG. 169 is a diagram showing a conventional pixel configuration.

Figure 170:
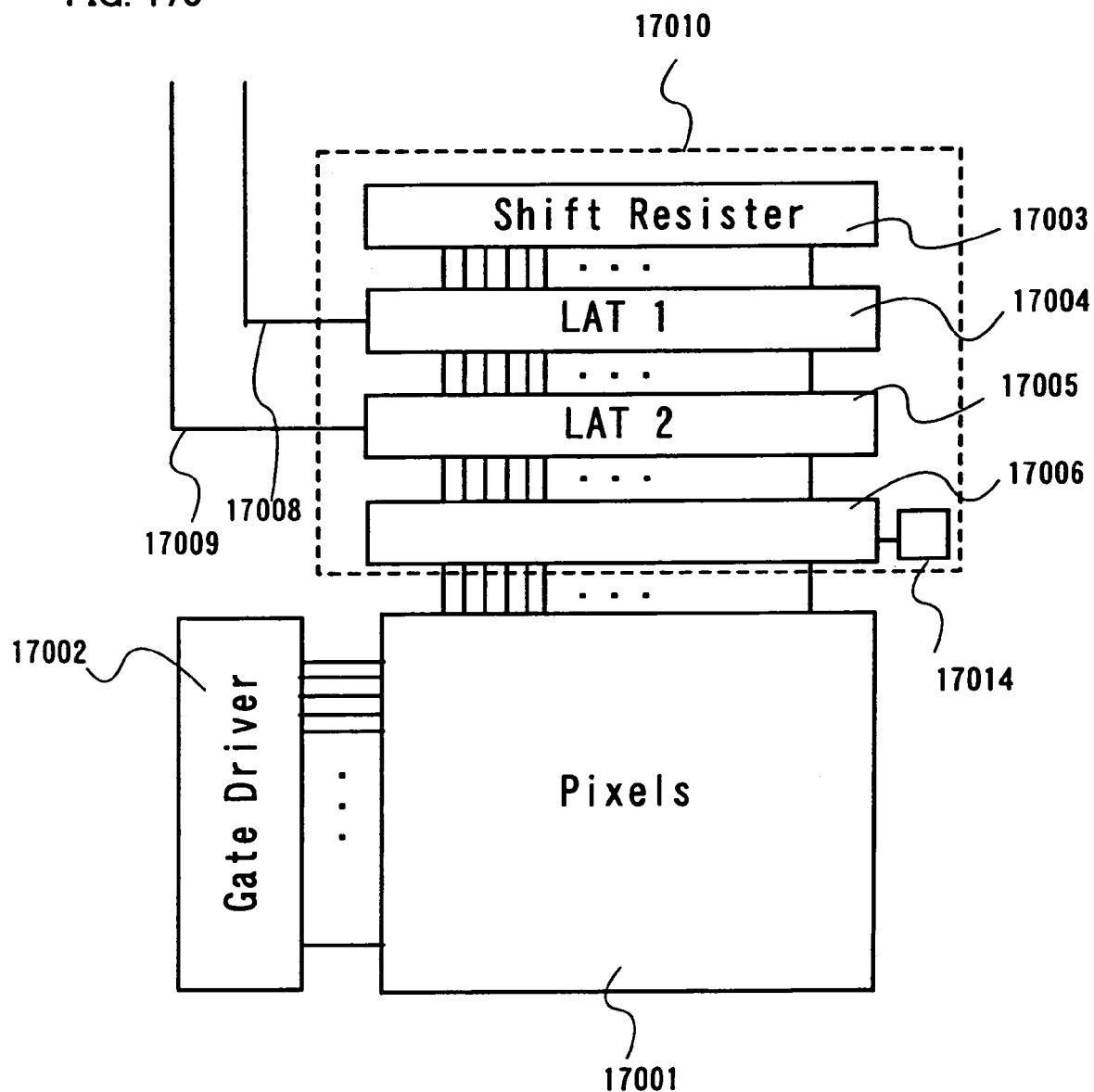

FIG. 170 is a diagram showing a configuration of a display device of the invention.

Figure 171:
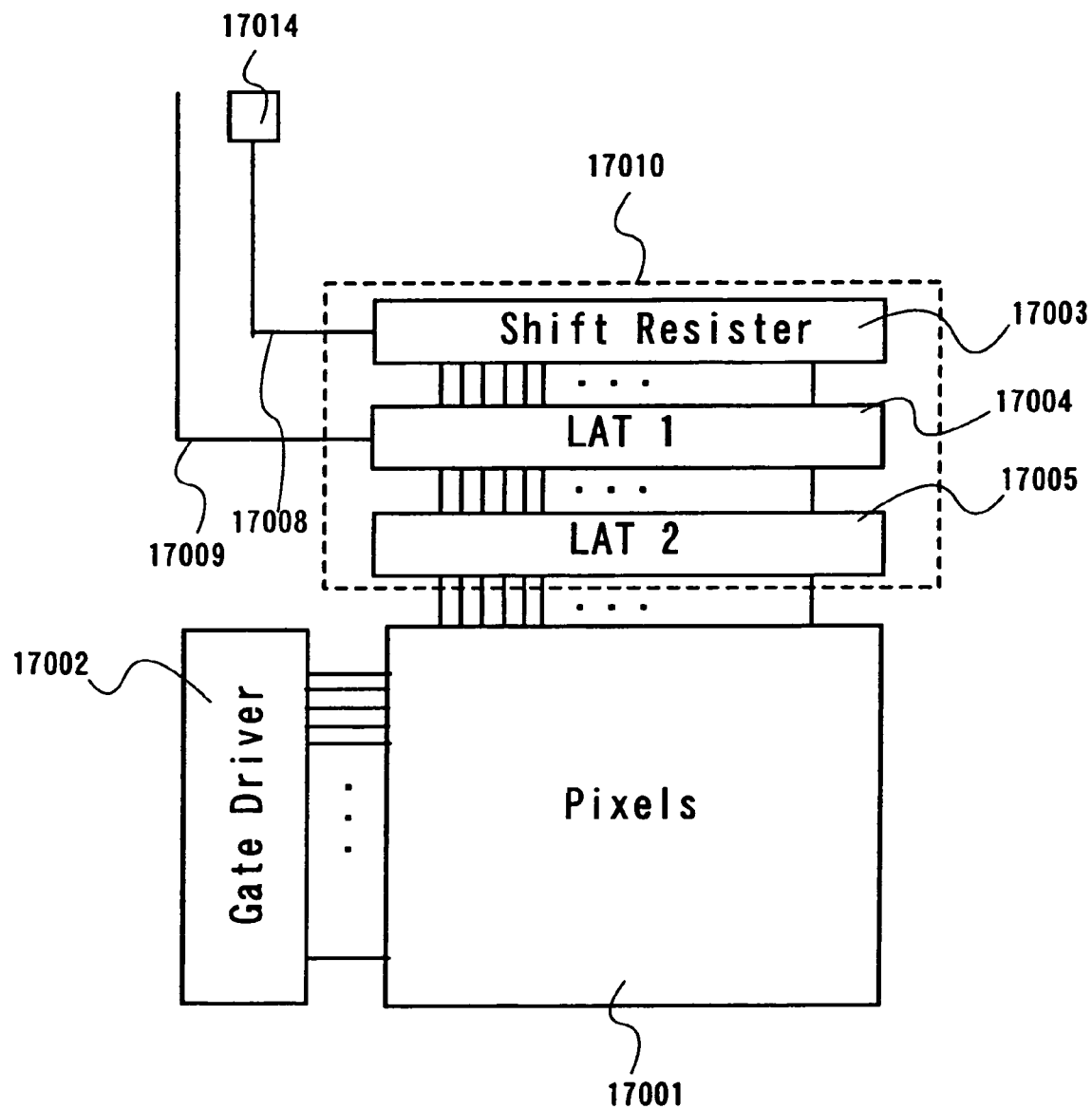
Figure 172A:
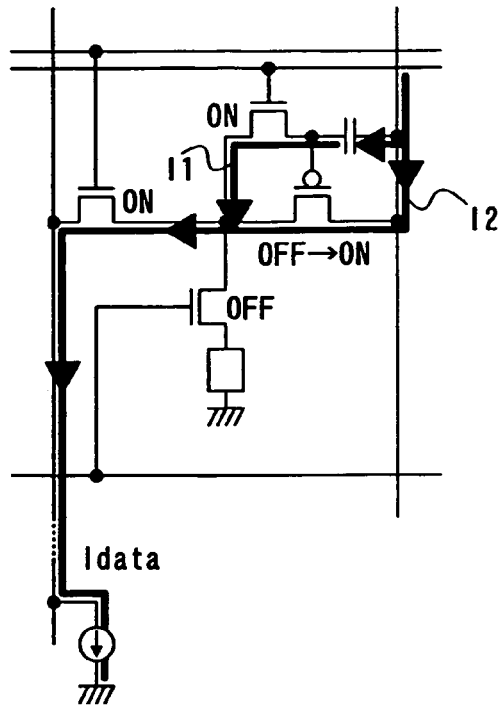
Figure 172B:
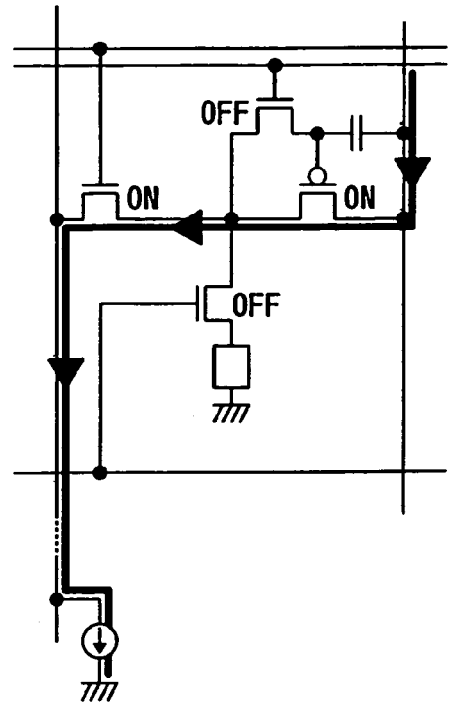
Figure 172C:
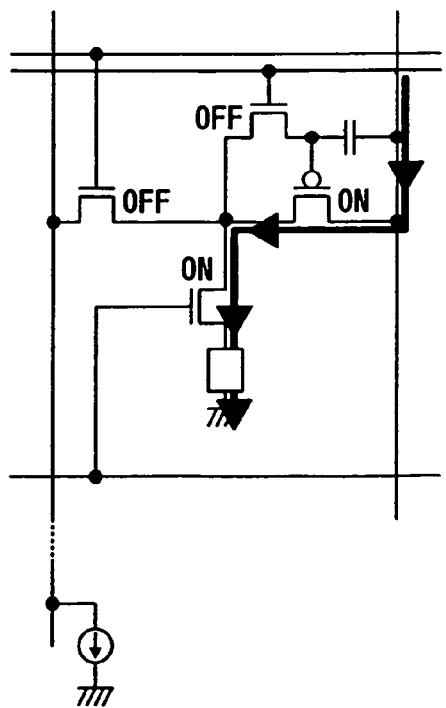
Figure 172D:
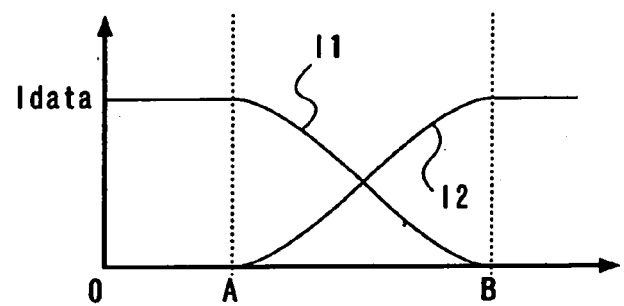
Figure 172E:
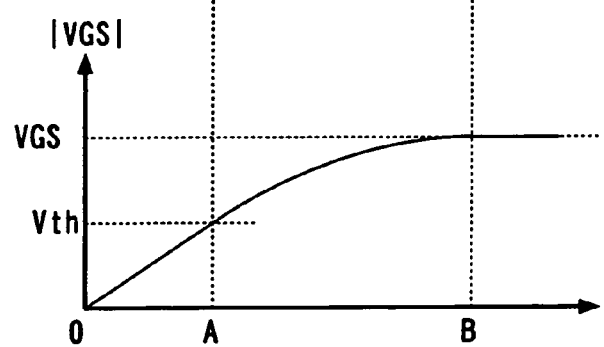

FIG. 171 is a diagram showing a configuration of a display device of the invention.

FIGS. 172A to 172E are diagrams each showing an operation of a conventional pixel.

Figure 173A:
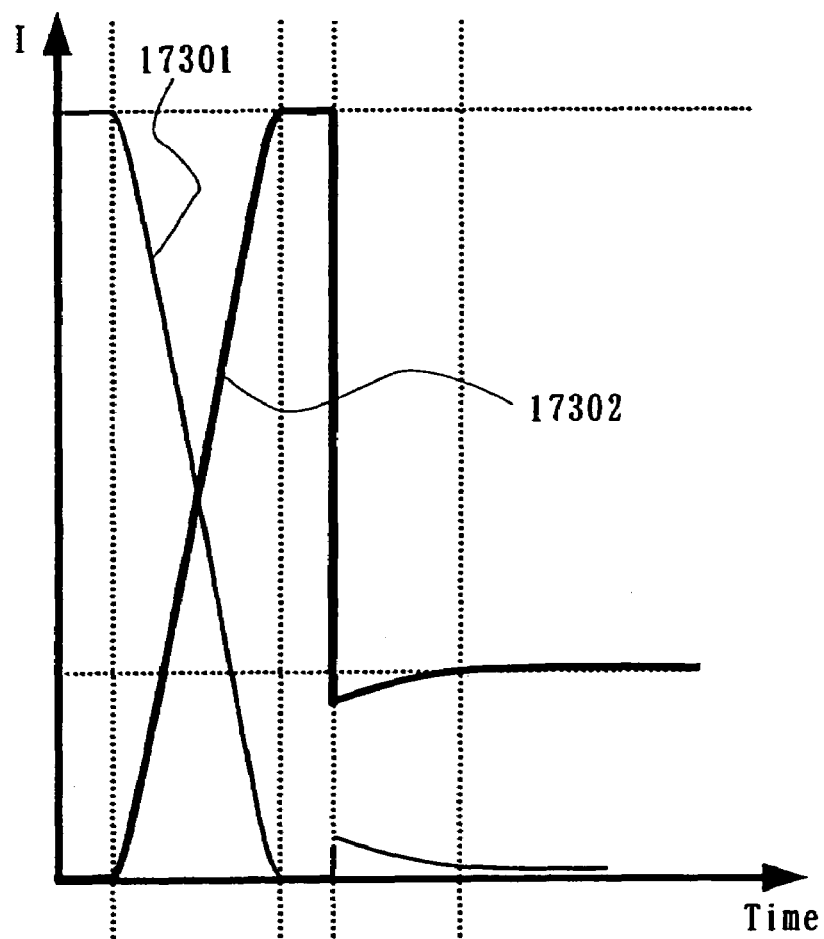
Figure 173B:
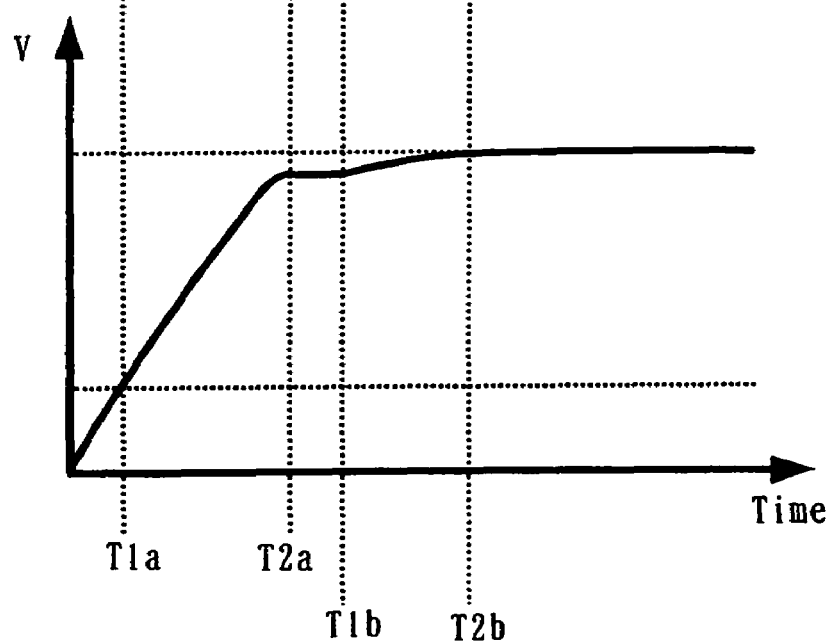

FIGS. 173A and 173B are diagrams each showing a change with time of a current and a voltage of a current source circuit of the invention.

Figure 174:
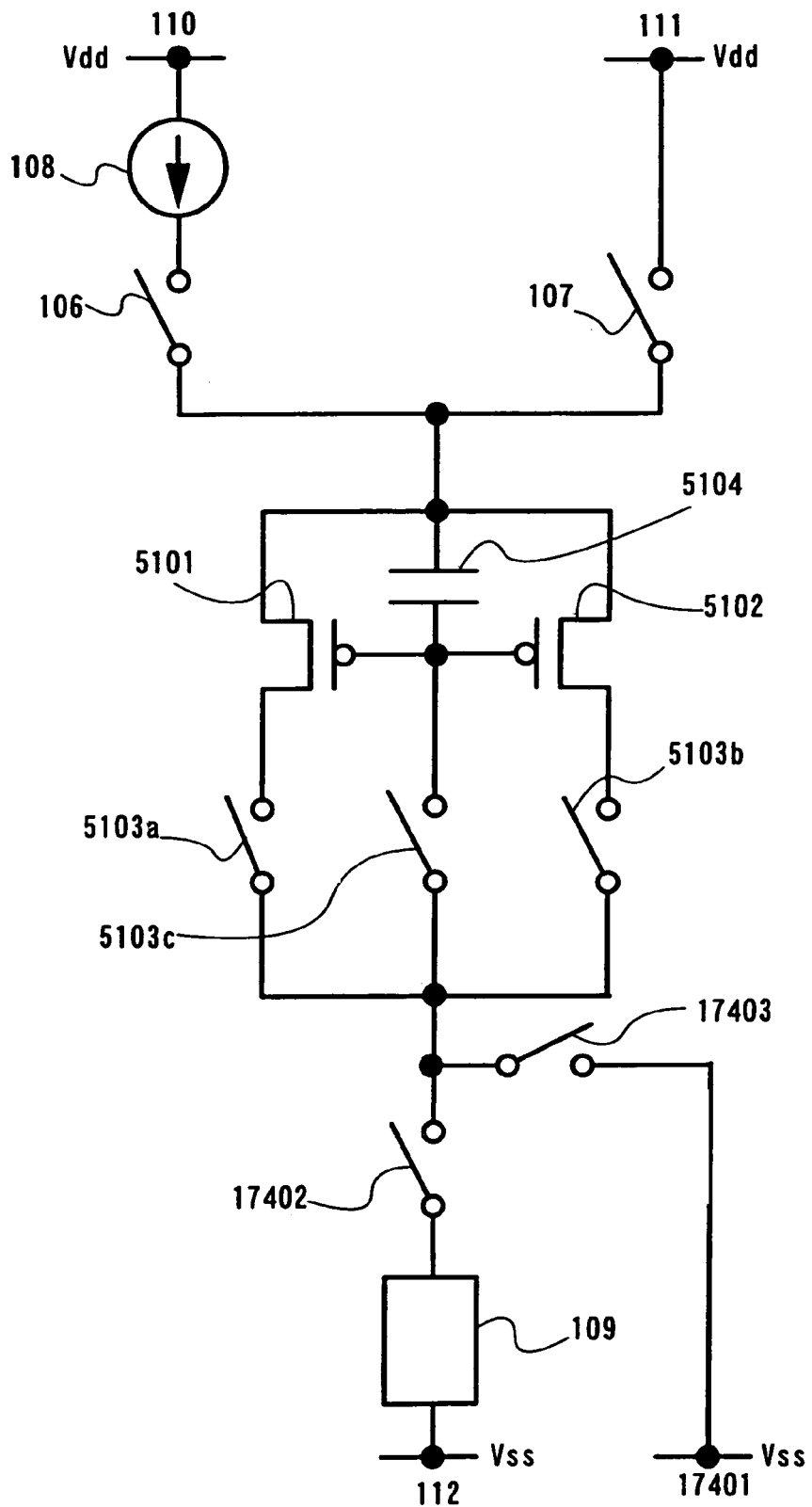

FIG. 174 is a diagram showing a configuration of a current source circuit of the invention.

Figure 175:
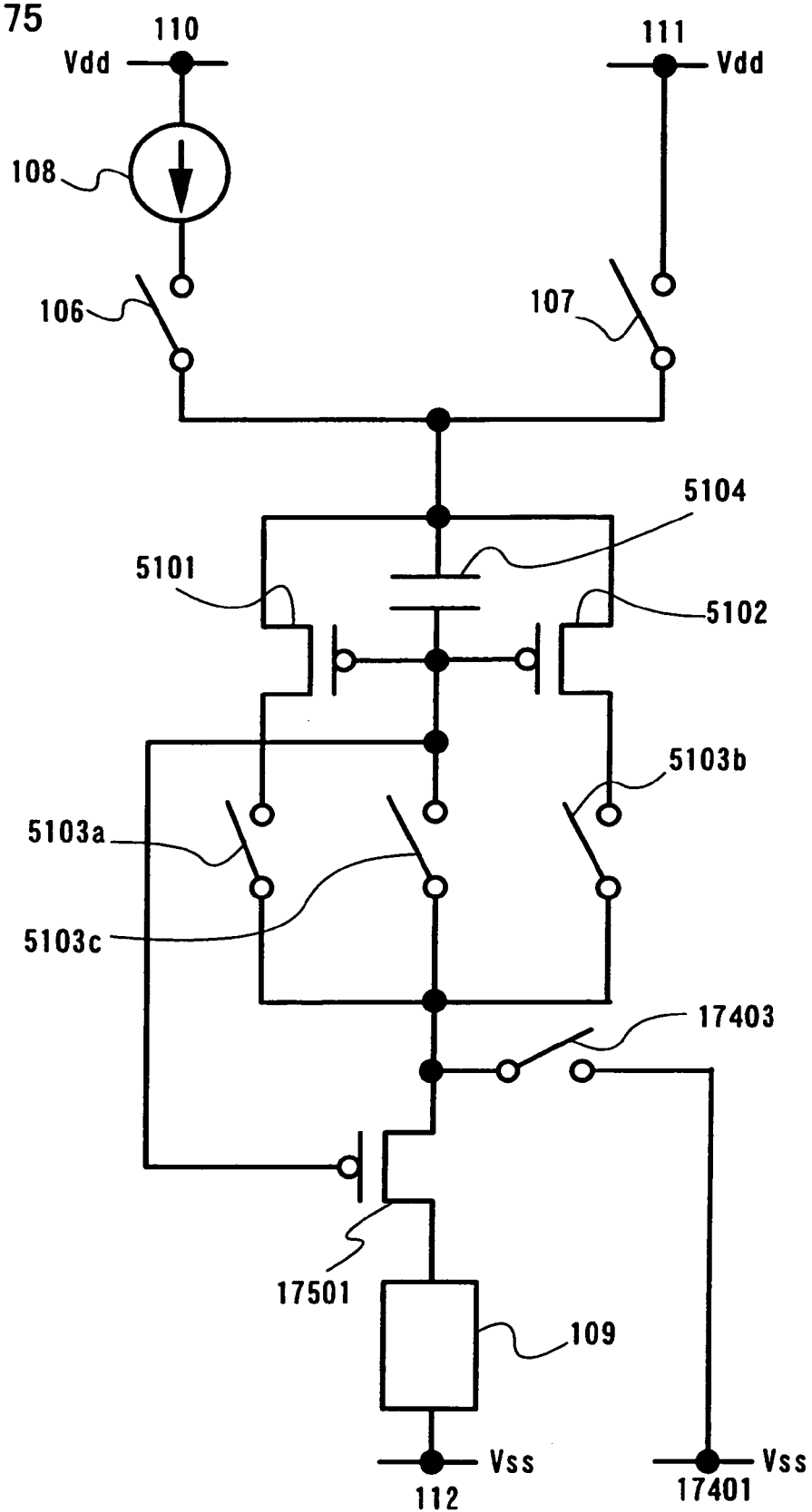

FIG. 175 is a diagram showing a configuration of a current source circuit of the invention.

Figure 176:
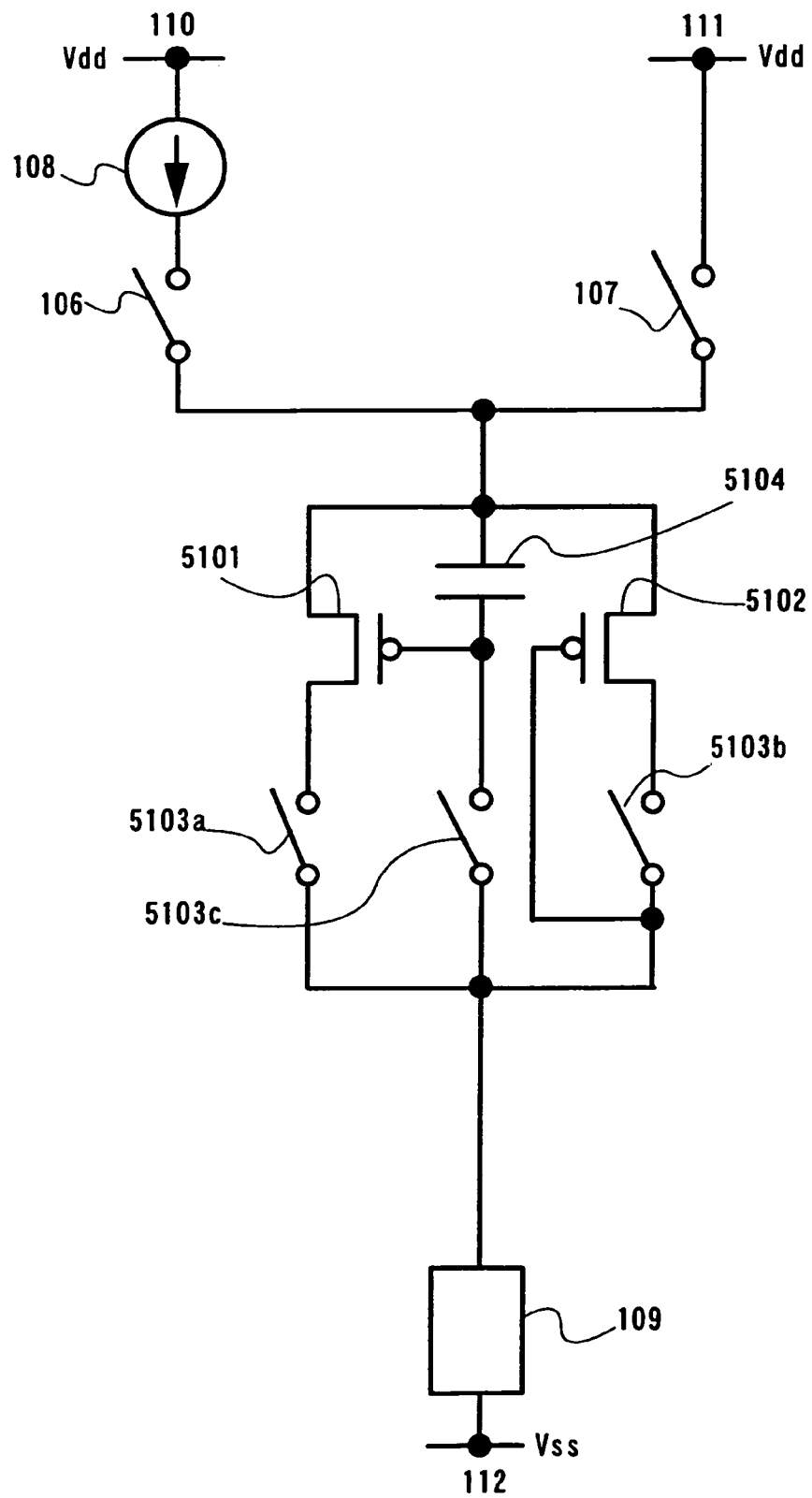

FIG. 176 is a diagram showing a configuration of a current source circuit of the invention.

Figure 177:
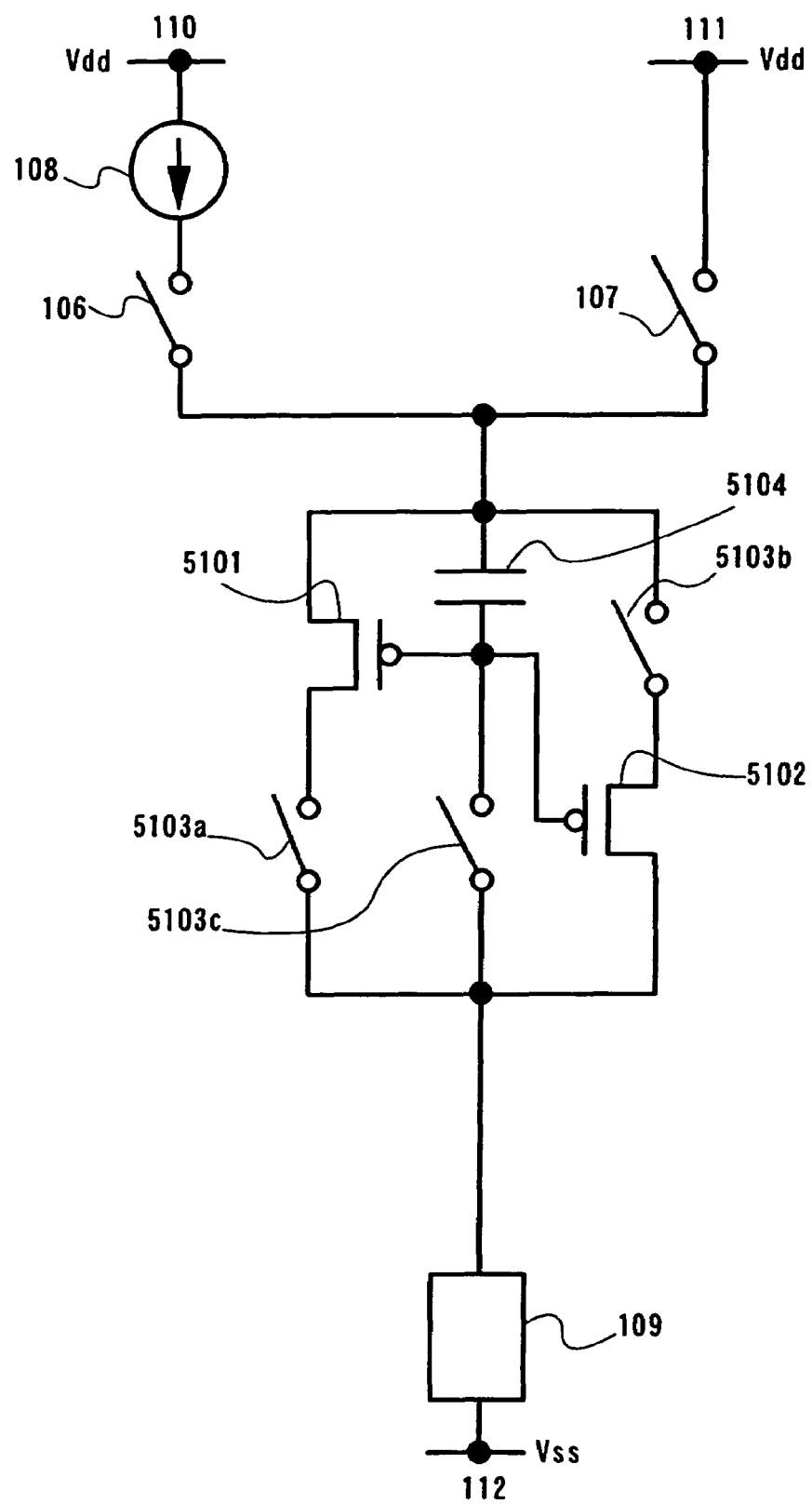

FIG. 177 is a diagram showing a configuration of a current source circuit of the invention.

Figure 178:
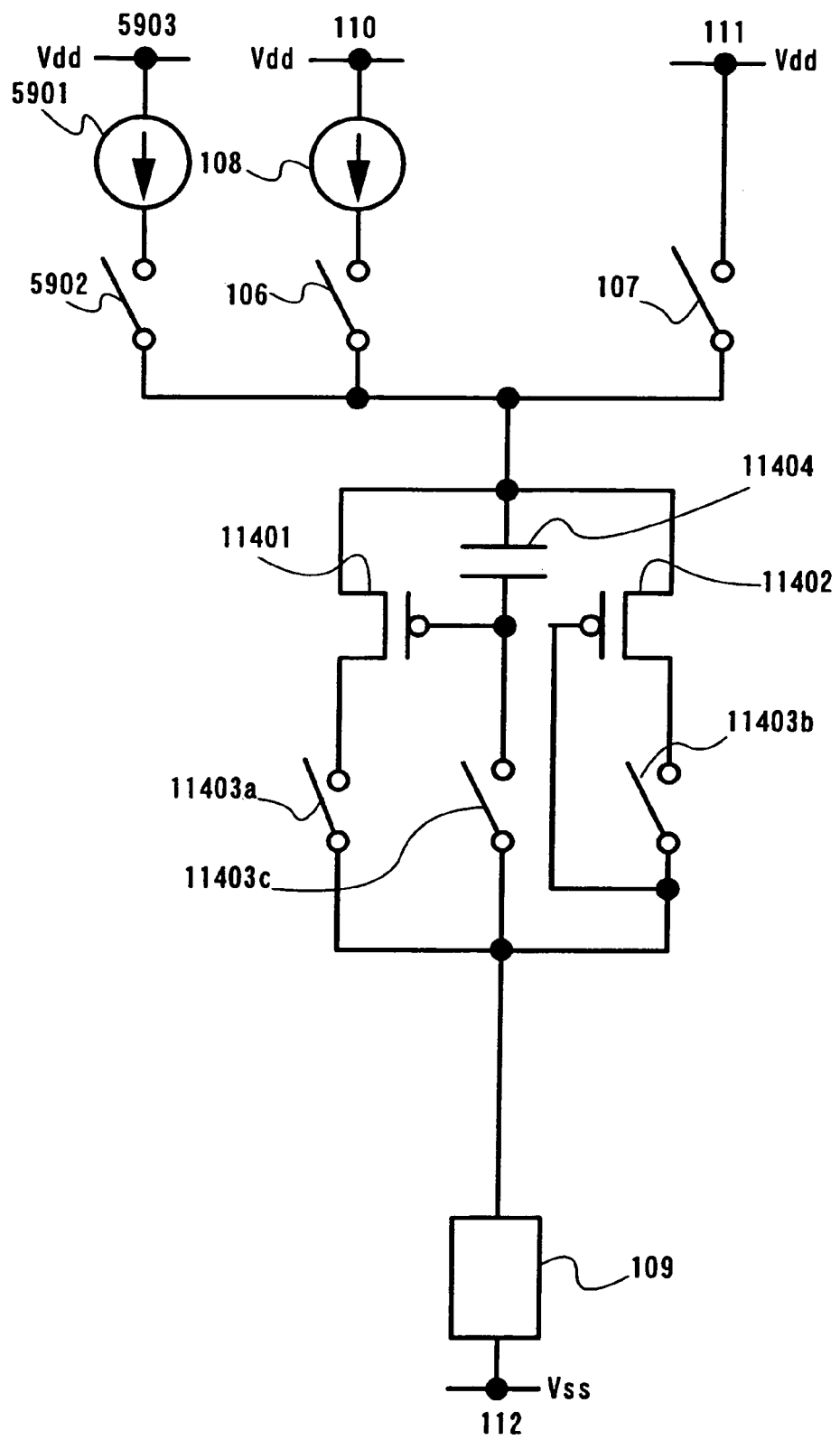

FIG. 178 is a diagram showing a configuration of a current source circuit of the invention.

Figure 179:
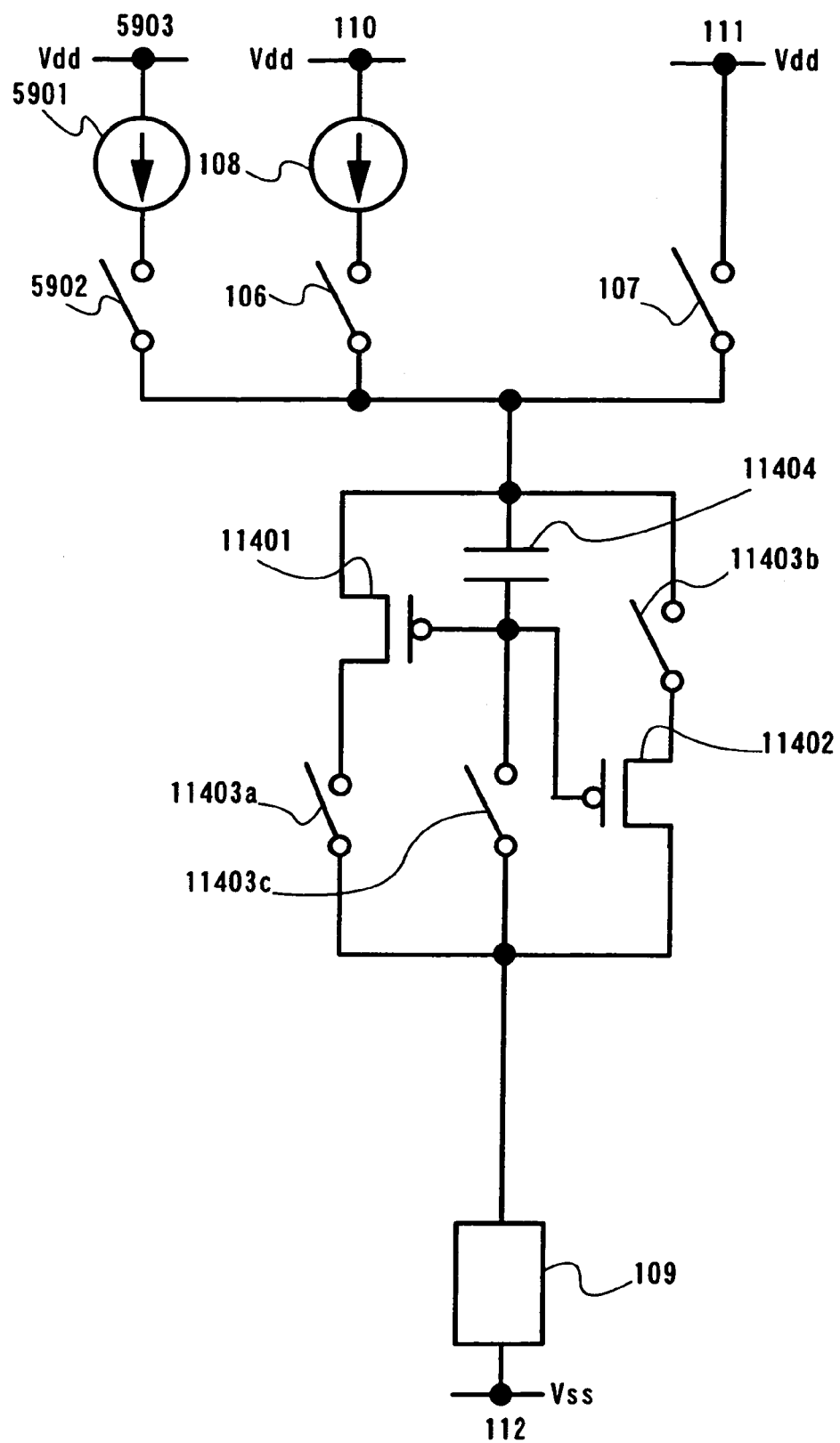

FIG. 179 is a diagram showing a configuration of a current source circuit of the invention.

Figure 180:
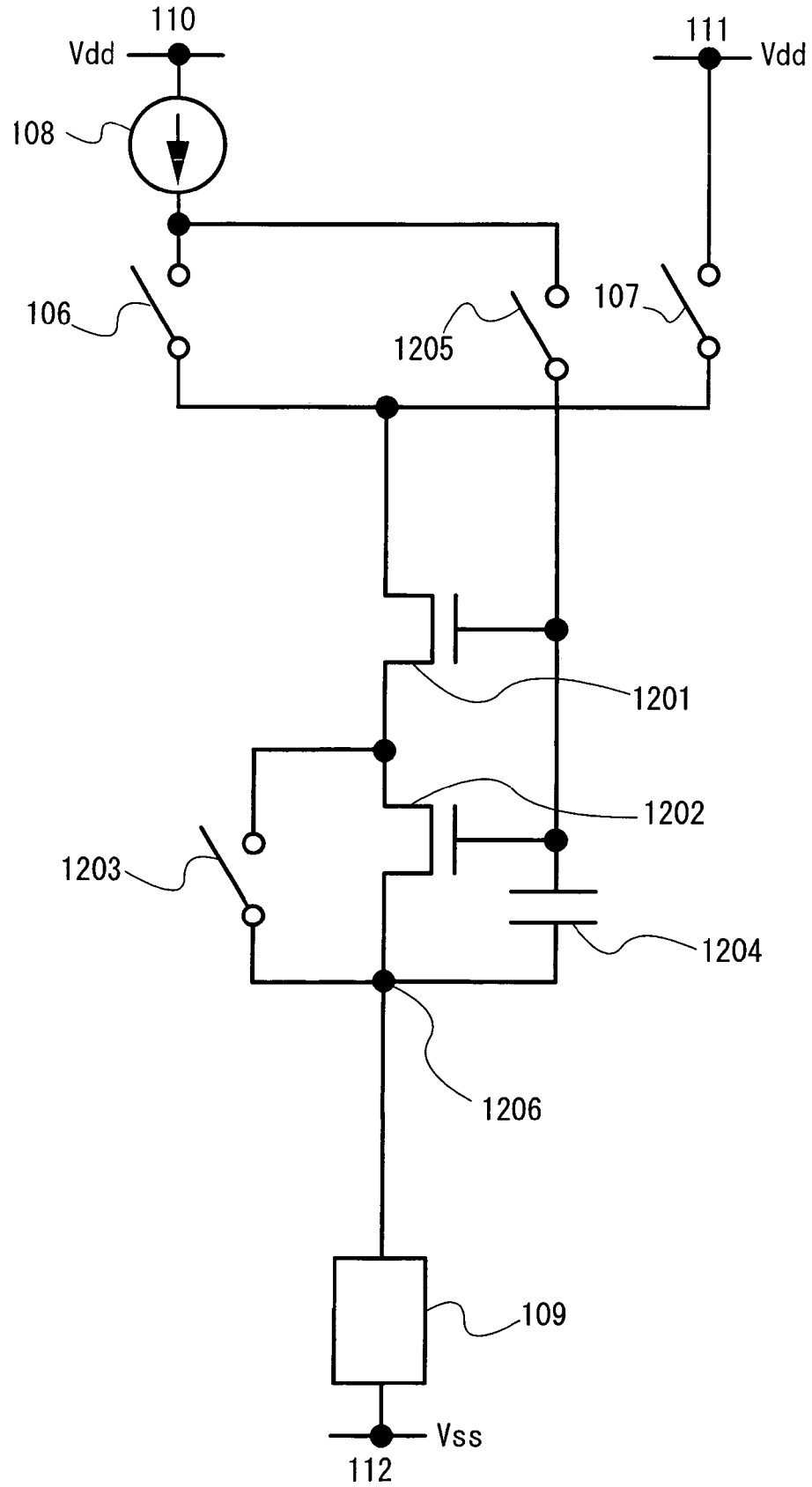

FIG. 180 is a diagram showing a configuration of a current source circuit of the invention.

Figure 181:
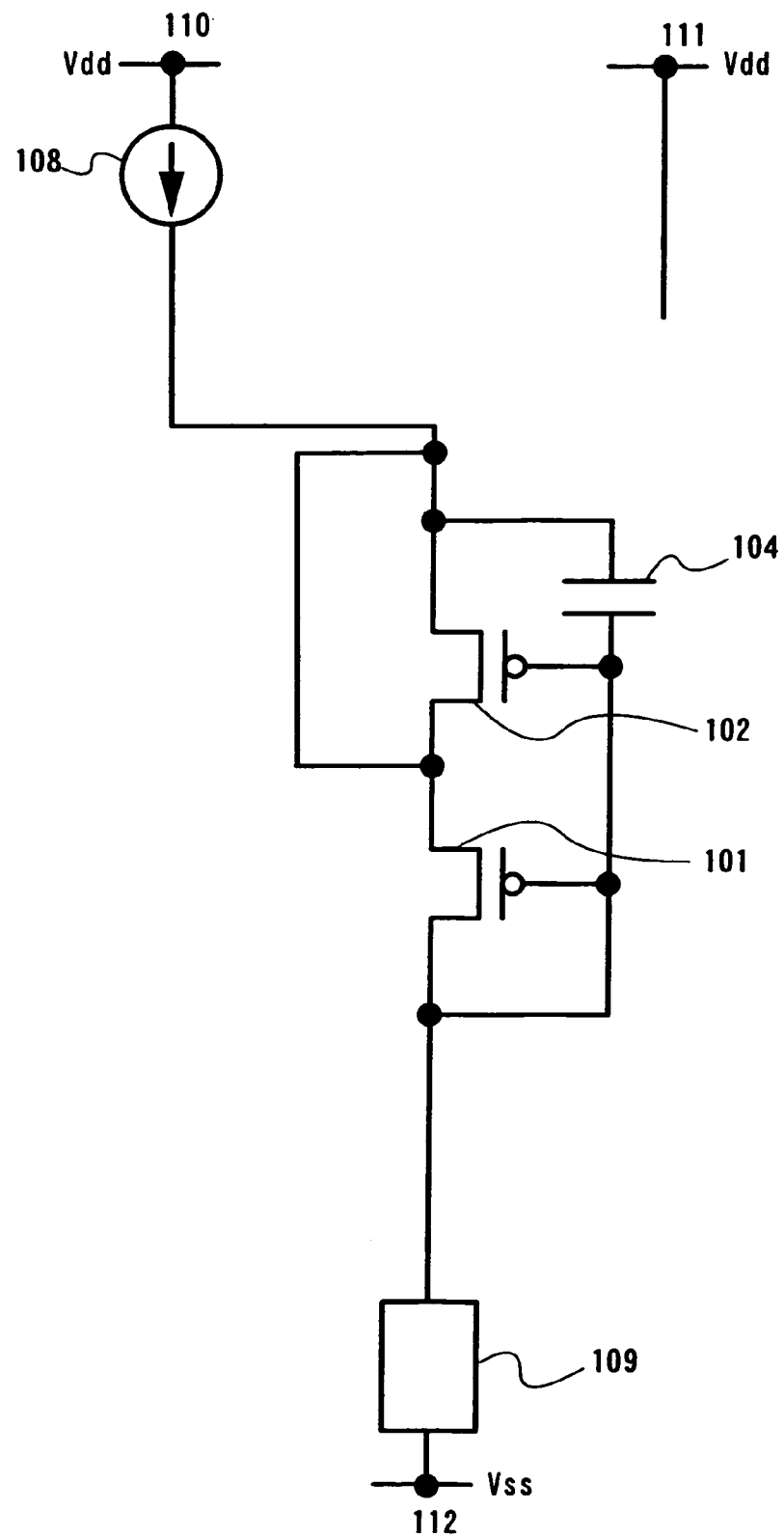

FIG. 181 is a diagram showing connections of a certain operation of a current source circuit of the invention.

Figure 182:
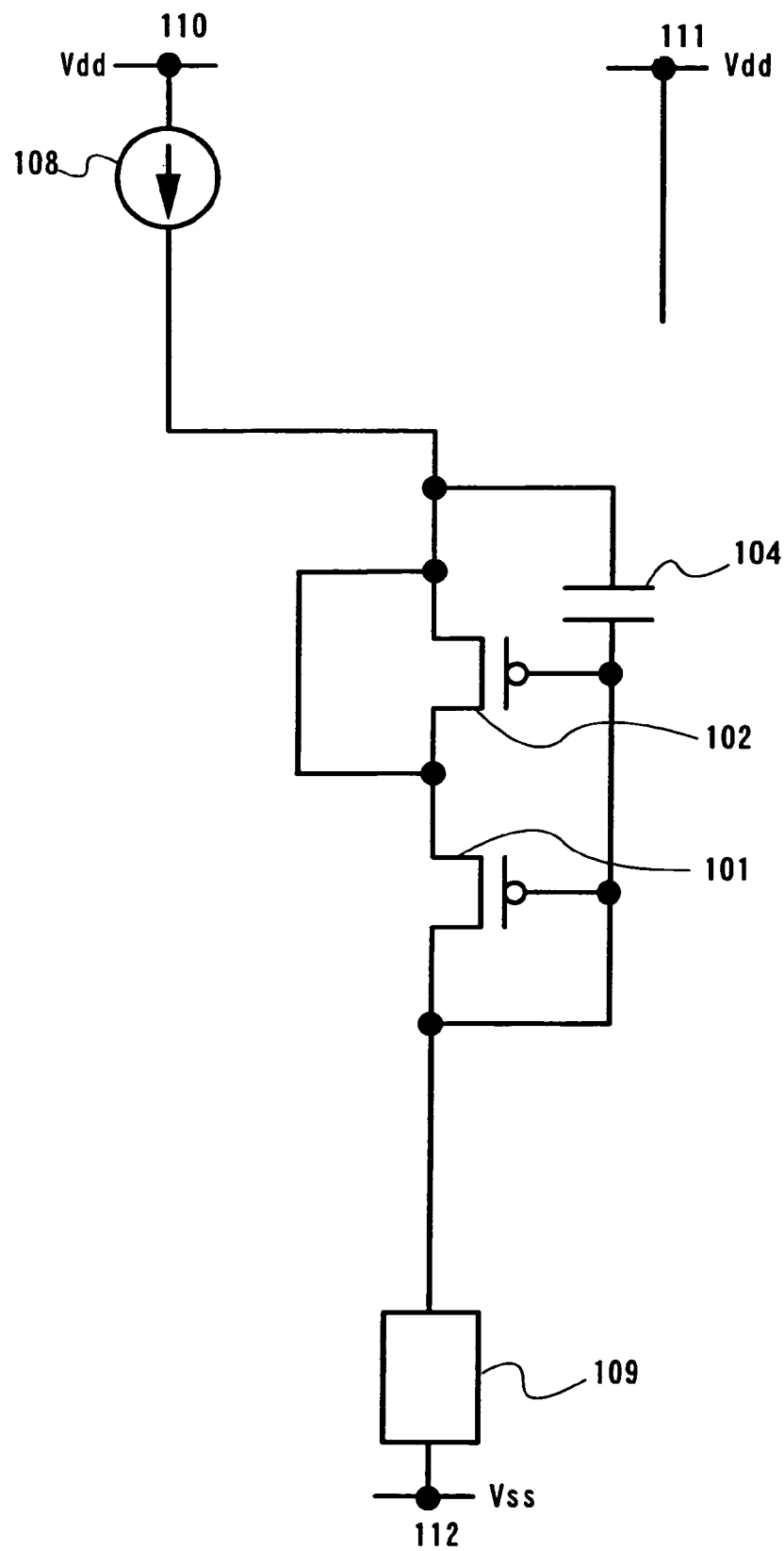

FIG. 182 is a diagram showing connections of a certain operation of a current source circuit of the invention.

Figure 183:
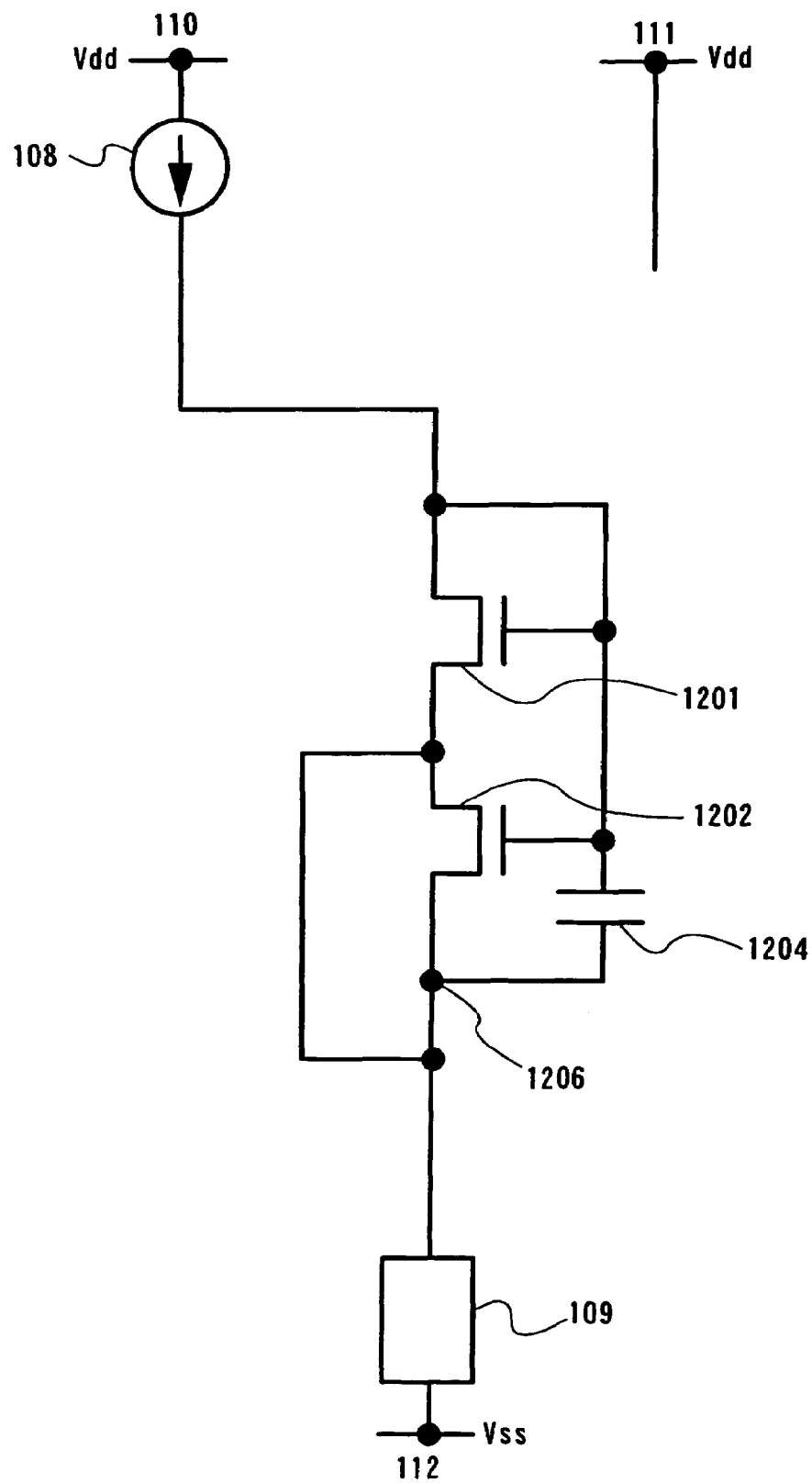

FIG. 183 is a diagram showing connections of a certain operation of a current source circuit of the invention.

Figure 184:
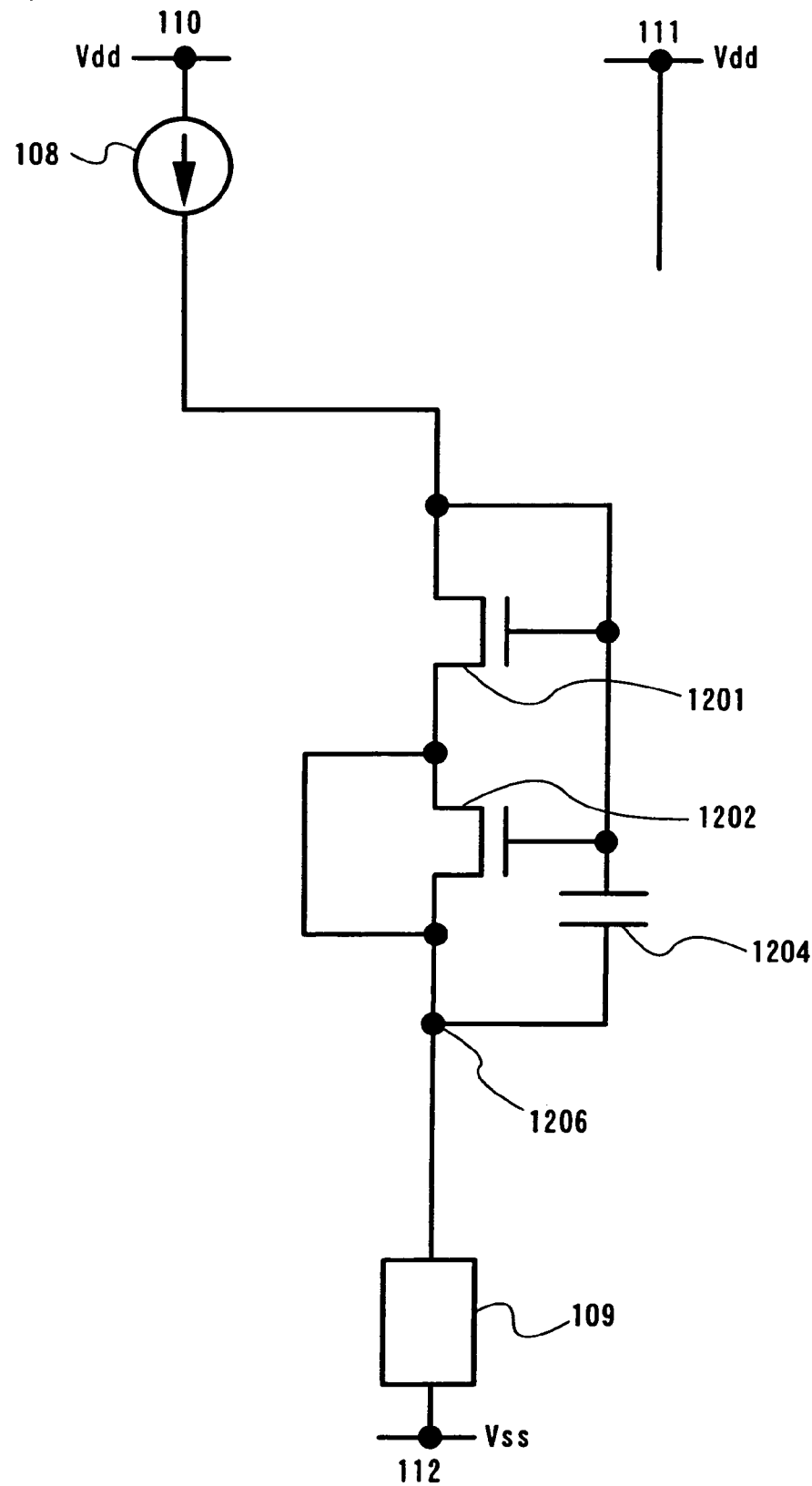

FIG. 184 is a diagram showing connections of a certain operation of a current source circuit of the invention.

Figure 185:
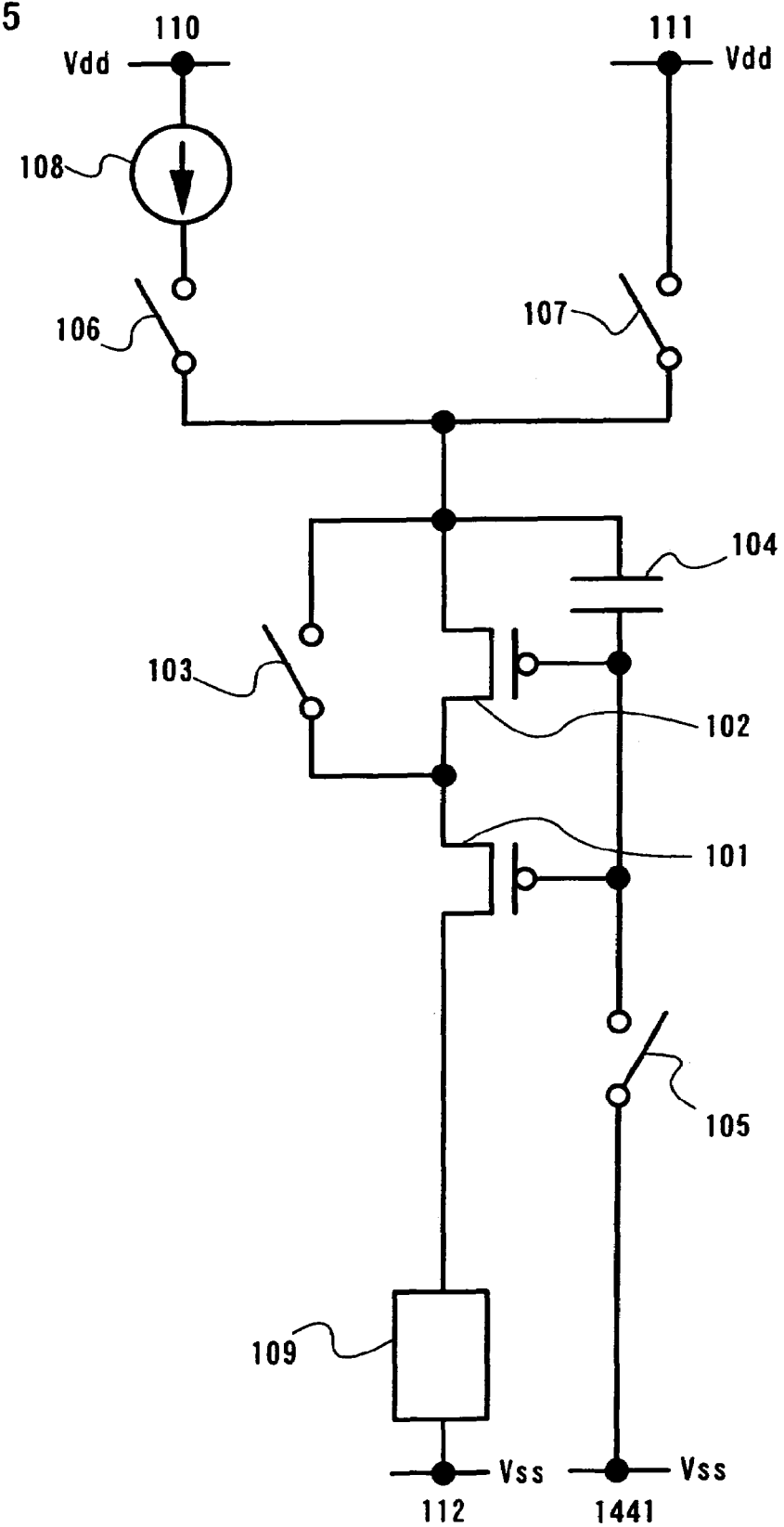

FIG. 185 is a diagram showing a configuration of a current source circuit of the invention.

Figure 186:
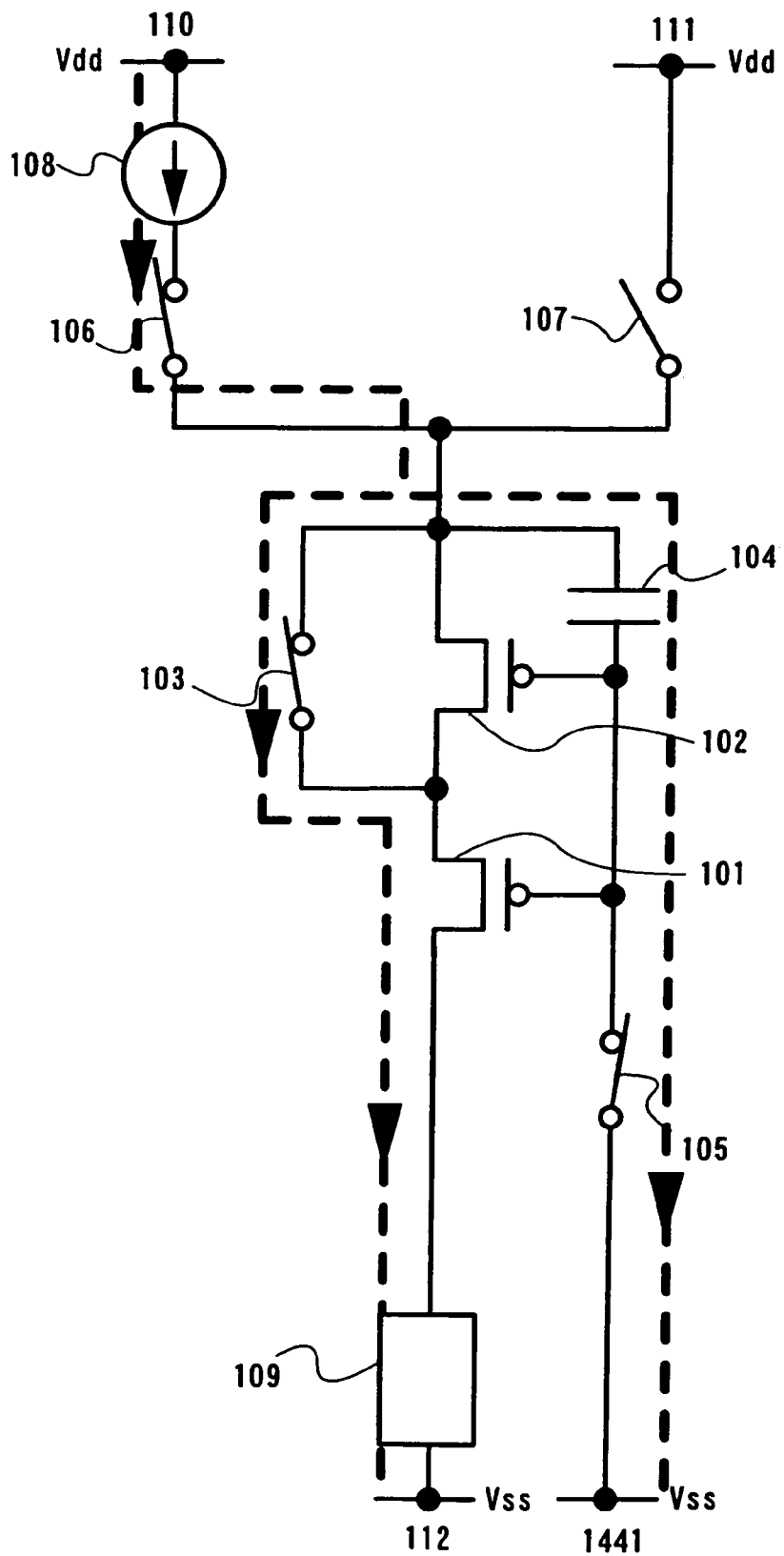

FIG. 186 is a diagram showing an operation of a current source circuit of the invention.

Figure 187:
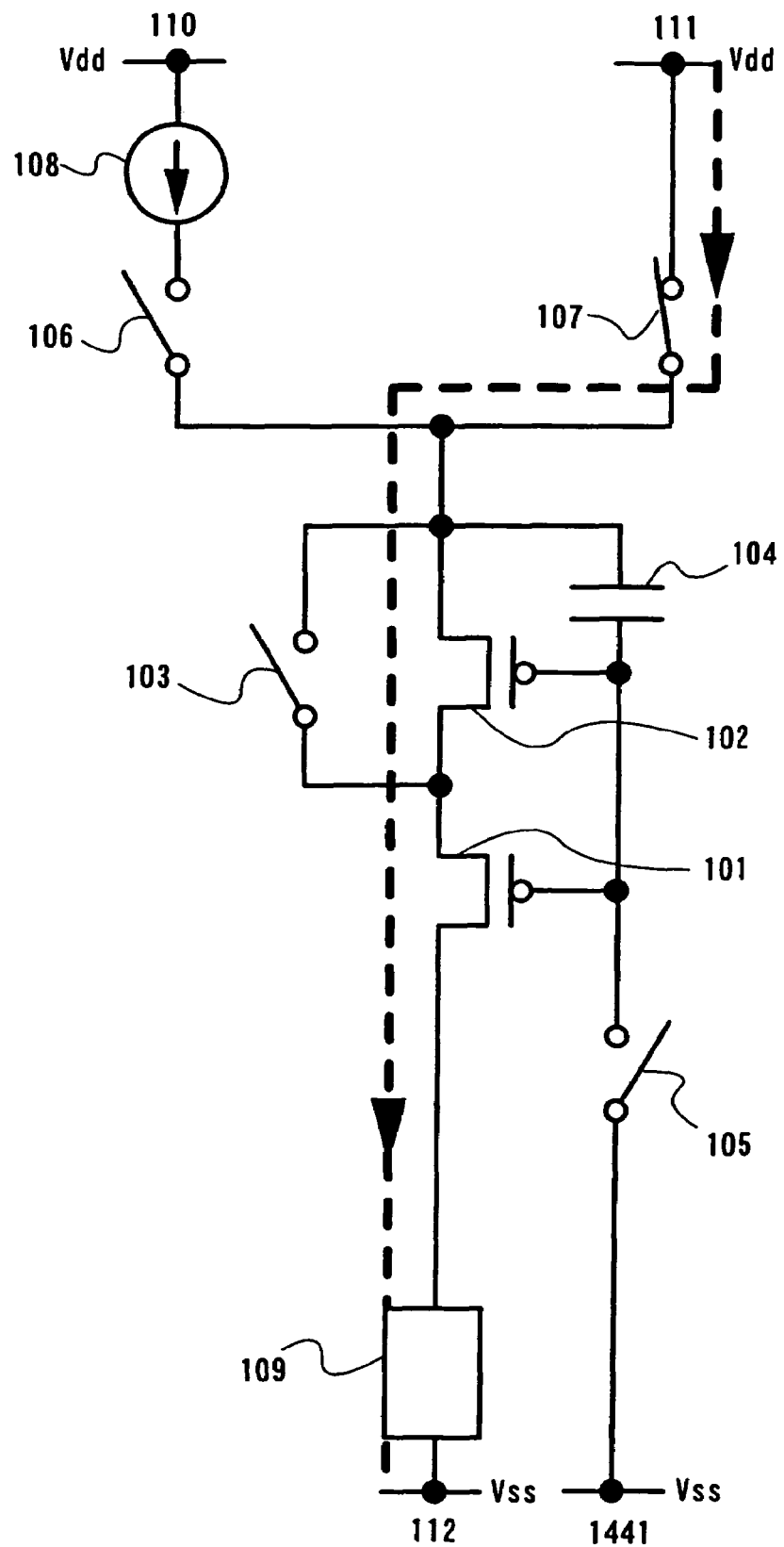

FIG. 187 is a diagram showing an operation of a current source circuit of the invention.

Figure 188:
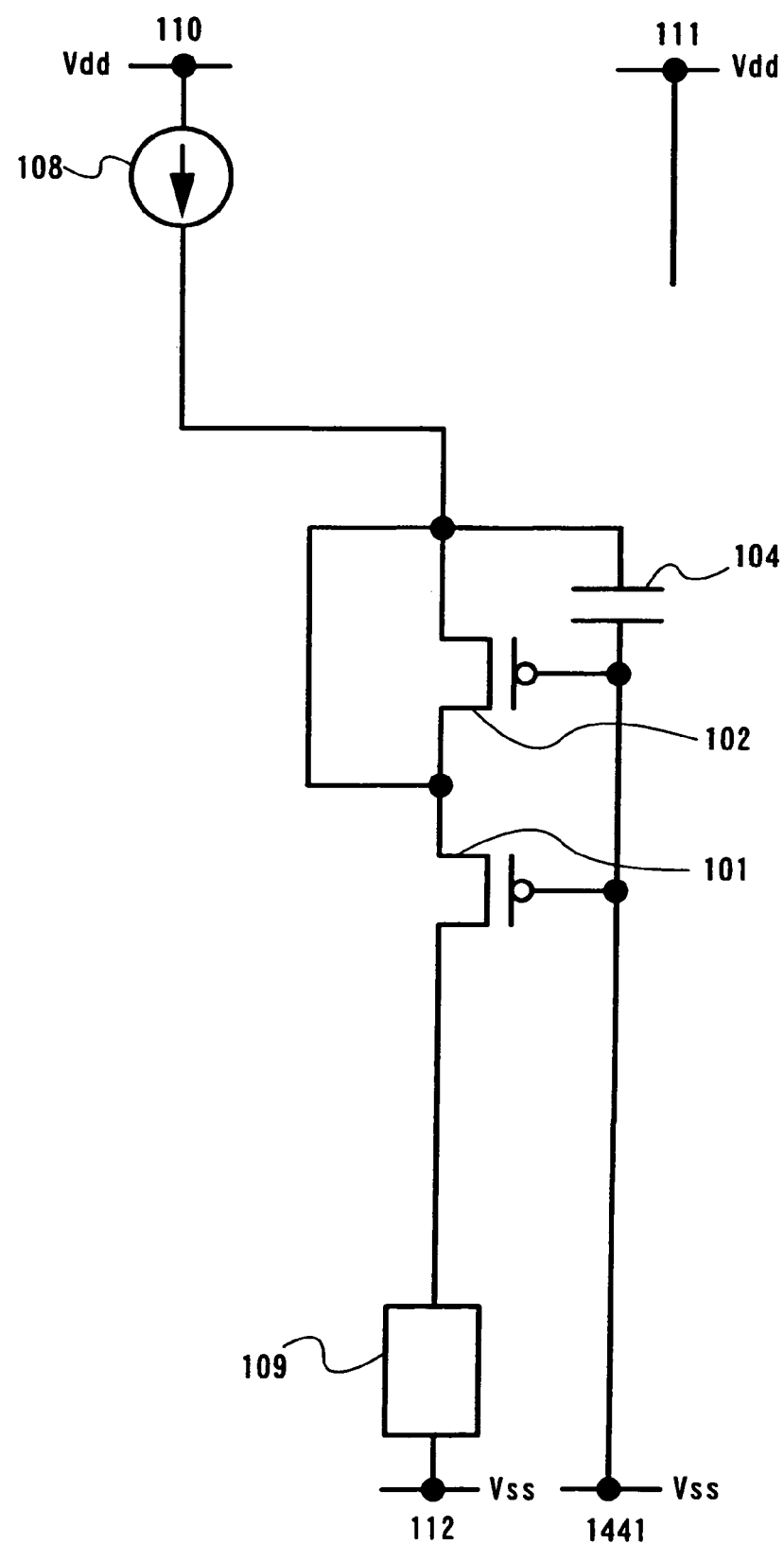

FIG. 188 is a diagram showing connections of a certain operation of a current source circuit of the invention.

Figure 189:
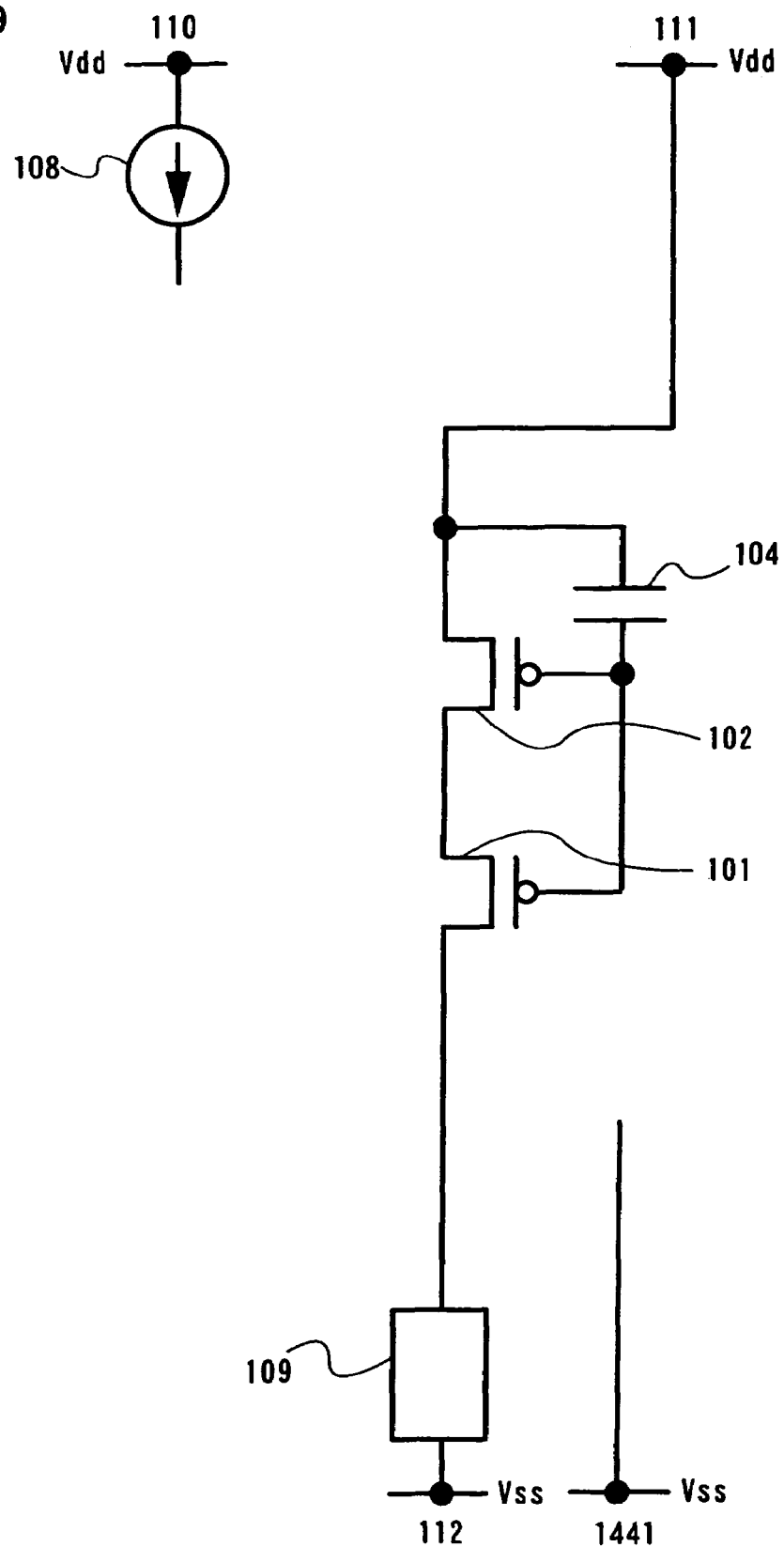

FIG. 189 is a diagram showing connections of a certain operation of a current source circuit of the invention.

Figure 190:
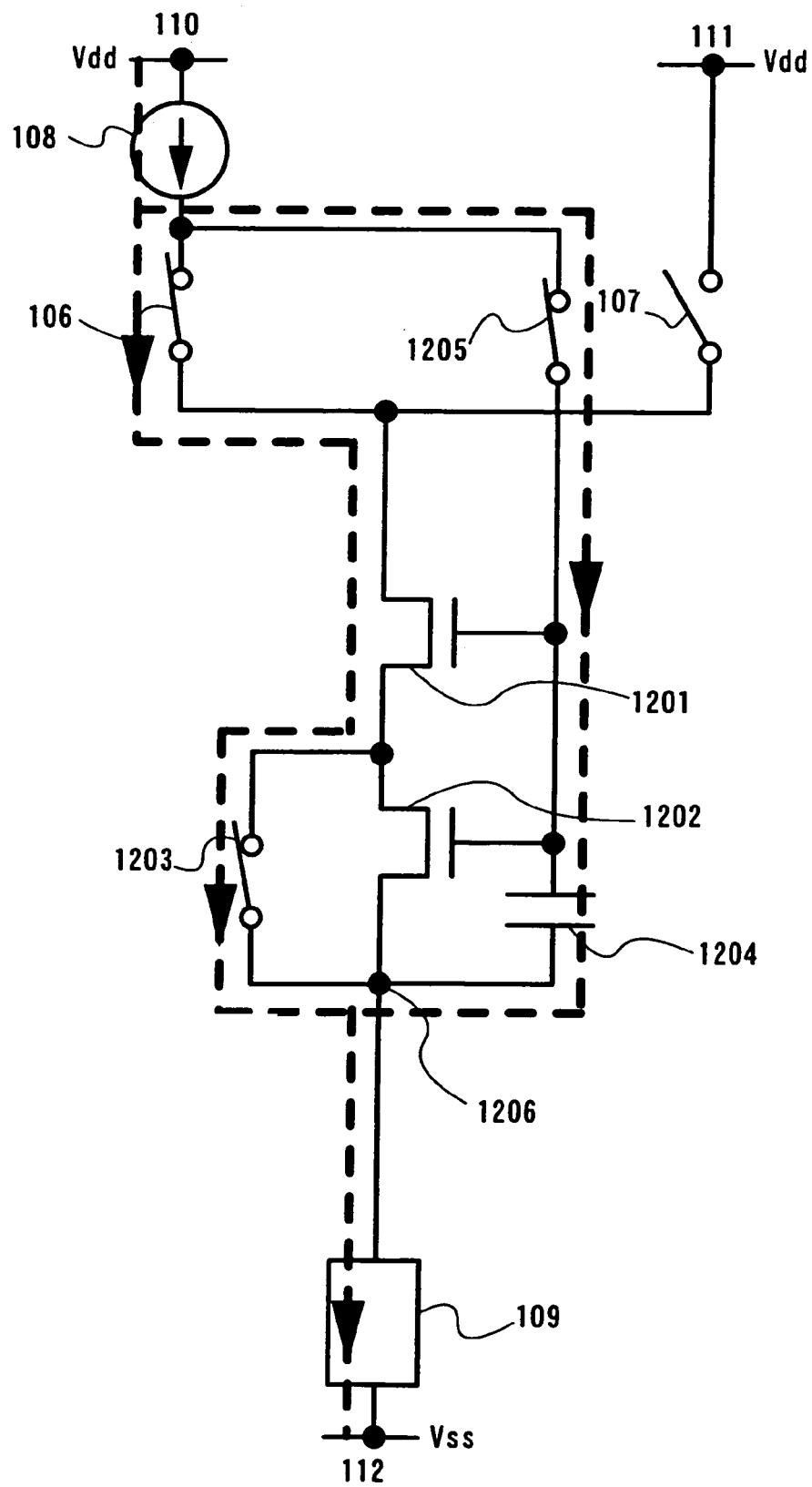

FIG. 190 is a diagram showing an operation of a current source circuit of the invention.

Figure 191:
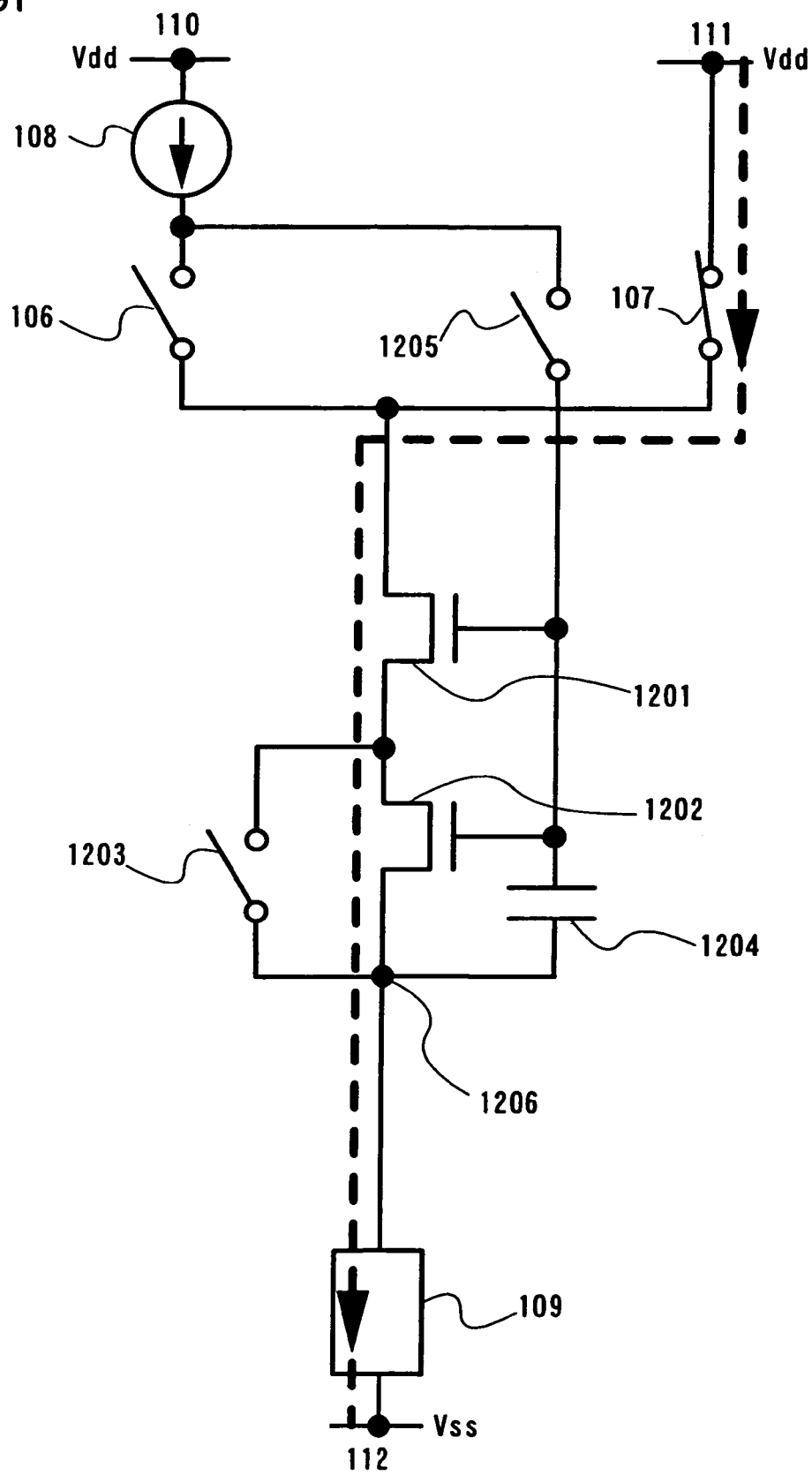

FIG. 191 is a diagram showing an operation of a current source circuit of the invention.

DETAILED DESCRIPTION OF THE INVENTION

Although the invention will be described by way of example with reference to the accompanying drawings, it is to be understood that various changes and modifications will be apparent to those skilled in the art. Therefore, unless such changes and modifications depart from the scope of the invention, they should be construed as being included therein. Note that identical portions in embodiment modes are denoted by the same reference numerals and detailed descriptions thereof are omitted.

Embodiment Mode 1

The invention can be applied to various analog circuits having a current source as well as to a pixel having an EL element. In this embodiment mode, a basic principle of the invention is described.

Figure 1:
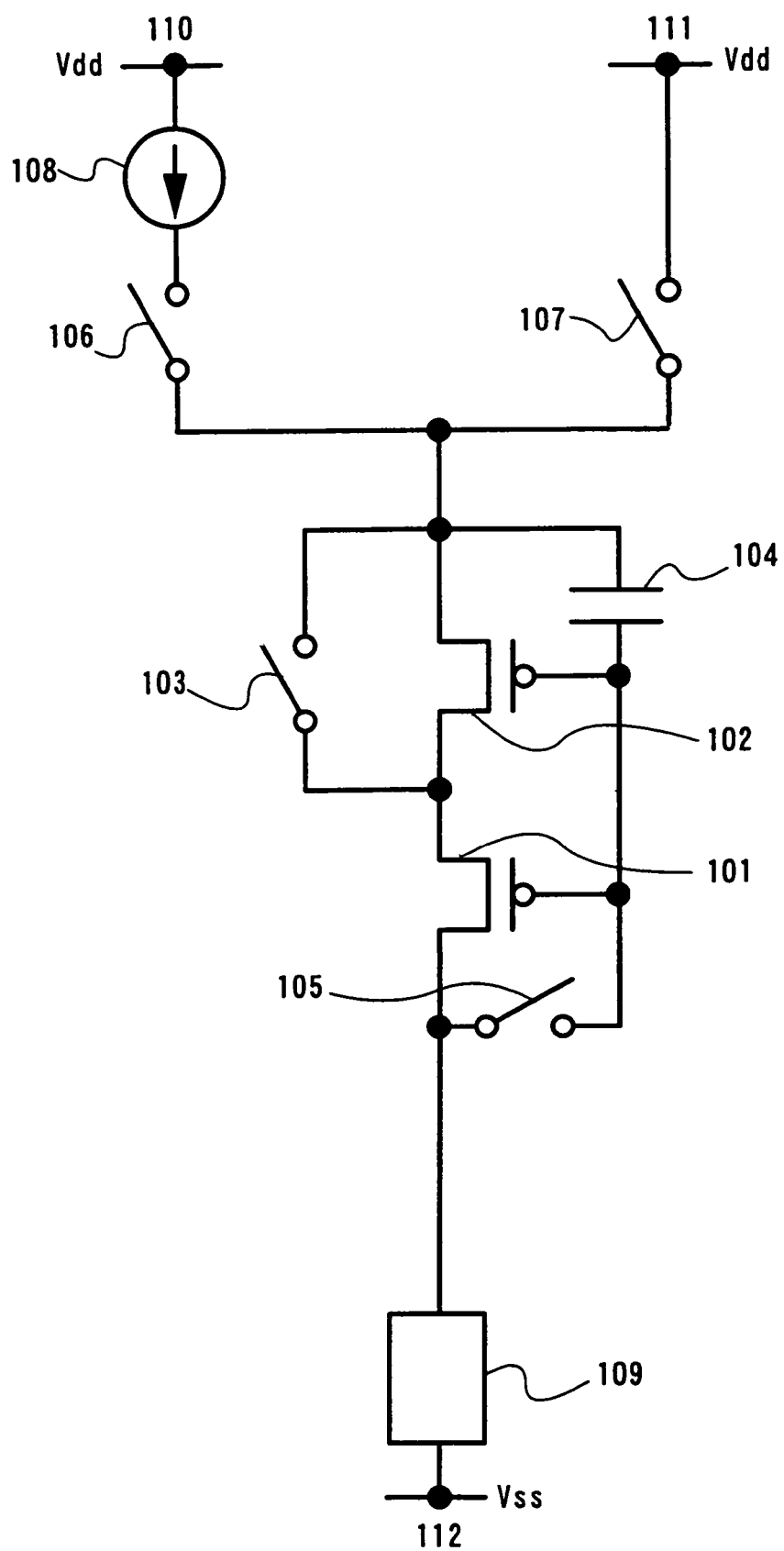
FIG. 1 is a diagram showing a configuration of a current source circuit of the invention.

First, a configuration based on the basic principle of the invention is shown in FIG. 1. A current source transistor 101 which constantly operates as a current source (or a part of it) and a switching transistor 102 which operates differently depending on states are provided, which are connected in series. A source terminal and a drain terminal of the switching transistor 102 are connected via a switch 103. A gate terminal of the current source transistor 101 and a gate terminal of the switching transistor 102 are connected to one terminal of a capacitor 104. The other terminal of the capacitor 104 is connected to the source terminal of the switching transistor 102. The gate terminals of the current source transistor 101 and the switching transistor 102 are connected to the drain terminal of the current source transistor 101 via a switch 105. The capacitor 104 can be controlled to hold a charge by turning on/off the switch 105. Accordingly, the capacitor 104 can hold a gate-source voltage of the current source transistor 101. The drain terminal of the current source transistor 101 and a wiring 112 are connected via the load 109. The source terminal of the switching transistor 102 is connected to a wiring 110 via a switch 106 and a reference current source 108, and in parallel to this, connected to a wiring 111 via a switch 107.

The switching transistor 102 is connected to a unit which can switch the operations between the case where the switching transistor 102 operates as a current source and the case where it operates so that no current flows between the source and drain thereof (or the case where it operates as a switch). Here, the case where the switching transistor 102 operates as (a part of) a current source is referred to as a current source operation. Further, the case where the switching transistor 102 operates with no current flowing between the source and drain thereof (or the case where it operates as a switch) or the case where it operates with a small source-drain voltage is referred to as a short-circuit operation.

In order to perform the current source operation and the short-circuit operation to the switching transistor 102, various configurations can be employed.

In this embodiment mode, FIG. 1 shows a configuration example. In FIG. 1, the source terminal and the drain terminal of the switching transistor 102 are designed to be connected via the switch 103. Then, the gate terminal of the switching transistor 102 is connected to the gate terminal of the current source transistor 101. The operation of the switching transistor 102 can be switched between the current source operation and the short-circuit operation by using the switch 103.

Figure 2:
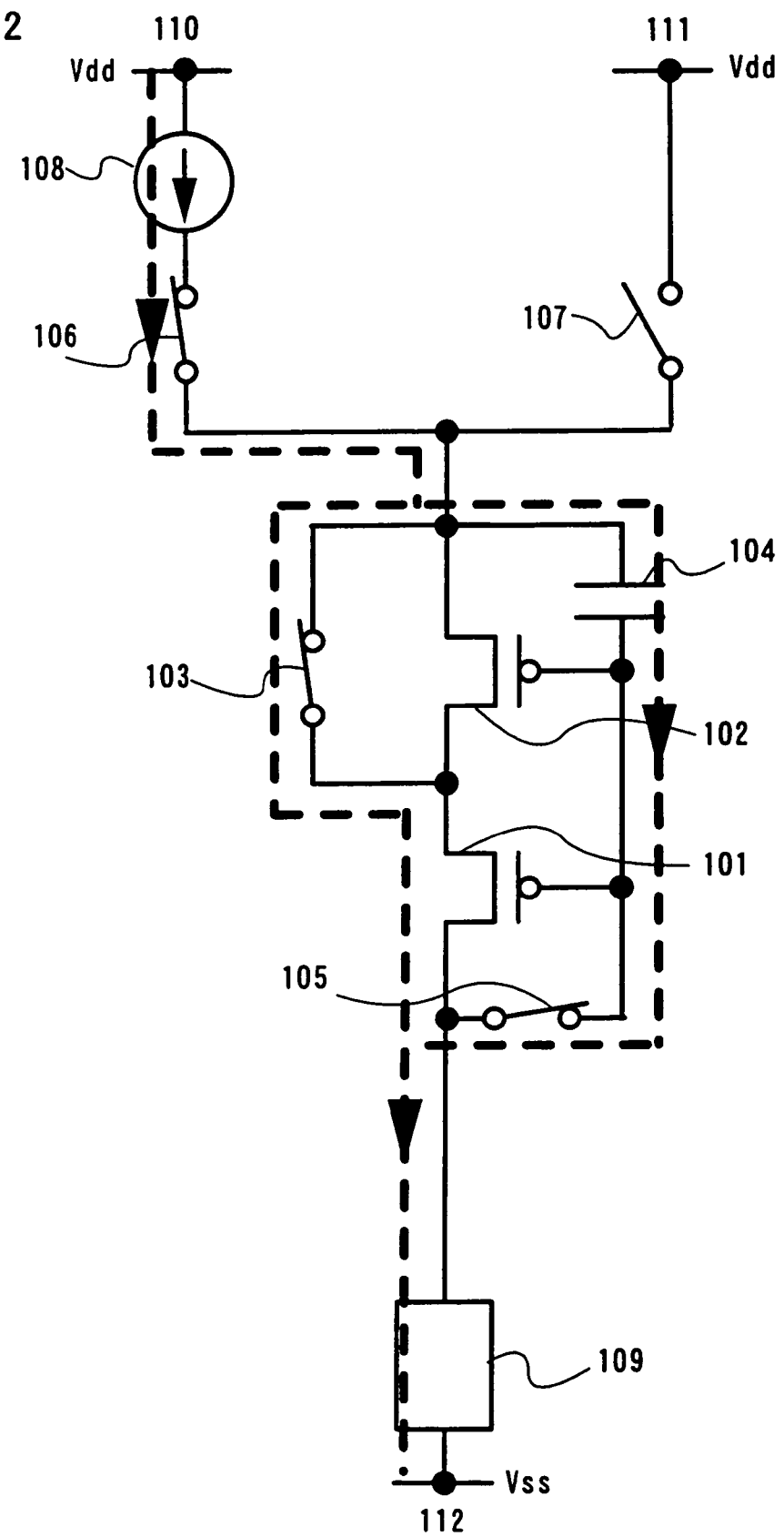
FIG. 2 is a diagram showing an operation of a current source circuit of the invention.

The operation of FIG. 1 is described now. First, the switches 103, 105 and 106 are turned on and the switch 107 is turned off as shown in FIG. 2. Then, the source terminal and the drain terminal of the switching transistor 102 have approximately the same potential. That is to say, hardly any current flows between the source and drain of the switching transistor 102 while a current flows to the switch 103. Therefore, a current Ib of the reference current source 108 flows to the capacitor 104 or the current source transistor 101. Then, the current stops flowing to the capacitor 104 when the current flowing between the source and drain of the current source transistor 101 and the current Ib of the reference current source 108 become equal. That is, a steady state is obtained. A potential of the gate terminal at that time is accumulated in the capacitor 104. That is, a voltage required to supply the current Ib between the source and drain of the current source transistor 101 is applied between the gate and source thereof. The aforementioned operation corresponds to the set operation. At that time, the switching transistor 102 performs the short-circuit operation.

In this manner, when a current stops flowing to the capacitor 104 and the steady state is obtained, the set operation is completed.

Figure 3:
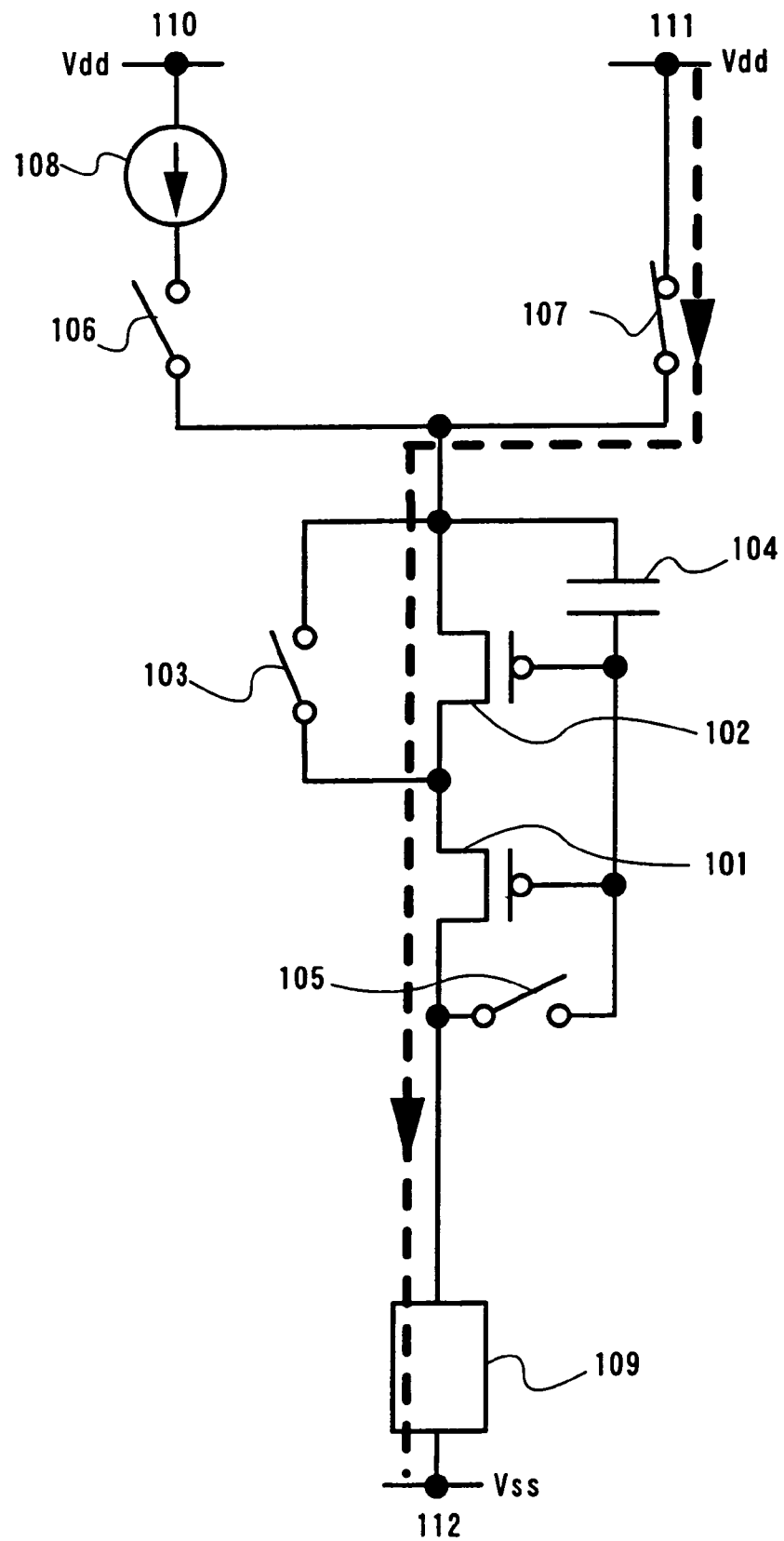
FIG. 3 is a diagram showing an operation of a current source circuit of the invention.

Next, the switches 103, 105 and 106 are turned off and the switch 107 is turned on as shown in FIG. 3. Then, a current flows between the source and drain of the switching transistor 102 as the switch 103 is off. On the other hand, a charge accumulated in the capacitor 104 in the set operation is applied to the gate terminals of the current source transistor 101 and the switching transistor 102. At this time, the gate terminals of the current source transistor 101 and the switching transistor 102 are connected to each other. Therefore, they operate together as a multi-gate transistor. When the current source transistor 101 and the switching transistor 102 operate as one transistor, a gate length L of the multi-gate transistor is longer than L of the current source transistor 101. Generally, as the gate length L of a transistor becomes longer, a current flowing through it becomes smaller. Therefore, a current flowing to the load 109 becomes smaller than Ib. The aforementioned operation corresponds to the output operation. At that time, the switching transistor 102 performs the current source operation.

In this manner, by controlling on/off of the switch 103, a current Ib flowing in the set operation can be larger than the current flowing to the load 109 and the like in the output operation, which enables the steady state to be obtained rapidly. That is to say, an effect of a load (wiring resistance, intersection capacitance and the like) which is parasitic on a wiring through which a current flows is lessened and the steady state can be obtained rapidly.

As the current Ib is large in the set operation, an effect of a noise and the like becomes little. That is, as a value of Ib is large, it is not affected by a minute current generated by a noise and the like.

Therefore, for example, when the load 109 is an EL element, a signal can be written by the current Ib which is larger than a current supplied to the EL element when writing a signal in the case where the EL element emits light at a low gray scale level. Therefore, such trouble that the signal current is disturbed by a noise can be prevented, thus a rapid write operation can be performed.

It is to be noted that the load 109 may be anything such as a resistor, a transistor, an EL element, and a current source circuit configured of a transistor, a capacitor, and a switch. The load 109 may be a signal line or a signal line and a pixel connected thereto. The pixel may include any display elements such as an EL element and an element used for an FED.

It is to be noted that the capacitor 104 can be substituted by gate capacitance of the current source transistor 101, the switching transistor 102 and the like. In that case, the capacitor 104 can be omitted.

Although a high potential power source Vdd is supplied to wirings 110 and 111, the invention is not limited to this. Each wiring may have the same potential of different potentials. The wiring 111 is only required to hold a charge of the capacitor 104. The wiring 110 or the wiring 111 is not required to keep the same potential constantly. They may have different potentials between the set operation and the output operation as long as a normal operation can be obtained.

It is preferable that the current source transistor 101 and the switching transistor 102 have the same polarity (the same conductivity) as they operate as a multi-gate transistor in the output operation.

It is to be noted that the current source transistor 101 and the switching transistor 102 operate as a multi-gate transistor in the output operation, a gate width W of each transistor may be the same or different. Similarly, a gate length L thereof may be the same or different. The gate width W, however, is preferably the same as it can be considered to be the same as a normal multi-gate transistor. By designing the gate length L of the switching transistor 102 longer, a current supplied to the load 109 becomes smaller. Therefore, the gate width and length may be designed in consideration of a current required to be supplied in each of the set operation and the output operation.

Note that the switches such as 103, 105, 106, and 107 may be any switches such as electrical switches and mechanical switches as long as they can control current flow. It may be a transistor, a diode, or a logic circuit configured with them. Therefore, in the case of applying a transistor as a switch, polarity thereof (conductivity) is not particularly limited because it operates just as a switch. However, when an off current is preferred to be small, a transistor with a polarity with a small off current is favorably used. For example, the transistor which has an LDD region has a small off current. Further, it is desirable that an n-channel transistor be employed when a potential of a source terminal of the transistor as a switch is closer to the potential of the low potential side power source (Vss, Vgnd, 0 V and the like), and a p-channel transistor be employed when the potential of the source terminal is closer to the potential of the high potential side power source (Vdd and the like). This helps the switch operate efficiently as the absolute value of the voltage between the gate and source of the transistor can be increased. It is also to be noted that a CMOS switch can also be applied by using both n-channel and p-channel transistors.

FIG. 1 shows a circuit of the invention, however, the invention is not limited to this. By changing the number and arrangement of switches, the polarity of each transistor, the number and arrangement of the current source transistor 101 and the switching transistor 102, a potential of each wiring, a direction of current flow, and the like, various circuits can be configured. By using each change in combination, various circuits can be configured.

For example, such switches as 103, 105, 106, and 107 may be arranged anywhere as long as they can control on/off of a current. In specific, the switch 107 is required to be arranged in series with the wiring 111 which supplies a desired potential for setting a desired potential. Similarly, the switch 106 which controls a current of the reference current source 108 is required to be arranged in series to the reference current source 108. The switch 103 which controls a current supplied to the switching transistor 102 is required to be arranged in parallel to the switching transistor 102. The switch 105 is required to be arranged so as to control a charge in the capacitor 104.

Figure 4:
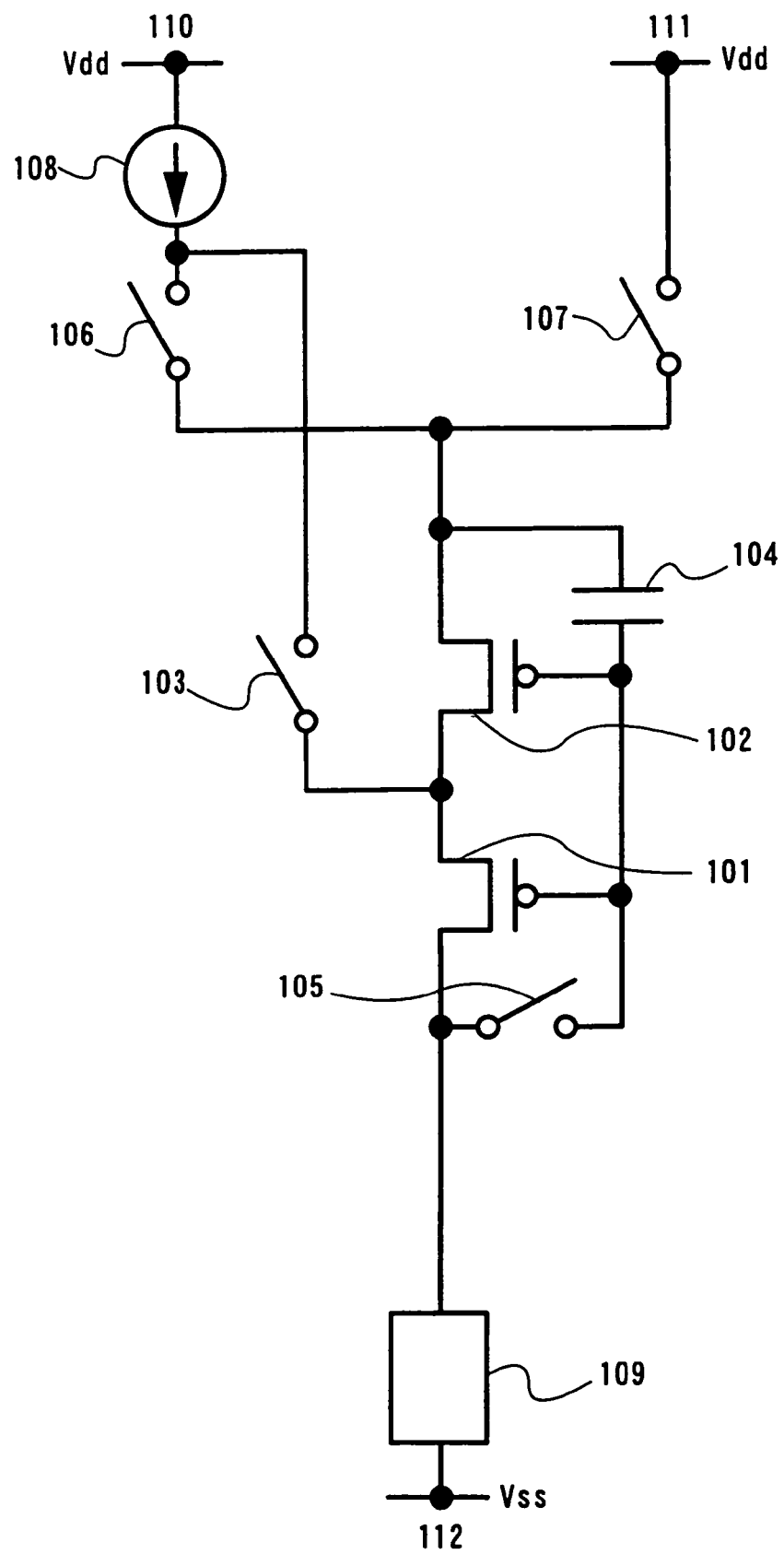
FIG. 4 is a diagram showing a configuration of a current source circuit of the invention.
Figure 5:
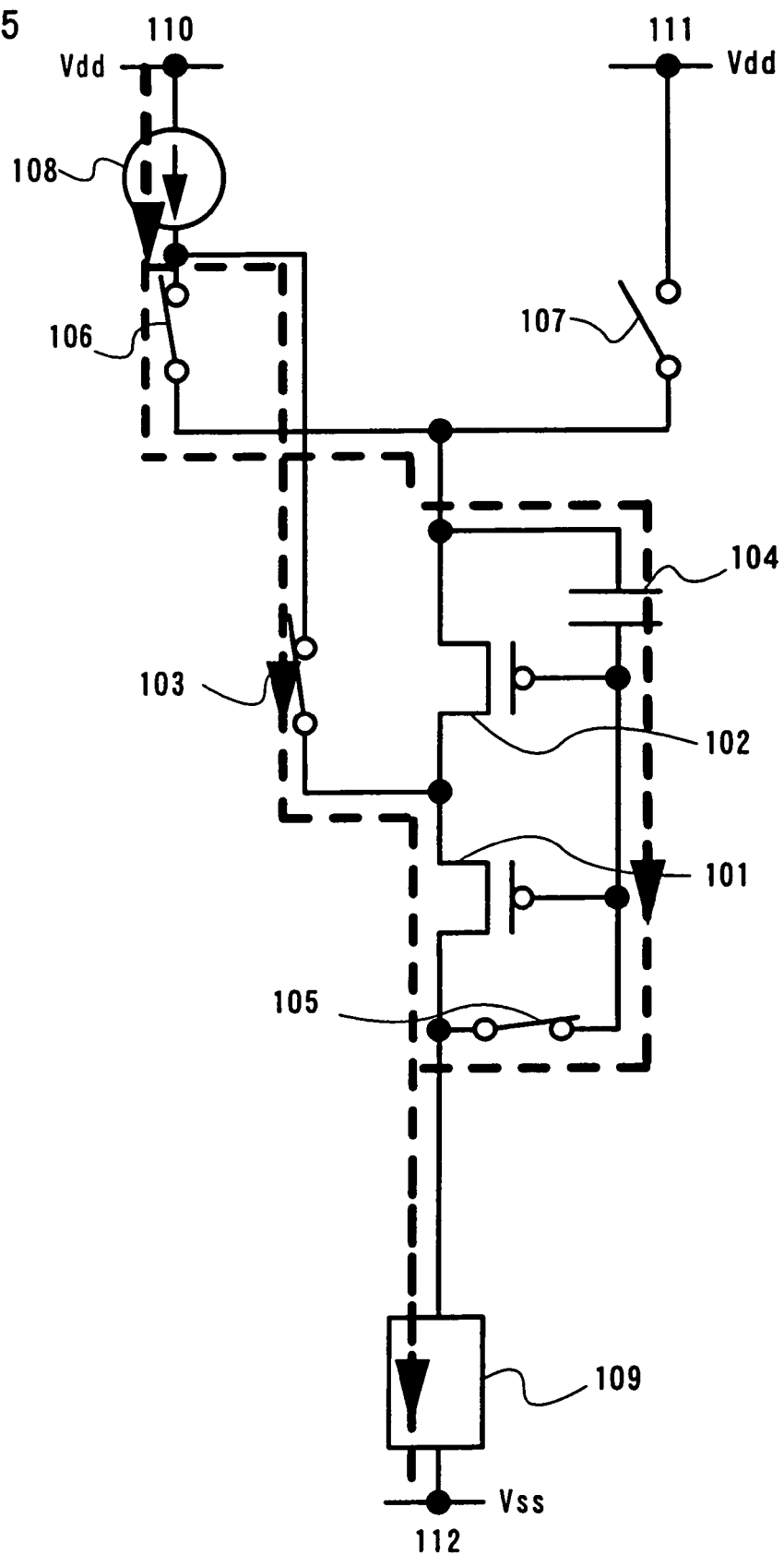
FIG. 5 is a diagram showing an operation of a current source circuit of the invention.
Figure 6:
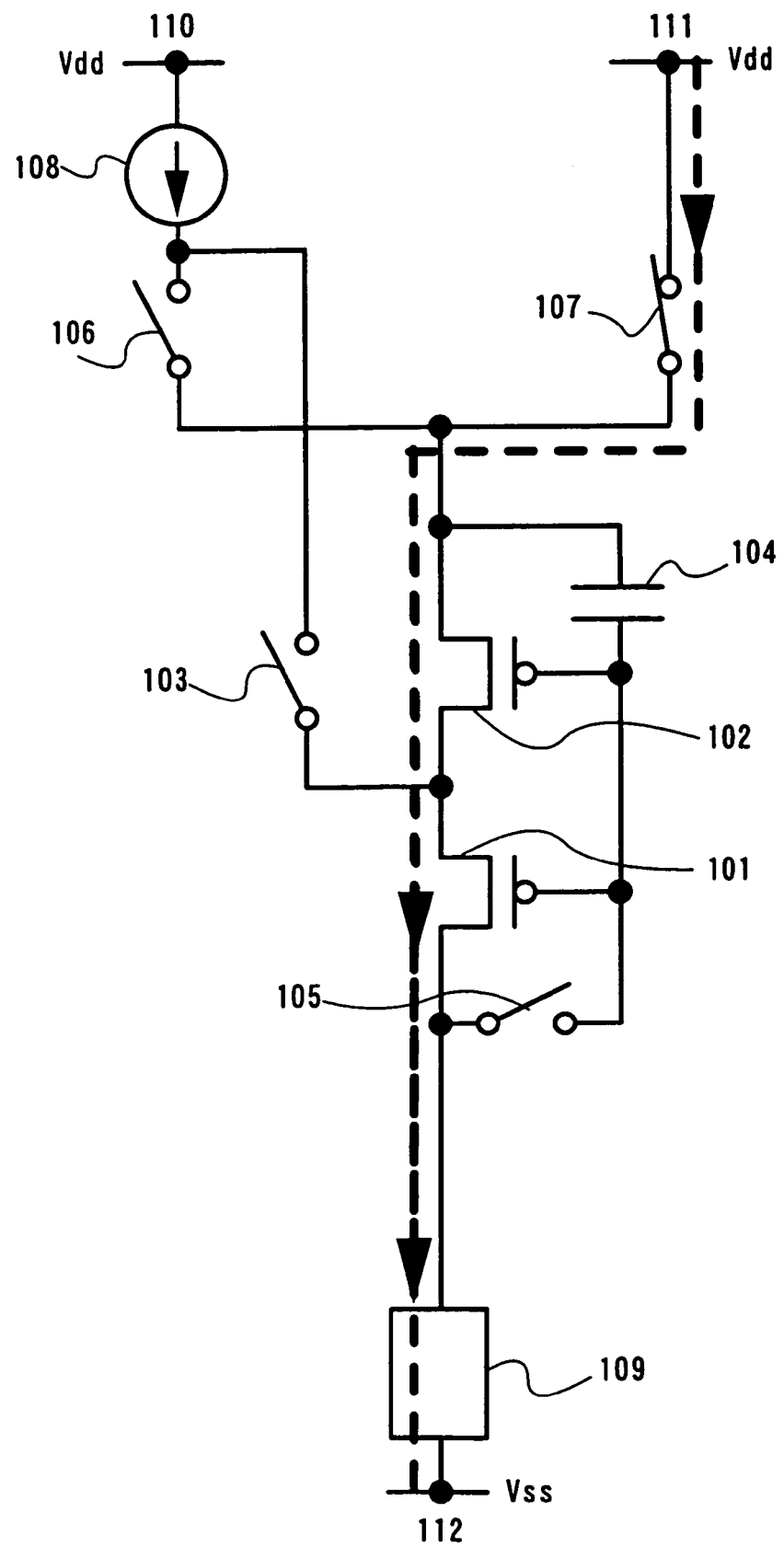
FIG. 6 is a diagram showing an operation of a current source circuit of the invention.

FIG. 4 shows an example of changing the connection of the switch 103. One terminal of the switch 103 is connected between the drain terminal of the switching transistor 102 and the source terminal of the current source transistor 101 while the other terminal is connected between the switch 106 and the reference current source 108. In the configuration of FIG. 4 also, a current of the reference current source 108 can be controlled by the switch 106, and the switch 103 can switch the short-circuit operation and the current source operation of the switching transistor 102. That is, the switches 103, 105, and 106 are turned on and the switch 107 is turned off in the set operation as shown in FIG. 5. In this manner, the source and drain of the switching transistor 102 can be short-circuited as well as the current of the reference current source 108 can be supplied. In the output operation, the switches 103, 105, and 106 are turned off and the switch 107 is turned on as shown in FIG. 6. In this manner, a current can flow to the switching transistor 102.

FIG. 144 shows an example where the switch 105 is connected differently. One terminal of the switch 105 is connected to the gate terminal of the current source transistor 101 and the other terminal thereof is connected to a wiring 1441. A charge in the capacitor 104 can be controlled by the configuration of FIG. 144. It is to be noted that the wirings 112 and 1441 may be a common wiring or different wirings.

Figure 15:
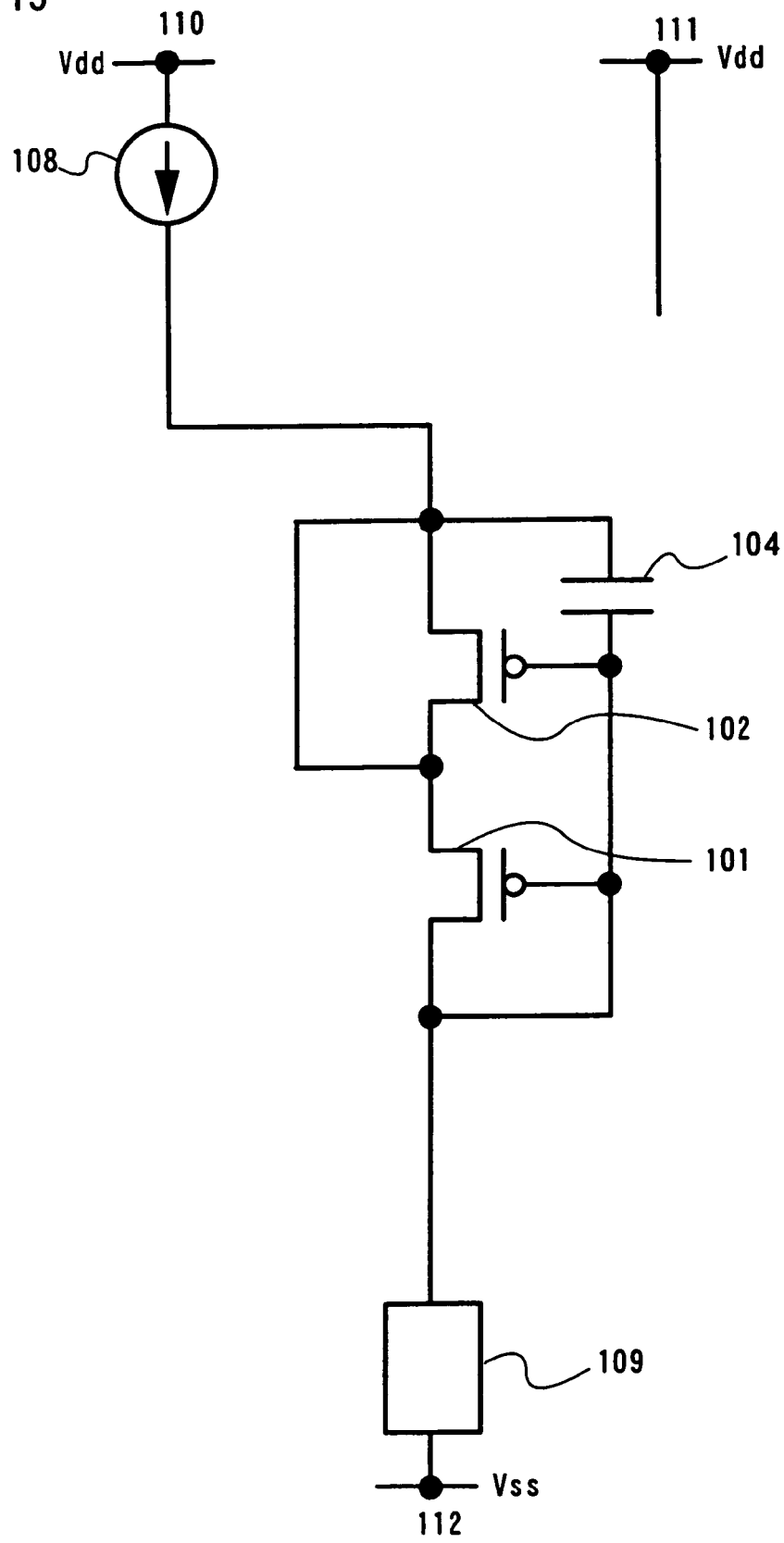
FIG. 15 is a diagram showing connections of a certain operation of a current source circuit of the invention.
Figure 16:
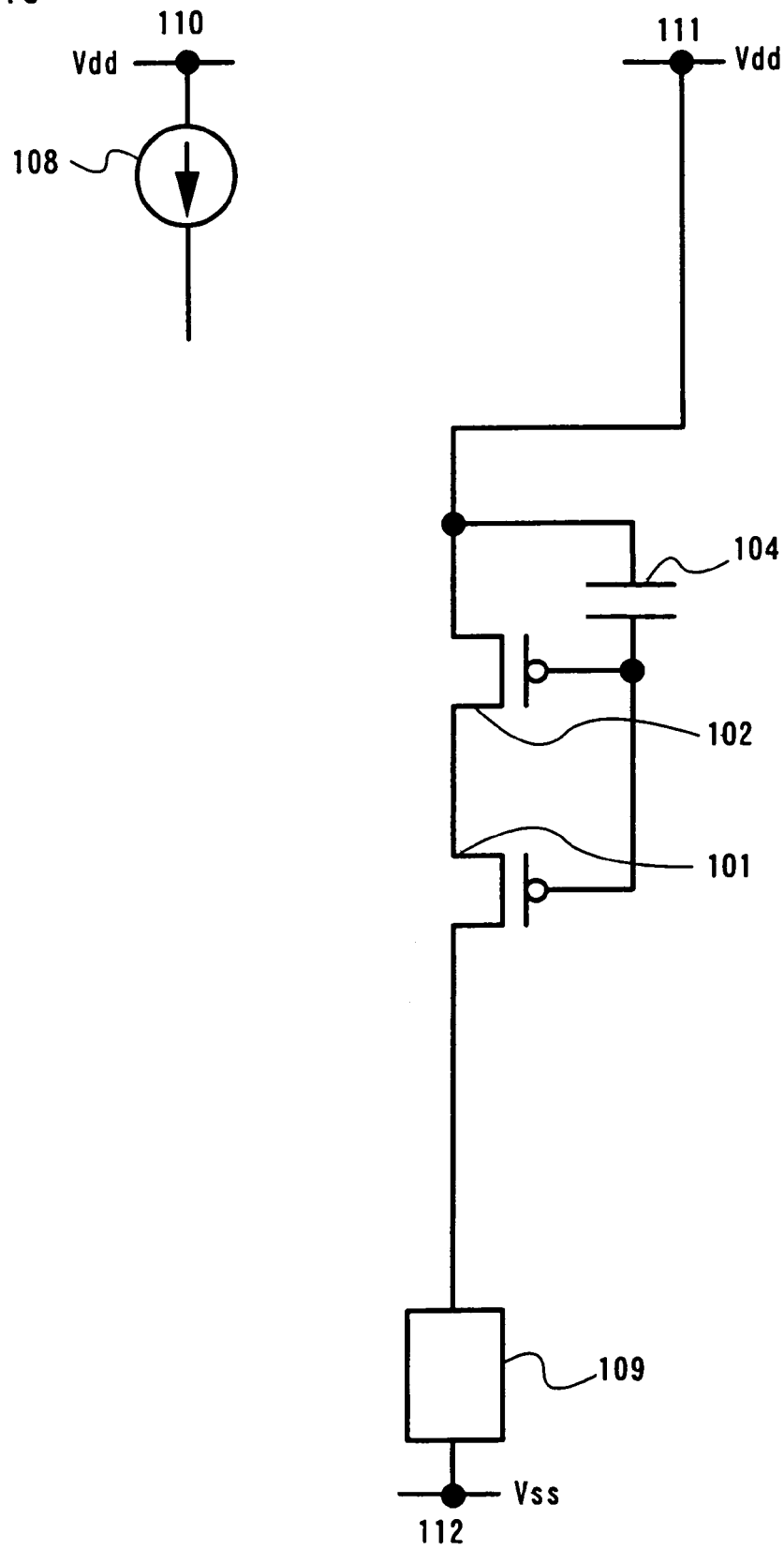
FIG. 16 is a diagram showing connections of a certain operation of a current source circuit of the invention.

That is to say, the switches such as 103, 105, 106, and 107 may be arranged anywhere as long as elements are connected as shown in FIG. 15 in the set operation in which the current Ib of the reference current source 108 flows to the current source transistor 101 and the switching transistor 102 performs the short-circuit operation while elements are connected as shown in FIG. 16 in the output operation in which the switching transistor 102 performs the current source operation and a current flowing through the switching transistor 102 and the current source transistor 101 flows to the load 109. Therefore, it is needless to say that the connections shown in FIG. 15 include connections shown in FIG. 181 and connections shown in FIG. 182.

Figure 7:
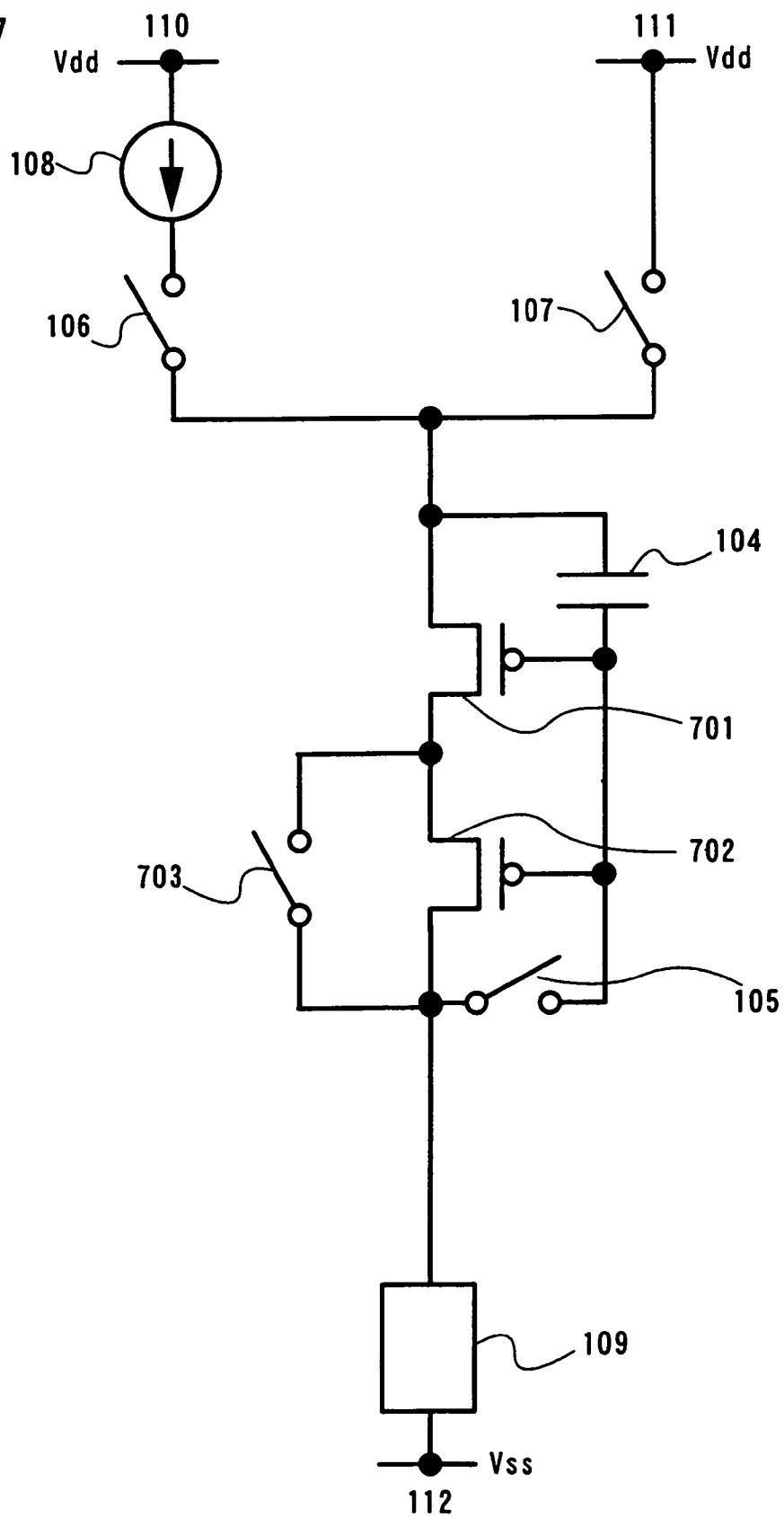
FIG. 7 is a diagram showing a configuration of a current source circuit of the invention.

FIG. 7 shows the case where the arrangements of the current source transistor 101 and the switching transistor 102 are interchanged. The current source transistor 101, the switching transistor 102, and the switch 103 in FIG. 1 correspond to a current source transistor 701, a switching transistor 702, and a switch 703 in FIG. 7 respectively. In FIG. 1, the switching transistor 102, the current source transistor 101, and the load 109 are arranged in this order, however, the current source transistor 701, the switching transistor 702, and the load 109 are arranged in this order in FIG. 7.

Here, a difference between the circuits in FIGS. 1 and 7 is described. In FIG. 1, a potential difference generates between the gate terminal and source terminal (drain terminal) of the switching transistor 102 in the short-circuit operation. Therefore, gate capacitance of the switching transistor 102 stores a charge. Then, a charge is still stored in the gate capacitance in the current source operation as well. Accordingly, the potential of the current source transistor 101 does not change almost at all between the short-circuit operation (set operation) and the current source operation (output operation).

On the other hand, hardly potential difference generates between a gate terminal and a source terminal (drain terminal) of the switching transistor 702 in the short-circuit operation. Therefore, gate capacitance of the switching transistor 702 does not store a charge. As the switches 105 and 703 are turned off in the current source operation, a charge is stored in the gate capacitance, thus the switching transistor 702 operates as a part of the current source. The charge at this time is accumulated in the capacitor 104 and gate capacitance of the current source transistor 701. The charge moves to a gate portion of the switching transistor 702. Accordingly, a potential of the gate terminal of the current source transistor 701 changes by the level of charge which is moved between the short circuit operation (set operation) and the current source operation (output operation). As a result, an absolute value of a gate-source voltage of the current source transistor 701 and the switching transistor 702 becomes small in the output operation, thus a current supplied to the load 109 becomes small.

Therefore, the arrangements of the current source transistor 701 and the switching transistor 702 are to be designed depending on the cases. For example, in the case where an EL element as the load 109 emits light even slightly when a black display is to be displayed, the contrast is decreased. In such a case, the configuration shown in FIG. 7 is preferable since it can make the current slightly smaller.

Figure 8:
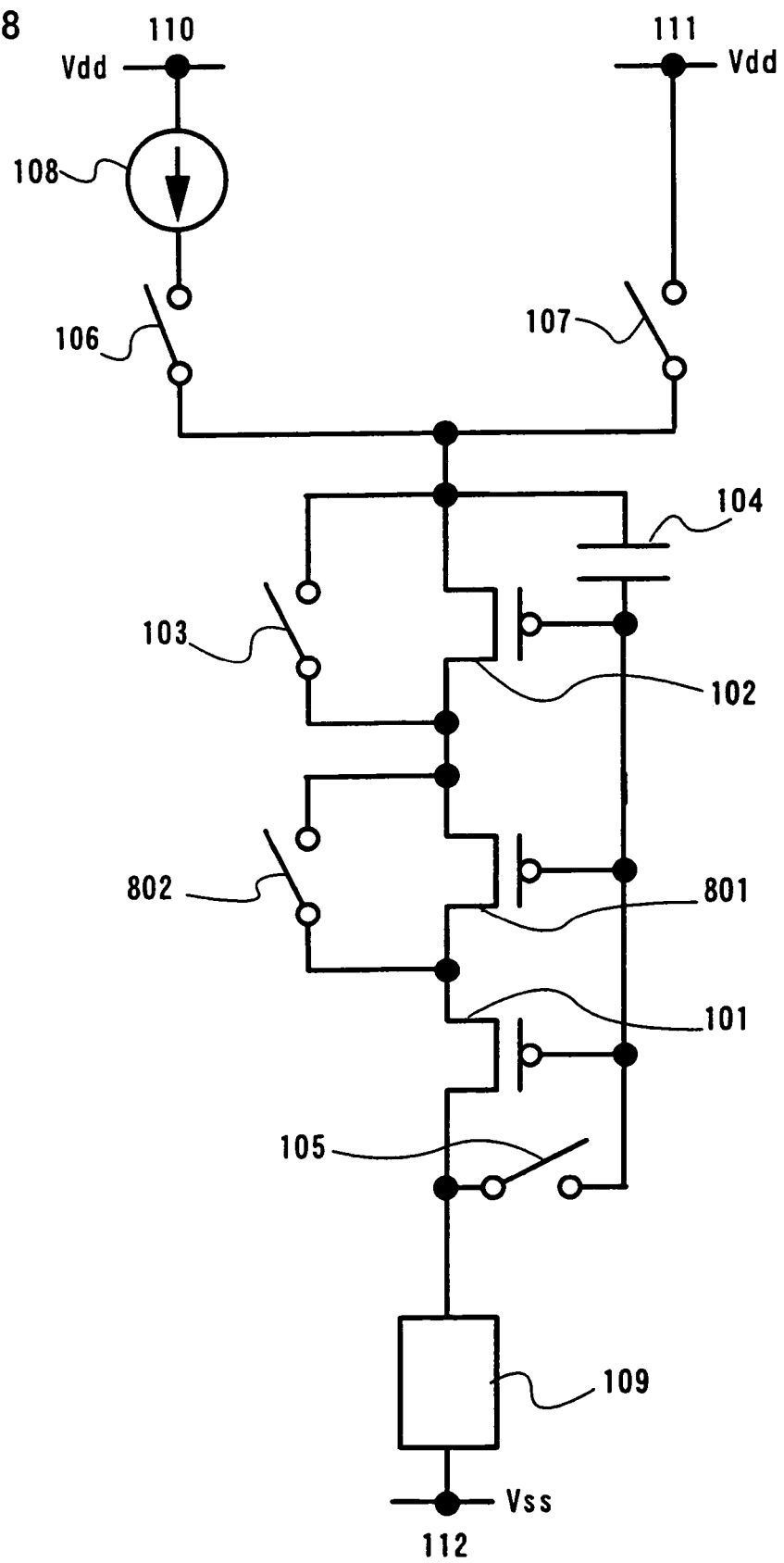
FIG. 8 is a diagram showing a configuration of a current source circuit of the invention.
Figure 9:
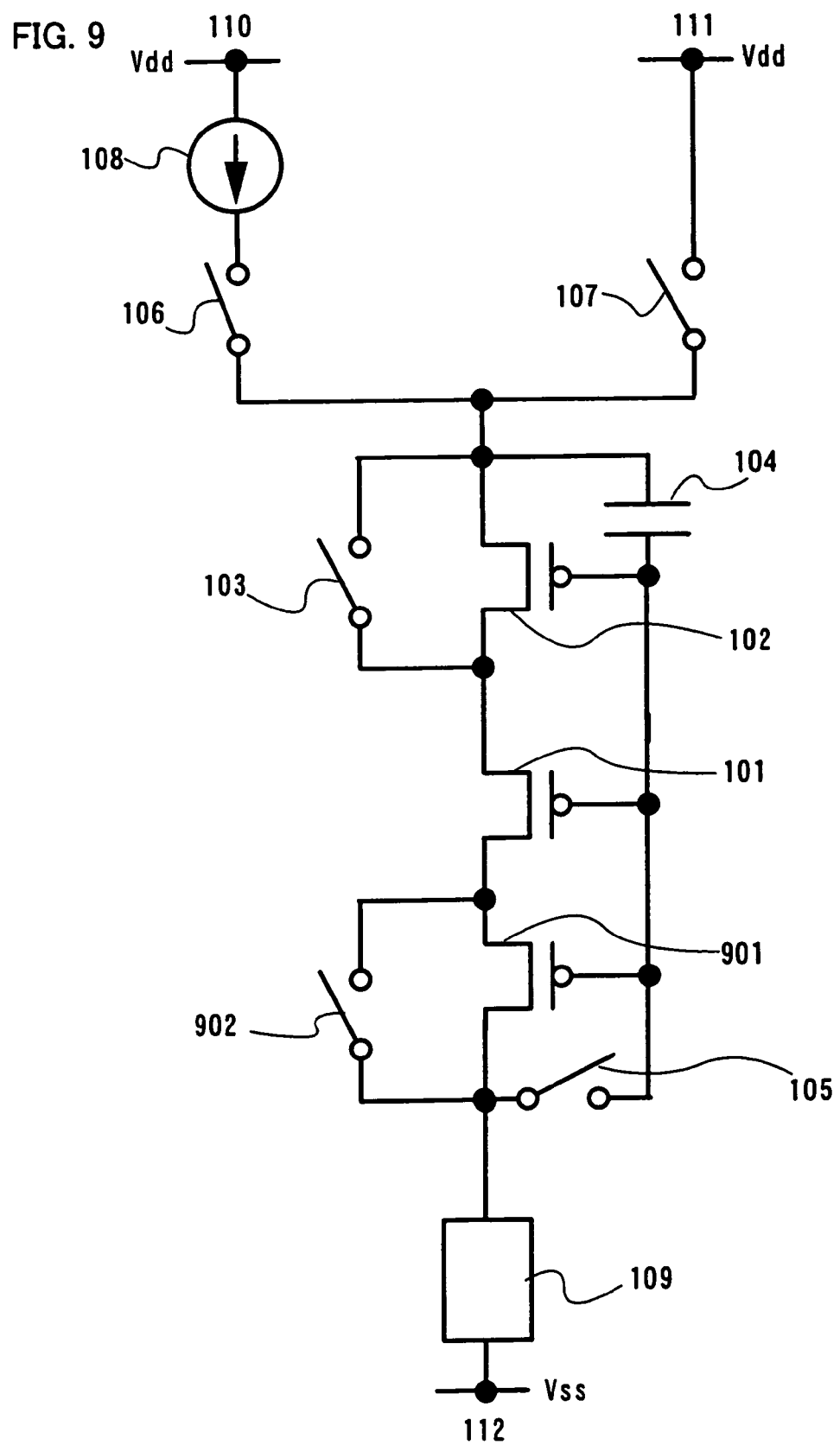
FIG. 9 is a diagram showing a configuration of a current source circuit of the invention.

Each of the current source transistor 101 and the switching transistor 102 is arranged one each in FIG. 1, however, one of or both transistors may be provided in plural numbers. The arrangements thereof may be selected arbitrarily. FIG. 8 shows an example of the case where a second switching transistor 801 is provided between the switching transistor 102 and the current source transistor 101 in FIG. 1. The short-circuit operation and the current source operation of the second switching transistor 801 is switched by turning on/off of the switch 802. In this manner, a function of the switching transistor 102 in FIG. 1 can be performed by using the switching transistor 102 and the second switching transistor 801 in FIG. 8. FIG. 9 shows a configuration in which a second switching transistor 902 functioning as the switching transistor 702 in FIG. 7 is provided in the configuration of FIG. 1. It is to be noted that the switch 901 corresponds to the switch 703 in FIG. 7.

In FIG. 1, the gate terminals of the current source transistor 101 and the switching transistor 102 are both connected to the drain terminal of the current source transistor 101 via the switch 105. As shown in FIG. 185, however, the gate terminals of the current source transistor 101 and the switching transistor 102 may be both connected to a wiring 1441 via the switch 105. That is, in the set operation, the switches 106, 103, and 105 are turned on and the switch 107 is turned off as shown in FIG. 186. In this manner, a current of the reference current source 108 can be supplied and the source and drain of the switching transistor 102 can be short-circuited. In the output operation, the switch 107 is turned on and the switches 106, 103, and 105 are turned off as shown in FIG. 187. In this manner, a current can flow through the switching transistor 102.

That is to say, the switches such as 103, 105, 106, and 107 may be arranged anywhere as long as elements are connected as shown in FIG. 188 in the set operation in which the current Ib of the reference current source 108 flows to the current source transistor 101 and the switching transistor 102 performs the short-circuit operation while elements are connected as shown in FIG. 189 in the output operation in which the switching transistor 102 performs the current source operation and a current flowing through the switching transistor 102 and the current source transistor 101 flows to the load 109. It is to be noted that a low power source potential Vss is inputted to the wiring 1441, however, the invention is not limited to this. When potentials inputted to a wiring 112 and the wiring 1441 are the same, these wirings can be a common wiring.

Figure 11:
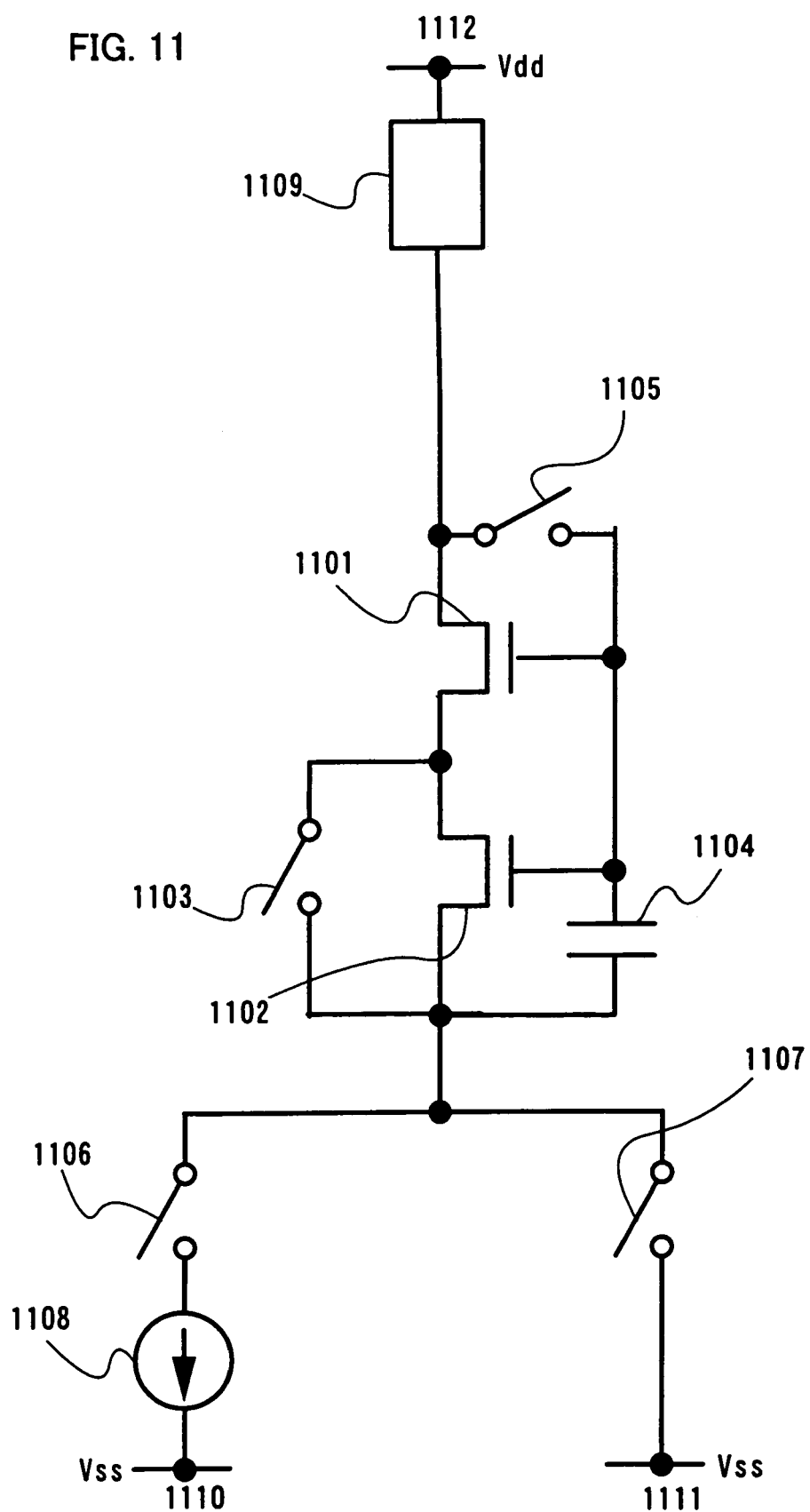
FIG. 11 is a diagram showing a configuration of a current source circuit of the invention.

The current source transistor 101 and the switching transistor 102 are p-channel transistors in FIG. 1, however, the invention is not limited to this. FIG. 11 shows an example in which the polarity (conductivity) of the current source transistor 101 and the switching transistor 102 are changed and connections of the circuit are not changed in the circuit of FIG. 1. As in FIGS. 1 and 11, the polarity can be easily changed by changing potentials of the wirings 110, 111, and 112 so as to be those of wirings 1110, 1111, and 1112 and changing a direction of current of the reference current source 108 so as to be that of a reference current source 1108. A current source transistor 1101, a switching transistor 1102, switches 1103, 1105, 1106, and 1107, a capacitor 1104, and a load 1109 correspond to the current source transistor 101, the switching transistor 102, the switches 103, 105, 106, and 107, the capacitor 104, and the load 109 respectively, of which connections are not changed.

Figure 12:
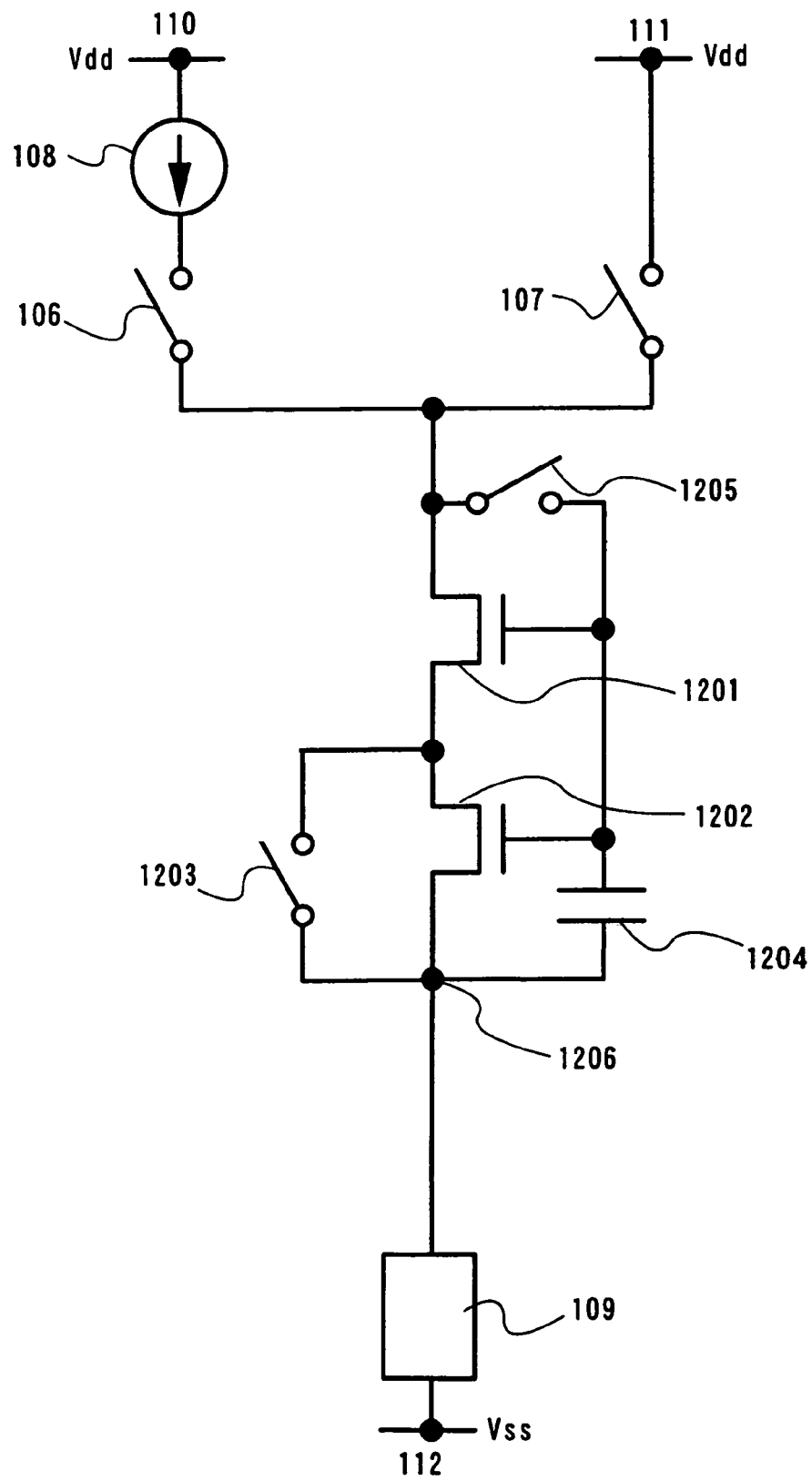
FIG. 12 is a diagram showing a configuration of a current source circuit of the invention.

FIG. 12 shows an example in which the polarity (conductivity) of the current source transistor 101 and the switching transistor 102 are changed by changing the connection of the circuit without changing the direction of current in the circuit of FIG. 1.

There are a current source transistor 1201 which constantly operates as a current source (or a part of it) and a switching transistor 1202 of which operation changes according to the circumstance. The current source transistor 1201 and the switching transistor 1202 are connected in series. A gate terminal of the current source transistor 1201 is connected to one of the terminals of the capacitor 1204. The other terminal 1206 of the capacitor 1204 is connected to a source terminal of the switching transistor 1202 (the current source transistor 1201). Therefore, the capacitor 1204 can hold a gate-source voltage of the current source transistor 1201. Further, the gate terminal and a drain terminal of the current source transistor 1201 are connected via a switch 1205. The capacitor 1204 can be controlled to hold a charge by turning on/off of the switch 1205.

Figure 13:
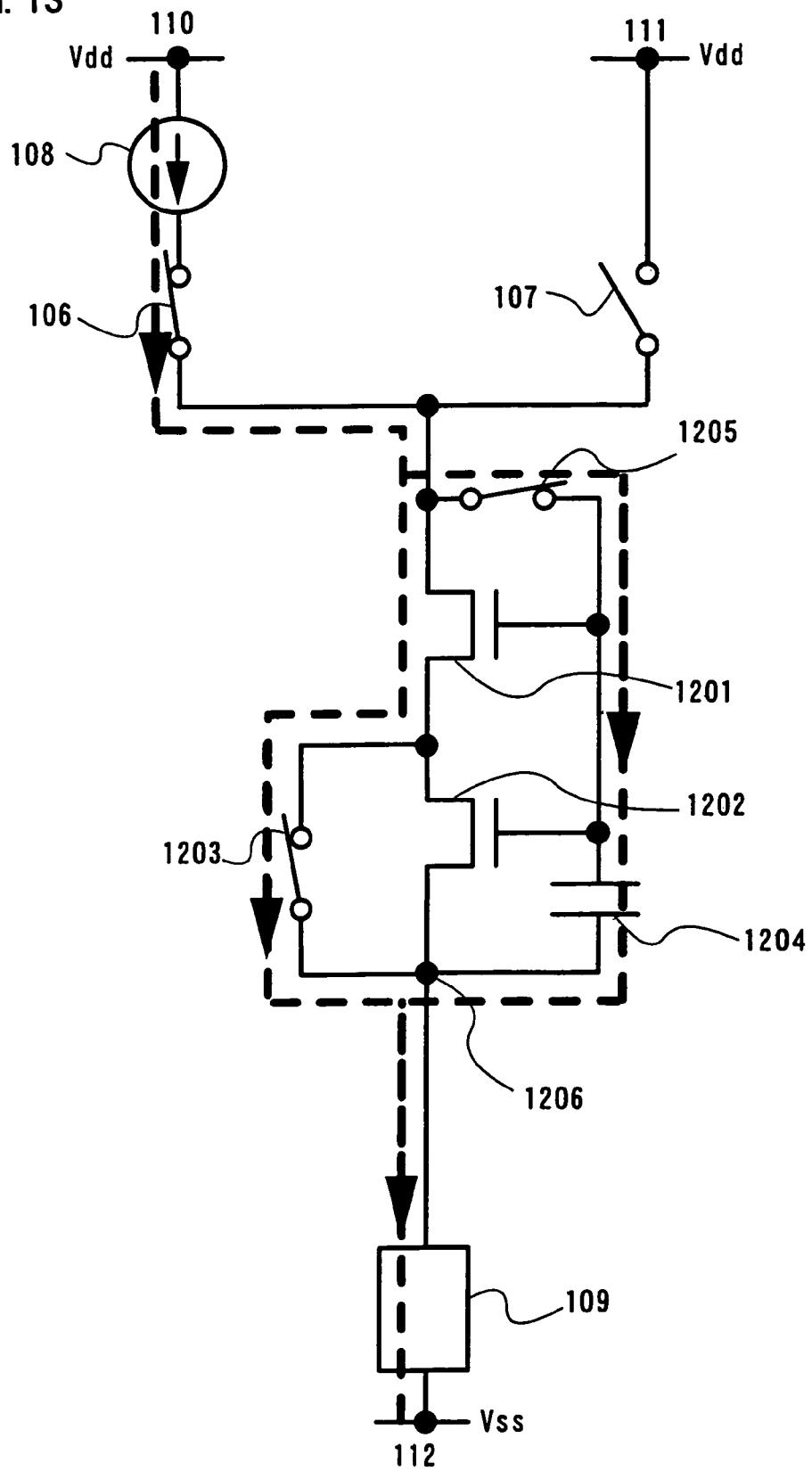
FIG. 13 is a diagram showing an operation of a current source circuit of the invention.

An operation of FIG. 12 is described. However, it is similar to the operation of FIG. 1, therefore, description will be made briefly. First, the switches 1203, 1205, and 106 are turned on and the switch 107 is turned off as shown in FIG. 13. Thus, when a steady state is obtained, a current stops flowing to the capacitor 1204. Then, a gate-source voltage of the current source transistor 1201 is accumulated in the capacitor 1204. That is, a voltage required to supply the current Ib between the source and drain of the current source transistor 1201 is applied between the gate and source thereof. The aforementioned operation corresponds to the set operation. At that time, the switching transistor 1202 performs the short-circuit operation.

Figure 14:
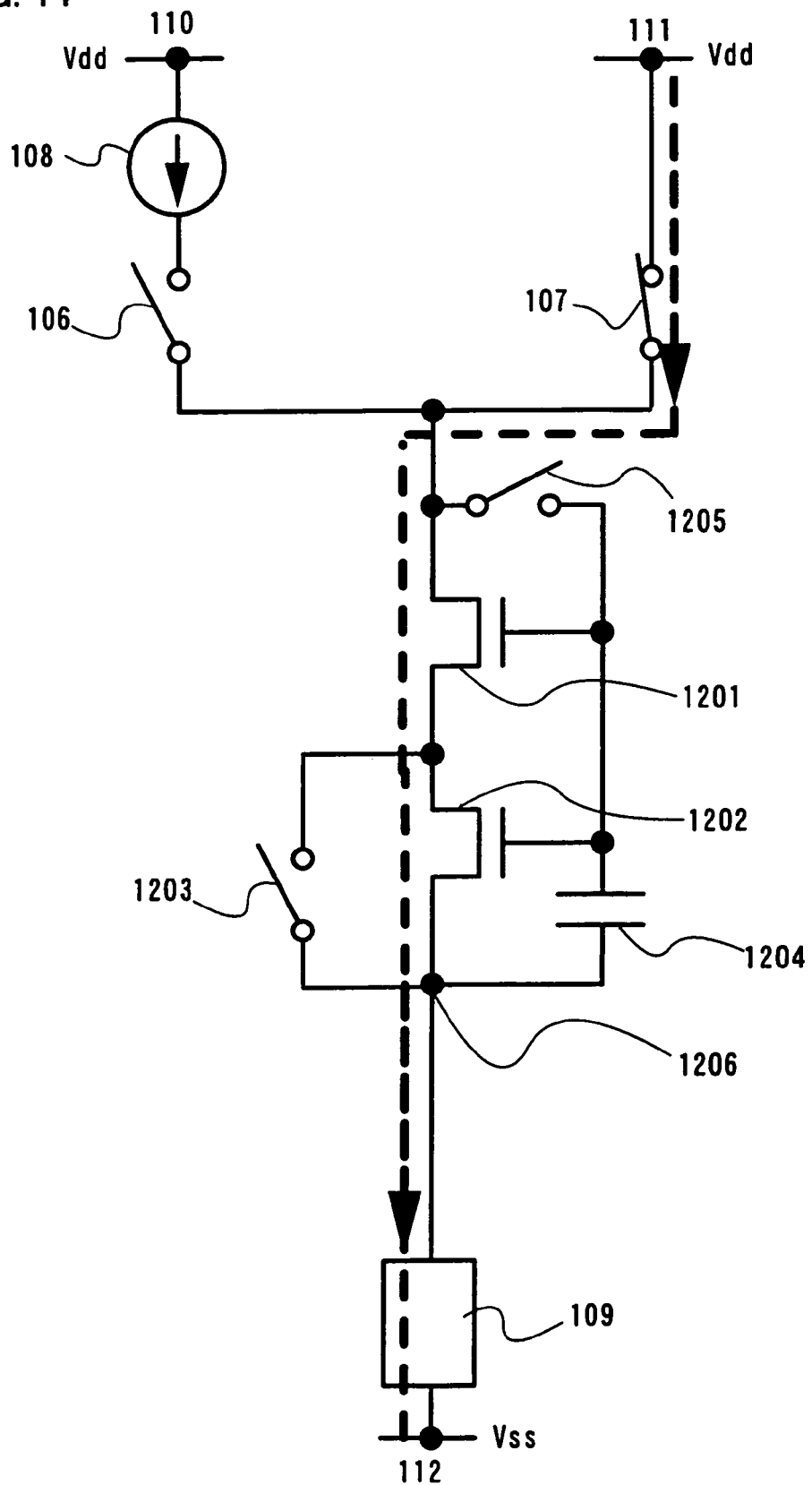
FIG. 14 is a diagram showing an operation of a current source circuit of the invention.

Next, the switches 1203, 1205, and 106 are turned off and the switch 107 is turned on as shown in FIG. 14. Then, the current source transistor 1201 and the switching transistor 1202 operate as a multi-gate transistor. Therefore, a current flows to the load 109, which is smaller than Ib. The aforementioned operation corresponds to the output operation. At that time, the switching transistor 1202 performs the current source operation.

Note that a potential of the terminal 1206 of the capacitor 1204 is different between the set operation and the output operation in many cases. However, voltage (potential difference) at both terminals of the capacitor 1204 do not change, therefore, a desired current flows to the load 109.

Figure 17:
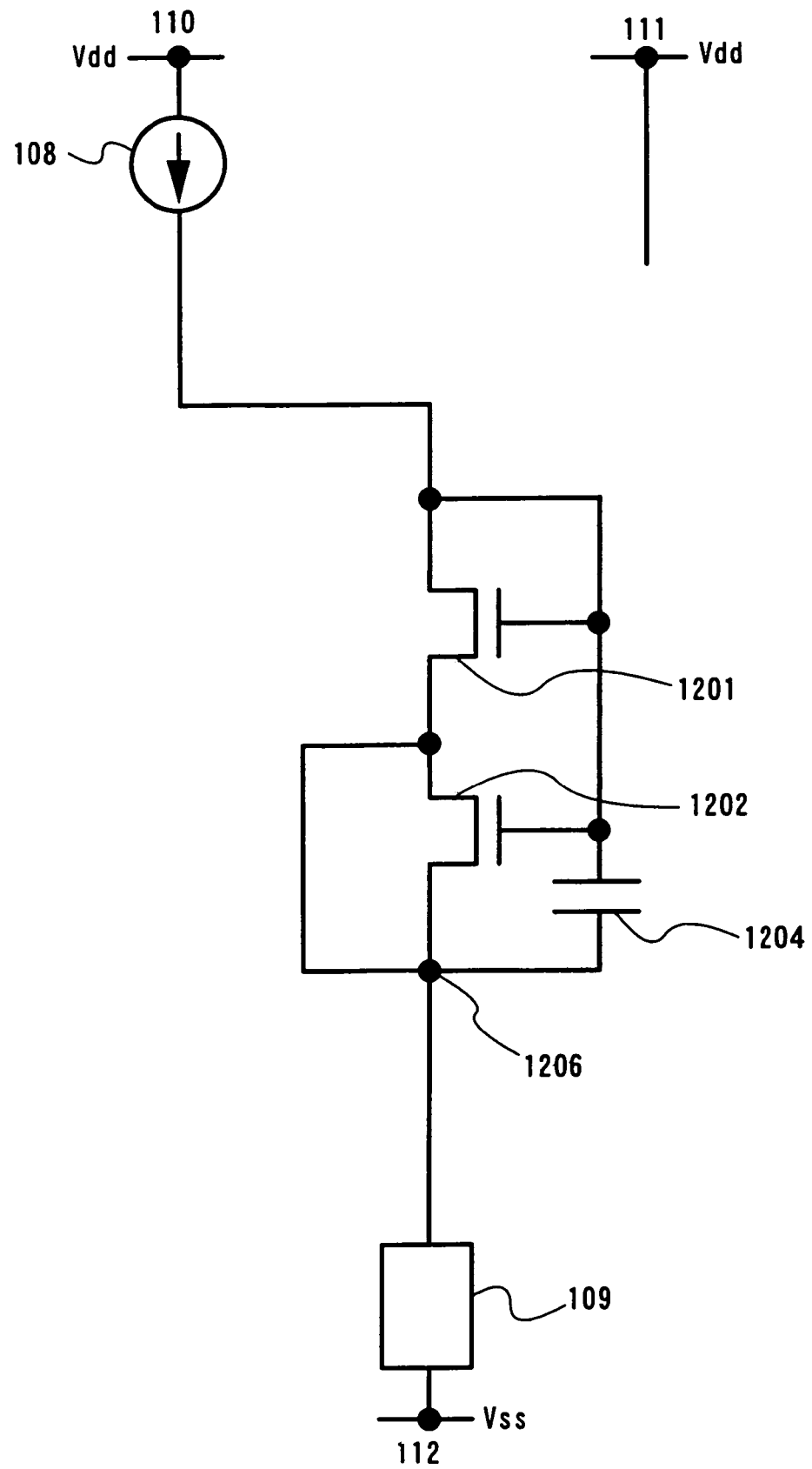
FIG. 17 is a diagram showing connections of a certain operation of a current source circuit of the invention.
Figure 18:
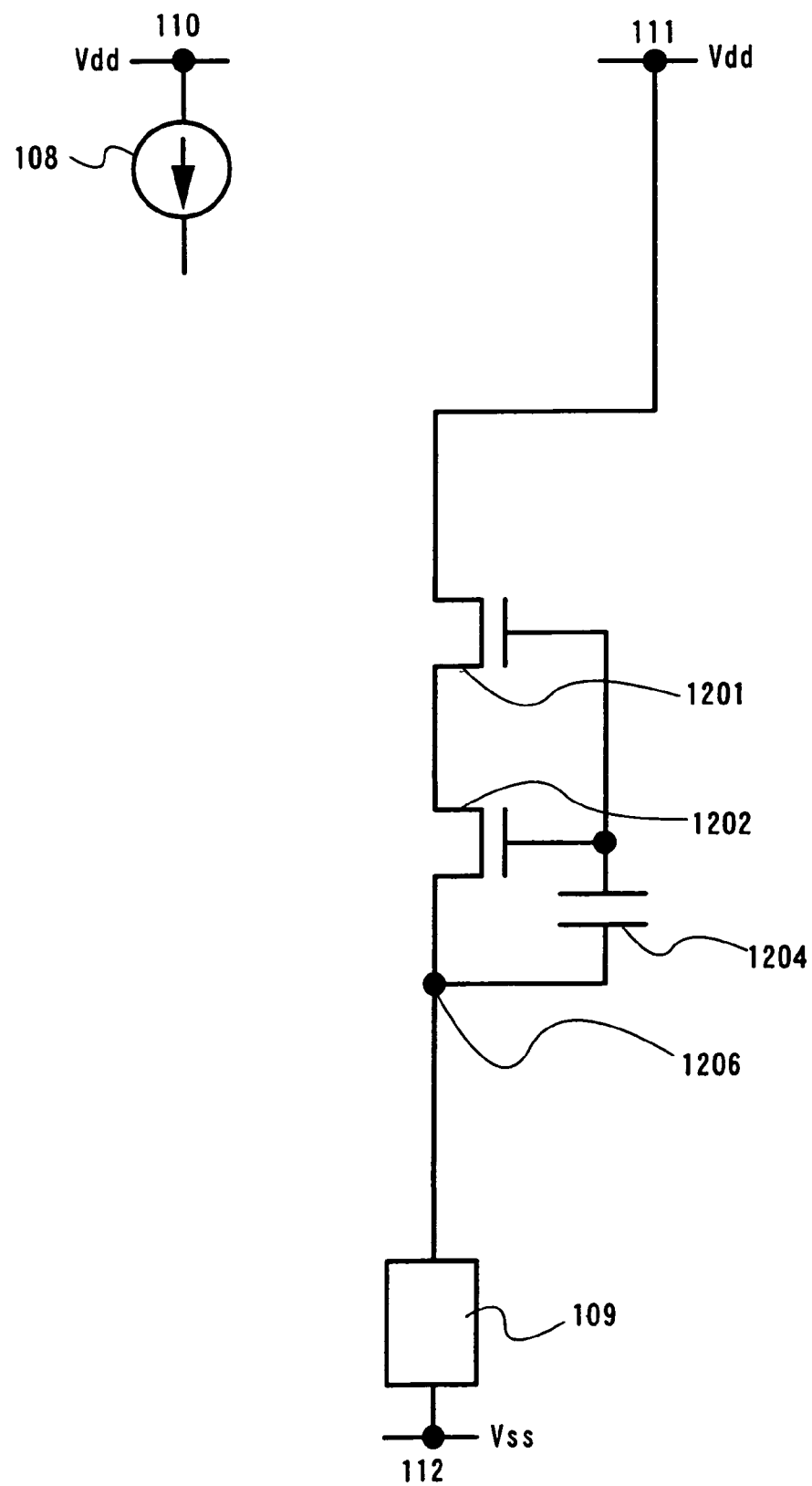
FIG. 18 is a diagram showing connections of a certain operation of a current source circuit of the invention.

In this case also, it is needless to say that the switches may be disposed anywhere as long as they are connected as shown in FIG. 17 in the set operation and connected as shown in FIG. 18 in the output operation.

FIG. 180 shows an example in which the switch 1205 is connected differently. One terminal of the switch 1205 is connected to a gate terminal of the current source transistor 1201 while the other terminal thereof is connected between the switch 106 and the reference current source 108. In the configuration of FIG. 180 also, the switch 1205 can control a current of the reference current source 108 while the switch 1203 can switch between the short-circuit operation and the current source operation of the switching transistor 1202. That is to say, the switches 106, 1205, and 1203 are turned on and the switch 107 is turned off as shown in FIG. 190 in the set operation. In this manner, a current of the reference current source 108 can be supplied as well as the source and drain of the switching transistor 1202 can be short-circuited. The switch 107 is turned on and the switches 106, 1205, and 1203 are turned off in the output operation as shown in FIG. 191. In this manner, a current can flow through the switching transistor 1202.

The connection shown in FIG. 17 includes the case where the elements are connected as shown in FIGS. 183 and 184.

Figure 19:
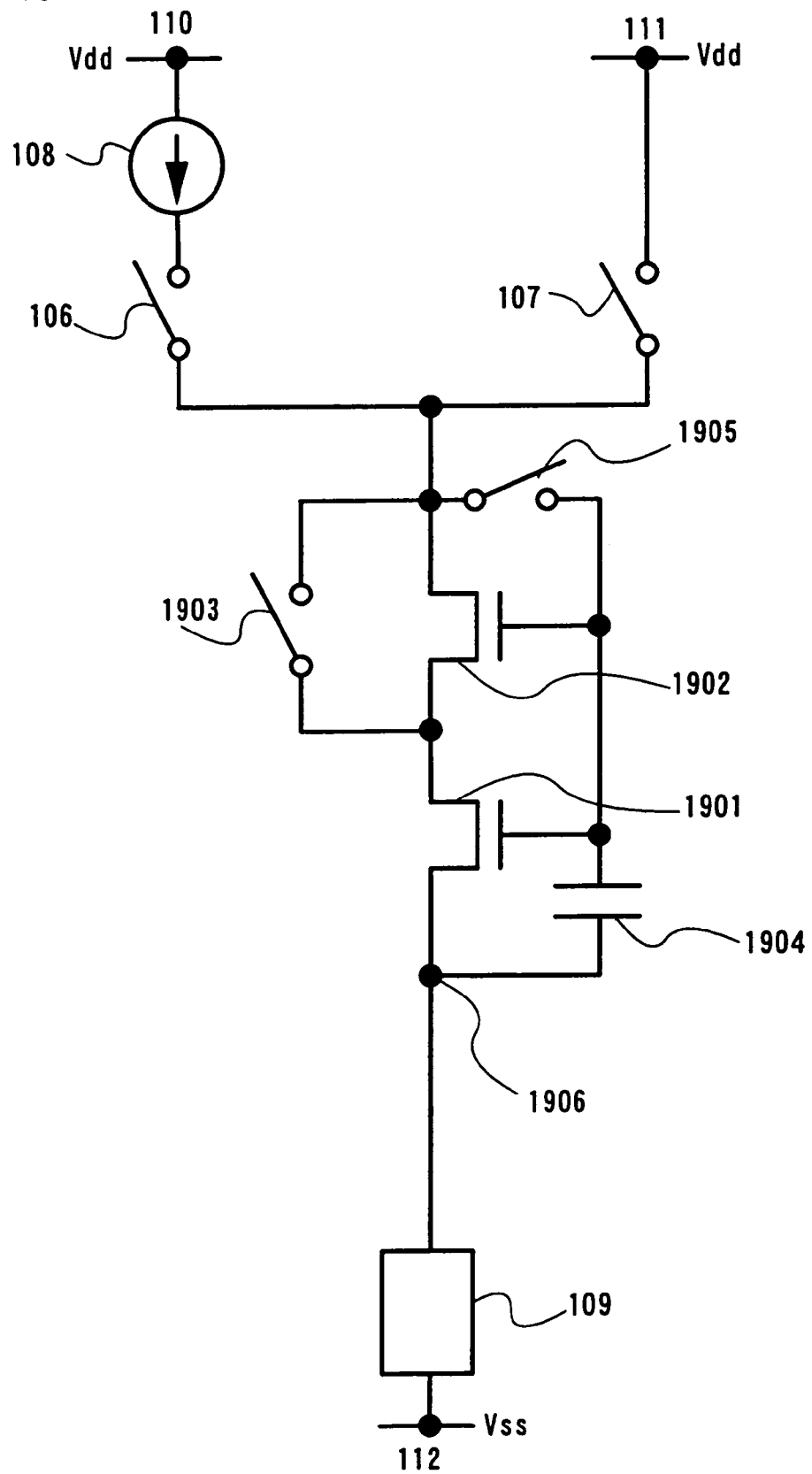
FIG. 19 is a diagram showing a configuration of a current source circuit of the invention.

FIG. 12 shows a circuit corresponding to FIG. 1 while FIG. 19 shows a circuit corresponding to FIG. 7. In FIG. 19, a charge is not accumulated in gate capacitance of a switching transistor 1902 in the short-circuit operation.

Figure 20:
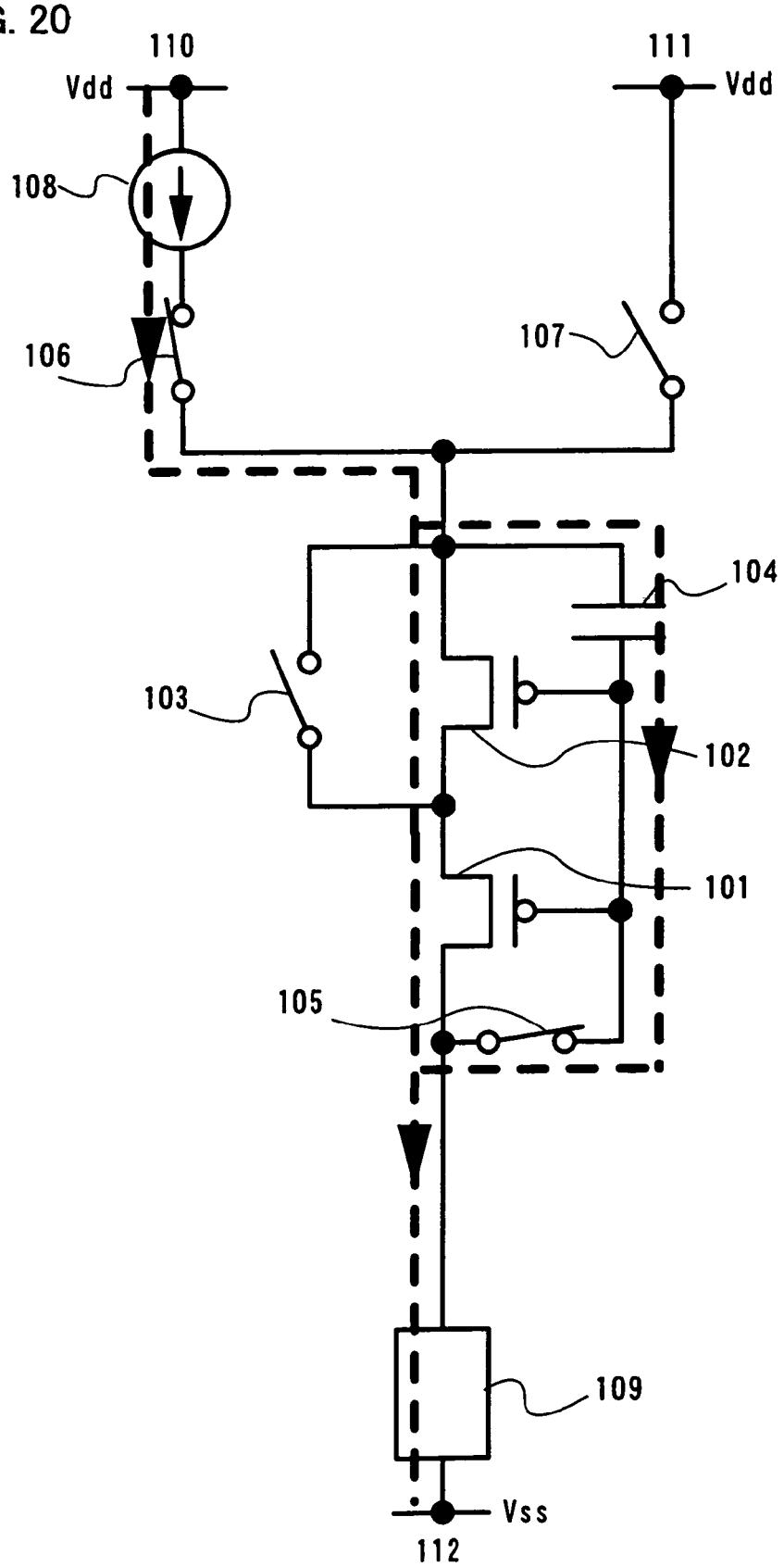
FIG. 20 is a diagram showing an operation of a current source circuit of the invention.
Figure 21:
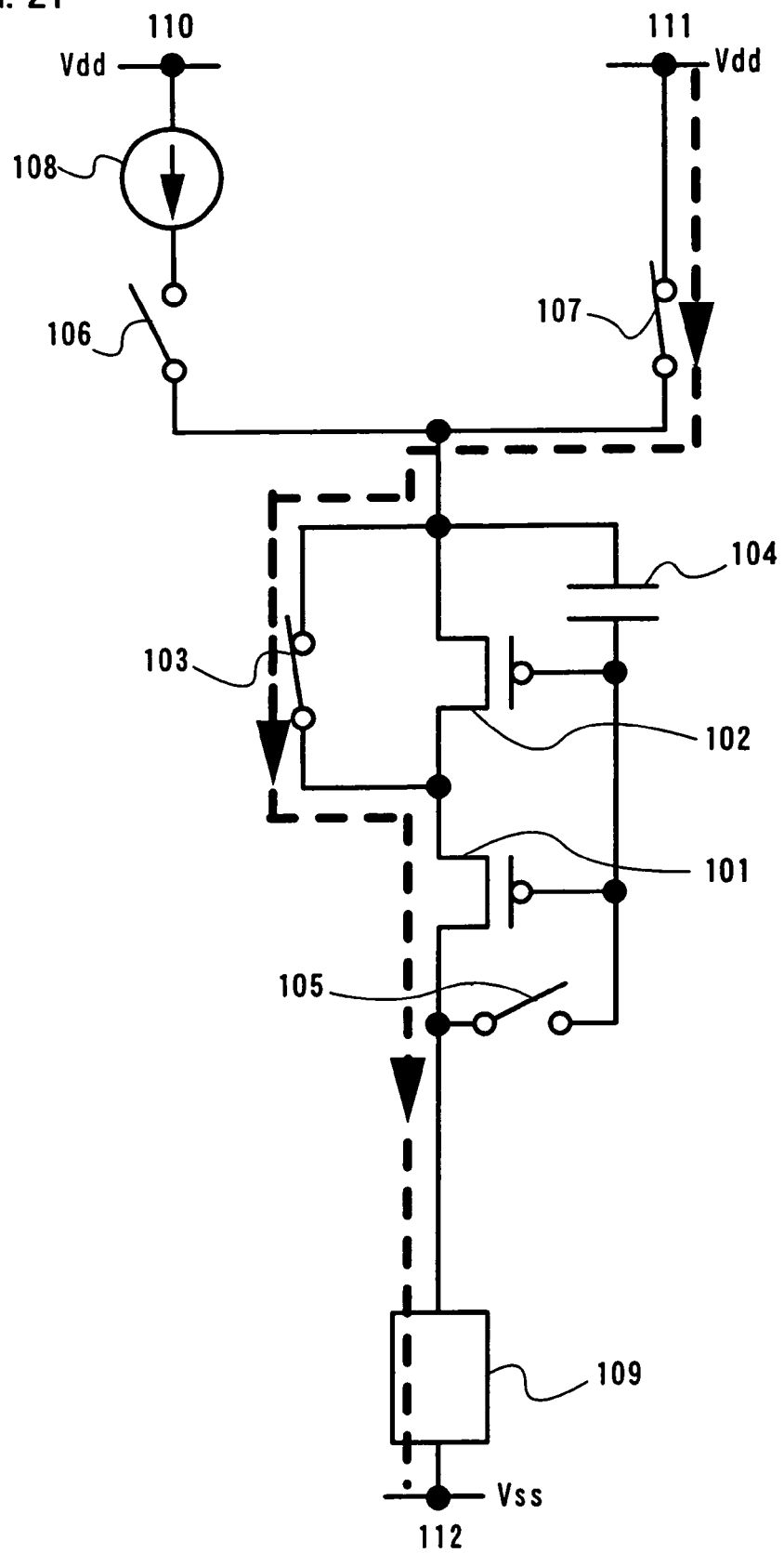
FIG. 21 is a diagram showing an operation of a current source circuit of the invention.

Heretofore described is the case where the switching transistor performs the short-circuit operation in the set operation and performs the current source operation in the output operation. However, the invention is not limited to this. As shown in FIG. 20, for example, the switching transistor may perform the current source operation in the set operation and perform the short-circuit operation in the output operation as shown in FIG. 21. In this case, a larger current is supplied in the output operation, which results in amplifying a signal. Therefore, the configuration of FIG. 21 can be applied to various analog circuits. Note that the configuration of FIG. 1 is described here, however, the invention is not limited to this.

In this manner, the invention can be configured by using various circuits by changing the arrangement and number of switches, the polarity of each transistor, the number and arrangement of the current source transistor and the switching transistor, a potential of each wiring, a direction of current flow as well as by using the circuit of FIG. 1. By using each change in combination, various circuits can be configured.

Hereinafter described is the case where a part of the circuit of FIG. 12 is changed. Therefore, as most of the configuration is similar to FIG. 12, description on that portion is omitted. However, various configurations can be applied to the invention as well as FIG. 12.

Figure 32:
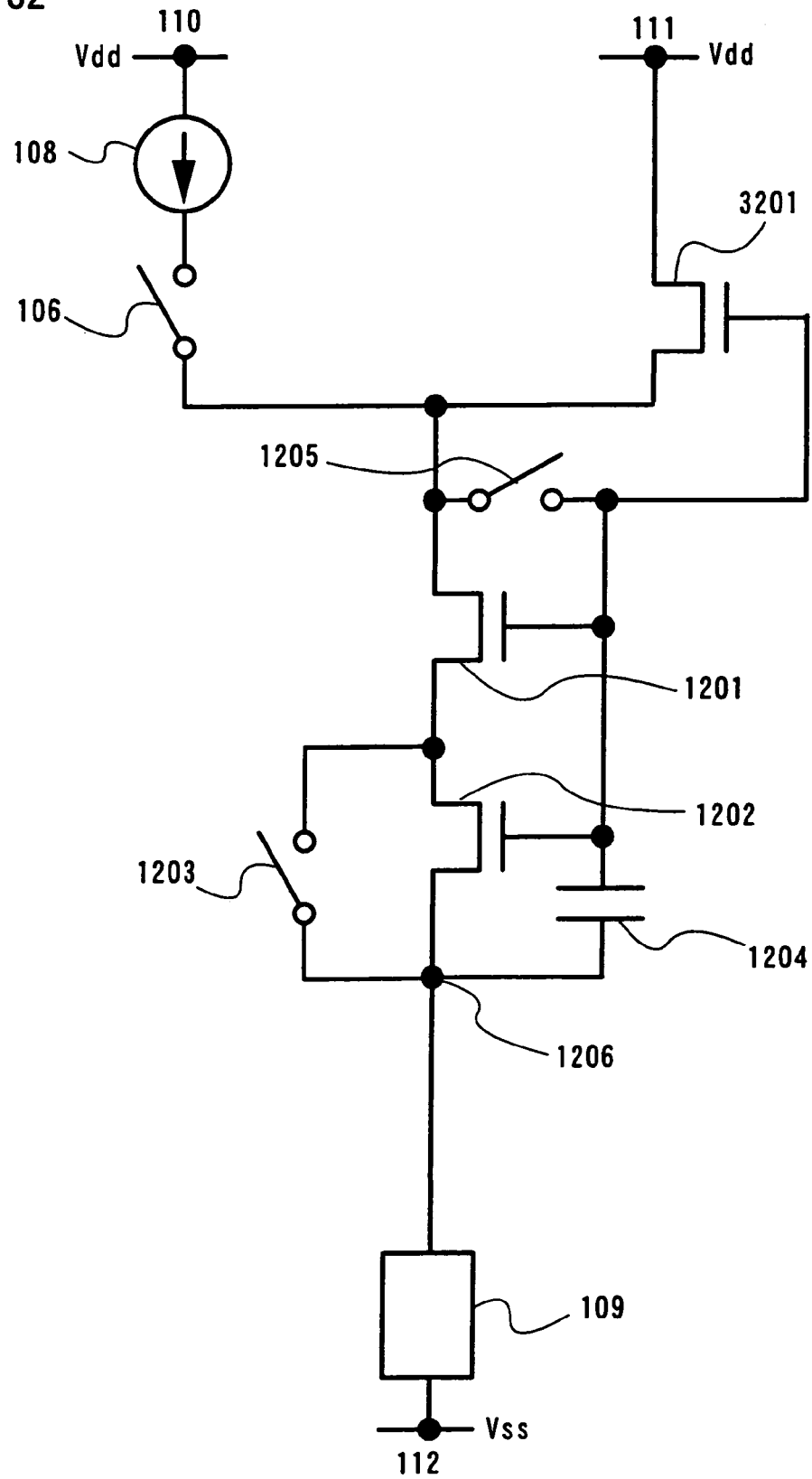
FIG. 32 is a diagram showing a configuration of a current source circuit of the invention.

First, FIG. 32 shows the configuration of FIG. 12 which is partially changed. The switch 107 in FIG. 12 is changed into a multi transistor 3201 in FIG. 32. The multi transistor 3201 is a transistor having the same polarity (conductivity) as the current source transistor 1201 and the switching transistor 1202. A gate terminal of the multi transistor 3201 is connected to the gate terminal of the current source transistor 1201. The multi transistor 3201 changes its operation depending on the cases. In the set operation, the multi transistor 3201 operates as a switch. In the output operation, it operates as a part of a multi-gate transistor together with the current source transistor 1201 and the switching transistor 1202 to operate as a current source.

Figure 33:
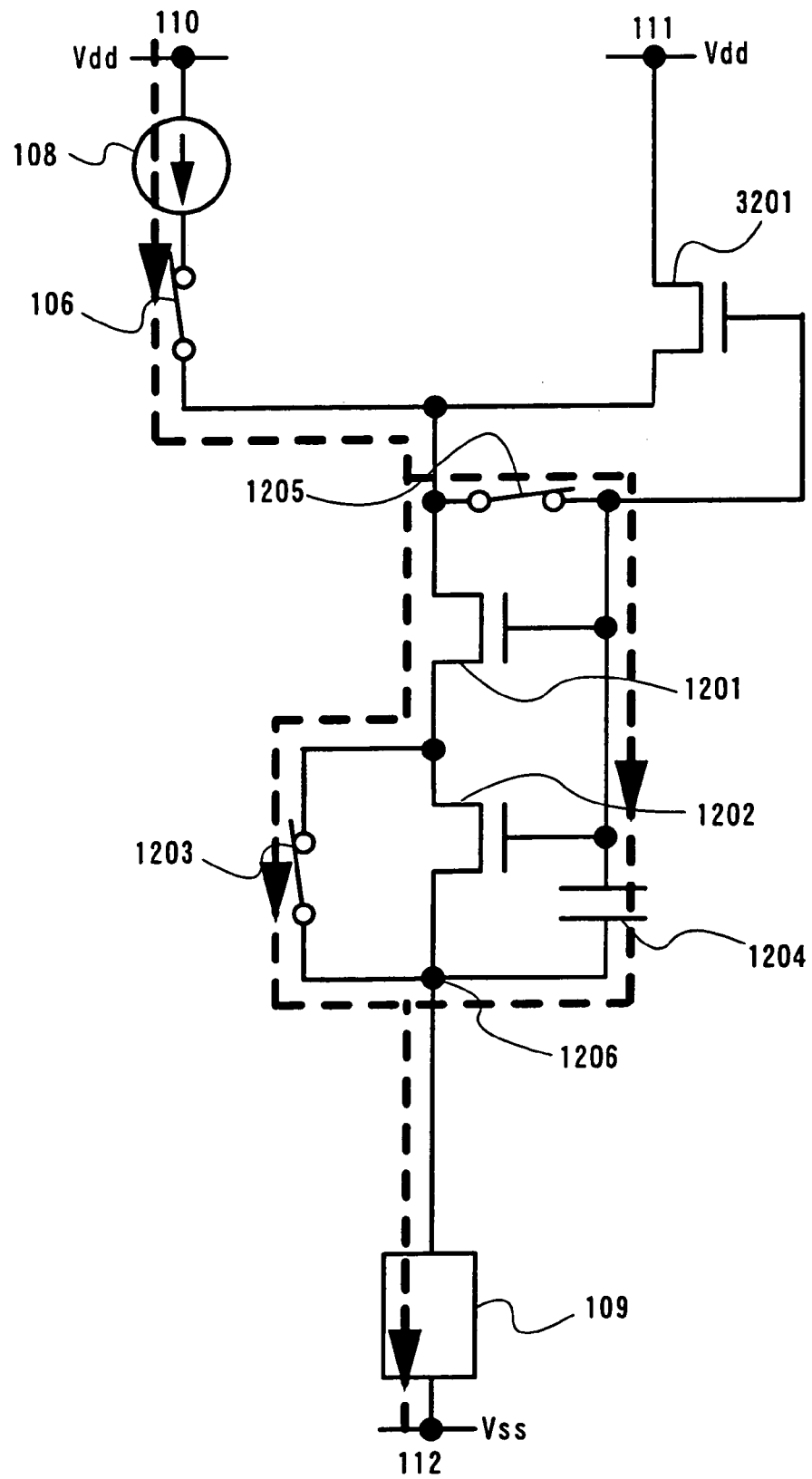
FIG. 33 is a diagram showing an operation of a current source circuit of the invention.

Next, an operation of the circuit of FIG. 32 is described. As shown in FIG. 33, the switches 106, 1205, and 1203 are turned on. Then, the current Ib of the reference current source 108 flows to the capacitor 1204 and the current source transistor 1201. At this time, a gate terminal and a source terminal of the multi transistor 3201 have approximately the same potential. That is to say, a gate-source voltage of the multi transistor 3201 becomes approximately 0 V. Therefore, the multi transistor 3201 is turned off. Then, a steady state is obtained in which a current flowing between the source and drain of the current source transistor 1201 and the current Ib of the reference current source 108 become equal, thus a current stops flowing to the capacitor 1204. The aforementioned operation corresponds to the set operation. At this time, the multi transistor 3201 operates as a switch which is off.

Figure 34:
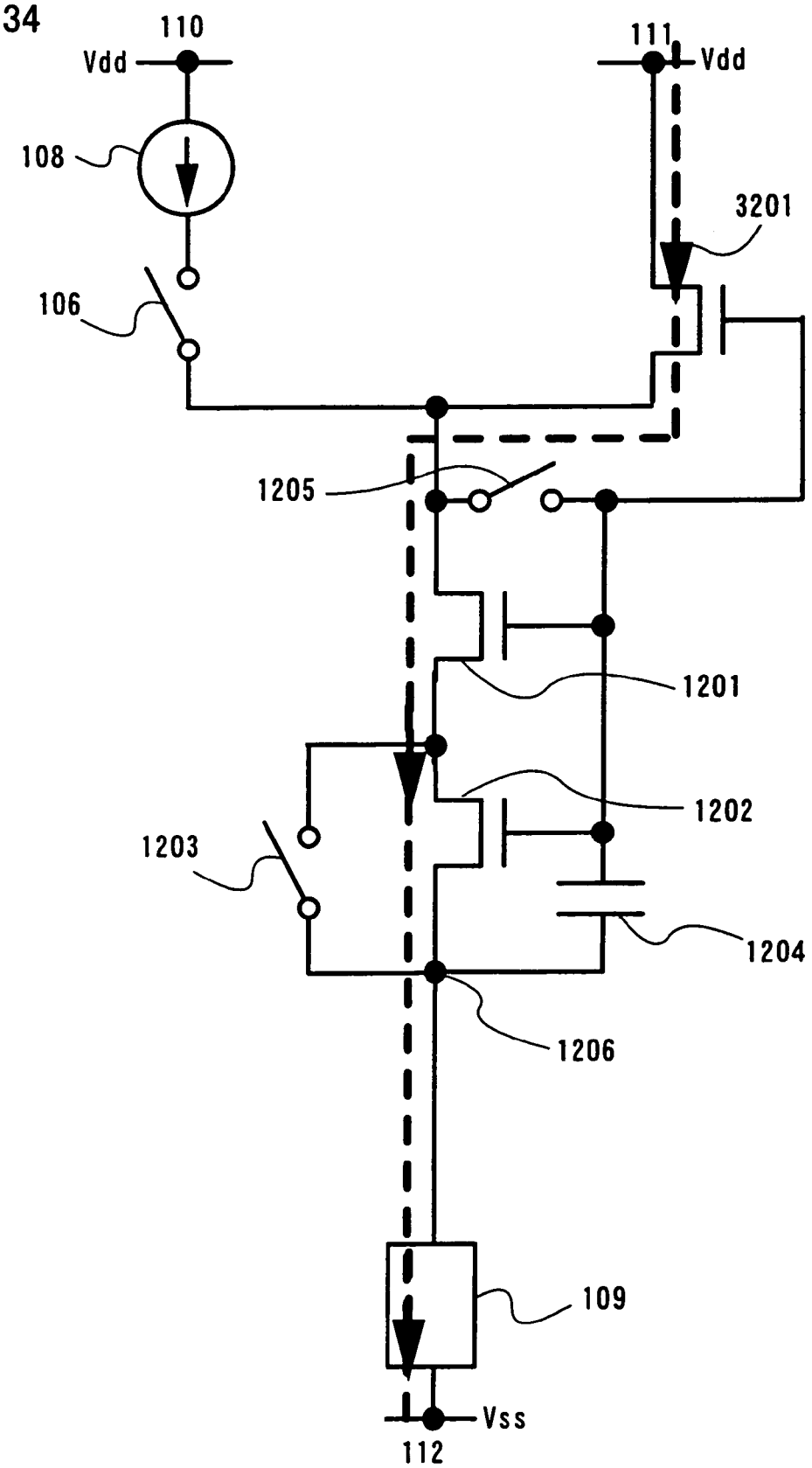
FIG. 34 is a diagram showing an operation of a current source circuit of the invention.

Next, as shown in FIG. 34, the switches 106, 1205, and 1203 are turned off. Then, a charge accumulated in the set operation in the capacitor 1204 is applied to gate terminals of the current source transistor 1201, the switching transistor 1202, and the multi transistor 3201. The gate terminals of the current source transistor 1201, the switching transistor 1202, and the multi transistor 3201 are connected to each other. As described above, the current source transistor 1201, the switching transistor 1202, and the multi transistor 3201 operate as a multi-gate transistor. Therefore, when the current source transistor 1201, the switching transistor 1202, and the multi transistor 3201 are one transistor, a gate length L of the multi-gate transistor is longer than L of the current source transistor 1201. Therefore, a current flowing to the load 109 becomes smaller than Ib. That is, a current flowing to the load 109 becomes smaller than that in the case of FIG. 12. The aforementioned operation corresponds to the output operation. At that time, the multi transistor 3201 operates as a part of the multi-gate transistor.

In this manner, by changing the switch 107 of FIG. 12 into the multi transistor 3201 of FIG. 32 and connecting the gate terminal of the multi transistor 3201 to the gate terminal of the current source transistor 1201, a current can be controlled automatically. Moreover, a current flowing to the load 109 can be small. In the case of FIG. 12, a wiring for controlling the switch 107 is required for changing the operation between supplying a current to the load 109 in the output operation and stopping current thereto in the set operation, however, a current can be controlled automatically in FIG. 32, therefore, a wiring for the control can be omitted.

It is to be noted that the current source transistor 1201, the switching transistor 1202, and the multi transistor 3201 operate as a multi-gate transistor in the output operation, therefore, it is preferable that these transistors have the same polarity (conductivity).

It is to be noted that the current source transistor 1201, the switching transistor 1202, and the multi transistor 3201 operate as a multi-gate transistor in the output operation, and a gate width W of each transistor may be the same or different. Similarly, a gate length L thereof may be the same or different. The gate width W, however, is preferably the same as it can be considered to be the same as a normal multi-gate transistor. By designing the gate length L of the switching transistor 1202 and the multi transistor 3201 longer, a current supplied to the load 109 becomes smaller. Therefore, the gate width and length may be designed in consideration of a ratio of current required to be supplied in each of the set operation and the output operation.

Note that FIG. 32 is shown as a circuit of this embodiment mode, however, the invention is not limited to this configuration. By changing an arrangement and the number of switches, the polarity of each transistor, the number and arrangement of the current source transistor 1201, the switching transistor 1202, and the multi transistor 3201, a potential of each wiring, a direction of current flow and the like, various circuits can be employed in the configuration. Further, by combining each change also, a configuration using various circuits can be achieved.

Figure 35:
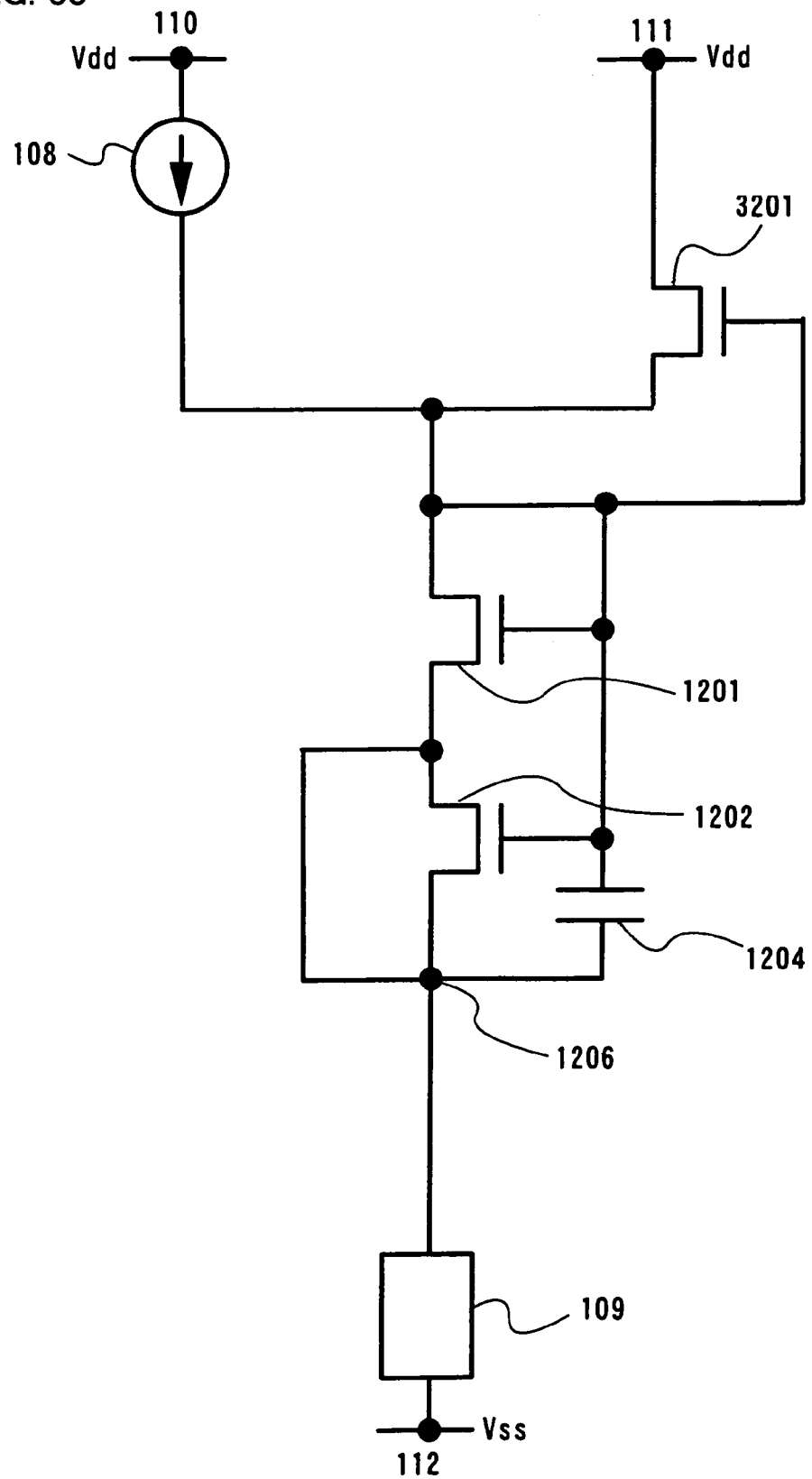
FIG. 35 is a diagram showing a configuration of a current source circuit of the invention.
Figure 36:
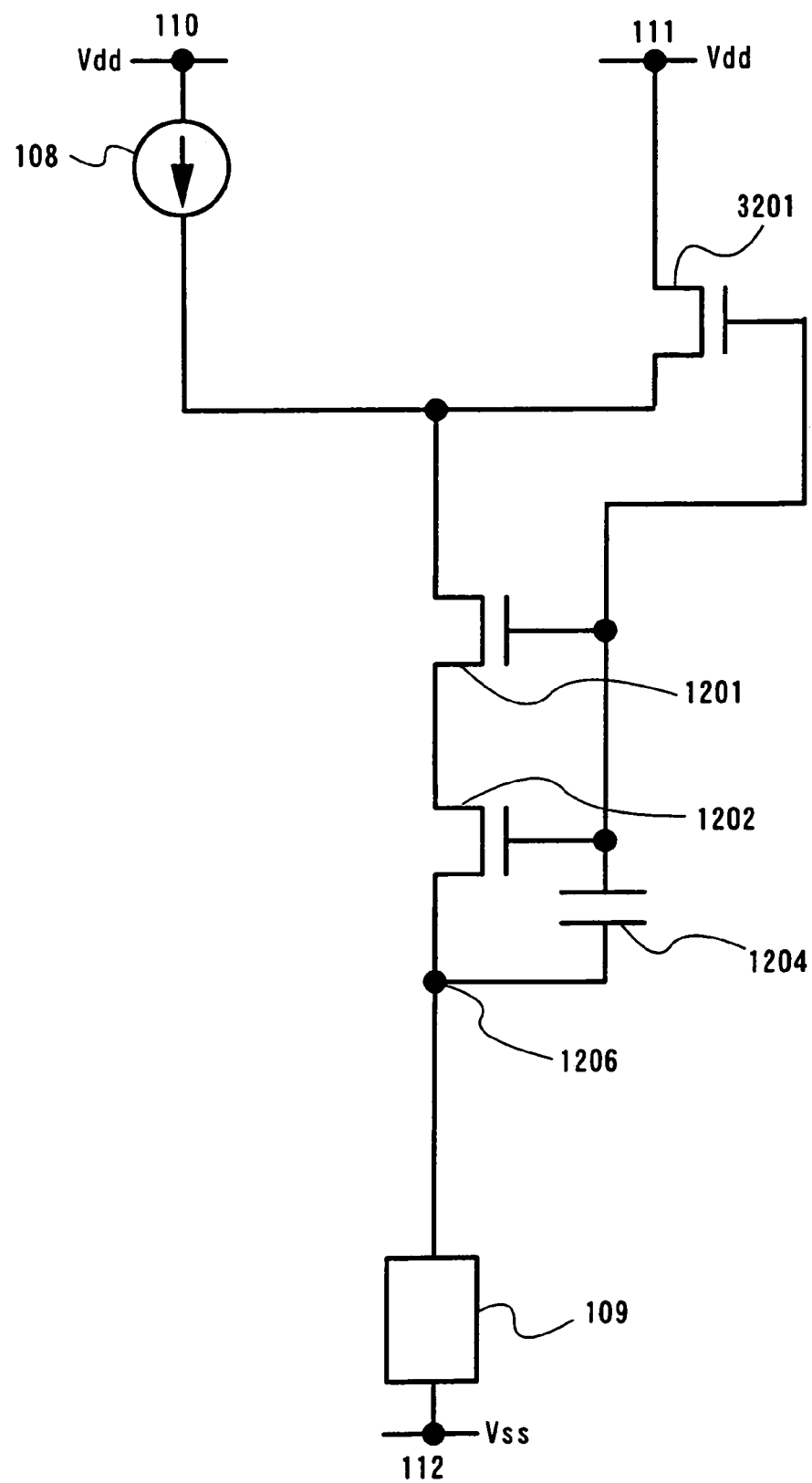
FIG. 36 is a diagram showing a configuration of a current source circuit of the invention.

For example, such switches as 106, 1203, and 1205 may be arranged anywhere as long as they can control on/off of current. That is to say, such switches as 106, 1203, and 1205 may be arranged anywhere as long as they are connected as shown in FIG. 35 in the set operation and connected as shown in FIG. 36 in the output operation.

Embodiment Mode 2

In Embodiment Mode 1, the configuration of FIG. 1 is employed for realizing the current source operation and the short-circuit operation of the switching transistor 102. In this embodiment mode, a configuration example for realizing the current source operation and the short-circuit operation, which is different from Embodiment Mode 1 is described.

It should be noted that most of the description which is similar to Embodiment Mode 1 will be omitted here.

Figure 22:
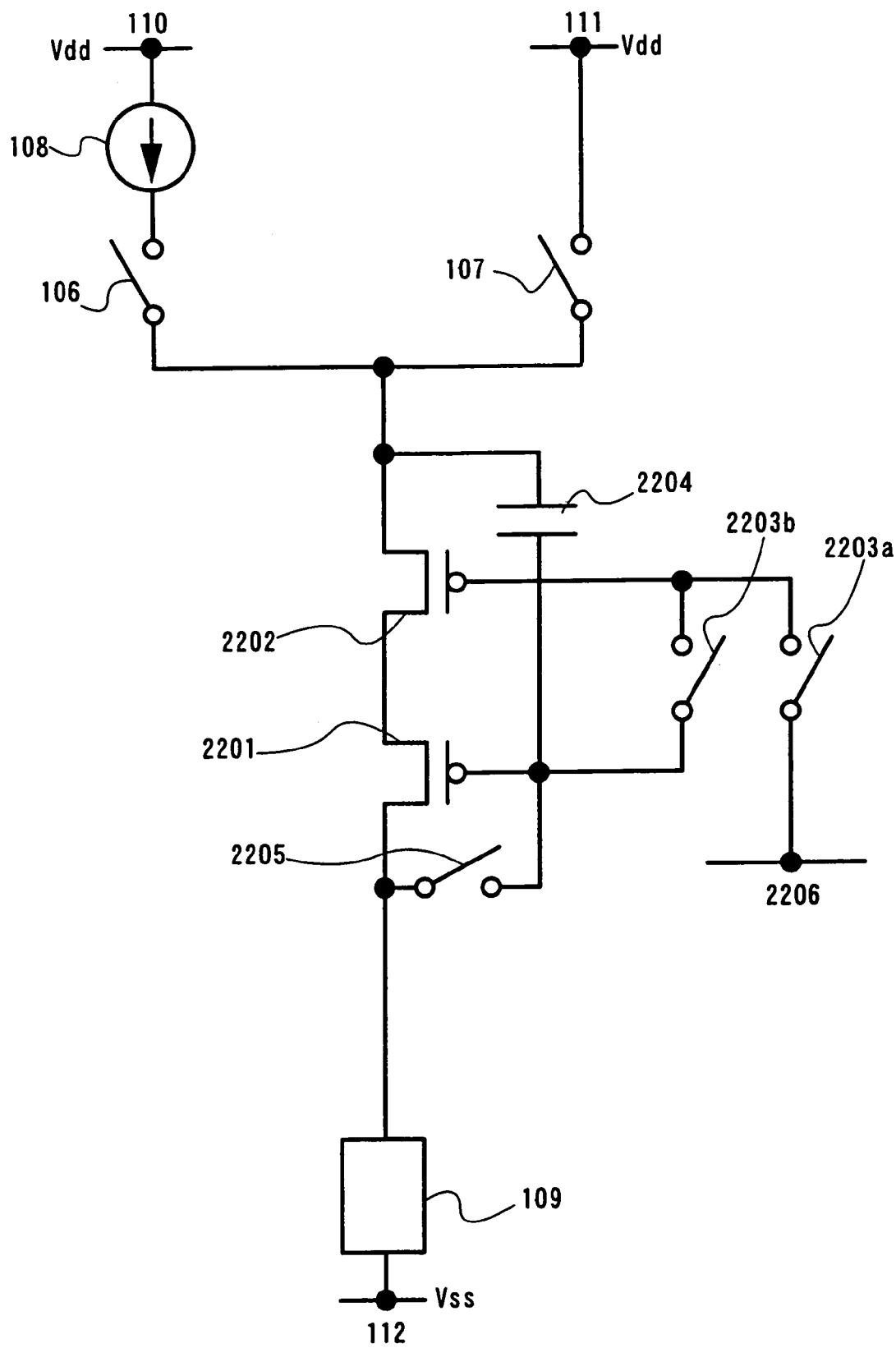
FIG. 22 is a diagram showing a configuration of a current source circuit of the invention.

First, FIG. 22 shows a configuration in which the current source operation and the short-circuit operation of a switching transistor 2202 are realized.

In FIG. 1, the switch 103 is used so that the switching transistor 102 can perform the short-circuit operation. By controlling the switch 103, a current does not flow between the source and drain of the switching transistor 102 so the source terminal and the drain terminal of the switching transistor 102 have approximately the same potential.

In FIG. 22, on the contrary, a voltage of a gate terminal of the switching transistor 2202 is controlled so that a large current can flow to the switching transistor 2202. Specifically, an absolute value of a gate-source voltage of the switching transistor 2202 is made large by using a switch 2203a. As a result, only a small source-drain voltage of the switching transistor 2202 is required when a certain value of current flows. That is, the switching transistor 2202 operates just as a switch.

In the current source operation, the switch 103 is turned off in FIG. 1 and the current source transistor 101 and the switching transistor 102 operate as a multi-gate transistor since the gate terminals thereof are connected to each other.

In FIG. 22, on the other hand, the current source transistor 2201 and the switching transistor 2202 of which gate terminals are not connected to each other are connected by using a switch 2203b. As a result, they can operate as a multi-gate transistor.

Figure 23:
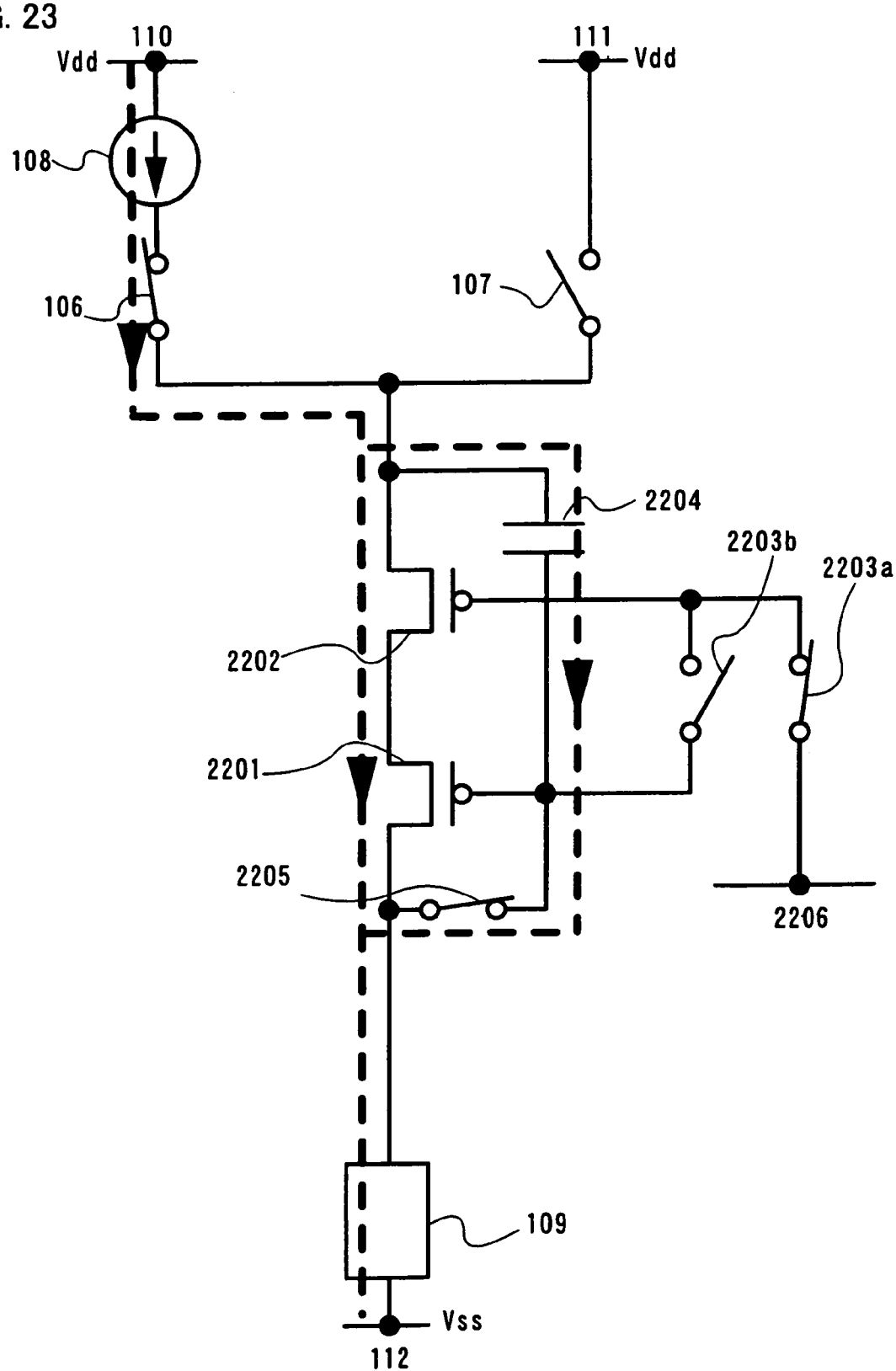
FIG. 23 is a diagram showing an operation of a current source circuit of the invention.

An operation of FIG. 22 is described. First, switches 2203a, 2205 and 106 are turned on and the switches 107 and 2203b are turned off as shown in FIG. 23. Then, the gate terminal of the switching transistor 2202 is connected to a wiring 2206. The wiring 2206 is supplied with a low potential power supply (Vss), therefore, an absolute value of a gate-source voltage of the switching transistor 2202 becomes quite large. Thus, the switching transistor 2202 has quite a large current drive capacity and the source terminal and the drain terminal thereof have approximately the same potential. Therefore, the current Ib of the reference current source 108 flows to a capacitor 2204 and the current source transistor 2201. When a current flowing between the source and drain of the current source transistor 2201 and the current Ib of the reference current source 108 become equal, a current stops flowing to the capacitor 2204. That is, a steady state is obtained. Then, a potential of the gate terminal at that time is accumulated in the capacitor 2204. That is, a voltage required to supply the current Ib between the source and drain of the current source transistor 2201 is applied to the gate terminal thereof. The aforementioned operation corresponds to the set operation. At that time, the switching transistor 2202 operates as a switch and performs the short-circuit operation.

Figure 24:
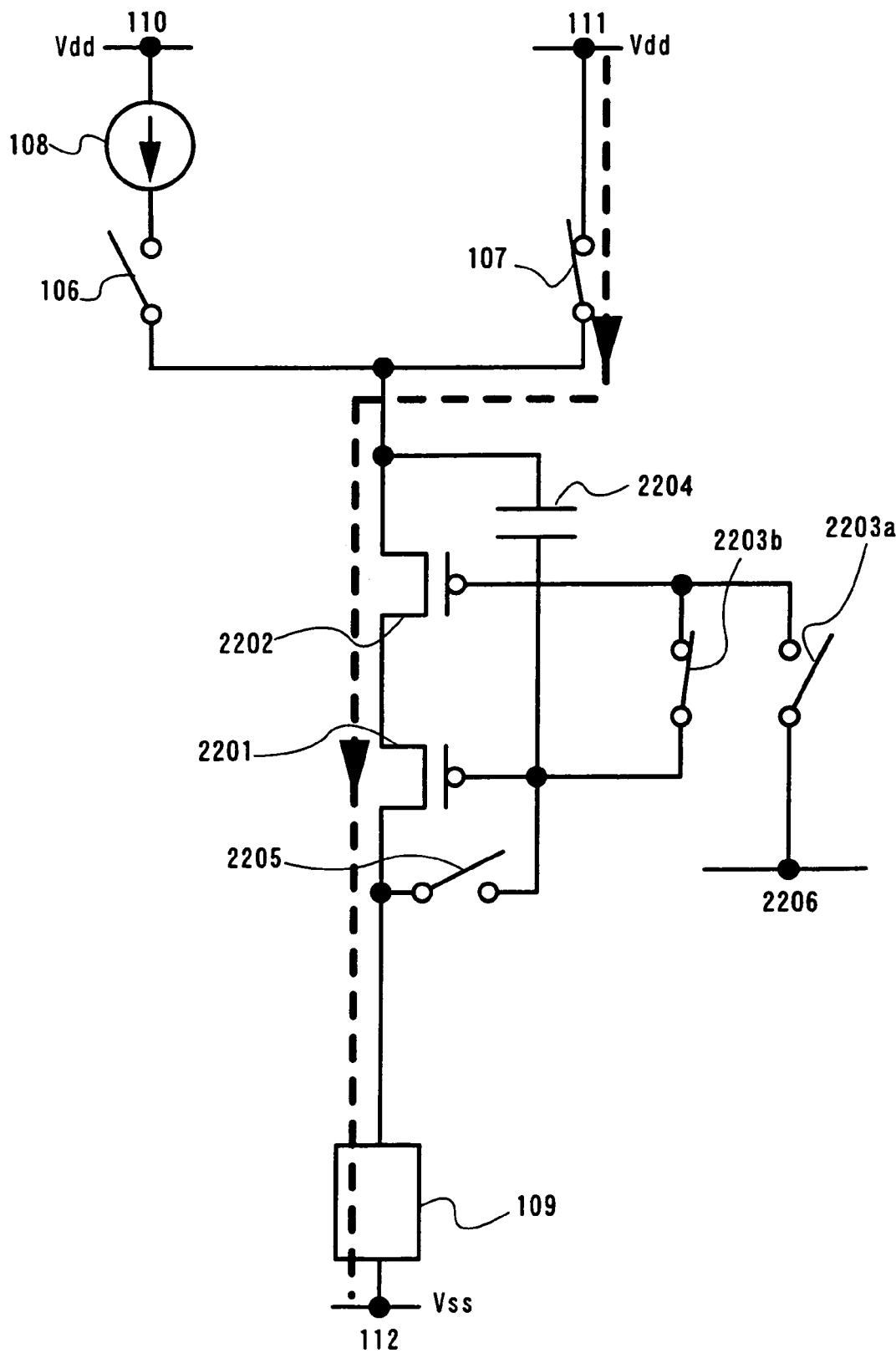
FIG. 24 is a diagram showing an operation of a current source circuit of the invention.

Next, the switches 106, 2205 and 2203a are turned off and the switches 107 and 2203b are turned on as shown in FIG. 24. Then, the gate terminal of the switching transistor 2202 and the gate terminal of the current source transistor 2201 are connected to each other. On the other hand, a charge accumulated in the set operation in the capacitor 2204 is applied to the gate terminals of the current source transistor 2201 and the switching transistor 2202. As described above, the current source transistor 2201 and the switching transistor 2202 operate as a multi-gate transistor. Therefore, when the current source transistor 2201 and the switching transistor 2202 are one transistor, a gate length L of the transistor becomes longer than L of the current source transistor 2201. Therefore, a current supplied to the load 109 becomes smaller than Ib. The aforementioned operation corresponds to the output operation. At that time, the switching transistor 2202 performs the current source operation.

Note that a potential of the wiring 2206 is not limited to Vss. It may have any value which is large enough to turn on the switching transistor 2202.

Note that FIG. 22 is shown as a circuit of this embodiment mode, however, the invention is not limited to this configuration. By changing an arrangement and the number of switches, the polarity of each transistor, the number and arrangement of the current source transistor 2201 and the switching transistor 2202, a potential of each wiring, a direction of current flow and the like, various circuits can be employed in the configuration. Further, by combining each change also, a configuration using various circuits can be achieved.

Figure 25:
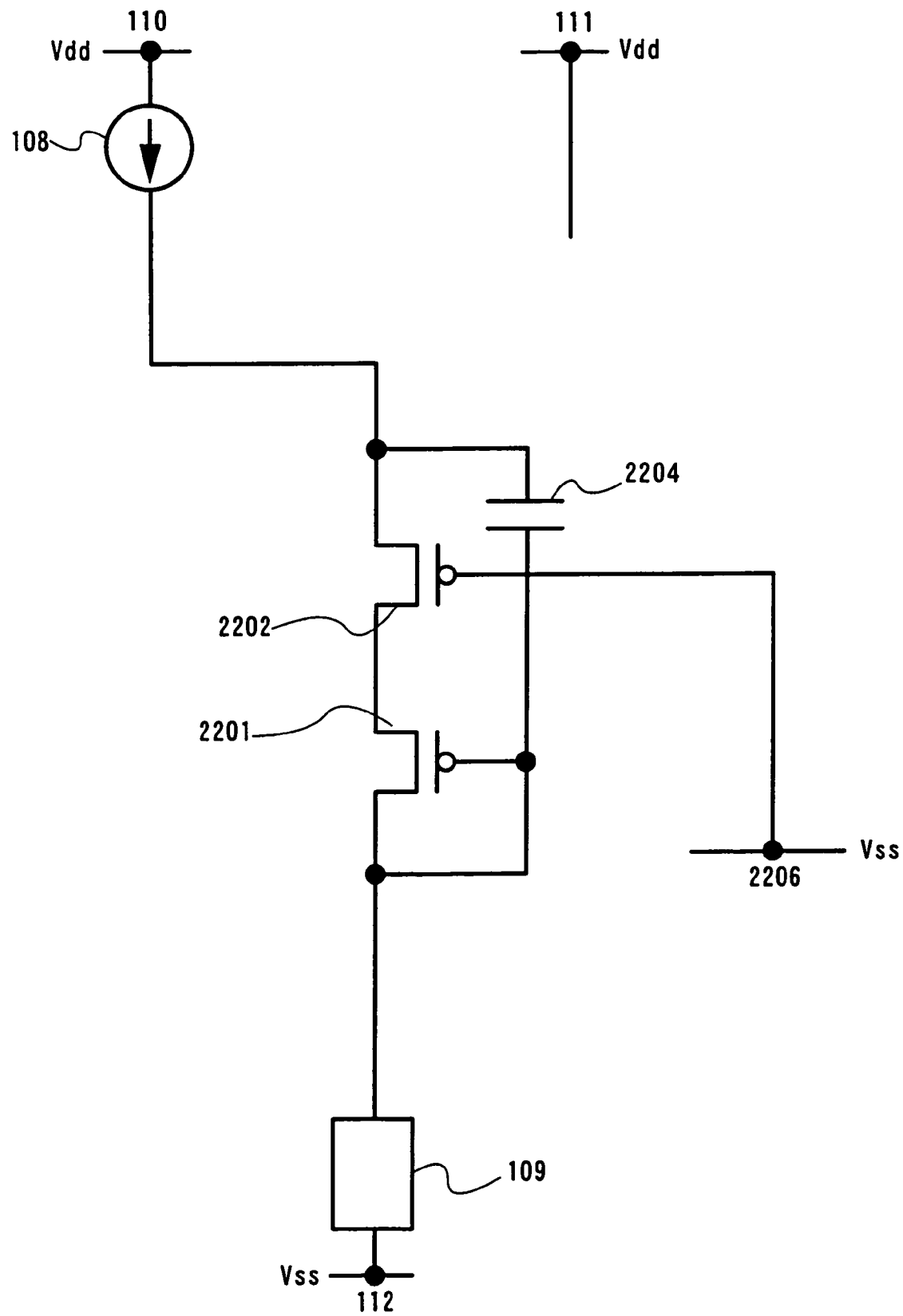
FIG. 25 is a diagram showing connections of a certain operation of a current source circuit of the invention.
Figure 26:
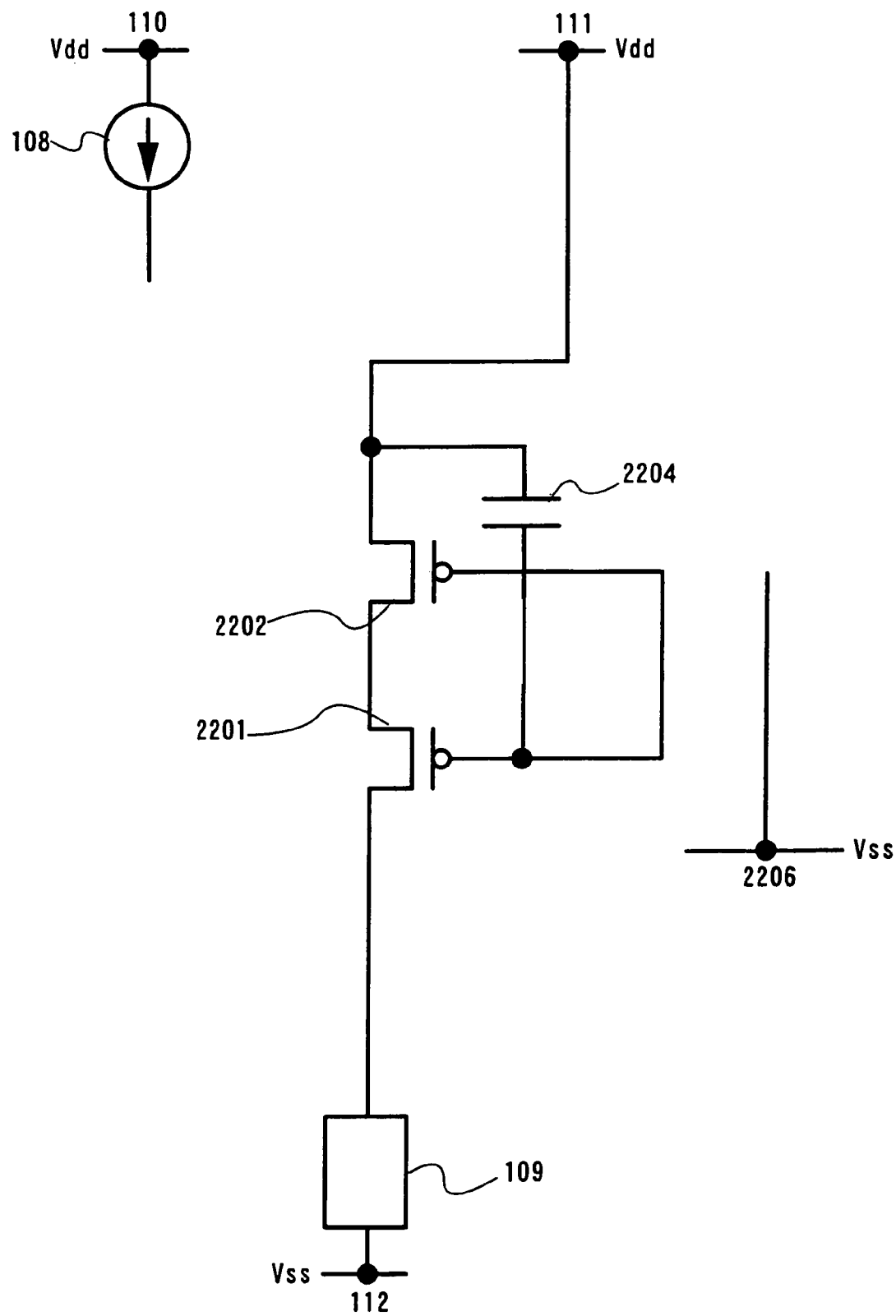
FIG. 26 is a diagram showing connections of a certain operation of a current source circuit of the invention.

For example, each switch may be disposed anywhere as long as it is connected as shown in FIG. 25 in the set operation and connected as shown in FIG. 26 in the output operation.

Figure 27:
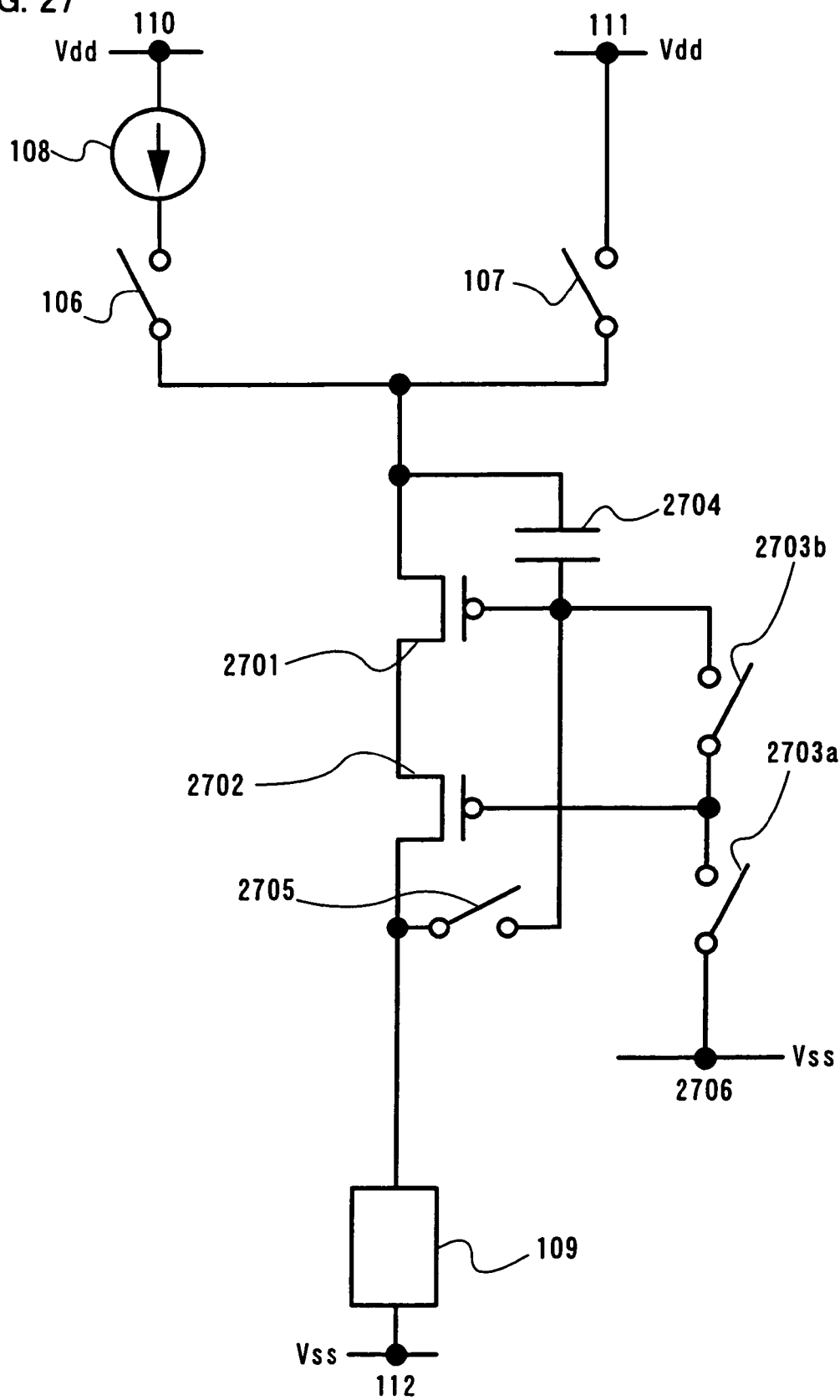
FIG. 27 is a diagram showing a configuration of a current source circuit of the invention.

FIG. 27 shows the case where the arrangements of the current source transistor 2201 and the switching transistor 2202 are interchanged. In FIG. 27, a current source transistor 2701, a switching transistor 2702, and the load 109 are arranged in this order. In the set operation, a switch 2703a is turned on and an absolute value of a gate-source voltage of the switching transistor 2702 is made large. Thus, the switching transistor 2702 having high current drive capacity functions as a switch. In the output operation, the switch 2703a is turned off and the switch 2703b is turned on. In this manner, gate terminals of the switching transistor 2702 and the current source transistor 2701 are connected so they function as a multi-gate transistor.

Figure 28:
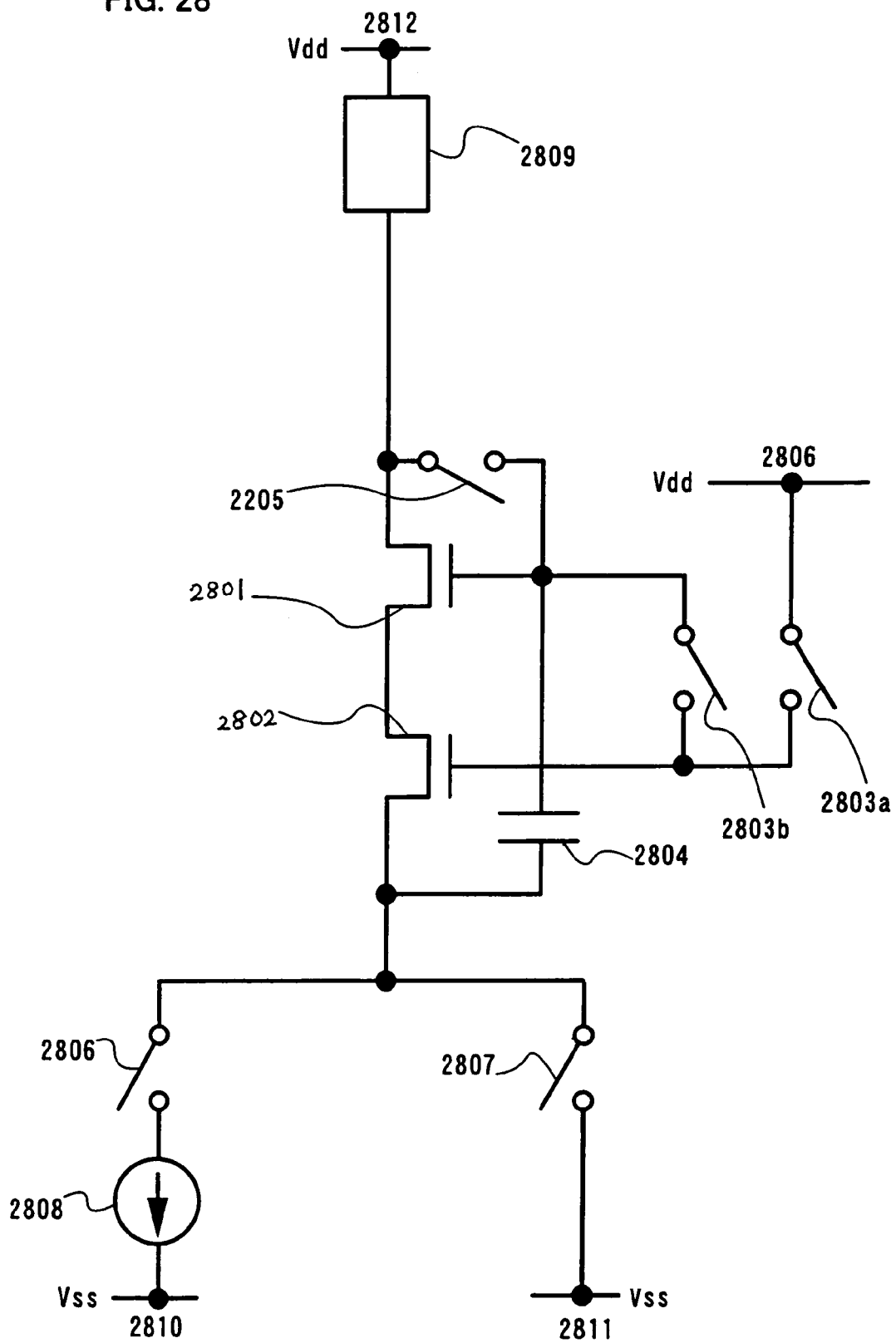
FIG. 28 is a diagram showing a configuration of a current source circuit of the invention.

FIG. 28 shows an example in which the polarity (conductivity) of the current source transistor 2201 and the switching transistor 2202 are changed and connections of the circuit are not changed in the circuit of FIG. 22. In this manner, by changing a potential of a wiring and a direction of current of the reference current source 108, the polarity can be changed easily. As in FIGS. 22 and 28, the polarity can be easily changed by changing potentials of the wirings 110, 111, and 2112 so as to be those of wirings 2810, 2811, and 2812 and changing a direction of current of the reference current source 108 so as to be that of a reference current source 2808. A current source transistor 2801, a switching transistor 2802, switches 2803a, 2803b, 2805, 2806, and 2807, a capacitor 2804, and the load 1109 correspond to the current source transistor 2201, the switching transistor 2202, the switches 2203b, 2205, 2206, and 2207, the capacitor 2204, and the load 109 respectively, of which connection is not changed.

Figure 29:
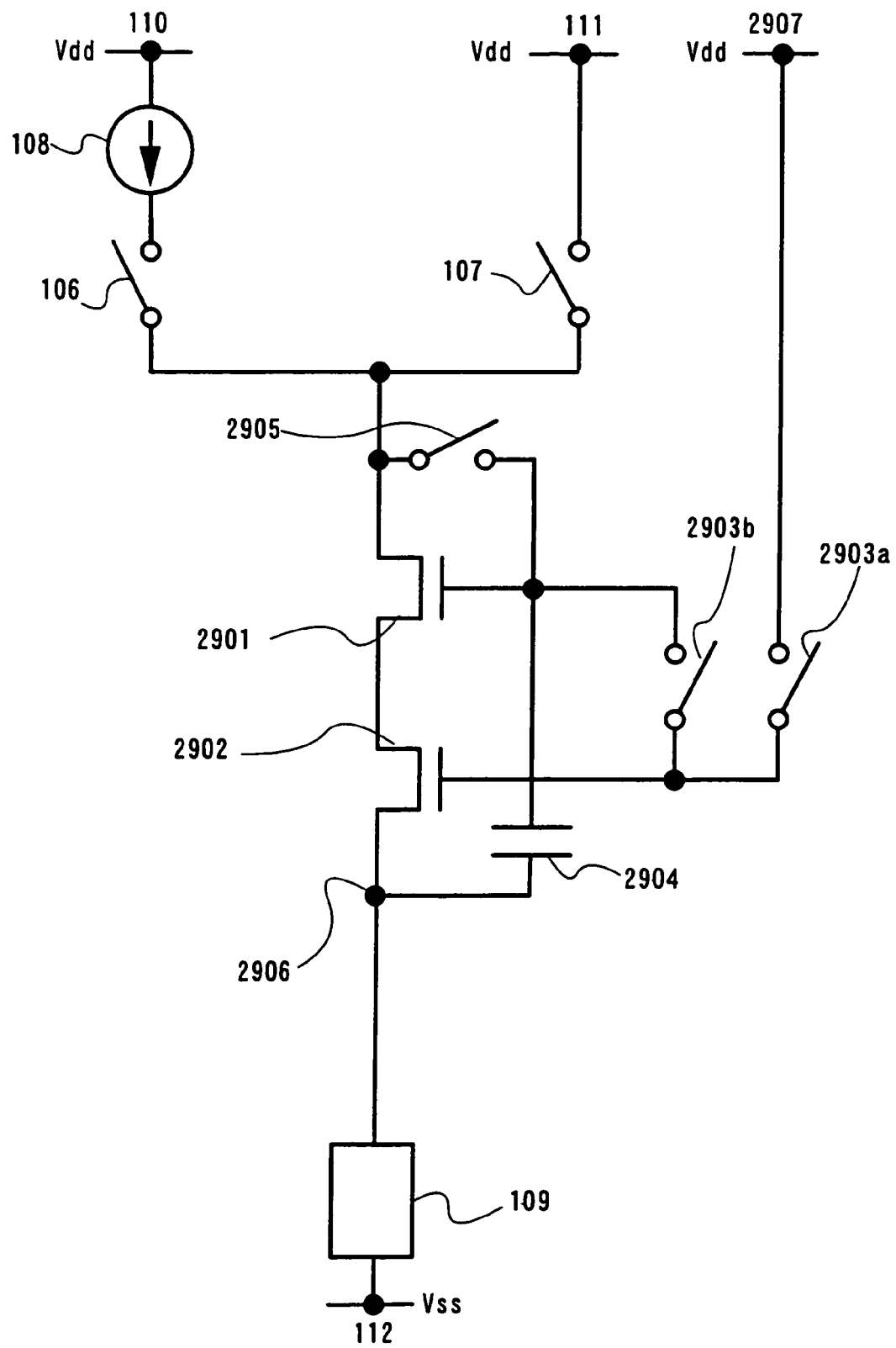
FIG. 29 is a diagram showing a configuration of a current source circuit of the invention.

FIG. 29 shows an example in which the polarity (conductivity) of the current source transistor 2201 and the switching transistor 2-202 are changed by changing the connection of the circuit without changing the direction of current in the circuit of FIG. 22.

There are a current source transistor 2901 which constantly operates as a current source (or a part of it) and a switching transistor 2902 of which operation changes according to the circumstance. The current source transistor 2901, the switching transistor 2902, and the load 109 are connected in series. A gate terminal of the current source transistor 2901 is connected to one of the terminals of the capacitor 2904. The other terminal 2906 of the capacitor 2904 is connected to a source terminal of the switching transistor 2902 (the current source transistor 2901). Therefore, the capacitor 2904 can hold a gate-source voltage of the current source transistor 2901. Further, the gate terminal and a drain terminal of the current source transistor 2901 are connected via a switch 2905. The capacitor 2904 can be controlled to hold a charge by turning on/off of the switch 2905.

Figure 30:
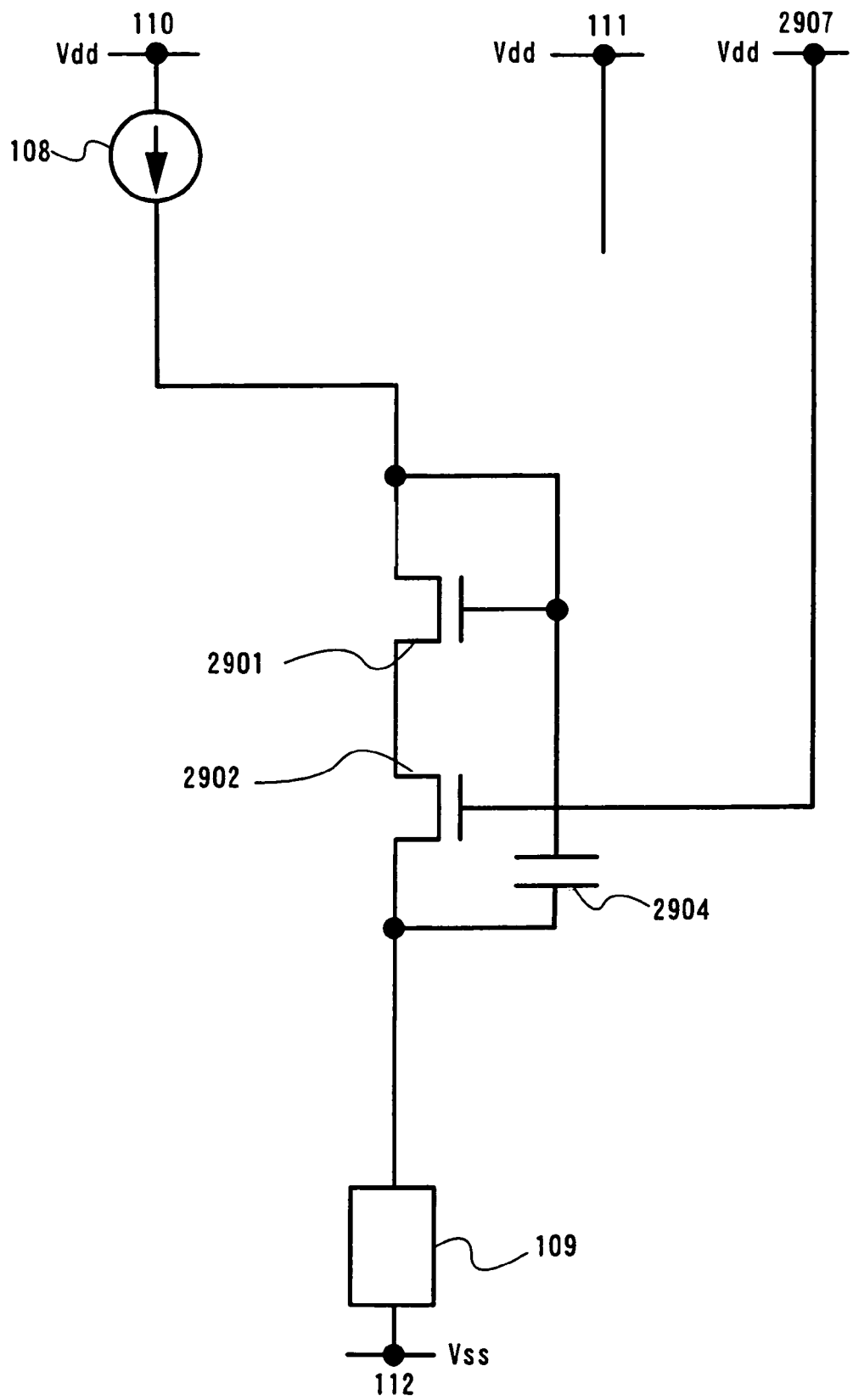
FIG. 30 is a diagram showing connections of a certain operation of a current source circuit of the invention.
Figure 31:
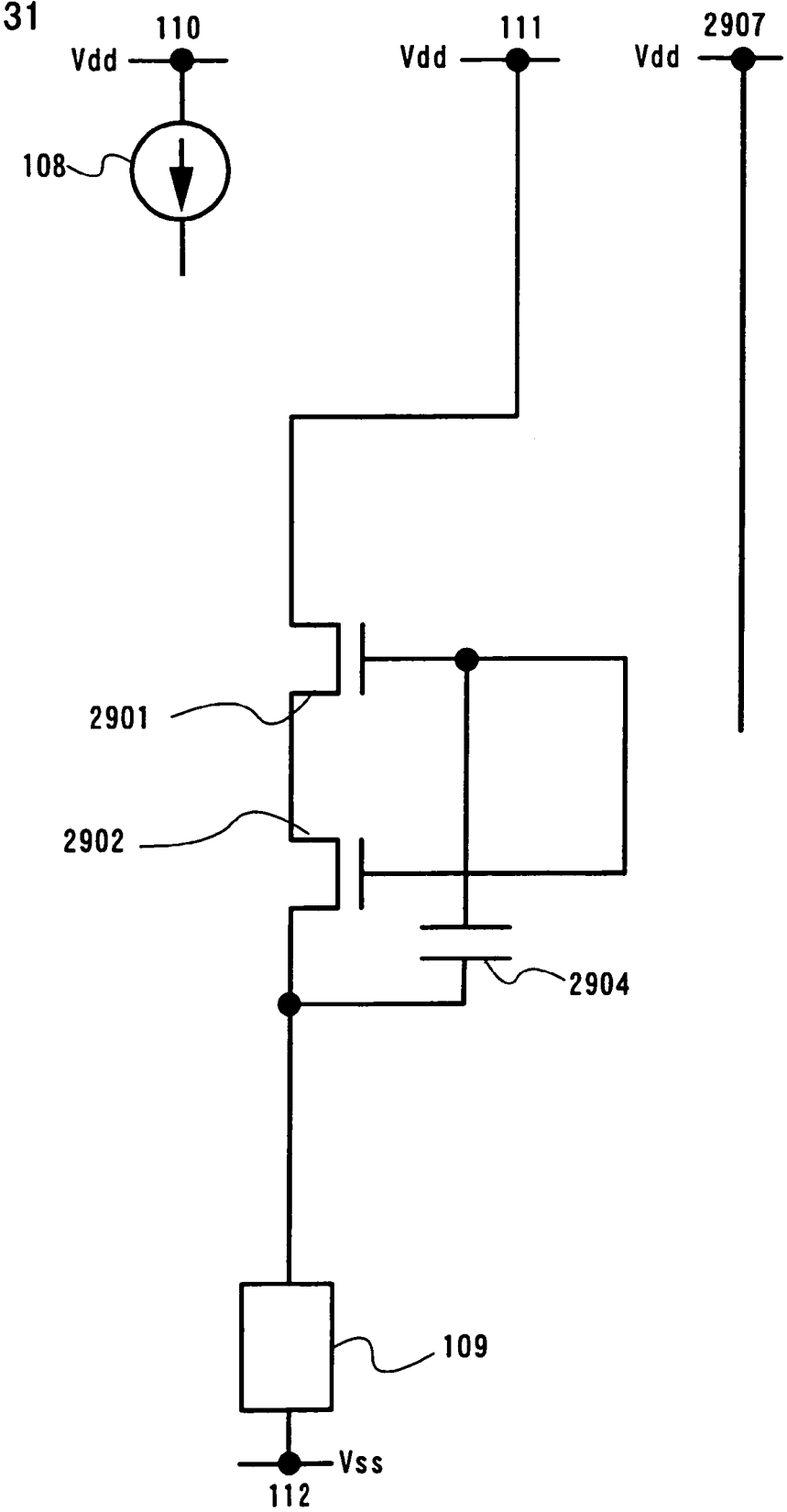
FIG. 31 is a diagram showing connections of a certain operation of a current source circuit of the invention.

In this case also, it is needless to say that the switches may be disposed anywhere as long as they are connected as shown in FIG. 30 in the set operation and connected as shown in FIG. 31 in the output operation.

It is to be noted that Vdd2 which is higher than Vdd is supplied to the wiring 2907. The invention is not limited to this, however, it is preferable to supply as high potential as possible so that current drive capacity of the switching transistor 2902 becomes as high as possible in the short-circuit operation.

In this manner, the invention can be configured by using various circuits by changing the arrangement and number of switches, the polarity of each transistor, the number and arrangement of the current source transistor and the switching transistor, a potential of each wiring, a direction of current flow as well as by using the circuit of FIG. 22. By using each change in combination, the invention can be configured by various circuits.

The description in this embodiment mode corresponds to Embodiment Mode 1 which is partially modified. Therefore, Embodiment Mode 1 can be applied to this embodiment mode as well.

Embodiment Mode 3

In this embodiment mode, description is made on a configuration in which transistors are connected in parallel and the transistor for supplying a current is changed between the set operation and the output operation. It is to be noted that the description already made in Embodiments 1 and 2 are omitted in the following description.

First, a configuration example in the case of connecting transistors in parallel and changing the transistor for supplying a current is changed between the set operation and the output operation is described with reference to FIG. 51.

A set transistor 5102 which becomes conductive at least in the set operation, a current source transistor 5101 which becomes conductive in the output operation are provided. The set transistor 5102 and the current source transistor 5101 are connected in parallel. A gate terminal of the set transistor 5102 is connected to one terminal of the capacitor 5104. Moreover, a gate terminal of the current source transistor 5101 is connected to one terminal of the capacitor 5104. The other terminal of the capacitor 5104 is connected to a source terminal of the set transistor 5102. Therefore, the capacitor 5104 can hold a potential of the gate terminal of the set transistor 5102. The other terminal of the capacitor 5104 is connected to the wiring 110 through the switch 106 and the reference current source 108, and in parallel to this, connected to the wiring 111 via the switch 107. A terminal 5105 and a drain terminal of the set transistor 5102 are connected via a switch 5103b. The terminal 5105 and a drain terminal of the current source transistor 5101 are connected via a switch 5103a. The terminal 5105 and the gate terminal of the set transistor 5102 are connected via a switch 5103c. By turning on/off the switch 5103c, a charge can be held in the capacitor 5104. Moreover, the terminal 5105 and the wiring 112 are connected via the load 109.

Figure 51:
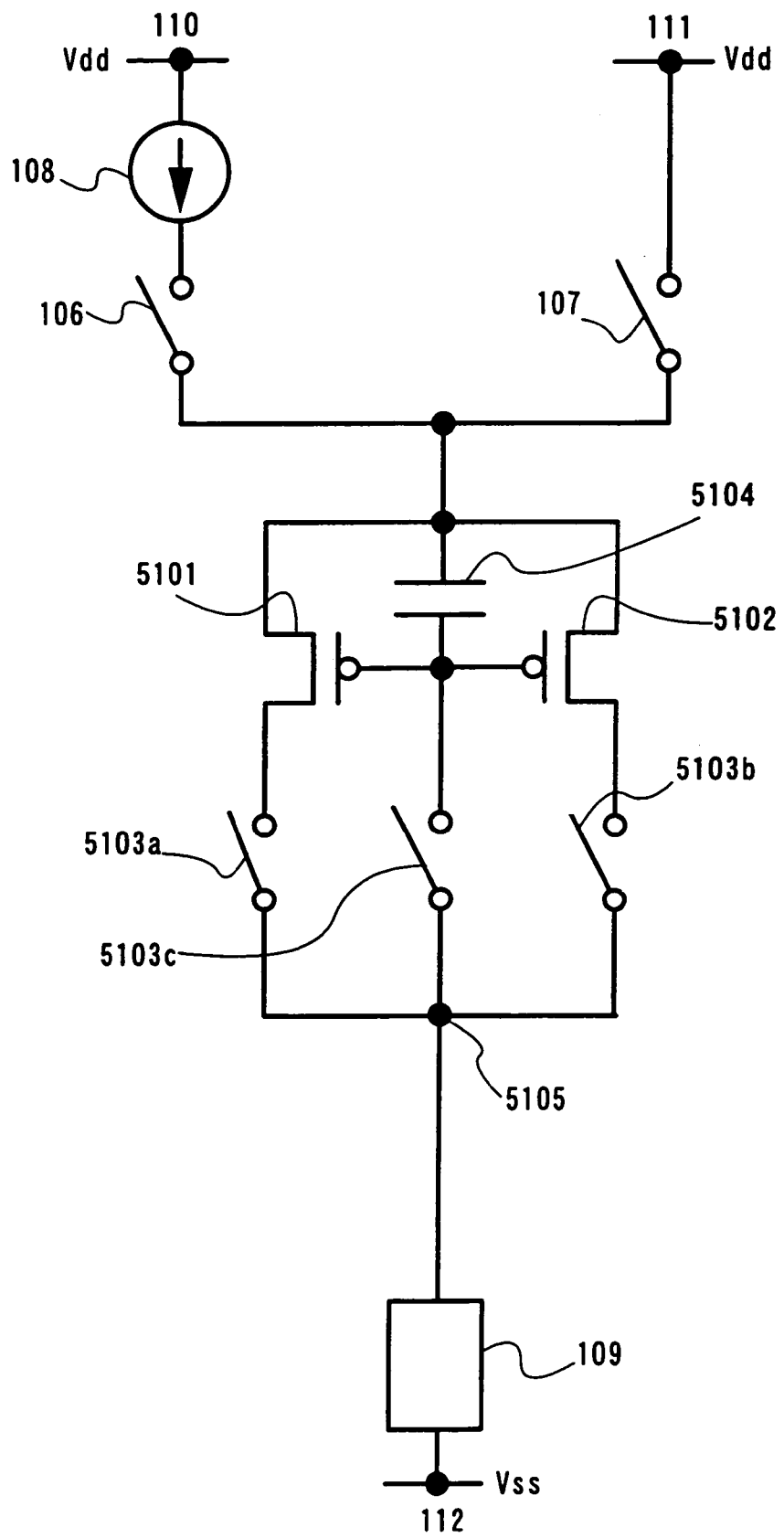
FIG. 51 is a diagram showing a configuration of a current source circuit of the invention.
Figure 52:
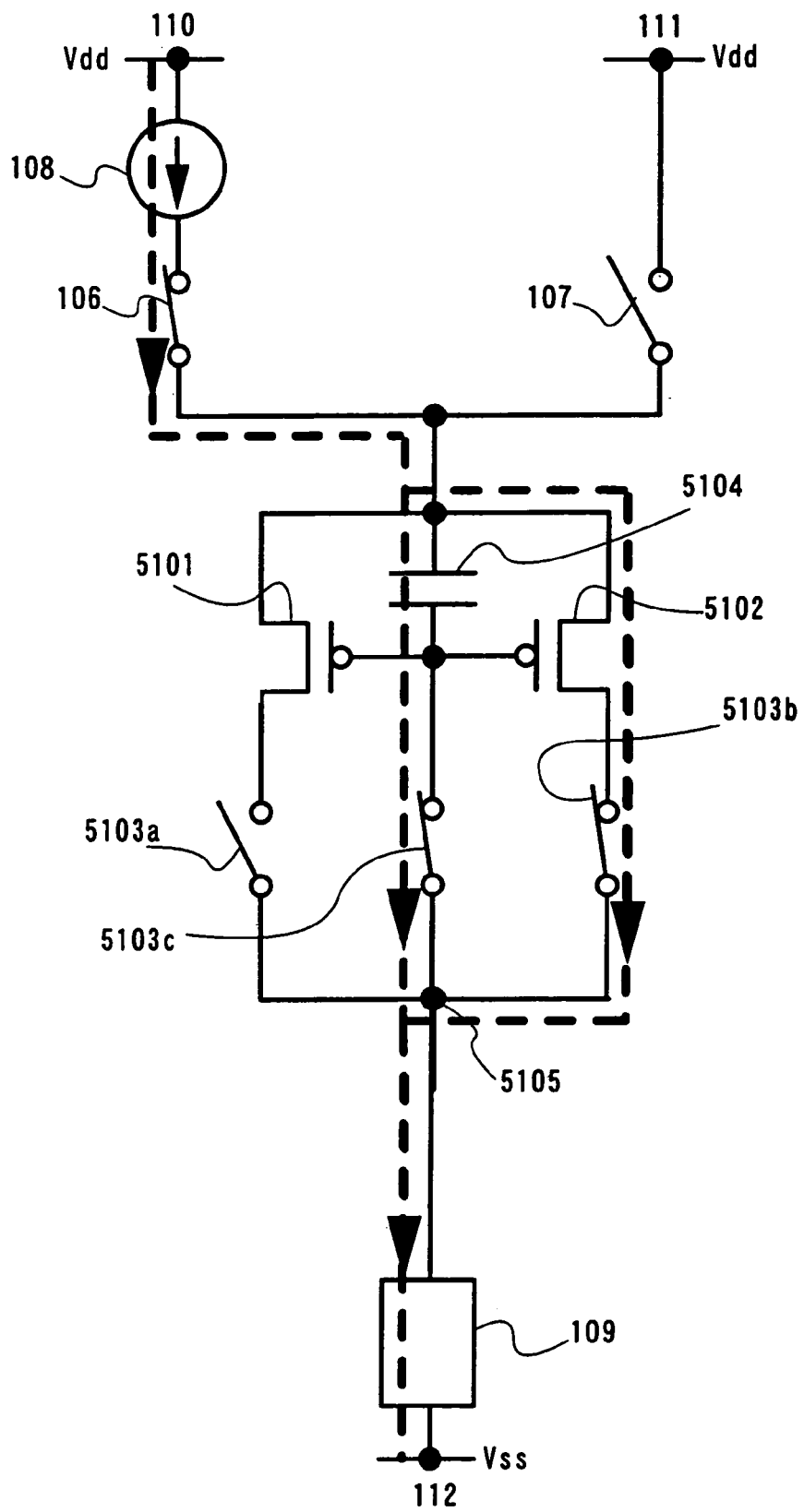
FIG. 52 is a diagram showing an operation of a current source circuit of the invention.

An operation of FIG. 51 is described. As shown in FIG. 52, the switches 106, 5103b, and 5103c are turned on and the switches 107 and 5103a are turned off. Then, a current does not flow between the source and drain of the current source transistor 5101. Therefore, the current Ib of the reference current source 108 flows to the capacitor 5104 and the set transistor 5102. When the current flowing between the source and drain of the set transistor 5102 and the current Ib of the reference current source 108 become equal, a current stops flowing to the capacitor 5104. That is, a steady state is obtained. A potential of the gate terminal of the set transistor 5102 is accumulated in the capacitor 5104. That is, a voltage required to supply the current Ib between the source and drain of the set transistor 5102 is applied to the gate terminal thereof. The aforementioned operation corresponds to the set operation.

Figure 53:
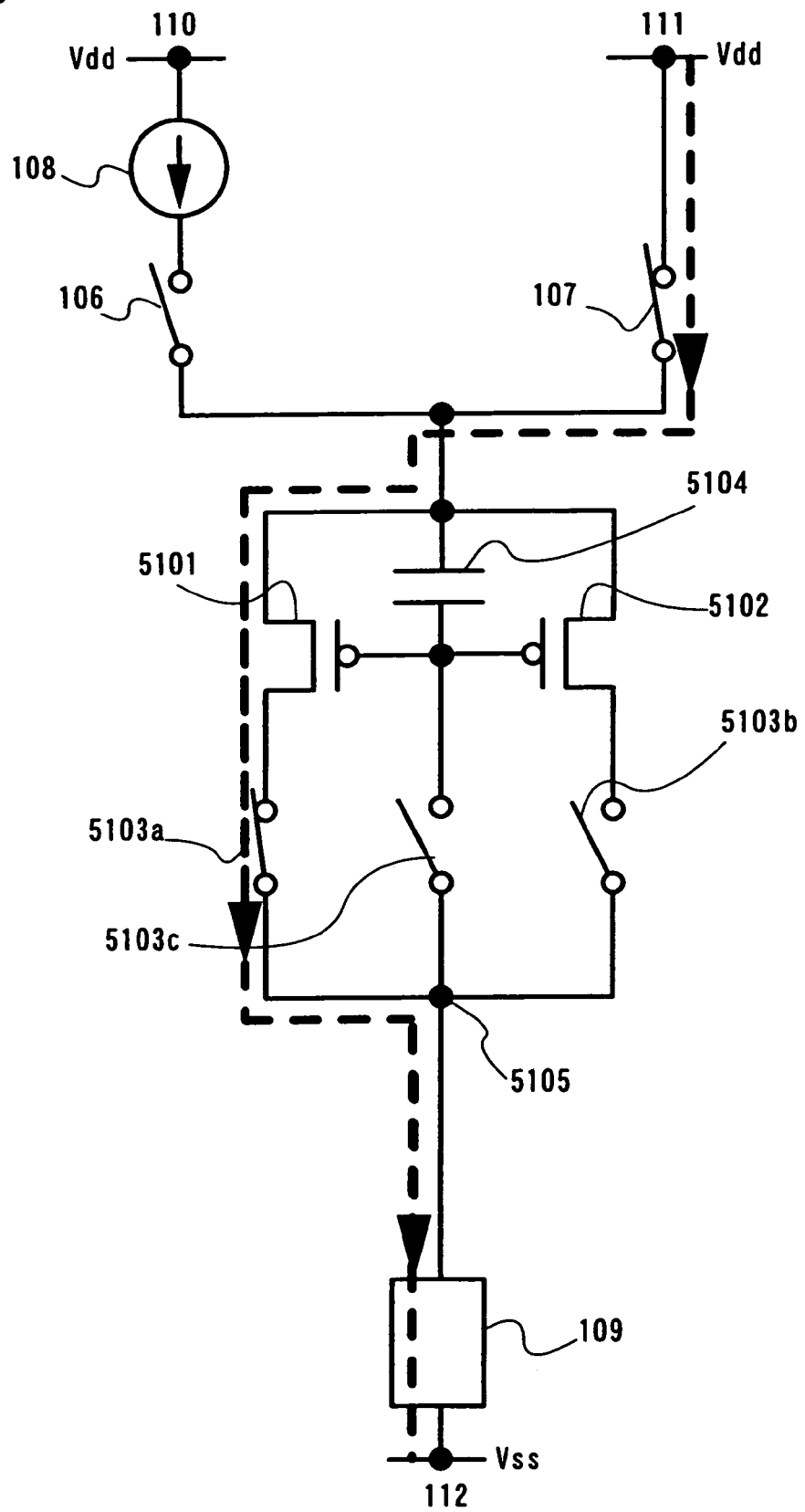
FIG. 53 is a diagram showing an operation of a current source circuit of the invention.

As shown in FIG. 53, the switches 107 and 5103a are turned on and the switches 106, 5103b, and 5103c are turned off. Then, a current stops flowing between the source and drain of the set transistor 5102 since the switch 5103b is off. A part of the charge accumulated in the gate capacitance of the set transistor 5102 and the capacitor 5104 is accumulated in gate capacitance of the current source transistor 5101. Thus, a current flows to the transistor 5101. By appropriately setting the transistor size (gate width W and gate length L) of the set transistor 5102 and the current source transistor 5101, a current which flows in the output operation can be smaller than the current Ib which flows in the set operation. That is to say, by enhancing current drive capacity of the set transistor 5102 higher than the current source transistor 5101, the set operation can be performed with the current Ib which is larger than the current which flows in the output operation, thus a steady state can be obtained rapidly. That is to say, an effect of a load which is parasitic on a wiring through which a current flows (wiring resistance, intersection capacitance and the like) is lessened and the set operation can be performed rapidly. Therefore, in the case where the load 109 is an EL element, a signal can be written rapidly when the EL element emits light at a low gray scale level. It is preferable that capacitance of the capacitor 5104 be sufficiently larger than that of the gate capacitance of the set transistor 5102 and the current source transistor 5101. Accordingly, a voltage held in the capacitor 5104 in the set operation does not easily vary in the output operation.

The current source transistor 5101 and the set transistor 5102 are required to have almost the same gate potential between the set operation and the output operation, therefore, it is preferable that they have the same polarity (conductivity).

Figure 54:
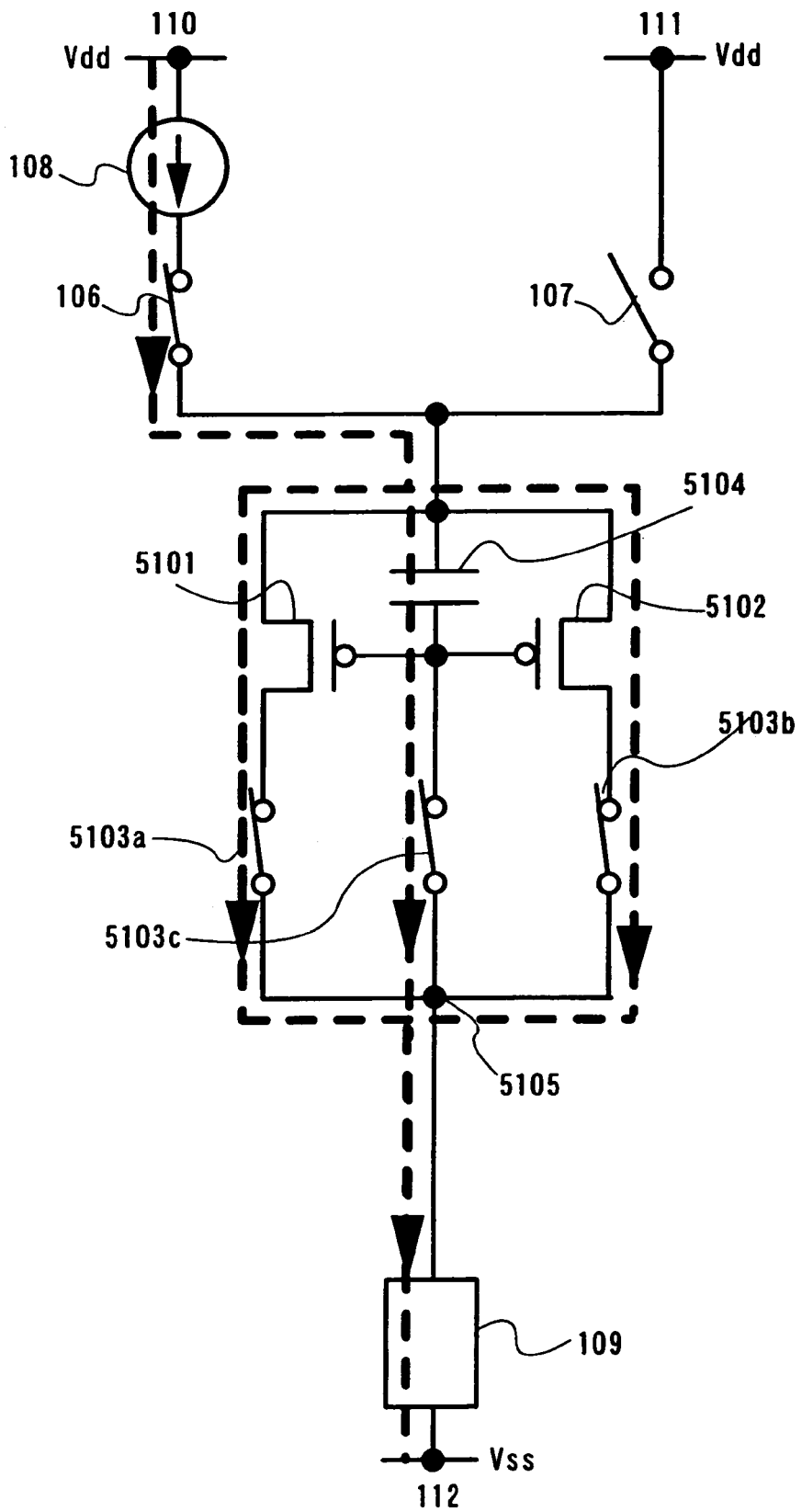
FIG. 54 is a diagram showing an operation of a current source circuit of the invention.

It is to be noted that a current does not flow to the transistor 5101 in FIG. 52 in the set operation, however, the switch 5103a may be turned on to supply a current to the current source transistor 5101 in the set operation as shown in FIG. 54 as well.

Although this embodiment mode is described with reference to FIG. 51, the configuration of the invention is not limited to this and various modifications are possible unless such changes and modifications depart from the scope of the invention.

Figure 10:
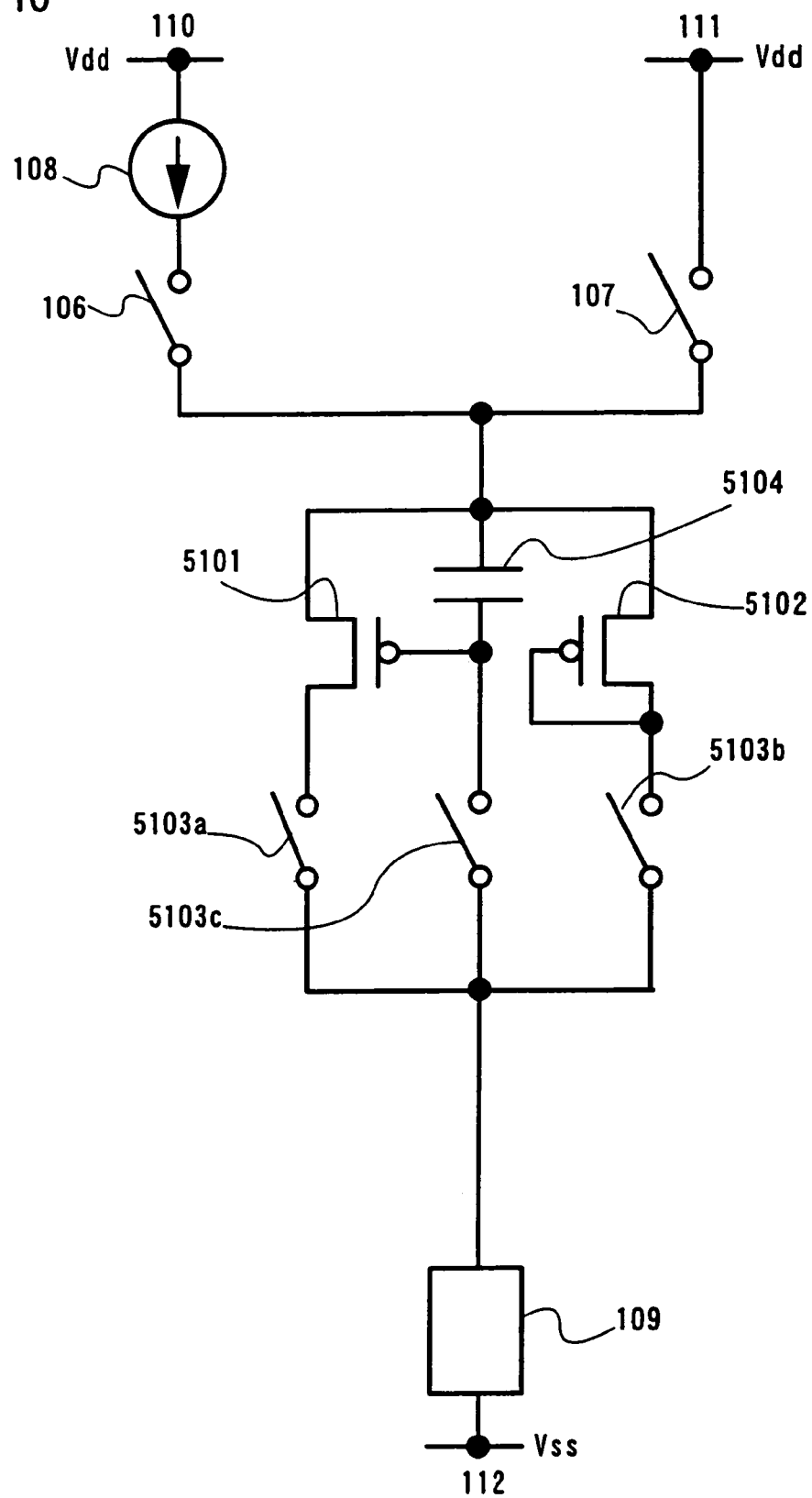
FIG. 10 is a diagram showing a configuration of a current source circuit of the invention.
Figure 55:
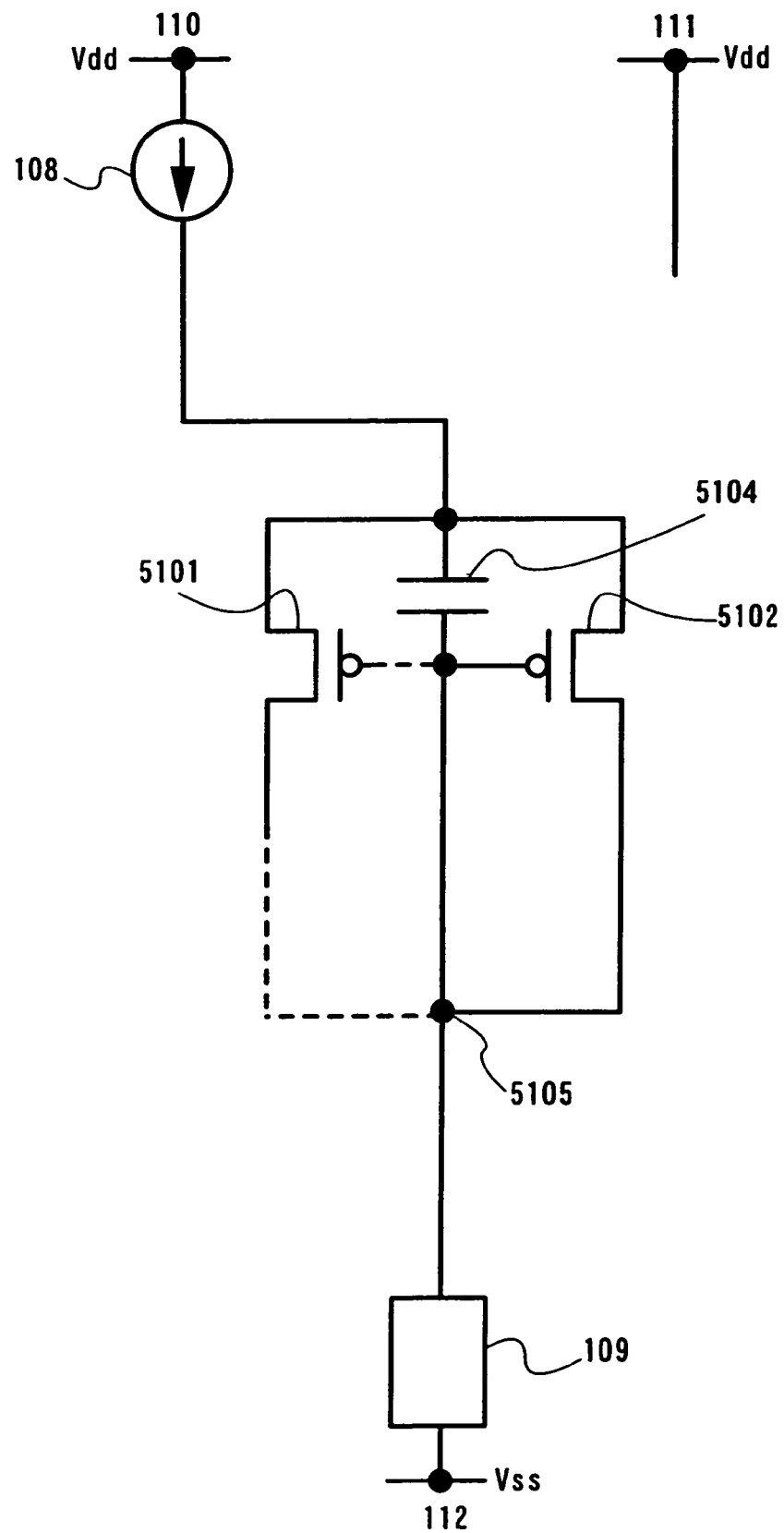
FIG. 55 is a diagram showing connections of a certain operation of a current source circuit of the invention.
Figure 56:
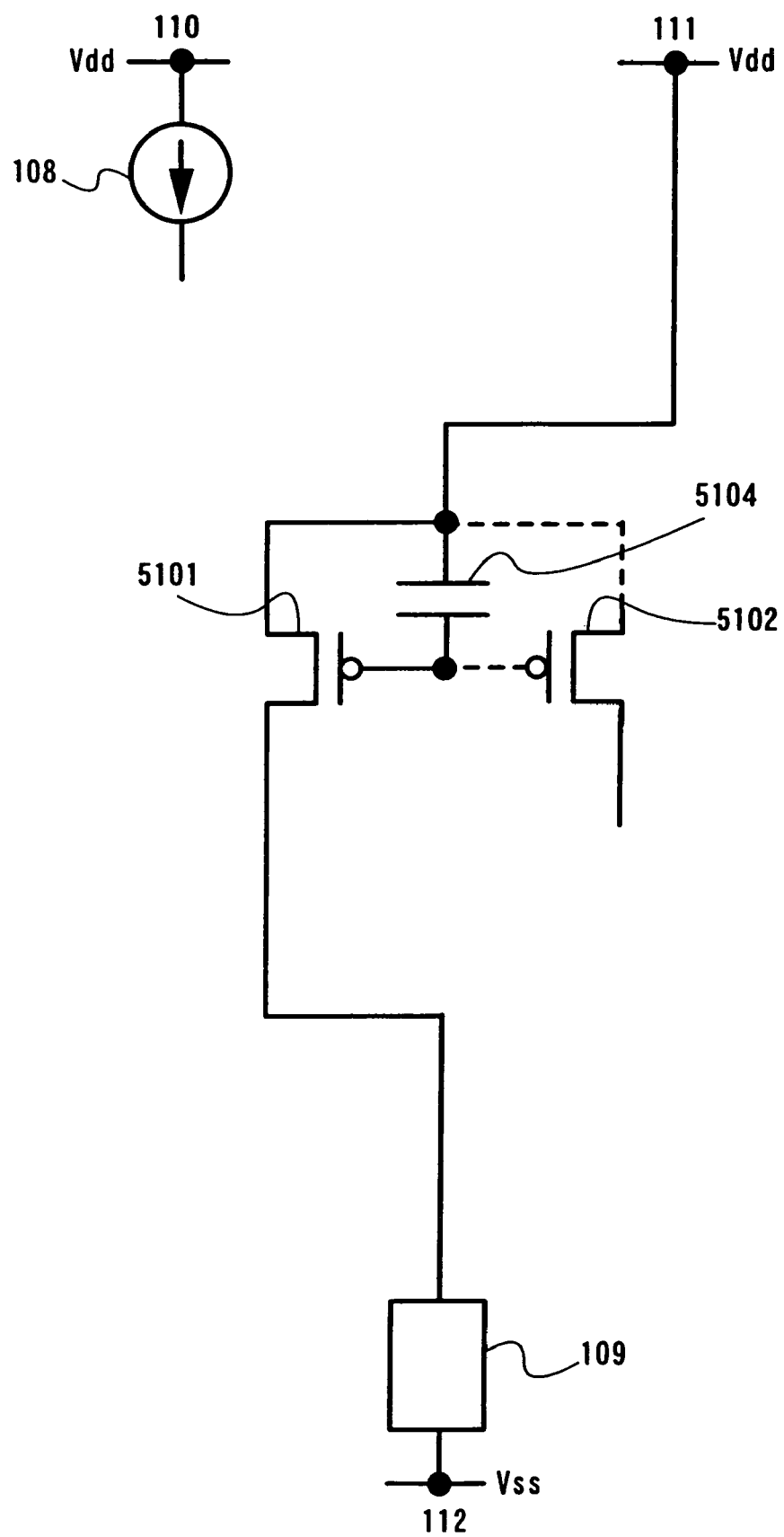
FIG. 56 is a diagram showing connections of a certain operation of a current source circuit of the invention.

The gate terminals of the set transistor 5102 and the current source transistor 5101 may be connected via a switch as shown in FIGS. 10 and 176 or the switch 5103b may be connected to the source terminal side of the set transistor 5102 as shown in FIG. 177 as long as the elements are connected as shown in FIG. 55 in the set operation and the elements are connected as shown in FIG. 56 in the output operation.

Figure 57:
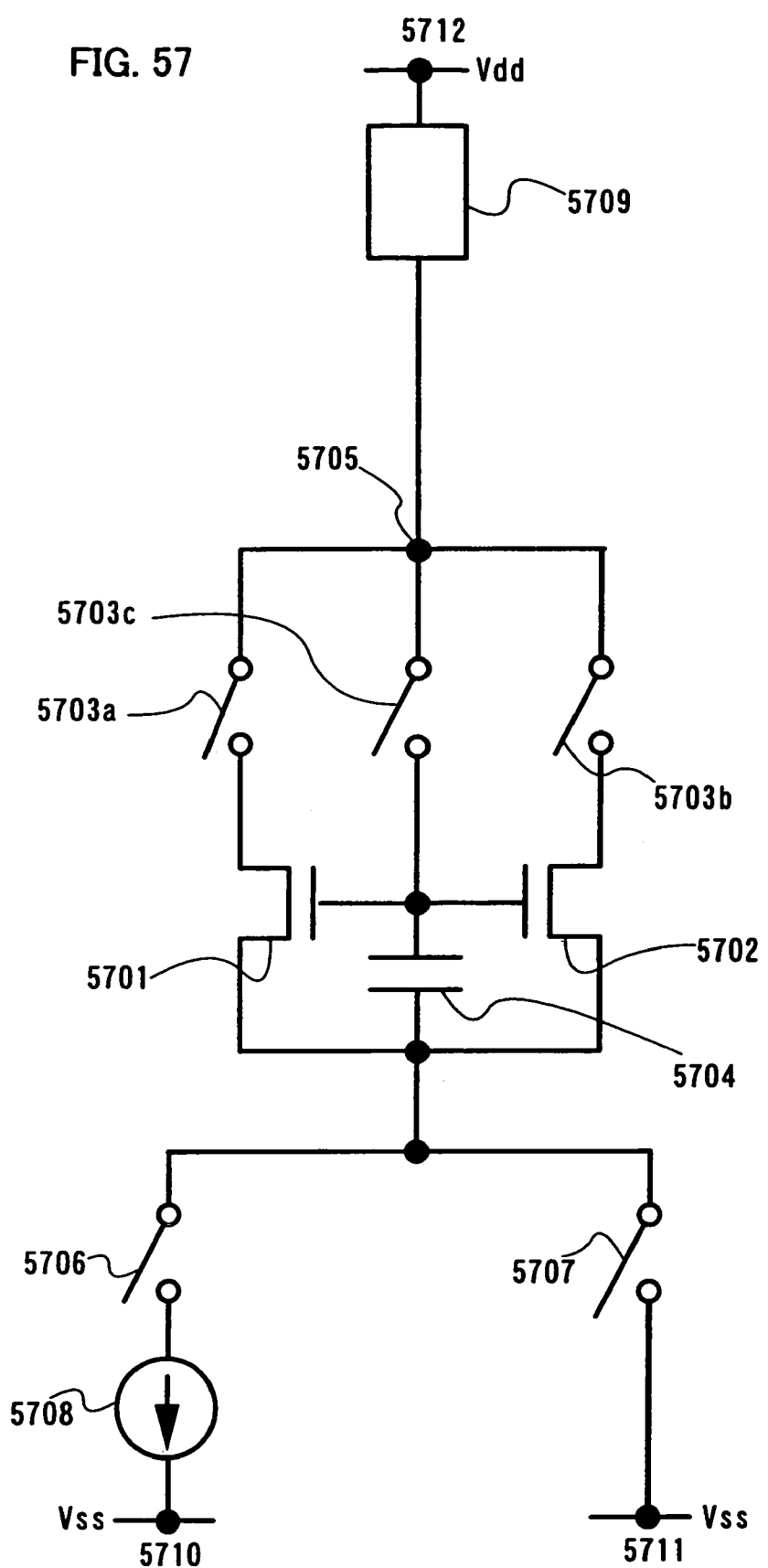
FIG. 57 is a diagram showing a configuration of a current source circuit of the invention.

FIG. 57 shows an example in which polarity (conductivity) of the current source transistor 5101 and the set transistor 5102 are changed by changing a direction of current flow and without changing connections of the circuit of FIG. 51. As in FIGS. 51 and 57, the polarity can be easily changed by changing potentials of wirings 5110, 5111, and 5112 so as to be those of wirings 5710, 5711, and 5712 and changing a direction of current of the reference current source 108 so as to be that of a reference current source 5708. A current source transistor 5701, a set transistor 5702, switches 5703, 5705, 5706, and 5707, a capacitor 5704, and a load 5709 correspond to the current source transistor 5101, the set transistor 5102, the switches 5103, 5105, 5106, and 5107, the capacitor 5104, and the load 5109 respectively, of which connection is not changed.

Figure 58:
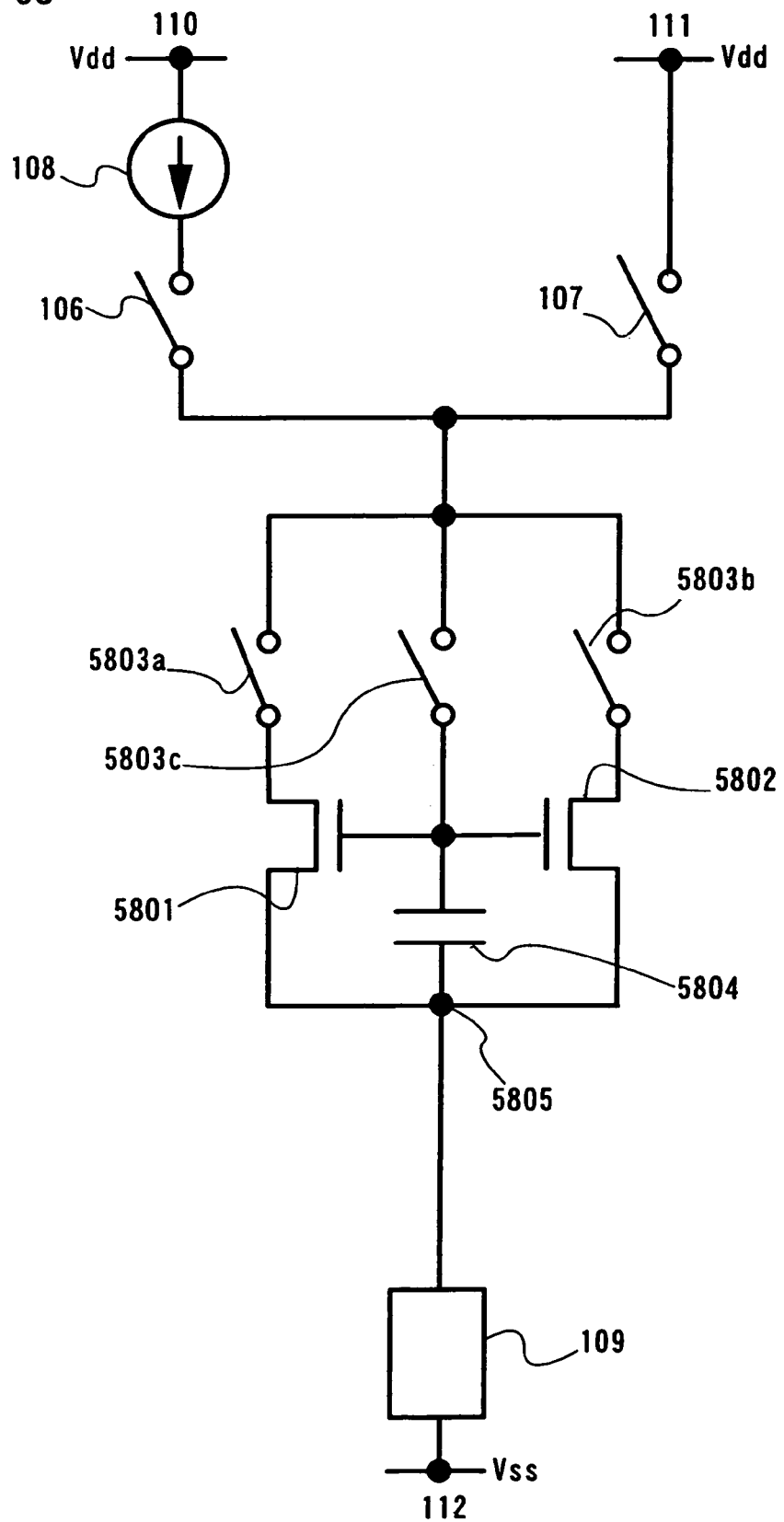
FIG. 58 is a diagram showing a configuration of a current source circuit of the invention.

FIG. 58 shows an example in which the polarity (conductivity) of the current source transistor 5101 and the switching transistor 5102 are changed by changing the connection of the circuit without changing the direction of current in the circuit of FIG. 51. By turning on/off the switch 5803b, a current flowing to the set transistor 5102 can be controlled. By turning on/off the switch 5803a, a current flowing to the current source transistor 5101 can be controlled. By turning on/off the switch 5803c, one of a gate-source voltage of the set transistor 5102, and a gate-source voltage of the current source transistor 5101, or both of a gate-source voltage of the set transistor 5102 and a gate-source voltage of the current source transistor 5101 can be held.

Embodiment Mode 4

The description in this embodiment mode corresponds to Embodiment Modes 1 to 3 which are partially modified. Therefore, the description made in this embodiment mode can be applied to the various configurations in Embodiment Modes 1 to 3.

In this embodiment mode, the circuits described in Embodiment Modes 1, 2, and 3 which are partially changed are described.

For simplicity, description is made on the case of partially changing the circuit of FIG. 1. Therefore, most of the description which is similar to Embodiment Mode 1 will be omitted here.

Figure 37:
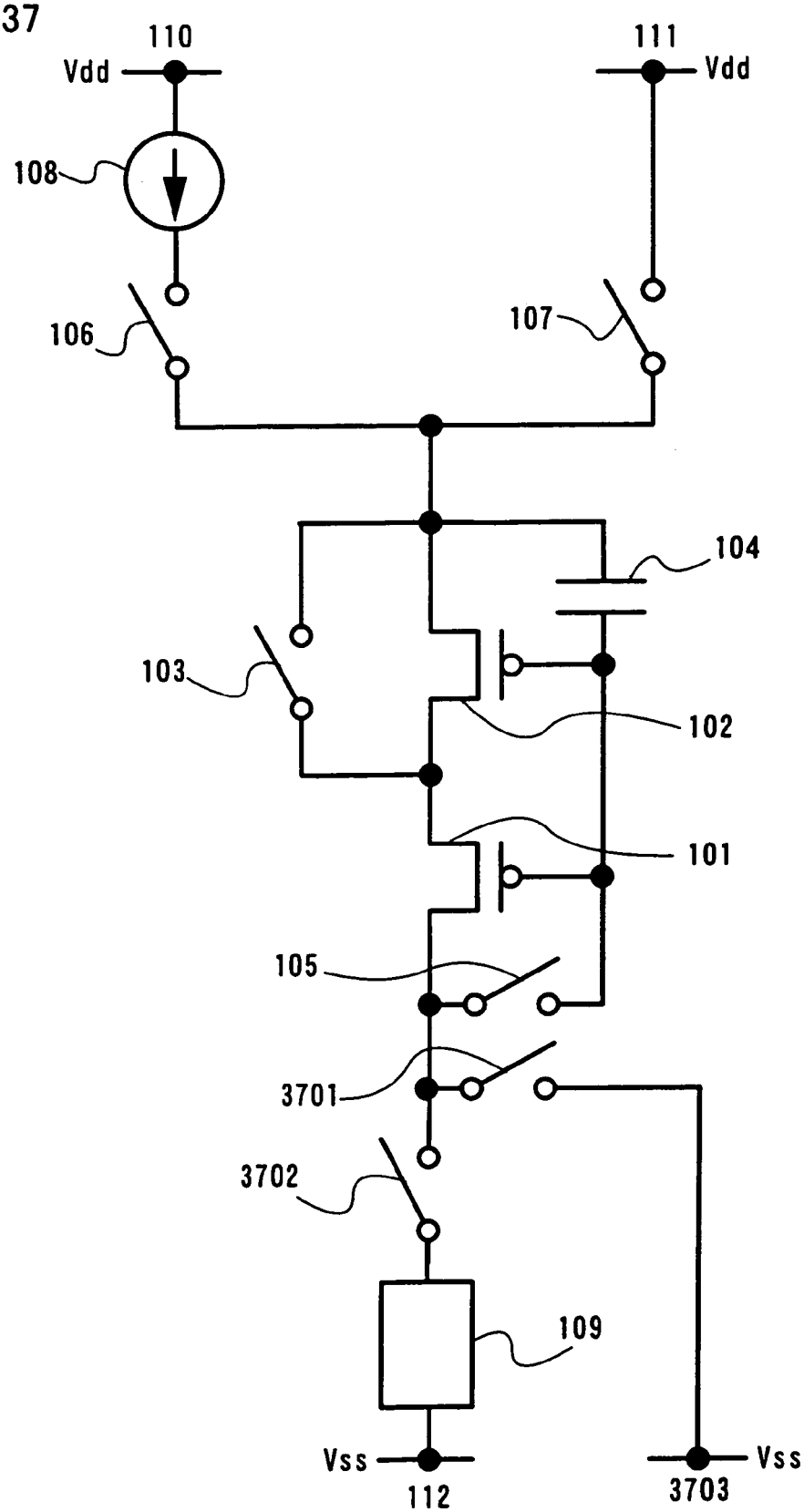
FIG. 37 is a diagram showing a configuration of a current source circuit of the invention.

First, FIG. 37 shows the configuration of FIG. 1 which is partially changed. In FIG. 37, a switch 3702 which selects whether to supply a current to the load 109, a wiring 3703 to which a current is discharged, and a switch 3701 which selects whether to discharge a current to the wiring 3703 are provided.

Figure 38:
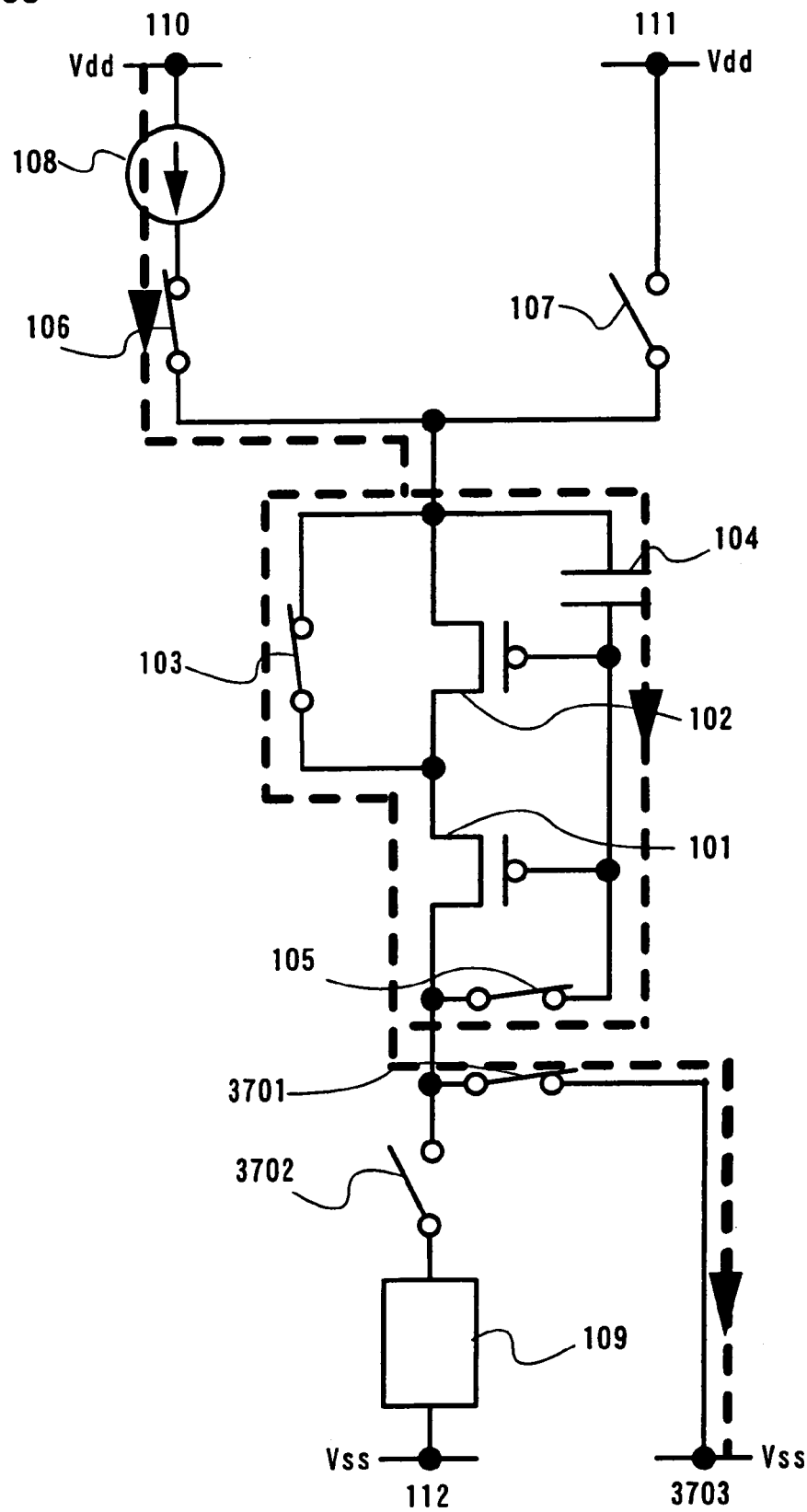
FIG. 38 is a diagram showing an operation of a current source circuit of the invention.

An operation of FIG. 37 is described. First, the switches 103, 105, 106, and 3701 are turned on and the switches 107 and 3702 are turned off as shown in FIG. 38. Then, the source terminal and the drain terminal of the switching transistor 102 have approximately the same potential. That is to say, hardly any current flows between the source and drain of the switching transistor 102 while a current flows to the switch 103. Therefore, a current Ib of the reference current source 108 flows to the capacitor 104 and the current source transistor 101. Then, the current stops flowing to the capacitor 104 when the current flowing between the source and drain of the current source transistor 101 and the current Ib of the reference current source 108 become equal. That is, a steady state is obtained. A potential of the gate terminal at that time is accumulated in the capacitor 104. That is, a voltage required to supply the current Ib between the source and drain of the current source transistor 101 is applied between the gate and source thereof. The aforementioned operation corresponds to the set operation. At that time, the switching transistor 102 performs the short-circuit operation. In this configuration, a current does not flow to the load 109 since the switch 3702 is off in the set operation while a current flows through the wiring 3703 since the switch 3701 is turned on. Here, in the case where a p-channel transistor which operates in the saturation region is used for the reference current source 108 in the configuration of FIG. 1, a potential in which a voltage drop in the load 109 is taken into consideration is required to be set at the wiring 110. That is to say, a potential high enough for the p-channel transistor to operate in the saturation region even when a voltage drop occurs at the load 109 is required to be set at the wiring 110. In the configuration of FIG. 37, however, a current is discharged to the wiring 3702 without being supplied to the load 109 in the set operation, therefore, a voltage drop at the load 109 is not required to be taken into consideration for the potential of the wiring 110. In other words, a potential lower than that in FIG. 1 can be employed. Therefore, power consumption can be reduced in FIG. 37.

In this manner, when a current stops flowing to the capacitor 104 and a steady state is obtained, the set operation is completed.

Figure 39:
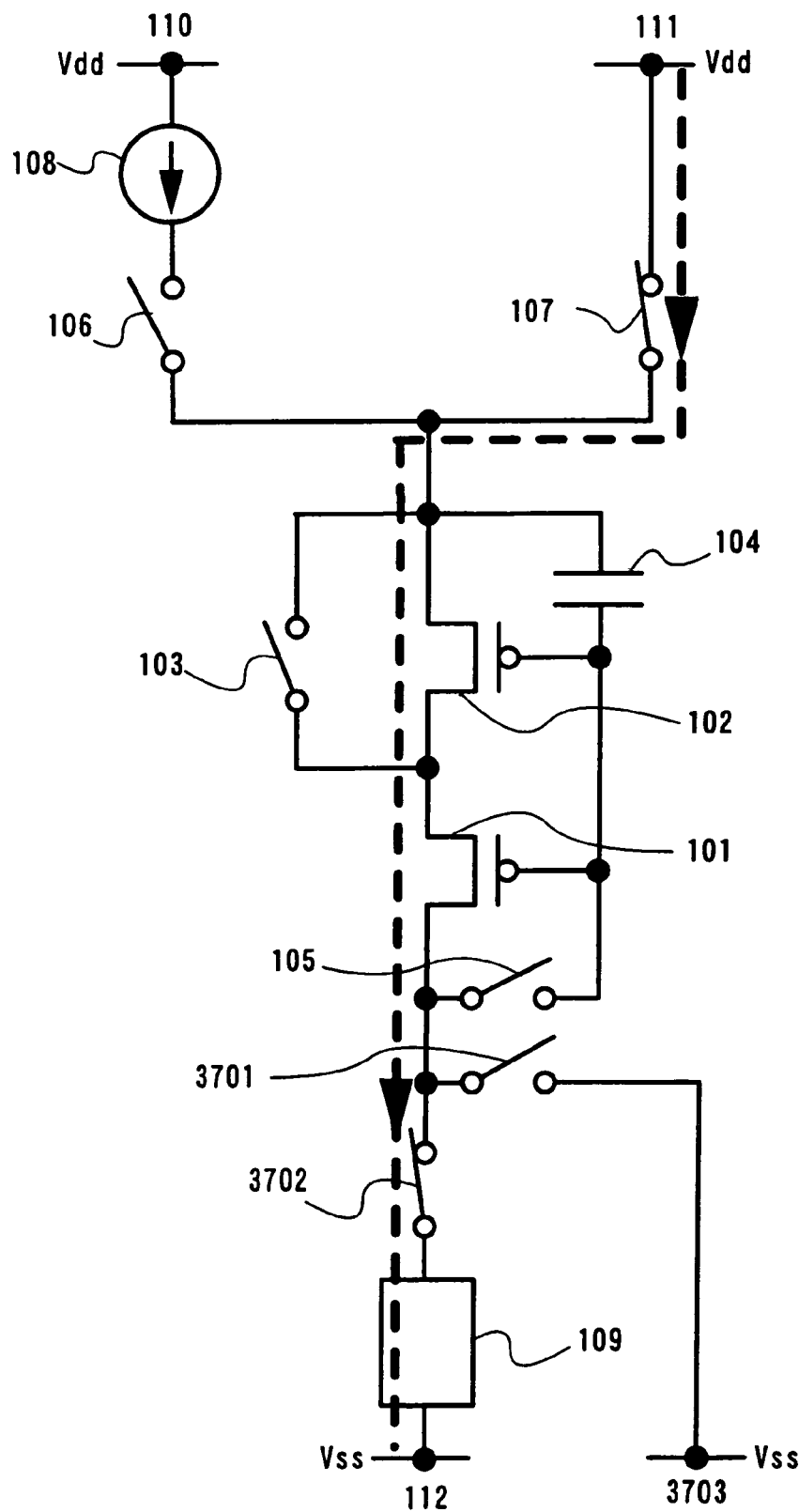
FIG. 39 is a diagram showing an operation of a current source circuit of the invention.

Next, as shown in FIG. 39, the switches 103, 105, 106, and 3701 are turned off and the switches 107 and 3702 are turned on. Thus, a current flows between the source and drain of the switching transistor 102 since the switch 103 is off. Then, a charge accumulated in the set operation in the capacitor 104 is applied to the gate terminals of the current source transistor 101 and the switching transistor 102. The gate terminals of the current source transistor 101 and the switching transistor 102 are connected to each other. As described above, the current source transistor 101 and the switching transistor 102 operate as a multi-gate transistor. Therefore, when the current source transistor 101 and the switching transistor 102 are one transistor, a gate length L of the multi-gate transistor is longer than L of the current source transistor 101. Generally, as the gate length L of a transistor becomes longer, a current flowing through it becomes smaller. Therefore, a current flowing to the load 109 becomes smaller than Ib. The aforementioned operation corresponds to the output operation. At that time, the switching transistor 102 performs the current source operation.

In this manner, by controlling on/off of the switch 103, a current flowing in the precharge operation can be larger than the current flowing to the load 109 and the like in the output operation, which enables the steady state to be obtained rapidly. That is to say, an effect of a load which is parasitic on a wiring through which a current flows (wiring resistance, intersection capacitance and the like) is lessened and the set operation can be performed rapidly.

As the current Ib is large in the set operation, an effect of a noise and the like becomes little. That is, as a value of Ib is large, it is not affected by a minute current generated by a noise and the like.

Therefore, for example, provided that the load 109 is an EL element, a signal can be written by the current Ib which is larger than a current supplied to the EL element when writing a signal in the case where the EL element emits light at a low gray scale level. Therefore, such a trouble in that the signal current is disturbed by a noise can be prevented, thus a rapid write operation can be performed.

Note that FIG. 37 is shown as a circuit of this embodiment mode, however, the invention is not limited to this configuration. By changing an arrangement and the number of switches, the polarity of each transistor, the number and arrangement of the current source transistor 101, and the switching transistor 102, a potential of each wiring, a direction of current flow and the like, various circuits can be employed in the configuration. Further, by combining each change also, a configuration using various circuits can be achieved.

Figure 40:
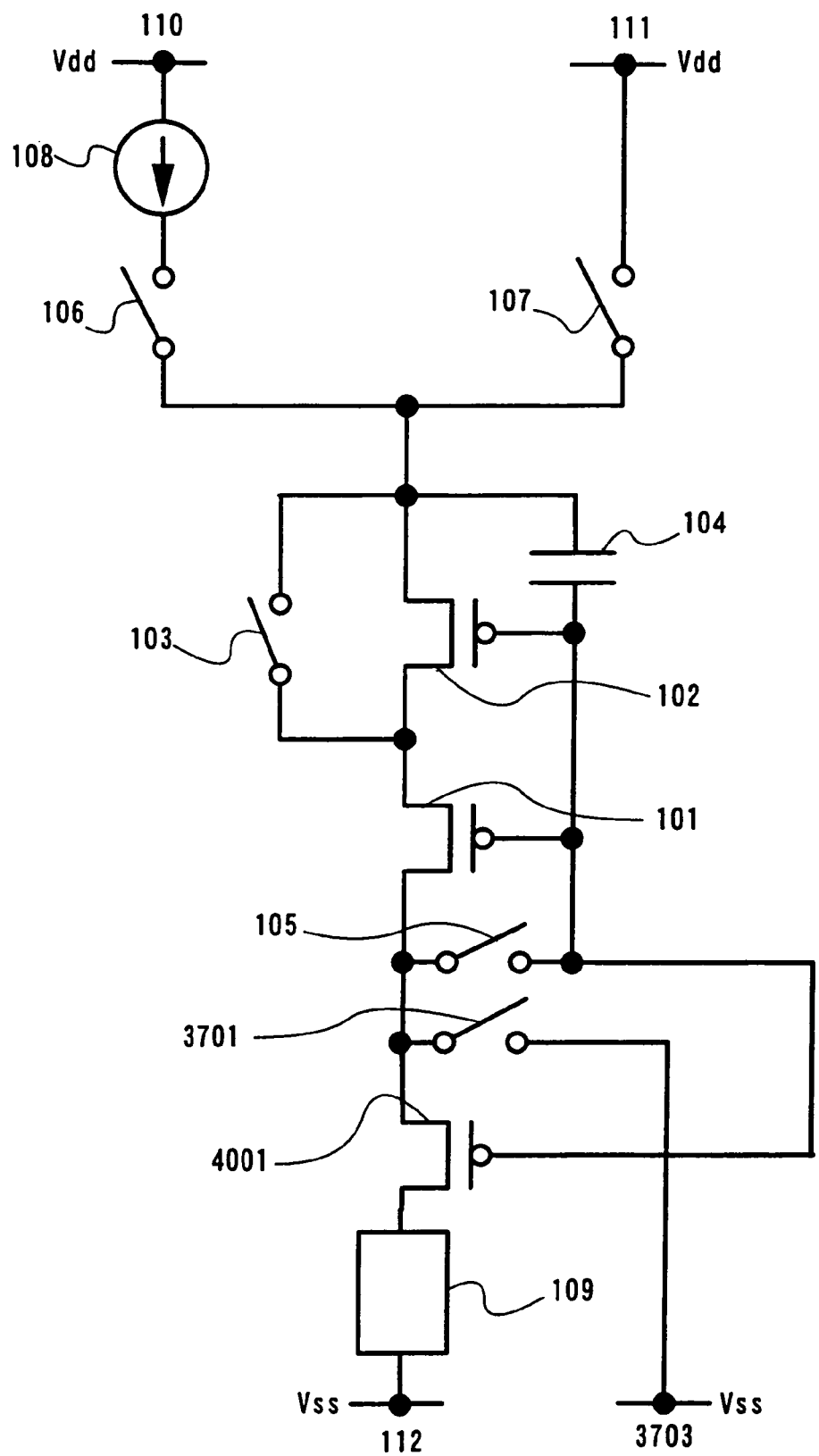
FIG. 40 is a diagram showing a configuration of a current source circuit of the invention.

For example, such switches as 106, 107, 103, 105, 3701, and 3702 may be arranged anywhere as long as they can control on/off of current. As shown in FIG. 40, a transistor 4001 may be used instead of the switch 3702 in FIG. 37.

For simplicity, description is made on the case of partially changing the circuit of FIG. 37. The description made in this embodiment mode can be applied to various configurations in Embodiment Modes 1 to 3.

First, FIG. 40 shows the configuration of FIG. 37 which is partially changed. In FIG. 40, the switch 3702 in FIG. 37 is changed into a multi transistor 4001 in FIG. 40. The multi transistor 4001 is a transistor having the same polarity (conductivity) as the current source transistor 101 and the switching transistor 102. A gate terminal of the multi transistor 4001 is connected to the gate terminal of the current source transistor 101. The multi transistor 4001 changes its operation depending on the cases. In the set operation, the multi transistor 4001 operates as a switch while it operates as a part of a multi-gate transistor together with the current source transistor 101 and the switching transistor 102 to operate as a current source.

Figure 41:
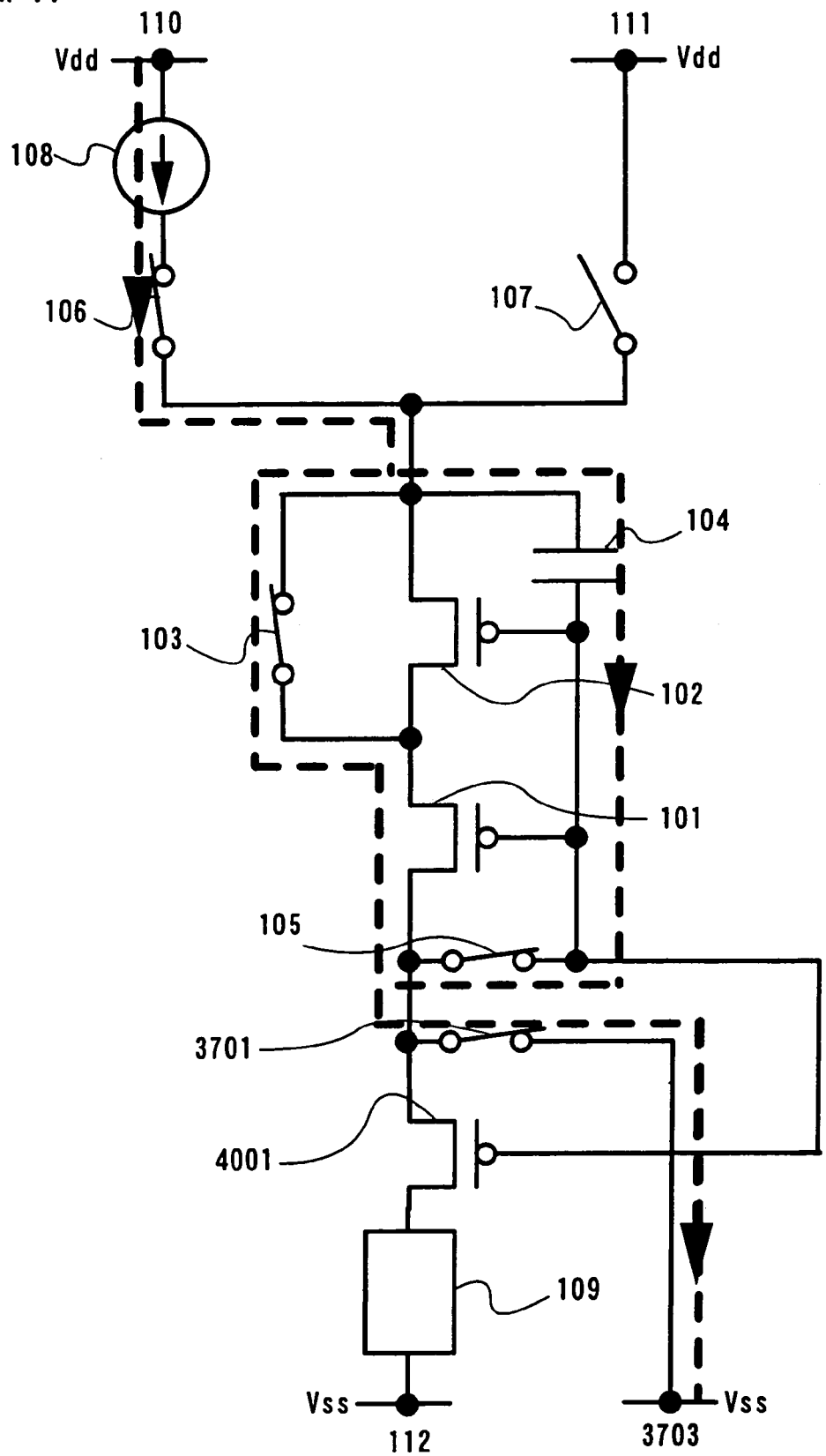
FIG. 41 is a diagram showing an operation of a current source circuit of the invention.

Next, an operation of the circuit of FIG. 40 is described. As shown in FIG. 41, the switches 106, 105, 103, and 3701 are turned on. Then, the current Ib of the reference current source 108 flows to the capacitor 104 and the current source transistor 101. At this time, a gate terminal and a source terminal of the multi transistor 4001 have approximately the same potential. That is to say, a gate-source voltage of the multi transistor 4001 becomes approximately 0 V. Therefore, the multi transistor 4001 is turned off. Then, a steady state is obtained in which a current flowing between the source and drain of the current source transistor 101 and the current Ib of the reference current source 108 become equal, thus a current stops flowing to the capacitor 104. The aforementioned operation corresponds to the set operation. At this time, the multi transistor 4001 operates as a switch which is off.

Figure 42:
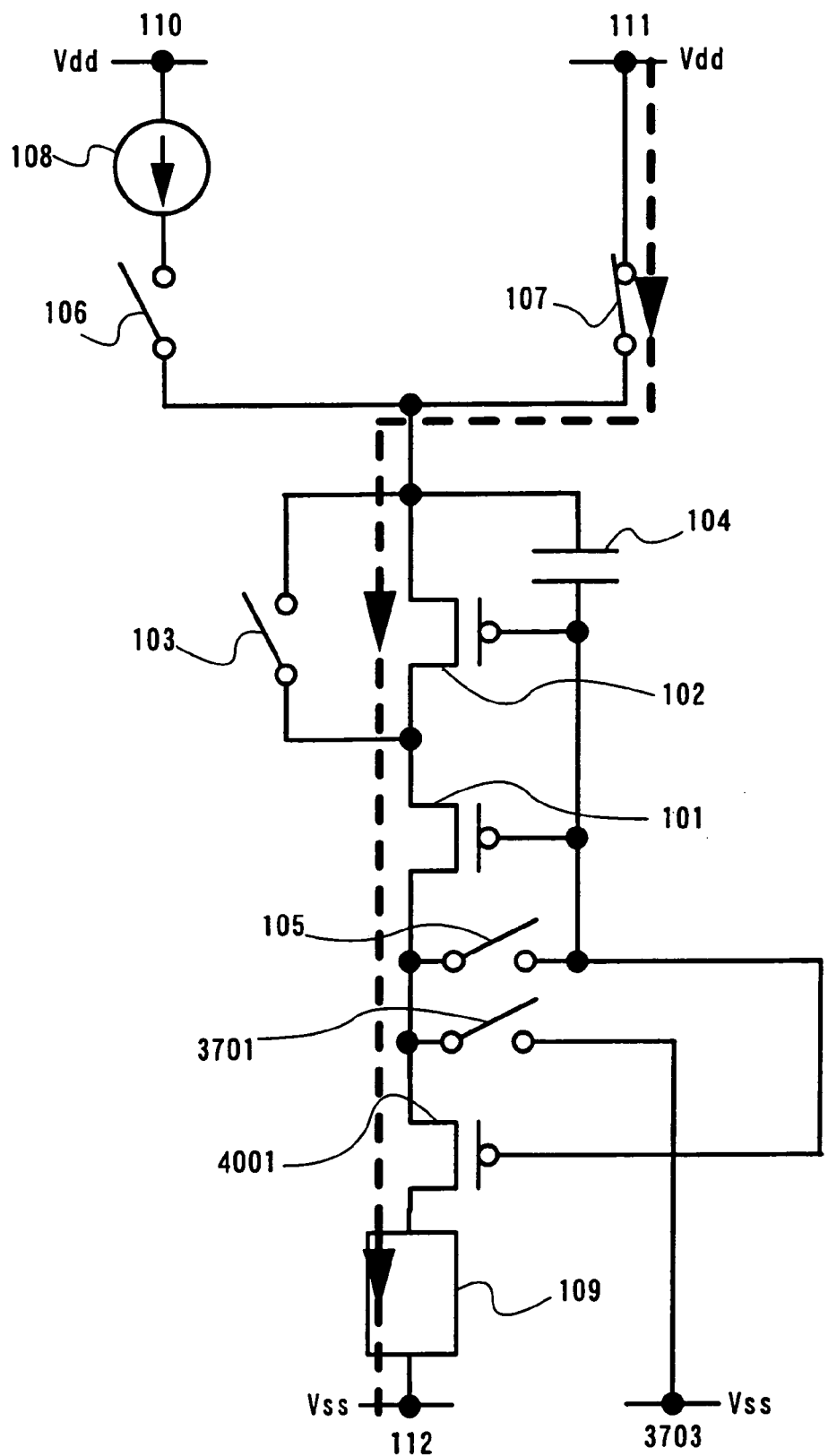
FIG. 42 is a diagram showing an operation of a current source circuit of the invention.

Next, as shown in FIG. 42, the switches 106, 105, 103, and 3701 are turned off. Then, a charge accumulated in the set operation in the capacitor 104 is applied to the gate terminals of the current source transistor 101, the switching transistor 102, and the multi transistor 4001. The gate terminals of the current source transistor 101, the switching transistor 102, and the multi transistor 4001 are connected to each other. As described above, the current source transistor 101, the switching transistor 102, and the multi transistor 4001 operate as a multi-gate transistor. Therefore, when the current source transistor 101, the switching transistor 102, and the multi transistor 4001 operate as one transistor, a gate length L of the multi-gate transistor is longer than L of the current source transistor 101. Therefore, a current flowing to the load 109 becomes smaller than Ib. That is, a current flowing to the load 109 becomes smaller than the case of FIG. 37. The aforementioned operation corresponds to the output operation. At that time, the multi transistor 4001 operates as a part of the multi-gate transistor.

In this manner, by changing the switch 107 of FIG. 37 into the multi transistor 4001 of FIG. 40 and connecting the gate terminal of the multi transistor 4001 to the gate terminal of the current source transistor 101, a current can be controlled automatically. Moreover, a current supplied to the load 109 can be small. In the case of FIG. 37, a wiring for controlling the switch 107 is required for changing the operation between supplying a current to the load 109 in the output operation and stopping current thereto in the set operation, however, a current can be controlled automatically in FIG. 40, therefore, the wiring for the control can be omitted.

It is to be noted that the current source transistor 101, the switching transistor 102, and the multi transistor 4001 operate as a multi-gate transistor in the output operation, therefore, it is preferable that these transistors have the same polarity (conductivity).

It is to be noted that the current source transistor 101, the switching transistor 102, and the multi transistor 4001 operate as a multi-gate transistor in the output operation, and a gate width W of each transistor may be the same or different. Similarly, a gate length L thereof may be the same or different. The gate width W, however, is preferably the same as it can be considered to be the same as a normal multi-gate transistor. By designing the gate length L of the switching transistor 102 and the multi transistor 4001 longer, a current supplied to the load 109 becomes smaller. Therefore, the gate width and length may be designed in consideration of a current required to be supplied in each of the set operation and the output operation.

Figure 43:
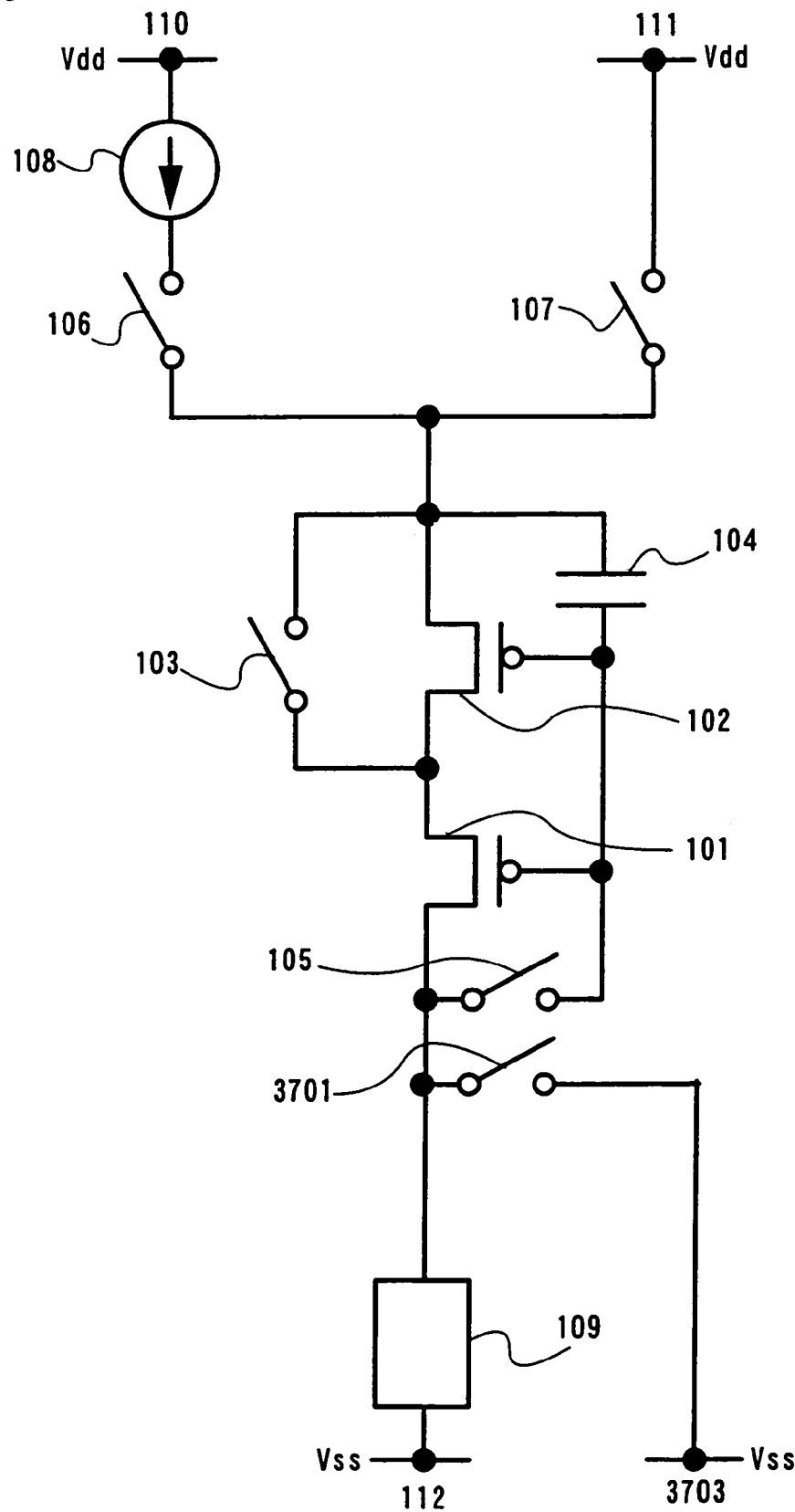
FIG. 43 is a diagram showing a configuration of a current source circuit of the invention.

As shown in FIG. 43, the switch 3702 may not be provided in the configuration of FIG. 37. This is because the load 109 has resistance. When the switch 3701 is turned on, a current flows to the wiring 3703 which has little resistance and does not flow to the load 109 almost at all.

Figure 44:
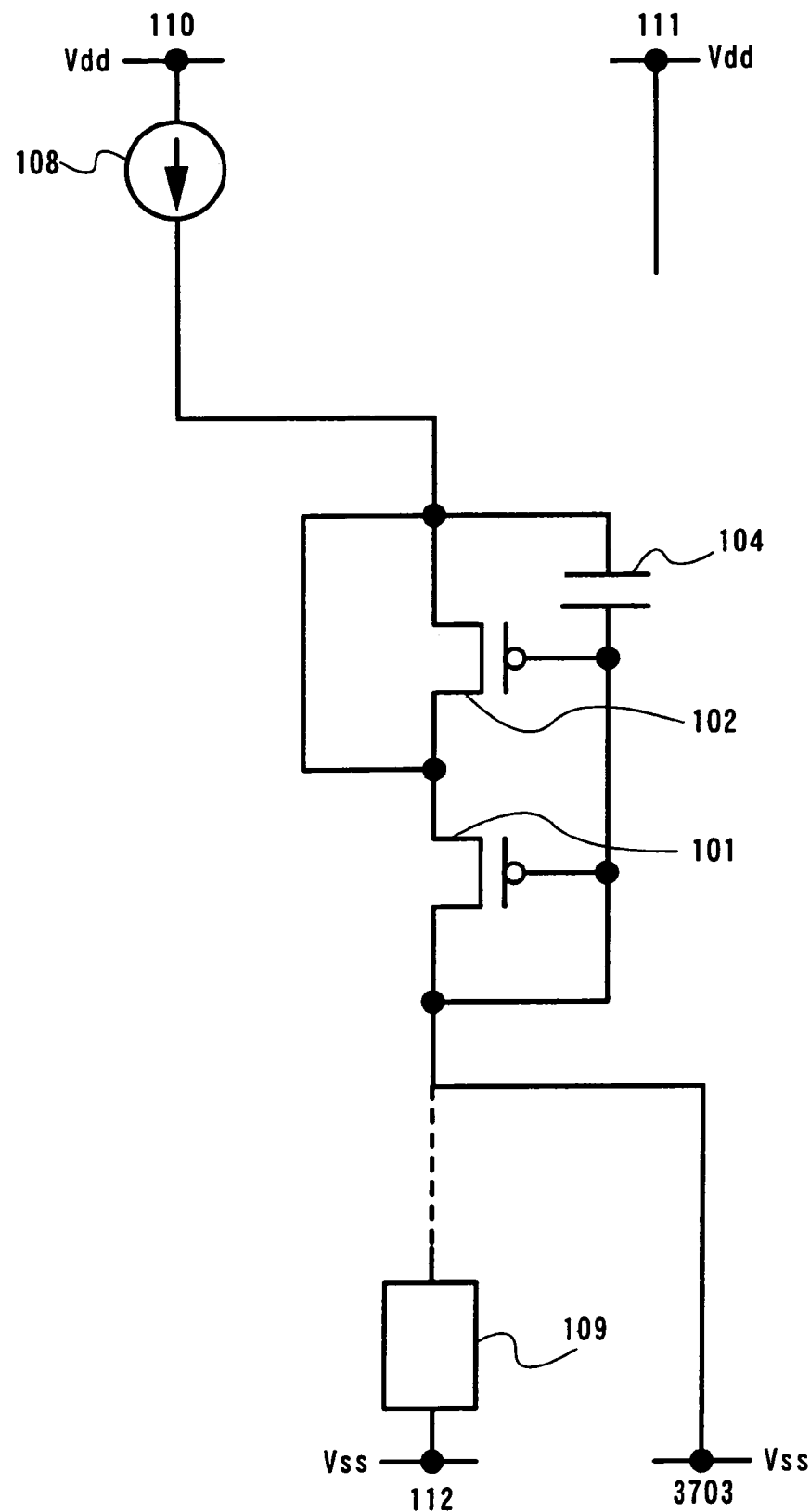
FIG. 44 is a diagram showing connections of a certain operation of a current source circuit of the invention.
Figure 45:
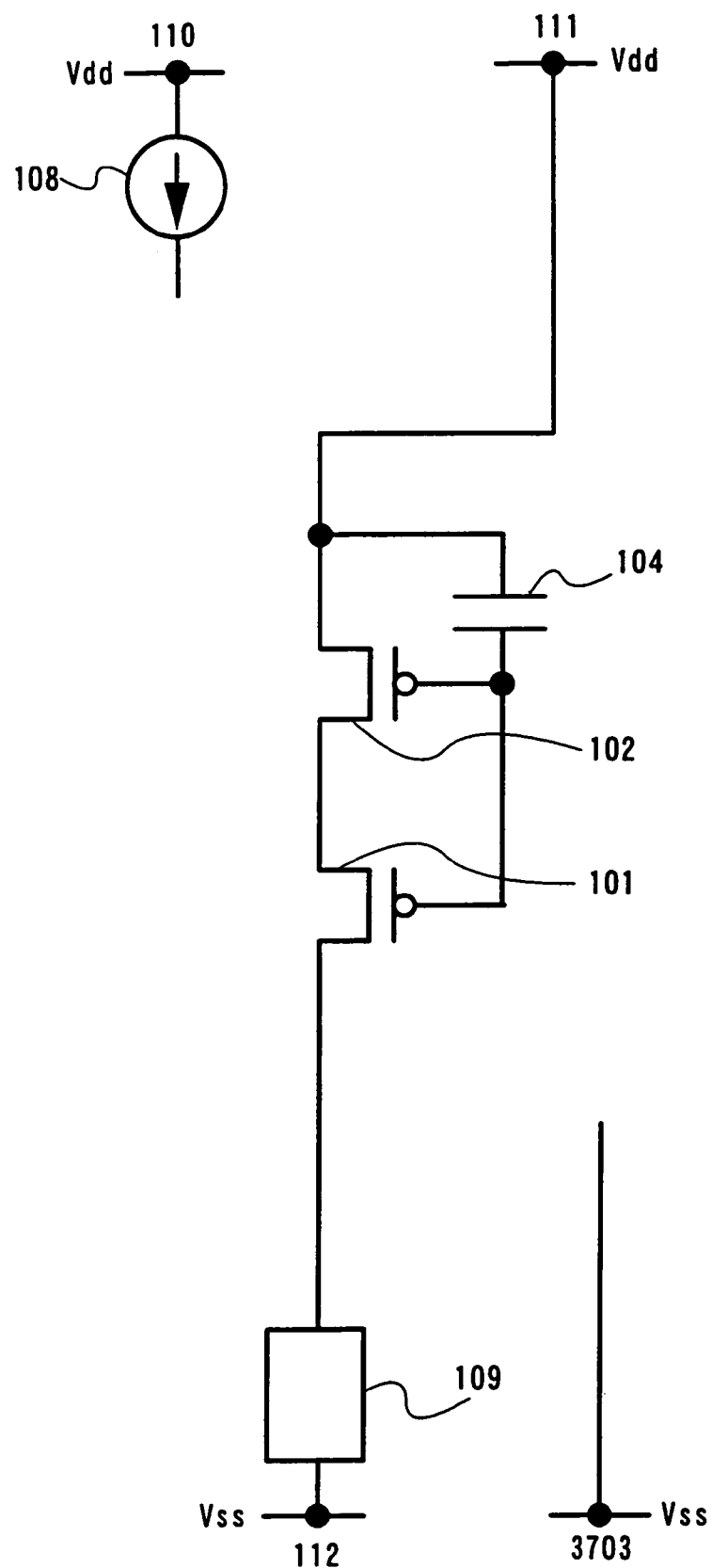
FIG. 45 is a diagram showing connections of a certain operation of a current source circuit of the invention.

That is to say, the switches such as 106, 1203, and 1205 may be arranged anywhere or all of these switches may not be provided as long as the elements are connected as shown in FIG. 44 in the set operation and the elements are connected as shown in FIG. 45 in the output operation.

Figure 46:
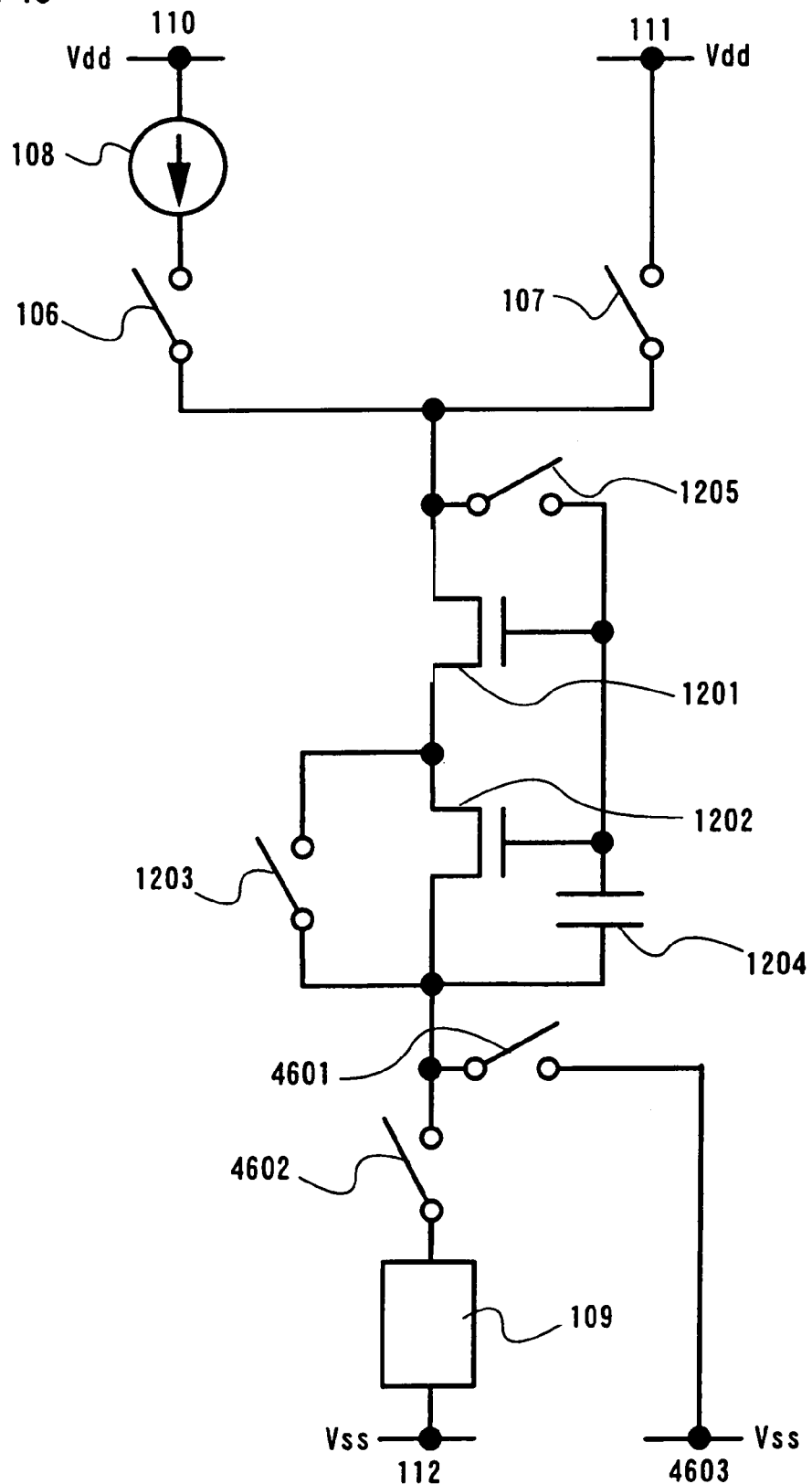
FIG. 46 is a diagram showing a configuration of a current source circuit of the invention.

FIG. 46 shows an example in which the polarity (conductivity) of the current source transistor 101 and the switching transistor 102 are changed by changing the connection of the circuit without changing the direction of current in the circuit of FIG. 37. FIG. 46 is also a configuration of FIG. 12 which is partially changed. Therefore, common portions between FIGS. 12 and 46 are denoted by the same reference numerals. In FIG. 46, a switch 4602 which selects whether to supply a current to the load 109, a wiring 4603 to which a current is discharged, and a switch 4601 which selects whether to discharge a current to the wiring 4603 are provided.

It is to be noted that the configuration is not limited to this. By changing the number and arrangement of switches, the polarity of each transistor, the number and arrangement of the current source transistor 1201 and the switching transistor 1202, a potential of each wiring, a direction of current flow, and the like, various circuits can be configured. By using each change in combination, various circuits can be configured.

Figure 47:
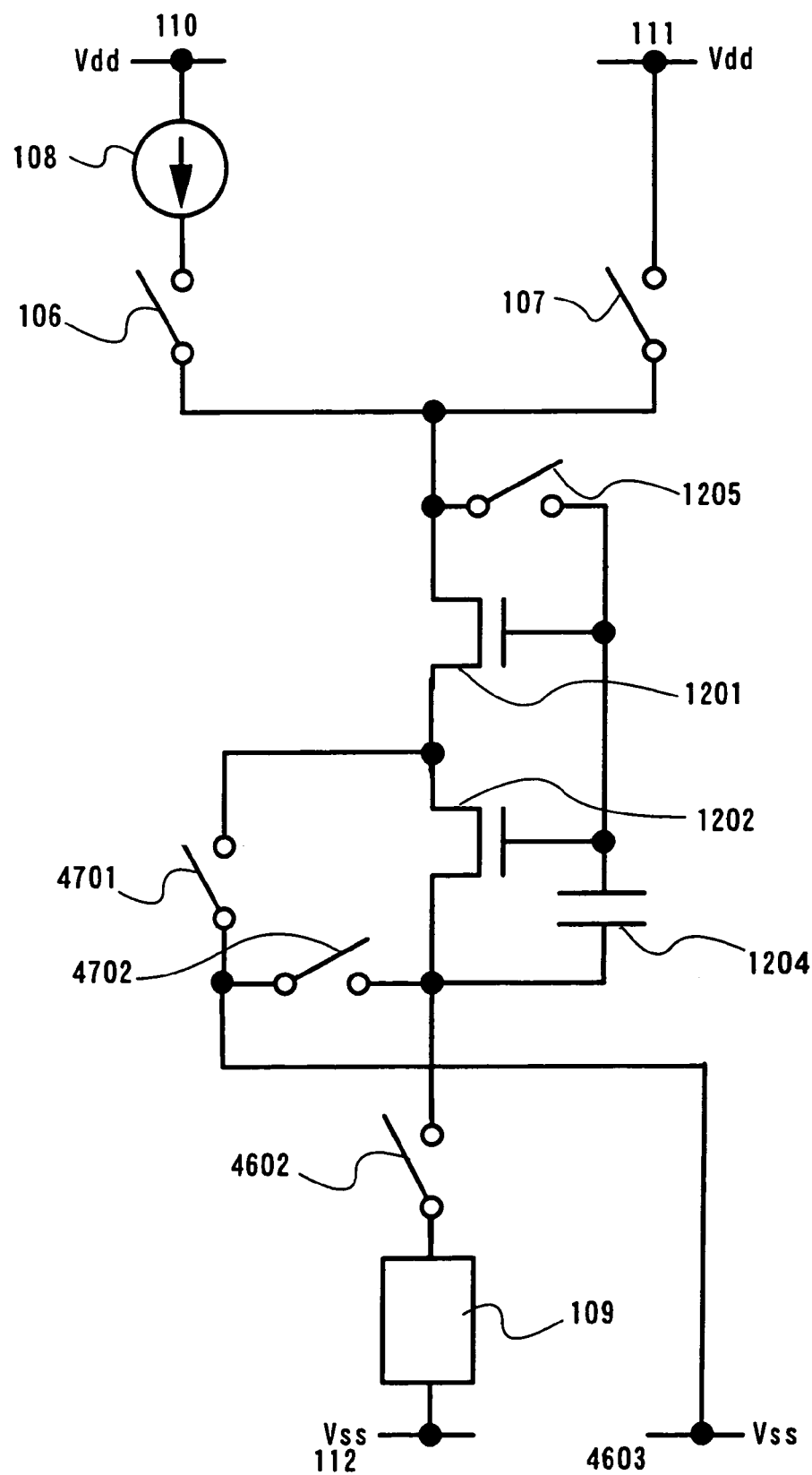
FIG. 47 is a diagram showing a configuration of a current source circuit of the invention.

For example, such switches as 106, 107, 1263, 1205, 4601, and 4602 may be arranged anywhere as long as they can control on/off of current. Alternatively, functions of the switches 1203 and 4601 shown in FIG. 46 may be substituted by switches 4701 and 4702 as shown in FIG. 47. That is to say, in the set operation, the switches 4701 and 4702 are turned on so that the switching transistor 1204 performs the short-circuit operation, thus the current Ib of the reference current source 108 can be discharged to the wiring 4603. In the output operation, the switches 4701 and 4702 are turned off so that the switching transistor 1202 performs the current source operation, thus the current flowing through the current source transistor 1201 does not flow to the wiring 4603.

Figure 48:
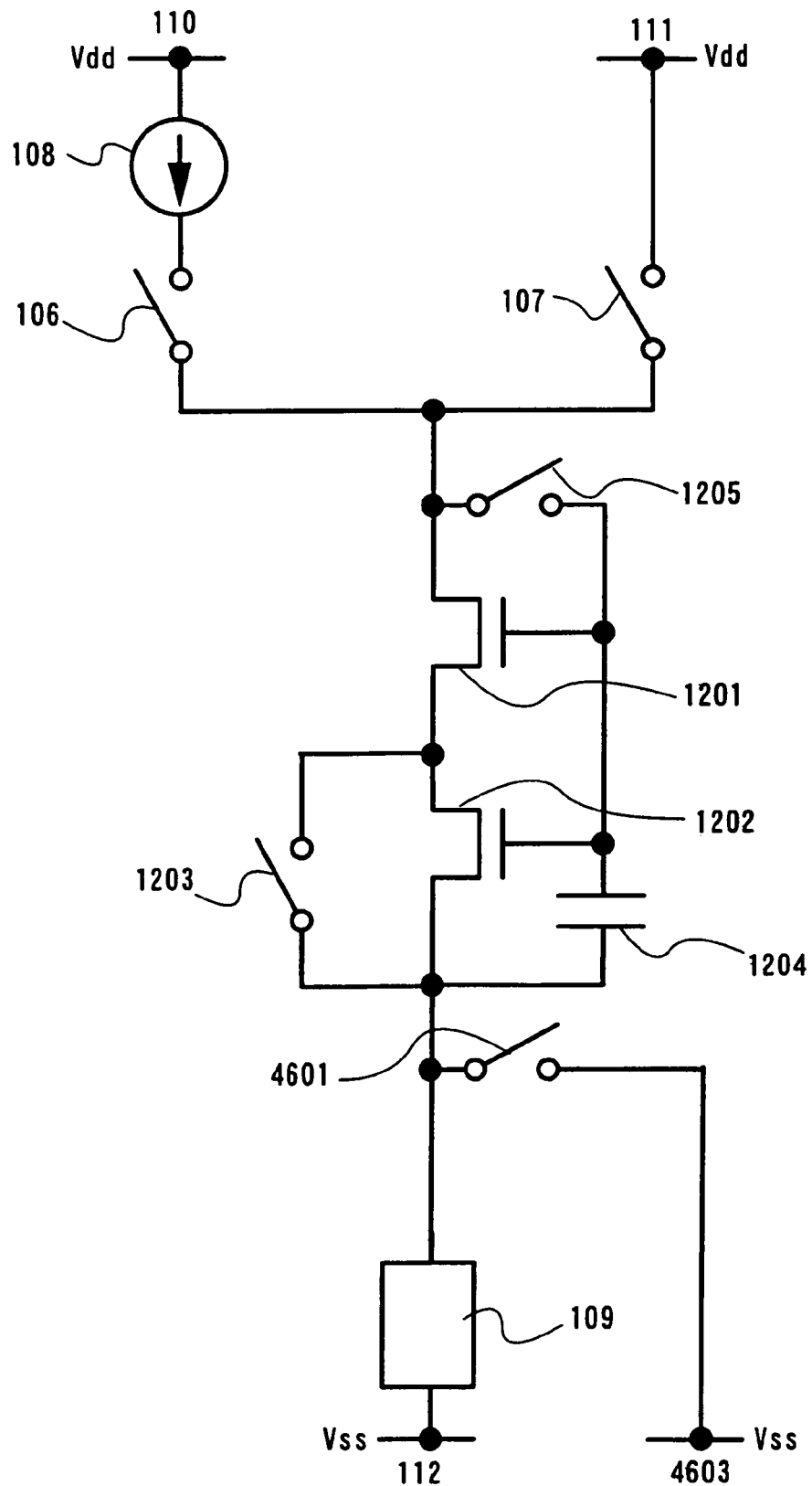
FIG. 48 is a diagram showing a configuration of a current source circuit of the invention.

As shown in FIG. 48, the switch 4602 may not be provided in the configuration of FIG. 46. This is because the load 109 has resistance. When the switch 4601 is turned on, a current flows to the wiring 4603 which has little resistance and does not flow to the load 109 almost at all.

Figure 49:
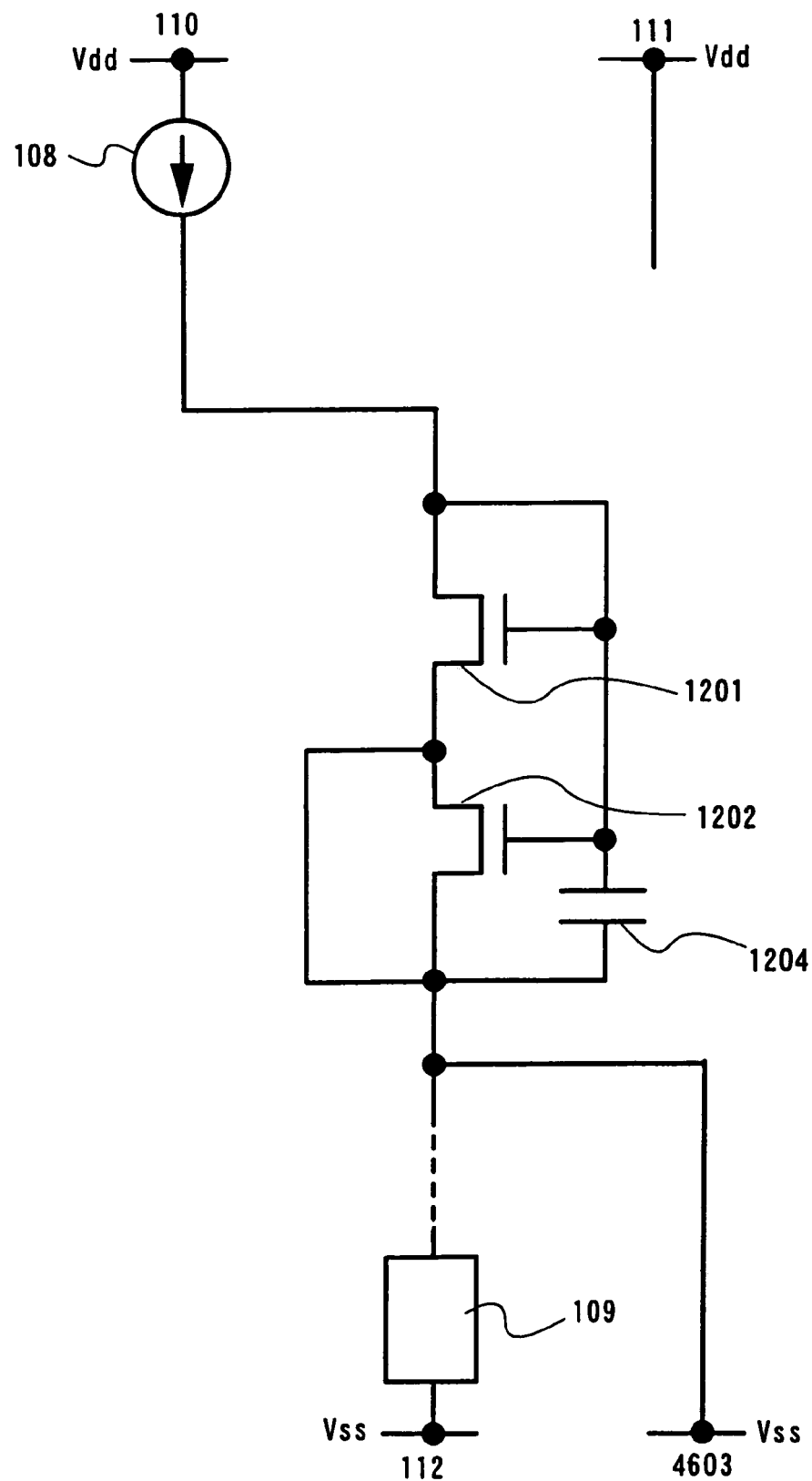
FIG. 49 is a diagram showing connections of a certain operation of a current source circuit of the invention.
Figure 50:
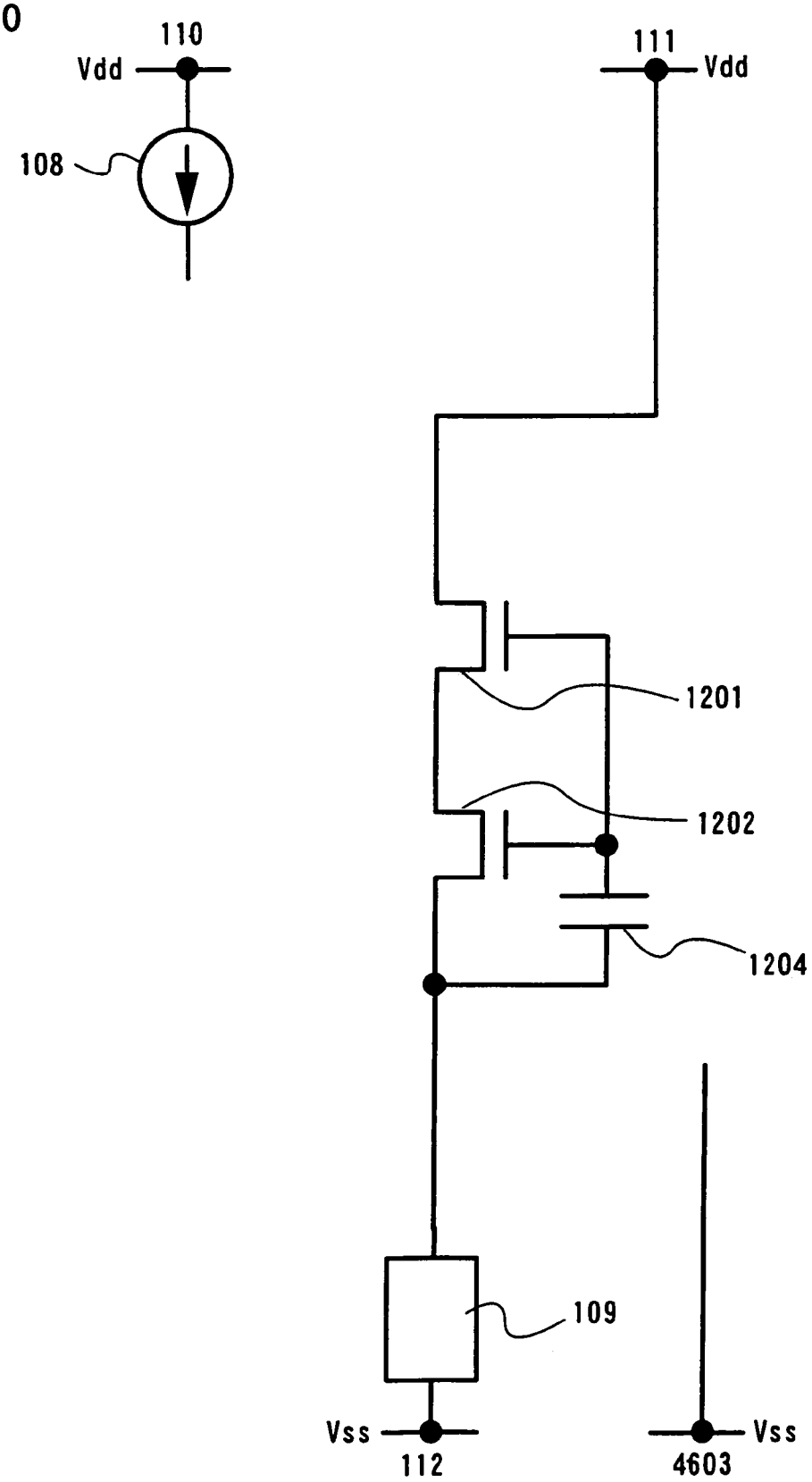
FIG. 50 is a diagram showing connections of a certain operation of a current source circuit of the invention.

That is to say, the switches such as 106, 107, 1203, 1205, 4601, and 4602 may be arranged anywhere or all of these switches may not be provided as long as the elements are connected as shown in FIG. 49 in the set operation and the elements are connected as shown in FIG. 50 in the output operation.

This embodiment mode can be applied to the configuration of FIG. 51 as well. In FIG. 51, a switch 17402 which selects whether to supply a current to the load 109, a wiring 17401 to which a current is discharged, and a switch 17403 which selects whether to discharge a current to the wiring 17401 are provided. That is to say, the switch 17403 is turned on and the switch 17402 is turned off in the set operation, while the switch 17402 is turned on and the switch 17403 is turned off in the output operation. Accordingly, a current can be supplied to the wiring 17401 without being supplied a current to the load 109 in the set operation while a current can be supplied to the load 109 in the output operation. Detailed description which is made in Embodiment Mode 3 is omitted here. Thus, a potential set at the wiring 110 in the set operation does not have to take a voltage drop at the load 109 into consideration. That is to say, a potential lower than the configuration of FIG. 51 can be employed. Therefore, power consumption can be reduced in the configuration of FIG. 174.

In the configuration of FIG. 174, the switch 17402 does not have to be provided. This is because the load 109 has resistance. When the switch 17403 is turned on, a current flows to the wiring 17401 which has little resistance and does not flow to the load 109 almost at all.

The circuit of FIG. 174 may be changed partially. For example, the switch 17402 may be substituted by a multi transistor 17501 as shown in FIG. 175. The switch 5103c is on in the set operation, therefore, a source terminal and a gate terminal of the multi transistor 17501 are short-circuited via the switch 5103c. That is to say, a current does not flow to the multi transistor 17501 as a gate-source voltage thereof becomes approximately 0 V. In the output operation, the switch 5103c is turned off, therefore, a charge accumulated in the set operation is stored in the capacitor 104. The charge is applied to gate terminals of the current source transistor 5101 and the multi transistor 17501. The gate terminals of the current source transistor 5101 and the multi transistor 17501 are connected to each other. As described above, the current source transistor 5101 and the multi transistor 17501 operate as a multi-gate transistor. Therefore, a current can be controlled automatically. Moreover, a current supplied to the load 109 can be small. In the case of FIG. 174, a wiring for controlling the switch 17402 is required for changing the operation between supplying a current to the load 109 in the output operation and stopping current thereto in the set operation, however, a current can be controlled automatically in FIG. 175, therefore, a wiring for the control can be omitted.

Embodiment Mode 5

In this embodiment mode, a configuration in the case where a precharge operation is employed is described.

Figure 59:
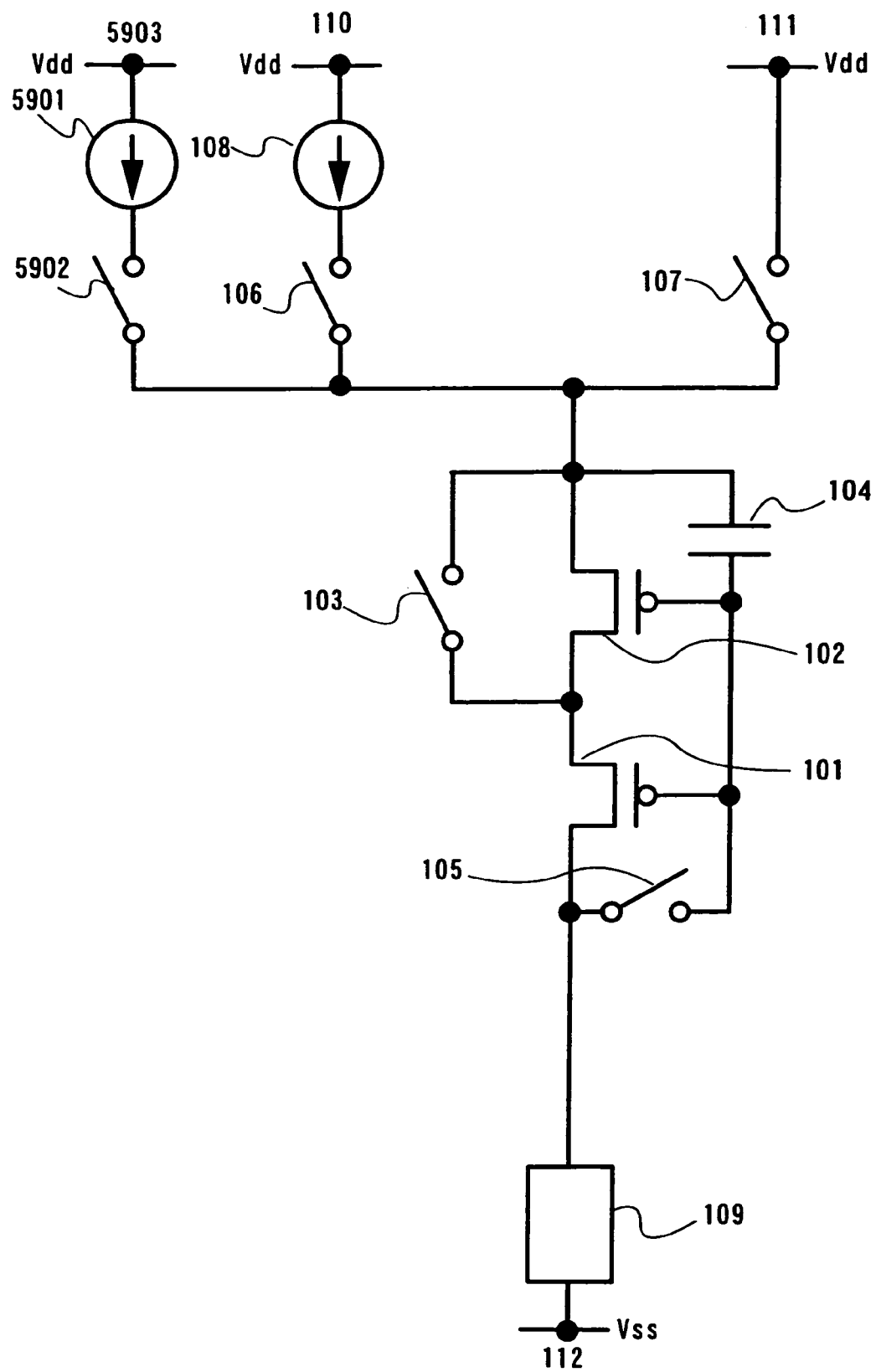
FIG. 59 is a diagram showing a configuration of a current source circuit of the invention.

FIG. 59 shows a configuration of a current source circuit based on a basic principle of the invention. The configuration of FIG. 59 employs a second reference current source 5901 and a switch 5102 in the configuration of FIG. 1. Accordingly, common portions between FIGS. 59 and 1 are denoted by the same reference numerals.

There are the current source transistor 101 which constantly operates as a current source (or a part of it) and the switching transistor 102 of which operation changes according to the circumstance. The current source transistor 101 and the switching transistor 102 are connected in series. The source terminal and the drain terminal of the switching transistor 102 are connected via the switch 103. The gate terminal of the current source transistor 101 and the gate terminal of the switching transistor 102 are connected to one of the terminals of the capacitor 104. The other terminal of the capacitor 104 is connected to the source terminal of the switching transistor 102. The gate terminals of the current source transistor 101 and the switching transistor 102 are connected to the drain terminal of the current source transistor 101 via the switch 105. By turning on/off the switch-105, a charge in the capacitor 104 can be controlled. Therefore, the capacitor 104 can hold the gate-source voltage of the switching transistor 102 or the current source transistor 101. The drain terminal of the current source transistor 101 and the wiring 112 are connected via the load 109. The source terminal of the switching transistor 102 is connected to the wiring 110 via the switch 106 and the reference current source 108, and in parallel to this, connected to the wiring 111 via the switch 107. Similarly, in parallel to the aforementioned, the source terminal of the switching transistor 102 is connected to the wiring 5103 via the switch 5902 and the second reference current source 5901.

The switching transistor 102 is connected to a unit which can switch between the case where the switching transistor 102 operates as a current source (or a part of it) and the case where a current does not flow between the source and drain thereof depending on the case.

Various configurations can be employed for realizing the current source operation and the short-circuit operation of the switching transistor 102.

In this embodiment mode, FIG. 59 shows a configuration as an example. In FIG. 59, the source terminal and the drain terminal of the switching transistor 102 are connected via the switch 103. The gate terminal of the switching transistor 102 is connected to the gate terminal of the current source transistor 101. The operation of the switching transistor 102 can be switched between the current source operation and the short-circuit operation by using the switch 103.

The precharge operation can be performed by using the circuit configuration of FIG. 59. Therefore, the steady state can be obtained rapidly in the set operation after the precharge operation. That is, the set operation can be completed more rapidly.

Figure 60:
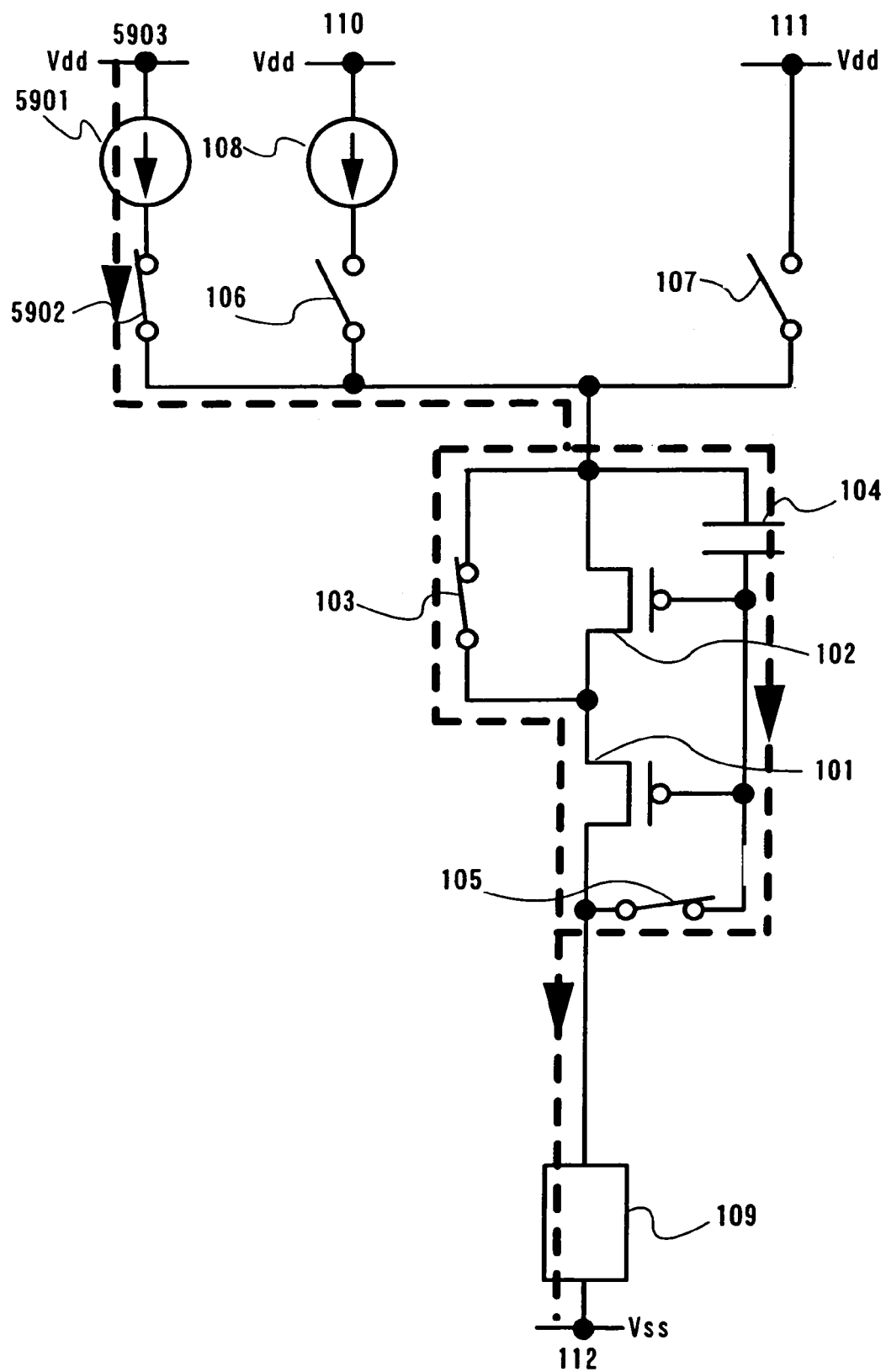
FIG. 60 is a diagram showing an operation of a current source circuit of the invention.

An operation of FIG. 59 is described. As shown in FIG. 60, the switches 103, 105, and 5902 are turned on and the switches 107 and 106 are turned off. Then, the source terminal and the drain terminal of the switching transistor 102 have approximately the same potential. That is to say, hardly any current flows between the source and drain of the switching transistor 102 while a current flows to the switch 103. Therefore, a current Ib2 of the second reference current source 5901 flows to the capacitor 104 or the current source transistor 101. Then, a current stops flowing to the capacitor 104 when the current flowing between the source and drain of the current source transistor 101 and the current Ib2 of the second reference current source 5901 become equal. That is, a steady state is obtained. A potential of the gate terminal at that time is accumulated in the capacitor 104. That is, a voltage required to supply the current Ib2 between the source and drain of the current source transistor 101 is applied between the gate and source thereof. The aforementioned operation corresponds to the precharge operation. At that time, the switching transistor 102 performs the short-circuit operation.

Figure 61:
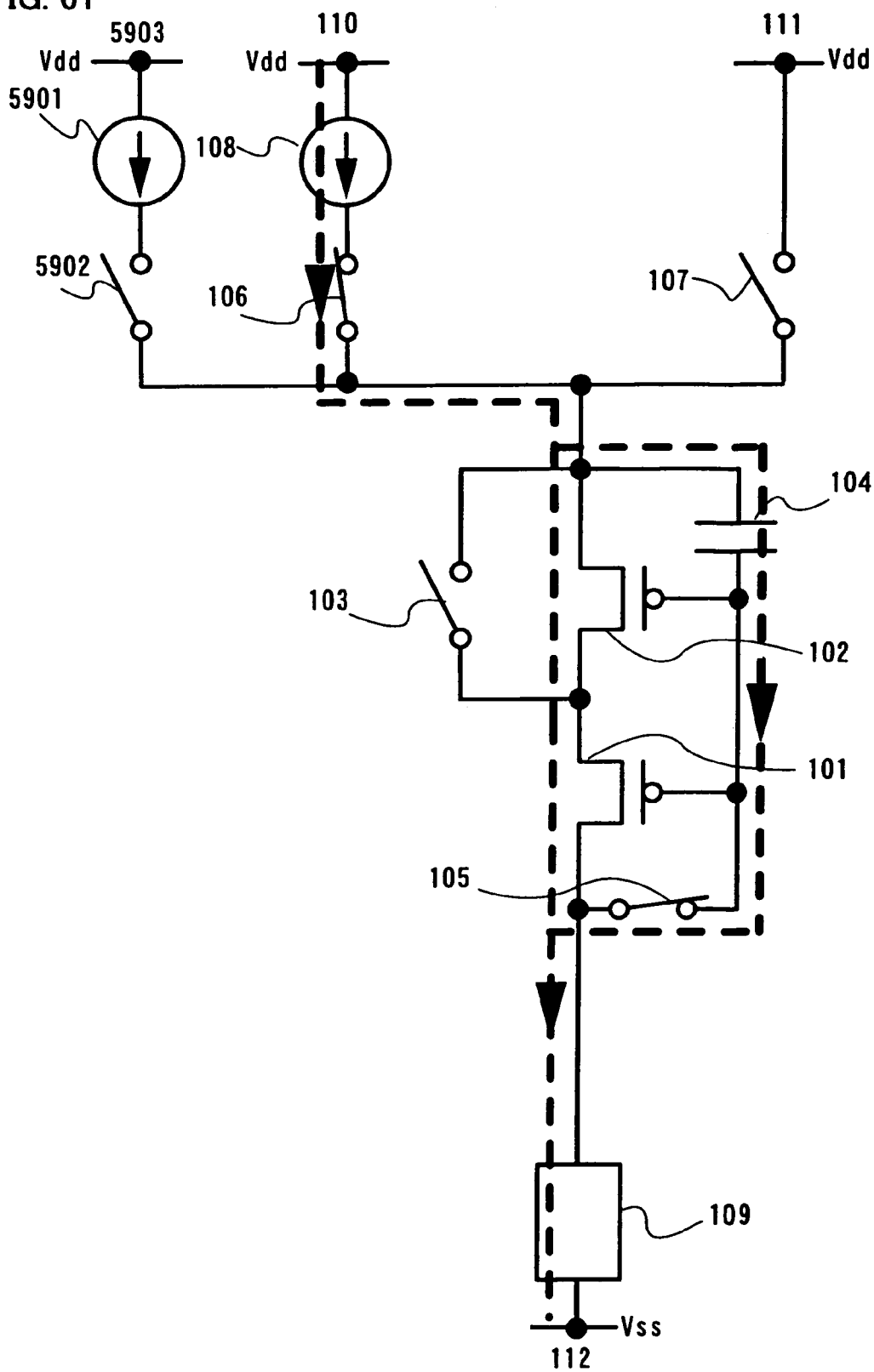
FIG. 61 is a diagram showing an operation of a current source circuit of the invention.

Next, as shown in FIG. 61, the switches 105 and 106 are turned on and the switches 103, 107, and 5102 are turned off. Thus, a current flows between the source and drain of the switching transistor 102 since the switch 103 is off. Accordingly, a current Ib1 of the reference current source 108 flows to the capacitor 104, the current source transistor 101, and the switching transistor 102. At this time, the gate terminals of the current source transistor 101 and the switching transistor 102 are connected to each other. Therefore, these transistors operate together as a multi-gate transistor. Therefore, a gate length L of the multi-gate transistor is longer than L of the current source transistor 101. Generally, as the gate length L of a transistor becomes longer, a current flowing through it becomes smaller.

When the current flowing between the source and drain of the multi-gate transistor and the current Ib1 of the reference current source 108 become equal, a current stops flowing to the capacitor 104. That is, a steady state is obtained. A potential of the gate terminal at that time is accumulated in the capacitor 104. That is, a voltage required to supply the current Ib1 between the source and drain of the multi-gate transistor (the current source transistor 101 and the switching transistor 102) is applied to the gate terminal thereof. The aforementioned operation corresponds to the set operation. At this time, the switching transistor 102 performs the current source operation.

At this time, the current Ib1 of the reference current source 108, the current Ib2 of the second reference current source 5901, transistor sizes of the current source transistor 101 and the switching transistor 102 (gate width W, gate length L, and the like) are set appropriately so that a charge accumulated in the capacitor 104, that is a potential of the gate terminal of the current source transistor 101 becomes approximately the same between the precharge operation and the set operation.

In the case where the current Ib2 of the second reference current source 5901 is larger than the current Ib1 of the reference current source 108, the capacitor 104 can be charged rapidly in the precharge operation, thus a steady state can be obtained. In the set operation after that, the steady state can be rapidly obtained even when the current Ib1 of the reference current source 108 is small. This is because the capacitor 104 is almost charged by the precharge operation.

Figure 62:
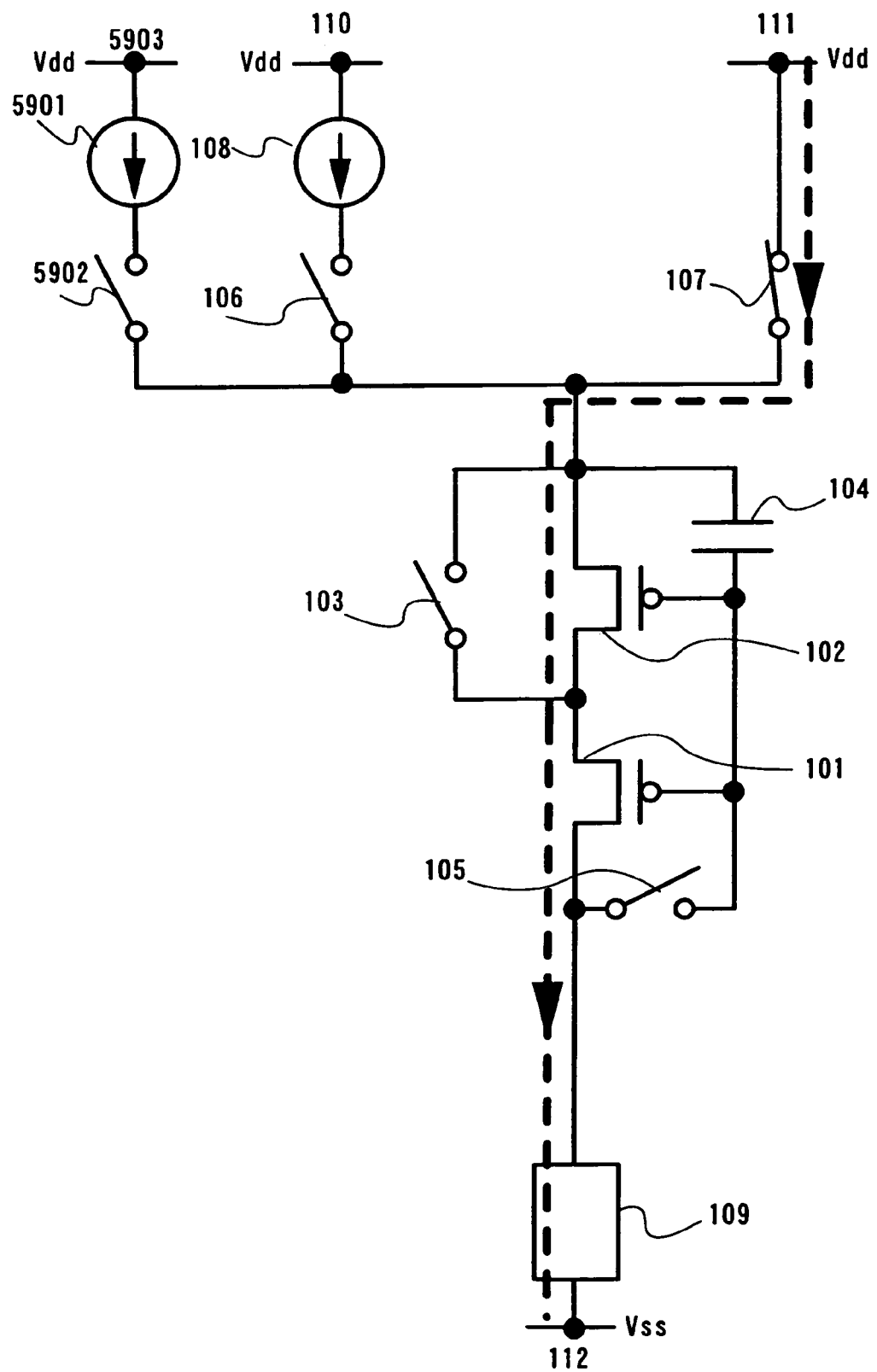
FIG. 62 is a diagram showing an operation of a current source circuit of the invention.

As shown in FIG. 62, the switches 103, 105, 106, and 5902 are turned off and the switch 107 is turned on. Then, the switching transistor 102 and the current source transistor 101 operate as a multi-gate transistor since the switch 105 is off. A gate-source voltage high enough to flow the current of Ib1 is held in the capacitor 104, therefore, a current of 1b can be supplied to the load 109. The aforementioned operation corresponds to the output operation.

In this manner, by controlling on/off of the switch 103, a current flowing in the precharge operation can be made large, thus a steady state can be rapidly obtained. That is to say, an effect of a load which is parasitic on a wiring through which a current flows (wiring resistance, intersection capacitance and the like) is lessened and the steady state can be obtained rapidly. At that time, the steady state close to that in the set operation is obtained. Therefore, the steady state can be obtained rapidly in the set operation after the precharge operation.

Therefore, in the case where the load 109 is an EL element, a signal can be written rapidly in the case where the EL element emits light at a low gray scale level, which is the case where a current value is small in the set operation.

FIGS. 173A and 173B show changes of current and voltage in the aforementioned operation respectively. In FIGS. 173A and 173B, the lateral axis represents time while the longitudinal axis represents current (I) and voltage (V) similarly to FIGS. 172D and 172E. A graph 17301 represents the amount of current I1 which flows to the capacitor 104 and the like while a graph 17302 represents the amount of current I2 which flows to the current source transistor 101. The circuit operates as shown in FIG. 60 up to time T1$b$ in which a precharge operation is performed. From the time T1$b$ to T2$b$, the circuit operates as shown in FIG. 61 in which the set operation is performed.

In FIGS. 173A and 173B, the steady state is obtained in the time T2$a$ in which the precharge operation is performed. In the set operation, the steady state is obtained in the time T2$b$. Therefore, the set operation can be performed rapidly as long as the size (gate width W and gate length L) of each transistor is designed so that a potential of the gate terminal of the current source transistor 101 in the time T2$a$ becomes approximately equal to that in the time T2$b$.

A condition required for a voltage accumulated in the capacitor 104, that is a potential of the gate terminal of the current source transistor 101 to be approximately equal between the precharge operation and the set operation is described. First, a gate width and a gate length of the current source transistor 101 are set Wa and La respectively while a gate width and a gate length of the switching transistor 102 are set Wb and Lb respectively. It is to be noted that Wa=Wb is satisfied here for simplicity. A current which flows in the set operation (the current Ib1 of the reference current source 108 in FIG. 61) times A equals to a current which flows in the precharge operation (the current Ib2 of the second reference current source 5901 in FIG. 60).

Generally, a current which flows between a source and a drain of a transistor is proportion to a ratio of a channel width W to a channel length L: W/L. Therefore, a relationship between a ratio of a gate width to a gate length in the precharge operation: Wa/La and a ratio of a gate width to a gate length in the set operation: Wa/(La+Lb) is to be considered. Each value is preferably set so that Wa/(La+Lb) times A equals Wa/La since the current Ib1 of the reference current source 108 times A equals the current Ib2 of the second reference current source 5901. Accordingly, provided that current characteristics of the current source transistor 101 and the switching transistor 102 are approximately the same, a potential of the gate terminal of the current source transistor 101 in the time T2$a$ becomes approximately equal to that in the time T2$b$. In FIG. 173B, the potential of the gate terminal of the current source transistor 101 in the time T2$a$ is shown to be different than that in the time T2$b$, however, this is shown only for simplifying the description. Therefore, the invention is not limited to FIG. 173B.

Figure 63:
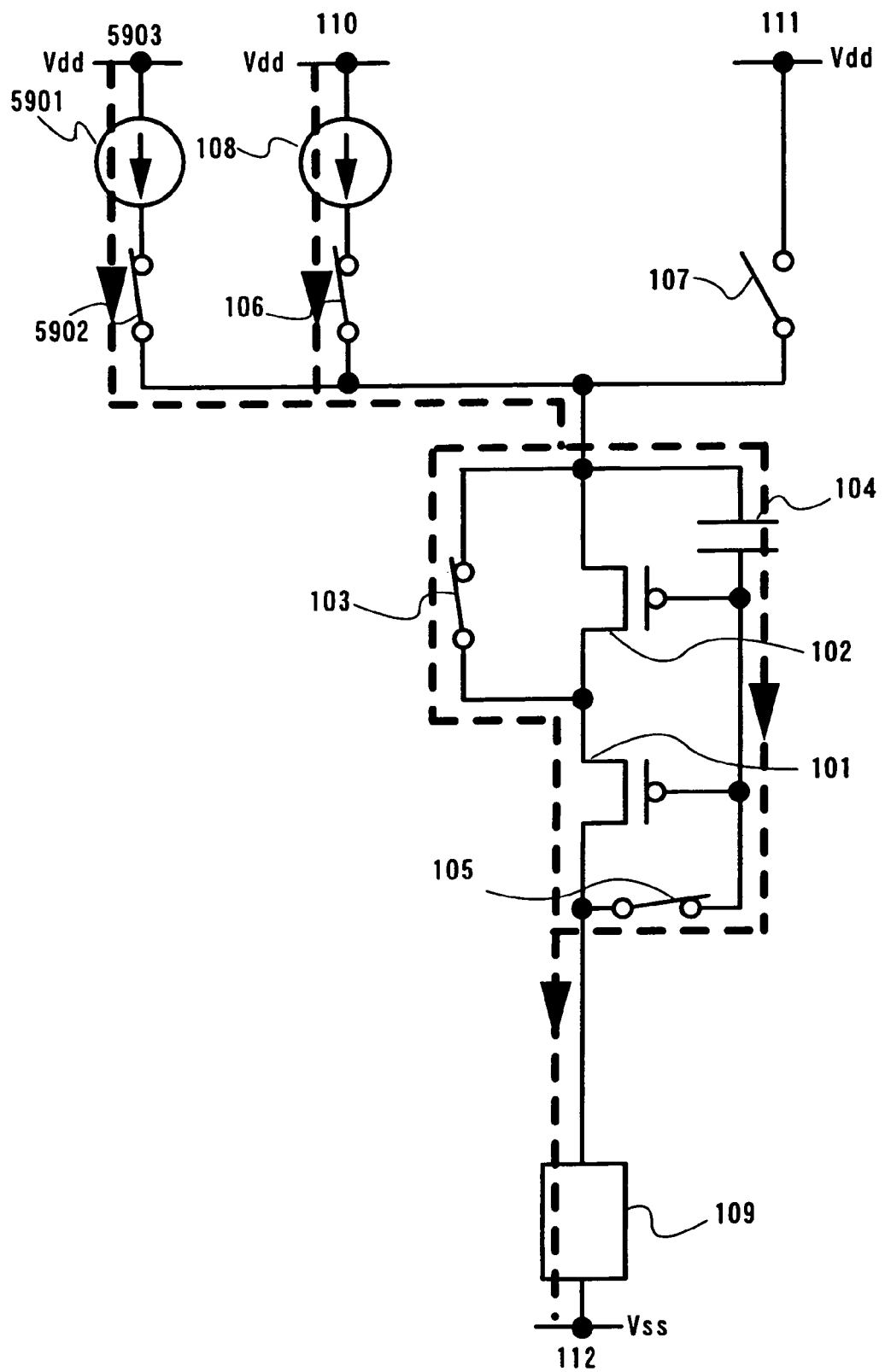
FIG. 63 is a diagram showing an operation of a current source circuit of the invention.

In the precharge operation, in FIG. 60, the switches 103, 105, and 5902 are turned on and the switches 107 and 106 are turned off. Thus, a current of the second reference current source 5901 flows while a current of the reference current source 108 does not flow, however, the invention is not limited to this. For example, the switches 103, 105, 5902, and 106 are turned on and the switch 107 is turned off as shown in FIG. 63 so that the currents of the second reference current source 5902 and the reference current source 108 flow.

In FIG. 59, two switches and two current sources which are the second reference current source 5102 and the reference current source 108 are used for controlling whether to supply each current in order to change the amount of current between in the precharge operation and in the set operation, however, the invention is not limited to this. For example, the amount of current may be controlled by using only the reference current source 108 without providing the switch 106 as shown in FIG. 1. In this case, however, the amount of current of the reference current source 108 is different between the precharge operation and the set operation.

It is to be noted that the load 109 may be anything such as a resistor, a transistor, an EL element, other light emitting elements, and a current source circuit configured of a transistor, a capacitor, a switch and the like. The load 109 may be a signal line or a signal line and a pixel connected thereto. The pixel may include any display elements such as an EL element and an element used for an FED. It is to be noted that the capacitor 104 can be substituted by gate capacitance of the current source transistor 101, the switching transistor 102 and the like. In that case, the capacitor 104 can be omitted.

The wirings 110, 111, and 5903 are supplied with a high potential power source Vdd, however, the invention is not limited to this. Each wiring may be the same potential of different potentials. The wiring 111 is only required to store a charge of the capacitor 104. The wiring 110 or 111 is not required to keep the same potential at all times. The wiring 110 or 111 may have different potentials between the set operation and the output operation as long as a normal operation can be obtained.

The wiring 112 is supplied with a low potential power source Vss, however, the invention is not limited to this. The wiring 112 is not required to keep the same potential at all times. The wiring 112 may have different potentials between the set operation and the output operation as long as a normal operation can be obtained.

The capacitor 104 is connected to the gate terminal of the current source transistor 101 and the wiring 111, however, the invention is not limited to this. It is most preferable that the capacitor 104 be connected to the gate terminal and source terminal of the current source transistor 101. This is because an operation of the transistor is determined by its gate-source voltage, therefore, it is unlikely to be affected by other effects (such as a voltage drop due to wiring resistance and the like) when a voltage is held between the gate terminal and the source terminal thereof. Provided that the capacitor 104 is provided between the gate terminal of the current source transistor 101 and another wiring, a potential of the gate terminal of the current source transistor 101 may be changed due to a voltage drop at the another wiring.

In the current source operation, the current source transistor 101 and the switching transistor 102 operate as a multi-gate transistor, therefore, it is preferable that these transistors have the same polarity (conductivity).

Although the current source transistor 101 and the switching transistor 102 operate as a multi-gate transistor in the current source operation, a gate width W of each transistor may be the same or different. Similarly, a gate length L thereof may be the same or different. The gate width W, however, is preferably the same as it can be considered to be the same as a normal multi-gate transistor. By designing the gate length L of the switching transistor 102 longer, a current which flows in the set operation and the output operation becomes smaller. Therefore, the gate width and length may be designed according to the circumstance.

Note that the switches such as 103, 105, 106, 107, and 5902 may be any switches such as an electrical switch and a mechanical switch as long as it can control current flow. It may be a transistor, a diode, or a logic circuit configured with them. Therefore, in the case of applying a transistor as a switch, polarity thereof (conductivity) is not particularly limited because it operates just as a switch. However, when an off current is preferred to be small, a transistor of polarity with a small off current is favorably used. For example, the transistor provided with an LDD region has a small off current. Further, it is desirable that an n-channel transistor is employed when a potential of a source terminal of the transistor as a switch is closer to the potential of the low potential side power source (Vss, Vgnd, 0V and the like), and a p-channel transistor be employed when the potential of the source terminal is closer to the potential of the high potential side power source (Vdd and the like). This helps the switch operate efficiently as the absolute value of the voltage between the gate and drain of the transistor can be increased. It is also to be noted that a CMOS switch can be also applied by using both n-charnel and p-channel transistors.

FIG. 59 shows a circuit of the invention, however, the invention is not limited to this. By changing the number and arrangement of switches, the polarity of each transistor, the number and arrangement of the current source transistor 101 and the switching transistor 102, a potential of each wiring, a direction of current flow and the like, various circuits can be configured. By using each change in combination, various circuits can be configured.

For example, such switches as 103, 105, and 107 may be arranged anywhere as long as they can control on/off of current. In specific, the switch 107 which controls a current supplied to the load 109 is only required to be connected in series thereto.

Similarly, the switches 106 and 5902 which control the current of the reference current source 108 and the second reference current source 5901 are only required to be arranged in series to thereto. The switch 103 which controls a current supplied to the switching transistor 102 is required to be arranged in parallel to the switching transistor 102. The switch 105 is required to be arranged so as to control a charge in the capacitor 104.

Figure 64:
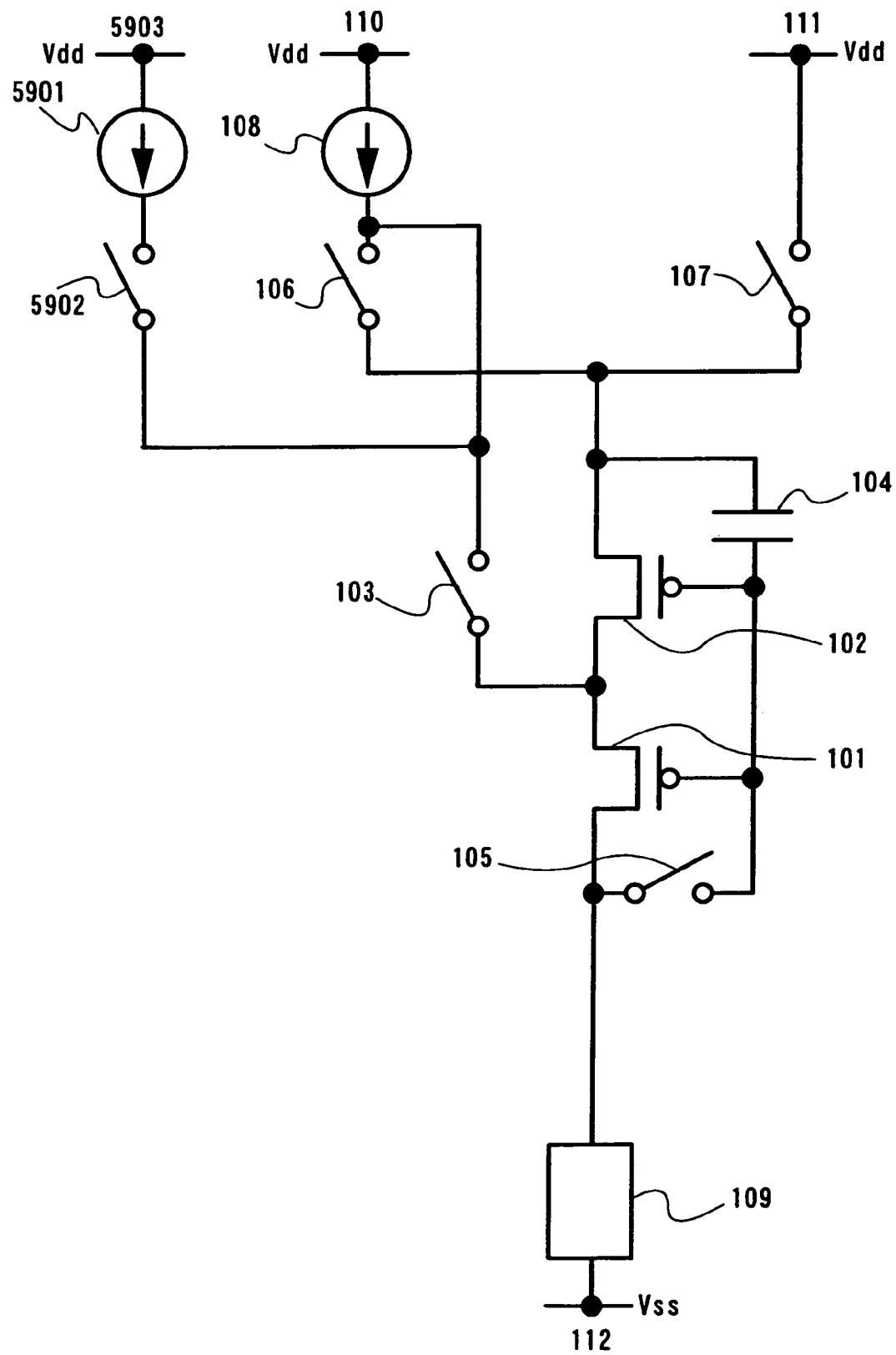
FIG. 64 is a diagram showing a configuration of a current source circuit of the invention.

FIG. 64 shows an example of changing connections of the switches 103 and 5902. One terminal of the switch 103 is connected to the source terminal of the current source transistor 101 while the other terminal thereof is connected to the wiring 110 via the reference current source 108 and to a wiring 5903 via the second reference current source 5901. The switches 5902 and 103 control a current of the second reference current source 108. A switch 6403 controls a current of the second reference current source 108. The switching transistor 102 performs the short-circuit operation by using the switches 106 and 103.

An operation of FIG. 64 is described. First, as shown in FIG. 145, the switches 5902, 103, 106, and 105 are turned on and the switch 107 is turned off. Then, the source terminal and the drain terminal of the switching transistor 102 have approximately the same potential. That is to say, hardly any current flows between the source and drain of the switching transistor 102 while a current flows to the switch 103. Therefore, the current Ib2 of the second reference current source 5901 and the current Ib1 of the reference current source 108 flow to the capacitor 104 or the current source transistor 101. Then, the current stops flowing to the capacitor 104 when the current flowing between the source and drain of the current source transistor 101 and a sum of the current Ib2 of the second reference current source 5901 and the current Ib1 of the reference current source 108 become equal. That is, a steady state is obtained. A potential of the gate terminal at that time is accumulated in the capacitor 104. That is, a voltage required to supply the current Ib2+Ib1 between the source and drain of the current source transistor 101 is applied to the gate terminal thereof. The aforementioned operation corresponds to the precharge operation. At that time, the switching transistor 102 performs the short-circuit operation.

Next, as shown in FIG. 146, the switches 106 and 105 are turned on and the switches 5902, 103, and 107 are turned off. Thus, a current flows between the source and drain of the switching transistor 102 as the switch 103 is off. Accordingly, a current Ib1 of the reference current source 108 flows to the capacitor 104, the current source transistor 101, and the switching transistor 102. At this time, the gate terminals of the current source transistor 101 and the switching transistor 102 are connected to each other. Therefore, these transistors operate as a multi-gate transistor together. Therefore, a gate length L of the multi-gate transistor is longer than L of the current source transistor 101. Generally, as the gate length L of a transistor becomes longer, a current flowing through it becomes smaller.

When the current flowing between the source and drain of the multi-gate transistor and the current Ib1 of the reference current source 108 become equal, a current stops flowing to the capacitor 104. That is, a steady state is obtained. A potential of the gate terminal at that time is accumulated in the capacitor 104. That is, a voltage required to supply the current Ib1 between the source and drain of the multi-gate transistor (the current source transistor 101 and the switching transistor 102) is applied to the gate terminal thereof. The aforementioned operation corresponds to the set operation. At this time, the switching transistor 102 performs the current source operation.

At this time, the current Ib1 of the reference current source 108, the current Ib2 of the second reference current source 5901, transistor sizes of the current source transistor 101 and the switching transistor 102 (gate width W, gate length L, and the like) are set appropriately so that a charge accumulated in the capacitor 104, that is a potential of the gate terminal of the current source transistor 101 becomes approximately the same between the precharge operation and the set operation.

In the case where the current Ib2 of the second reference current source 5901 is larger than the current Ib1 of the reference current source 108, the capacitor 104 can be charged rapidly in the precharge operation, thus a steady state can be obtained. In the set operation after that, the steady state can be rapidly obtained even when the current Ib1 of the reference current source 108 is small. This is because the capacitor 104 is almost charged by the precharge operation.

As shown in FIG. 147, the switches 5902, 103, 106, and 105 are turned off and the switch 107 is turned on. Then, the switching transistor 102 and the current source transistor 101 operate as a multi-gate transistor as the switch 105 is off. A gate-source voltage high enough to supply the current Ib1 is held in the capacitor 104, therefore, the current Ib can be supplied to the load 109. The aforementioned operation corresponds to the output operation.

In this manner, by controlling on/off of the switch 103, a current flowing in the precharge operation can be made large, thus a steady state can be rapidly obtained. That is to say, an effect of a load which is parasitic on a wiring through which a current flows (wiring resistance, intersection capacitance and the like) is lessened and the steady state can be obtained rapidly. At that time, the steady state close to that in the set operation is obtained. Therefore, the steady state can be obtained rapidly in the set operation after the precharge operation.

Therefore, in the case where the load 109 is an EL element, a signal can be written rapidly in the case where the EL element emits light at a low gray scale level, which is the case where a current value is small in the set operation.

Figure 65:
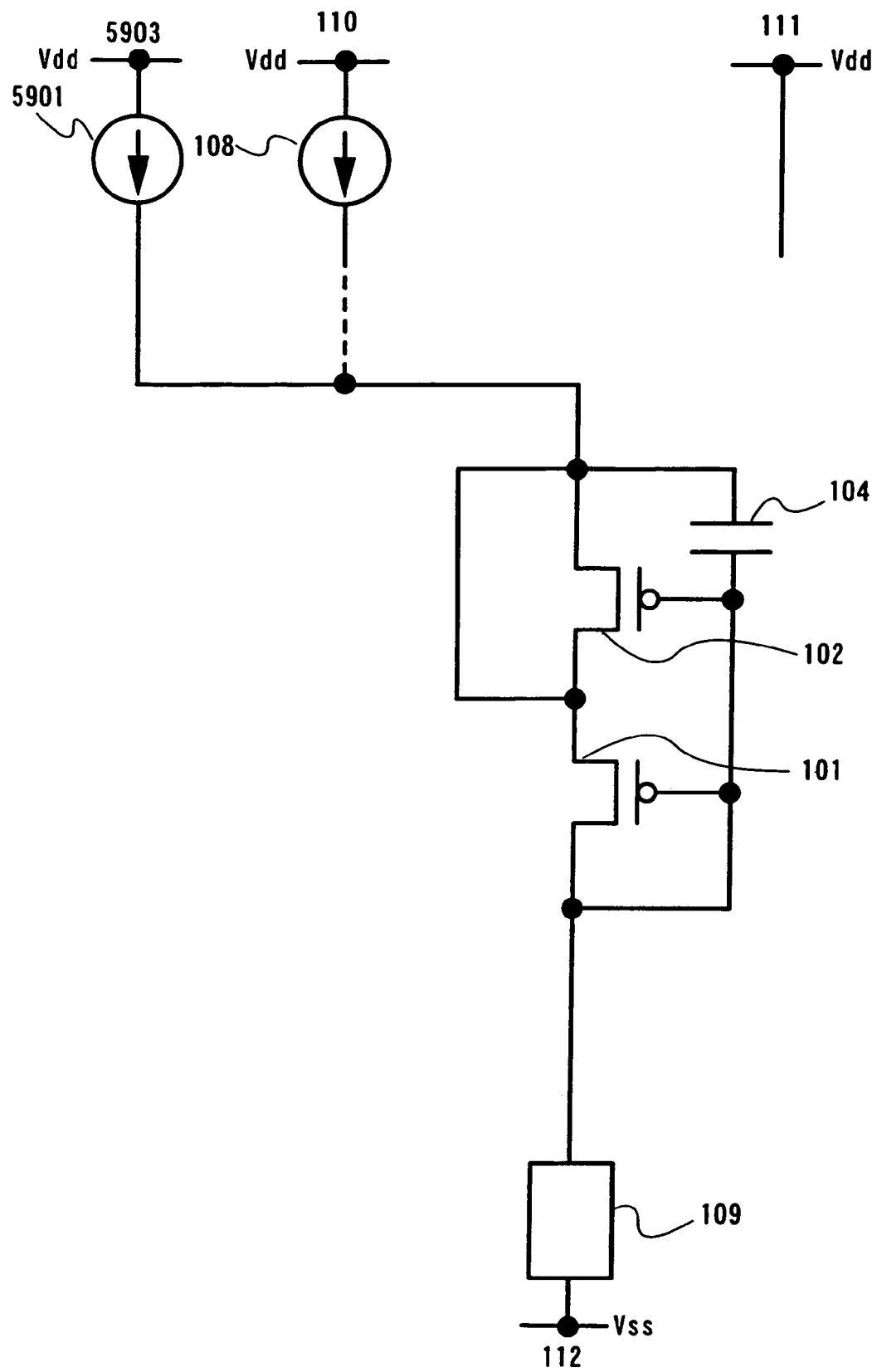
FIG. 65 is a diagram showing connections of a certain operation of a current source circuit of the invention.
Figure 66:
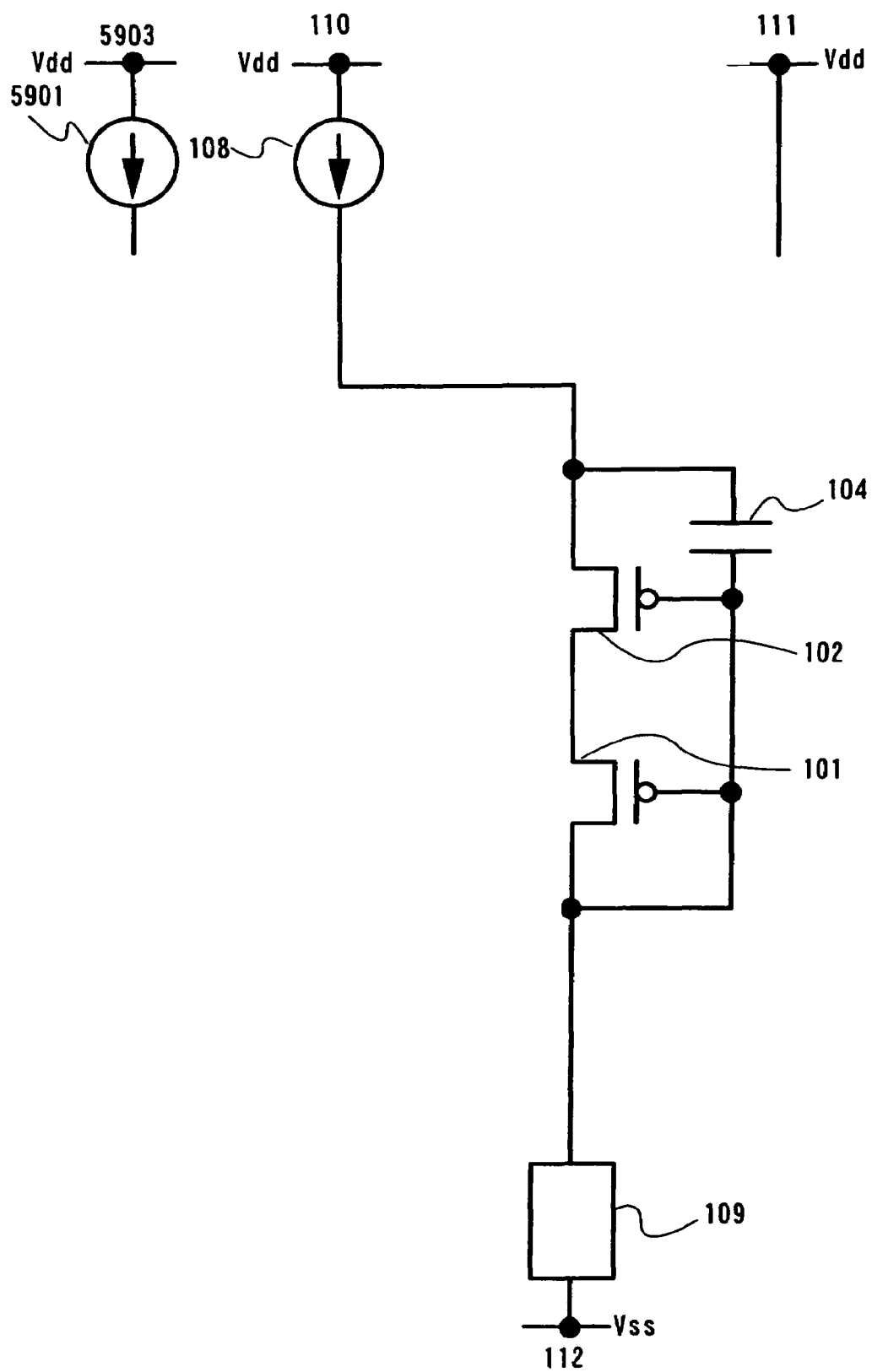
FIG. 66 is a diagram showing connections of a certain operation of a current source circuit of the invention.
Figure 67:
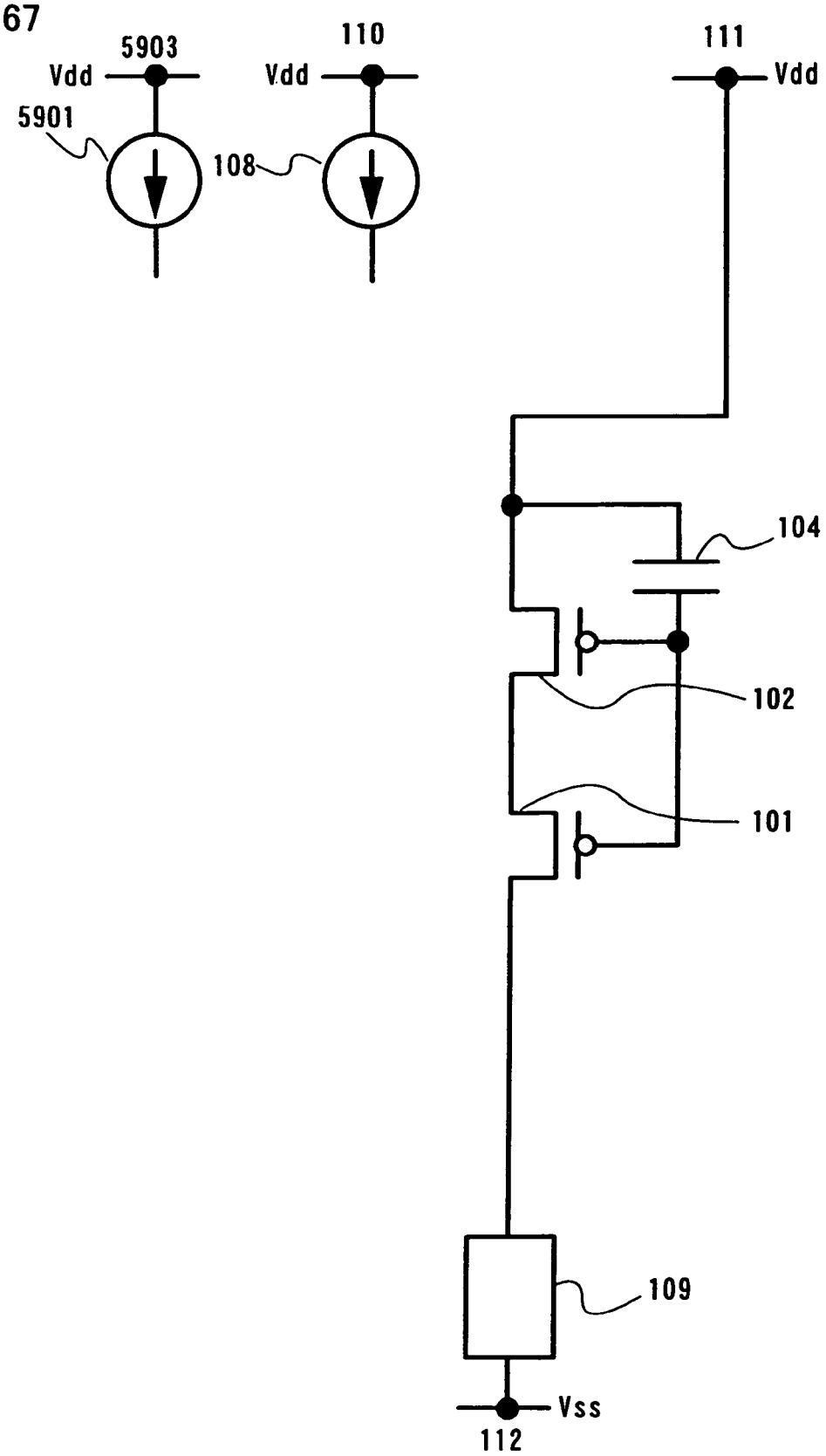
FIG. 67 is a diagram showing connections of a certain operation of a current source circuit of the invention.

In the precharge operation, it is only required that the elements are connected as shown in FIG. 65, elements are connected as shown in FIG. 66 in the reference current source set operation, the current Ib of the second reference current source 6401 flows to the current source transistor 101, and the switching transistor 102 performs the short-circuit operation. Note that the reference current source 108 may be connected as well. Therefore, a wiring is shown by a dotted line in FIG. 65. In the set operation, it is only required that the elements are connected as shown in FIG. 66, the switching transistor 102 performs the current source operation, and the current Ib1 of the reference current source 108 flows to the switching transistor 102 and the current source transistor 101. In the output operation, such switches as 5902, 106, 107, 103, and 105 may be arranged anywhere as long as the elements are connected as shown in FIG. 67 in which a gate potential of the switching transistor 102 and the current source transistor 101 is held in the capacitor 104, the switching transistor 102 performs the current source operation, and a current which flows through the switching transistor 102 and the current source transistor 101 flows to the load 109.

Figure 68:
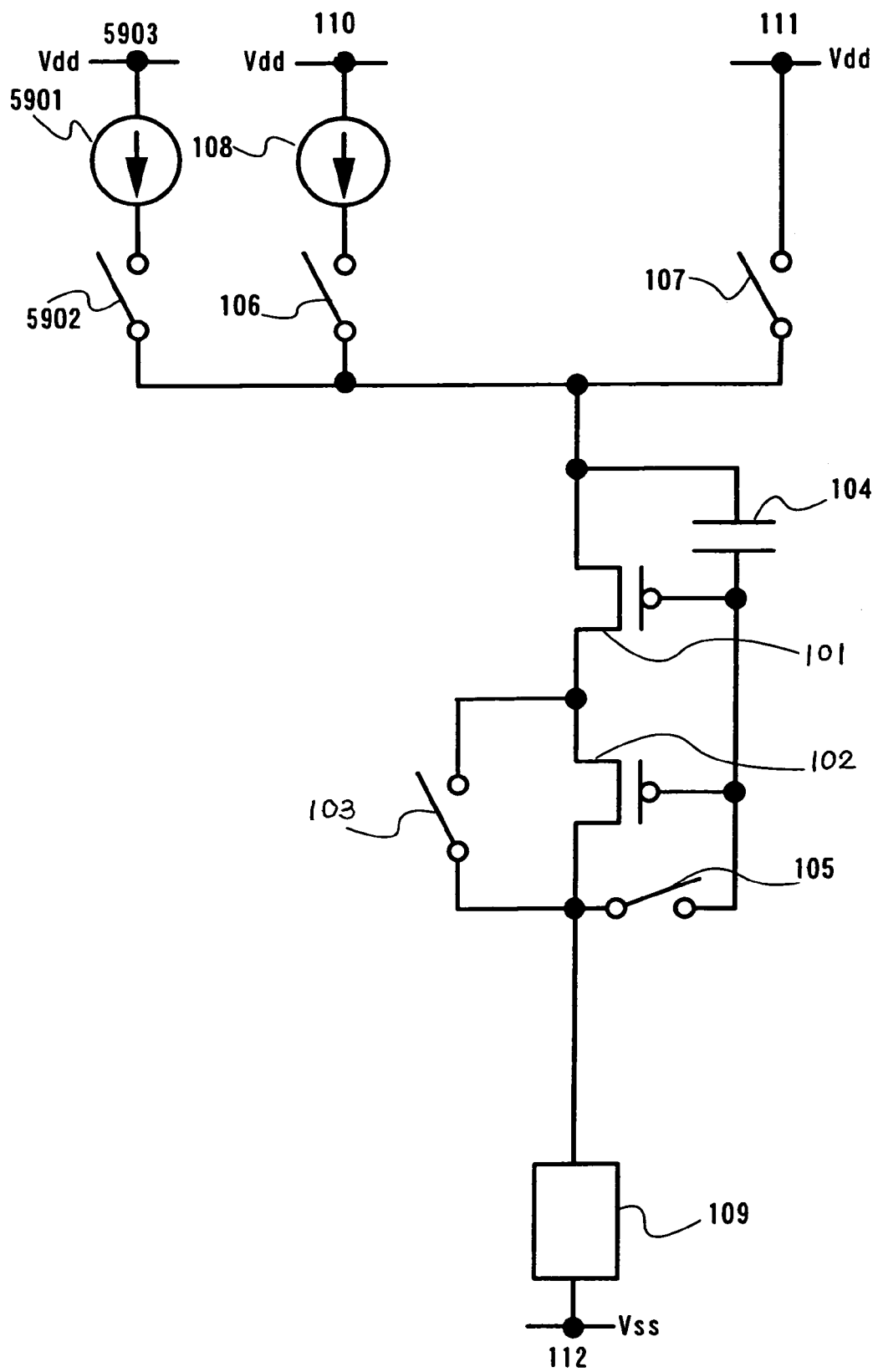
FIG. 68 is a diagram showing a configuration of a current source circuit of the invention.

Next, FIG. 68 shows the case of interchanging the arrangements of the current source transistor 101 and the switching transistor 102. In FIG. 59, the wiring 110, the switching transistor 102, and the current source transistor 101 are arranged in this order, however, the switching transistor 6802, the current source transistor 6801, and the load 109 are arranged in this order in FIG. 68.

Here, circuits in FIGS. 59 and 68 are compared. In FIG. 59, when the switching transistor 102 performs the short-circuit operation, a potential difference generates between the gate terminal and the source terminal (drain terminal) of the switching transistor 102. Therefore, a charge is stored in gate capacitance of the switching transistor 102. In the current source operation as well, a charge is still stored in the gate capacitance. Accordingly, a potential of the gate terminal of the current source transistor 101 hardly changes between the short-circuit operation (precharge operation) and the current source operation (set operation).

On the other hand, in FIG. 68, when the switching transistor 102 performs the short-circuit operation, hardly any potential difference generates between the gate terminal and source terminal (drain terminal) of the switching transistor 102. Therefore, a charge is not stored in the gate capacitance of the switching transistor 102. In the current source operation, the switch 103 is turned off and a charge is accumulated in the gate capacitance. Thus, the switching transistor 102 operates as a part of the current source. The charge at this time is accumulated in the capacitor 104 and gate capacitance of the current source transistor 101. The charge moves to a gate portion of the switching transistor 102. Accordingly, a potential of the gate terminal of the current source transistor 101 changes by the charge which is moved between the short-circuit operation (precharge operation) and the current source operation (set operation). As a result, an absolute value of a gate-source voltage of the current source transistor 101 and the switching transistor 102 becomes small in the set operation.

In view of the aforementioned, the arrangements of the current source transistor 101 and the switching transistor 102 may be designed depending on the circumstances. That is, in the case where an absolute value of a gate-source voltage of the multi-gate transistor (the current source transistor 101 and the switching transistor 102) is preferably small, for example, when the precharge operation changes into the set operation, the configuration of FIG. 68 is preferably applied.

As an example of the aforementioned case, there is a case where a current of the reference current source 108 in the set operation is small. In FIG. 68, time until the steady state is to be obtained can be shortened in some cases. That is, in the case where a current of the reference current source 108 is small in the set operation, a charge in the capacitor 104 is sometimes required to be discharged to the current source transistor 101 and the switching transistor 102 instead of charging the capacitor 104. In that case, as the current of the reference current source 108 in the set operation is small, an absolute value of the gate-source voltage of each of the current source transistor 101 and the switching transistor 102 is small. Therefore, a current does not easily flow through the current source transistor 101 and the switching transistor 102. As a result, it takes a long time until a steady state is obtained by discharging the charge in the capacitor 104. In FIG. 68, when the current source transistor 101 and the switching transistor 102 operate as a multi-gate transistor when the precharge operation changes into the set operation, an absolute value of the gate-source voltage thereof become small. Thus, the capacitor 104 is charged instead of discharging the charge in the capacitor 104, thereby an absolute value of the gate-source voltage becomes large and the steady state can be obtained.

Figure 69:
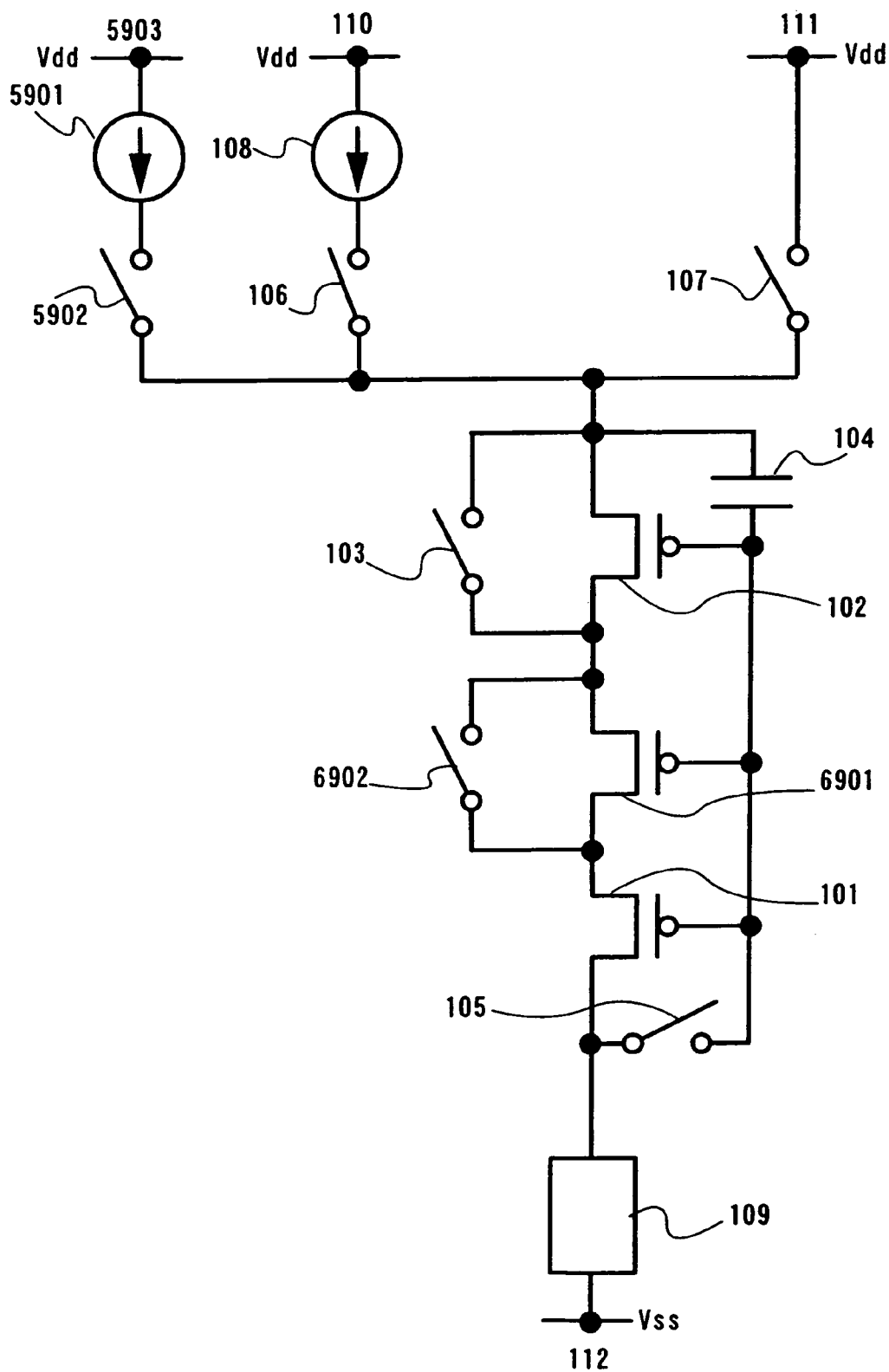
FIG. 69 is a diagram showing a configuration of a current source circuit of the invention.
Figure 70:
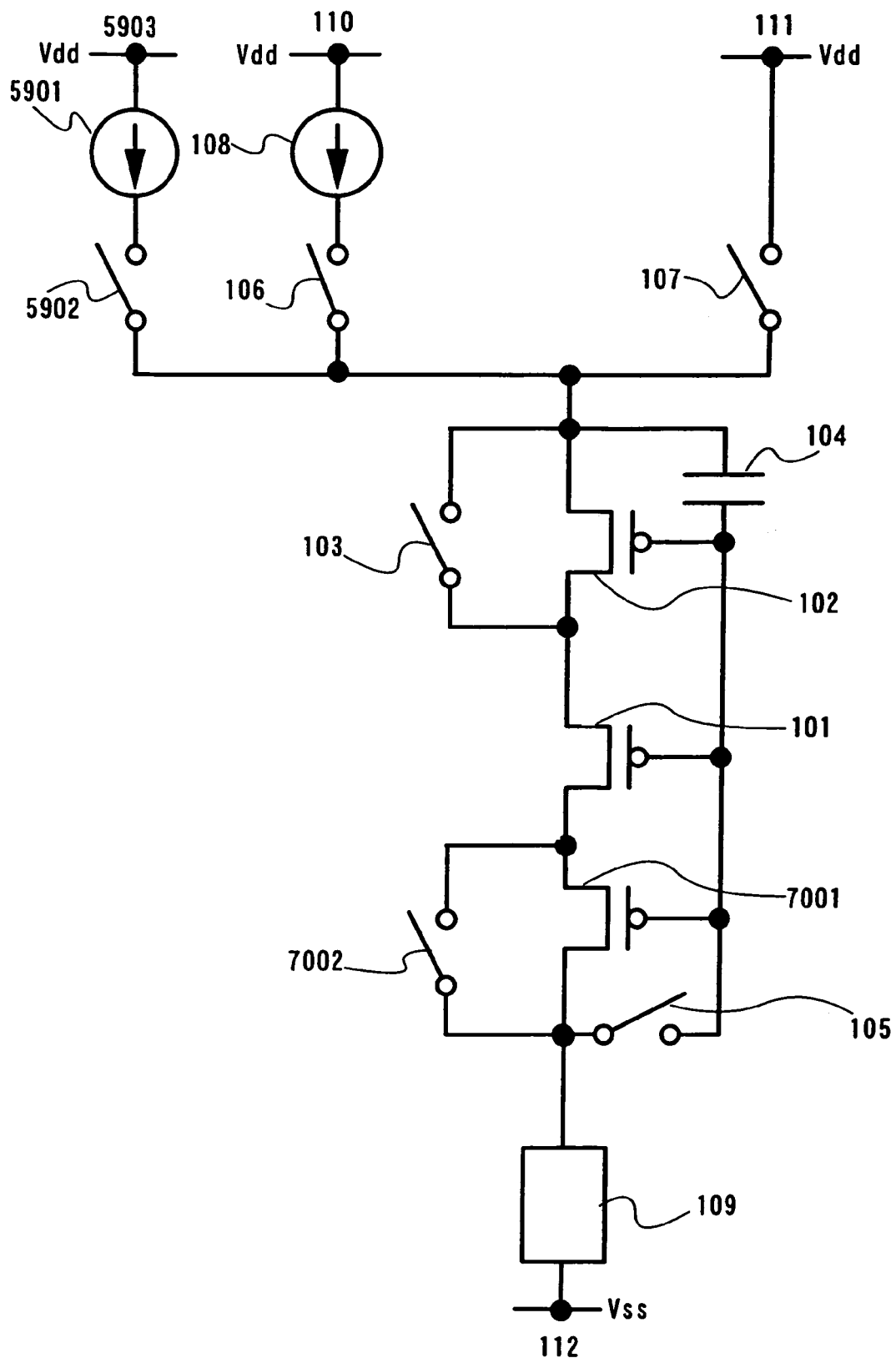
FIG. 70 is a diagram showing a configuration of a current source circuit of the invention.

In FIG. 59, the current source transistor 101 and the switching transistor 102 are provided one each, however, one or both of them may be provided in plural numbers. The arrangements thereof may be arbitrarily selected as well. FIG. 69 shows an example in which a second switching transistor 6901 is provided between the switching transistor 102 and the current source transistor 101 in FIG. 59. By turning a switch 6902 on/off, the short-circuit operation and the current source operation of the second switching transistor 6901 are switched. In this manner, the function of the switching transistor 102 shown in FIG. 59 is achieved by using the switching transistor 102 and the second switching transistor 6901 in FIG. 69. FIG. 70 shows a configuration in which a second switching transistor 7001 which functions as the switching transistor 102 in FIG. 68 is provided in the configuration of FIG. 59. It is to be noted that the short-circuit operation and the current source operation of the second switching transistor 7001 are switched by turning on/off a switch 7002.

Figure 72:
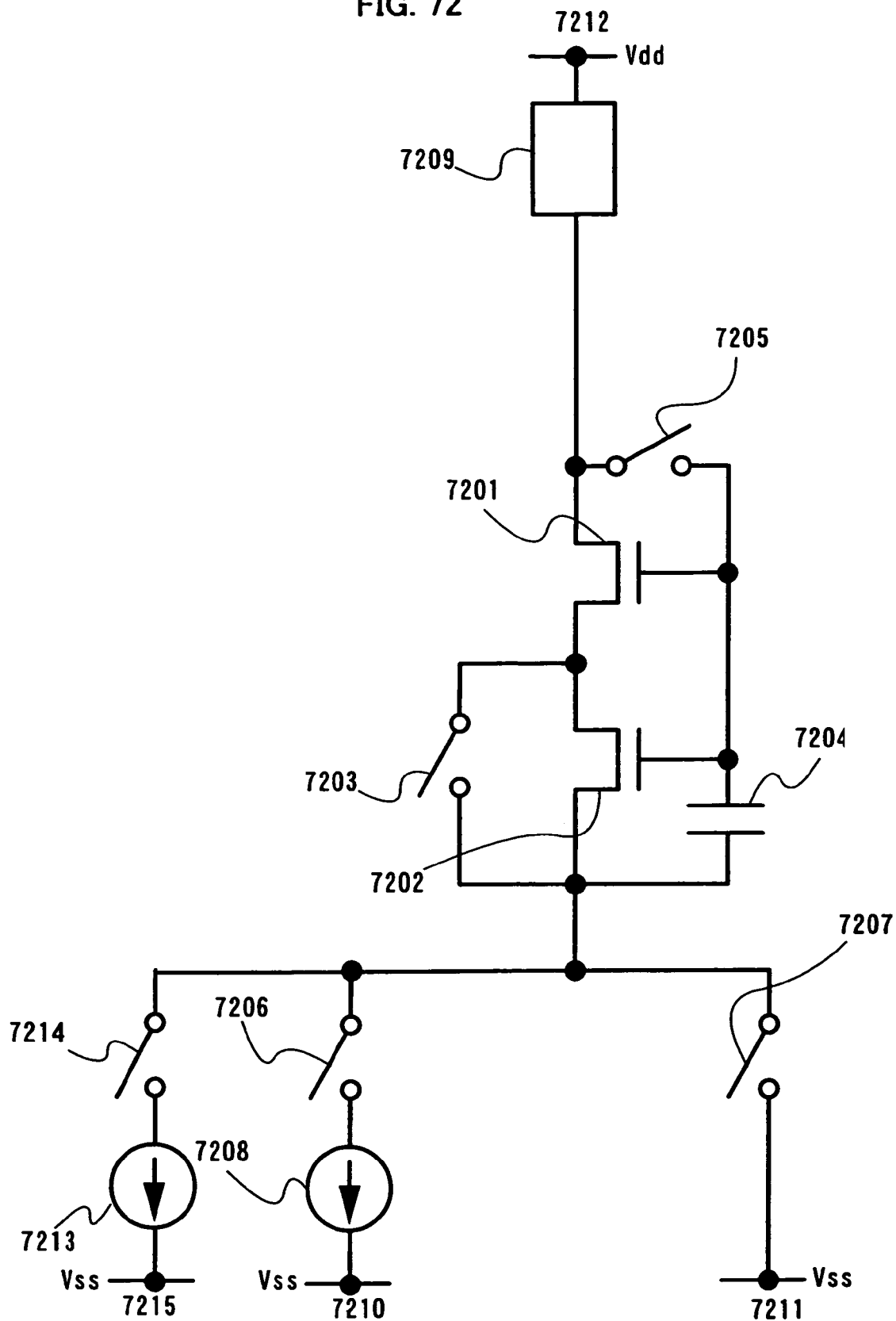
FIG. 72 is a diagram showing a configuration of a current source circuit of the invention.

It is to be noted that the current source transistor 101 and the switching transistor 102 are both p-channel transistors in FIG. 59, however, the invention is not limited to this. FIG. 72 shows an example in which the polarity (conductivity) of the current source transistor 101 and the switching transistor 102 are changed and connections of the circuit are not changed in the circuit of FIG. 59. As in FIGS. 59 and 72, the polarity can be easily changed by changing potentials of the wirings 5903, 110, 111, and 112 so as to be those of wirings 7215, 7210, 7211, and 7212 and changing directions of current of the reference current source 108 and the second reference current source 5901. The connections of a current source transistor 7201, a switching transistor 7202, switches 7203, 7207, 7205, 7206, 7207, and 7214, the reference current source 108, and the second reference current source 5901, a load 7209 and the like are not changed.

Figure 71:
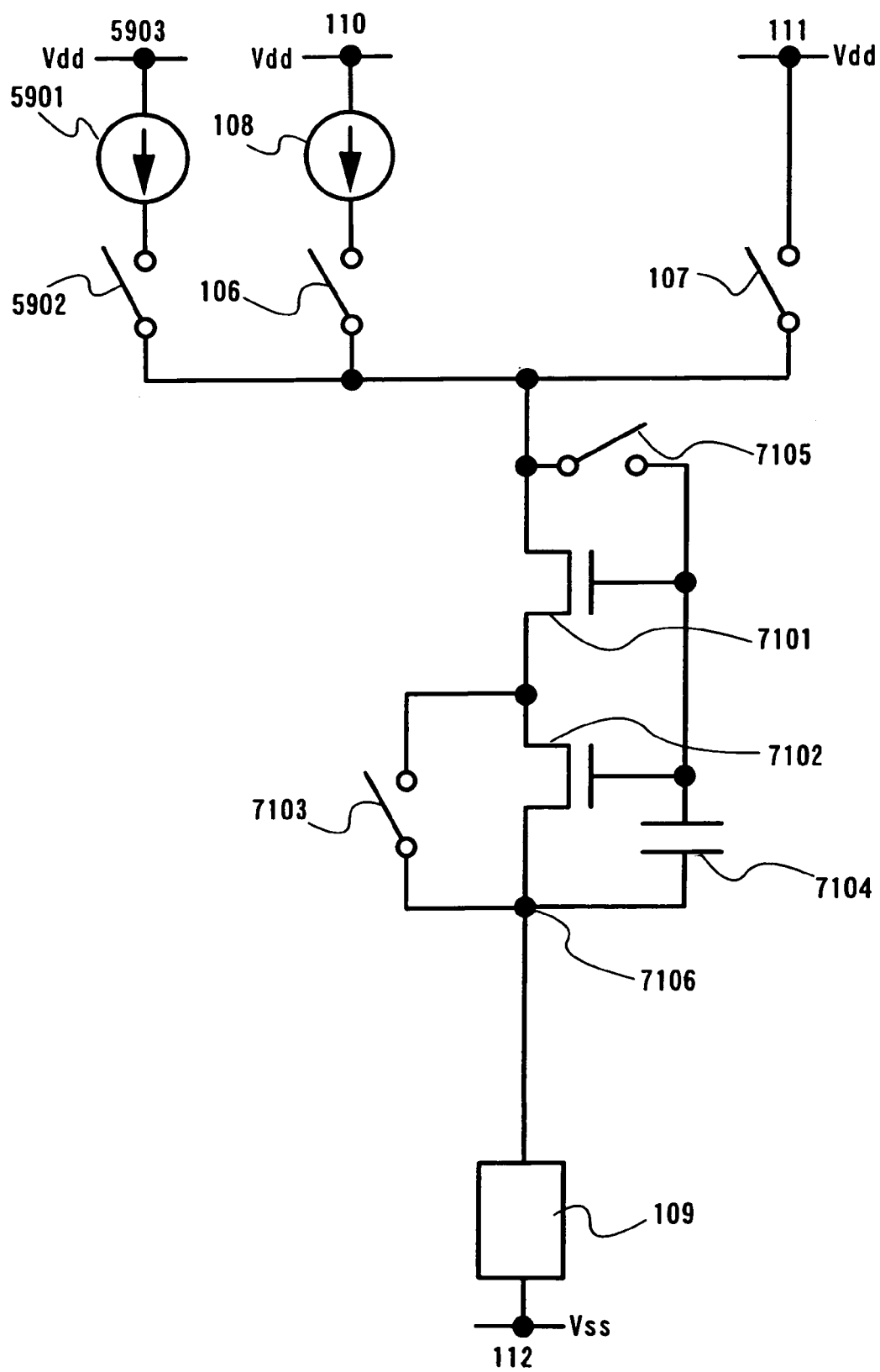
FIG. 71 is a diagram showing a configuration of a current source circuit of the invention.

FIG. 71 shows an example in which the polarity (conductivity) of the current source transistor 101 and the switching transistor 102 are changed by changing connections of the circuit of FIG. 59 without changing the direction of current. There are a current source transistor 7101 which constantly operates as a current source (or a part of it) and a switching transistor 7102 of which operation changes according to the circumstance. The current source transistor 7101, the switching transistor 7102, and the load 109 are connected in series. A gate terminal of the current source transistor 7101 is connected to one of the terminals of the capacitor 7104. The other terminal 7106 of the capacitor 7104 is connected to a source terminal of the switching transistor 7102 (the current source transistor 7101). Therefore, the capacitor 7104 can hold a gate-source voltage of the current source transistor 7101. Further, the gate terminal and a drain terminal of the current source transistor 7101 are connected via a switch 7105. The capacitor 7104 can be controlled to hold a charge by turning on/off of the switch 7105.

An operation of FIG. 71 is described. However, it is similar to the operation of FIG. 59, therefore, description will be made briefly. First, the switches 5902, 7103, and 7105 are turned on and the switches 106 and 107 are turned off. Then, when a steady state is obtained, a current stops flowing to the capacitor 7104. Then, a gate-source voltage of the current source transistor 7101 at that time is accumulated in the capacitor 7104. That is, a voltage required to supply the current Ib2 between the source and drain of the current source transistor 7101 is applied between the gate and source thereof. The aforementioned operation corresponds to the precharge operation. At that time, the switching transistor 7102 performs the short-circuit operation.

Next, the switches 106 and 7105 are turned on and the switches 5902, 107, and 7103 are turned off. Then, the current source transistor 7101 and the switching transistor 7102 operate as a multi-gate transistor. Therefore, a current stops flowing to the load 7014 when the steady state is obtained. At that time, a gate-source voltage of the multi-gate transistor is accumulated in the capacitor 7104. That is, a voltage required to supply the current Ib1 between the source and drain of the multi-gate transistor is applied between the gate and source thereof. The aforementioned operation corresponds to the set operation. At that time, the switching transistor 7102 performs the current source operation.

Next, the switch 107 is turned on and switches 5902, 106, 7105 and 7103 are turned off. Then, a current flows to the load 109. The aforementioned operation corresponds to the output operation. At that time, the switching transistor 7102 performs the current source operation. Note that a potential of the terminal 7106 of the capacitor 7104 is different between the set operation and the output operation in many cases. However, voltage (potential difference) at both terminals of the capacitor 7104 do not change, therefore, a gate-source voltage of the transistor does not change either. Thus, a desired current flows to the load 109.

Figure 73:
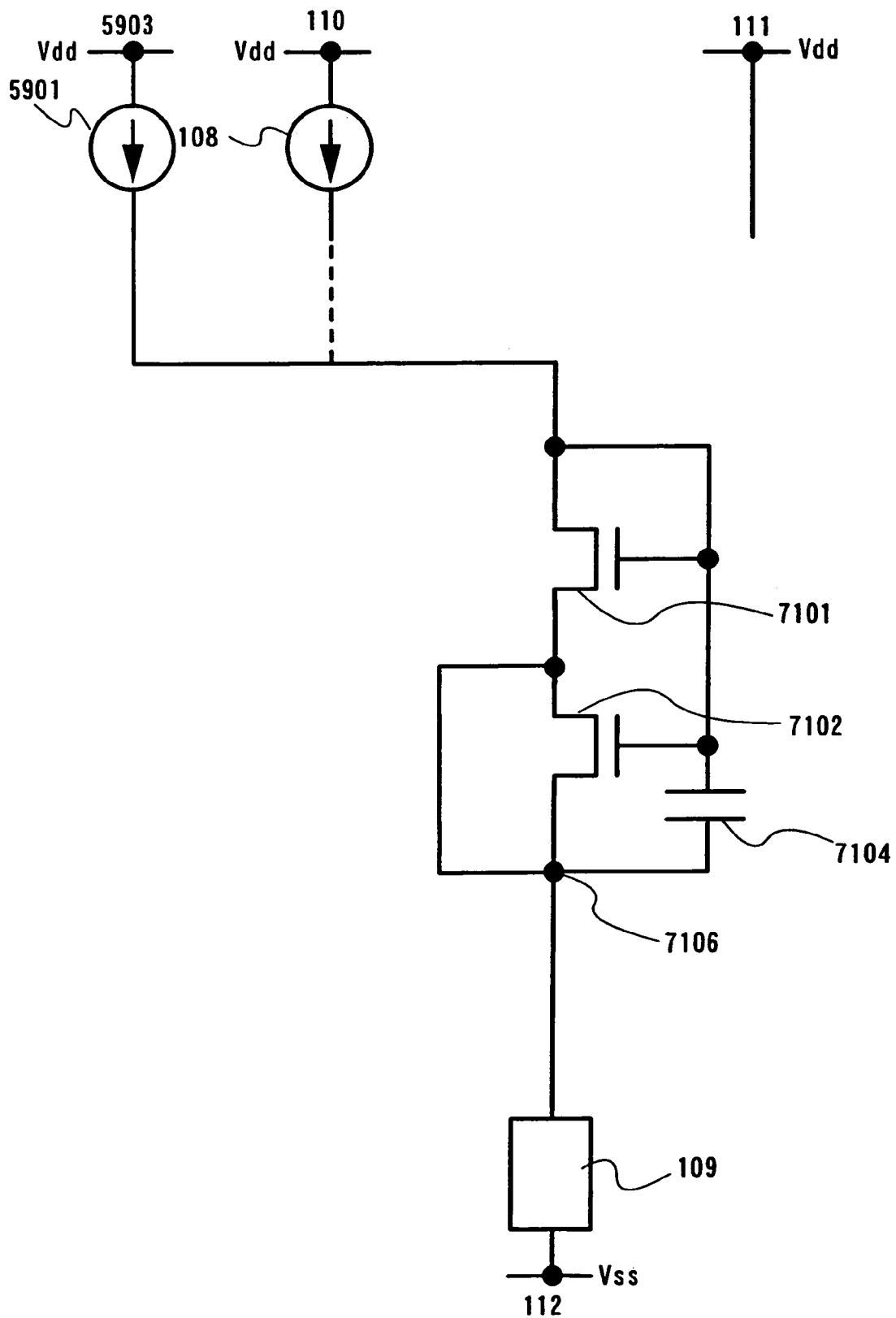
FIG. 73 is a diagram showing connections of a certain operation of a current source circuit of the invention.
Figure 74:
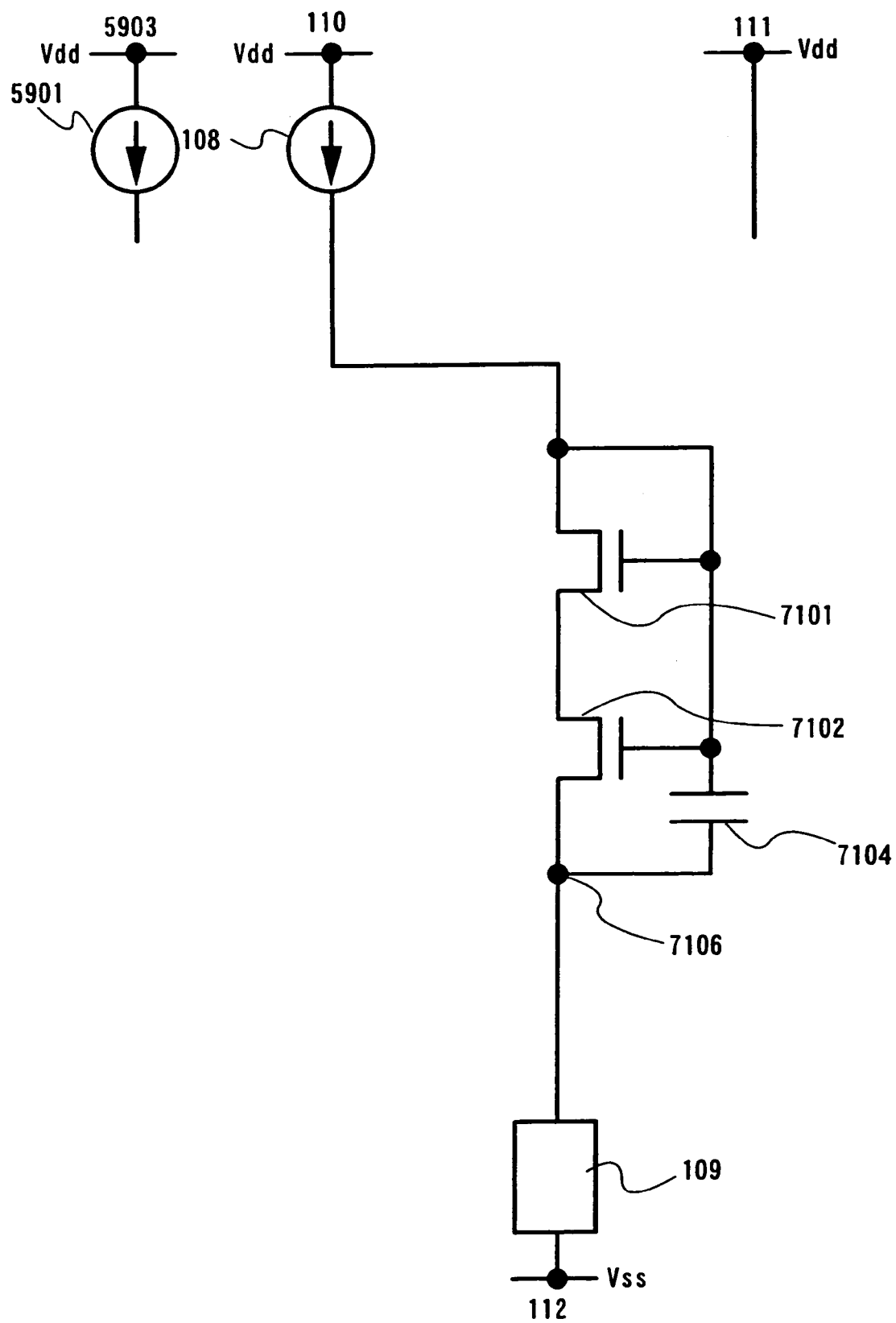
FIG. 74 is a diagram showing connections of a certain operation of a current source circuit of the invention.
Figure 75:
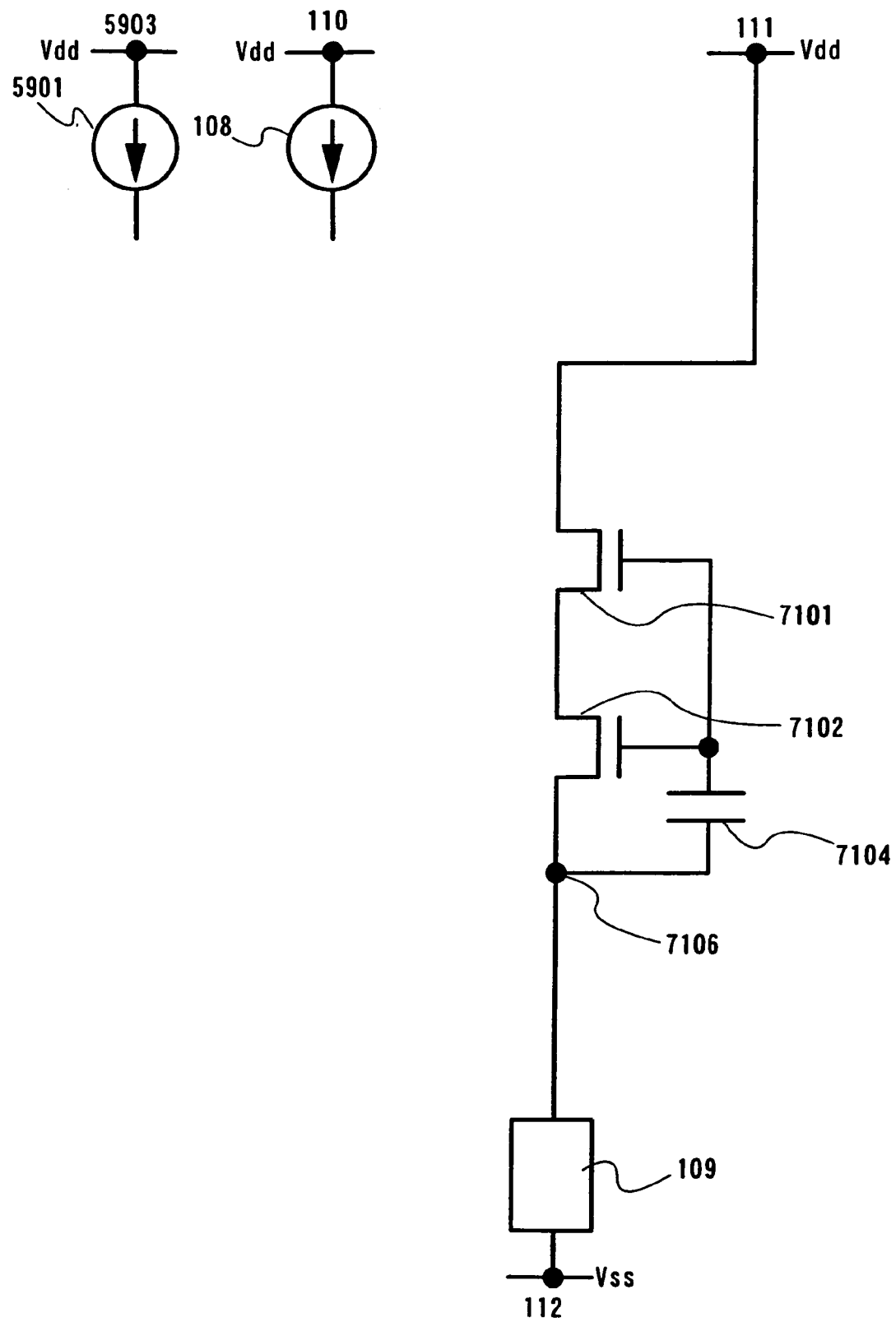
FIG. 75 is a diagram showing connections of a certain operation of a current source circuit of the invention.

In this case also, the switches may be disposed anywhere as long as they are connected as shown in FIG. 73 in the precharge operation, connected as shown in FIG. 74 in the set operation, and connected as shown in FIG. 75 in the output operation.

FIG. 71 shows a circuit corresponding to FIG. 59, however, the transistors may be arranged in the order of FIG. 68 as well. In that case, a charge is not accumulated in the gate capacitance of the switching transistor 7102 in the short-circuit operation.

It is to be noted in the case of FIG. 59 that the precharge operation is performed as shown in FIG. 60 and then the set operation is performed as shown in FIG. 61, however, the invention is not limited to this.

For example, the precharge operation shown in FIG. 60 may be performed a plurality of times. FIG. 148 shows as an example the case where one more precharge operation is performed than the case of FIG. 60. In FIG. 148, a transistor 14802 which operates as a current source is provided additionally. A first precharge operation is performed with switches 14804, 103, 14802, and 105 being on and switches 5902, 106, and 107 being off. After that, a second precharge operation is performed with the switches 14804, 106, 107, and 14802 being turned off and the switches 5902 and 103 being on. That is, the aforementioned operation corresponds to the precharge operation in FIG. 60. It is to be noted that a current flowing in the first precharge operation is larger than that in the second precharge operation. In this manner, by performing the precharge operation with a larger current value first, a steady state can be obtained rapidly.

It is preferable that the characteristics of the transistors used in the precharge operation and the transistor used in the set operation be the same as much as possible. In the case of FIG. 59, for example, it is preferable that the current characteristics of the current source transistor 101 and the switching transistor 102 be the same. Therefore, it is preferable to device in the process of manufacturing these transistors so that the current characteristics thereof become the same. For example, it is preferable to arrange the current source transistor 101 and the switching transistor 102 as close to each other as possible. In the case of crystallizing a semiconductor layer of the transistors by irradiation with laser, for example, it is preferable that the transistors be irradiated with the same laser shot. As a result, the current characteristics can be approximately the same, which leads to produce an appropriate state by the precharge operation. Thus, the set operation can be performed rapidly.

In this manner, by changing the number and arrangement of switches, the polarity of each transistor, the number and arrangement of the current source transistor and the switching transistor, a potential of each wiring, a direction of current flow and the like, various circuits can be configured. By using each change in combination, various circuits can be configured.

Description is made on the case of changing the circuit of FIG. 71 partially. Therefore, as the most part of the configuration is similar to FIG. 71, description thereon will be omitted. However, the invention is not limited to the configuration of FIG. 71 and various configurations can be employed.

Figure 89:
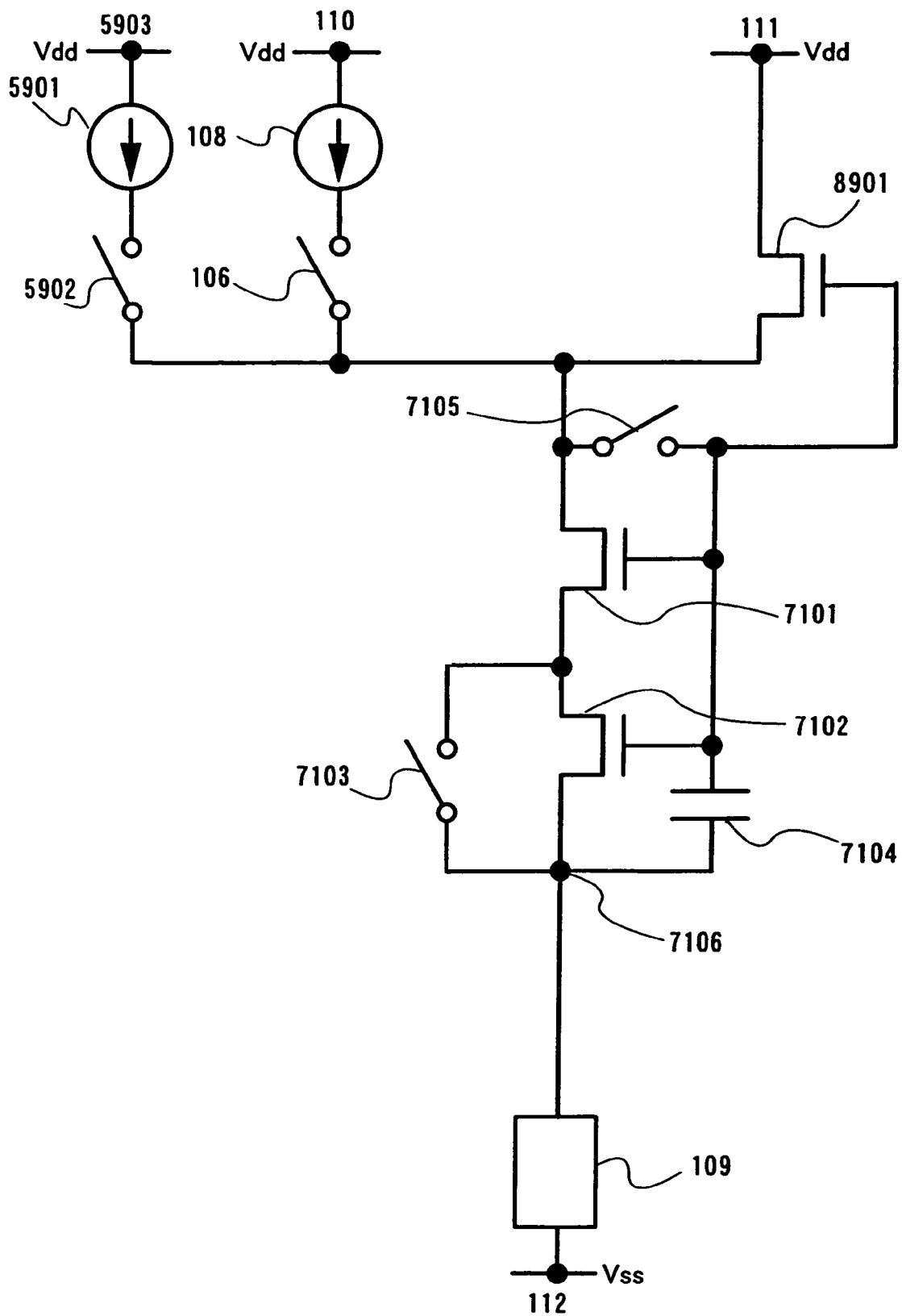
FIG. 89 is a diagram showing a configuration of a current source circuit of the invention.

FIG. 89 shows the configuration of FIG. 71 which is partially changed. FIG. 89 is different than FIG. 71 in that the switch 107 in FIG. 71 is changed into a multi transistor 8901 in FIG. 89. The multi transistor 8901 has the same polarity (conductivity) as the current source transistor 7101 and the switching transistor 7102. A gate terminal of the multi transistor 8901 is connected to the gate terminal of the current source transistor 7101. The multi transistor 8901 changes its operation depending on the circumstance. That is, the multi transistor 8901 operates as a switch in the set operation while it operates as a part of a multi-gate transistor together with the current source transistor 7101 and the switching transistor 7102 as a current source.

Figure 90:
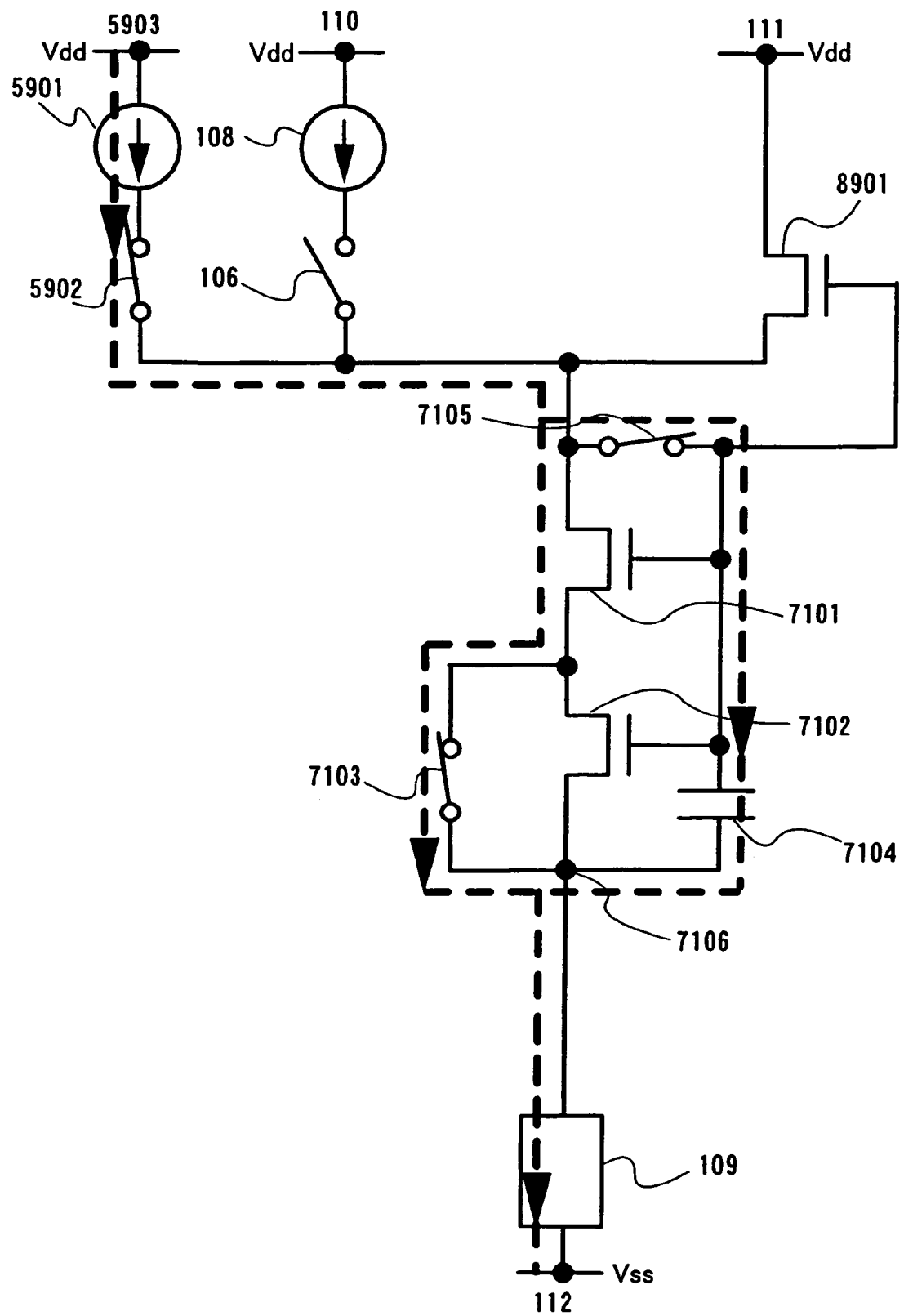
FIG. 90 is a diagram showing an operation of a current source circuit of the invention.

An operation of the circuit of FIG. 89 is described. First, the switches 5902, 7105, and 7103 are turned on as shown in FIG. 90. Then, the current Ib2 of the reference current source 5901 flows to the capacitor 7104 and the current source transistor 7101'. At this time, the gate terminal and a source terminal of the multi transistor 8901 have approximately the same potential. That is, a gate-source voltage of the multi transistor 8901 becomes approximately 0 V. Therefore, the multi transistor 8901 is turned off. Then, a steady state is obtained and a current flowing between the source and drain of the current source transistor 7101 and the current Ib2 of the second reference current source 5901 become equal to each other. Then, a current stops flowing to the capacitor 7104. The aforementioned operation corresponds to the precharge operation. At that time, the multi transistor 8901 operates as a switch which is off.

Figure 91:
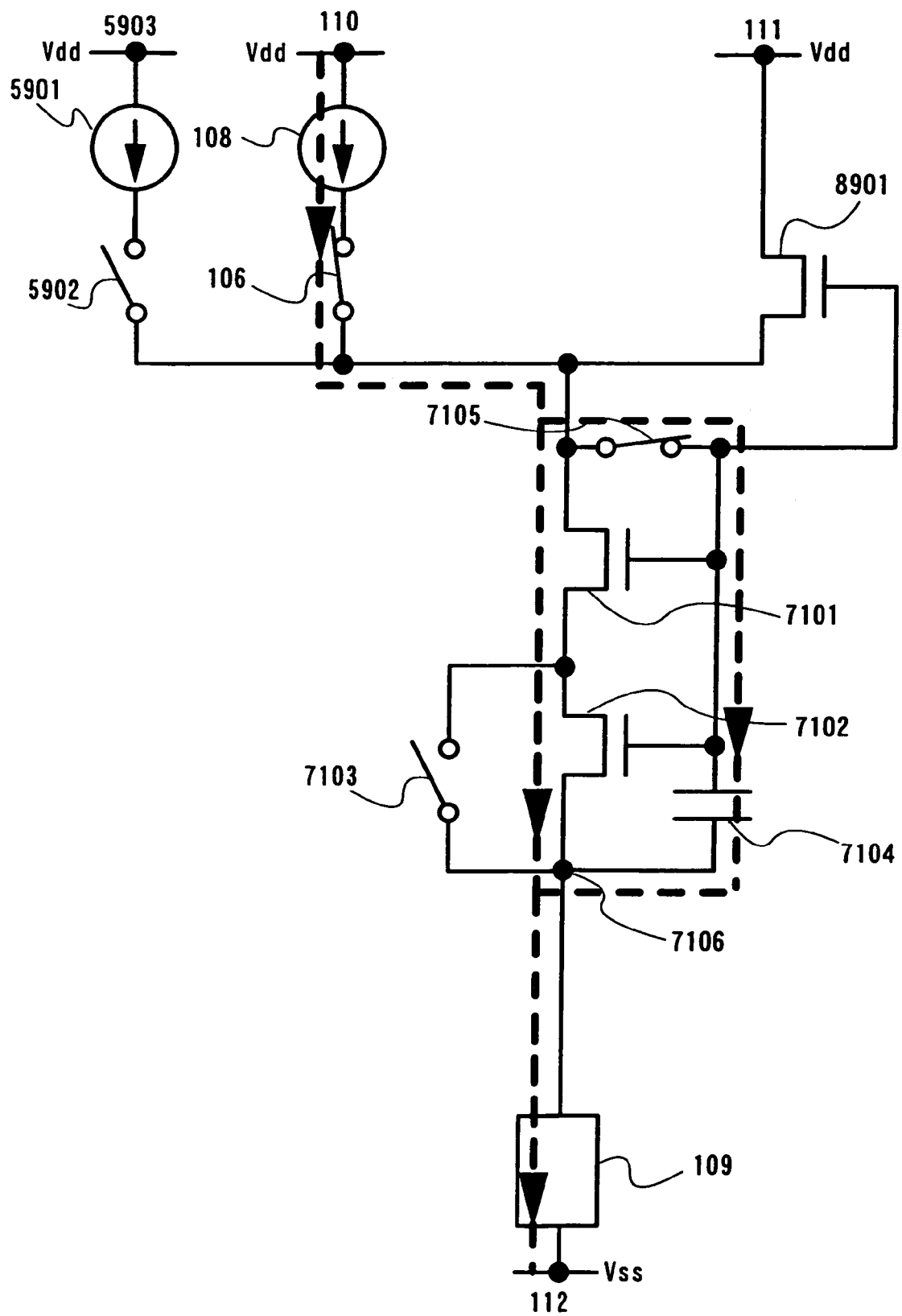
FIG. 91 is a diagram showing an operation of a current source circuit of the invention.

Next, as shown in FIG. 91, the switches 106 and 7105 are turned on and the switches 7102 and 7103 are turned off. Then, a current flows between the source and drain of the switching transistor 7102 as the switch 7103 is off. Therefore, the current Ib1 of the reference current source 108 flows to the capacitor 7104, the current source transistor 7101, and the switching transistor 7102. At this time, the gate terminals of the current source transistor 7101 and the switching transistor 7102 are connected to each other. Therefore, they operate together as a multi-gate transistor. A gate length L of the multi-gate transistor is longer than L of the current source transistor 101. Generally, the longer the gate length L of the transistor is, the smaller the current flowing there becomes.

When a current flowing between a source and drain of the multi-gate transistor and the current Ib1 of the reference current source 108 become equal to each other, a current stops flowing to the capacitor 7104. That is, a steady state is obtained. A potential of the gate terminal at that time is accumulated in the capacitor 7104. That is, a voltage required to supply the current Ib1 between the source and drain of the multi-gate transistor (the current source transistor 7101 and the switching transistor 7102) is applied to the gate terminal thereof. The aforementioned operation corresponds to the set operation. At that time, the switching transistor 7102 performs the current source operation.

At this time, by appropriately setting the current Ib1 of the reference current source 108, the current Ib2 of the second reference current source 5901, and a transistor size (a gate width W, a gate length L and the like) of the current source transistor 7101 and the switching transistor 7102, a charge accumulated in the capacitor 7104, that is a potential of the gate terminal of the current source transistor 7101 is set to be approximately equal between the precharge operation and the set operation.

In the case where the current Ib2 of the second reference current source 5901 is larger than the current Ib1 of the reference current source 108, the capacitor 7104 can be charged rapidly in the precharge operation, thus the steady state can be obtained. In the set operation after that, the steady state can be rapidly obtained even when the current Ib1 of the reference current source 108 is small. This is because the capacitor 7104 is almost charged by the precharge operation.

Figure 92:
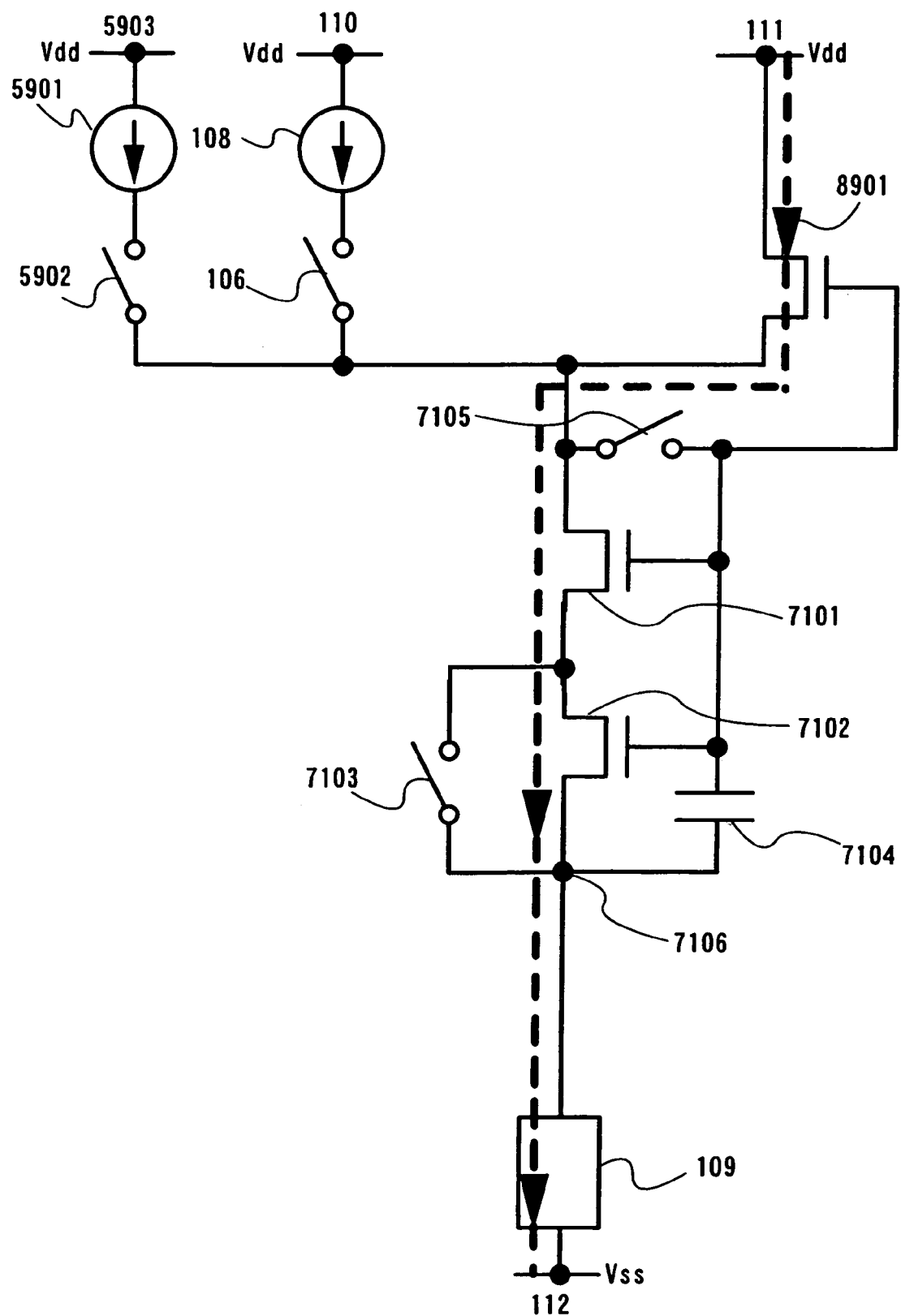
FIG. 92 is a diagram showing an operation of a current source circuit of the invention.

Next, as shown in FIG. 92, the switches 5902, 106, and 7103 are turned off. Then, a charge accumulated in the capacitor 7104 in the set operation is applied to the gate terminals of the current source transistor 7101, the switching transistor 7102, and the multi transistor 8901. The gate terminals of the current source transistor 7101, the switching transistor 7102, and the multi transistor 8901 are connected to each other. As described above, the current source transistor 7101, the switching transistor 7102, and the multi transistor 8901 operate as a multi-gate transistor. Therefore, when the current source transistor 7101, the switching transistor 7102, and the multi transistor 8901 are one transistor, a gate length L of the multi-gate transistor is longer than L of the current source transistor 7101 and L of the switching transistor 7102. Therefore, a current flowing to the load 109 becomes smaller than Ib1. That is, the current flowing to the load 109 becomes smaller than that in the case of FIG. 91. The aforementioned operation corresponds to the output operation. At that time, the multi transistor 8901 operates as a part of the multi-gate transistor.

In this manner, by changing the switch 107 in FIG. 71 into the multi transistor 8901 in FIG. 89 and connecting the gate terminal of the multi transistor 8901 to the gate terminal of the current source transistor 7101, a current can be controlled automatically and a current flowing to the load 109 can be small. In the case of FIG. 71, a wiring for controlling the switch 107 which connects the drain terminal of the current source transistor to the wiring 111 in the output operation is required, however, it can be omitted in FIG. 89 as a current can be controlled automatically.

In the output operation, the current source transistor 7101, the switching transistor 7102, and the multi transistor 8901 operate as a multi-gate transistor. Therefore, it is preferable that these transistors have the same polarity (conductivity).

It is to be noted that the current source transistor 7101, the switching transistor 7102, and the multi transistor 8901 operate as a multi-gate transistor in the output operation, and a gate width W of each transistor may be the same or different. Similarly, a gate length L thereof may be the same or different. The gate width W, however, is preferably the same as it can be considered to be the same as a normal multi-gate transistor. By designing the gate length L of the switching transistor 7102 and the multi transistor 8901 longer, a current supplied to the load 109 becomes smaller. Therefore, the gate width and length may be designed depending on the circumstance.

FIG. 89 shows a circuit of this embodiment mode, however, the invention is not limited to this. By changing the number and arrangement of switches, the polarity of each transistor, the number and arrangement of the current source transistor 7101, the switching transistor 7102, and the multi transistor 8901, a potential of each wiring, a direction of current flow and the like, various circuits can be configured. By using each change in combination, various circuits can be configured.

Figure 93:
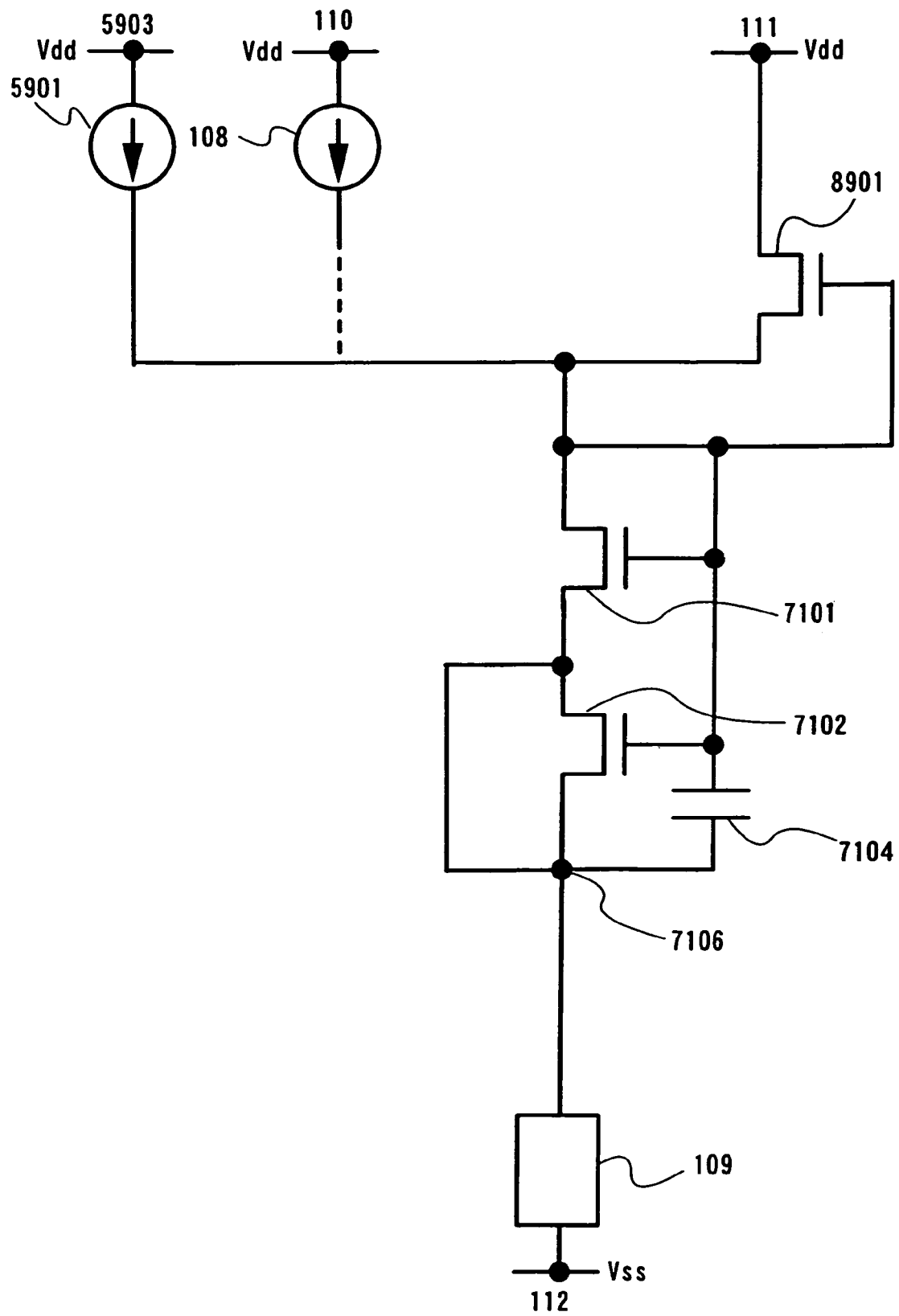
FIG. 93 is a diagram showing connections of a certain operation of a current source circuit of the invention.
Figure 94:
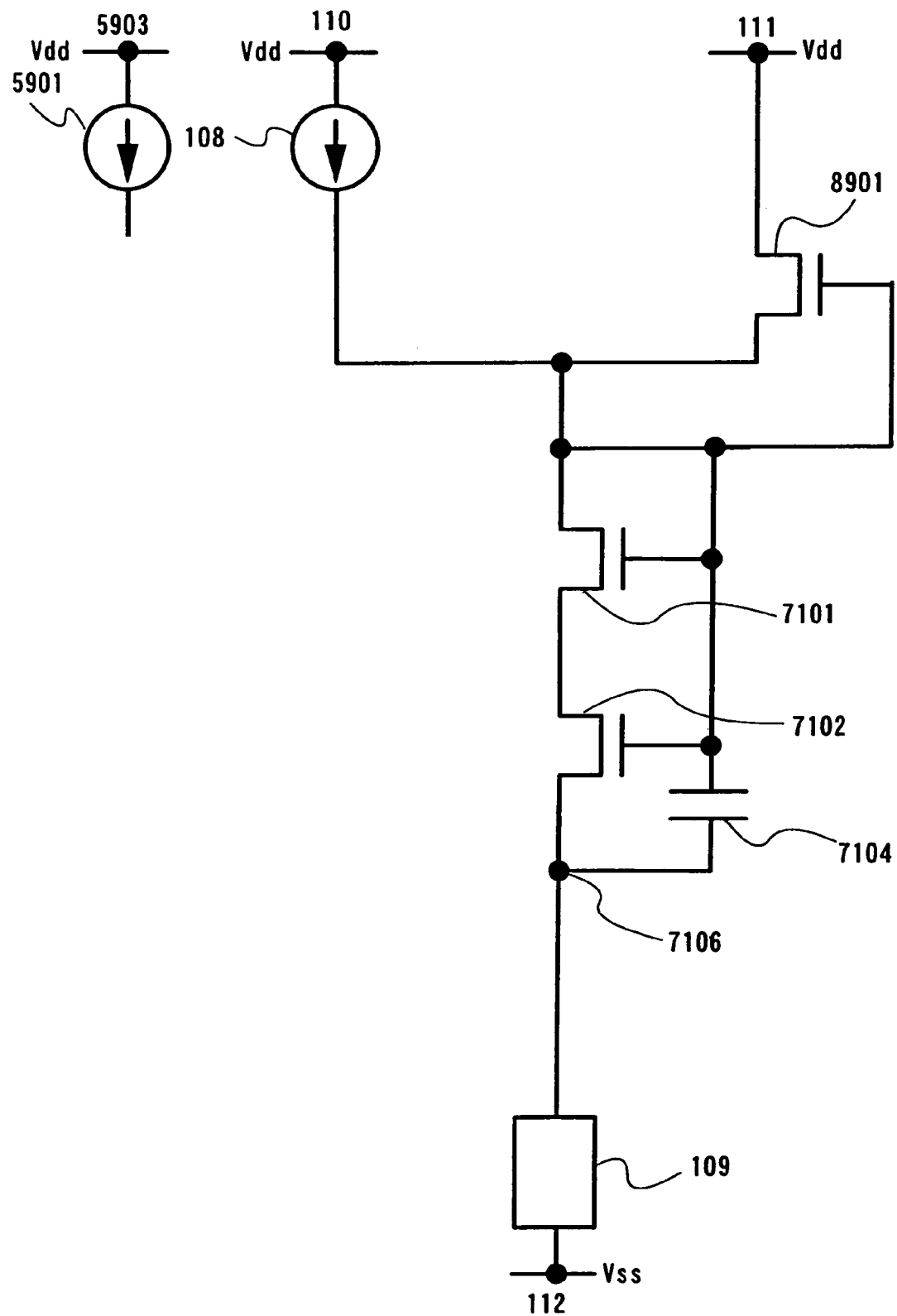
FIG. 94 is a diagram showing connections of a certain operation of a current source circuit of the invention.
Figure 95:
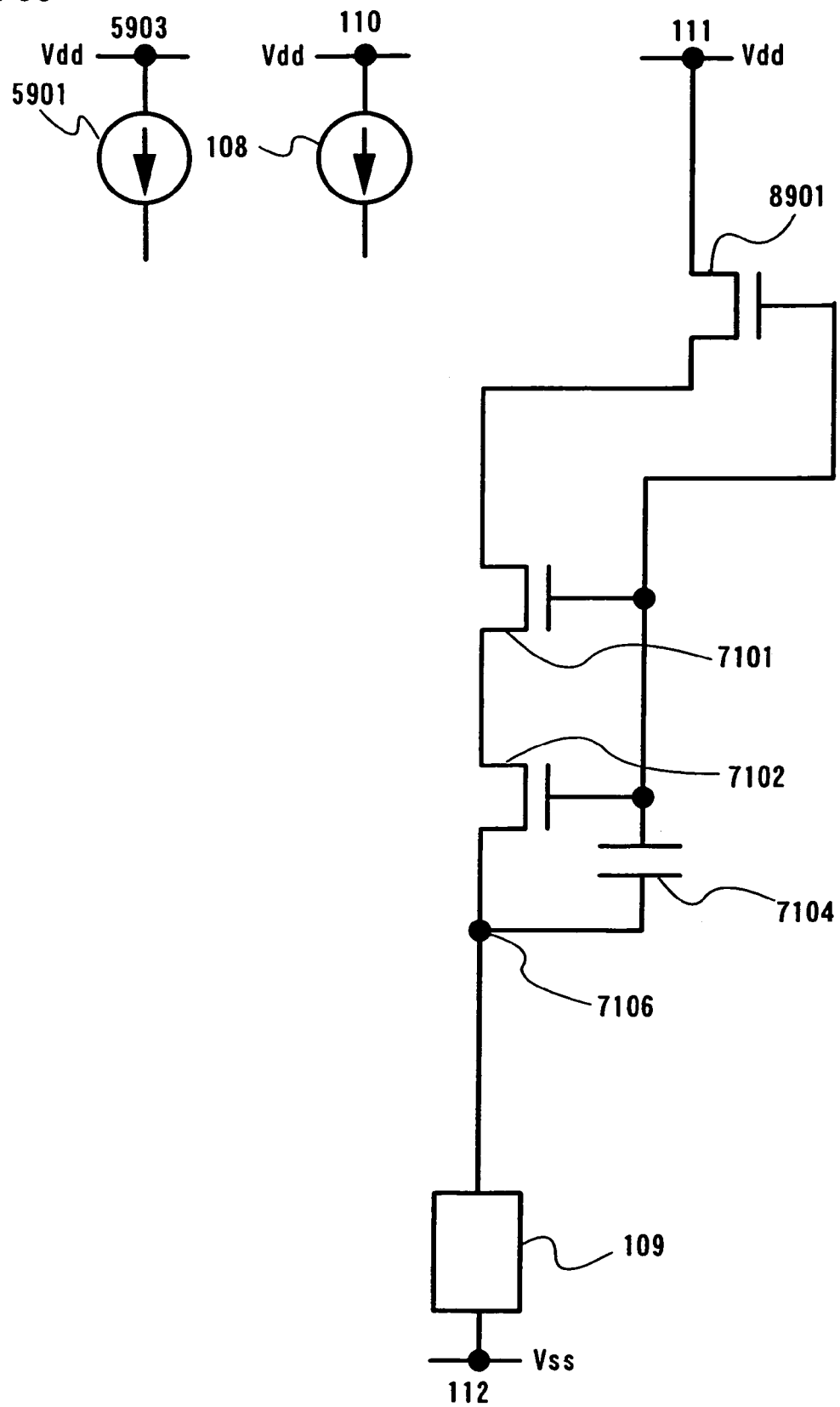
FIG. 95 is a diagram showing connections of a certain operation of a current source circuit of the invention.

For example, such switches as 5901, 106, 7103, and 7105 may be arranged anywhere as long as they can control on/off of current. That is to say, such switches as 5901, 106, 7103, and 7105 may be arranged anywhere as long as they are connected as shown in FIG. 93 in the precharge operation, connected as shown in FIG. 94 in the set operation and connected as shown in FIG. 95 in the output operation.

Embodiment Mode 6

In Embodiment Mode 5, the configuration of FIG. 59 in which the current source operation and the short-circuit operation are performed to the switching transistor 102 is described. In this embodiment mode, an example of realizing the current source operation and the short-circuit operation in a different configuration than that of Embodiment Mode 5 will be described.

It should be noted that the description which is similar to Embodiment Mode 4 will be omitted here. First, FIG. 76 shows a configuration in which the current source operation and the short-circuit operation are performed to a switching transistor 7602.

Figure 76:
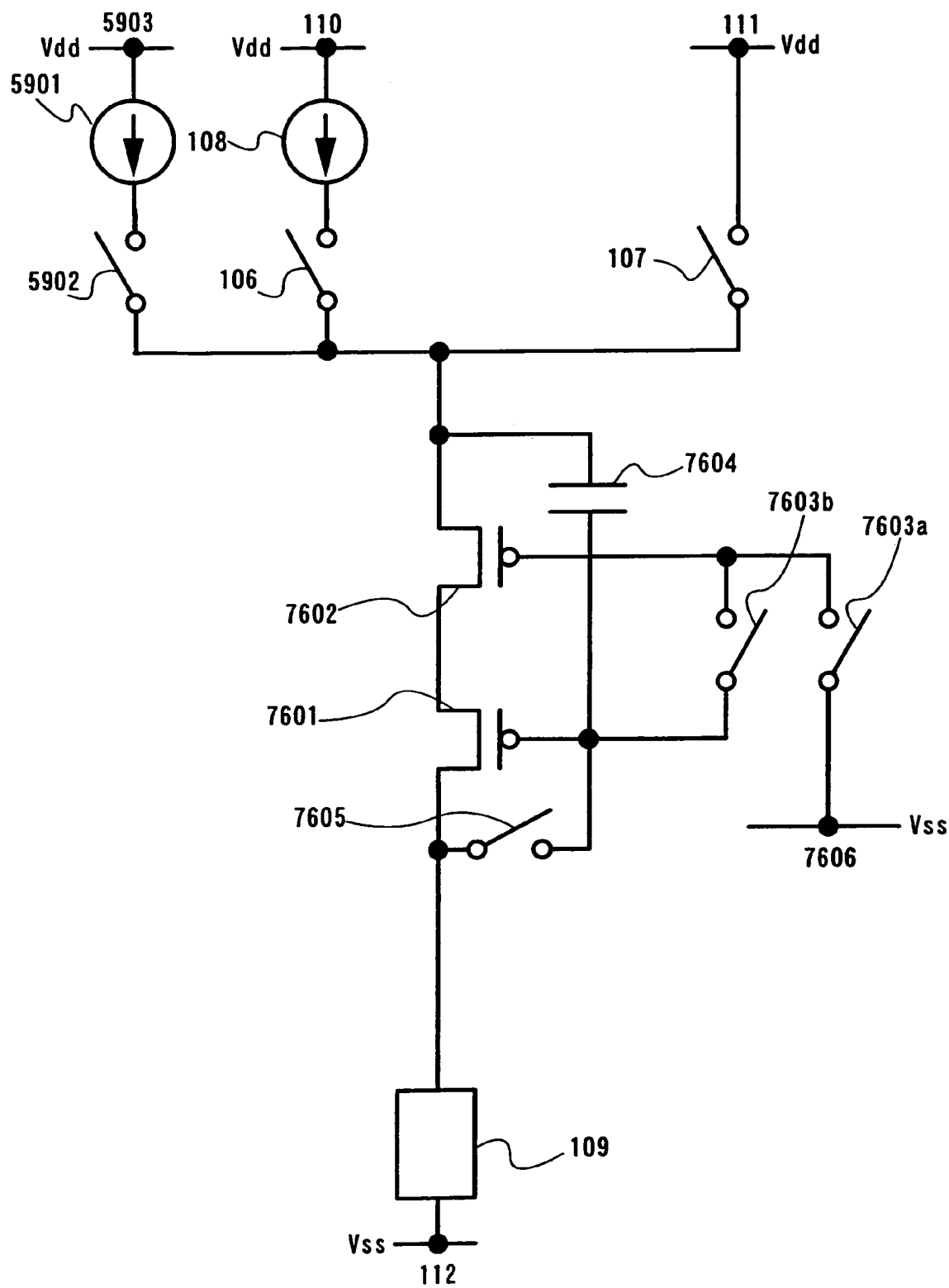
FIG. 76 is a diagram showing a configuration of a current source circuit of the invention.

A current source circuit shown in FIG. 76 is designed so that a voltage at a gate terminal of the switching transistor 7602 is controlled to supply as much current as possible to the switching transistor 7602. Specifically, by using a switch 7603a, an absolute value of a gate-source voltage of the switching transistor 7602 is made large. As a result, a source-drain voltage of the switching transistor 7602 is not required to be high when a certain value of current flows. That is, the switching transistor 7602 operates as a switch.

In FIG. 76, gate terminals of the current source transistor 7601 and the switching transistor 7602 are not connected to each other, therefore, they are connected by using a switch 7603b. As a result, the current source transistor 7601 and the switching transistor 7602 operate as a multi-gate transistor. An operation of the current source circuit shown in FIG. 76 is described.

Figure 77:
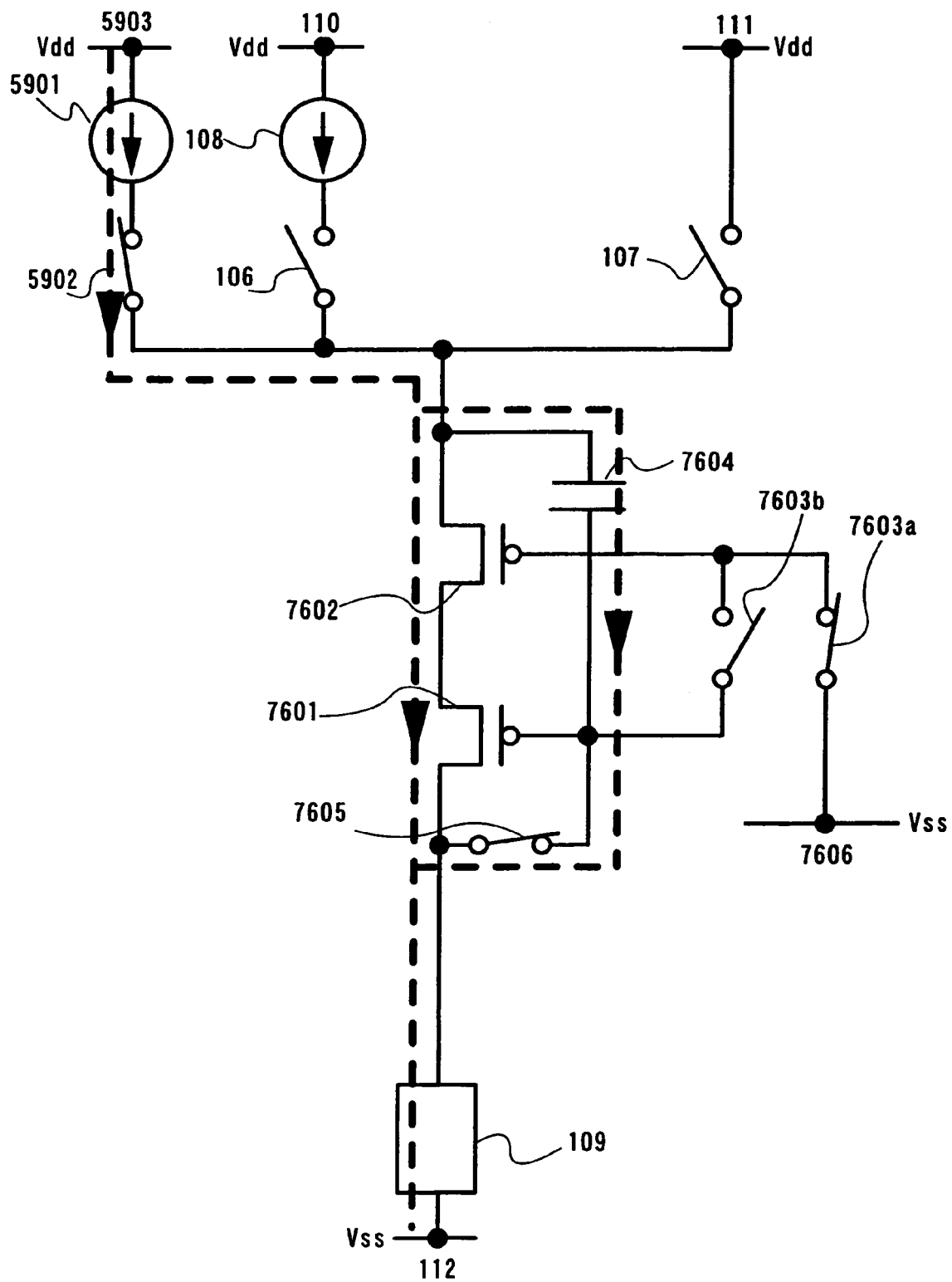
FIG. 77 is a diagram showing an operation of a current source circuit of the invention.

First, as shown in FIG. 77, switches 5902, 7605, and 7603a are turned on and the switches 106, 107, and 7603b are turned off. Then, the gate terminal of the switching transistor 7602 is connected to a wiring 7606. The wiring 7606 is supplied with a low potential side power source (Vss), therefore, an absolute value of a gate-source voltage of the switching transistor 7602 becomes quite large. The switching transistor 7602 thus has quite large current drive capacity, which makes a source terminal and a drain terminal of the switching transistor 7602 have approximately the same potential. Accordingly, the current Ib2 of the second reference current source 5901 flows to the capacitor 7604 and the current source transistor 7601. When a current flowing between the source and drain of the current source transistor 7601 and the current Ib2 of the second reference current source 5901 become equal, a current stops flowing to the capacitor 7604. That is, a steady state is obtained. A potential of a gate terminal at that time is accumulated in the capacitor 7604. That is, a voltage required to supply the current Ib2 between the source and drain of the current source transistor 7601 is applied to the gate terminal thereof. The aforementioned operation corresponds to a precharge operation. At that time, the switching transistor 7602 operates as a switch and performs a short-circuit operation.

Figure 78:
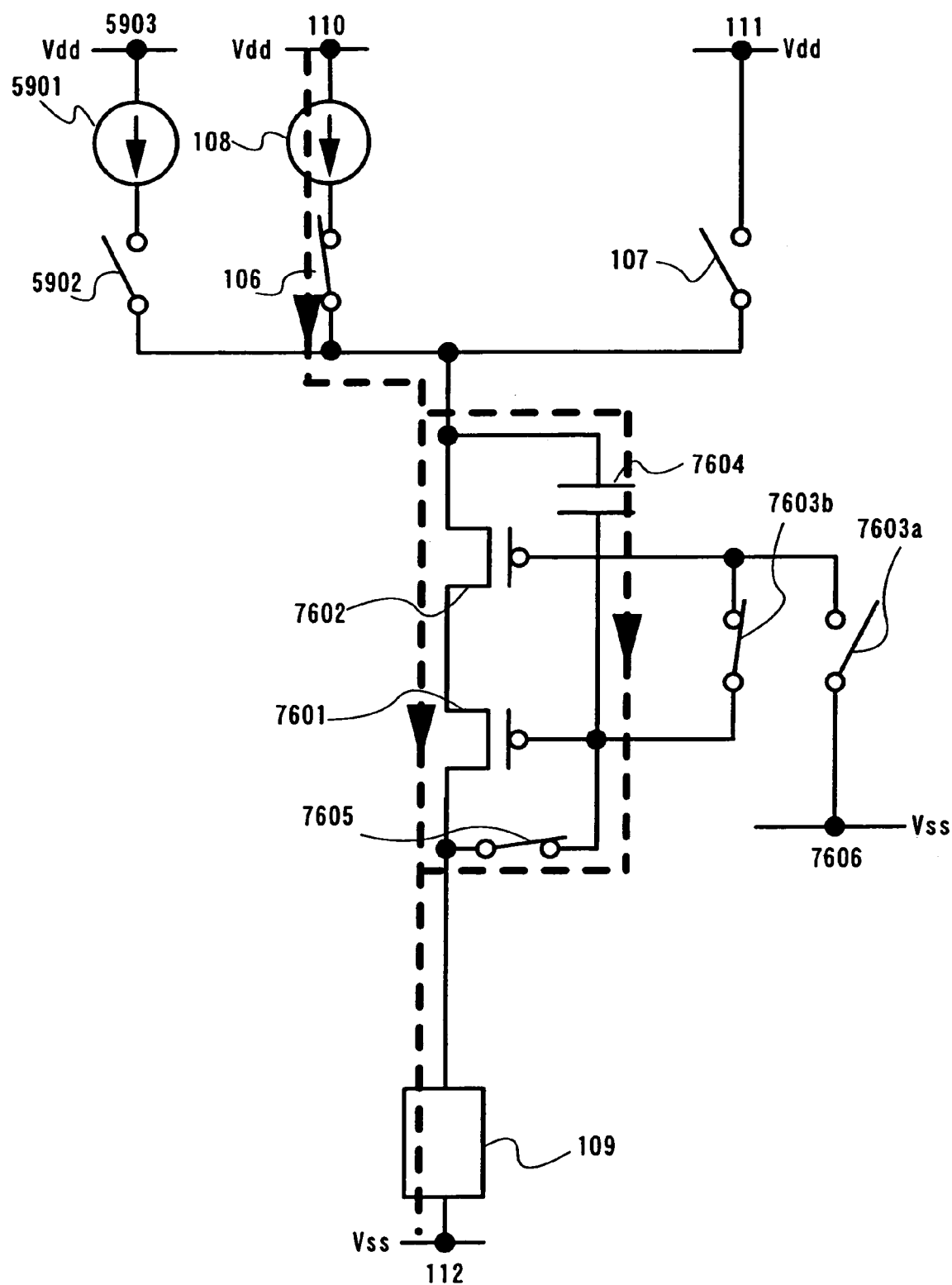
FIG. 78 is a diagram showing an operation of a current source circuit of the invention.

Next, as shown in FIG. 78, the switches 5902, 107, and 7603a are turned off and the switches 106, 7603b, and 7605 are turned on. Then, the gate terminal of the switching transistor 7602 and the gate terminal of the current source transistor 7601 are connected to each other. Accordingly, the current source transistor 7601 and the switching transistor 7602 operate as a multi-gate transistor. Therefore, when the current source transistor 7601 and the switching transistor 7602 are one transistor, a gate length L of the multi-gate transistor is longer than L of the current source transistor 7601. Therefore, a current stops flowing to the load 7604 when a current flowing between the source and drain of the multi-gate transistor formed of the current source transistor 7601 and the switching transistor 7602 and the current Ib1 of the reference current source 5901 become equal. That is, a steady state is obtained. A potential of a gate terminal at that time is accumulated in the capacitor 7604. The aforementioned operation corresponds to the set operation. At that time, the switching transistor 7602 performs the current source operation.

Figure 79:
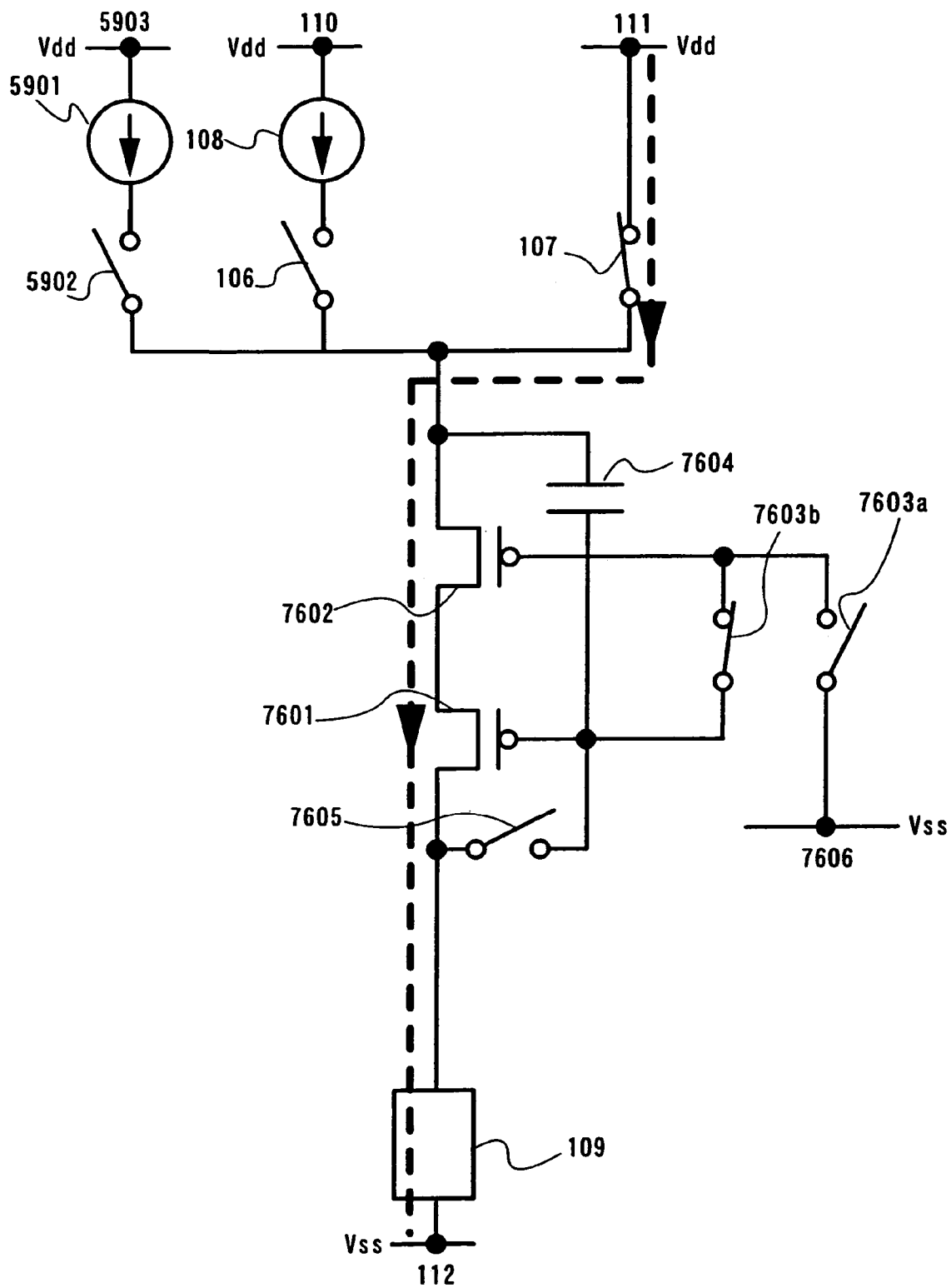
FIG. 79 is a diagram showing an operation of a current source circuit of the invention.

Next, as shown in FIG. 79, the switches 5902, 106, 7605, and 7603a are turned off and the switches 107 and 7603b are turned on. Then, a charge stored in the capacitor 7604 in the set operation is applied to the gate terminals of the current source transistor 7601 and the switching transistor 7602. As described above, the current as large as Ib1 flows to the load 109. The aforementioned operation corresponds to the output operation.

It is to be noted that a potential of the wiring 7606 is not limited to Vss and may have any value as long as it is sufficiently high to turn on the switching transistor 7602.

It is to be noted that the current source circuit shown in FIG. 76 is described in this embodiment mode, however, the configuration of the invention is not limited to this and various changes and modifications can be made unless such changes and modifications depart from the scope of the invention. For example, by changing the arrangement and number of switches, the polarity of each transistor, the number and arrangement of the current source transistor and the switching transistor, a potential of each wiring, a combination with other precharge operations, a direction of current flow and the like, various circuits can be employed in the configuration. Further, by combining each change also, a configuration using various circuits can be achieved.

Figure 80:
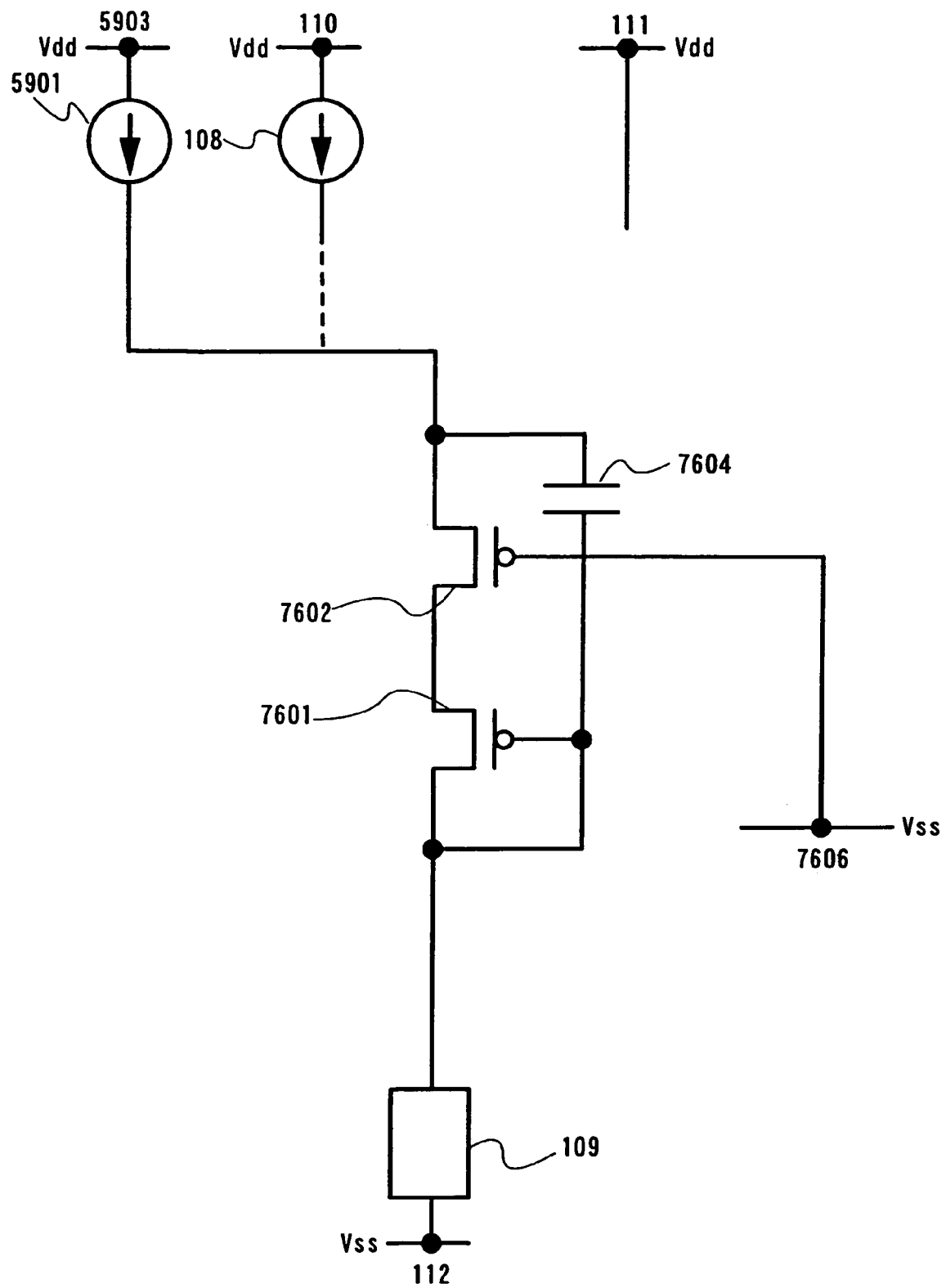
FIG. 80 is a diagram showing connections of a certain operation of a current source circuit of the invention.
Figure 81:
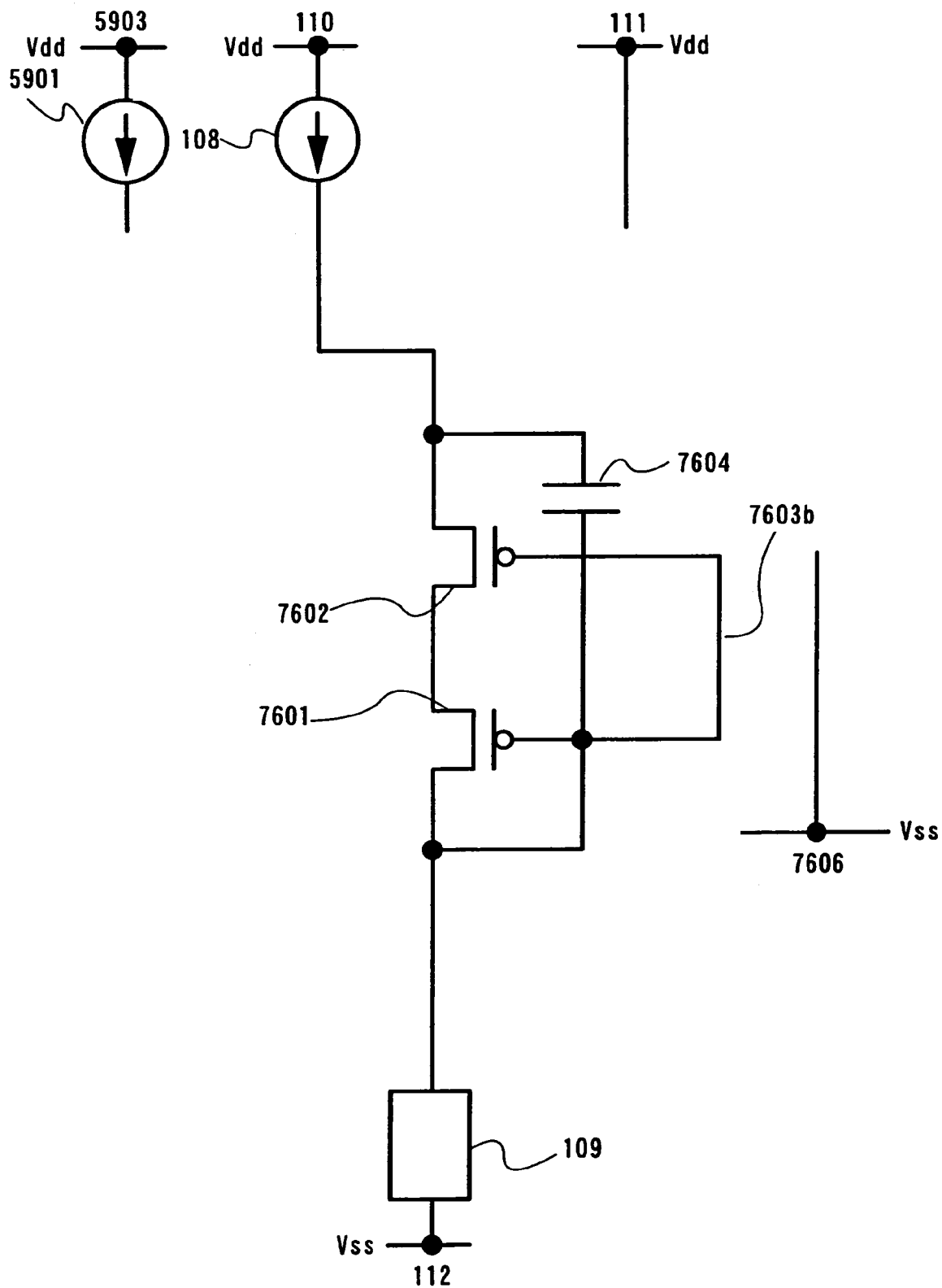
FIG. 81 is a diagram showing connections of a certain operation of a current source circuit of the invention.
Figure 82:
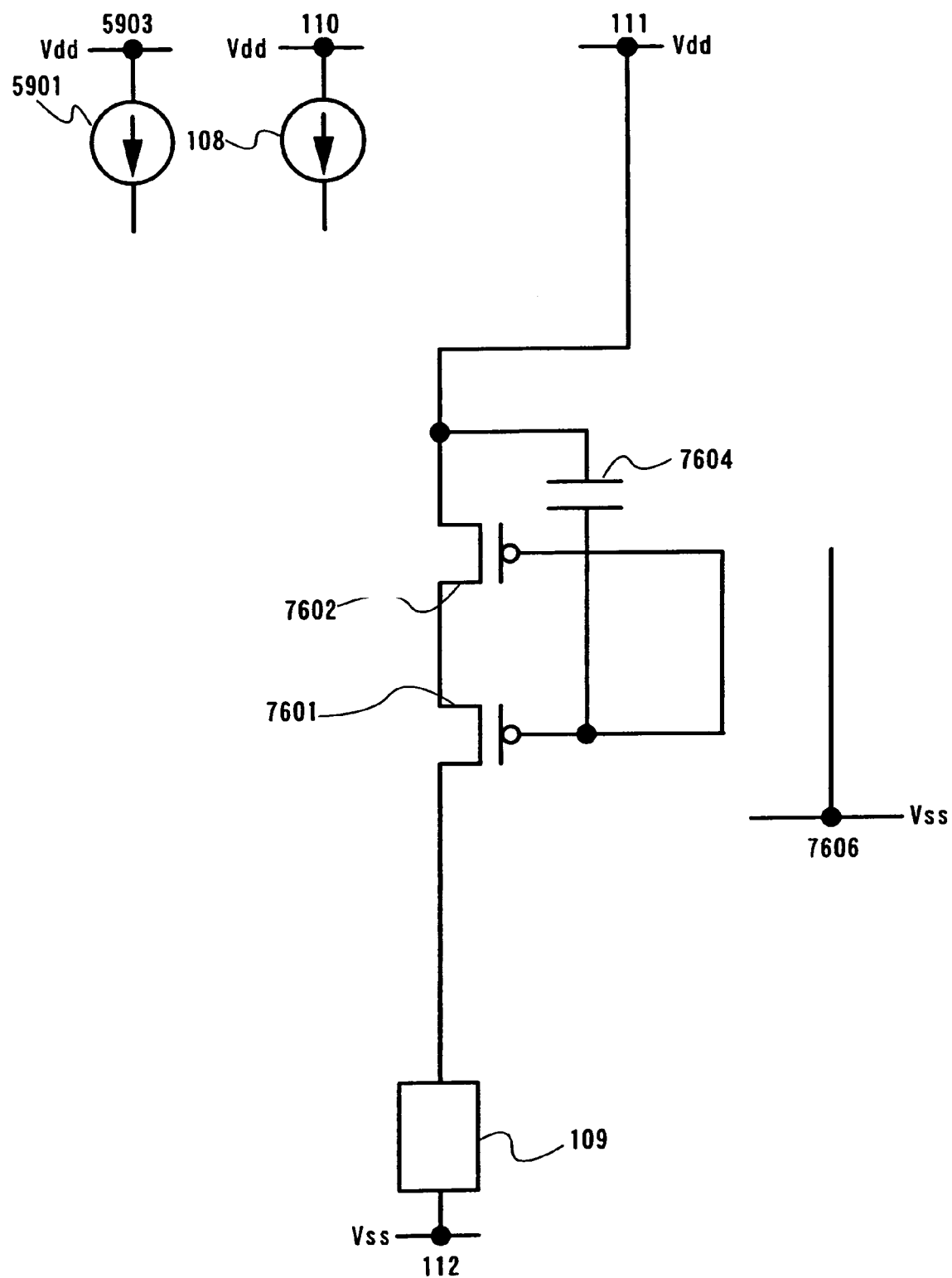
FIG. 82 is a diagram showing connections of a certain operation of a current source circuit of the invention.

For example, each switch may be arranged anywhere as long as it is connected as shown in FIG. 80 in the precharge operation, connected as shown in FIG. 81 in the set operation, and connected as shown in FIG. 82 in the output operation.

Figure 83:
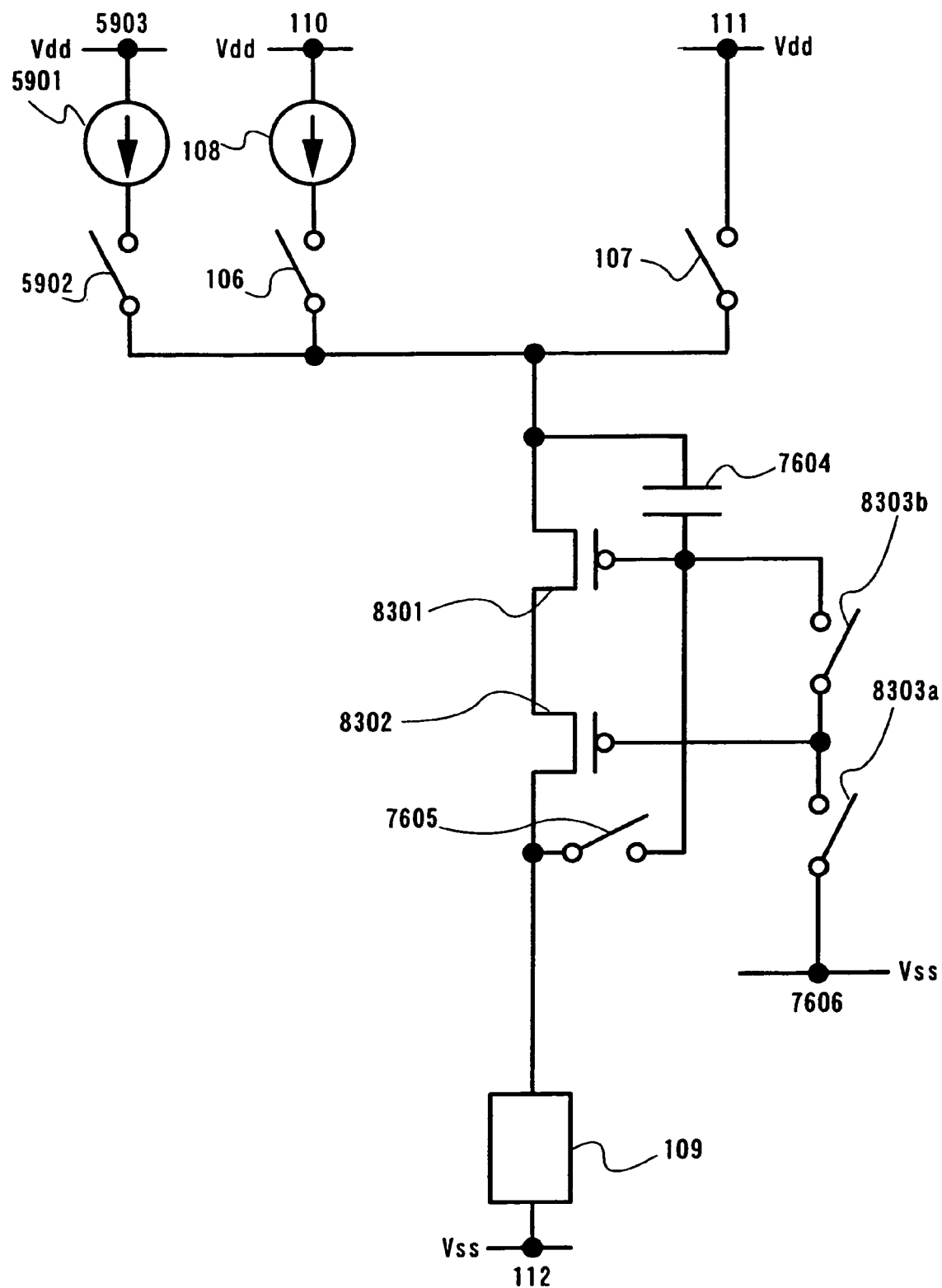
FIG. 83 is a diagram showing a configuration of a current source circuit of the invention.

FIG. 83 shows the case where the arrangements of the current source transistor 7601 and the switching transistor 7602 are interchanged. In FIG. 83, a current source transistor 8301, a switching transistor 8302, and the load 109 are arranged in this order.

Figure 84:
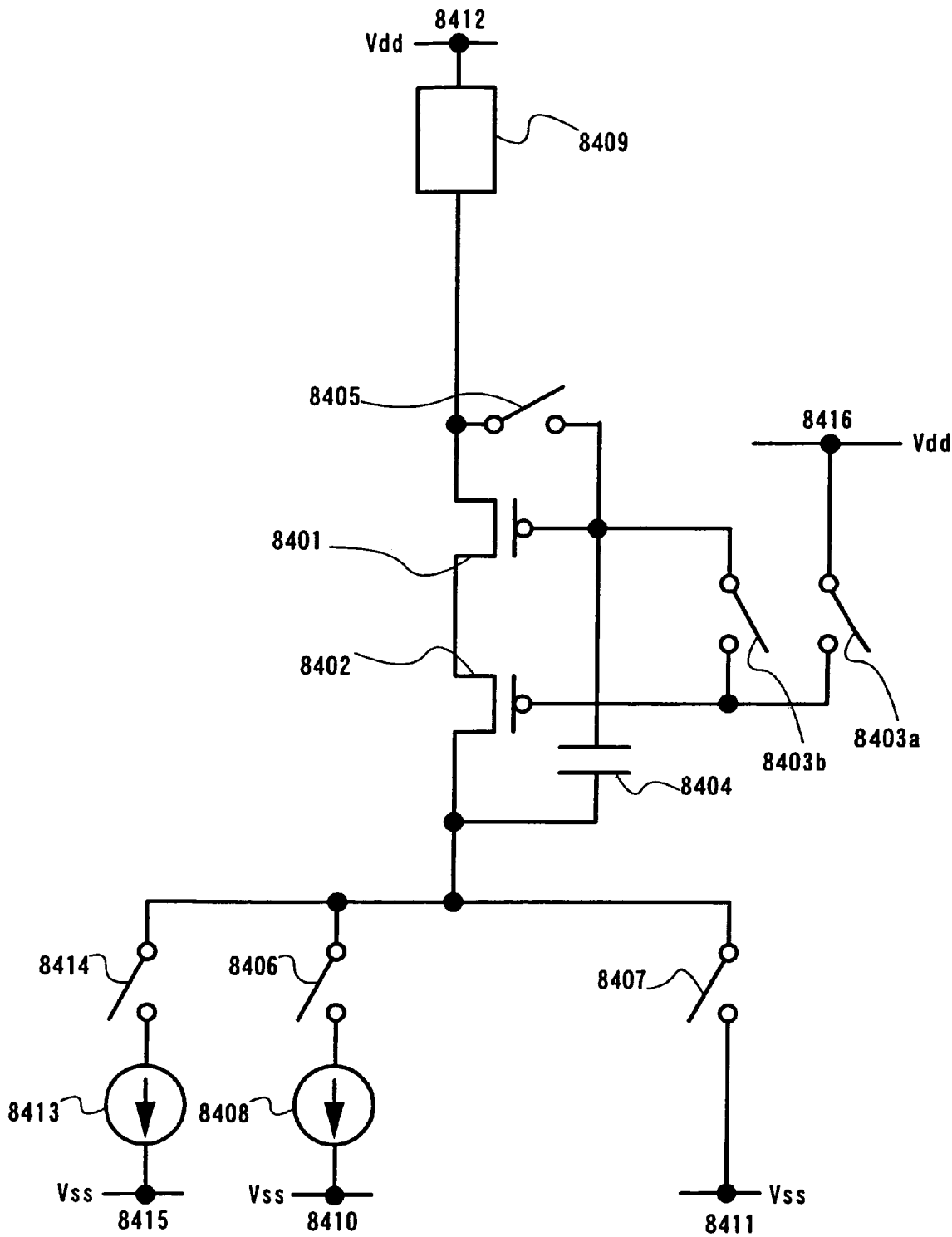
FIG. 84 is a diagram showing a configuration of a current source circuit of the invention.

FIG. 84 shows an example in which the polarity (conductivity) of the current source transistor 7601 and the switching transistor 7602 are changed and connections of the circuit are not changed in the circuit of FIG. 76. As in FIGS. 76 and 84, the polarity can be easily changed by changing potentials of the wirings 5903, 110, 111, and 112 so as to be those of wirings 8415, 8410, 8411, and 8412 and changing a direction of the currents of the reference current source 108 and the second reference current source 5901 so as to be those of a reference current source 8408 and a second reference current source 8413. The connections of a current source transistor 8401, a switching transistor 8402, switches 8403a, 8403b, 8407, 8405, 8406, and 8414, a reference current source 8404, a second reference current source 8413, a load 8409 and the like is not changed.

Figure 85:
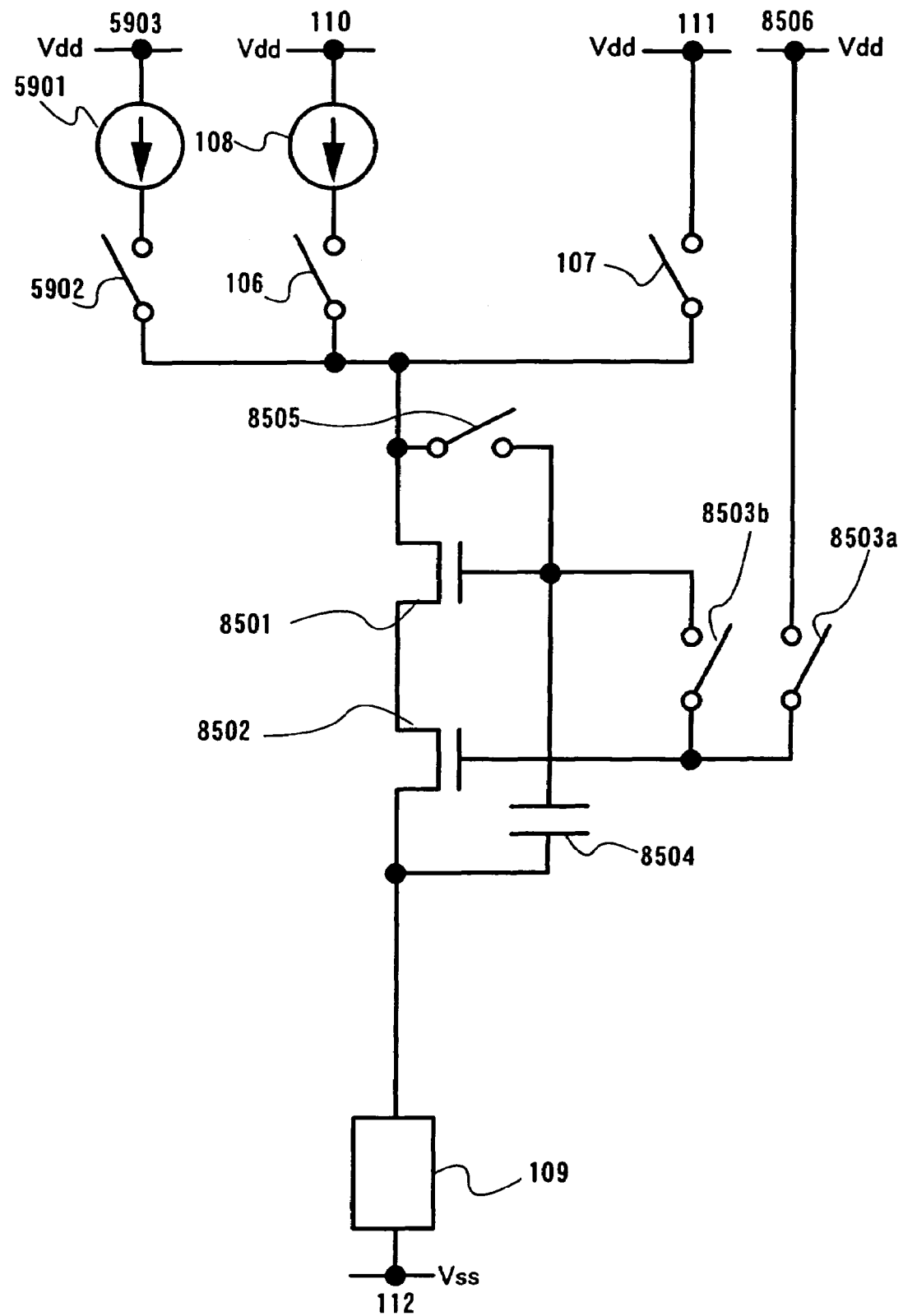
FIG. 85 is a diagram showing a configuration of a current source circuit of the invention.

FIG. 85 shows an example in which the polarity (conductivity) of the current source transistor 7601 and the switching transistor 7602 are changed by changing the connection of the circuit without changing the direction of current in the circuit of FIG. 76.

There are a current source transistor 8501 which constantly operates as a current source (or a part of it) and a switching transistor 8502 of which operation changes according to the circumstance. A load 109, the current source transistor 8501, and the switching transistor 8502 are connected in series. A gate terminal of the current source transistor 8501 is connected to one of the terminals of the capacitor 8504. The other terminal of the capacitor 8504 is connected to a source terminal of the switching transistor 8502 (the current source transistor 8501). Therefore, the capacitor 8504 can hold a gate-source voltage of the current source transistor 8501. Further, the gate terminal and a drain terminal of the current source transistor 8501 are connected via a switch 8505. The capacitor 8504 can be controlled to hold a charge by turning on/off of the switch 8505.

In this case also, the switches may be arranged anywhere as long as they can operate normally in the precharge operation, the set operation, and the output operation.

Figure 86:
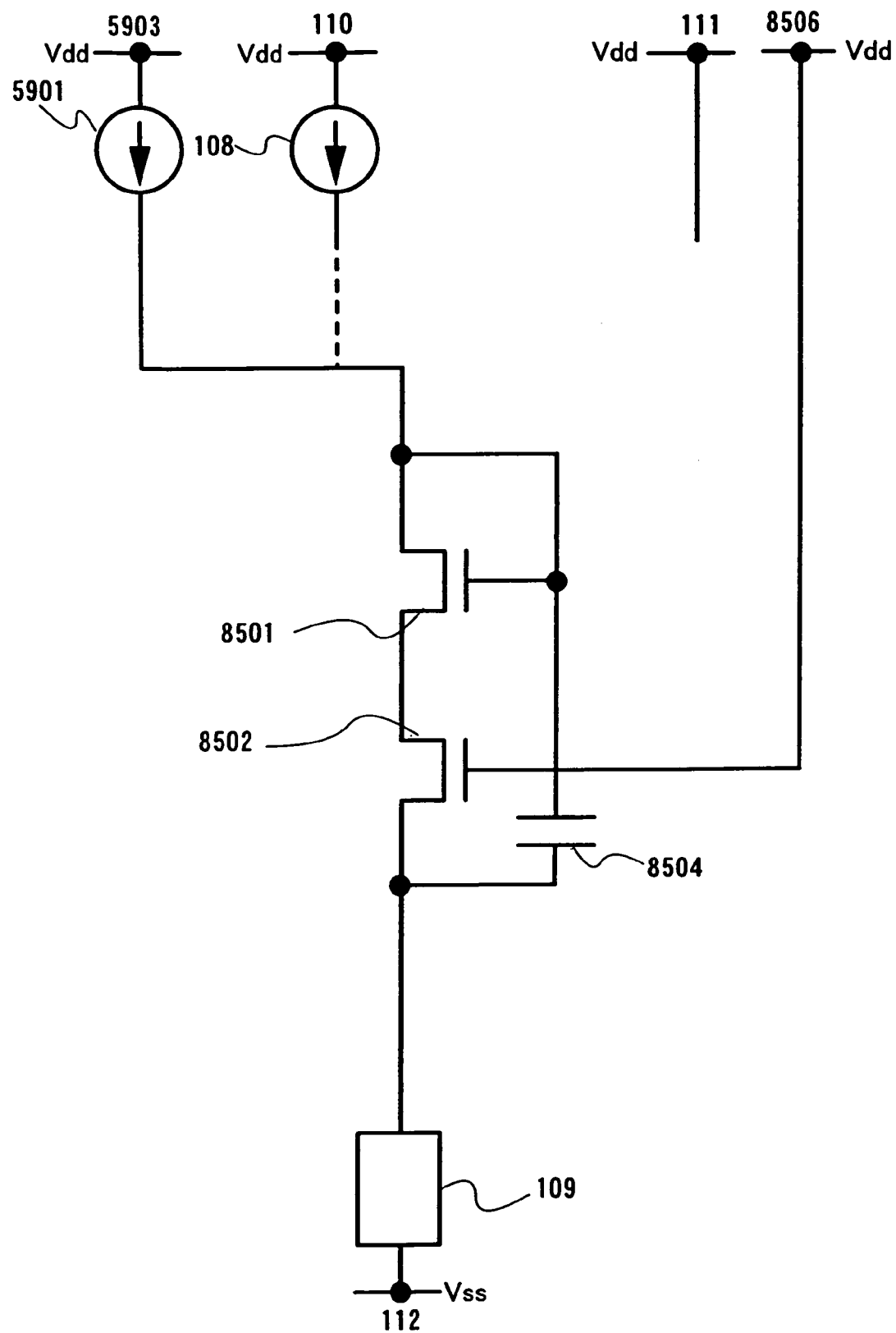
FIG. 86 is a diagram showing connections of a certain operation of a current source circuit of the invention.
Figure 87:
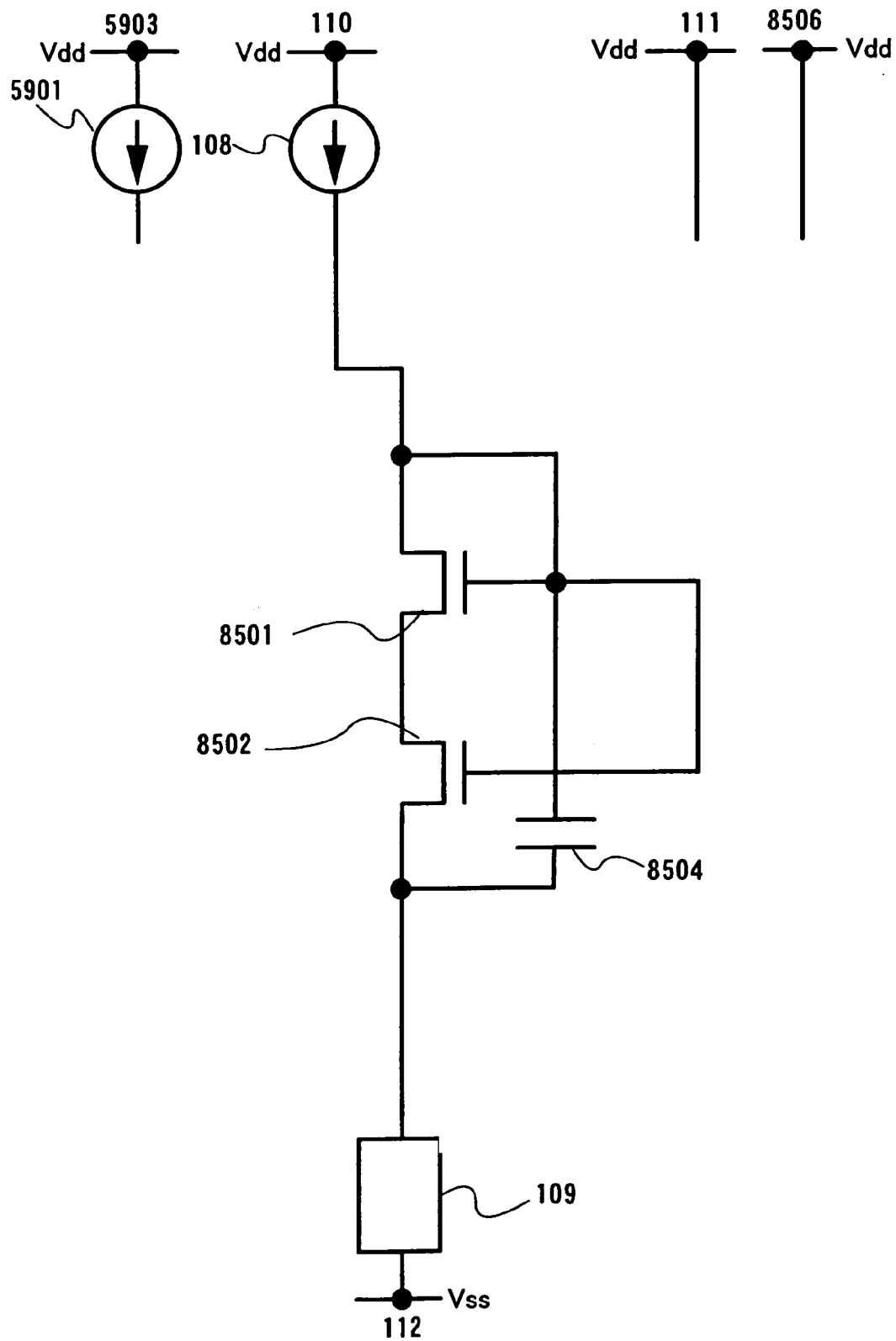
FIG. 87 is a diagram showing connections of a certain operation of a current source circuit of the invention.
Figure 88:
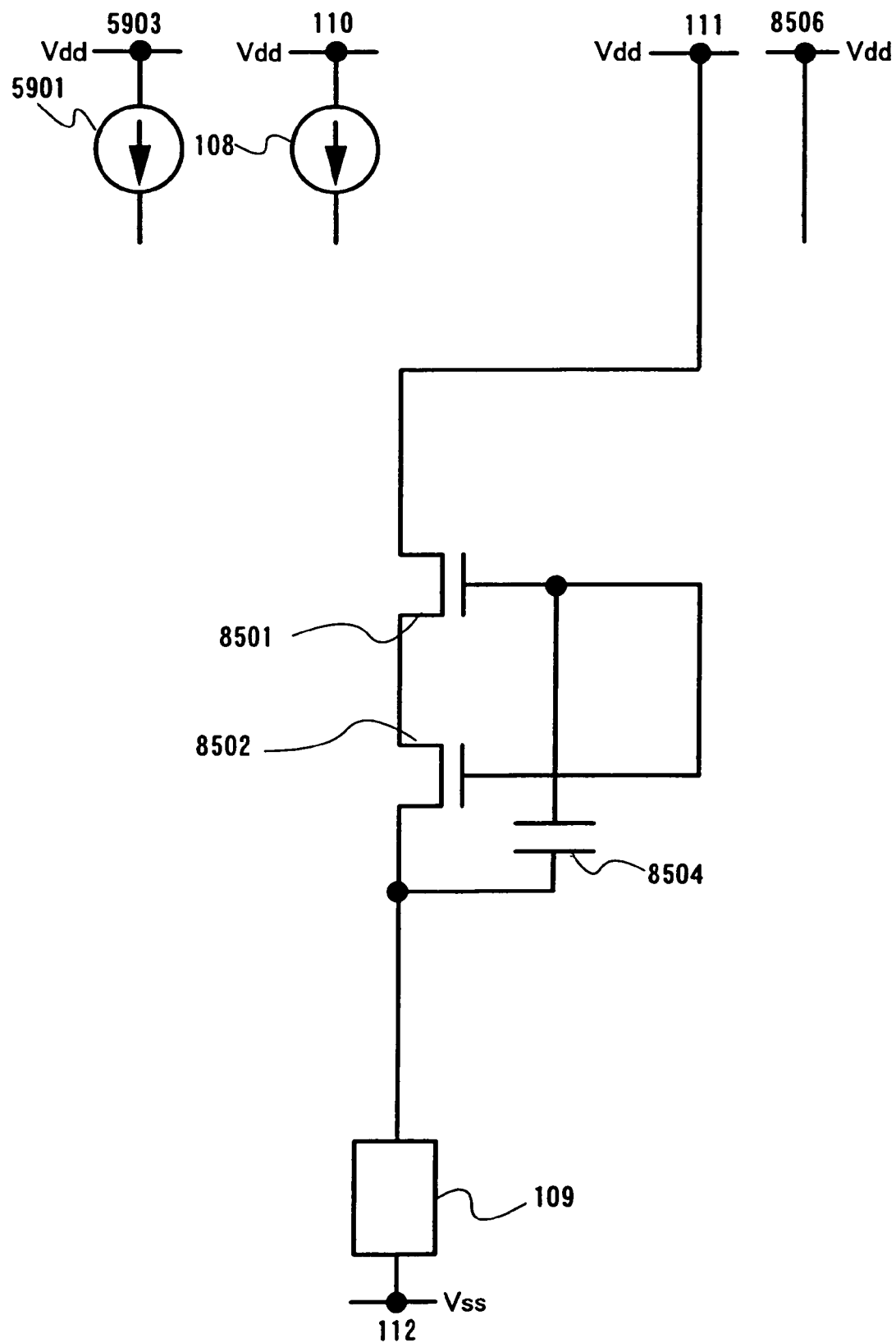
FIG. 88 is a diagram showing connections of a certain operation of a current source circuit of the invention.

For example, the switches may be arranged anywhere as long as they are connected as shown in FIG. 86 in the precharge operation, connected as shown in FIG. 87 in the set operation, and connected as shown in FIG. 88 in the output operation.

It is to be noted that the wiring 8506 is supplied with Vdd2 which is higher than Vdd. The invention is not limited to this, however, it is preferable to supply as high voltage as possible so that current drive capacity of the switching transistor 8502 becomes higher in the short-circuit operation.

In this manner, by changing the number and arrangement of switches, the polarity of each transistor, the number and arrangement of the current source transistor, the reference current source, and the switching transistor, a potential of each wiring, a combination with other precharge operation, a direction of current flow, and the like, various circuits can be configured. By using each change in combination, various circuits can be configured.

Embodiment Mode 7

In this embodiment mode, a configuration example in which transistors are connected in parallel and a sum of current values flowing through the transistors is changed to perform the precharge operation and the set operation will be described.

It is to be noted that the description already made in Embodiment Modes 5 and 6 will be omitted.

First, a configuration example in which the precharge operation and the set operation are performed by connecting transistors in parallel is described with reference to FIG. 114.

There are a set transistor 11401 which becomes conductive at least in the set operation and a charge transistor 11402 which becomes conductive in the precharge operation. The set transistor 11401 and the charge transistor 11402 are connected in parallel. A gate terminal of the set transistor 11401 is connected to one terminal of a capacitor 11404. Further, a gate terminal of the charge transistor 11402 is also connected to one terminal of the capacitor 11404. The other terminal of the capacitor 11404 is connected to source terminals of the set transistor 11401 and the charge transistor 11402. Therefore, the capacitor 11404 can hold a potential of the gate terminal of the set transistor 11401. The other terminal of the capacitor 11404 is connected to the wiring 110 via the switch 106 and the reference current source 108, and in parallel to this, connected to the wiring 5903 via the switch 5902 and the second reference current source 5901, and in parallel to this, connected to the wiring 111 via the switch 107. Further, a node 11405 and a drain terminal of the current source transistor 11401 are connected via a switch 11403a. The node 11405 and the drain terminal of the set transistor 11402 are connected via a switch 11403b. The node 11405 and the gate terminal of the set transistor 11401 are connected via a switch 11403c. The capacitor 11404 is controlled to hold a charge by turning on/off the switch 11403c. Moreover, the terminal 11405 and the wiring 112 are connected via the load 109.

Figure 114:
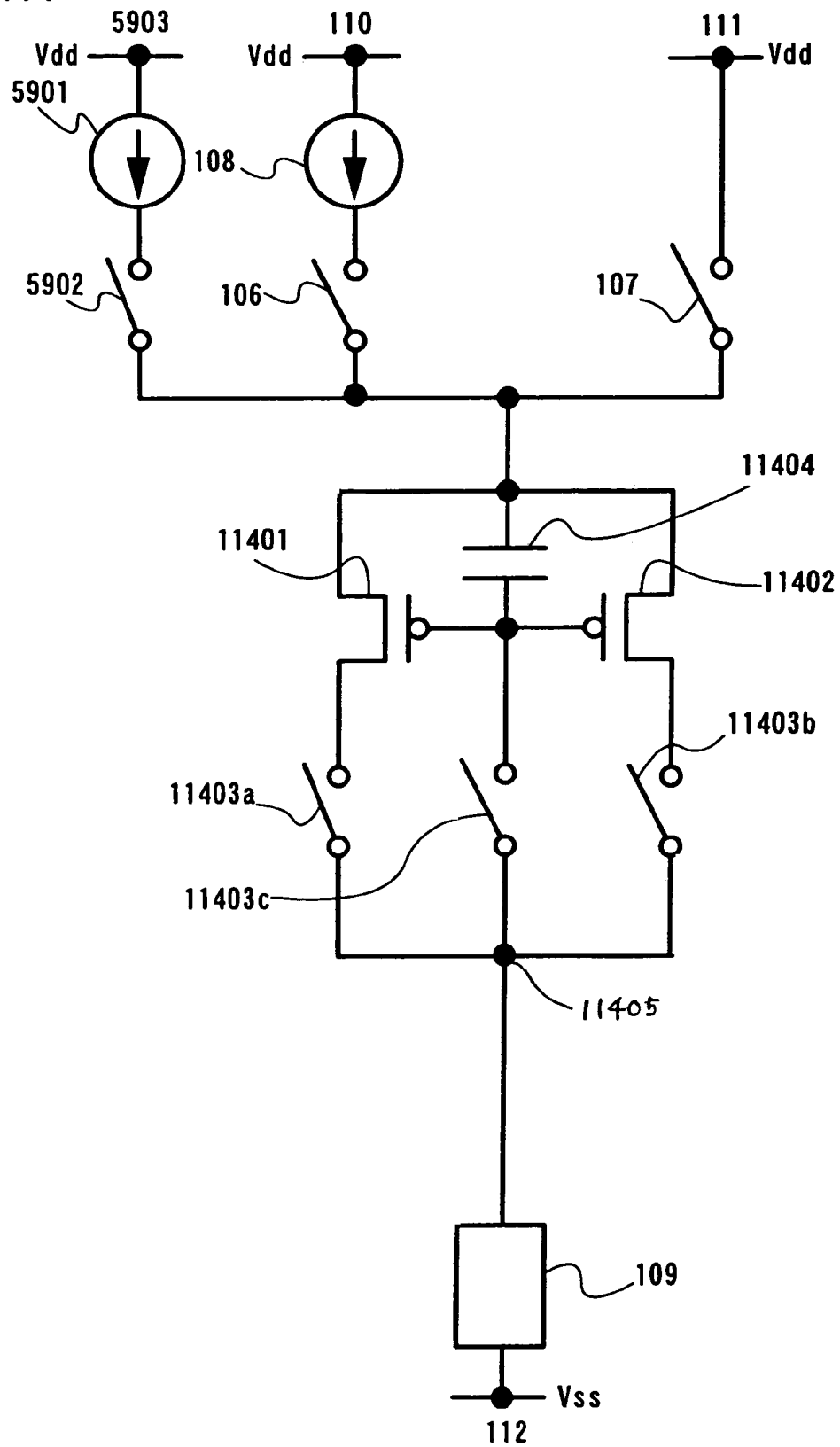
FIG. 114 is a diagram showing a configuration of a current source circuit of the invention.

The precharge operation can be performed by using a circuit configuration as shown in FIG. 114. By performing the set operation after the precharge operation, the steady state can be obtained rapidly.

Figure 115:
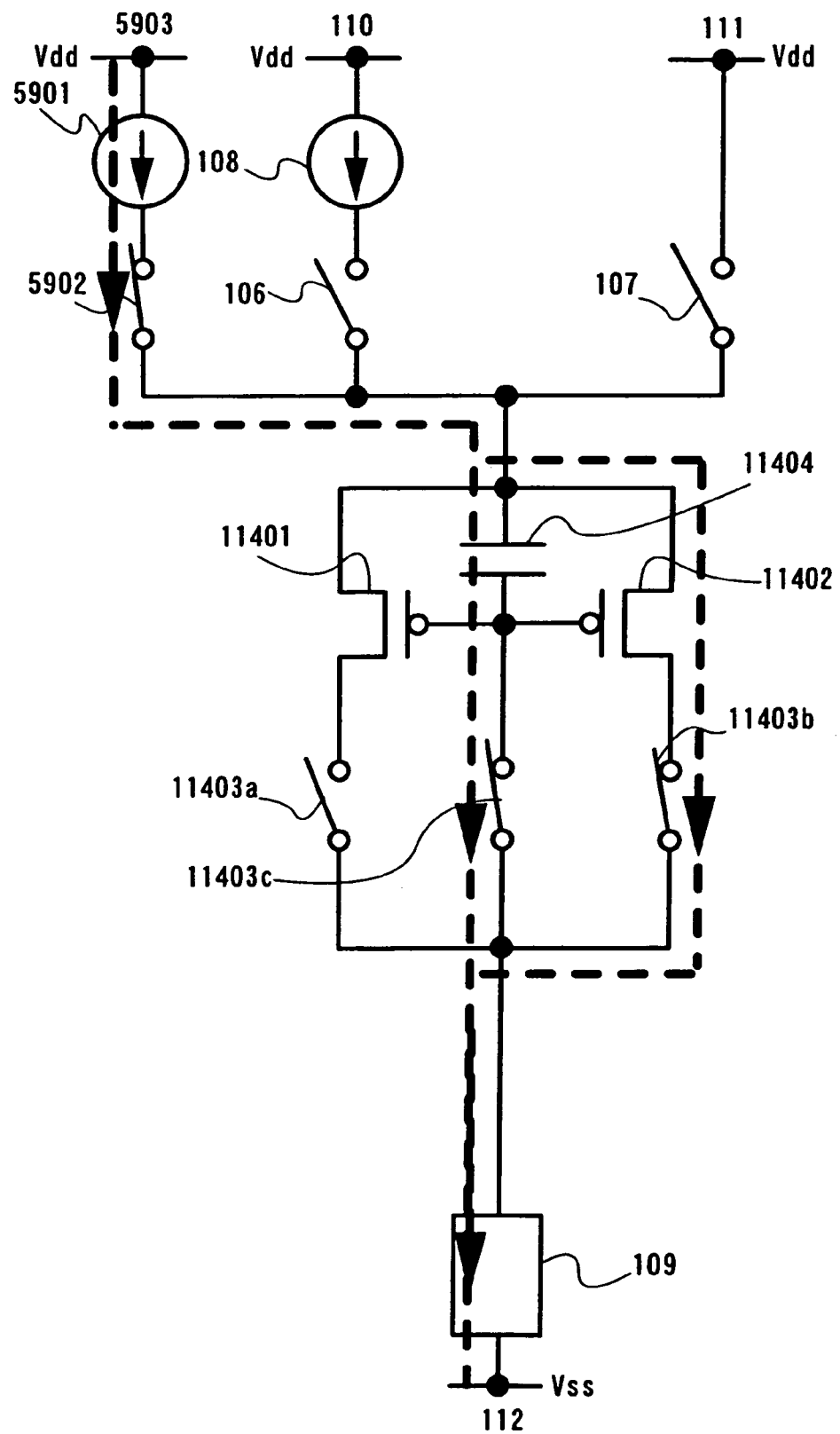
FIG. 115 is a diagram showing an operation of a current source circuit of the invention.

An operation of FIG. 114 is described. As shown in FIG. 115, the switches 5902, 11403b, and 11403c are turned on and the switches 106, 107 and 11403a are turned off. Then, a current does not flow between the source and drain of the set transistor 11401. Therefore, the current Ib2 of the second reference current source 5901 flows to the capacitor 11404 and the charge transistor 11402. When the current flowing between the source and drain of the charge transistor 11402 and the current Ib2 of the second reference current source 5901 become equal, a current stops flowing to the capacitor 11404. That is, the steady state is obtained. A potential of the gate terminal of the charge transistor 11402 is accumulated in the capacitor 11404. That is, a voltage required to supply the current Ib2 between the source and drain of the charge transistor 11402 is applied to the gate terminal thereof. The aforementioned operation corresponds to the precharge operation.

Figure 116:
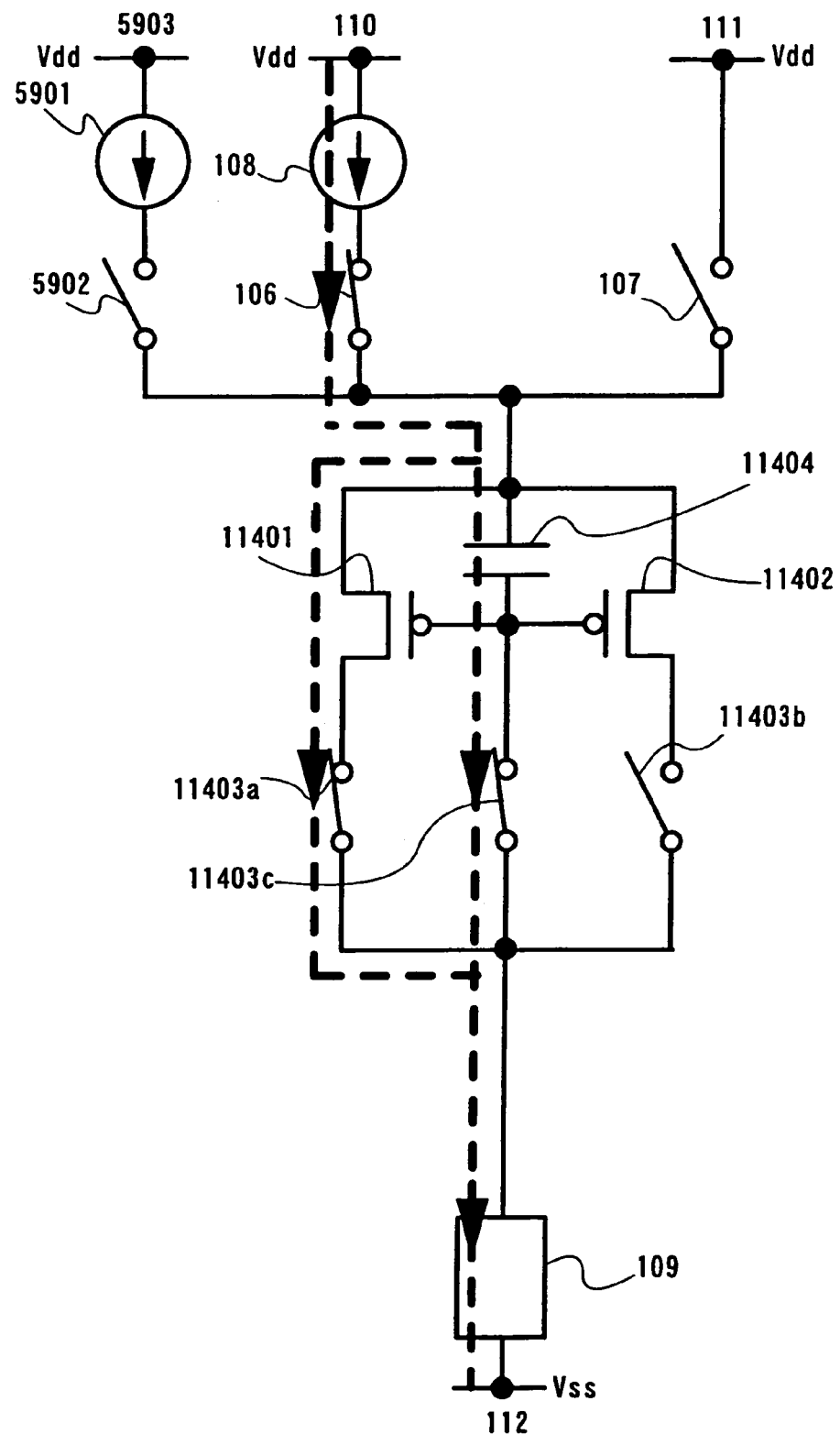
FIG. 116 is a diagram showing an operation of a current source circuit of the invention.

Next, as shown in FIG. 116, the switches 106, 11403a, and 11403c are turned on and the switches 5902, 107, and 11403b are turned off. As the switch 11403b is off, a current stops flowing between the source and drain of the charge transistor 11402. Therefore, the current Ib1 of the reference current source 108 flows to the capacitor 11404 and the set transistor 11401.

When the current flowing between the source and drain of the set transistor 11401 and the current Ib1 of the reference current source 108 become equal, a current stops flowing to the capacitor 11404. That is, the steady state is obtained. A potential of the gate terminal of the set transistor 11401 at that time is accumulated in the capacitor 11404. That is, a voltage required to supply the current Ib1 between the source and drain of the set transistor 11401 is applied to the gate terminal thereof. The aforementioned operation corresponds to the set operation.

It is to be noted that the current Ib1 of the reference current source 108, the current Ib2 of the second reference current source 5901, and the transistor size (gate width W and gate length L) of the set transistor 11401 and the charge transistor 11402 are appropriately set at this time so that a charge accumulated in the capacitor 11404, that is a potential of a gate terminal of the set transistor 11401 (or the charge transistor 11402) becomes approximately equal between the precharge operation and the set operation.

In the case where a current value of the current Ib2 of the second reference current source 5901 is larger than that of the current Ib1 of the reference current source 108, the capacitor 11404 can be charged rapidly in the precharge operation, thus the steady state can be obtained. In the set operation after that, the steady state can be obtained rapidly even when the current Ib1 of the reference current source 108 is small. This is because the capacitor 11404 is almost charged by the precharge operation.

Figure 117:
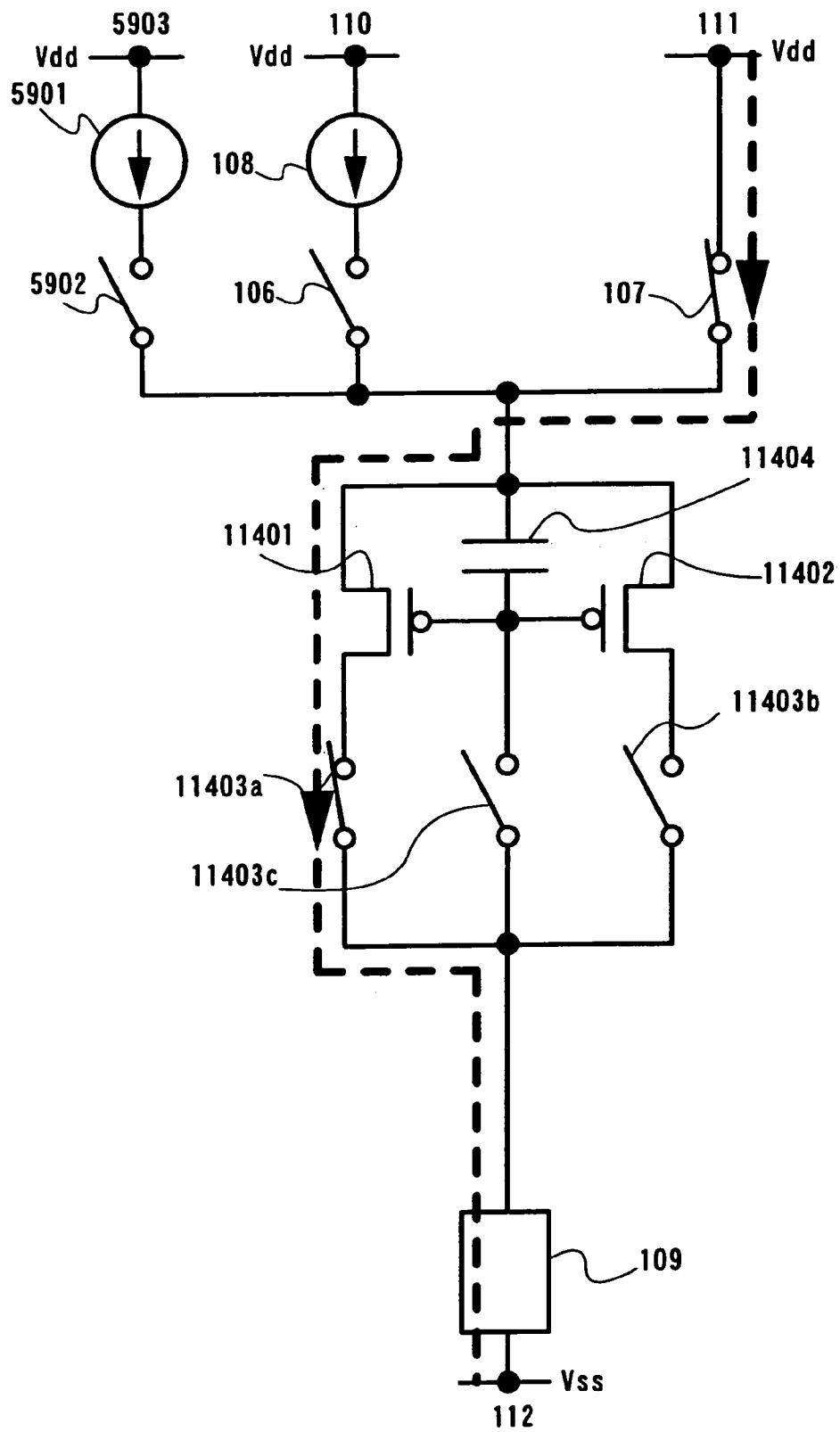
FIG. 117 is a diagram showing an operation of a current source circuit of the invention.

Next, the switches 5902, 106, 11403b, and 11403c are turned off and the switches 107 and 11403a are turned on as shown in FIG. 117. Then, a current flows to the load 109. The aforementioned operation corresponds to the output operation.

In this manner, by controlling on/off of the switches 11403a and 11403b, a current flowing in the precharge operation can be large, thus the steady state can be obtained rapidly. That is, an effect of capacitance (wiring resistance, intersection capacitance and the like) which is parasitic on a wiring through which a current flows is lessened, thus the steady state can be obtained rapidly. At that time, a state close to the steady state in the set operation is already obtained. Therefore, the steady state can be rapidly obtained in the set operation after the precharge operation.

Therefore, for example, in the case where the load 109 is an EL element, a signal can be written rapidly when writing a signal in the case where the EL element is to emit light at a low gray scale level.

Hereinafter described is a condition that a voltage accumulated in the capacitor 11404 becomes approximately the same between the precharge operation and the set operation. First, a gate width and a gate length of the charge transistor 11402 are set Wa and La respectively while a gate width and a gate length of the set transistor 11402 are set Wb and Lb respectively. A current which flows in the set operation (in FIG. 116, the current Ib1 of the reference current source 108) times A equals a current which flows in the precharge operation (in FIG. 115, the current Ib2 of the second reference current source 5901).

In general, a current which flows between a source and a drain of a transistor is in proportion to a ratio W/L of a channel width W and a channel length L. Thus, a relation between a ratio of a gate width and a gate length in the precharge operation: Wa/La and a ratio thereof in the set operation: Wb/Lb is considered. The current Ib1 of the reference current source 108 times A equals the amount of the current Ib2 of the second reference current source 5901, therefore, each value is to be set so that Wb/Lb times A equals Wa/La. Accordingly, a voltage of the capacitor 11404 (a potential of each gate terminal of the charge transistor 11402 and the set transistor 11401) in time T2$a$ in FIG. 173 becomes approximately equal to a potential in time T2$b$.

It is to be noted that the capacitor 11404 can be substituted by gate capacitance of the charge transistor 11402 and the set transistor 11401. In that case, the capacitor 11404 can be omitted.

It is to be noted that the switches 5902, 11403$b$, and 11403$c$ are turned on and the switches 106, 107, and 11403$a$ are turned off so that a current does not flow to the set transistor 11401 in the precharge operation in FIG. 115, however, the invention is not limited to this. For example, the switches 5902, 11403$a$, 11403$b$, and 11403$c$ may be turned on and the switches 106 and 107 may be turned off so that a current flows to the set transistor 11401 as shown in FIG. 118.

Figure 118:
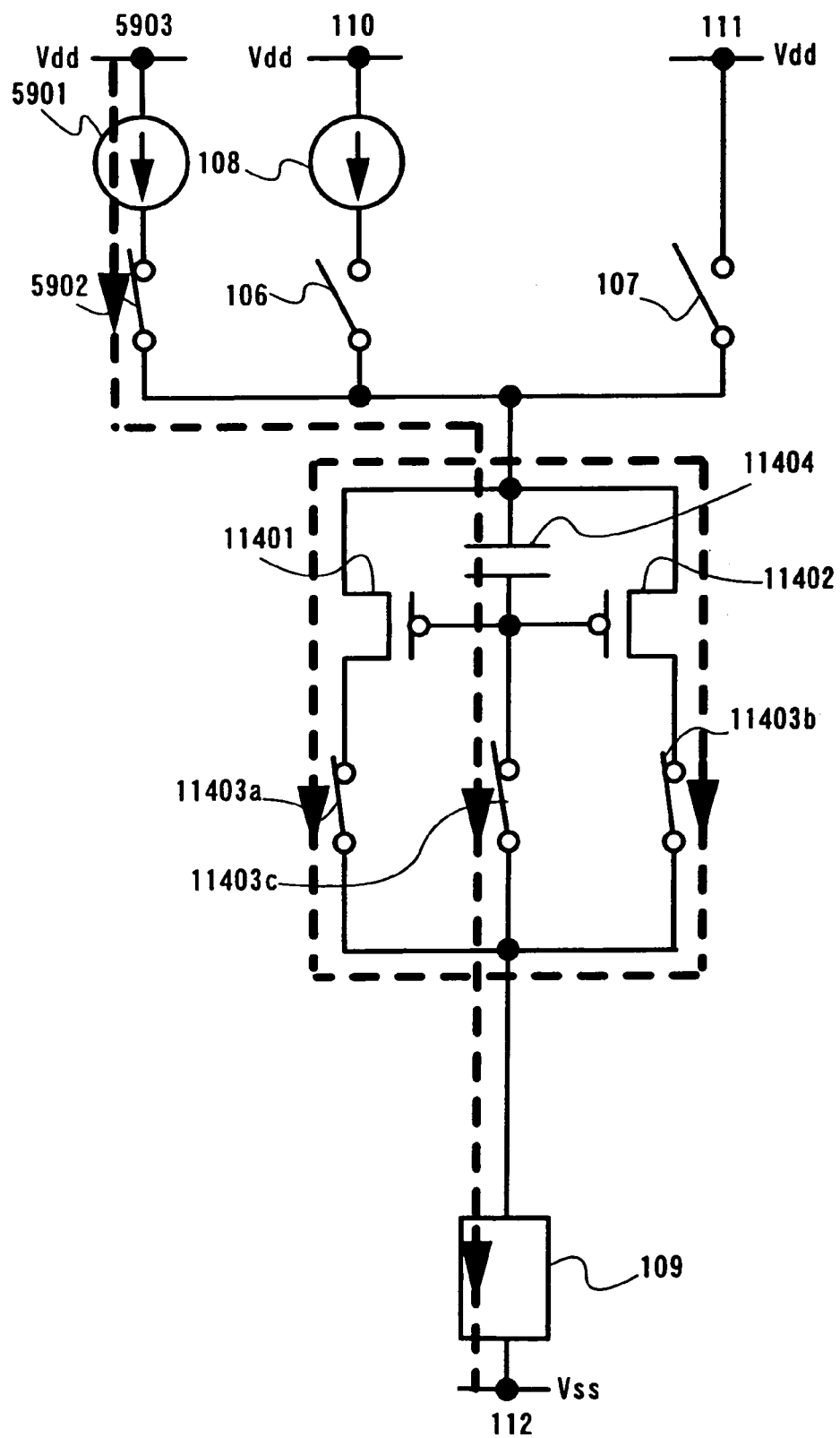
FIG. 118 is a diagram showing an operation of a current source circuit of the invention.
Figure 119:
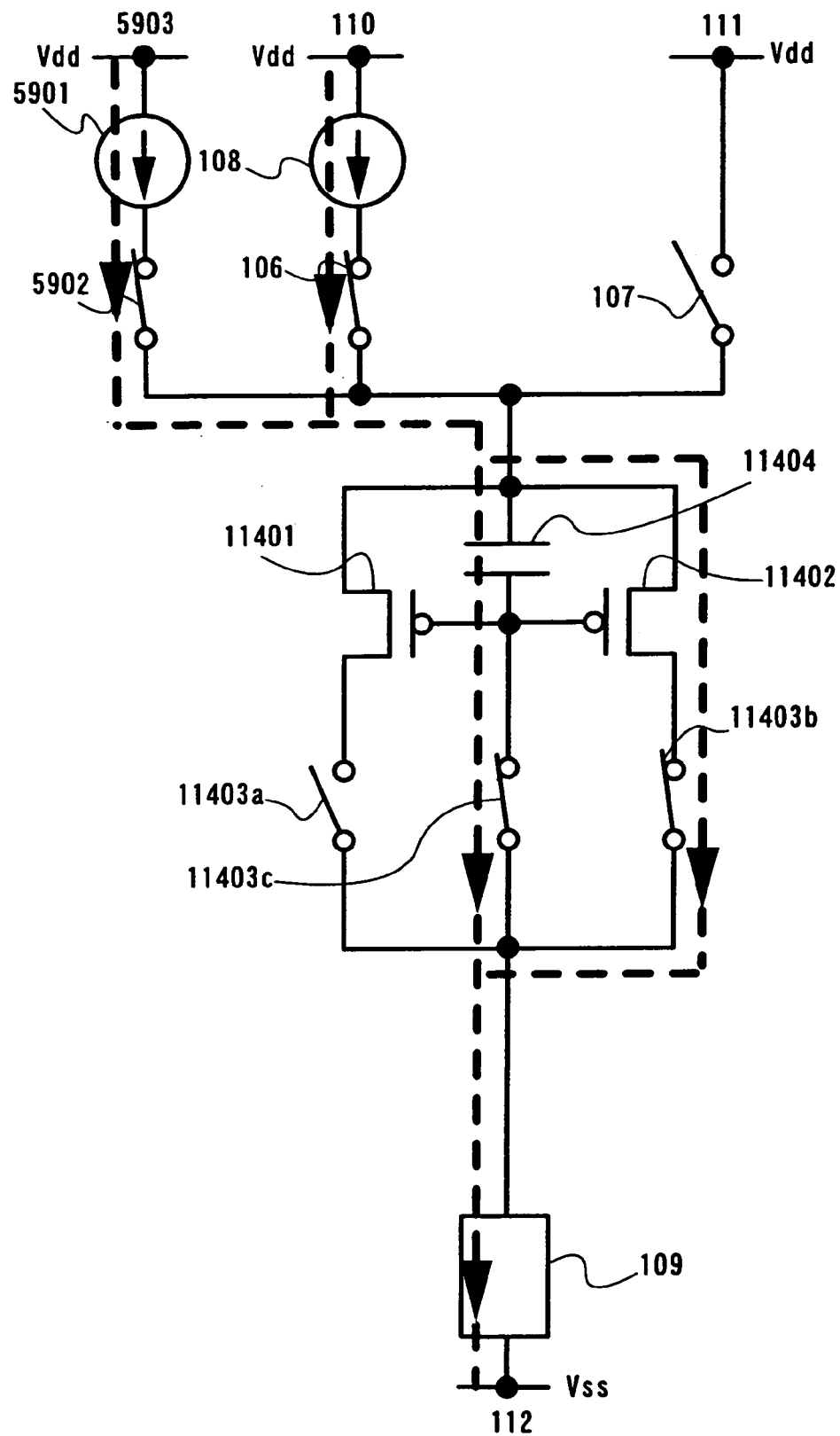
FIG. 119 is a diagram showing an operation of a current source circuit of the invention.

In FIGS. 115 and 118 in the precharge operation, the switch 5902 is turned on and the switches 106 and 107 are turned off so that a current of the second reference current source 5901 flows and a current of the reference current source 108 does not flow, however, the invention is not limited to this. For example, as shown in FIG. 119, the switches 5902 and 106 may be turned on and the switch 107 may be turned off so that currents of the second reference current source 5901 and the reference current source 108 flow.

Figure 120:
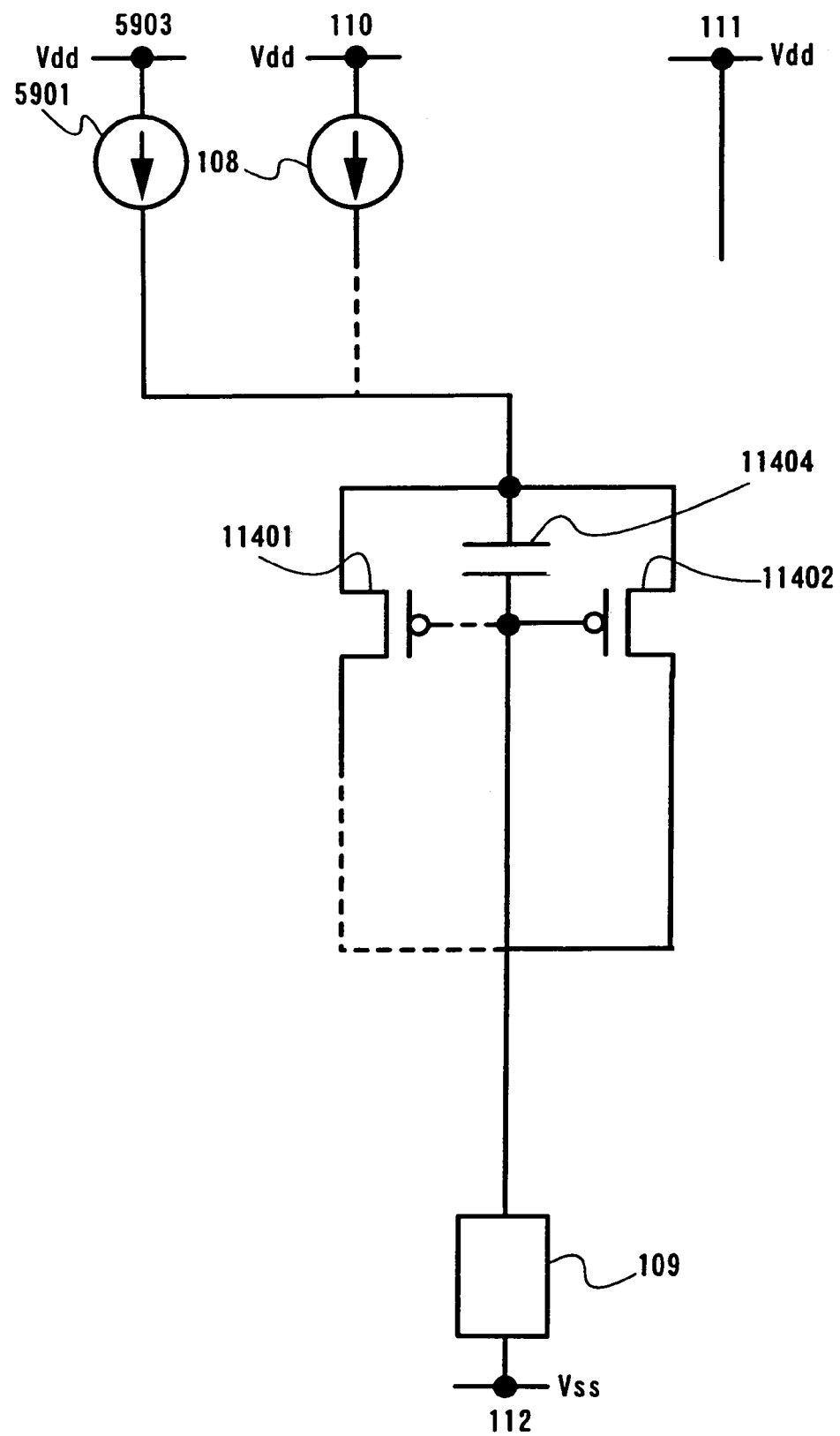
Figure 121:
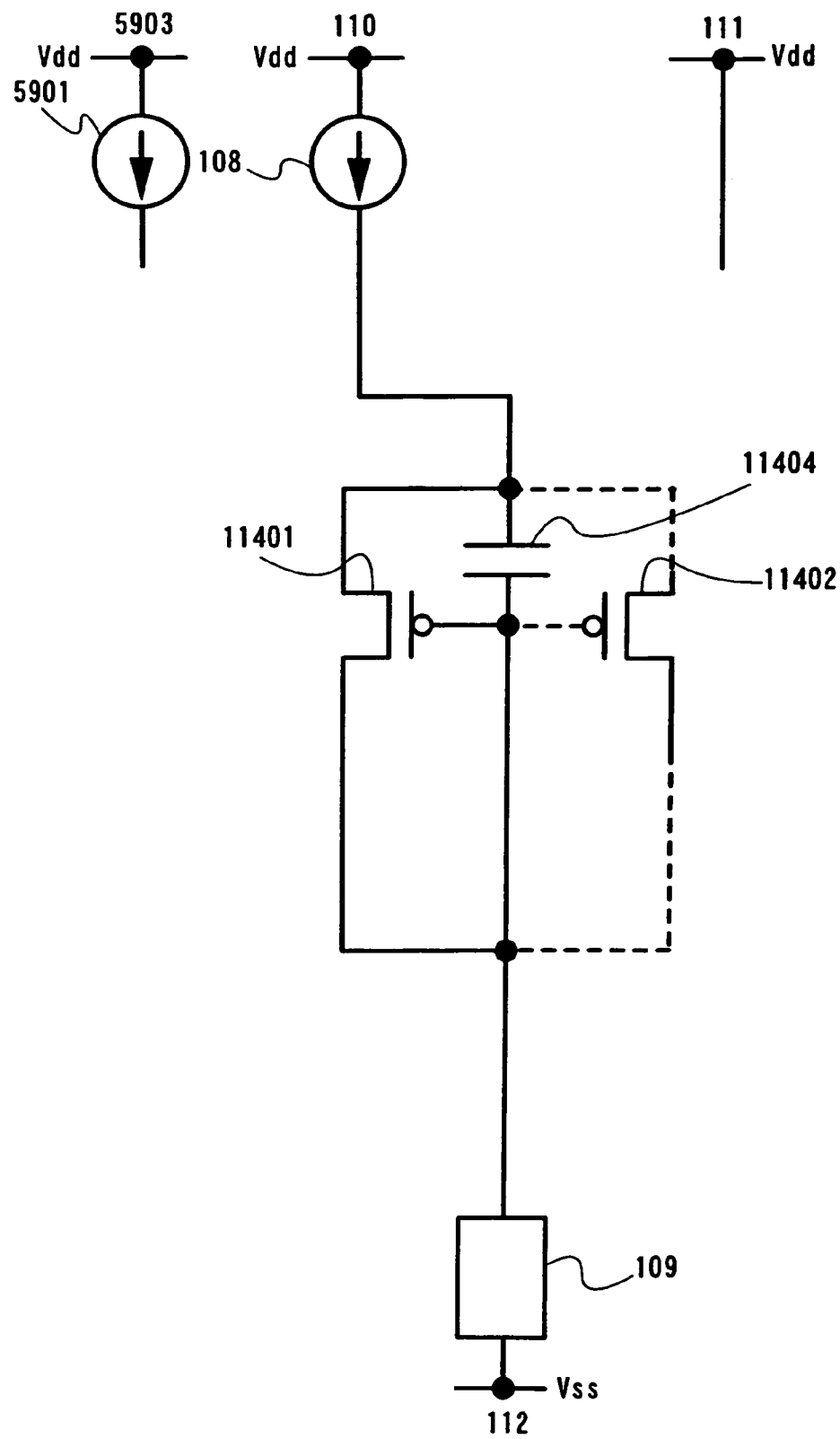
Figure 122:
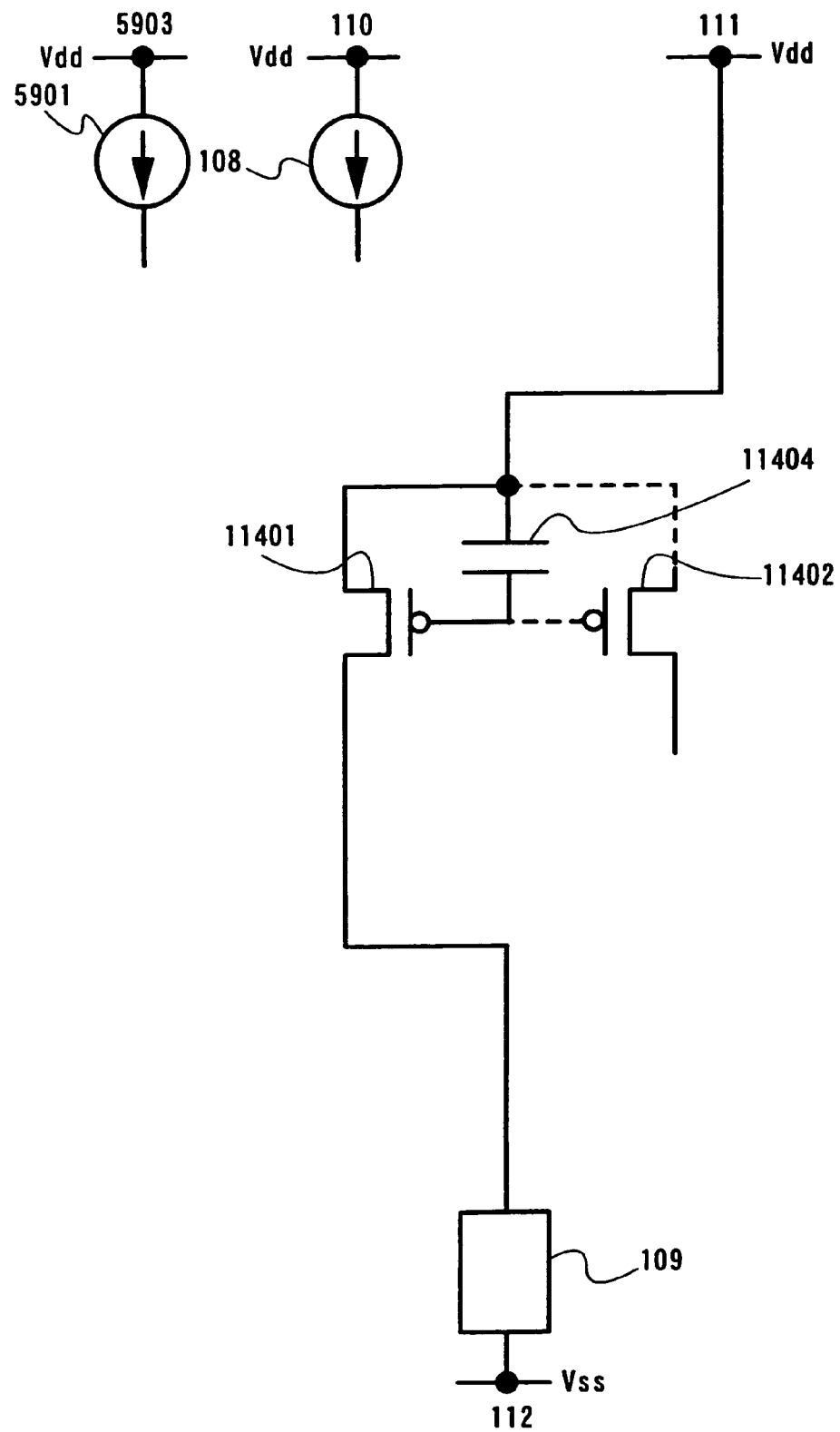

For example, the elements may be arranged anywhere as long as they are connected as shown in FIG. 120 in the precharge operation, connected as shown in FIG. 121 in the set operation, and connected as shown in FIG. 122 in the output operation.

It is to be noted that the wirings 5903, 110, and 111 are supplied with a high potential power source Vdd, however, the invention is not limited to this. Each wiring may have the same potential or different potentials. The wiring 5903, 110, or 111 is not required to hold the same potential at all times. Each of them may have different potentials between the set operation and the output operation as long as it operates normally.

It is to be noted that the charge transistor 11402 and the set transistor 11401 preferably have the same polarity (conductivity) as they are required to have approximately equal gate potentials between the precharge operation and the set operation.

It is to be noted that a gate width W of the charge transistor 11402 and the set transistor 11401 may be the same or different. Similarly, a gate length L thereof may be the same or different. By forming the gate length L of the set transistor 11401 longer, a current which flows in the set operation and the output operation becomes smaller. Further, a current value does not easily change even when a source-drain voltage changes in the saturation region. That is, kink effect can be reduced. Similarly, by forming a gate width W of the set transistor 11401 shorter than that of the charge transistor 11402, a current which flows in the set operation and the output operation becomes smaller. Therefore, the gate width and length are to be designed depending on the circumstances.

As shown in FIG. 114, in this embodiment mode, the configuration of the invention is not limited to this and various changes and modifications can be made unless such changes and modifications depart from the scope of the invention. Similarly to Embodiment Modes 5 and 6, for example, by changing the number and arrangement of switches, the polarity of each transistor, the number and arrangement of the charge transistor 11402 and the set transistor 11401, a potential of each wiring, a combination with other precharge operation, and a direction of current flow and the like, various circuits can be configured. By using each change in combination, various circuits can be configured.

Figure 123:
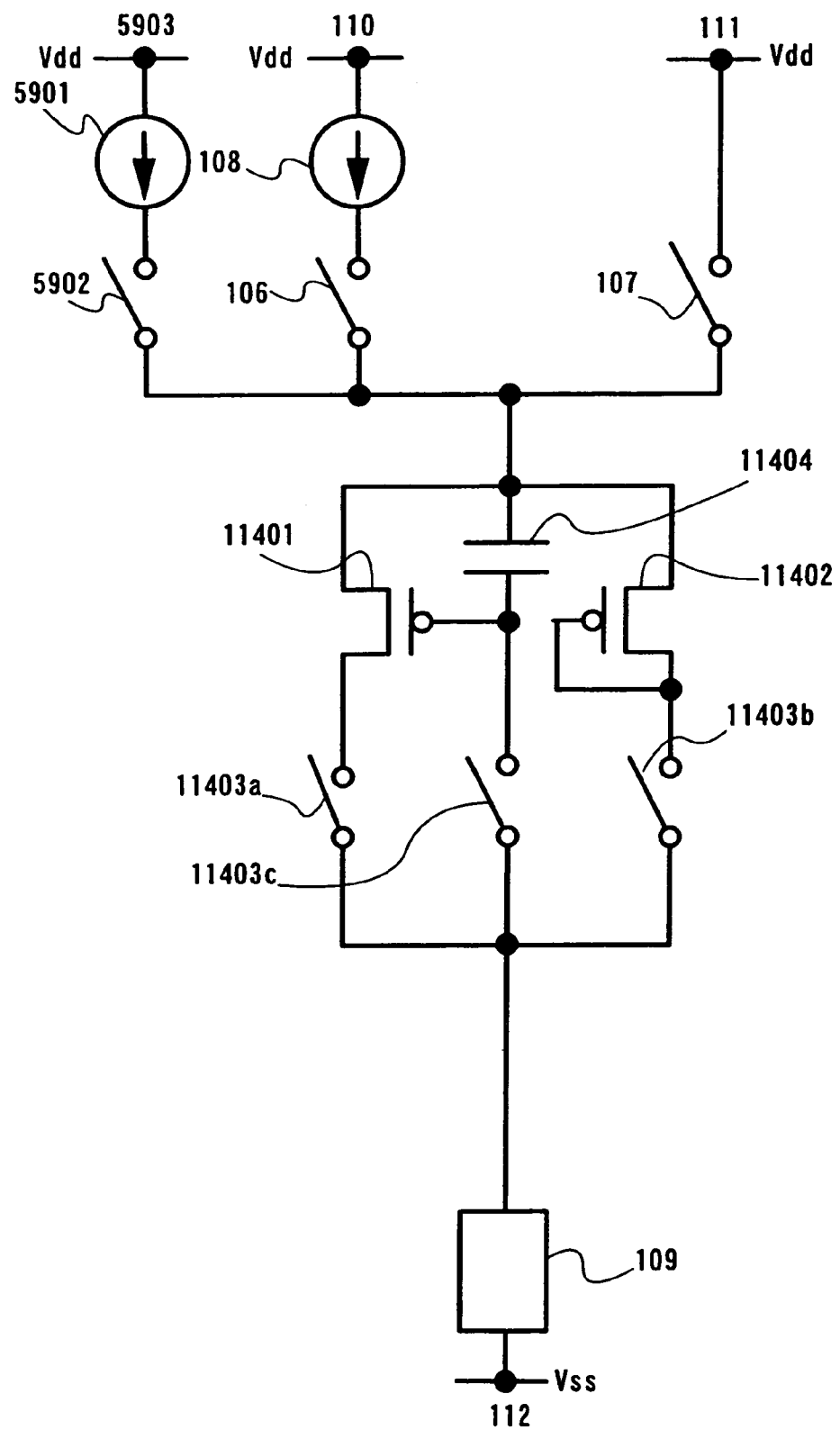
Figure 124:
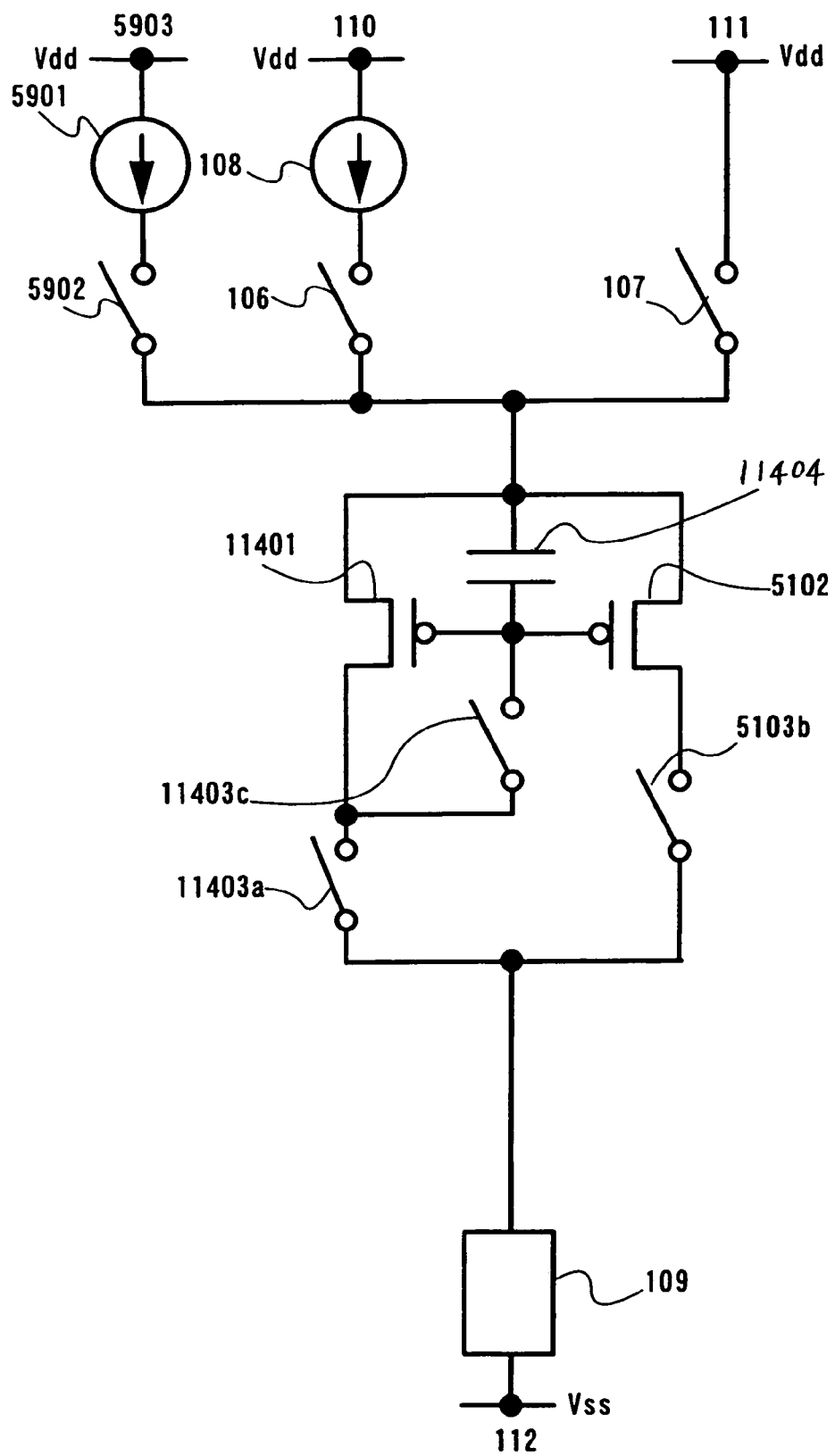
Figure 127:
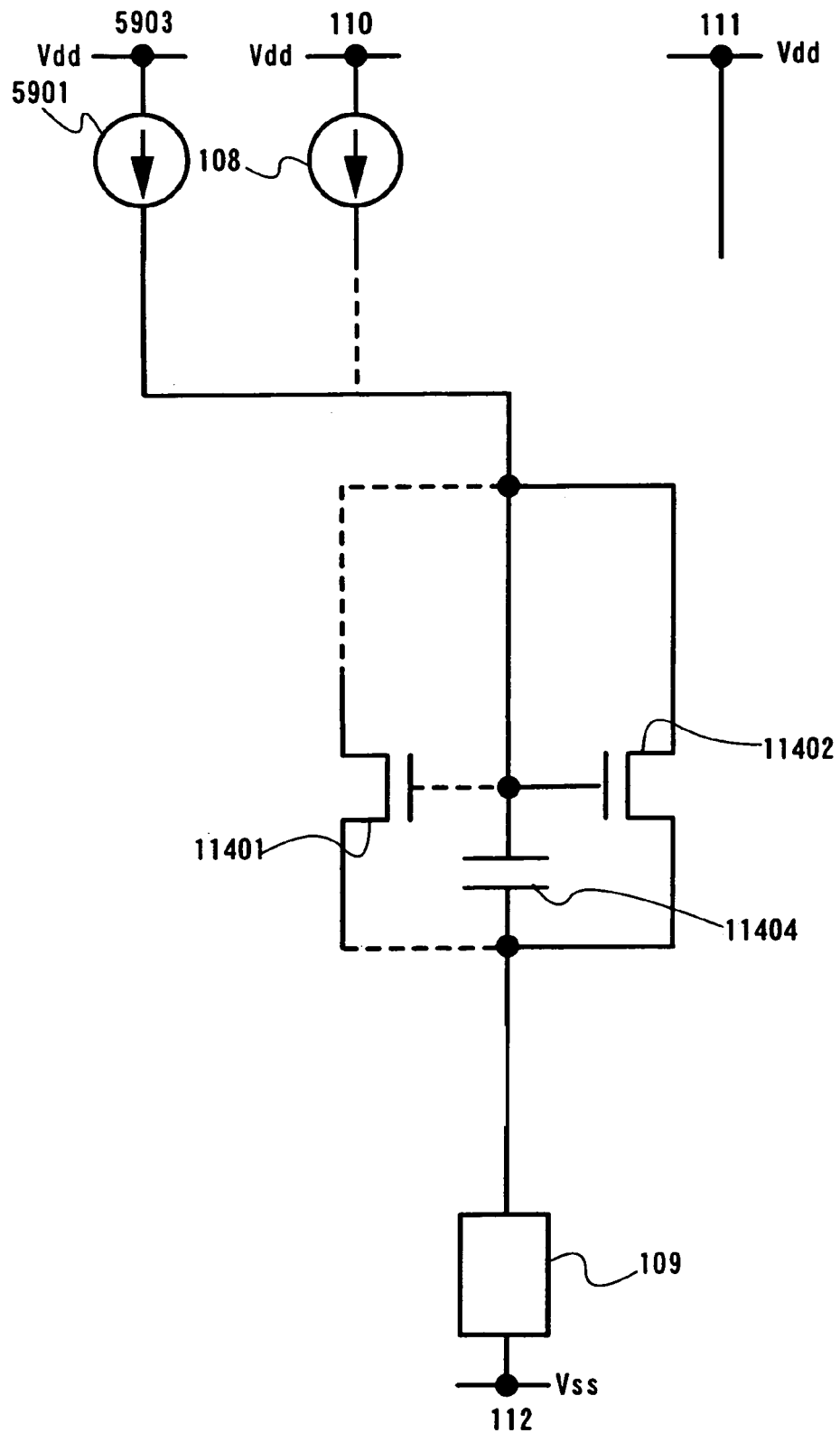
Figure 128:
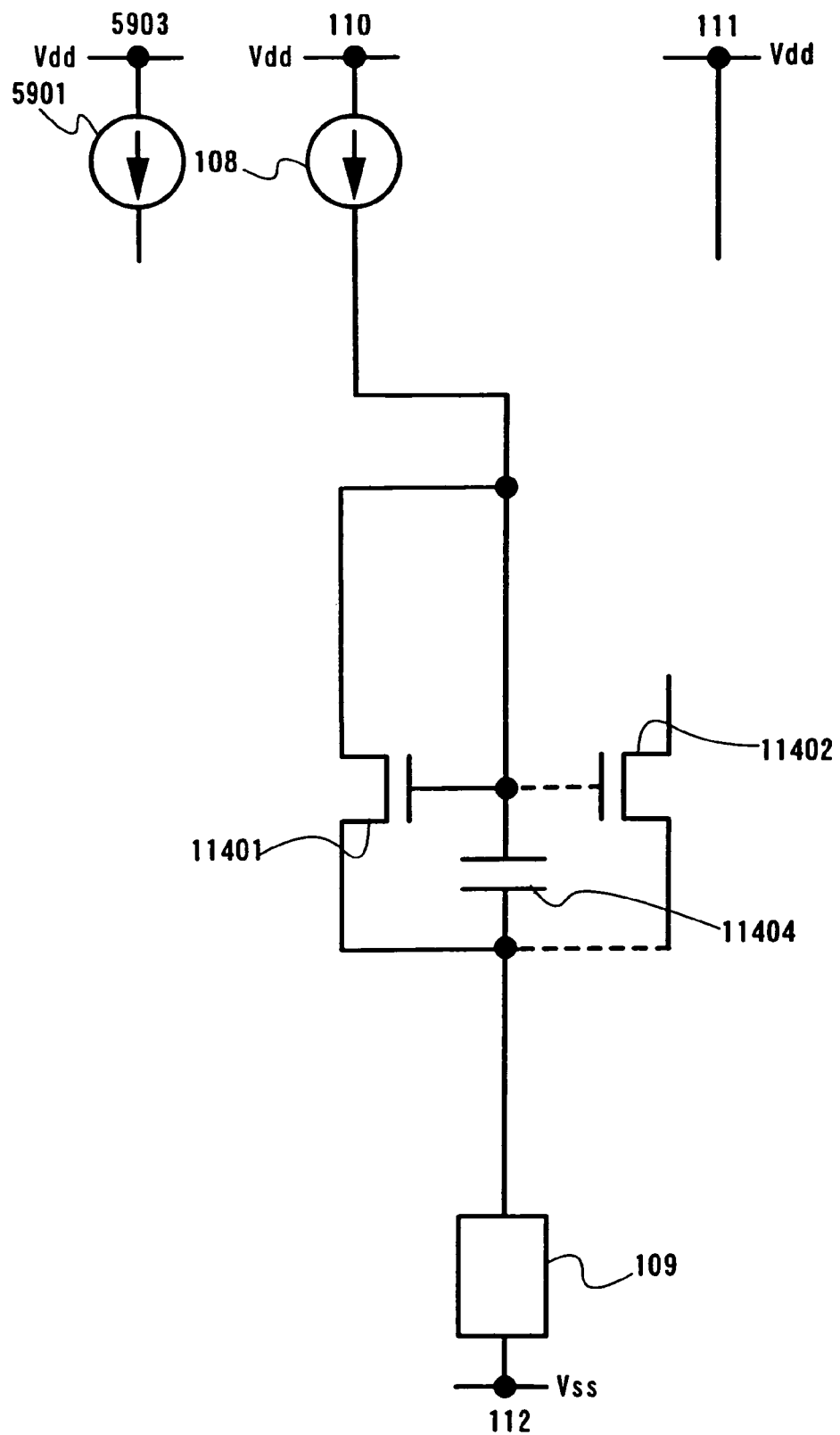
Figure 129:
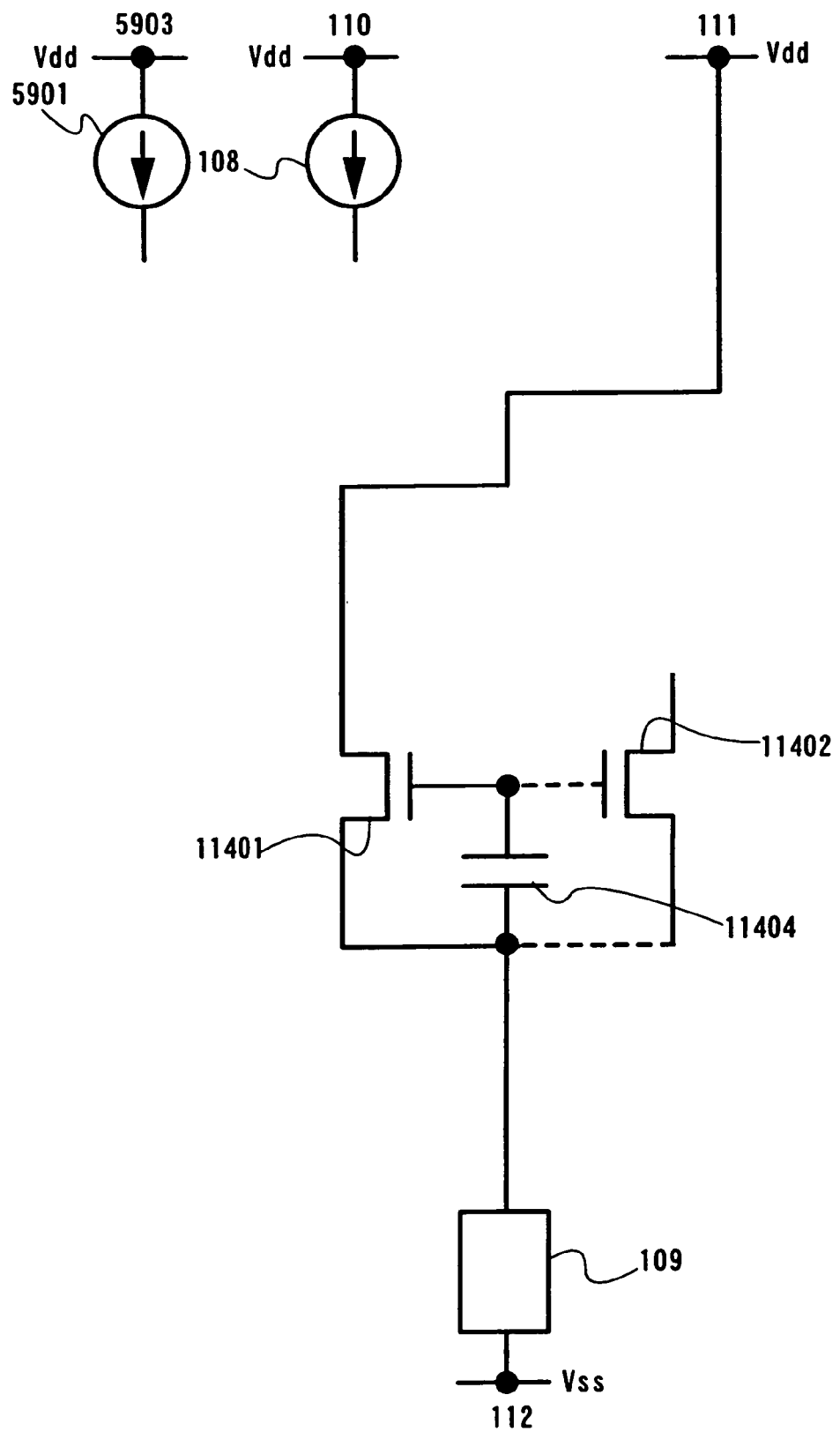

Each of the switches may be arranged anywhere as long as they are connected as shown in FIG. 127 in the precharge operation, connected as shown in FIG. 128 in the set operation, and connected as shown in FIG. 129 in the output operation. It is to be noted that dotted lines and the like in FIGS. 127 to 129 may be connected or do not have to be connected. Therefore, the gat terminals of the charge transistor 11402 and the set transistor 11401 may be connected via a switch as shown in FIGS. 123 and 178 or may be connected as shown in FIG. 124 or 179. In the case of FIG. 124, however, the switch 11403$a$ is required to be turned on to supply a current to the set transistor 11401 in the precharge operation as well in order to supply a current to the capacitor 11404.

Figure 125:
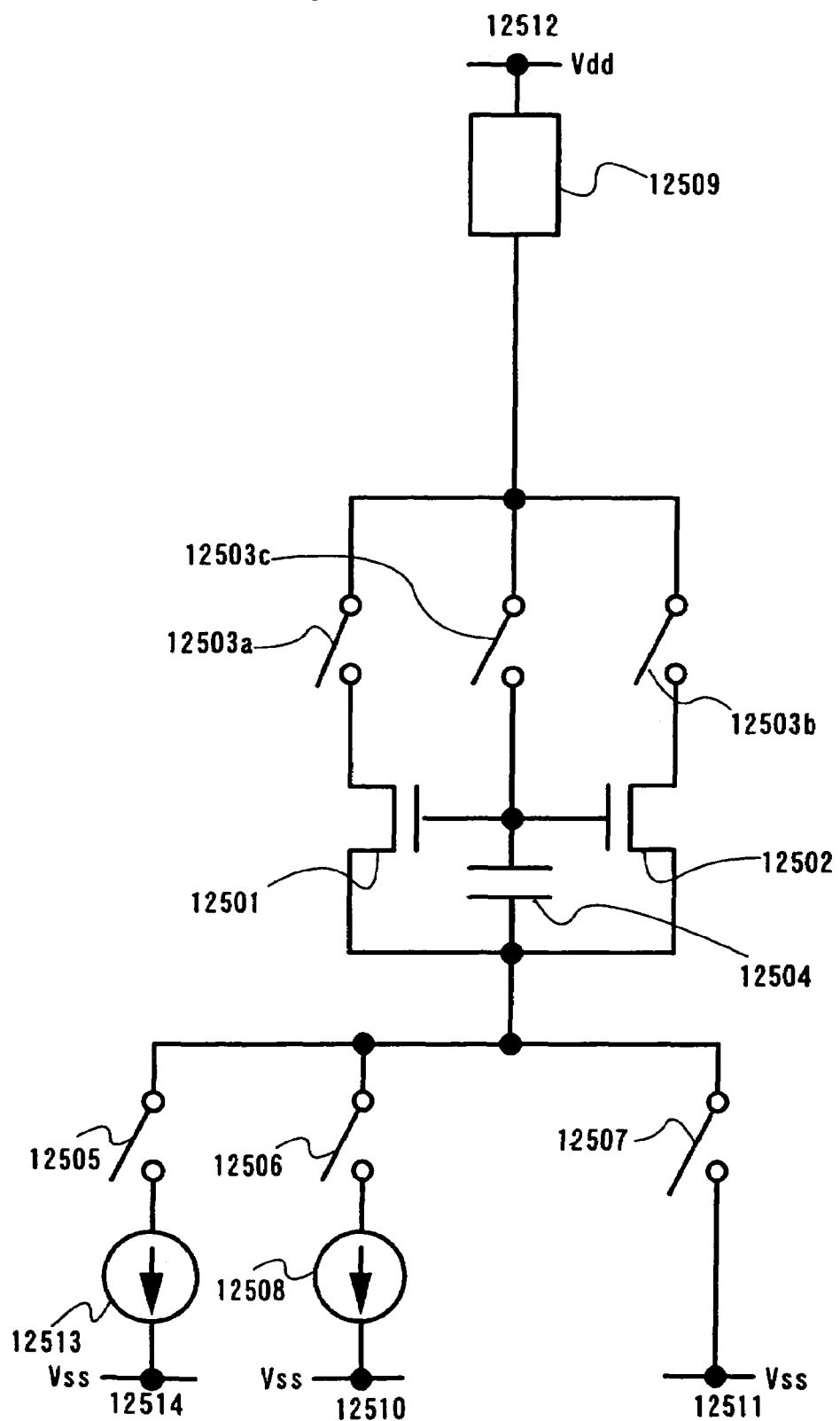

FIG. 125 shows an example in which the polarity (conductivity) of the charge transistor 11402 and the set transistor 11401 are changed by changing a direction of current without changing connections of the circuit in the circuit of FIG. 114. In this manner, the polarity of the charge transistor 11402 and the set transistor 11401 can be easily changed by changing the potential of the wiring and directions of the current flow of the reference current source 108 and the second reference current source 5901. As in FIGS. 114 and 125, the polarity can be easily changed by changing potentials of the wirings 110, 111, and 5903 so as to be those of wirings 12510, 12511, and 12514 and changing directions of current of the reference current source 108 and the second reference current source 5901 so as to be those of a reference current source 12508 and a second reference current source 12513 respectively. A set transistor 12501, a charge transistor 12502, switches 12503$a$, 12503$b$, 12503$c$, 12505, 12506, and 12507, a capacitor 12504, and a load 12509 correspond to the set transistor 11401, the charge 11402, the switches 11403$a$, 11403$b$, 11403$c$, 5902, 106, and 107, the capacitor 11404, and the load 109 in FIG. 114. The connections of these elements are not changed.

Figure 126:
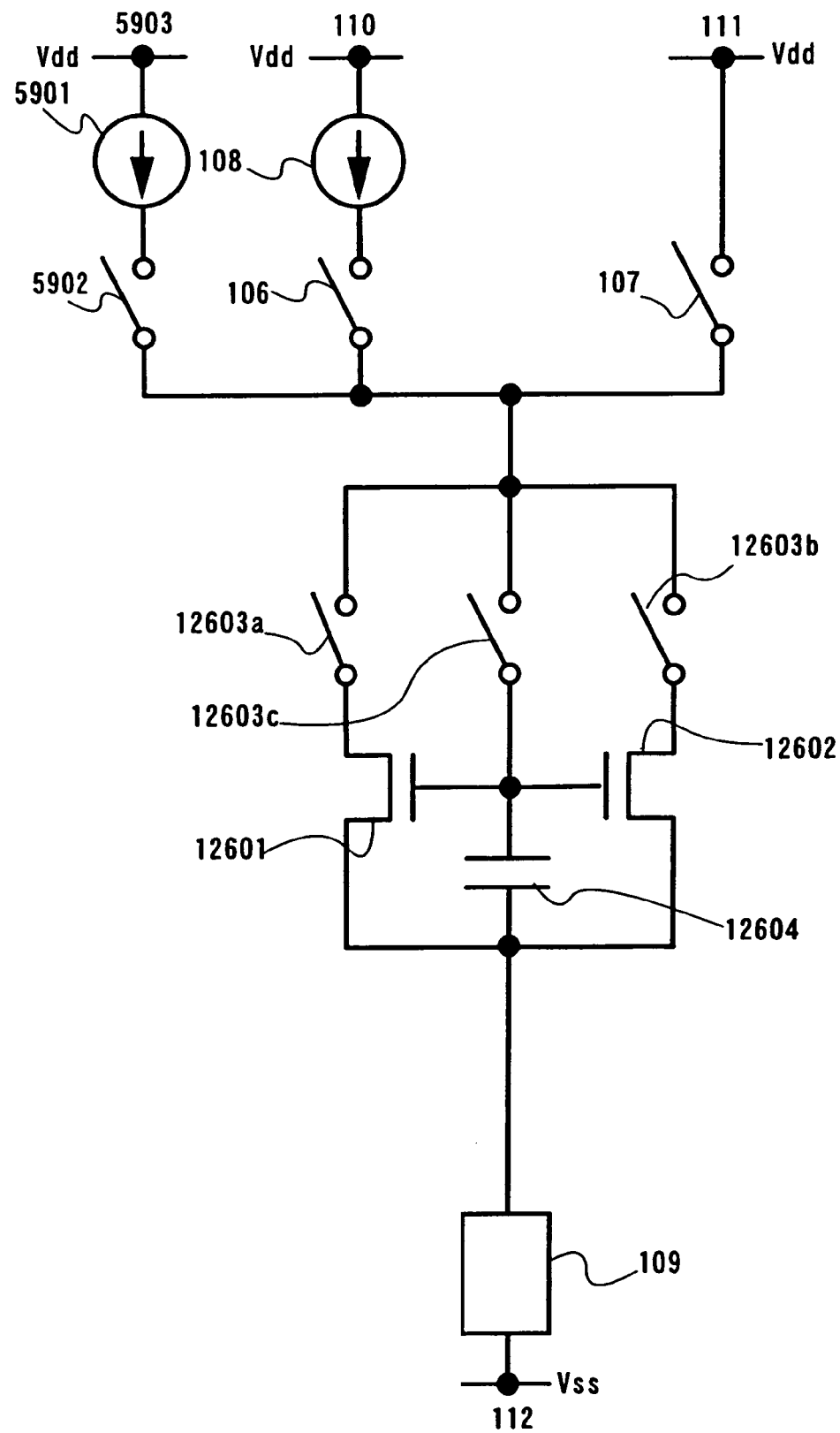

FIG. 126 shows an example in which the polarity (conductivity) of the charge transistor 11402 and the set transistor 11401 are changed by changing connections of a circuit without changing a direction of current in the circuit of FIG. 114. An operation of the circuit of FIG. 126 is similar to that of FIG. 114, thus description thereon will be omitted.

In this case also, the switches may be arranged anywhere as long as each of them operates normally in the precharge operation, the set operation, and the output operation. Otherwise, the switches may be arranged anywhere as long as they are connected as shown in FIG. 127 in the precharge operation, connected as shown in FIG. 128 in the set operation, and connected as shown in FIG. 129 in the output operation.

In this manner, various circuit can be used as well as the circuit of FIG. 114 in this embodiment mode.

In the case of FIG. 114, the precharge operation is performed as shown in FIG. 115 and then the set operation is performed as shown in FIG. 116, however, the invention is not limited to this.

For example, the precharge operation shown in FIG. 115 may be performed a plurality of times. FIG. 134 shows an example where one more precharge operation is performed than the case of FIG. 115. In FIG. 134, a transistor 13401 which operates as a current source is provided additionally. A first precharge operation is performed by turning on switches 13404, 13402, 11403c and 11403b and turning off the switches 5902, 106, 107, and 11403a being off. After that, a second precharge operation is performed by turning off the switches 13404, 106, 107, 13402, and 11403c and turning on the switches 5902, 11403c, and 11403b. That is, the aforementioned operation corresponds to the precharge operation in FIG. 115. It is to be noted that a current flowing in the first precharge operation is larger than that in the second precharge operation. In this manner, by performing the precharge operation with a larger current value first, the steady state can be obtained rapidly.

Alternatively, another precharge operation may be performed in combination.

It is preferable that the characteristics of the transistor used in the precharge operation and the transistor used in the set operation be the same as much as possible. In the case of FIG. 114, for example, it is preferable that the current characteristics of the set transistor 11401 and the charge transistor 11402 be the same. Therefore, it is preferable to device in the process of manufacturing these transistors so that the current characteristics thereof become the same. For example, it is preferable to arrange the set transistor 11401 and the charge transistor 11402 as close to each other as possible. In the case of crystallizing a semiconductor layer of the transistors by irradiation with laser, for example, it is preferable that the transistors be irradiated with the same laser shot. As a result, the current characteristics can be the same, which leads to produce an appropriate state by the precharge operation. Thus, the set operation can be performed rapidly.

The description made in this embodiment mode corresponds to Embodiment Modes 5 and 6 which are partially changed. Therefore, the description made in Embodiment Modes 5 and 6 can be applied to this embodiment mode as well. Further, the description made in Embodiment Modes 5 and 6 can be implemented in combination with this embodiment mode.

Figure 130:
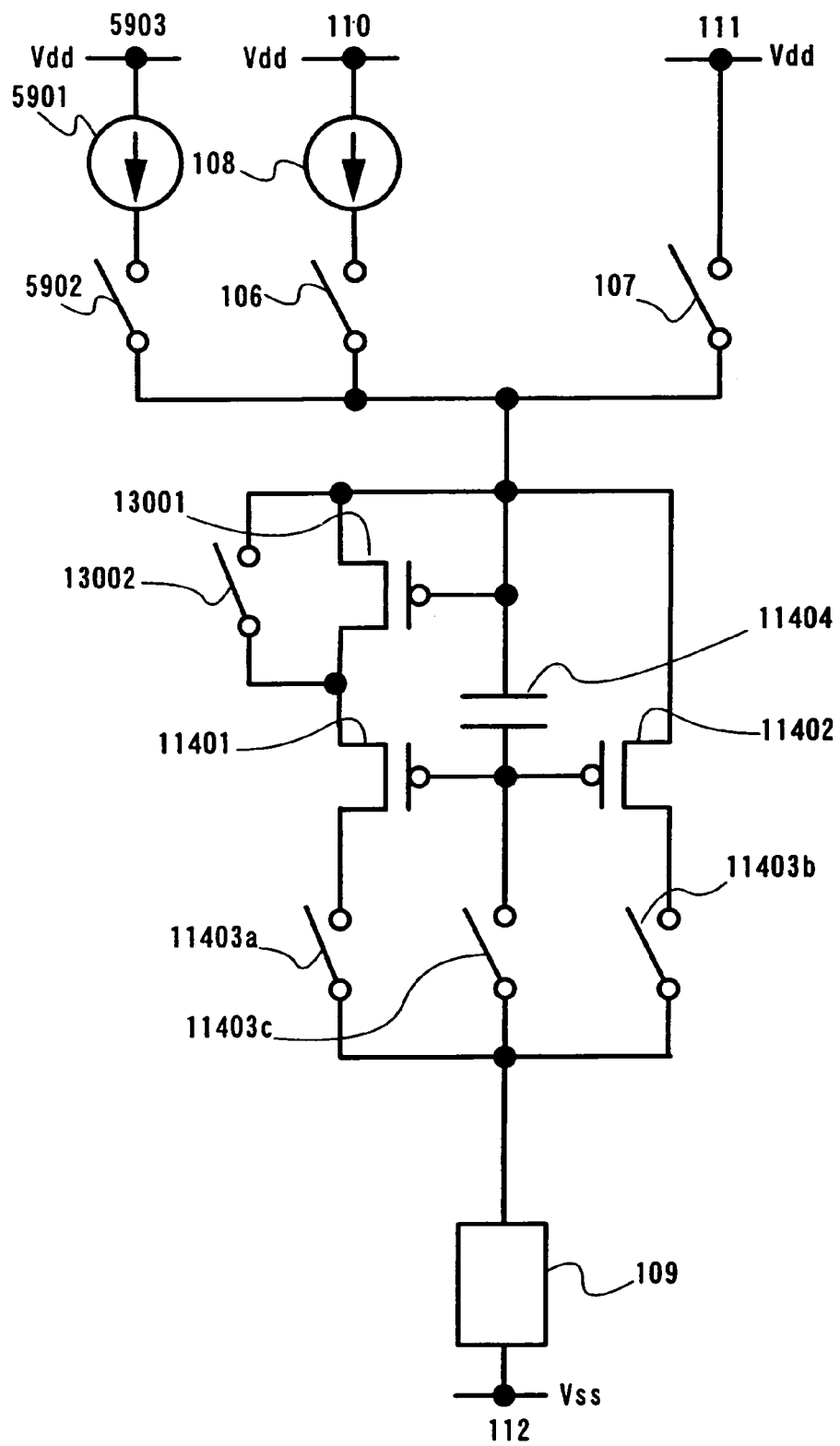
Figure 131:
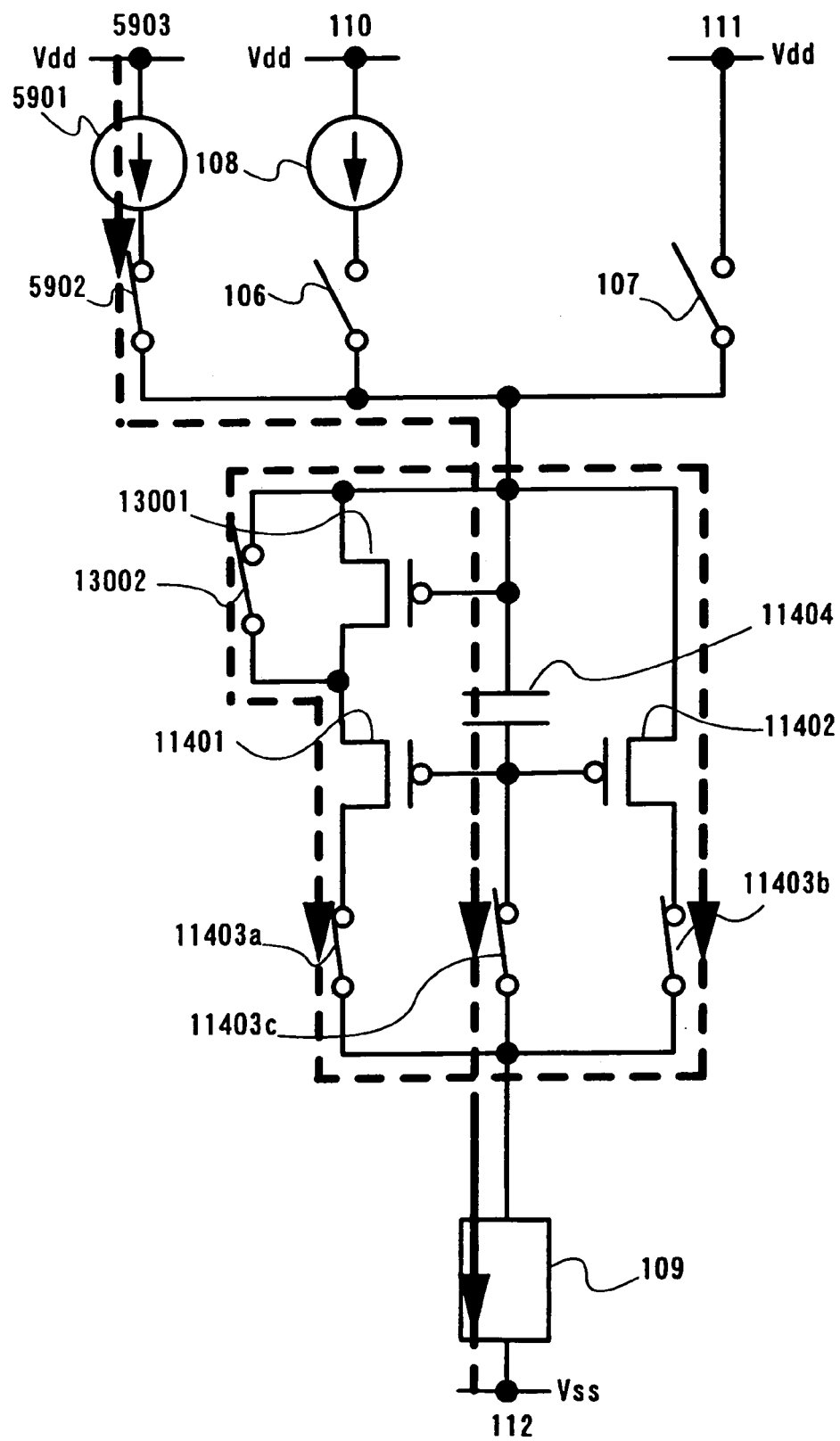

FIG. 130 shows a configuration in the case of combining the circuits of FIGS. 59 and 114. In FIG. 130, a switching transistor 13001 and a switch 13002 are provided additionally in the circuit of FIG. 114. Operations at this time are shown in FIGS. 131 to 133. In the precharge operation, the switching transistor 13001 performs the short-circuit operation as shown in FIG. 131 and a current flows to the charge transistor 11402. In the set operation, the switching transistor 13001 performs the current source operation as shown in FIG. 132. In the output operation, the switching transistor 13001 operates as shown in FIG. 133.

It is needless to say that the description made in Embodiment Modes 5 and 6 can be applied to the configuration of FIG. 131 as well.

Embodiment Mode 8

In this embodiment mode, the circuit described in Embodiment Modes 5 to 7 is partially changed.

For simplicity, description is made on the case of partially changing the circuit of FIG. 59. Therefore, most of the description which is similar to Embodiment Mode 5 will be omitted here. However, this embodiment mode can be applied to various circuits described in Embodiment Modes 5 to 7 as well.

Figure 96:
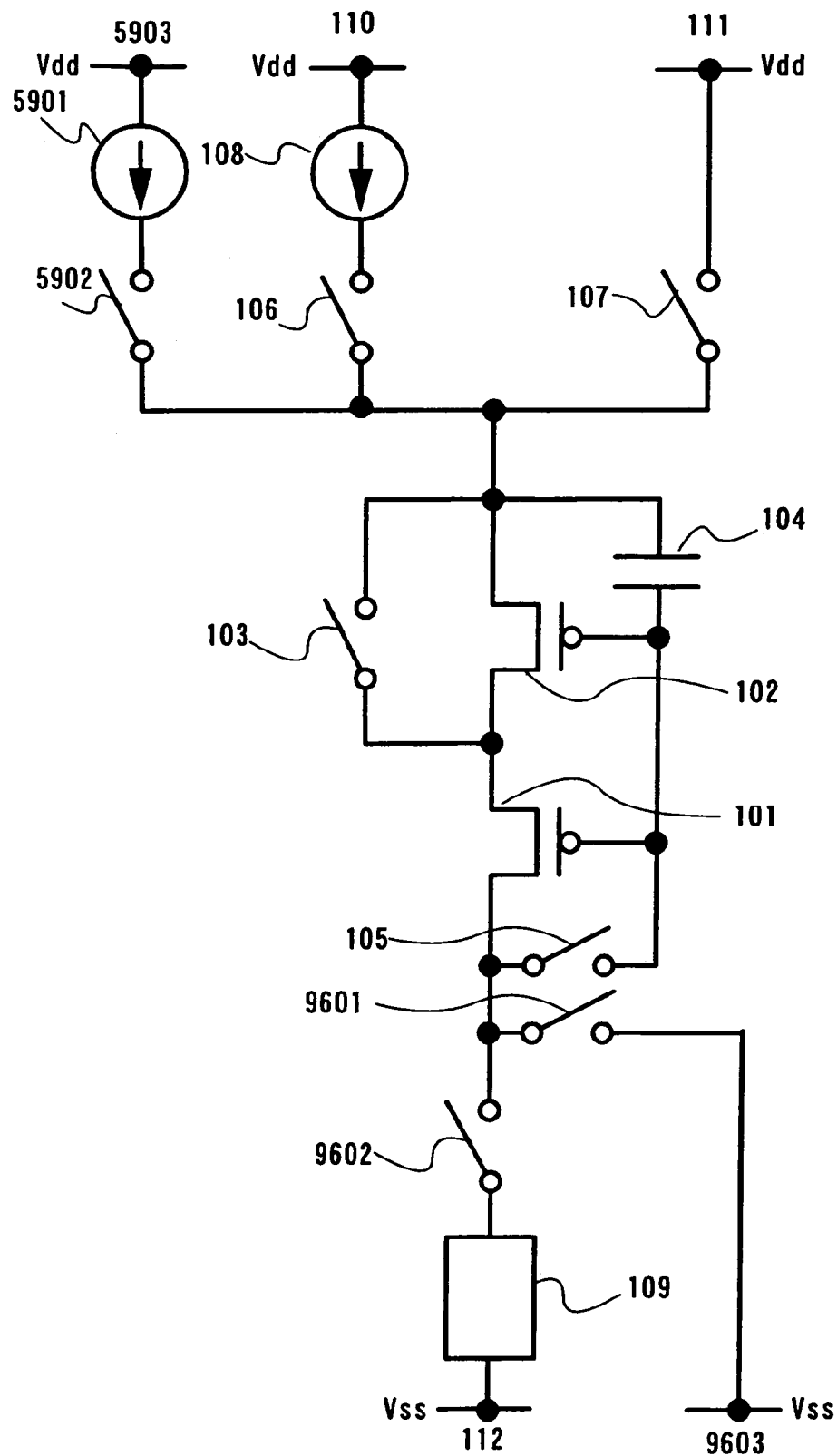
FIG. 96 is a diagram showing a configuration of a current source circuit of the invention.

FIG. 96 shows the configuration of FIG. 59 which is partially changed. FIG. 96 is different than FIG. 59 in that a switch 9602 which selects to supply a current to the load 109 or not, a wiring 9603 to which a current is discharged, and a switch 9601 which selects to discharge a current to the wiring 9603 or not are provided.

Figure 97:
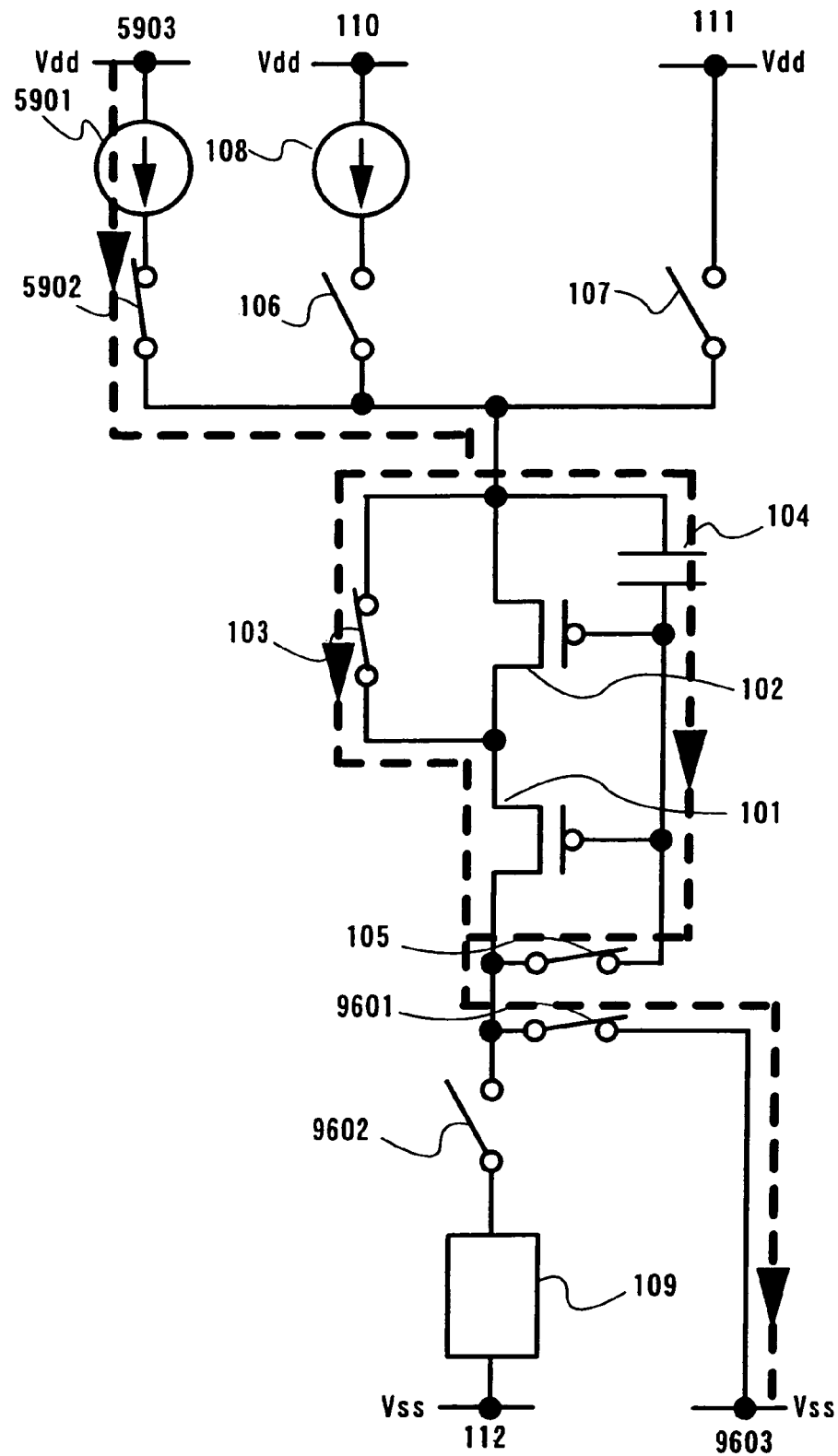
FIG. 97 is a diagram showing an operation of a current source circuit of the invention.

An operation of FIG. 96 is described. First, as shown in FIG. 97, the switches 103, 105, 106, 5902, and 9601 are turned on and the switches 106, 107, and 9602 are turned off. Then, a source terminal and a drain terminal of the switching transistor 102 have approximately the same potential. That is, a current hardly flows between the source and drain of the switching transistor 102 but flows to the switch 103. Accordingly, the current Ib2 of the second reference current source 5901 flows to the capacitor 104 and the current source transistor 101. When a current which flows between the source and drain of the current source transistor 101 and the current Ib2 of the second reference current source 5901 become equal, a current stops flowing to the capacitor 104. That is, the steady state is obtained. A potential of the gate terminal of the current source transistor 101 is accumulated in the capacitor 104. That is, a voltage required to supply the current Ib2 between the source and drain of the current source transistor 101 is applied between the gate and source thereof. The aforementioned operation corresponds to the precharge operation. At that time, the switching transistor 102 performs the short-circuit operation. In this configuration, the switch 9602 is off in the precharge operation, therefore, a current does not flow to the load 109 but flows to the wiring 9603 as the switch 9601 is on.

Figure 98:
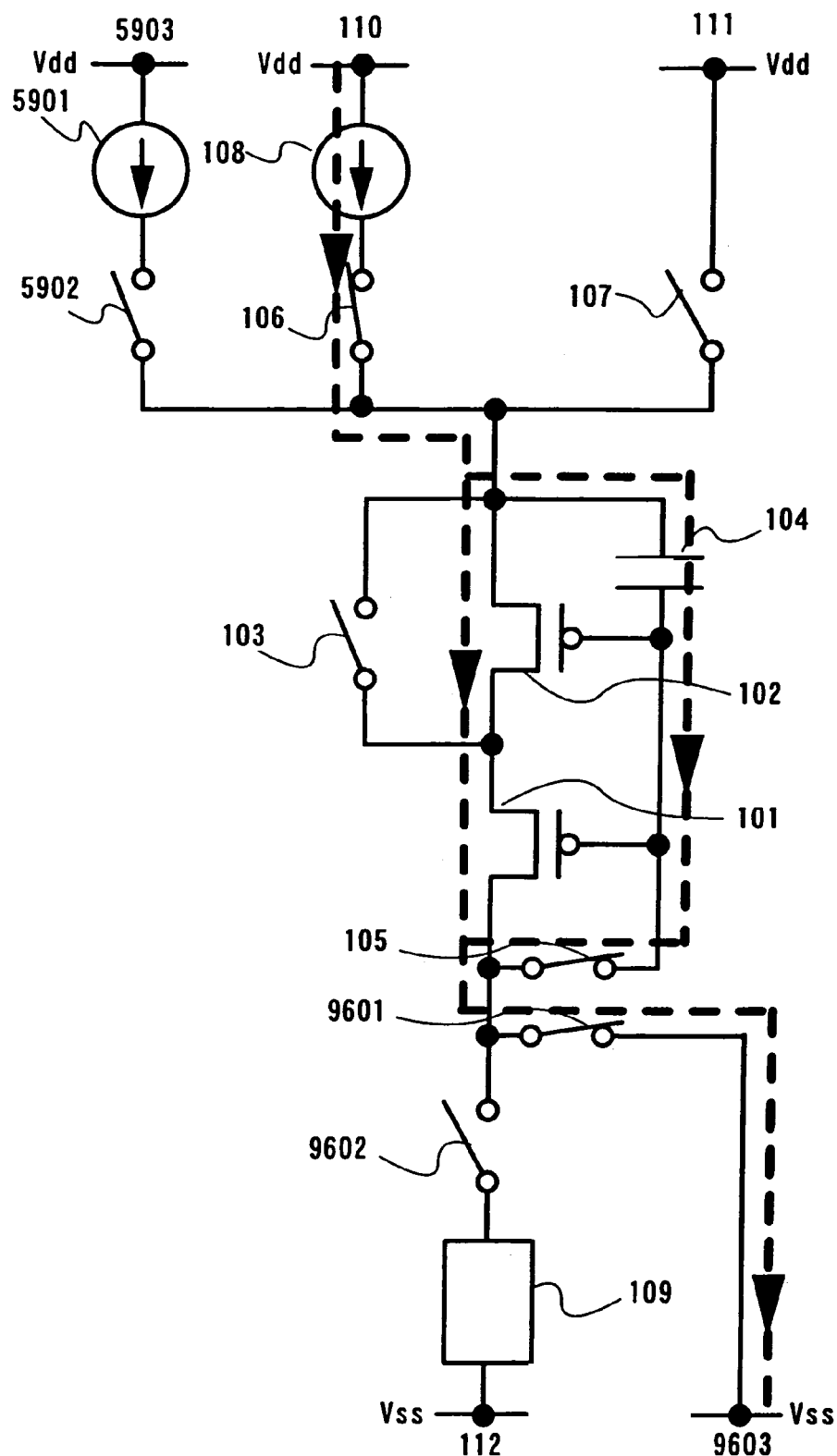
FIG. 98 is a diagram showing an operation of a current source circuit of the invention.

As shown in FIG. 98, the switches 106, 105, and 9601 are turned on and the switches 5902, 107, 103, and 9602 are turned off. Then, the current source transistor 101 and the switching transistor 102 operate as a multi-gate transistor. When a steady state is obtained, a current stops flowing to the capacitor 104. At that time, a gate-source voltage of the multi-gate transistor is accumulated in the capacitor 104. That is, a voltage required to supply the current Ib1 between the source and drain of the multi-gate transistor is applied between the gate and source thereof. The aforementioned operation corresponds to the set operation. At that time, the switching transistor 102 performs the current source operation.

Figure 99:
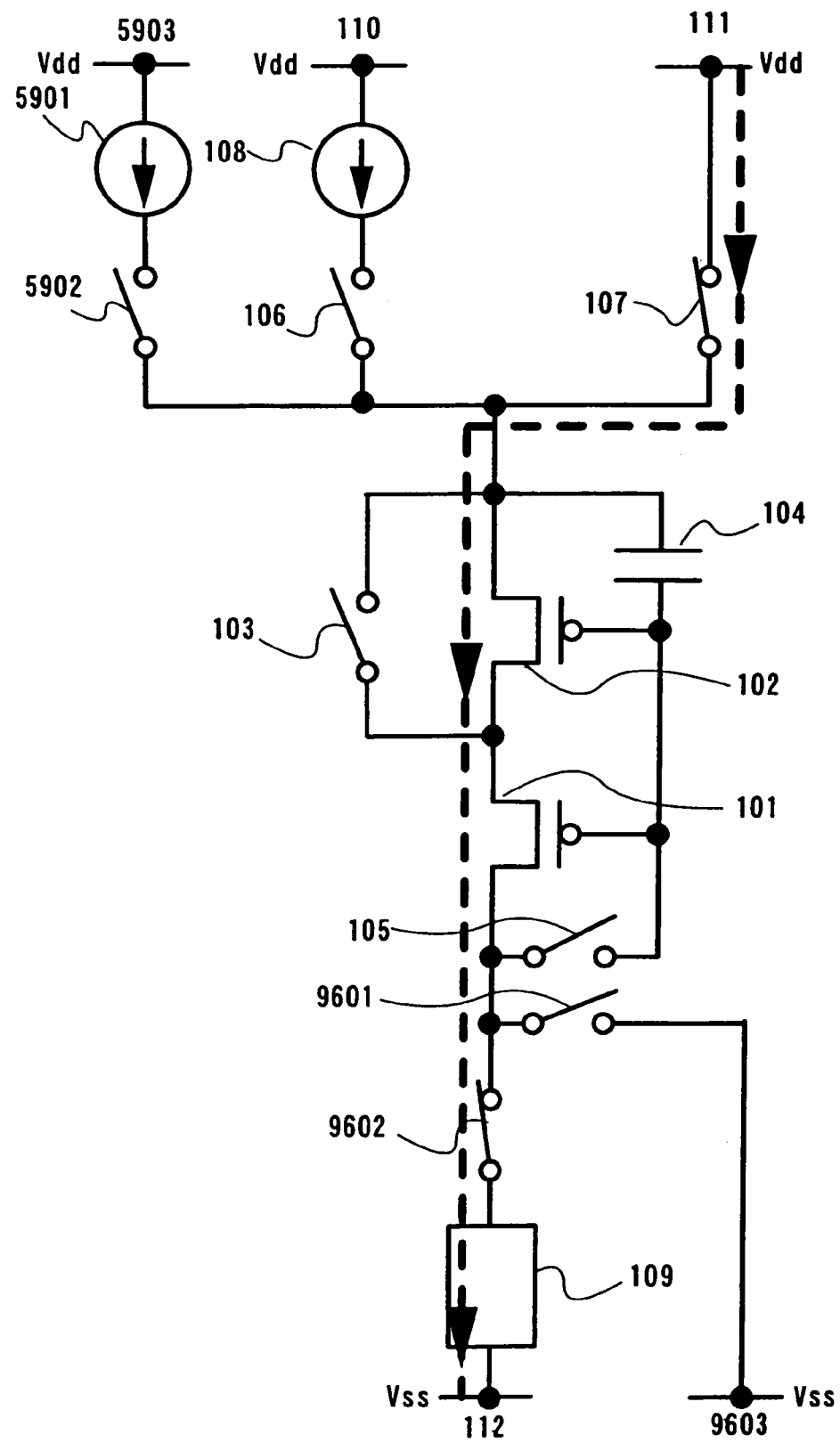
FIG. 99 is a diagram showing an operation of a current source circuit of the invention.

Next, as shown in FIG. 99, the switches 107 and 9602 are turned on and the switches 5902, 106, 105, 103, and 9601 are turned off. Then, a current flows to the load 109. The aforementioned operation corresponds to the output operation. At that time, the switching transistor 102 performs the current source operation.

In the case of using a p-channel transistor which operates in the saturation region as the reference current source 108 and the second reference current source 5901 in the configuration of FIG. 59, potentials of the wirings 110 and 5903 are required to be set in consideration of a voltage drop at the load 109 so that the p-channel transistor operates in the saturation region. That is, a potential high enough to operate the p-channel transistor in the saturation region even when a voltage drops at the load 109 is required to be set at the wirings 110 and 5903. In the configuration of FIG. 96, however, a current is discharged to the wiring 9603 without being supplied to the load 109 in the set operation. Therefore, the voltage drop at the load 109 does not have to be taken into consideration for the potentials set at the wirings 110 and 5903. That is, a potential lower than that in the configuration of FIG. 59 can be set. Accordingly, power consumption can be reduced in the configuration of FIG. 96.

Description is made on the case of changing the circuit of FIG. 96 partially. Therefore, most of the description which is similar to the configuration of FIG. 96 will be omitted here. However, this embodiment mode can be applied to various circuits as well as to the configuration of FIG. 96.

Figure 100:
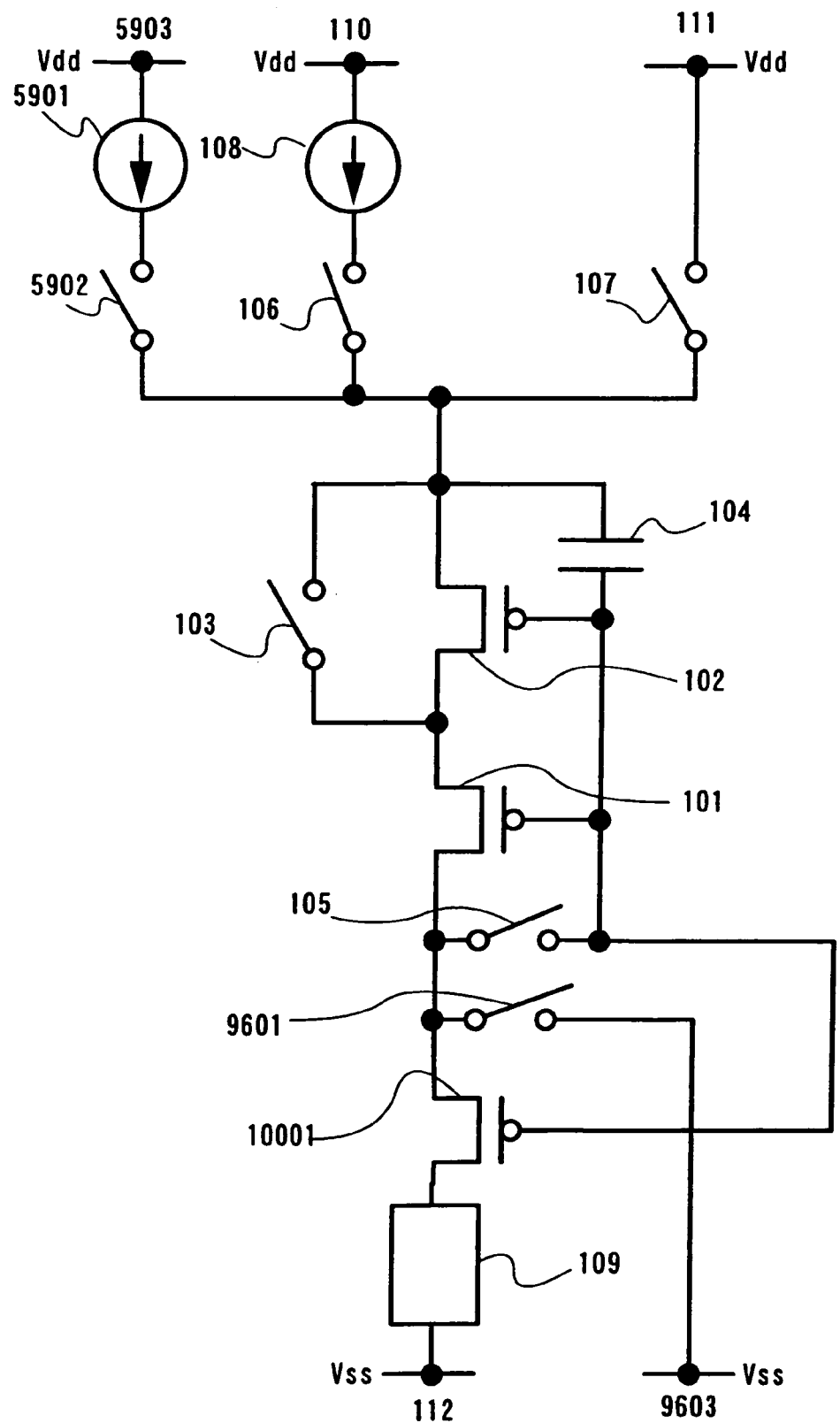
FIG. 100 is a diagram showing a configuration of a current source circuit of the invention.

FIG. 100 shows the configuration of FIG. 96 which is partially changed. FIG. 100 is different than FIG. 96 in that the switch 9602 in FIG. 96 is changed into a multi transistor 10001 in FIG. 100. The multi transistor 10001 has the same polarity (conductivity) as those of the current source transistor 101 and the switching transistor 102. A gate terminal of the multi transistor 10001 is connected to a gate terminal of the current source transistor 101. The multi transistor 10001 changes its operation depending on the circumstance. That is, the multi transistor 10001 operates as a switch in the set operation and as a part of a multi-gate transistor together with the current source transistor 101 and the switching transistor 102 in the output operation to operate as a current source.

Figure 101:
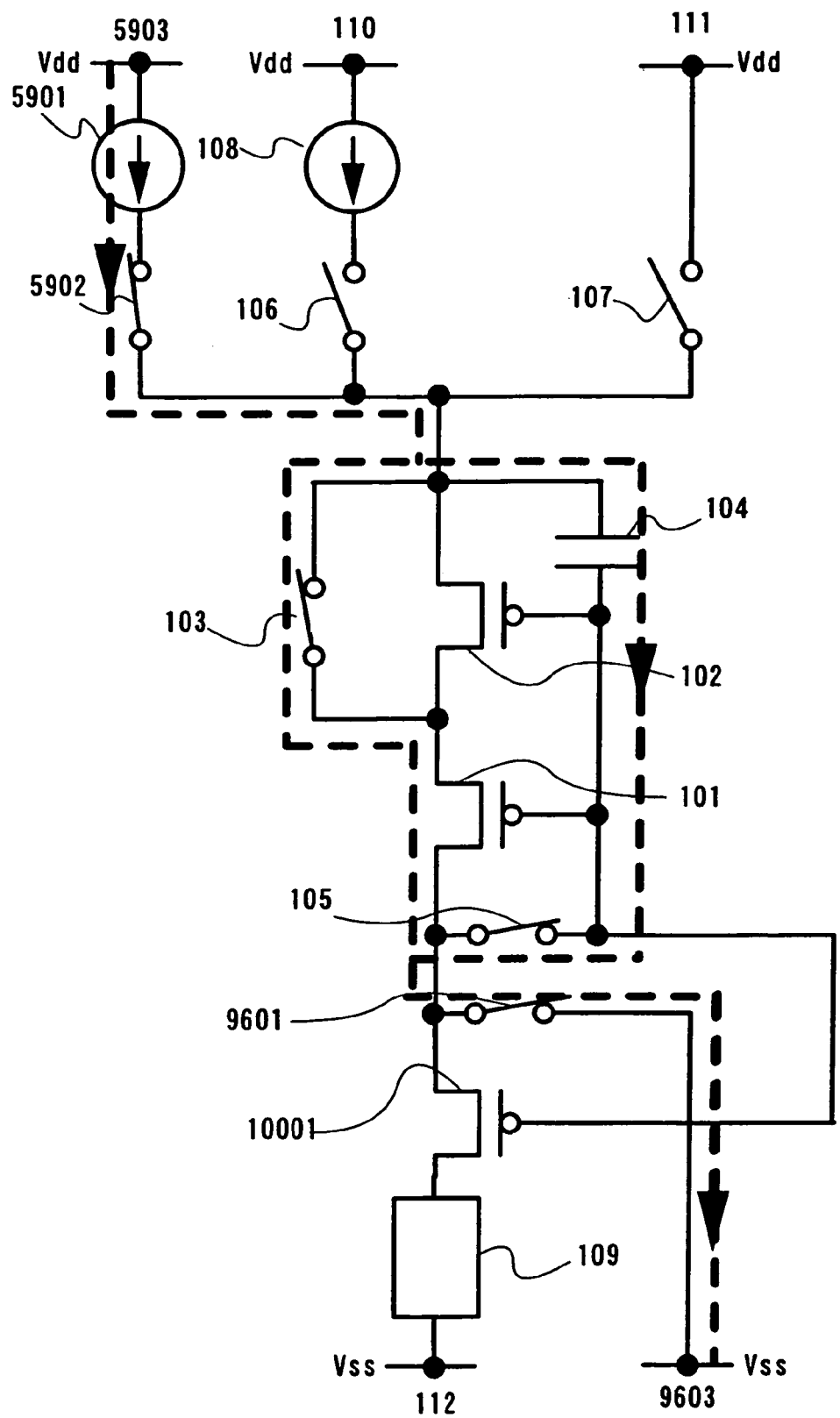
FIG. 101 is a diagram showing an operation of a current source circuit of the invention.

Next, an operation of the circuit of FIG. 100 is described. As shown in FIG. 101, the switches 5902, 103, 105, and 9601 are turned on and the switches 106 and 107 are turned off. Then, the current Ib2 of the second reference current source 5901 flows to the capacitor 104 and the current source transistor 101. At this time, the gate terminal and a source terminal of the multi transistor 10001 have approximately the same potential. That is, a gate-source voltage of the multi transistor 10001 becomes approximately 0 V. Then, when the steady state is obtained, a current which flows between the source and drain of the current source transistor 101 and the current Ib2 of the second reference current source 5901 become equal to each other, thus a current stops flowing to the capacitor 104. The aforementioned operation corresponds to the precharge operation. At that time, the multi transistor 10001 operates as a switch which is off.

Figure 102:
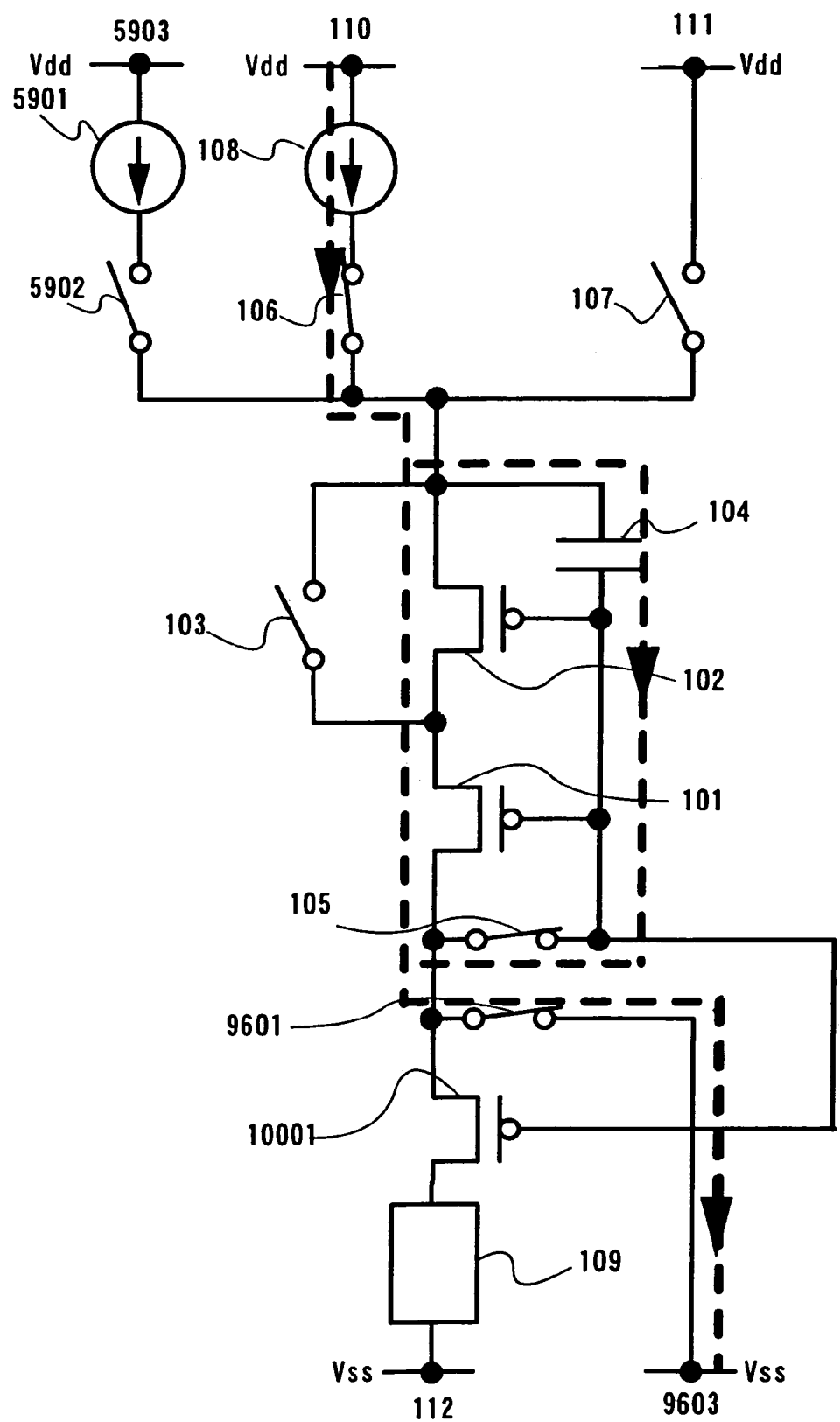
FIG. 102 is a diagram showing an operation of a current source circuit of the invention.

As shown in FIG. 102, the switches 106, 105, and 9601 are turned on and the switches 5902, 103, and 107 are turned off. Then, the current Ib1 of the reference current source 108 is supplied to the capacitor 104, the current source transistor 101, and the switching transistor 102. At this time, the gate terminal and source terminal of the multi transistor 10001 have approximately the same potential. That is, a gate-source voltage of the multi transistor 10001 becomes approximately 0 V. Therefore, the multi transistor 10001 is turned off. Then, when the steady state is obtained, a current which flows between the source and drain of the current source transistor 101 and the current Ib1 of the reference current source 108 become equal to each other, thus a current stops flowing to the capacitor 104. The aforementioned operation corresponds to the set operation. At this time also, the multi transistor 10001 operates as a switch which is off.

Figure 103:
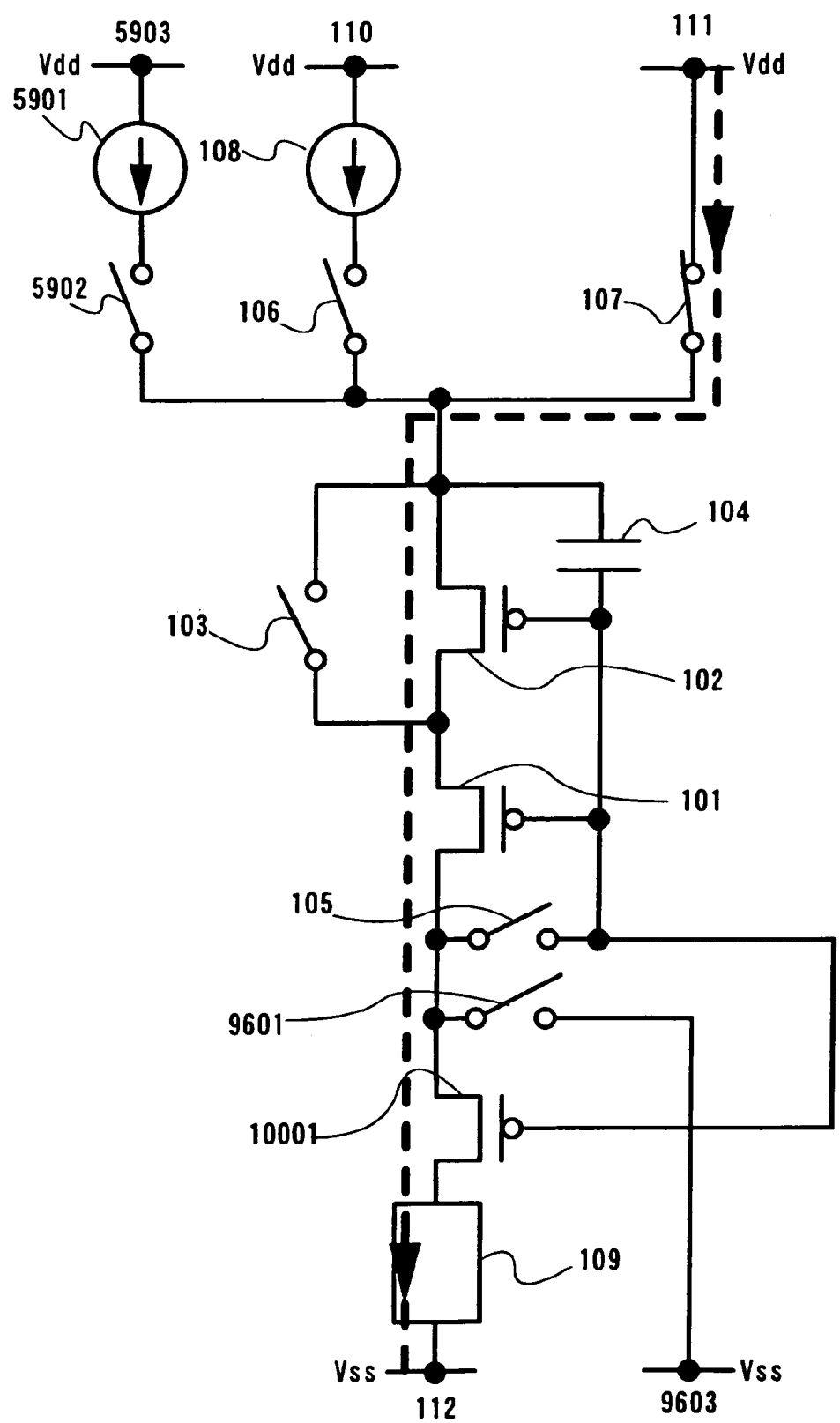
FIG. 103 is a diagram showing an operation of a current source circuit of the invention.

Next, the switch 107 is turned on and the switches 5902, 106, 103, 105, and 9601 are turned off as shown in FIG. 103. Then, a charge stored in the capacitor 104 in the set operation is applied to the gate terminals of the current source transistor 101, the switching transistor 102, and the multi transistor 10001. The gate terminals of the current source transistor 101, the switching transistor 102, and the multi transistor 10001 are connected to each other. As described above, the current source transistor 101, the switching transistor 102, and the multi transistor 10001 operate as a multi-gate transistor. Therefore, when the current source transistor 101, the switching transistor 102, and the multi transistor 10001 are one transistor, a gate length L of the multi-gate transistor is longer than L of the current source transistor 101. Therefore, a current flowing to the load 109 becomes smaller than Ib1. That is, a current which flows to the load 109 becomes smaller than that in the case of FIG. 102. The aforementioned operation corresponds to the output operation. At that time, the multi transistor 10001 operates as a part of the multi-gate transistor.

In this manner, by changing the switch 9602 of FIG. 96 into the multi transistor 10001 of FIG. 100 and connecting the gate terminal of the multi transistor 10001 to the gate terminal of the current source transistor 101, a current can be controlled automatically. Moreover, a current supplied to the load 109 can be small. In the case of FIG. 96, a wiring for controlling the switch 9602 is required for changing the operation between supplying a current to the load 109 in the output operation and stopping current thereto in the set operation, however, a current can be controlled automatically in FIG. 100, therefore, the wiring for the control can be omitted.

It is to be noted that the current source transistor 101, the switching transistor 102, and the multi transistor 10001 operate as a multi-gate transistor in the output operation, therefore, it is preferable that these transistors have the same polarity (conductivity).

In the output operation, the current source transistor 101, the switching transistor 102, and the multi transistor 10001 operate as a multi-gate transistor, however, a gate width W of each transistor may be the same or different. Similarly, a gate length L thereof may be the same or different. The gate width W, however, is preferably the same as it can be considered to be the same as a normal multi-gate transistor. By designing the gate length L of the switching transistor 102 and the multi transistor 10001 longer, a current supplied to the load 109 becomes smaller. Therefore, the gate width and length may be designed depending on the circumstance.

It is to be noted that FIG. 100 shows the circuit of this embodiment mode, however, the invention is not limited to this. The invention can be configured by using various circuits by changing the arrangement and number of switches, the polarity of each transistor, the number and arrangement of the current source transistor and the switching transistor, a potential of each wiring, a direction of current flow and the like. By using each change in combination, various circuits can be configured.

Figure 105:
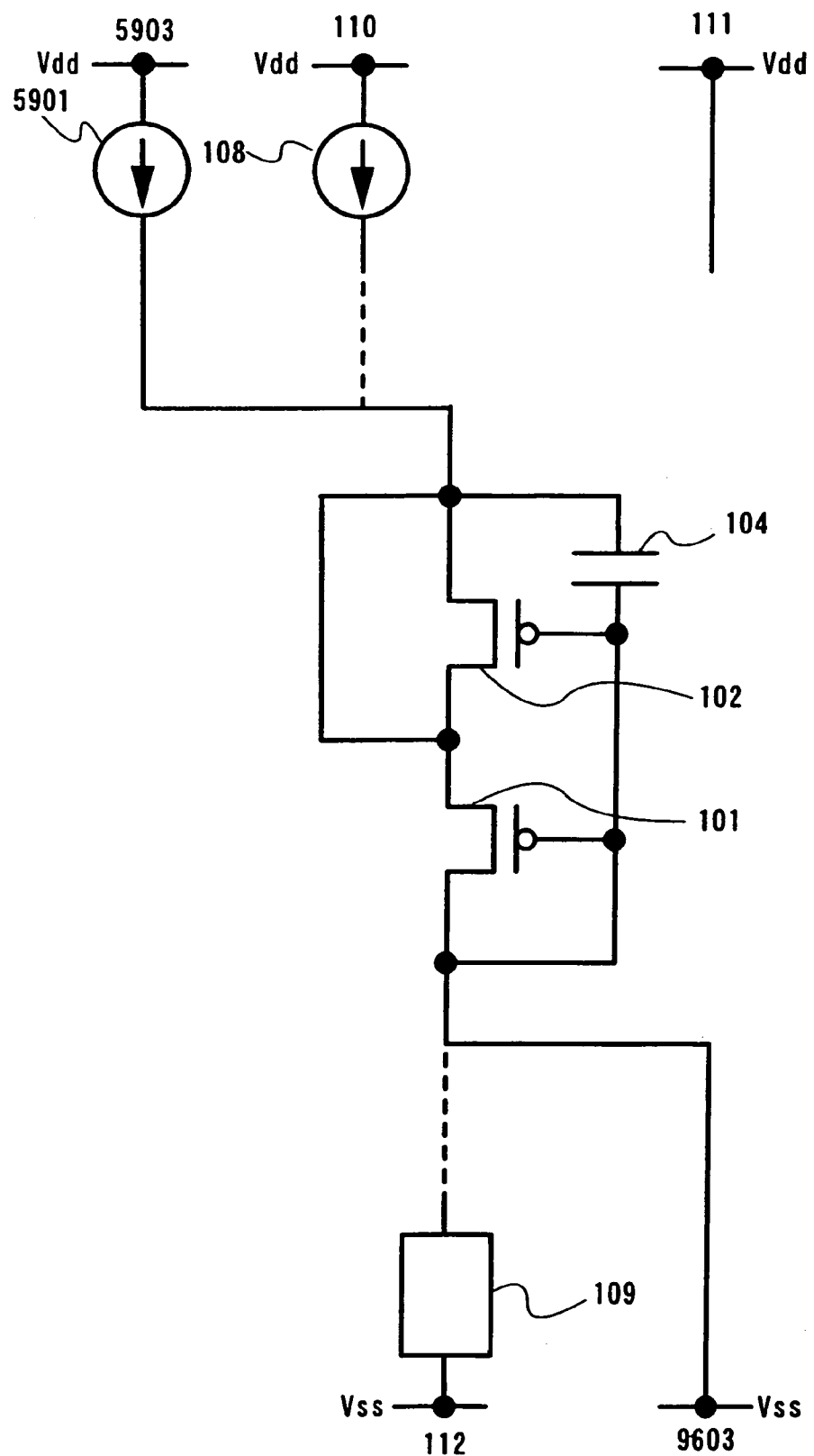
FIG. 105 is a diagram showing connections of a certain operation of a current source circuit of the invention.
Figure 106:
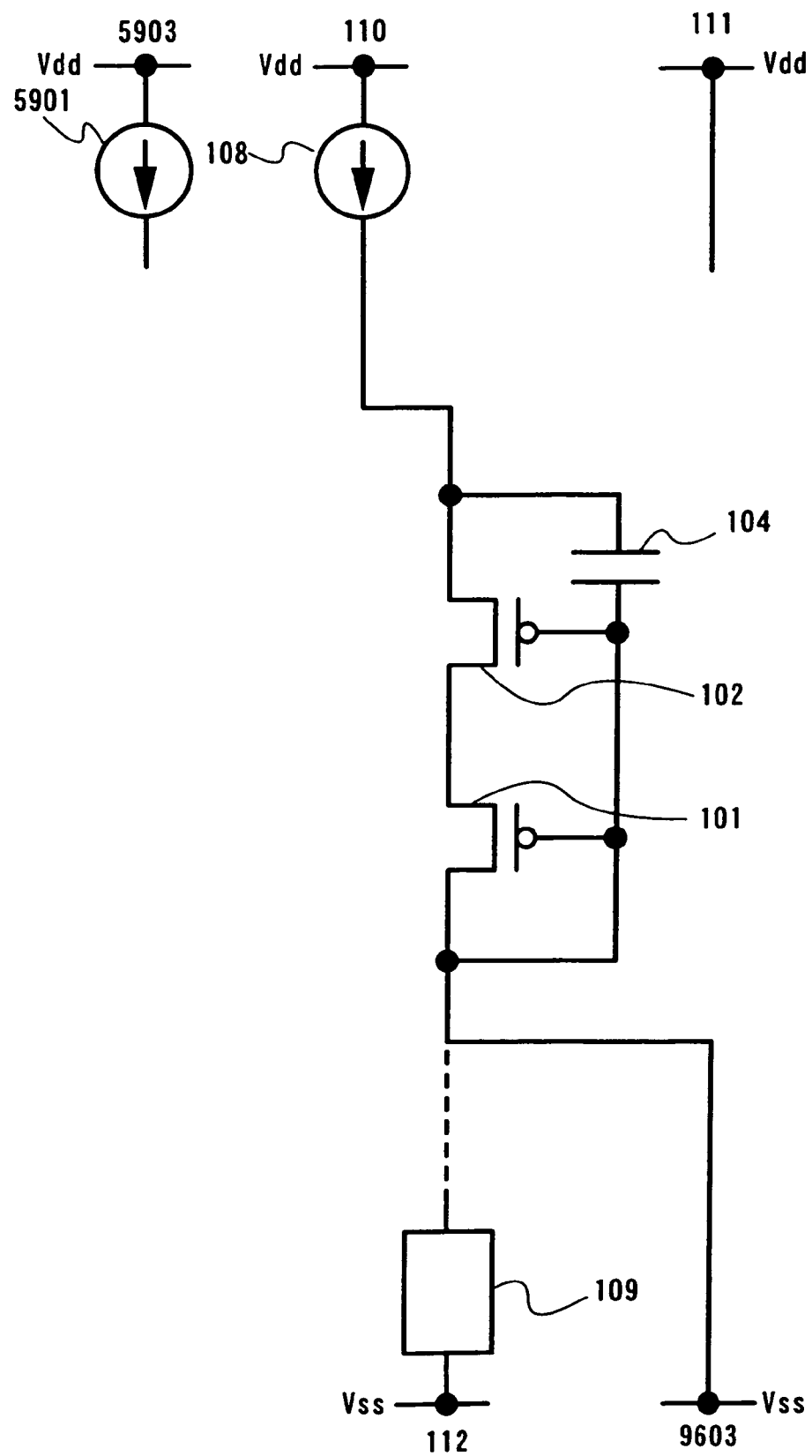
FIG. 106 is a diagram showing connections of a certain operation of a current source circuit of the invention.
Figure 107:
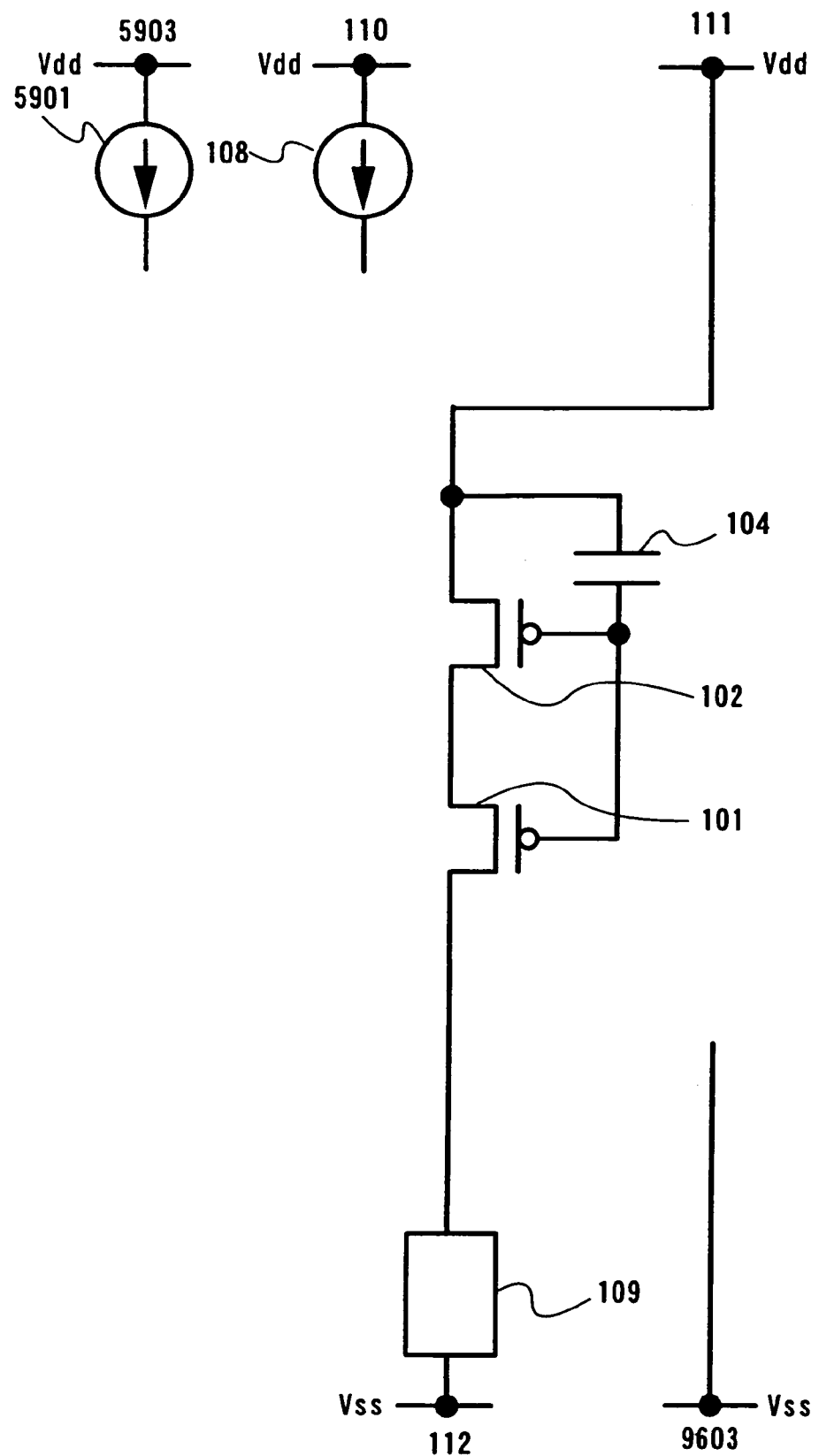
FIG. 107 is a diagram showing connections of a certain operation of a current source circuit of the invention.

For example, such switches as 5902, 106, 107, 103, 105, 9601, and 9602 may be arranged anywhere as long as they can control on/off of a current. That is, the switches as 5902, 106, 107, 103, 105, 9601, and 9602 may be arranged anywhere as long as they are connected as shown in FIG. 105 in the precharge operation, connected as shown in FIG. 106 in the set operation, and connected as shown in FIG. 107 in the output operation.

Figure 104:
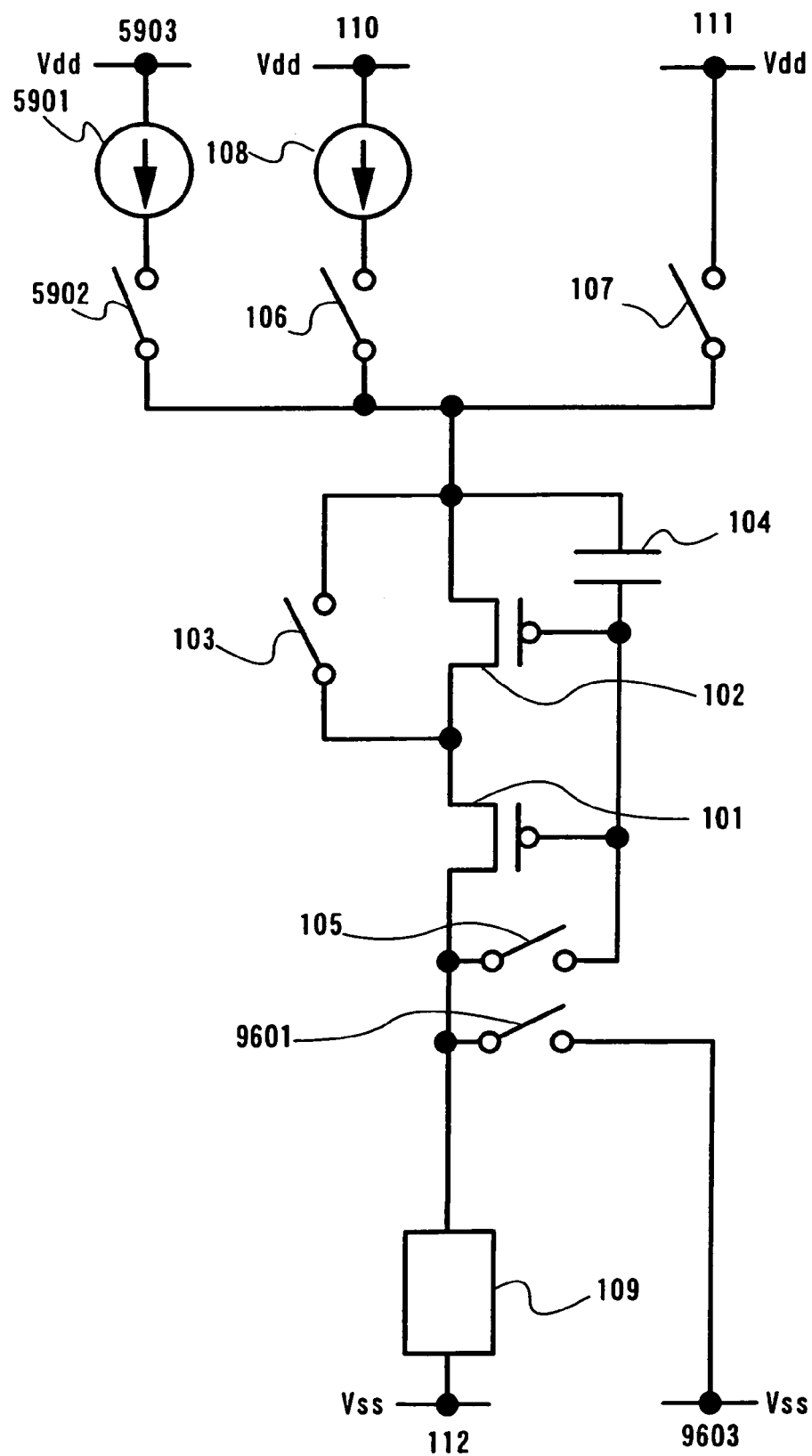
FIG. 104 is a diagram showing a configuration of a current source circuit of the invention.

As shown in FIG. 104, a configuration in which the switch 9602 shown in FIG. 96 is not provided may be employed as well. That is, by turning on the switch 9601 in the precharge operation and the set operation, a current hardly flows to the load 109 but flows to the wiring 9603, thus a voltage drop does not affect almost at all.

Figure 108:
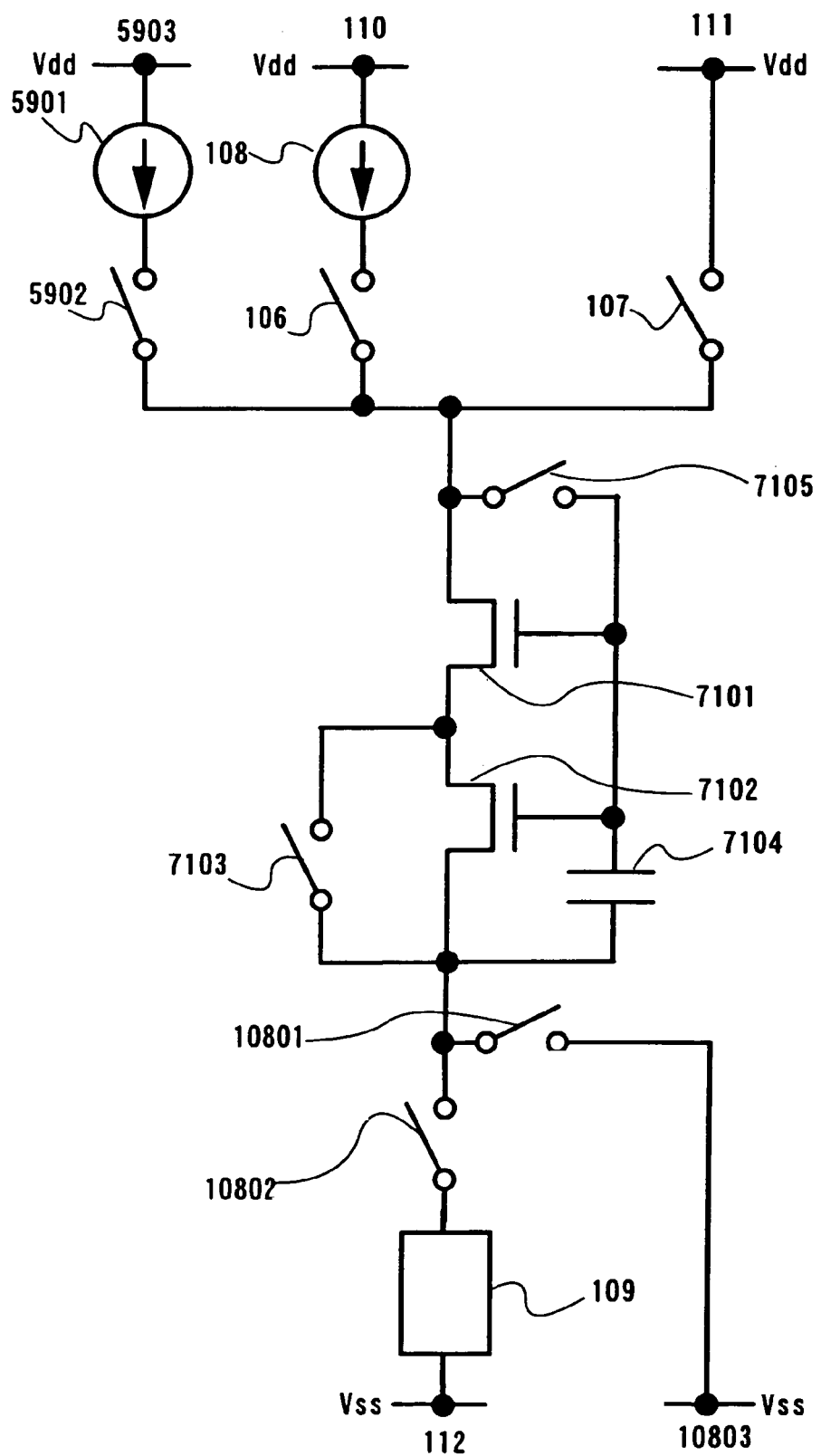
FIG. 108 is a diagram showing a configuration of a current source circuit of the invention.

FIG. 108 shows the circuit of FIG. 71 which is partially changed in which a current does not flow to the load in the precharge operation and the set operation. FIG. 108 is different than FIG. 71 in that a switch 10802 which selects to supply a current to the load 109 or not, a wiring 10803 to which a current is discharged and a switch 10801 which selects to discharge a current to the wiring 10803 are provided.

An operation of FIG. 108 will not be described as it is similar to FIG. 96.

FIG. 108 shows a circuit of this embodiment mode, however, the invention is not limited to this. The invention can be configured by using various circuits by changing the arrangement and number of switches, the polarity of each transistor, the number and arrangement of the current source transistor and the switching transistor and the multi transistor, a potential of each wiring, a direction of current flow and the like. By using each change in combination, various circuits can be configured.

Figure 111:
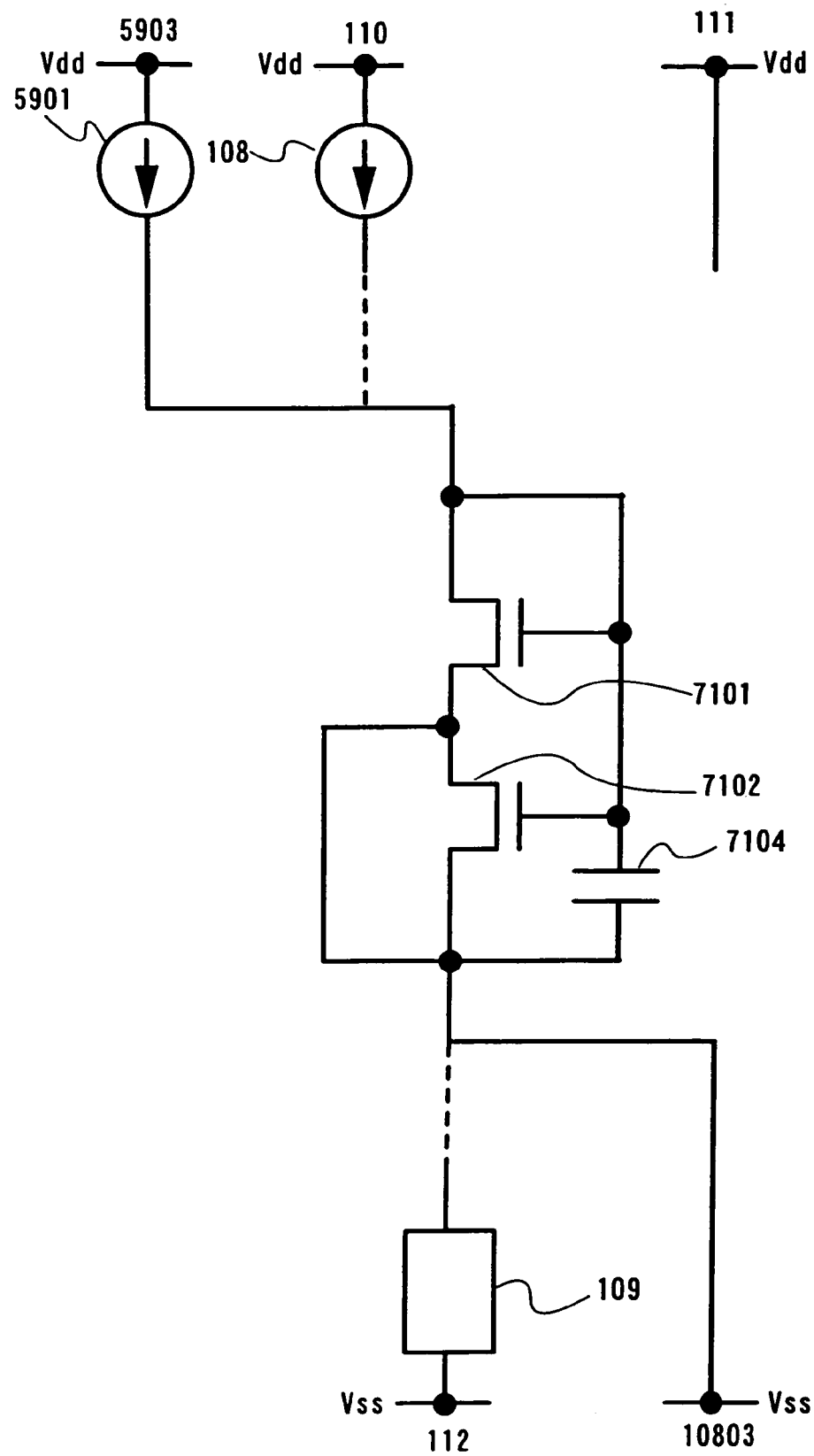
FIG. 111 is a diagram showing connections of a certain operation of a current source circuit of the invention.
Figure 112:
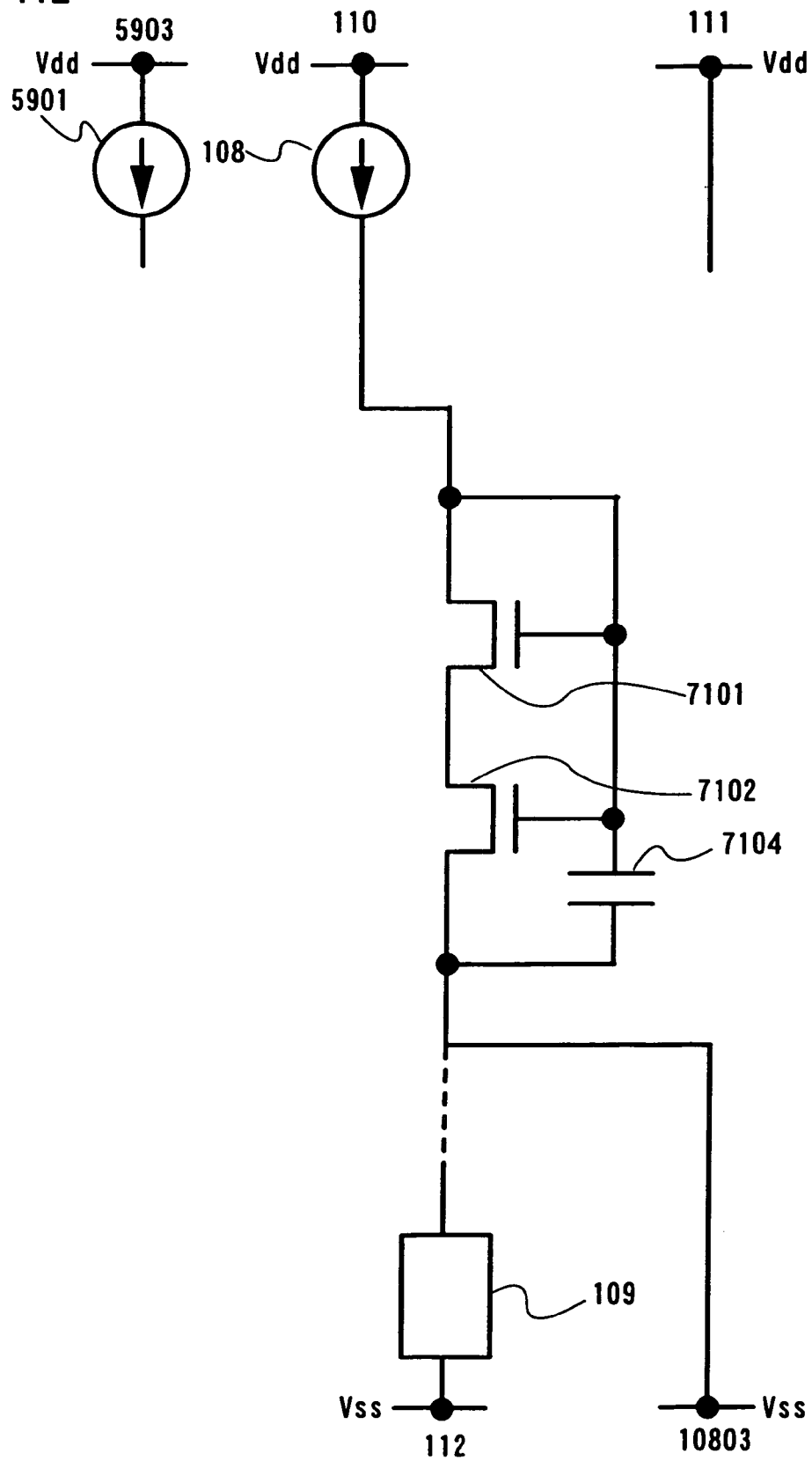
FIG. 112 is a diagram showing connections of a certain operation of a current source circuit of the invention.
Figure 113:
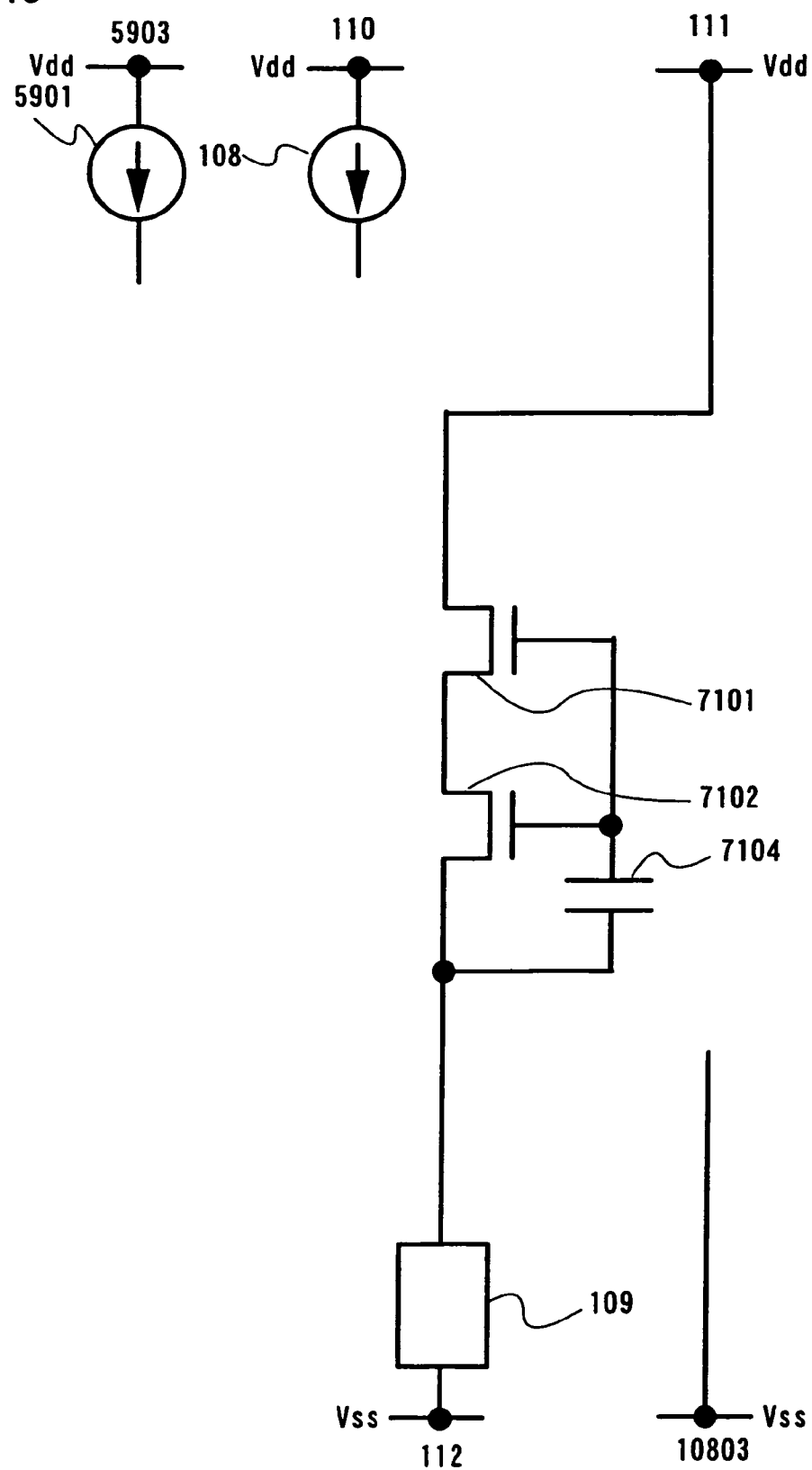
FIG. 113 is a diagram showing connections of a certain operation of a current source circuit of the invention.

For example, for example, such switches as 5902, 106, 107, 7103, 7105, 10801, and 10802 may be arranged anywhere as long as they can control on/off of current. That is, the switches 5902, 106, 107, 7103, 7105, 10801, and 10802 may be arranged anywhere as long as they are connected as shown in FIG. 111 in the precharge operation, connected as shown in FIG. 112 in the set operation, and connected as shown in FIG. 113 in the output operation.

Figure 109:
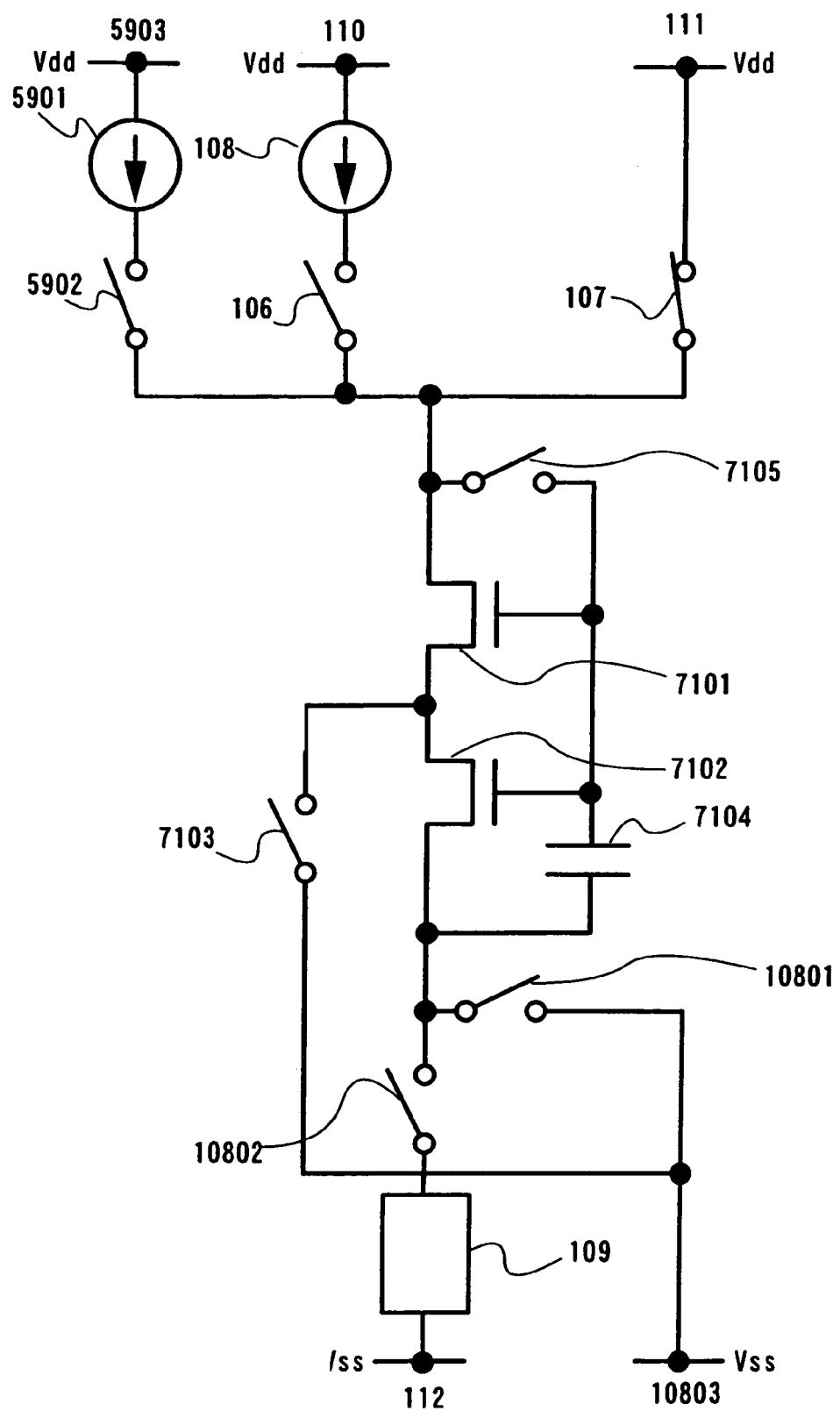
FIG. 109 is a diagram showing a configuration of a current source circuit of the invention.
Figure 110:
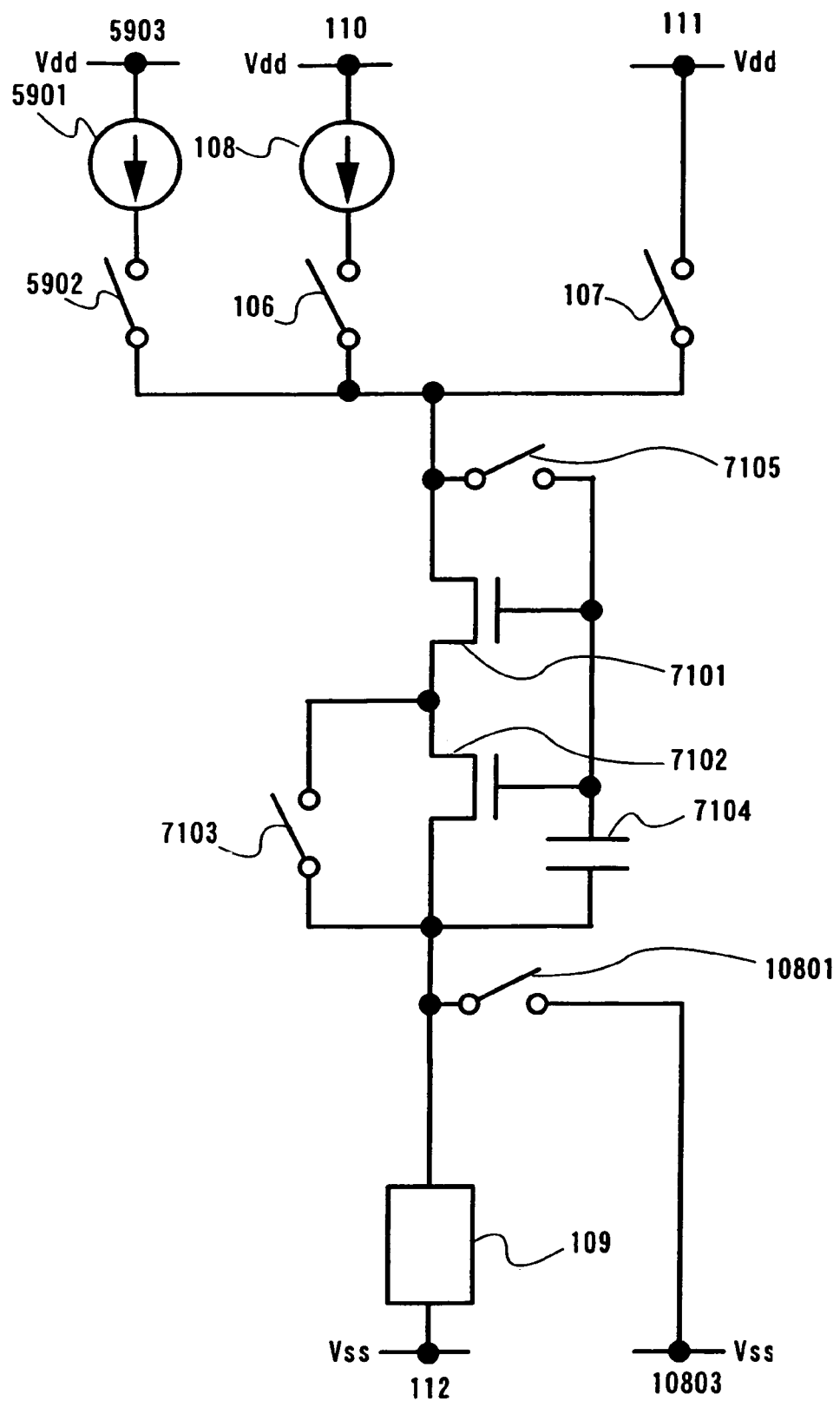
FIG. 110 is a diagram showing a configuration of a current source circuit of the invention.

Therefore, the switch 7103 may be connected as shown in FIG. 109. Alternatively, the switch 10802 shown in FIG. 108 may not be provided as shown in FIG. 110. That is, by turning on the switch 10801 in the precharge operation and the set operation, a current hardly flows to the load 109 but flows to the wiring 10803, thus a voltage drop does not affect almost at all.

FIG. 135 shows the circuit of FIG. 114 which is partially changed in which a current does not flow to a load in the precharge operation and the set operation. FIG. 135 is different than FIG. 114 in that a switch 13502 which selects to supply a current to the load 109 or not, a wiring 13503 to which a current is discharged, and a switch 13501 which selects to discharge a current to the wiring 13503 or not are provided.

Here, an operation of FIG. 135 is described. First, as shown in FIG. 136, the switches 5902, 11403*b*, 11403*c*, and 13501 are turned on and the switches 106, 107, 11403*a*, and 13502 are turned off. Then, a current does not flow between the source and drain of the set transistor 11401. Therefore, the current Ib2 of the second reference current source 5901 flows to the capacitor 11404 and the charge transistor 11402. Then, when a current which flows between the source and drain of the charge transistor 11402 and the current Ib2 of the second reference current source 5901 become equal to each other, a current stops flowing to the capacitor 11404.

That is, the steady state is obtained. A potential of a gate terminal at that time is accumulated in the capacitor 11404. That is, a voltage required to supply the current Ib2 between the source and drain of the charge transistor 11402 is applied to the gate terminal thereof. The aforementioned operation corresponds to the precharge operation.

Next, as shown in FIG. 137, the switches 106, 11403*a*, and 11403*c* are turned on and the switches 5902, 107, 11403*b*, and 13502 are turned off. Then, a current stops flowing between the source and drain of the charge transistor 11402 as the switch 11403*b* is off. Accordingly, the current Ib1 of the reference current source 108 flows to the capacitor 11404 and the set transistor 11401.

When the current which flows between the source and drain of the set transistor 11401 and the current Ib1 of the reference current source 108 become equal, a current stops flowing to the capacitor 11404. That is, a steady state is obtained. A potential of the gate terminal at that time is accumulated in the capacitor 11404. That is, a voltage required to supply the current Ib1 between the source and drain of the set transistor 11401 is applied to the gate terminal thereof. The aforementioned operation corresponds to the set operation.

The current Ib1 of the reference current source 108, the current Ib2 of the second reference current source 5901, transistor sizes (gate width W, gate length L and the like) of the set transistor 11401 and the charge transistor 11402 are appropriately set at this time so that a charge accumulated in the capacitor 11404, that is a potential of the gate terminal of the set transistor 11401 (or the charge transistor 11402) becomes approximately equal between the precharge operation and the set operation.

In the case where the current Ib2 of the second reference current source 5901 is larger than the current Ib1 of the reference current source 108, the capacitor 11404 can be charged rapidly in the precharge operation, thus a steady state can be obtained. In the set operation after that, the steady state can be rapidly obtained even when the current Ib1 of the reference current source 108 is small. This is because the capacitor 11404 is almost charged by the precharge operation.

Next, as shown in FIG. 138, the switches 5902, 106, 11403*b*, 11403*c*, and 13501 are turned off and the switches 107, 11403*a*, and 13502 are turned on. Then, a current flows to the load 109. The aforementioned operation corresponds to the output operation.

In this manner, by controlling on/off of the switches 11403*a* and 11403*b*, a current which flows in the precharge operation can be large, thus a steady state can be obtained rapidly. That is to say, an effect of a load which is parasitic on a wiring through which a current flows (wiring resistance, intersection capacitance and the like) is lessened and the steady state can be performed rapidly. At that time, a state close to the steady state in the set operation is already obtained. Therefore, the steady state can be rapidly obtained in the set operation after the precharge operation.

Therefore, in the case where the load 109 is an EL element, a signal can be written rapidly when the EL element emits light at a low gray scale level.

In the case of using a p-channel transistor which operates in the saturation region as the reference current source 108 and the second reference current source 5901 in the configuration of FIG. 114, potentials of the wirings 110 and 5903 are required to be set in consideration of a voltage drop at the load 109 so that the p-channel transistor operates in the saturation region. That is, a potential high enough to operate the p-channel transistor in the saturation region even when a voltage drops at the load 109 is required to be set at the wirings 110 and 5903. In the configuration of FIG. 135, however, a current is discharged to the wiring 13503 without being supplied a current to the load 109 in the set operation. Therefore, the voltage drop at the load 109 does not have to be taken into consideration for the potentials set at the wirings 110 and 5903. That is, a potential lower than that in the configuration of FIG. 114 can be set. Accordingly, power consumption can be reduced in the configuration of FIG. 135.

Further, FIG. 135 shows the case of performing the precharge operation and the set operation by connecting the transistors in parallel, however, the invention is not limited to this. The invention can be configured by using various circuits by changing the arrangement and number of switches, the polarity of each transistor, the number and arrangement of the current source transistor, the switching transistor, and the multi transistor, a potential of each wiring, a direction of current flow and the like. By using each change in combination, various circuits can be configured.

For example, such switches as 5902, 106, 107, 11403*a*, 11403*b*, 11403*c*, 13501, and 13502 may be arranged anywhere as long as they can control on/off of current. That is, the switches 5902, 106, 107, 11403*a*, 11403*b*, 11403*c*, 13501, and 13502 may be arranged anywhere as long as they are connected as shown in FIG. 149 in the precharge operation, connected as shown in FIG. 150 in the set operation, and connected as shown in FIG. 151 in the output operation.

FIG. 139 shows the configuration of FIG. 135 which is partially changed. FIG. 139 is different than FIG. 135 in that the switch 13502 in FIG. 135 is changed into the multi transistor 13901 in FIG. 139. The multi transistor 13901 has the same polarity (conductivity) as the set transistor 11401 and the charge transistor 11402. A gate terminal of the multi transistor 13901 is connected to the gate terminal of the current source transistor 11401. The multi transistor 13901 changes its operation depending on the circumstance. That is, the multi transistor 13901 operates as a switch in the set operation and operates as a part of a multi-gate transistor together with the set transistor 11401 and the charge transistor 11402 in the output operation to operate as a current source.

An operation of FIG. 139 is described. First, as shown in FIG. 140, the switches 5902, 11403b, 11403c, and 13501 are turned on and the switches 106, 107, and 11403a are turned off. At this time, the gate terminal and a source terminal of the multi transistor 13901 have approximately the same potential. That is, a gate-source voltage of the multi transistor 13901 becomes approximately 0 V. Accordingly, the multi transistor 13901 is turned off. As the switch 11403a is off, a current does not flow between the source and drain of the set transistor 11401. Therefore, the current Ib2 of the second reference current source 5901 flows to the capacitor 11404 and the charge transistor 11402. Then, a current which flows between the source and drain of the charge transistor 11402 and the current Ib2 of the second reference current source 5901 become equal, a current stops flowing to the capacitor 11404. That is, the steady state is obtained. A potential of the gate terminal at that time is accumulated in the capacitor 11404. That is, a voltage required to supply the current Ib2 between the source and drain of the charge transistor 11402 is applied to the gate terminal thereof. The aforementioned operation corresponds to the precharge operation.

Next, as shown in FIG. 141, the switches 106, 11403a, and 11403c are turned on and the switches 5902, 107, and 11403b are turned off. At this time, the gate terminal and the source terminal of the multi transistor 13901 have approximately the same potential. That is, a gate-source voltage of the multi transistor 13901 becomes approximately 0 V. Accordingly, the multi transistor 13901 is turned off. As the switch 11403b is off, a current stops flowing between the source and drain of the charge transistor 11402. Accordingly, the current Ib1 of the reference current source 108 flows to the capacitor 11404 and the set transistor 11401.

When a current which flows between the source and drain of the set transistor 11401 and the current Ib1 of the reference current source 108 become equal, a current stops flowing to the capacitor 11404. That is, a steady state is obtained. A potential of a gate terminal at that time is accumulated in the capacitor 11404. That is, a voltage required to supply the current Ib1 between the source and drain of the set transistor 11401 is applied to the gate terminal thereof. The aforementioned operation corresponds to the set operation.

It is to be noted that the current Ib1 of the reference current source 108, the current Ib2 of the second reference current source 5901, and the transistor sizes (gate width W and gate length L) of the set transistor 11401 and the charge transistor 11402 are appropriately set at this time so that a charge accumulated in the capacitor 11404, that is a potential of the gate terminal of the set transistor 11401 (or the charge transistor 11402) becomes approximately equal between the precharge operation and the set operation.

In the case where a current value of the current Ib2 of the second reference current source 5901 is larger than that of the current Ib1 of the reference current source 108, the capacitor 11404 can be charged rapidly in the precharge operation, thus the steady state can be obtained. In the set operation after that, the steady state can be obtained rapidly even when the current Ib1 of the reference current source 108 is small. This is because the capacitor 11404 is almost charged by the precharge operation.

Next, the switches 5902, 106, 11403b, and 11403c are turned off and the switches 107 and 11403a are turned on as shown in FIG. 142. A charge stored in the set operation in the capacitor 11404 is applied to gate terminals of the set transistor 11401, the charge transistor 11402, and the multi transistor 13901. The gate terminals of the set transistor 11401, the charge transistor 11402, and the multi transistor 13901 are connected to each other. As described above, the set transistor 11401, the charge transistor 11402, and the multi transistor 13901 operate as a multi-gate transistor. Therefore, when the set transistor 11401, the charge transistor 11402, and the multi transistor 13901 are one transistor, a gate length L of the multi-gate transistor is longer than L of the set transistor 11401 and the charge transistor 11402. Therefore, a current flowing to the load 109 becomes smaller than Ib1. That is, a current which flows to the load 109 becomes smaller than that in the case of FIG. 135. The aforementioned operation corresponds to the output operation. At that time, the multi transistor 13901 operates as a part of the multi-gate transistor.

In this manner, by changing the switch 13502 of FIG. 135 into the multi transistor 13901 of FIG. 139 and connecting the gate terminal of the multi transistor 13901 to the gate terminal of the set transistor 11401, a current can be controlled automatically. Moreover, a current supplied to the load 109 can be small. In the case of FIG. 135, a wiring for controlling the switch 13502 is required for changing the operation between supplying a current to the load 109 in the output operation and stopping current thereto in the set operation, however, a current can be controlled automatically in FIG. 139, therefore, the wiring for the control can be omitted. It is to be noted that the gate terminal of the multi transistor 13901 may be connected as shown in FIG. 143.

It is preferable that the set transistor 11401, the charge transistor 11402, and the multi transistor 13901 have the same polarity (conductivity) as they operate as a multi-gate transistor in the output operation.

In the output operation, the set transistor 11401, the charge transistor 11402, and the multi transistor 13901 operate as a multi-gate transistor, however, a gate width W of each transistor may be the same or different. Similarly, a gate length L thereof may be the same or different. The gate width W, however, is preferably the same as it can be considered to be the same as a normal multi-gate transistor. By designing the gate length L of the switching transistor 11402 and the multi transistor 13901 longer, a current supplied to the load 109 becomes smaller. Therefore, the gate width and length may be designed depending on the circumstance.

In this manner, by controlling on/off of the switches 11403a and 11403b, a current which flows in the precharge operation can be large, thus the steady state can be obtained rapidly. That is to say, an effect of a load which is parasitic on a wiring through which a current flows (wiring resistance, intersection capacitance and the like) is lessened and the set operation can be performed rapidly. At that time, a state which is close to the steady state in the set operation is already obtained. Therefore, the steady state can be rapidly obtained in the set operation after the precharge operation.

Therefore, in the case where the load 109 is an EL element, a signal can be written rapidly even when the EL element emits light at a low gray scale level.

Hereinafter described is a condition that a voltage accumulated in the capacitor 11404 becomes approximately the same between the precharge operation and the set operation. First, a gate width and a gate length of the charge transistor 11402 are denoted as Wa and La while a gate width and a gate length of the set transistor 11402 are denoted as Wb and Lb. A current which flows in the set operation (in FIG. 137, the current Ib1 of the reference current source 108) times A equals a current which flows in the precharge operation (in FIG. 136, the current Ib2 of the second reference current source 5901).

Alternatively, the switch 13501 in FIG. 135 may be connected as shown in FIG. 152. It is to be noted that an operation which is similar to FIG. 135 is omitted here.

In this manner, the configuration of the invention is not limited to this and various modifications are possible unless such changes and modifications depart from the scope of the invention. For example, by changing the number and arrangement of switches, the polarity of each transistor, the numbers and arrangements of the current source transistor, the switching transistor, the multi transistor, the set transistor, and the charge transistor, a potential of each wiring, a combination with other precharge operation, a direction of current flow and the like, various circuits can be configured. By using each change in combination, various circuits can be configured.

The description made in this embodiment mode corresponds to Embodiment Modes 5 to 7 which are partially changed. Therefore, the description made in Embodiment Modes 5 to 7 can be applied to this embodiment mode as well.

Embodiment Mode 9

In this embodiment mode, structures and operations of a display device, a signal line driver circuit and the like are described. The circuit of the invention can be applied to a part of the signal line driver circuit and a pixel.

The display device includes a pixel arrangement (pixels) 17001, a gate line driver circuit (Gate Driver) 17002, and a signal line driver circuit 17010 as shown in FIG. 170. The gate line driver circuit 17002 sequentially outputs selection signals to the pixel arrangement 17001. The signal line driver circuit 17010 sequentially outputs video signals to the pixel arrangement 17001. The pixel arrangement 17001 displays an image by controlling a condition of light according to the video signals. The video signals inputted from the signal line driver circuit 17010 to the pixel arrangement 17001 are often current. That is, a display element arranged in each pixel and an element which controls the display element changes their states according to the video signals (current) inputted from the signal line driver circuit 17010. The display element arranged in the pixel is, for example, an element used for an EL element and an FED (Field Emission Display) and the like.

It is to be noted that the gate line driver circuit 17002 and the signal line driver circuit 17010 may be provided in plural numbers.

The configuration of the signal line driver circuit 17010 can be divided into a plurality of portions. Roughly, the signal line driver circuit 17010 can be divided into a shift register 17003, a first latch circuit (LAT1) 17004, a second latch circuit (LAT2) 17005, and a digital-analog converter circuit 17006. The digital-analog converter circuit 17006 includes a function to convert a voltage into a current and may also include a function to provide a gamma correction. That is, the digital-analog converter circuit 17006 includes a circuit which outputs a current (video signal) to a pixel, that is a current source circuit to which the invention can be applied.

Further, a pixel includes a display element such as an EL element. The invention can also be applied to a circuit which outputs a current (video signal) to the display element, that is a current source circuit.

An operation of the signal line driver circuit 17010 is briefly described. The shift register 17003 is formed by using a plurality of columns of flip-flop circuits (FF) and the like and inputted with a clock signal (S-CLK), a start pulse (SP), and a clock inversion signal (S-CLKb). The signal line driver circuit 17010 outputs sampling pulses are outputted sequentially in accordance with a timing of these signals.

The sampling pulses outputted from the shift register 17003 are inputted to the first latch circuit (LAT1) 17004. The first latch circuit (LAT1) 17004 is inputted with video signals from a video signal line 17008 and holds the video signals in each column in accordance with a timing at which the sampling pulses are inputted. In the case where the digital-analog converter circuit 17006 is provided, the video signal has a digital value. Moreover, the video signals in this stage is often a voltage.

However, in the case where the first latch circuit 17004 and the second latch circuit 17005 are circuits which can store analog values, the digital-analog converter circuit 17006 can be omitted in many cases. In that case, the video signal is often a current. Moreover, in the case where data outputted to the pixel arrangement 17001 has a binary value, that is a digital value, the digital-analog converter circuit 17006 can be omitted in many cases.

When the video signals are held up to the last column in the first latch circuit (LAT1) 17004, a latch pulse is inputted from a latch control line 17009 in a horizontal flyback period, thus the video signals held in the first latch circuit (LAT1) 17004 are transferred to the second latch circuit (LAT2) 17005 all at once. After that, the video signals held in the second latch circuit (LAT2) 17005 are inputted to the digital-analog converter circuit 17006 one row at a time. Then, a signal outputted from the digital-analog converter circuit 17006 is inputted to the pixel arrangement 17001.

While the video signals held in the second latch circuit (LAT2) 17005 are inputted to the digital-analog converter circuit 17006 and then inputted to the pixels 17001, sampling pulses are outputted from the shift register 17003 again. That is, two operations are performed at the same time. Accordingly, a line sequential drive can be performed. The aforementioned operation is repeated hereafter.

In the case where a current source circuit included in the digital-analog converter circuit 17006 performs the set operation and the output operation, a circuit for supplying a current to the current source circuit is required. In such a case, a reference current source circuit 17014 is provided.

The signal line driver circuit and a part thereof are formed by using, for example, an external IC chip in some cases in stead of being formed on the same substrate as the pixel arrangement 17001. The IC chip may be provided on a glass substrate by COG (Chip On Glass). Alternatively, the IC chip may be connected to a glass substrate by using TAB (Tape Auto Bonding) or a printed substrate.

It is to be noted that the configurations of the signal line driver circuit and the like are not limited to FIG. 170.

For example, in the case where the first latch circuit 17004 and the second latch circuit 17005 can store analog values, video signals (analog current) may be inputted from the reference current source circuit 17014 to the first latch circuit (LAT1) 17004 in some cases as shown in FIG. 171. In FIG. 171, the second latch circuit 17005 may not be provided. In such a case, more current sources are often provided for the first latch circuit 17004. Accordingly, the set operation, the output operation and the like can be performed at the same time without the second latch circuit 17005. For example, two or more current source circuits may be provided and used alternately. That is, the set operation is performed to one current source circuit while the output operation is performed to the other current source circuit. Then, the aforementioned operations are exchanged in an arbitrary cycle. Accordingly, the set operation, the output operation and the like can be performed at the same time. As a result, the second latch circuit 17005 can be omitted. A configuration and an operation of such a circuit are described in International Publication WO03/038796 and International Publication WO03/038797 of which description can be applied to'the invention.

Embodiment Mode 10

Next, a specific configuration of the signal line driver circuit 17010 described in Embodiment Mode 9 is described.

FIG. 153 shows an example of the case where the invention is applied to the signal line driver circuit. FIG. 153 shows an example where transistors are connected in series as shown in FIG. 108. Transistors 15301 and 15302, a capacitor 15304, a load 15309, a reference current source 15310, a second reference current source 15311, switches 15306, 15307, and 15308, and a wiring 15315 in FIG. 153 correspond to the current source transistor 7101, the switching transistor 7102, the capacitor 7104, the load 7109, the reference current source 108, the second reference current source 5901, the switches 106, 5902, and 107, and the wiring 111 in FIG. 108 respectively. The switches 7105 and 7103 shown in FIG. 108 are substituted by transistors 15305 and 15303 in FIG. 153 respectively. Further, the wirings 5903 and 110 in FIG. 108 a common wiring 15312 in FIG. 153.

A wiring 15313 is connected to a plurality of current source circuits. FIG. 153 shows only a current source circuit 15316 for simplicity. A current of the reference current source 15310 is controlled by turning on/off the switch 15306, a current of the second reference current source 15311 is controlled by turning on/off the switch 15307, and connections of the wiring 15315 and the current source circuit 15316 is controlled by turning on/off the switch 15308. That is, the switch 15307 is turned on in the precharge operation to supply a current of the second reference current source 15311 and the switch 15306 is turned on in the set operation to supply a current of the reference current source 15310. In the output operation, the switch 15308 is turned on to set the potential of the wiring 15315 at the current source circuit. A current of a reference current source circuit 15320 which is formed of the reference current source 15310 and the second reference current source 15311 can be supplied to the current source circuit 15316 in the precharge operation and the set operation of each current source circuit by turning on the switching transistor 15314. Further, the precharge operation, the set operation, and the output operation of the current source circuit 15316 are changed by using the wirings 15317, 15318, and 15319.

A current source of the reference current source circuit 17014 corresponds to the reference current source circuit 15320 in FIG. 153. The load 15309 in FIG. 153 corresponds to a signal line, a pixel connected to the signal line, and another current source circuit.

As an example of applying the invention to the signal line driver circuit, FIG. 154 shows the case where transistors are connected in parallel as shown in FIG. 126. It is to be noted that a plurality of current source circuits are connected to a wiring 15418, however, a current source circuit 15413 only is shown in FIG. 154. Transistors 15401 and 15402, a capacitor 15404, a load 15409, a reference current source 15410, a second reference current source 15411, switches 15406, 15407, and 15408, and a wiring 15414 in FIG. 154 correspond to the set transistor 12601, the charge transistor 12602, the capacitor 12604, the load 12609 the reference current source 108, the second reference current source 5901, the switches 106 and 5902, the switch 107, and the wiring 111 in FIG. 126 respectively. Further, switches 12603*a*, 12603*b*, and 12603*c* shown in FIG. 126 are substituted by transistors 15403*a*, 15403*b*, and 15403*c* in FIG. 154. The wirings 5903 and 110 in FIG. 126 are a common wiring 15412 in FIG. 154. It is to be noted that the precharge operation, the set operation, and the output operation of the current source circuit 15418 are changed by the wirings 15414, 15415, 15416, and 15417. In the precharge operation, the switch 15407 is turned on in the precharge operation to supply a current of the second basic current source 15411 and the switch 15406 is turned on in the set operation to supply a current of the second reference current source 15410 to the current source circuit. In the output operation, the switch 15408 is turned on to set the potential of the wiring 15414 at the current source circuit. A current of the reference current source circuit 15419 which is formed of the reference current source 15410, the second reference current source 15411 and the like can be supplied to the current source circuit 15413 in the precharge operation and the set operation of each current source circuit.

Although only one current source circuit is shown in FIGS. 153 and 154, however, the output operation can be performed while performing the set operation by providing a plurality of current source circuits in parallel and using them alternately.

Although two reference current sources for the precharge operation are provided in FIGS. 153 and 154, the second reference current source may be omitted. That is, various current source circuits described in Embodiment Modes 1 to 8 can be applied.

In the case of performing the set operation to the current source circuit, a timing thereof is required to be controlled. In that case, a dedicated driver circuit (a shift register and the like) may be provided for controlling the set operation. Alternatively, the set operation to the current source circuit may be controlled by using a signal outputted from the shift register for controlling the LAT1 circuit. That is, the LAT1 circuit and the current source circuit may be both controlled by using one shift register. In that case, a signal outputted from the shift register for controlling the LAT1 circuit may be directly inputted to the current source circuit. Otherwise, the current source circuit may be controlled via a circuit which separates a control of the LAT1 circuit and a control of the current source circuit. Alternatively, a signal outputted from the LAT2 circuit may be used to control the set operation to the current source circuit. As the signal outputted from the LAT2 circuit is normally a video signal, the current source circuit is to be controlled via a circuit which separates the case of using the signals as video signals and the case of controlling the current source circuit. In this manner, a circuit configuration for controlling the set operation and the output operation, an operation and the like of the circuit are described in International Publication WO03/038794 and International Publication WO03/038795 of which descriptions can be applied to the invention.

In the case of outputting an analog current to the load 15309 (for example, a switch, a signal line, a pixel connected to the signal line, and the like), a digital-analog conversion is required to be performed. Thus, a configuration shown in FIG. 155 in which a plurality of current source circuits are provided is employed. For simplicity, the case of 3-bit operation is shown in FIG. 155. That is, there are reference current source circuits 15503A, 15503B, and 15503C each having a current size of Ic, 2×Ic, and 4×Ic respectively in the set operation. Each of current source circuits 15501A, 15501B, and 15501C are connected to the reference current source circuits respectively. The current source circuits 15501A, 15501B, and 15501C may be the current source circuit 15316 shown in FIG. 153 or the current source circuit 15418 shown in FIG. 154. Therefore, in the output operation, the current source circuits 15501A, 15501B, and 15501C each outputs a current of Ic, 2×Ic, and 4×Ic respectively in the output operation. Then, switches 15502A, 15502B, and 15503C are connected in series to each of the current source circuits. These switches are controlled by video signals outputted from the second latch circuit (LAT2) 17005. A sum of a current outputted from each of the current source circuits and switches is outputted to a load 15504, that is a signal line and the like. According to the aforementioned operation, an analog current is outputted as a video signal to a pixel and the like.

For simplicity, FIG. 155 shows the case of 3-bit operation, however, the invention is not limited to this. With a similar configuration to FIG. 155, the number of bits can be easily changed. By providing more current sources in parallel similarly to FIGS. 153 and 154, the set operation and the like and the output operation can be performed at the same time.

Next, the case of FIG. 171 is described. A current source of the reference current source circuit 17014 corresponds to the reference current source circuits 15320 and 15419 in FIGS. 153 and 154. A current source circuit provided in the first latch circuit (LAT1) 17004 corresponds to the current source circuits 15316 and 15418 in FIGS. 153 and 154. The load 15309 in FIGS. 153 and 154 corresponds to a current source circuit provided in the second latch circuit (LAT2) 17005. In this case, a video signal is outputted as a current from a current source of the reference current source circuit 17014. The current may have a digital value or an analog value depending on the case.

In the case where the second latch circuit (LAT2) 17005 is not provided, the loads 15309 and 15409 in FIGS. 153 and 154 correspond to a pixel and a signal line.

The current source circuit provided in the first latch circuit 17004 may correspond to the reference current source circuits 15320 and 15419 in FIGS. 153 and 154, the current source circuit provided in the second latch circuit 17005 may correspond to the current source circuits 15316 and 15418 in FIGS. 153 and 154, and the pixel and the signal line may correspond to the loads 15309 and 15409 in FIGS. 153 and 154.

Furthermore, can be applied to the reference current source circuit 17014 shown in FIGS. 170 and 171. That is, the reference current source circuit 17014 may correspond to the current source circuits 15316 and 15418 in FIGS. 153 and 154, the current source circuit provided in the first latch circuit 17004 may correspond to the loads 15316 and 15418 in FIGS. 153 and 154, and another current source (a circuit which supplies a current to the reference current source circuit 17014) may correspond to the reference current source circuits 15320 and 15419 in FIGS. 153 and 154.

The light emitting element provide in the pixel may correspond to the loads 15309 and 15409 in FIGS. 153 and 154, the current source circuit provided in the pixel may correspond to the current source circuits 15316 and 15418 in FIGS. 153 and 154, and the current source circuit which outputs a current to the pixel in the signal line driver circuit 17010 may correspond to the reference current source circuits 15320 and 15419 in FIGS. 153 and 154. It is to be noted that a current is supplied from the current source circuit provided in the pixel and thus the light emitting element emits light.

In this manner, the invention can be applied to various portions.

A digital video signal (current value) corresponding to each bit may be inputted to the first latch circuit 17004. By adding the digital video signals corresponding to each bit after that, a digital value can be converted into an analog value. In that case, it is preferable to apply the invention when inputting a bit signal of smaller digit as a current value of a signal becomes small in the case of a bit signal of smaller digit. According to the invention, a current value of a signal can be large. Accordingly, a write speed of a signal can be increased.

In FIG. 153, the configuration of FIG. 108 is used as a configuration of the current source circuit 15316, however, the invention is not limited to this. Similarly, the configuration of FIG. 126 is used as a configuration f the current source circuit 15418, however, the invention is not limited to this. Various configuration of the invention can be employed.

By applying the invention to the signal line driver circuit in this manner, a signal can be written rapidly by the set operation even when a current value inputted to the signal line driver circuit is small. Provided that the signal cannot be written sufficiently by the set operation, an accurate current cannot be outputted to the signal line, which leads to an inaccurate display of the pixels. Therefore, by applying the invention, a defect in image quality can be prevented.

It is to be noted that the description made in this embodiment mode utilizes the description made in Embodiment Modes 1 to 9. Accordingly, the description made in Embodiment Modes 1 to 9 can be applied to this embodiment mode as well.

Embodiment Mode 11

In Embodiment Mode 10, a specific configuration of the signal line driver circuit 17010 has been described. In this embodiment mode, a specific configuration of the case where the invention is applied to the pixels arranged in the pixel arrangement 17001 is described.

FIG. 156 shows the case where the configuration of FIG. 1 is applied to the pixel. The load 109 in FIG. 1 corresponds to an EL element 15609 in FIG. 156. The reference current source 15608 in FIG. 156 corresponds to the current source circuit provided in the digital-analog converter circuit 17006 in FIG. 170 and corresponds to the current source circuit provided in the second latch circuit 17005 in FIG. 171. In the case where the second latch circuit 17005 is not provided in FIG. 171, the reference current source 15608 corresponds to the current source circuit provided in the first latch circuit 17004. It is to be noted that a plurality of pixels are connected to the wiring 15613. For simplicity, only one pixel is connected in FIG. 156.

Transistors 15601 and 15602, a capacitor 15604, a load 15609, a reference current source 15608, switches 15606 and 15607, wirings 15610, 15611, and 15617 correspond to the current source transistor 101, the switching transistor 102, the capacitor 104, the load 109, the reference current source 108, the switches 106 and 107, the wirings 110, 112, and 111 respectively. The switches 103 and 105 shown in FIG. 1 are substituted by transistors 15603 and 15605 in FIG. 156 respectively. Each switch (transistor in FIG. 156) is controlled to be turned on/off by using gate lines 15614, 15615, and 15616. By turning on/off a selecting transistor 15612 by controlling the gate line 15614, a signal is inputted from a signal line 15613. It is to be noted that a detailed operation thereof which is similar to FIG. 1 is omitted here.

FIG. 157 shows the case of applying the configuration of FIG. 51 to a pixel. Transistors 15701 and 15702, a capacitor 15704, a load 15709, a reference current source 15713, switches 15714 and 15715, wirings 15716, 15717, and 15712 in FIG. 157 correspond to the current source transistor 5101, the charge transistor 5102, the capacitor 5104, the load 109, the reference current source 108, the switches 106 and 107, and the wirings 110, 111, and 112 in FIG. 51. The switches 5103a, 5103b, and 5103c shown in FIG. 51 are substituted by transistors 15703a, 15703b, and 15703c in FIG. 157 respectively. Gate lines 15707, 15708, 15710, and 15711 are used to control on/off of each switch (transistor in FIG. 157). By turning on/off a selecting transistor 15705 by controlling the gate line 15707, a signal is inputted from a signal line 15706. It is to be noted that a detailed operation thereof which is similar to FIG. 51 is omitted here. Moreover, a gate terminal of the transistor 15702 can be connected as shown in FIG. 167. The configuration of FIG. 10 is applied to the pixel in FIG. 167.

FIG. 158 shows the case where the configuration of FIG. 40 is applied to the pixel. Transistors 15801, 15802, and 15808, a capacitor 15804, a load 15809, a reference current source 15817, switches 15818 and 15819, wirings 15820, 15816, and 15815 in FIG. 158 correspond to the current source transistor 101, the charge transistor 102, the multi transistor 4001, the capacitor 104, the load 109, the reference current source 108, the switches 106 and 107, and the wirings 111, 3703, and 112 in FIG. 40 respectively. The switches 103, 105, and 3701 shown in FIG. 40 are substituted by transistors 15803, 15805, and 15807 in FIG. 158 respectively. Gate lines 15811, 15812, 15813, and 15814 are used to control on/off of each switch (transistor in FIG. 158). By turning on/off a selecting transistor 15806 by controlling the gate line 15811, a signal is inputted from a signal line 15810. It is to be noted that a detailed operation thereof which is similar to FIG. 40 is omitted here.

FIG. 159 shows the case where the configuration of FIG. 175 is applied to the pixel. Transistors 15901, 15902, and 15907, a capacitor 15904, a load 15909, a reference current source 15917, switches 15918 and 15919, wirings 15920, 15921, 15910, and 15911 in FIG. 159 correspond to the current source transistor 5101, the charge transistor 5102, the multi transistor 17501, the capacitor 5104, the load 109, the reference current source 108, the switches 106 and 107, and the wirings 110, 111, 112, and 17401 in FIG. 175 respectively. The switches 5103a, 5103b, 5103c, and 17403 shown in FIG. 175 are substituted by transistors 15903a, 15903b, 15903c, and 15906 in FIG. 159 respectively. Gate lines 15912, 15913, 15914, 15915, and 15916 are used to control on/off of each switch (transistor in FIG. 159). By turning on/off a selecting transistor 15905 by controlling the gate line 15912, a signal is inputted from a signal line 15908. It is to be noted that a detailed operation thereof which is similar to FIG. 175 is omitted here.

FIG. 162 shows the case where the configuration of FIG. 59 is applied to the pixel. Transistors 16201 and 16202, a capacitor 16204, a load 16209, a reference current source 16213, a second reference current source 16214, switches 16215, 16216, and 16217, and wirings 16211 and 16219 in FIG. 162 correspond to the current source transistor 101, the switching transistor 102, the capacitor 104, the load 109, the reference current source 108, the second reference current source 5901, the switches 106, 5902, and 107, and the wirings 112 and 111 in FIG. 59 respectively. It is to be noted that the wirings 110 and 5903 in FIG. 59 are a common wiring 16218 in FIG. 162 respectively. The switches 103 and 105 in FIG. 59 are substituted by transistors 16203 and 16205 in FIG. 162. Each switch (transistor in FIG. 162) is controlled to be turned on/off by using gate lines 16206, 16207, and 16208. By tuning on/off a selecting transistor 16212 by controlling the gate line 16206, a signal is inputted from a signal line 16210. It is to be noted that a detailed operation thereof which is similar to FIG. 59 is omitted here.

FIG. 163 shows the case where the configuration of FIG. 114 is applied to the pixel. Transistors 16301 and 16302, a capacitor 16304, a load 16310, a reference current source 16313, a second reference current source 16314, switches 16315, 16316, and 16317, and wirings 16319 and 16312 in FIG. 163 correspond to the set transistor 11401, the charge transistor 11402, the capacitor 11404, the load 109, the reference current source 108, the second reference current source 5901, the switches 106, 5902, and 107, and the wirings 111 and 112 in FIG. 114 respectively. The switches 11403a, 11403b, and 11403c in FIG. 114 are substituted by transistors 16303a, 16303b and 16303c in FIG. 163. Each switch (transistor in FIG. 163) is controlled to be turned on/off by using gate lines 16306, 16307, 16308, and 16309. By turning on/off a selecting transistor 16305 by controlling the gate line 16306, a signal is inputted from a signal line 16311. It is to be noted that a detailed operation thereof which is similar to FIG. 114 is omitted here.

The configuration applied to the pixel is not limited to those shown in FIGS. 156 to 163.

The pixel can be configured by using various configurations described in Embodiment Modes 1 to 8.

For example, the polarity (conductivity) of the transistors in FIGS. 156 to 163 is not limited to this. When the transistors operate as switches, in particular, the polarity of the transistors (conductivity) can be changed without changing the connections.

Although a current flows from a power source line 6808 to a wiring 113 in FIGS. 156 to 163, the invention is not limited to this. By controlling the potentials of the power source line 6808 and the wiring 113, a current may flow from the wiring 113, to the power source line 6808.

In that case, however, an EL element 109 is required to be disposed reversely as a current normally flows from an anode to a cathode in the EL element 109.

It is to be noted that light may be emitted from either the anode side or the cathode side of the EL element.

The gate lines are connected to the respective transistors in FIGS. 156 to 163, however, the invention is not limited to these configurations.

For example, by controlling the polarity and operation of the transistor which operates as a switch, each gate line can be shared. For example, by controlling the polarity of each transistor in FIG. 156, the number of gate lines can be reduced as shown in FIG. 160. Similarly, the number of gate lines can be reduced in FIG. 157 as shown in FIG. 161.

In this manner, a pixel can be formed by various configurations. In the case of displaying an image using these pixels, a gray scale can be displayed by using various methods.

For example, a gray scale can be displayed by inputting an analog video signal (analog current) from a signal line to a pixel and supplying a current having a size according to the inputted digital video signal.

Alternatively, two-level gray scale can be displayed by inputting a digital video signal (digital current) from a signal line to a pixel and supplying a current having a size according to the inputted digital video signal. In this case, however, a multi-level gray scale is to be displayed by using the time gray scale method, the area gray scale method and the like in combination.

In the case of forcibly setting the light emitting element not to emit light, for example, in the time gray scale method and the like, a current is not to be supplied to a display element. Therefore, for example, the switch 15607 in FIG. 156, the switch 15715 in FIG. 157, the switch 15819 in FIG. 158, the switch 15919 in FIG. 159, the switch 15607 in FIG. 160, and the switch 15715 in FIG. 161 are to be turned off in the output operation. Otherwise, a charge in a capacitor may be controlled so as not to supply a current to the light emitting element as well. In order to realize the aforementioned operation, a switch and the like may be used.

In the case of controlling the charges in the capacitors 15604 and 15704 to forcibly set the light emitting element not to emit light when the number of gate lines are required to be reduced as shown in FIGS. 160 and 161, it is preferable to control a transistor which can change the charges in the capacitors 15604 and 15704 by using a dedicated gate line.

It is to be noted that a detailed description on the time gray scale method is omitted here, which can be referred in Japanese Patent Application No. 2001-5426 and Japanese Patent Application No. 2000-86968.

Further, such a pixel configuration may be employed that a digital video signal (digital voltage) is inputted from a signal line to a pixel to control a current to be supplied to a display element or not in accordance with the video signal, thus a two-level gray scale is displayed. Therefore, in this case also, a multi-level gray scale is to be displayed by using the time gray scale method, the area gray scale method and the like in combination. FIG. 164 shows a schematic diagram thereof. A switch 16401 is turned on/off by controlling a gate line 16406 and a voltage is inputted from a signal line 16405 to a capacitor 16404. A switch 16402 connected in series to a current source circuit 16403 is controlled by a level of the voltage inputted to the capacitor 16406, thereby it is determined to supply a current to an EL element 16407 or not. The invention can be applied to the current source circuit 16403. That is, the precharge operation and the set operation are performed by supplying a current from a reference current source 16410 to a current source circuit 16403 and a current is supplied from the reference current source circuit 16403 to the EL element 16407 as a load. A current of the reference current source 16410 at this time is preferably set to be large in the precharge operation. Further, the precharge operation may be performed by providing a second reference current source.

The precharge operation and the set operation may be performed by supplying a current from another current source to the reference current source 16410 and a current may be supplied from the reference current source 16410 to the current source circuit 16403 as a load.

FIG. 165 shows an example in which the circuit shown in FIG. 37 is applied as the current source circuit 16403 to a pixel while FIG. 166 shows an example in which the circuit shown in FIG. 174 is applied to a pixel. Transistors 16501 and 16502, a capacitor 16504, a load 16407, a reference current source 16410, switches 16503, 16505, 16508, 16409, and 16506, wirings 16411, 16412, 16408, and 16507 in FIG. 165 correspond to the current source transistor 101, the switching transistor 102, the capacitor 104, the load 109, the reference current source 108, the switches 103, 105, 106, 107, and 3701, the wirings 110, 111, 112, and 3703 in FIG. 37 respectively. The switch 3702 in FIG. 37 is substituted by a transistor 16402 in FIG. 165. Transistors 16601 and 16602, a capacitor 16606, the load 16407, the reference current source 16410, switches 16603*a*, 16603*b*, 16603*c*, 16607, 16409, and 16604, and wirings 16411, 16412, 16408, and 16605 in FIG. 166 correspond to the current source transistor 5101, the set transistor 5102, the capacitor 5104, the load 109, the reference current source 108, the switches 5103*a*, 5103*b*, 5103*c*, 106, 107, and 17403, and the wirings 110, 111, 112, and 17401 respectively. The switch 17402 in FIG. 174 is substituted by the transistor 16402 in FIG. 166.

It is to be noted that the configuration of the invention is not limited to the circuits shown in FIGS. 165 and 166 and various circuits described in this embodiment mode can be applied.

By applying the invention to the pixel in this manner, a signal can be written rapidly by the set operation even when a current value inputted to the signal line driver circuit is small. Provided that the signal cannot be written sufficiently by the set operation, an accurate current cannot be outputted to the signal line, which leads to an inaccurate image display. Therefore, by applying the invention, a defect in image quality can be prevented.

It is to be noted that the description made in this embodiment mode utilizes the description made in Embodiment Modes 1 to 10. Accordingly, the description made in Embodiment Modes 1 to 10 can be applied to this embodiment mode as well.

Embodiment Mode 12

The invention can be applied to electronic devices such as a video camera, a digital camera, a goggle type display (a head mounted display), a navigation system, an audio reproducing device (a car audio set, an audio component system and the like), a notebook personal computer, a game machine, a portable information terminal (a mobile computer, a portable phone, a portable game machine, an electronic book or the like), and an image reproducing device provided with a recording medium (specifically, a device which reproduces a recording medium such as a DVD (Digital Versatile Disc) and is provided with a display capable of displaying the reproduced image). Specific examples of these electronic devices are shown in FIGS. 168A to 168H.

Figure 168A:
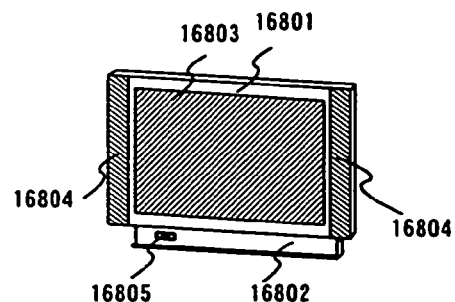

FIG. 168A illustrates a light emitting device including a housing 16801, a support base 16802, a display portion 16803, speaker portions 16804, a video input terminal 16805 and the like. The invention can be applied to an electronic circuit which forms the display portion 16803. According to the invention, the light emitting device shown in FIG. 168A is completed. As the light emitting device emits light by itself, a backlight is not required and a display portion thinner than a liquid crystal display can be formed. Note that the light emitting device refers to all light emitting devices for displaying information, including ones for personal computers, TV broadcasting reception, and advertisement.

Figure 168B:
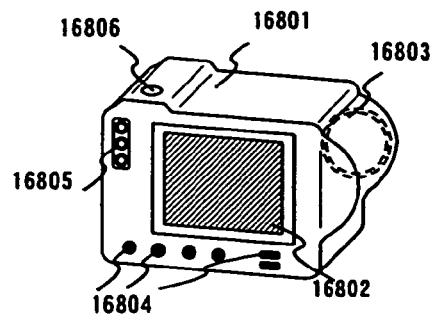

FIG. 168B illustrates a digital still camera including a main body 16801, a display portion 16802, an image receiving portion 16803, operating keys 16804, an external connecting port 16805, a shutter 16806 and the like. The invention can be used in an electronic circuit which forms the display portion 16802. According to the invention, the digital still camera shown in FIG. 168B is completed.

Figure 168C:
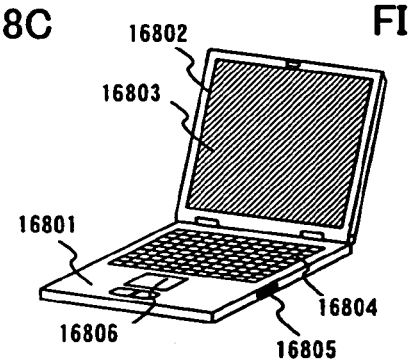

FIG. 168C illustrates a notebook personal computer including a main body 16801, a housing 16802, a display portion 16803, a keyboard 16804, an external connecting port 16805, a pointing mouse 16806 and the like. The invention can be applied to an electronic circuit which forms the display portion 16803. According to the invention, the notebook personal computer shown in FIG. 168C is completed.

Figure 168D:
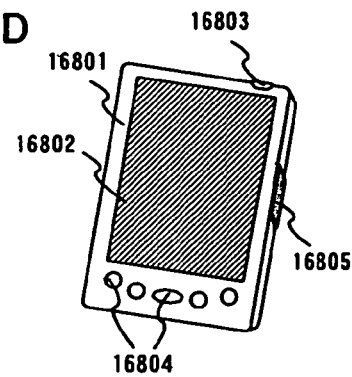

FIG. 168D illustrates a mobile computer including a main body 16801, a display portion 16802, a switch 16803, operating keys 16804, an infrared port 16805, and the like. The invention can be applied to an electronic circuit which forms the display portion 16802. According to the invention, the mobile computer shown in FIG. 168D is completed.

Figure 168E:
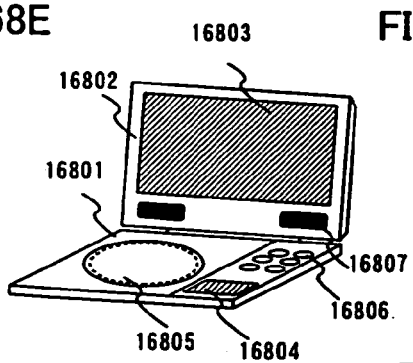

FIG. 168E illustrates an image reproducing device provided with a recording medium (specifically, a DVD reproducing device) including a main body 16801, a housing 16802, a display portion A 16803, a display portion B 16804, a recording medium (DVD and the like) reading portion 16805, an operating key 16806, a speaker portion 16807 and the like. The display portion A 16803 mainly displays image data while the display portion B 16804 mainly displays text data. The invention can be applied to an electronic circuit which forms the display portions A 16803 and B 16804. Note that the image reproducing device provided with a recording medium includes a home game machine and the like. According to the invention, the DVD reproducing device shown in FIG. 168E is completed.

Figure 168F:
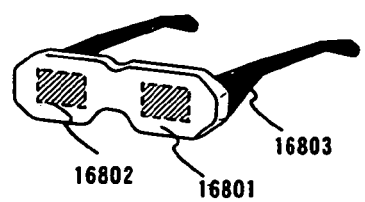

FIG. 168F illustrates a goggle type display (a head mounted display) including a main body 16801, a display portion 16802, and an arm portion 16803. The invention can be applied to an electronic circuit which forms the display portion 16802. According to the invention, a goggle type display shown in FIG. 168F is completed.

Figure 168G:
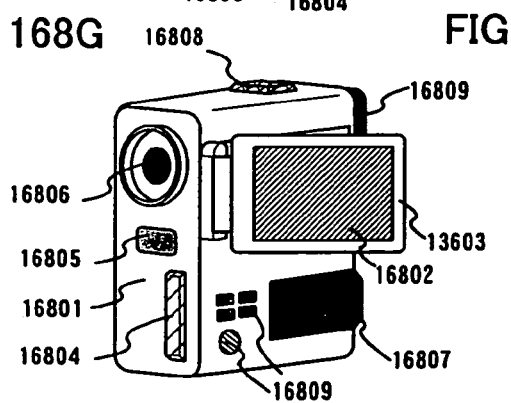

FIG. 168G illustrates a video camera including a main body 16801, a display portion 16802, a housing 16803, an external connecting port 16804, a remote control receiving portion 16805, an image receiving portion 16806, a battery 16807, an audio input portion 16808, operating keys 16809 and the like. The invention can be applied to an electronic circuit which forms the display portion 16802. According to the invention, the video camera shown in FIG. 168G is completed.

Figure 168H:
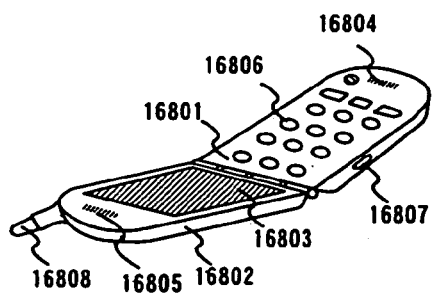

FIG. 168H illustrates a portable phone including a main body 16801, a housing 16802, a display portion 16803, an audio input portion 16804, an audio output portion 16805, an operating key 16806, an external connecting port 16807, an antenna 16808 and the like. The invention can be applied to an electronic circuit which forms the display portion 16803. When the display portion 16803 displays white text on a black background, power consumption of the portable phone can be suppressed. According to the invention, the portable phone shown in FIG. 168H is completed.

Provided that a luminance of a light emitting material becomes higher in the future, the light including outputted image data can be expanded and projected by using a lens and the like to be used for a front or rear type projector.

Furthermore, the aforementioned electronic devices are becoming to be more used for displaying information distributed through a telecommunication path such as Internet, a CATV (cable television system), and in particular for displaying moving image data. The light emitting device is suitable for displaying moving images since the light emitting material can exhibit high response speed.

It is preferable to display data with as small light emitting portion as possible because the light emitting device consumes power in the light emitting portion. Therefore, in the case of using the light emitting device in the display portions of the portable information terminal, in particular a portable phone or an audio reproducing device which mainly displays text data, it is preferable to drive so that the text data is formed by a light emitting portion with a non-light emitting portion as a background.

As described above, the application range of the invention is so wide that the invention can be used in various fields of electronic devices. The electronic devices described in this embodiment can use any configuration of the semiconductor device described in Embodiment Modes 1 to 11.

This application is based on Japanese Patent Application serial no. 2004-188713 filed in Japan Patent Office on Jun. 25, 2004, the contents of which are hereby incorporated by reference.

What is claimed is:

1. A semiconductor device comprising:
   a first transistor, wherein one of a source and a drain of the first transistor is electrically connected to a load;
   a second transistor, wherein a gate of the second transistor is electrically connected to a gate of the first transistor and a source of the second transistor is electrically connected to the source of the first transistor;
   a first current source for setting a voltage between the gate and the source of the second transistor by supplying a first current to the second transistor;
   a second current source for setting a voltage between the gate and the source of the first transistor by supplying a second current to the first transistor, wherein the second current source is electrically connected to the other of the source and drain of the first transistor; and
   a wiring electrically connected to the other of the source and the drain of the first transistor through a switch so that a current which is controlled by a voltage between the gate and the source of the first transistor is supplied to the load.

2. The semiconductor device according to claim 1, wherein the semiconductor device is applied to an electronic device selected from the group consisting of a light emitting device, a digital still camera, a notebook computer, a mobile computer, an image reproducing device, a goggle type display, a video camera and a portable phone.

3. A semiconductor device comprising:
   a display element;
   a first transistor, wherein one of a source and a drain of the first transistor is electrically connected to the display element;
   a second transistor, wherein a gate of the second transistor is electrically connected to a gate of the first transistor and a source of the second transistor is electrically connected to the source of the first transistor;
   a first current source for setting a voltage between the gate and the source of the second transistor by supplying a first current to the second transistor;
   a second current source for setting a voltage between the gate and the source of the first transistor by supplying a second current to the first transistor, wherein the second current source is electrically connected to the other of the source and drain of the first transistor; and
   a wiring electrically connected to the other of the source and the drain of the first transistor through a switch so that a current which is controlled by a voltage between the gate and the source of the first transistor is supplied to the display element.

4. The semiconductor device according to claim 3, wherein the semiconductor device is applied to an electronic device selected from the group consisting of a light emitting device, a digital still camera, a notebook computer, a mobile computer, an image reproducing device, a goggle type display, a video camera and a portable phone.

5. A semiconductor device comprising:
   a signal line driver circuit comprising:
   a signal line;
   a first transistor, wherein one of a source and a drain of the first transistor is electrically connected to the signal line;
   a second transistor, wherein a gate of the second transistor is electrically connected to a gate of the first transistor and a source of the second transistor is electrically connected to the source of the first transistor;
   a first current source for setting a voltage between the gate and the source of the second transistor by supplying a first current to the second transistor;
   a second current source for setting a voltage between the gate and the source of the first transistor by supplying a second current to the first transistor, wherein the second current source is electrically connected to the other of the source and drain of the first transistor; and
   a wiring electrically connected to the other of the source and the drain of the first transistor through a switch so that a current which is controlled by a voltage between the gate and the source of the first transistor is supplied to the signal line.

6. The semiconductor device according to claim 5, wherein the semiconductor device is applied to an electronic device selected from the group consisting of a light emitting device, a digital still camera, a notebook computer, a mobile computer, an image reproducing device, a goggle type display, a video camera and a portable phone.

7. A semiconductor device comprising:
a first transistor, wherein one of a source and a drain of the first transistor is electrically connected to a load;
a second transistor, wherein a gate of the second transistor is electrically connected to a gate of the first transistor and a source of the second transistor is electrically connected to the source of the first transistor;
a first current source for setting a voltage between the gate and the source of the second transistor by supplying a first current to the second transistor;
a second current source for setting a voltage between the gate and the source of the first transistor by supplying a second current to the first transistor; and
a power source electrically connected to the first transistor through a switch so that a third current which is controlled by a voltage between the gate and the source of the first transistor is supplied to the load.

8. The semiconductor device according to claim 7, wherein the semiconductor device is applied to an electronic device selected from the group consisting of a light emitting device, a digital still camera, a notebook computer, a mobile computer, an image reproducing device, a goggle type display, a video camera and a portable phone.

9. A driving method for a semiconductor device, comprising the steps of:
supplying a first current to a first transistor of which one of a source and a drain is electrically connected to a first current source;
generating between a gate and the source of the first transistor a voltage required for the first transistor to supply the first current;
supplying a second current to a second transistor of which one of the source and the drain is electrically connected to a second current source, of which a gate is electrically connected to the gate of the first transistor, and of which the source is electrically connected to the source of the first transistor;
generating between the gate and the source of the second transistor a voltage required for the second transistor to supply the second current; and
supplying a third current controlled by a voltage between the gate and the source of the second transistor to a load which is electrically connected to the other of the source and the drain of the second transistor.

10. The driving method for a semiconductor device according to claim 9, wherein the first current is larger than the second current.

11. A semiconductor device comprising:
a first transistor electrically connected to a load;
a second transistor, wherein a gate of the second transistor is electrically connected to a gate of a first transistor and a source of the second transistor is electrically connected to a source of the first transistor;
a first current source for supplying a first current;
a second current source for supplying a second current;
a first switch configured to electrically connect the first current source to the second transistor;
a second switch configured to electrically connect the second current source to the first transistor; and
a third switch configured to electrically connect a wiring to the first transistor so that a current is supplied to the load from the wiring through the first transistor.

12. The semiconductor device according to claim 11, wherein the semiconductor device is applied to an electronic device selected from the group consisting of a light emitting device, a digital still camera, a notebook computer, a mobile computer, an image reproducing device, a goggle type display, a video camera and a portable phone.

13. The semiconductor device according to claim 11, further comprising: a capacitor electrically connected to the gate of the first transistor.

14. A semiconductor device comprising:
a first transistor electrically connected to a load;
a second transistor wherein a gate of the second transistor is electrically connected to a gate of a first transistor and a source of the second transistor is electrically connected to a source of the first transistor;
a first current source for supplying a first current;
a second current source for supplying a second current;
a power source for supplying a voltage;
a first switch configured to electrically connect the first current source to the second transistor;
a second switch configured to electrically connect the second current source to the first transistor; and
a third switch configured to electrically connect the power source to the first transistor.

15. The semiconductor device according to claim 14, wherein the semiconductor device is applied to an electronic device selected from the group consisting of a light emitting device, a digital still camera, a notebook computer, a mobile computer, an image reproducing device, a goggle type display, a video camera and a portable phone.

16. The semiconductor device according to claim 14, further comprising: a capacitor electrically connected to the gate of the first transistor.

17. A semiconductor device comprising:
a first transistor, wherein one of a source and a drain of the first transistor is electrically connected to a load;
a second transistor, wherein a gate of the second transistor is electrically connected to a gate of the first transistor and a source of the second transistor is electrically connected to the source of the first transistor;
a first current source electrically connected to one of the source and a drain of the second transistor;
a second current source electrically connected to the other of the source and the drain of the first transistor; and
a wiring electrically connected to the other of the source and the drain of the first transistor through a switch.

* * * * *